US012637483B2

(12) United States Patent
Kuwabara et al.

(10) Patent No.: US 12,637,483 B2
(45) Date of Patent: May 26, 2026

(54) FUSED POLYCYCLIC COMPOUND AND LIGHT EMITTING DEVICE INCLUDING THE SAME

(71) Applicant: Samsung Display Co., Ltd., Yongin-si (KR)

(72) Inventors: Hirokazu Kuwabara, Yokohama (JP); Ryuhei Furue, Yokohama (JP); Yuma Aoki, Yokohama (JP); Yuuki Miyazaki, Yokohama (JP)

(73) Assignee: Samsung Display Co., Ltd., Yongin-si (KR)

(*) Notice: Subject to any disclaimer, the term of this patent is extended or adjusted under 35 U.S.C. 154(b) by 974 days.

(21) Appl. No.: 17/815,120

(22) Filed: Jul. 26, 2022

(65) Prior Publication Data

US 2023/0143071 A1 May 11, 2023

(30) Foreign Application Priority Data

Nov. 4, 2021 (KR) ........................ 10-2021-0150908

(51) Int. Cl.

*H10K 85/60* (2023.01)
*C07F 5/02* (2006.01)
*H10K 50/12* (2023.01)

(52) U.S. Cl.

CPC ............. *C07F 5/027* (2013.01); *H10K 50/12* (2023.02); *H10K 85/631* (2023.02); *H10K 85/633* (2023.02); *H10K 85/654* (2023.02); *H10K 85/657* (2023.02); *H10K 85/6572* (2023.02); *H10K 85/6576* (2023.02); *H10K 85/658* (2023.02); *C07B 2200/05* (2013.01)

(58) Field of Classification Search

None
See application file for complete search history.

(56) References Cited

U.S. PATENT DOCUMENTS

2019/0256538 A1* 8/2019 Hatakeyama ............. G09F 9/30
2020/0185626 A1 6/2020 Yuuki
2020/0354380 A1 11/2020 Thobes et al.
2021/0036235 A1* 2/2021 Seifermann ............. C07F 5/027
2021/0328166 A1* 10/2021 Sharifidehsari ......... H10K 50/11
2021/0351364 A1* 11/2021 Hatakeyama ...... H10K 85/6572
2021/0376250 A1* 12/2021 Suzaki ............... H10K 85/6574
2021/0391547 A1* 12/2021 Geum ................ H10K 85/6572
2022/0037591 A1* 2/2022 Hatakeyama ........ C08G 61/122
2022/0052264 A1* 2/2022 Baek ...................... C09K 11/06
2022/0077398 A1* 3/2022 Hatakeyama ........ H10K 85/636
2022/0115595 A1* 4/2022 Park ....................... C09K 11/06
2022/0123214 A1* 4/2022 Kuwabara ............... C07F 5/027
2023/0023388 A1* 1/2023 Tada .................... H10K 85/658
2023/0096132 A1* 3/2023 Hatakeyama ........ H10K 85/631 257/40
2023/0136708 A1* 5/2023 Inoue ................... H10K 85/636 257/40
2023/0139757 A1* 5/2023 Tada ...................... H10K 50/12 257/40
2023/0145235 A1* 5/2023 Ukigai ............... H10K 85/6572 257/40
2023/0157169 A1* 5/2023 Zink ...................... C09K 11/06 257/40
2023/0276708 A1* 8/2023 Hatakeyama ......... C07F 7/0816 257/40

FOREIGN PATENT DOCUMENTS

CN 114539296 A * 5/2022 ............ C09B 57/00
KR 10-2020-0071192 A 6/2020
KR 10-2020-0130158 A 11/2020
KR 10-2021-0018290 A 2/2021
KR 10-2021-0019987 A 2/2021
KR 10-2021-0038531 A 4/2021
WO WO 2020/200884 A1 10/2020

(Continued)

OTHER PUBLICATIONS

Machine translation of CN-114539296-A, translation generated Aug. 2025, 19 pages. (Year: 2025).*

(Continued)

*Primary Examiner* — Robert S Loewe

(74) *Attorney, Agent, or Firm* — Womble Bond Dickinson (US) LLP

(57) ABSTRACT

Provided is a light emitting device including a first electrode, a second electrode facing the first electrode, and an emission layer between the first electrode and the second electrode, wherein the emission layer includes a host and a dopant, and the host includes a compound represented by Formula E-2a or Formula E-2b, and the dopant includes a fused polycyclic compound represented by Formula 1.

Formula 1

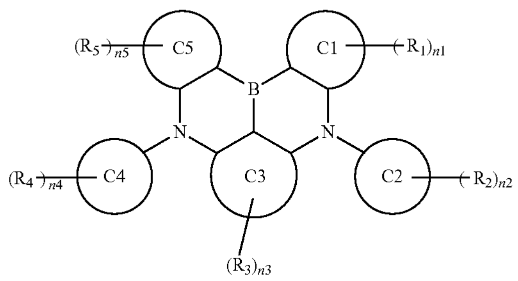

20 Claims, 8 Drawing Sheets

(56) References Cited

FOREIGN PATENT DOCUMENTS

WO WO 2021/013996 A1 1/2021

OTHER PUBLICATIONS

Balaban, Alexandru T., Daniela C. Oniciu, and Alan R. Katritzky. "Aromaticity as a cornerstone of heterocyclic chemistry." Chemical reviews 104.5 (2004): 2777-2812. (Year: 2004).*

Moore, James W., and S. Ramamoorthy. "Aromatic Hydrocarbons—Monocyclics." Organic Chemicals in Natural Waters: Applied Monitoring and Impact Assessment. New York, NY: Springer New York, 1984. 43-66. (Year: 1984).*

* cited by examiner

FUSED POLYCYCLIC COMPOUND AND LIGHT EMITTING DEVICE INCLUDING THE SAME

CROSS-REFERENCE TO RELATED APPLICATION

This application claims priority to and the benefit of Korean Patent Application No. 10-2021-0150908, filed on Nov. 4, 2021, the entire contents of which are hereby incorporated by reference.

BACKGROUND

Embodiments of the present disclosure herein relate to a fused polycyclic compound and a light emitting device including the same, and, for example, to a light emitting device including a fused polycyclic compound used as a luminescent material.

Recently, the development of an organic electroluminescence display apparatus as an image display apparatus is being actively conducted. Unlike liquid crystal display apparatuses and the like, the organic electroluminescence display apparatus is a so-called self-luminescent display apparatus in which holes and electrons injected from a first electrode and a second electrode recombine in an emission layer, and thus, a luminescent material including an organic compound in the emission layer emits light to implement a display.

In the application of an organic electroluminescence device to a display, a decrease of the driving voltage, and an increase of the emission efficiency and the life of the organic electroluminescence device are desired, and development of materials for an organic electroluminescence device stably attaining these features is being continuously conducted.

Recently, in order to accomplish an organic electroluminescence device having high efficiency, techniques on phosphorescence emission which uses energy in a triplet state or delayed fluorescence emission which uses the generating phenomenon of singlet excitons by the collision of triplet excitons (triplet-triplet annihilation, TTA) are being developed, and development of a material for thermally activated delayed fluorescence (TADF) using delayed fluorescence phenomenon is being conducted.

SUMMARY

Embodiments of the present disclosure provide a light emitting device in which luminous efficiency and a device service life are improved.

Embodiments of the present disclosure also provide a fused polycyclic compound capable of improving luminous efficiency and a device service life of a light emitting device.

An embodiment of the present disclosure provides a light emitting device including a first electrode, a second electrode facing the first electrode, and an emission layer between the first electrode and the second electrode, wherein the emission layer includes a host and a dopant, and the host includes a compound represented by Formula E-2a or Formula E-2b below, and the dopant includes a fused polycyclic compound represented by Formula 1 below.

Formula 1

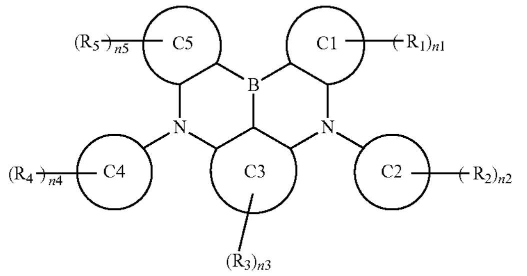

In Formula 1 above, C1 to C5 are each independently a monocyclic aromatic hydrocarbon ring having 6 to 30 ring-forming carbon atoms, or a monocyclic aromatic heterocycle having 2 to 30 ring-forming carbon atoms, $R_1$ to $R_5$ are each independently a hydrogen atom, a deuterium atom, a halogen atom, a substituted or unsubstituted boron group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, or a substituent represented by Formula 2 below or a substituent represented by Formula 3 below, $R_1$ to $R_3$ are all represented by Formula 2 below, or at least one selected from among $R_1$ to $R_5$ is represented by Formula 3 below, n1 and n5 are each independently an integer of 1 to 4, n2 and n4 are each independently an integer of 1 to 5, and n3 is an integer of 1 to 3.

Formula 2

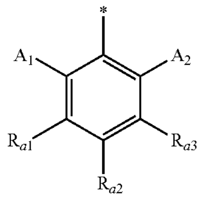

In Formula 2 above, $A_1$ and $A_2$ are each independently an alkyl group having 1 to 20 carbon atoms, and $R_{a1}$ to $R_{a3}$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

Formula 3

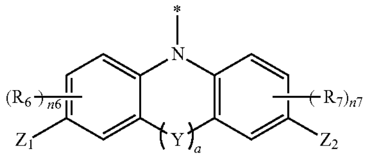

In Formula 3 above, a is 0 or 1, when a is 1, Y is a direct linkage, $Z_1$ and $Z_2$ are each independently represented by Formula 2 above, $R_6$ and $R_7$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and n6 and n7 are each independently an integer of 0 to 4.

Formula E-2a

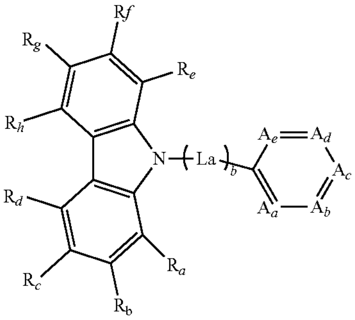

Formula E-2b

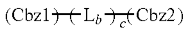

In Formula E-2a above, b is an integer of 0 to 10, $L_a$ is a direct linkage, a substituted or unsubstituted arylene group having 6 to 30 ring-forming carbon atoms, or a substituted or unsubstituted heteroarylene group having 2 to 30 ring-forming carbon atoms, $A_a$ to $A_e$ are each independently N or $CR_i$, $R_a$ to $R_i$ are each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, and two or three selected from among $A_a$ to $A_e$ are N, and the rest are $CR_i$, and in Formula E-2b above, Cbz1 and Cbz2 are each independently an unsubstituted carbazole group, or a carbazole group substituted with an aryl group having 6 to 30 ring-forming carbon atoms, $L_b$ is a direct linkage, a substituted or unsubstituted arylene group having 6 to 30 ring-forming carbon atoms, or a substituted or unsubstituted heteroarylene group having 2 to 30 ring-forming carbon atoms, and c is an integer of 0 to 10.

In an embodiment, the emission layer may emit delayed fluorescence.

In an embodiment, the emission layer may emit light having a luminescence center wavelength of about 430 nm to about 490 nm.

In an embodiment, the fused polycyclic compound represented by Formula 1 above may be represented by Formula 1-1 below:

Formula 1-1

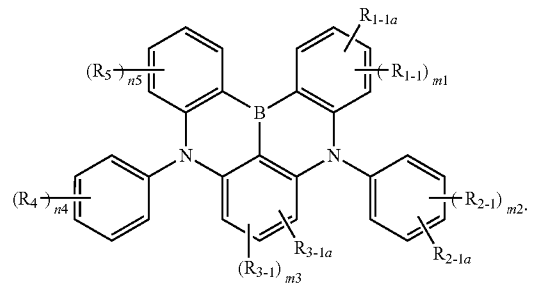

In Formula 1-1 above, $R_{1-1}$ to $R_{3-1}$ are each independently a hydrogen atom, a deuterium atom, a halogen atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, $R_{1-1a}$ to $R_{3-1a}$ are each independently represented by Formula 2 above, m1 is an integer of 0 to 3, m2 is an integer of 0 to 4, and m3 is an integer of 0 to 2.

In an embodiment, the same as defined with respect to Formula 1 above may be applied to $R_4$, $R_5$, n4, and n5 in Formula 1-1 above.

In an embodiment, the fused polycyclic compound represented by Formula 1-1 above may be represented by Formula 1-2-1 or Formula 1-2-2 below:

Formula 1-2-1

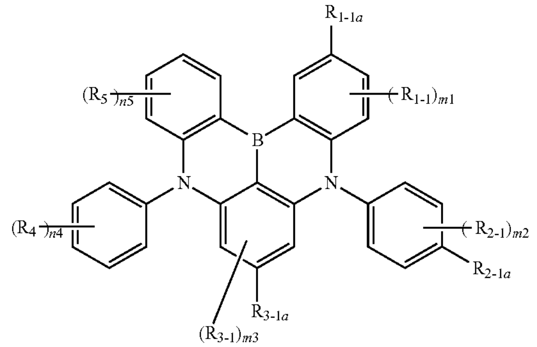

Formula 1-2-2

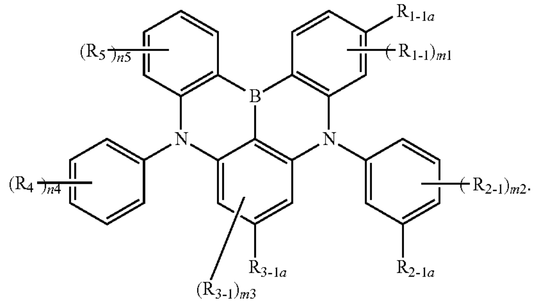

In Formula 1-2-1 and Formula 1-2-2 above, the same as defined with respect to Formula 1 and Formula 1-1 above may be applied to $R_{1-1}$ to $R_{3-1}$, $R_{1-1a}$ to $R_{3-1a}$, m1 to m3, $R_4$, $R_5$, n4, and n5.

In an embodiment, the fused polycyclic compound represented by Formula 1 above may be represented by Formula 1-3-1 or Formula 1-3-2 below:

Formula 1-3-1

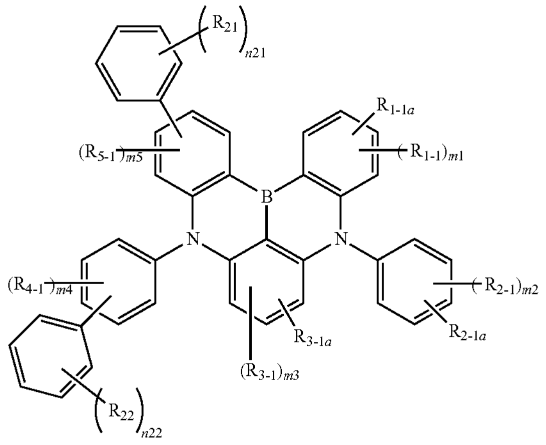

Formula 1-3-2

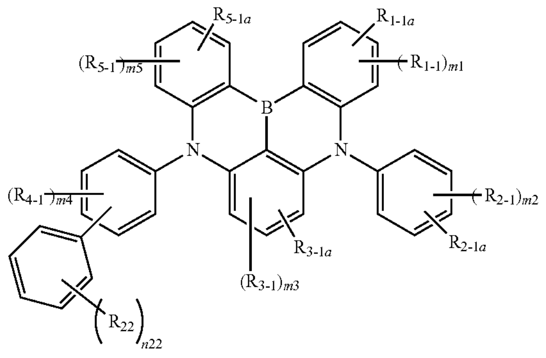

In Formula 1-3-1 and Formula 1-3-2 above, $R_{4-1}$ and $R_{5-1}$ are each independently a hydrogen atom, a deuterium atom, a halogen atom, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group 6 to 30 ring-forming carbon atoms, or a substituted or unsubstituted heteroaryl group having 2 to 30 ring-forming carbon atoms, or are bonded to an adjacent group to form a ring, $R_{5-1a}$ is represented by Formula 3 above, $R_{21}$ and $R_{22}$ are each independently a hydrogen atom, a deuterium atom, a halogen atom, a substituted or unsubstituted alkyl group having 1 to 20 carbon atoms, a substituted or unsubstituted aryl group 6 to 30 ring-forming carbon atoms, or a substituted or unsubstituted heteroaryl group having 2 to 30 ring-forming carbon atoms, m4 is an integer of 0 to 4, m5 is an integer of 0 to 3, and n21 and n22 are each independently an integer of 0 to 5.

In Formula 1-3-1 and Formula 1-3-2 above, the same as defined with respect to Formula 1 and Formula 1-1 above may be applied to $R_{1-1}$ to $R_{3-1}$, $R_{1-1a}$ to $R_{3-1a}$, and m1 to m3.

In an embodiment, the substituent represented by Formula 2 above may be represented by Formula 2-1 or Formula 2-2 below:

Formula 2-1

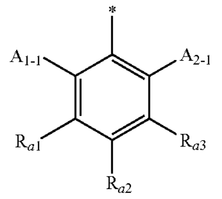

Formula 2-2

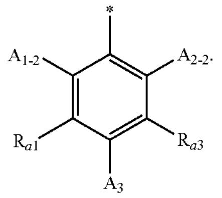

In Formula 2-1 and Formula 2-2 above, $A_{1-1}$ and $A_{2-1}$ are each independently a substituted or unsubstituted alkyl group having 1 to 10 carbon atoms, and $A_{1-2}$, $A_{2-2}$, and $A_3$ are each independently a substituted or unsubstituted alkyl group having 3 to 10 carbon atoms.

In Formula 2-1 and Formula 2-2 above, the same as defined with respect to Formula 2 above may be applied to $R_{a1}$ to $R_{a3}$.

In an embodiment, the substituent represented by Formula 3 above may be represented by Formula 3-1 or Formula 3-2 below:

Formula 3-1

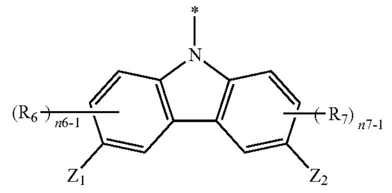

Formula 3-2

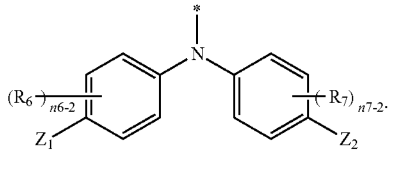

In Formula 3-1 and Formula 3-2 above, $n_{6-1}$ and $n_{7-1}$ are each independently an integer of 0 to 3, and $n_{6-2}$ and $n_{7-2}$ are each independently an integer of 0 to 4.

In Formula 3-1 and Formula 3-2 above, the same as defined with respect to Formula 3 above may be applied to $Z_1$, $Z_2$, $R_6$, and $R_7$.

In an embodiment, the fused polycyclic compound represented by Formula 1 above may be represented by Formula 1-4-1 or Formula 1-4-2 below:

Formula 1-4-1

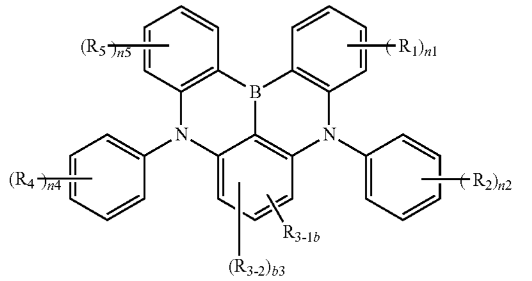

Formula 1-4-2

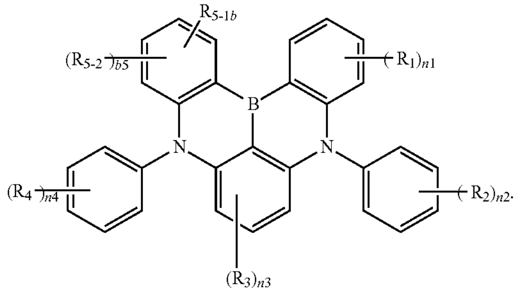

In Formula 1-4-1 and Formula 1-4-2 above, $R_{3-2}$ and $R_{5-2}$ are each independently a hydrogen atom, a deuterium atom, a halogen atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, $R_{3-1b}$ to $R_{5-1b}$ are each independently represented by Formula 3 above, b3 is an integer of 0 to 2, and b5 is an integer of 0 to 3.

In Formula 1-4-1 and Formula 1-4-2 above, the same as defined with respect to Formula 1 above may be applied to $R_1$ to $R_5$, and n1 to n5.

In an embodiment, the fused polycyclic compound represented by Formula 1 above may be represented by Formula 1-5-1 or Formula 1-5-2 below:

Formula 1-5-1

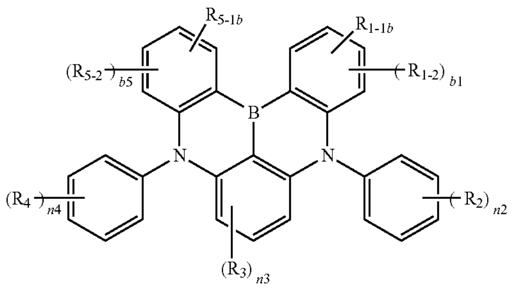

-continued

Formula 1-5-2

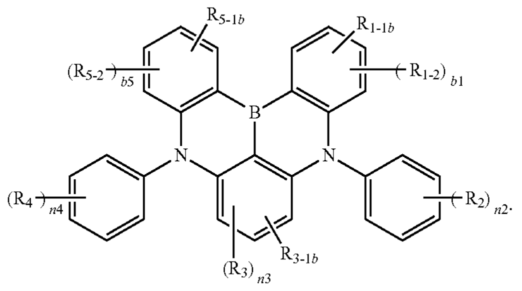

In Formula 1-5-1 and Formula 1-5-2 above, $R_{1-2}$, $R_{3-2}$ and $R_{5-2}$ are each independently a hydrogen atom, a deuterium atom, a halogen atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, $R_{1-1b}$, $R_{3-1b}$, and $R_{5-1b}$ are each independently represented by Formula 3 above, b1 and b5 are each independently an integer of 0 to 3, and b3 is an integer of 0 to 2.

In Formula 1-5-1 and Formula 1-5-2 above, the same as defined with respect to Formula 1 above may be applied to $R_2$ to $R_4$, and n2 to n4.

In an embodiment, the fused polycyclic compound represented by Formula 1 above may be represented by Formula 1-6 below:

Formula 1-6

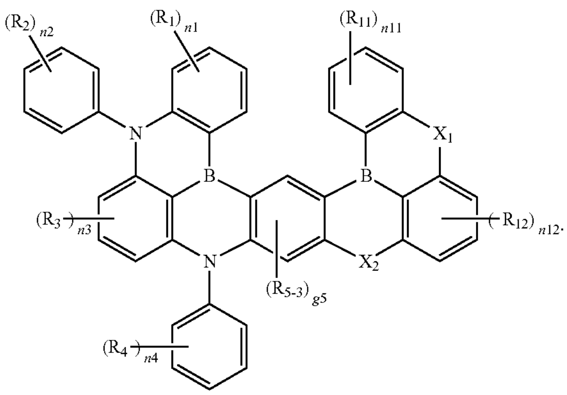

In Formula 1-6 above, $X_1$ and $X_2$ are each independently $NR_{13}$ or O, $R_{5-3}$ and $R_{11}$ to $R_{13}$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, the substituent represented by Formula 2 above, or the substituent represented by Formula 3 above, n11 is an integer of 0 to 4, n12 is an integer of 0 to 3, and g5 is an integer of 0 to 2.

In Formula 1-6 above, the same as defined with respect to Formula 1 above may be applied to $R_1$ to $R_4$, and n1 to n4.

In an embodiment, the fused polycyclic compound represented by Formula 1-6 above may be represented by Formula 1-7-1 or Formula 1-7-2 below:

Formula 1-7-1

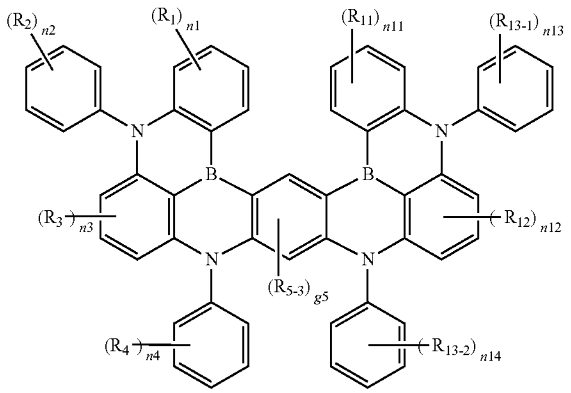

Formula 1-7-2

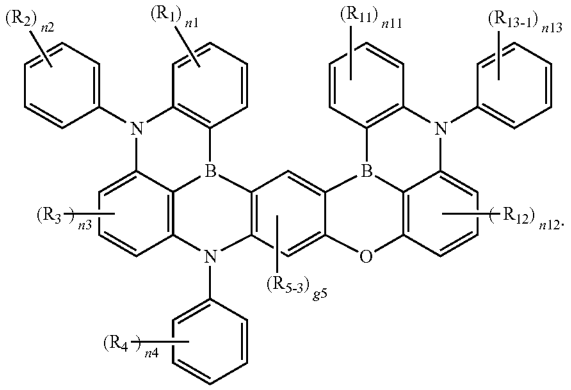

In Formula 1-7-1 and Formula 1-7-2 above, $R_{13-1}$ and $R_{13-2}$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or the substituent represented by Formula 2 above, and n13 and n14 are each independently an integer of 0 to 5.

In Formula 1-7-1 and Formula 1-7-2 above, the same as defined with respect to Formula 1 and Formula 1-6 above may be applied to $R_1$ to $R_4$, $R_{5-3}$, $R_{11}$, $R_{12}$, n1 to n4, g5, n11 and n12.

In an embodiment of the present disclosure, a fused polycyclic compound is represented by Formula 1 above.

BRIEF DESCRIPTION OF THE FIGURES

The accompanying drawings are included to provide a further understanding of the subject matter of the present disclosure, and are incorporated in and constitute a part of this specification. The drawings illustrate example embodiments of the present disclosure and, together with the description, serve to explain principles of the present disclosure. In the drawings.

Figure 7:
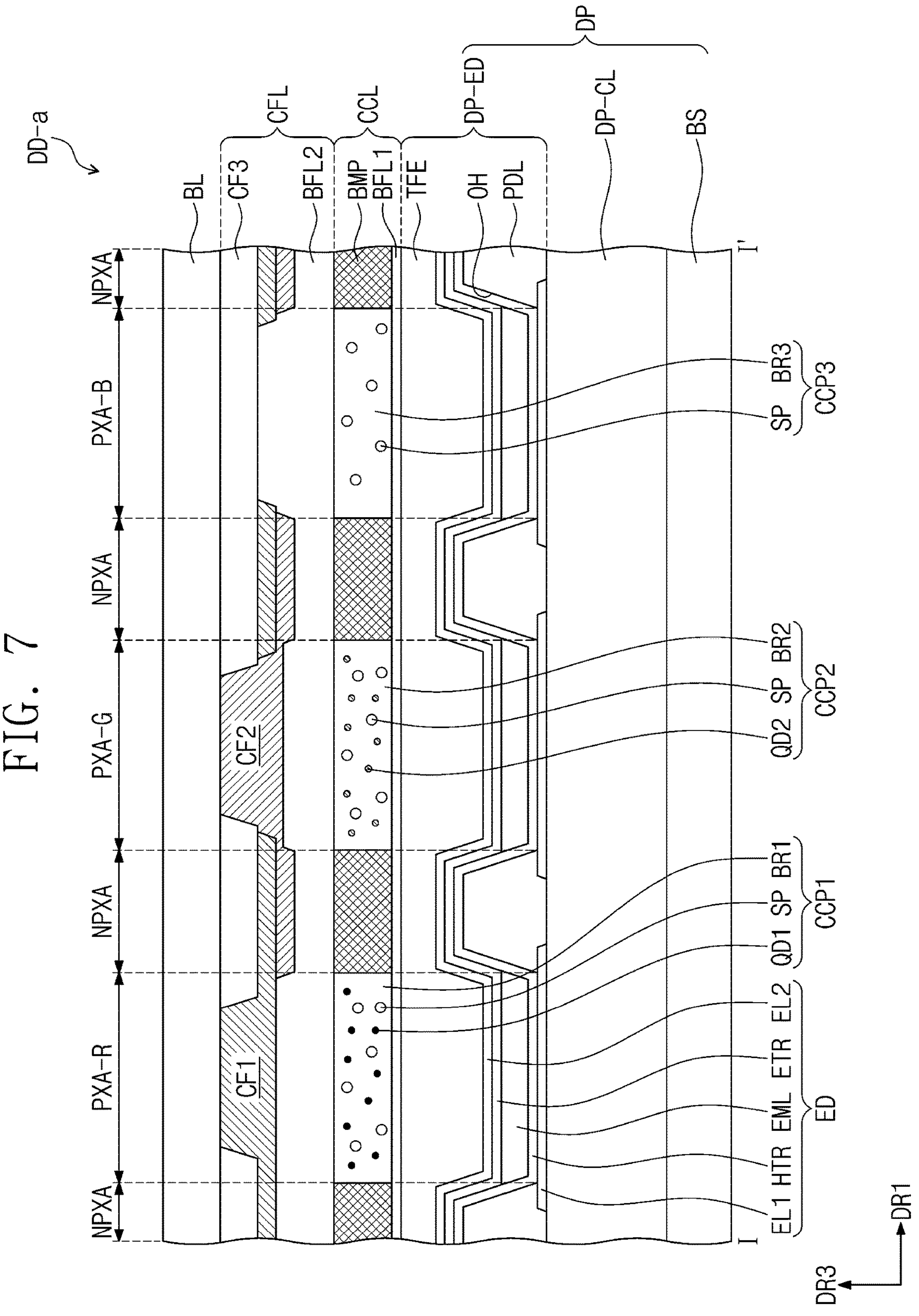
Figure 8:
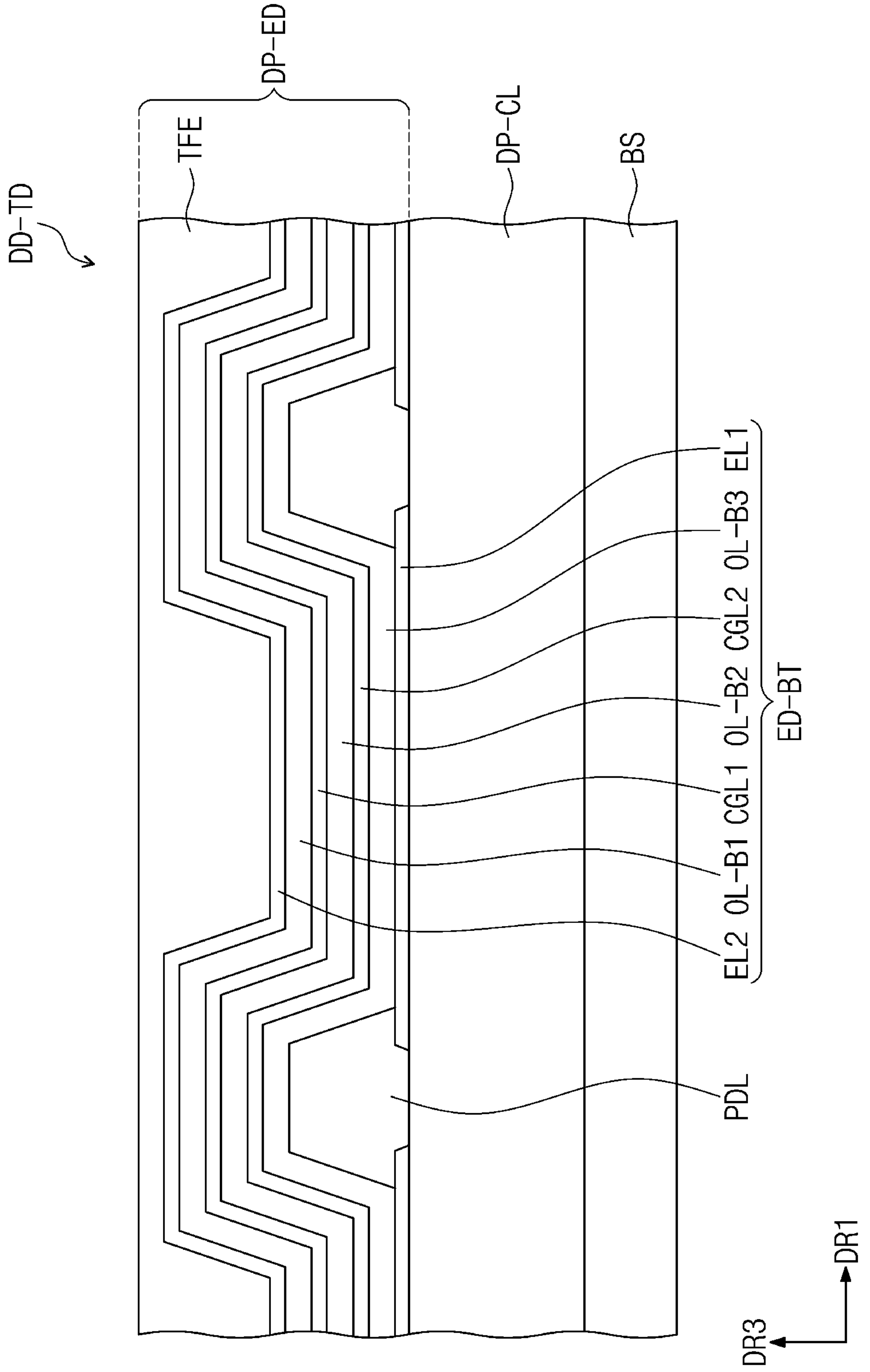
Figure 9:
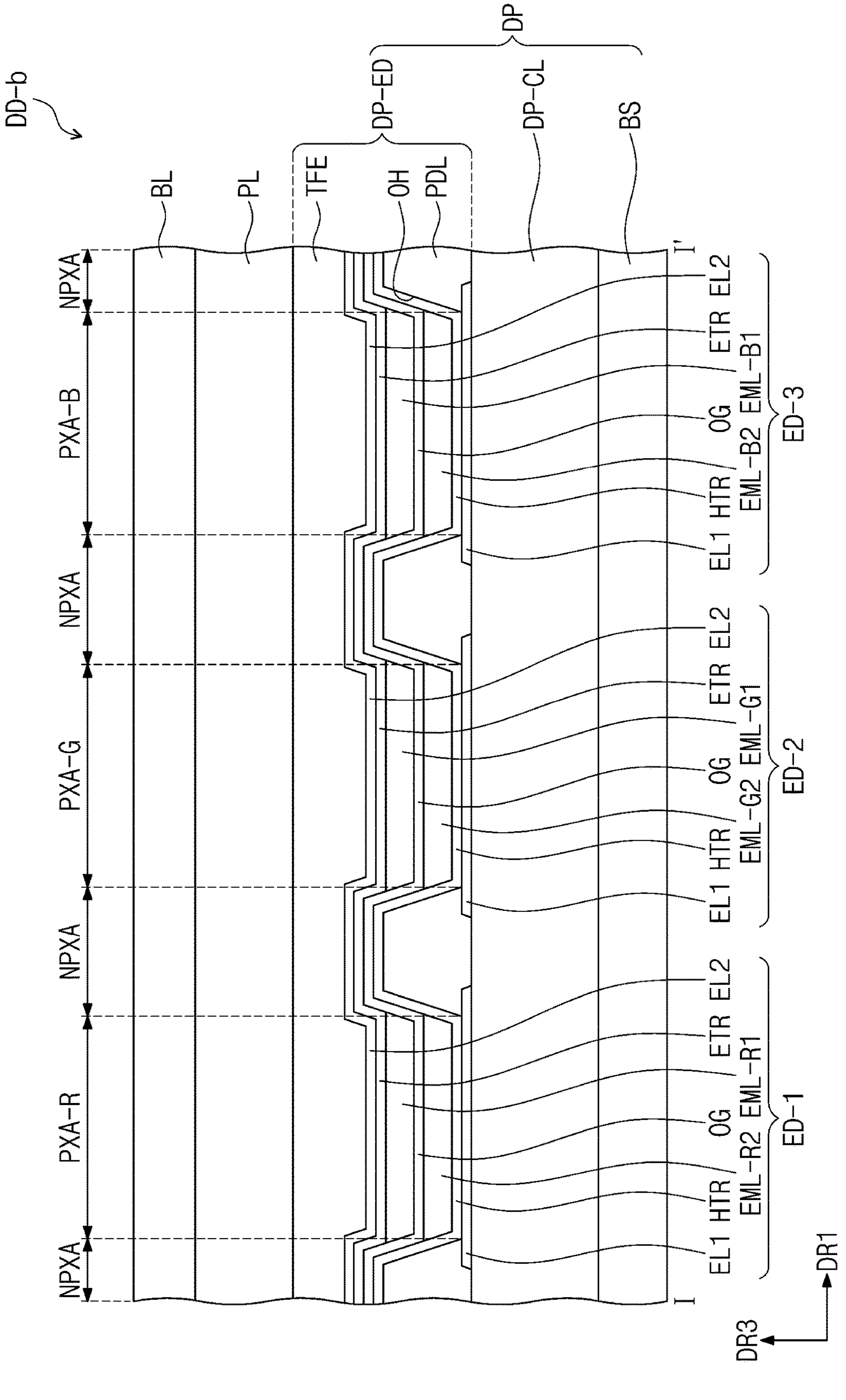
Figure 10:
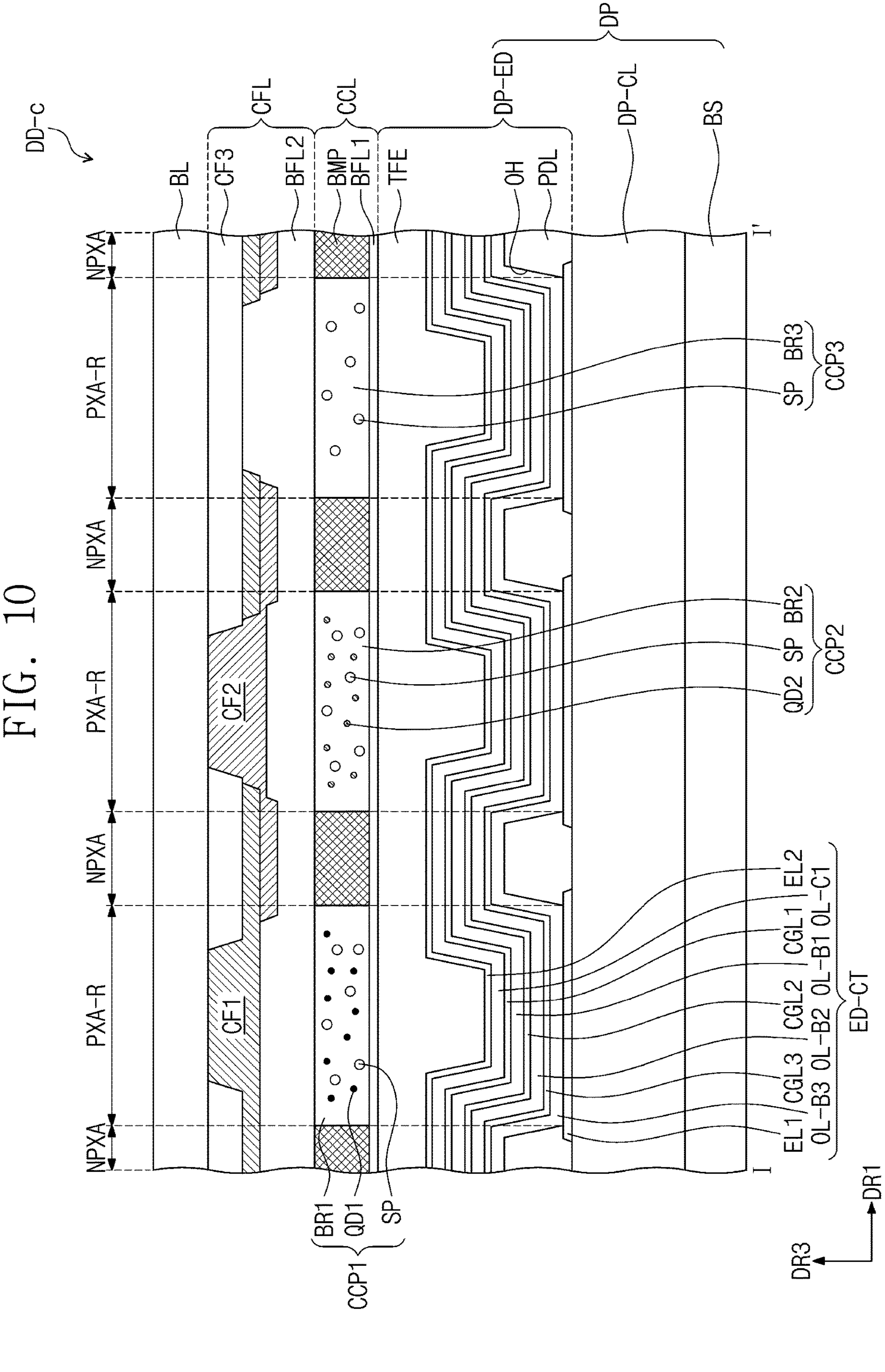

Each of FIGS. 7 and 8 is a cross-sectional view of a display apparatus according to an embodiment;

FIG. 9 is a cross-sectional view illustrating a display apparatus according to an embodiment of the present disclosure; and FIG. 10 is a cross-sectional view illustrating a display apparatus according to an embodiment of the present disclosure.

DETAILED DESCRIPTION

The subject matter of the present disclosure may be modified in many alternate forms, and thus, example embodiments will be illustrated in the drawings and described in more detail. It should be understood, however, that it is not intended to limit the subject matter of the present disclosure to the particular forms disclosed, but rather, is intended to cover all modifications, equivalents, and alternatives falling within the spirit and scope of the present disclosure.

When explaining each of drawings, like reference numerals are used to refer to like elements. In the accompanying drawings, the dimensions of each structure may be exaggerated for clarity of the present disclosure. It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the singular forms, "a," "an," and "the" are intended to include the plural forms as well, unless the context clearly indicates otherwise.

In the present application, it will be understood that the terms "include," "have" etc., specify the presence of a feature, a fixed number, a step, an operation, an element, a component, or a combination thereof disclosed in the present specification, but do not exclude the possibility of presence or addition of one or more other features, fixed numbers, steps, operations, elements, components, or combination thereof.

In the present application, when a part such as a layer, a film, a region, or a plate is referred to as being "on" or "above" another part, it can be directly on the other part, or an intervening part may also be present. On the contrary, when a part such as a layer, a film, a region, or a plate is referred to as being "under" or "below" another part, it can be directly under the other part, or an intervening part may also be present. In addition, it will be understood that when a part is referred to as being "on" another part, it can be on the other part, or under the other part as well.

In the present specification, the term "substituted or unsubstituted" may mean substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, a hydrocarbon ring group, an aryl group, and a heterocyclic group. In addition, each of the substituents described above may be substituted or unsubstituted. For example, a biphenyl group may be interpreted as an aryl group or a phenyl group substituted with a phenyl group.

In the present specification, the phrase "bonded to an adjacent group to form a ring" may indicate that one is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may be monocyclic or polycyclic. In addition, the rings formed by being bonded to each other may be connected to another ring to form a spiro structure.

In the present specification, the term "adjacent group" may mean a substituent substituted for an atom which is directly linked to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as "adjacent groups" to each other and two ethyl groups in 1,1-diethylcyclopentane may be interpreted as "adjacent groups" to each other. In addition, two methyl groups in 4,5-dimethylphenanthrene may be interpreted as "adjacent groups" to each other.

In the present specification, examples of the halogen atom may include a fluorine atom, a chlorine atom, a bromine atom, or an iodine atom.

In the present specification, the alkyl group may be a linear, branched or cyclic type (e.g., a linear, branched, or cyclic alkyl group). The number of carbons in the alkyl group is 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments of the present disclosure are not limited thereto.

In the present specification, the term "alkenyl group" means a hydrocarbon group including at least one carbon double bond at a main chain (e.g., in the middle) or at a terminal end of an alkyl group having 2 or more carbon atoms. The alkenyl group may have a linear chain or a branched chain. The carbon number is not specifically limited, but may be 2 to 30, 2 to 20 or 2 to 10. Examples of the alkenyl group include a vinyl group, a 1-butenyl group, a 1-pentenyl group, a 1,3-butadienyl aryl group, a styrenyl group, a styrylvinyl group, etc., without limitation.

The term "hydrocarbon ring group," as used herein, means any functional group or substituent derived from an aliphatic hydrocarbon ring. The hydrocarbon ring group may be a saturated hydrocarbon ring group having 5 to 20 ring-forming carbon atoms.

In the present specification, the term "aryl group" means any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but embodiments of the present disclosure are not limited thereto.

The term "heterocyclic group," as used herein, means any functional group or substituent derived from a ring including at least one of B, O, N, P, Si, or Se as a heteroatom. The heterocyclic group includes an aliphatic heterocyclic group and an aromatic heterocyclic group. The aromatic heterocyclic group may be a heteroaryl group. The aliphatic heterocycle and the aromatic heterocycle may be monocyclic or polycyclic.

In the present specification, the heterocyclic group may include at least one of B, O, N, P, Si or S as a heteroatom. If the heterocyclic group includes two or more heteroatoms, the two or more heteroatoms may be the same as or different from each other. The heterocyclic group may be a monocyclic heterocyclic group or a polycyclic heterocyclic group and encompasses a heteroaryl group. The number of ring-forming carbon atoms in the heterocyclic group may be 2 to 30, 2 to 20, or 2 to 10.

In the present specification, the heteroaryl group may include at least one of B, O, N, P, Si, or S as a heteroatom. When the heteroaryl group contains two or more hetero atoms, the two or more hetero atoms may be the same as or different from each other. The heteroaryl group may be a monocyclic heteroaryl group or polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but embodiments of the present disclosure are not limited thereto.

In the present specification, the above description of the aryl group may be applied to an arylene group except that the arylene group is a divalent group. The above description of the heteroaryl group may be applied to a heteroarylene group except that the heteroarylene group is a divalent group.

The term "boron group," as used herein, may mean that a boron atom is bonded to the alkyl group or the aryl group as defined above. The boron group includes an alkyl boron group and an aryl boron group. Examples of the boron group may include a trimethylboron group, a triethylboron group, a t-butyldimethylboron group, a triphenylboron group, a diphenylboron group, a phenylboron group, etc., but embodiments of the present disclosure are not limited thereto.

In the present specification, the term "oxy group" may mean that an oxygen atom is bonded to the alkyl group or the aryl group as defined above. The oxy group may include an alkoxy group and an aryl oxy group. The alkoxy group may be a linear chain, a branched chain or a ring chain. The number of carbon atoms in the alkoxy group is not specifically limited, but may be, for example, 1 to 20 or 1 to 10. Examples of the oxy group include methoxy, ethoxy, n-propoxy, isopropoxy, butoxy, pentyloxy, hexyloxy, octyloxy, nonyloxy, decyloxy, benzyloxy, etc., but embodiments of the present disclosure are not limited thereto.

In the present specification, the number of carbon atoms in an amine group is not specifically limited, but may be 1 to 30. The amine group may include an alkyl amine group and an aryl amine group. Examples of the amine group may include a methylamine group, a dimethylamine group, a phenylamine group, a diphenylamine group, a naphthylamine group, a 9-methyl-anthracenylamine group, a triphenylamine group, etc., but embodiments of the present disclosure are not limited thereto.

In the present specification, the term "direct linkage" may mean a single bond.

As used herein, "——*" means a position to be connected.

Hereinafter, embodiments of the present disclosure will be described with reference to the accompanying drawings.

Figure 1:
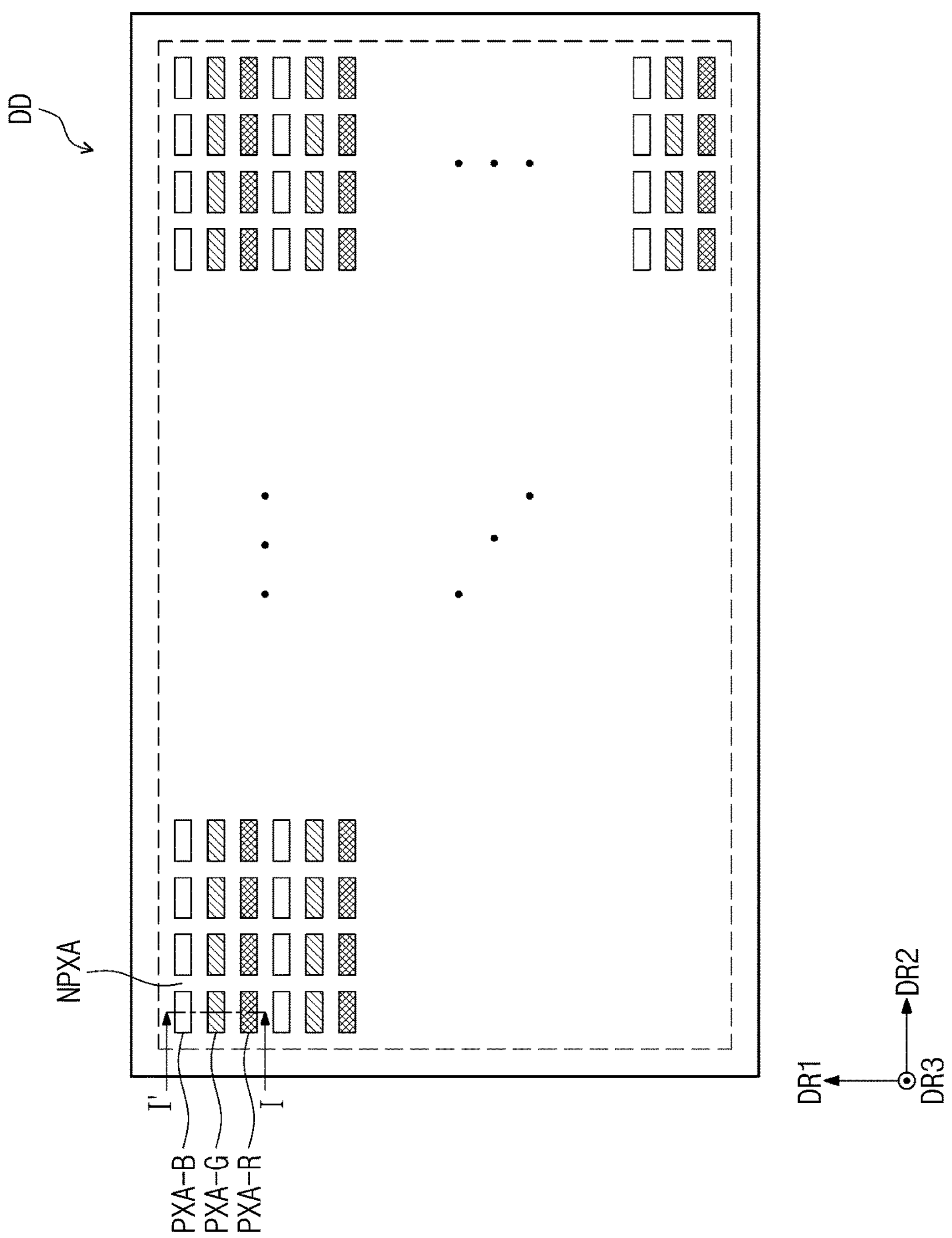
FIG. 1 is a plan view of a display apparatus according to an embodiment of the present disclosure.

FIG. 1 is a plan view illustrating an embodiment of a display apparatus DD.

Figure 2:
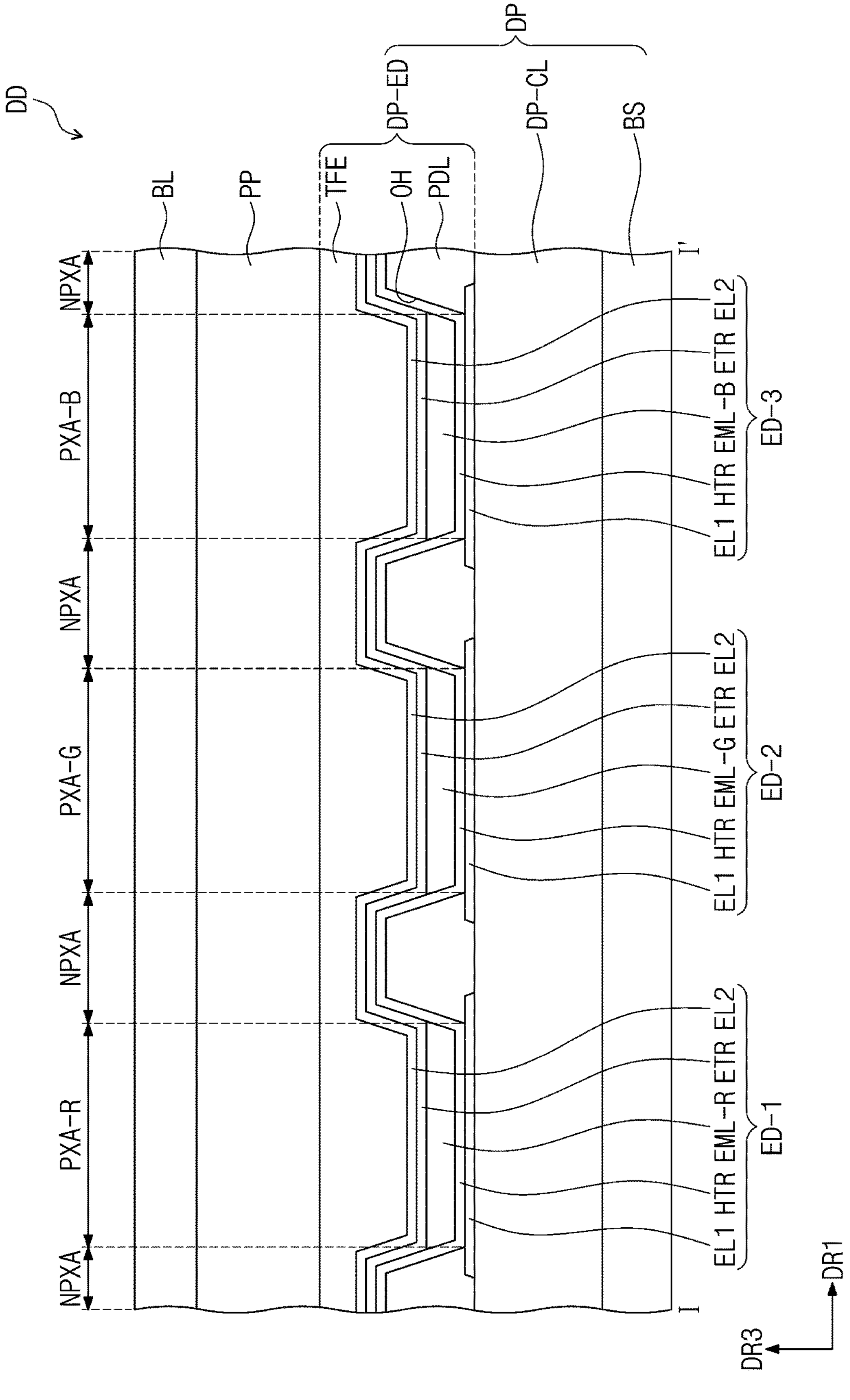
FIG. 2 is a cross-sectional view of a display apparatus according to an embodiment of the present disclosure.

FIG. 2 is a cross-sectional view of the display apparatus DD of the embodiment. FIG. 2 is a cross-sectional view illustrating a part taken along line I-I' of FIG. 1.

The display apparatus DD may include a display panel DP and an optical layer PP on the display panel DP. The display panel DP includes light emitting devices ED-1, ED-2, and ED-3. The display apparatus DD may include a plurality of light emitting devices ED-1, ED-2, and ED-3. The optical layer PP may be on the display panel DP and control reflected light in the display panel DP due to external light. The optical layer PP may include, for example, a polarization layer or a color filter layer. In some embodiments, the optical layer PP may be omitted from the display apparatus DD of an embodiment.

A base substrate BL may be on the optical layer PP. The base substrate BL may be a member which provides a base surface on which the optical layer PP is located. The base substrate BL may be a glass substrate, a metal substrate, a plastic substrate, etc. However, embodiments of the present disclosure are not limited thereto, and the base substrate BL may be an inorganic layer, an organic layer, or a composite material layer. In some embodiments, the base substrate BL may be omitted.

The display apparatus DD according to an embodiment may further include a filling layer. The filling layer may be between a display device layer DP-ED and the base substrate BL. The filling layer may be an organic material layer. The filling layer may include at least one of an acrylic-based resin, a silicone-based resin, or an epoxy-based resin.

The display panel DP may include a base layer BS, a circuit layer DP-CL provided on the base layer BS, and the display device layer DP-ED. The display device layer DP-ED may include a pixel defining film PDL, the light emitting devices ED-1, ED-2, and ED-3 between portions of the pixel defining film PDL, and an encapsulation layer TFE on the light emitting devices ED-1, ED-2, and ED-3.

The base layer BS may be a member which provides a base surface on which the display device layer DP-ED is located. The base layer BS may be a glass substrate, a metal substrate, a plastic substrate, etc. However, embodiments of the present disclosure are not limited thereto, and the base layer BS may be an inorganic layer, an organic layer, or a composite material layer.

In an embodiment, the circuit layer DP-CL is on the base layer BS, and the circuit layer DP-CL may include a plurality of transistors. Each of the transistors may include a control electrode, an input electrode, and an output electrode. For example, the circuit layer DP-CL may include a switching transistor and a driving transistor in order to drive the light emitting devices ED-1, ED-2, and ED-3 of the display device layer DP-ED.

Each of the light emitting devices ED-1, ED-2, and ED-3 may have a structure of a light emitting device ED of an embodiment according to FIGS. 3 to 6, which will be further described herein below. Each of the light emitting devices ED-1, ED-2 and ED-3 may include a first electrode EL1, a hole transport region HTR, emission layers EML-R, EML-G and EML-B, an electron transport region ETR, and a second electrode EL2.

FIG. 2 illustrates an embodiment in which the emission layers EML-R, EML-G, and EML-B of the light emitting devices ED-1, ED-2, and ED-3 are in openings OH defined in the pixel defining film PDL, and the hole transport region HTR, the electron transport region ETR, and the second electrode EL2 are provided as a common layer in the entire light emitting devices ED-1, ED-2, and ED-3. However, embodiments of the present disclosure are not limited thereto, and the hole transport region HTR and the electron transport region ETR in an embodiment may be provided by being patterned inside the opening hole OH defined in the pixel defining film PDL. For example, the hole transport region HTR, the emission layers EML-R, EML-G, and EML-B, and the electron transport region ETR of the light emitting devices ED-1, ED-2, and ED-3 in an embodiment may be provided by being patterned utilizing an inkjet printing method.

The encapsulation layer TFE may cover the light emitting devices ED-1, ED-2 and ED-3. The encapsulation layer TFE may seal the display device layer DP-ED. The encapsulation layer TFE may be a thin film encapsulation layer. The encapsulation layer TFE may be formed by laminating one layer or a plurality of layers. The encapsulation layer TFE includes at least one insulation layer. The encapsulation layer TFE according to an embodiment may include at least one inorganic film (hereinafter, an encapsulation-inorganic film). The encapsulation layer TFE according to an embodiment may also include at least one organic film (hereinafter, an encapsulation-organic film) and at least one encapsulation-inorganic film.

The encapsulation-inorganic film protects the display device layer DP-ED from moisture/oxygen, and the encapsulation-organic film protects the display device layer DP-ED from foreign substances such as dust particles. The encapsulation-inorganic film may include silicon nitride, silicon oxynitride, silicon oxide, titanium oxide, aluminum oxide, and/or the like, but embodiments of the present disclosure are not particularly limited thereto. The encapsulation-organic film may include an acrylic-based compound, an epoxy-based compound, and/or the like. The encapsulation-organic film may include a photopolymerizable organic material, but embodiments of the present disclosure are not particularly limited thereto.

The encapsulation layer TFE may be on the second electrode EL2 and may fill the opening hole OH.

Referring to FIGS. 1 and 2, the display apparatus DD may include a non-light emitting region NPXA and light emitting regions PXA-R, PXA-G and PXA-B. The light emitting regions PXA-R, PXA-G and PXA-B may be regions in which light generated by the respective light emitting devices ED-1, ED-2 and ED-3 is emitted. The light emitting regions PXA-R, PXA-G, and PXA-B may be spaced apart from each other on a plane.

Each of the light emitting regions PXA-R, PXA-G, and PXA-B may be a region divided by the pixel defining film PDL. The non-light emitting regions NPXA may be regions between the adjacent light emitting regions PXA-R, PXA-G, and PXA-B, which correspond to portions of the pixel defining film PDL. In the present specification, the light emitting regions PXA-R, PXA-G, and PXA-B may respectively correspond to pixels. The pixel defining film PDL may divide the light emitting devices ED-1, ED-2, and ED-3. The emission layers EML-R, EML-G and EML-B of the light emitting devices ED-1, ED-2 and ED-3 may be in openings OH defined in the pixel defining film PDL and spaced apart from each other.

The light emitting regions PXA-R, PXA-G and PXA-B may be divided into a plurality of groups according to the color of light generated from the light emitting devices ED-1, ED-2 and ED-3. In the display apparatus DD of an embodiment shown in FIGS. 1 and 2, three light emitting regions PXA-R, PXA-G, and PXA-B which emit red light, green light, and blue light, respectively are illustrated as examples. For example, the display apparatus DD of an embodiment may include the red light emitting region PXA-R, the green light emitting region PXA-G, and the blue light emitting region PXA-B that are spaced apart from each other.

In the display apparatus DD according to an embodiment, the plurality of light emitting devices ED-1, ED-2 and ED-3 may emit light beams having wavelengths different from each other. For example, in an embodiment, the display apparatus DD may include a first light emitting device ED-1 that emits red light, a second light emitting device ED-2 that emits green light, and a third light emitting device ED-3 that emits blue light. In some embodiments, the red light emitting region PXA-R, the green light emitting region PXA-G, and the blue light emitting region PXA-B of the display apparatus DD may correspond to the first light emitting device ED-1, the second light emitting device ED-2, and the third light emitting device ED-3, respectively.

However, embodiments of the present disclosure are not limited thereto, and the first to third light emitting devices ED-1, ED-2, and ED-3 may emit light beams in the same wavelength range or at least one light emitting device may emit a light beam in a wavelength range different from the others. For example, the first to third light emitting devices ED-1, ED-2, and ED-3 may all emit blue light.

The light emitting regions PXA-R, PXA-G, and PXA-B in the display apparatus DD according to an embodiment may be arranged in a stripe form. Referring to FIG. 1, the plurality of red light emitting regions PXA-R, the plurality of green light emitting regions PXA-G, and the plurality of blue light emitting regions PXA-B each may be arranged along a second directional axis DR2. In addition, the red light emitting region PXA-R, the green light emitting region PXA-G, and the blue light emitting region PXA-B may be alternately arranged in this order along a first directional axis DR1.

FIGS. 1 and 2 illustrate that all the light emitting regions PXA-R, PXA-G, and PXA-B have similar area, but embodiments of the present disclosure are not limited thereto. Thus, the light emitting regions PXA-R, PXA-G, and PXA-B may have different areas from each other according to the wavelength range of the emitted light.

In this case, the areas of the light emitting regions PXA-R, PXA-G, and PXA-B may mean areas when viewed on a plane defined by the first directional axis DR1 and the second directional axis DR2.

An arrangement form of the light emitting regions PXA-R, PXA-G, and PXA-B is not limited to the configuration illustrated in FIG. 1, and the order in which the red light emitting region PXA-R, the green light emitting region PXA-G, and the blue light emitting region PXA-B are arranged may be provided in various suitable combinations according to the characteristics of display quality required or desired in the display apparatus DD. For example, the arrangement form of the light emitting regions PXA-R, PXA-G, and PXA-B may be a pentile (PENTILE®) arrangement form (e.g., an RGBG matrix, RGBG structure, or RGBG matrix structure) or a diamond arrangement form. PENTILE® is a duly registered trademark of Samsung Display Co., Ltd.

In addition, the areas of the light emitting regions PXA-R, PXA-G, and PXA-B may be different from each other. For example, in an embodiment, the area of the green light emitting region PXA-G may be smaller than that of the blue light emitting region PXA-B, but embodiments of the present disclosure are not limited thereto.

Hereinafter, FIGS. 3 to 6 are cross-sectional views schematically illustrating light emitting devices according to embodiments. Each of the light emitting devices ED according to embodiments may include a first electrode EL1, a hole transport region HTR, an emission layer EML, an electron transport region ETR, and a second electrode EL2 that are sequentially stacked.

Figure 3:
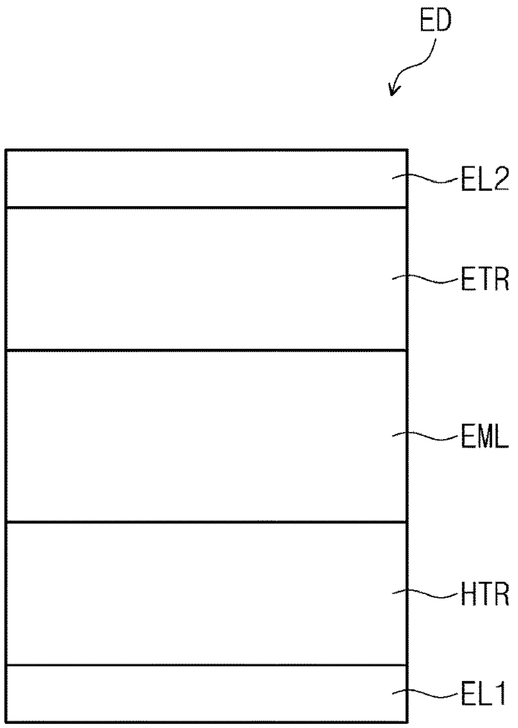
FIG. 3 is a cross-sectional view schematically illustrating a light emitting device according to an embodiment of the present disclosure.
Figure 4:
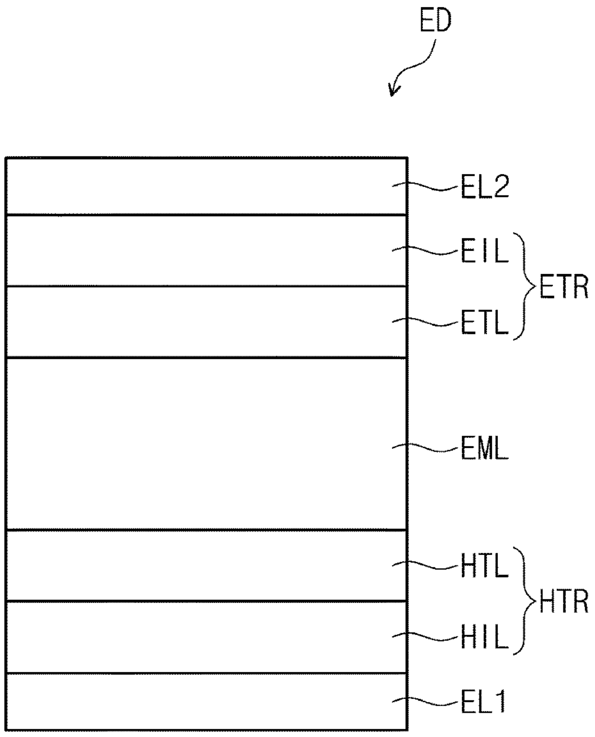
FIG. 4 is a cross-sectional view schematically illustrating a light emitting device according to an embodiment of the present disclosure.
Figure 5:
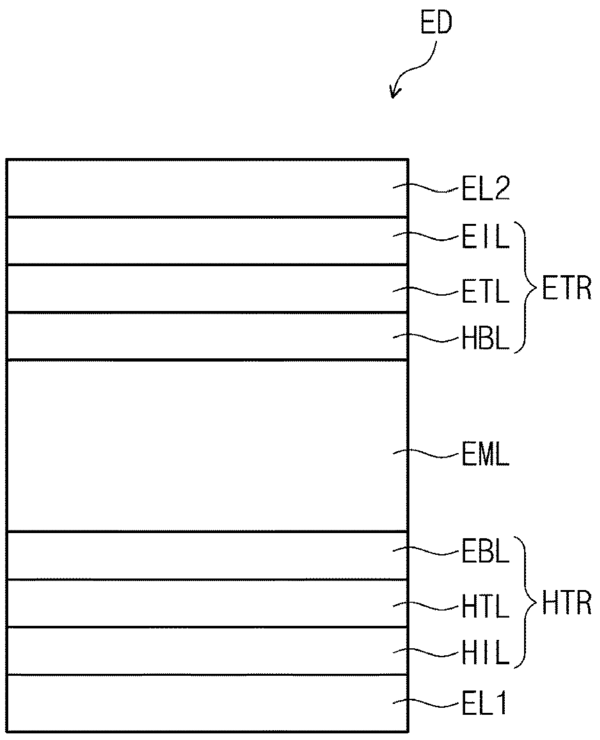
FIG. 5 is a cross-sectional view schematically illustrating a light emitting device according to an embodiment of the present disclosure.
Figure 6:
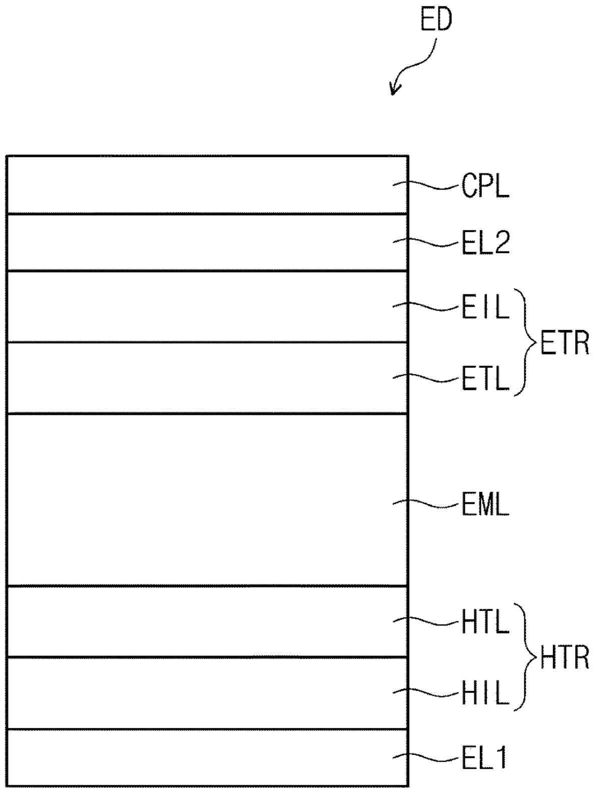
FIG. 6 is a cross-sectional view schematically illustrating a light emitting device according to an embodiment of the present disclosure.

Compared to FIG. 3, FIG. 4 illustrates a cross-sectional view of a light emitting device ED of an embodiment, in which a hole transport region HTR includes a hole injection layer HIL and a hole transport layer HTL, and an electron transport region ETR includes an electron injection layer EIL and an electron transport layer ETL. In addition, compared to FIG. 3, FIG. 5 illustrates a cross-sectional view of a light emitting device ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared to FIG. 4, FIG. 6 illustrates a cross-sectional view of a light emitting device ED of an embodiment including a capping layer CPL on a second electrode EL2.

The first electrode EL1 has conductivity (e.g., electrical conductivity). The first electrode EL1 may be formed of a metal material, a metal alloy, and/or a conductive compound. The first electrode EL1 may be an anode or a cathode. However, embodiments of the present disclosure are not limited thereto. In addition, the first electrode EL1 may be a pixel electrode. The first electrode EL1 may be a transmissive electrode, a transflective electrode, or a reflective electrode. The first electrode EL1 may be a transmissive electrode, a transflective electrode, or a reflective electrode. The first electrode EL1 may include at least one selected from among Ag, Mg, Cu, Al, Pt, Pd, Au, Ni, Nd, Ir, Cr, Li, Ca, LiF, Mo, Ti, W, In, Sn, Zn, a compound of two or more thereof, a mixture of two or more thereof, and an oxide thereof.

When the first electrode EL1 is a transmissive electrode, the first electrode EL1 may include a transparent metal oxide such as indium tin oxide (ITO), indium zinc oxide (IZO), zinc oxide (ZnO), and/or indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca (a stacked structure of LiF and Ca), LiF/Al (a stacked structure of LiF and Al), Mo, Ti, W, and/or a compound or mixture thereof (e.g., a mixture of Ag and Mg). In some embodiments, the first electrode EL1 may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but embodiments of the present disclosure are not limited thereto. In addition, embodiments of the present disclosure are not limited thereto, and the first electrode EL1 may include the above-described metal materials, combinations of at least two metal materials of the above-described metal materials, oxides of the above-described metal materials, and/or the like. The thickness of the first electrode EL1 may be from about 700 Å to about 10,000 Å. For example, the thickness of the first electrode EL1 may be from about 1,000 Å to about 3,000 Å.

The hole transport region HTR is provided on the first electrode EL1. The hole transport region HTR may include at least one of a hole injection layer HIL, a hole transport layer HTL, a buffer layer or an emission-auxiliary layer, or an electron blocking layer EBL. The thickness of the hole transport region HTR may be, for example, from about 50 Å to about 15,000 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of the hole injection layer HIL or the hole transport layer HTL, or may have a single layer structure formed of a hole injection material and a hole transport material. In addition, the hole transport region HTR may have a single layer structure formed of a plurality of different materials, or a structure in which a hole injection layer HIL/hole transport layer HTL, a hole injection layer HIL/hole transport layer HTL/buffer layer, a hole injection layer HIL/buffer layer, a hole transport layer HTL/buffer layer, or a hole injection layer HIL/hole transport layer HTL/electron blocking layer EBL are stacked in order from the first electrode EL1, but embodiments of the present disclosure are not limited thereto.

The hole transport region HTR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1 below:

Formula H-1

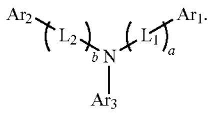

In Formula H-1 above, $L_1$ and $L_2$ may be each independently a direct linkage, a substituted or unsubstituted arylene group having 6 to 30 ring-forming carbon atoms, or a substituted or unsubstituted heteroarylene group having 2 to 30 ring-forming carbon atoms. a and b may be each independently an integer of 0 to 10. When a or b is an integer of 2 or greater, a plurality of $L_1$'s and $L_2$'s may be each independently a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. In addition, in Formula H-1, $Ar_3$ may be a substituted or unsubstituted aryl group having 6 to 30 ring-forming carbon atoms, or a substituted or unsubstituted heteroaryl group having 2 to 30 ring-forming carbon atoms.

The compound represented by Formula H-1 above may be a monoamine compound. In some embodiments, the compound represented by Formula H-1 above may be a diamine compound in which at least one selected from among $Ar_1$ to $Ar_3$ includes the amine group as a substituent. In addition, the compound represented by Formula H-1 above may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be represented by any one selected from among the compounds of Compound Group H below. However, the compounds listed in Compound Group H below are examples, and the compounds represented by Formula H-1 are not limited to those represented by Compound Group H below:

Compound Group H
H-1-1
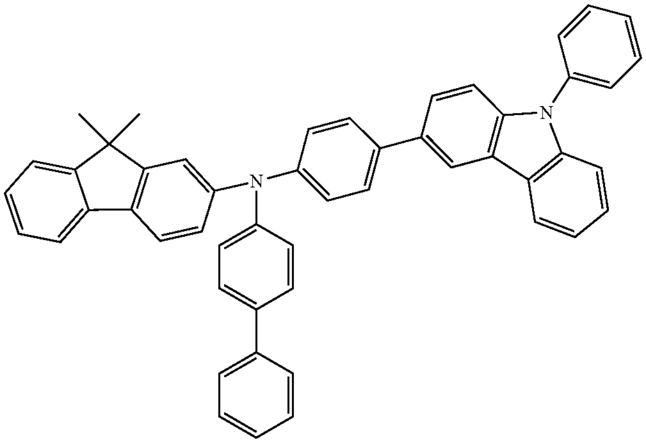
H-1-2
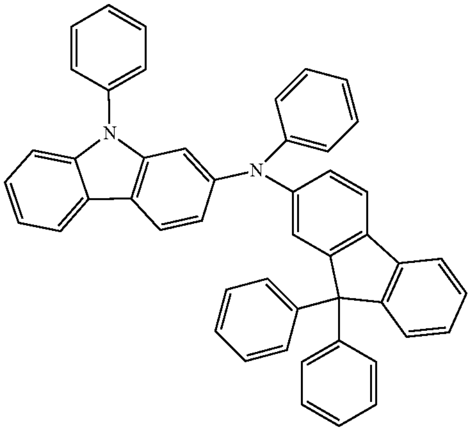
H-1-3
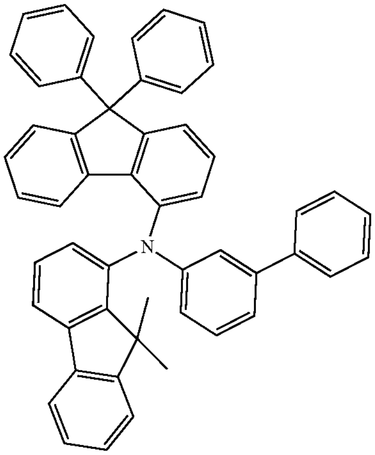
H-1-4
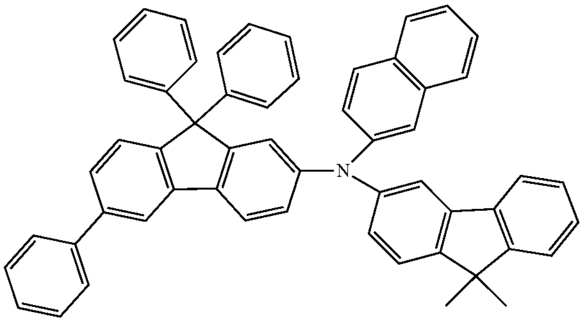

-continued
H-1-5
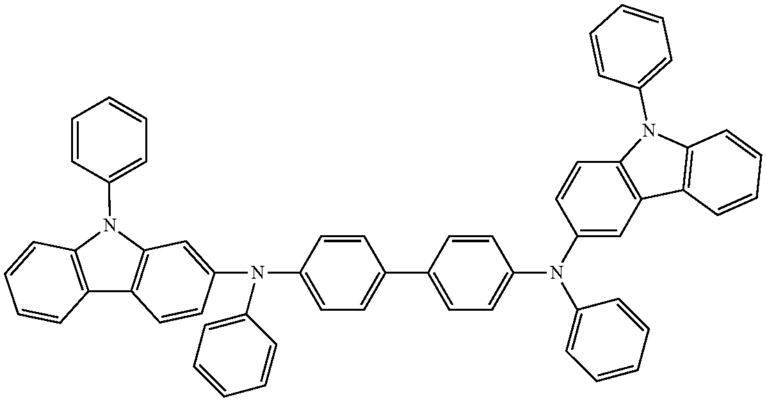
H-1-6
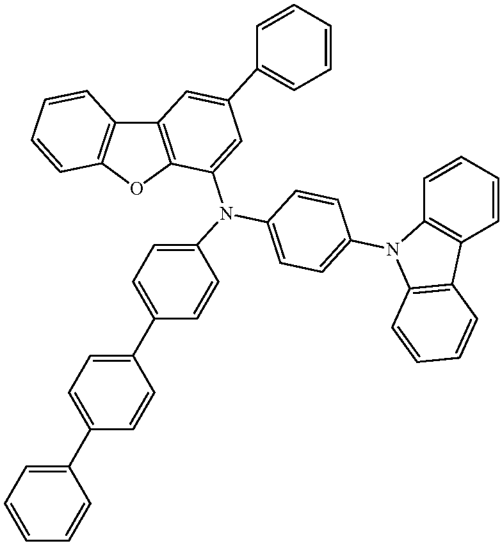
H-1-7
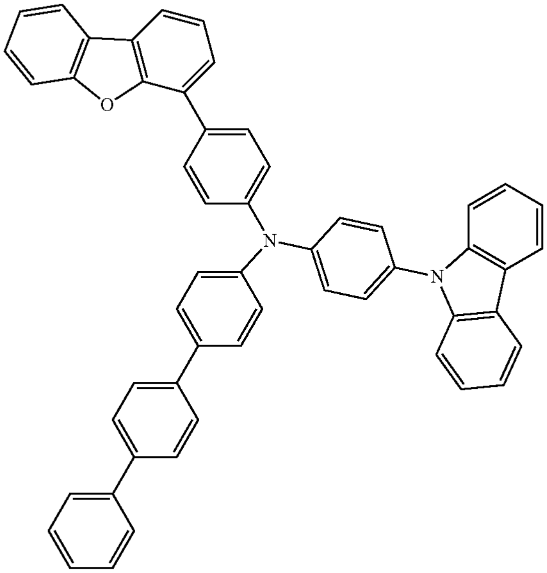
H-1-8
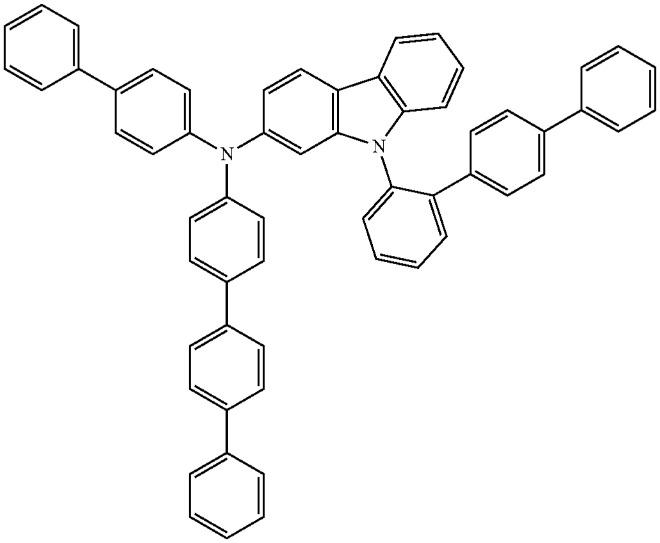

-continued
H-1-9
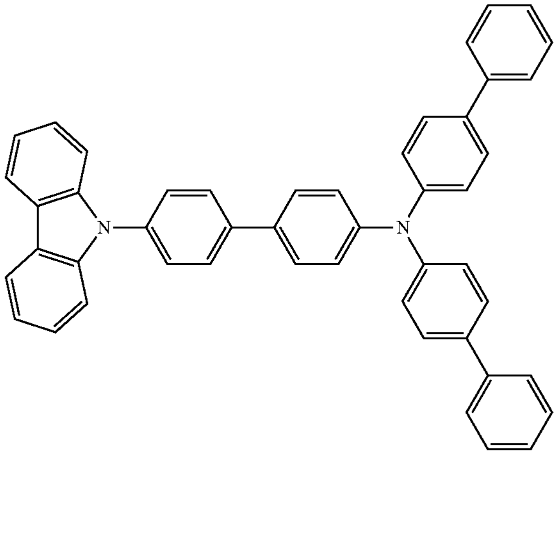
H-1-10
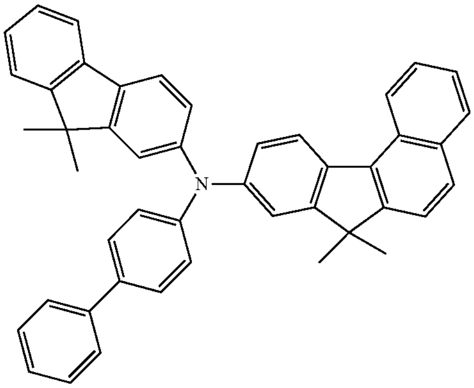
H-1-11
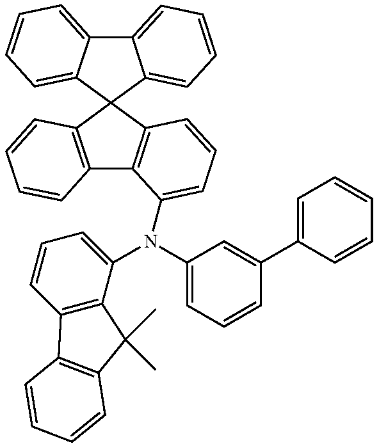
H-1-12
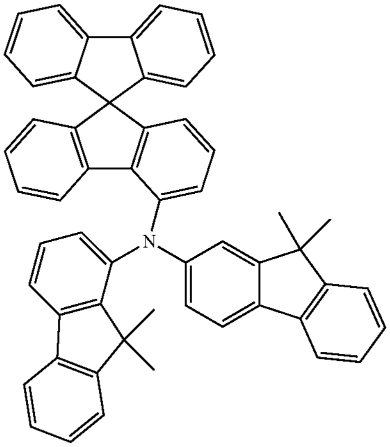
H-1-13
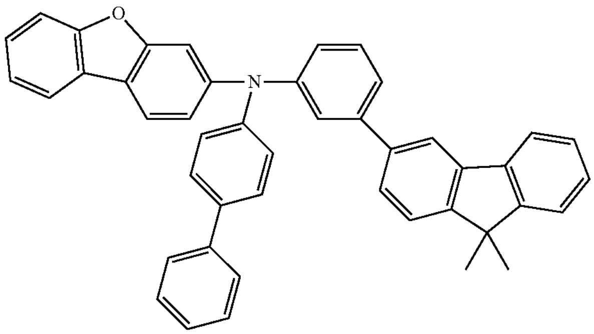

-continued
H-1-14
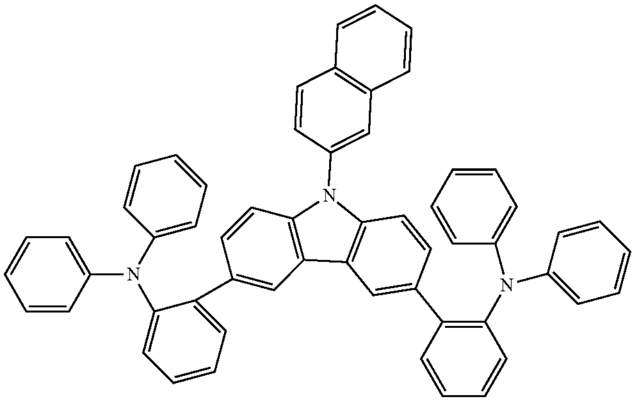
H-1-15
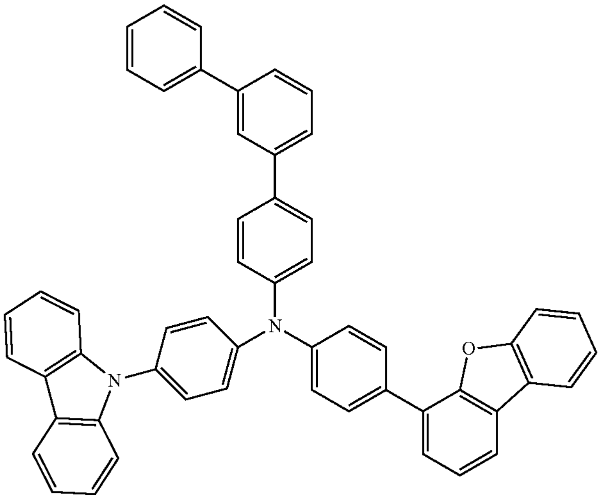
H-1-16
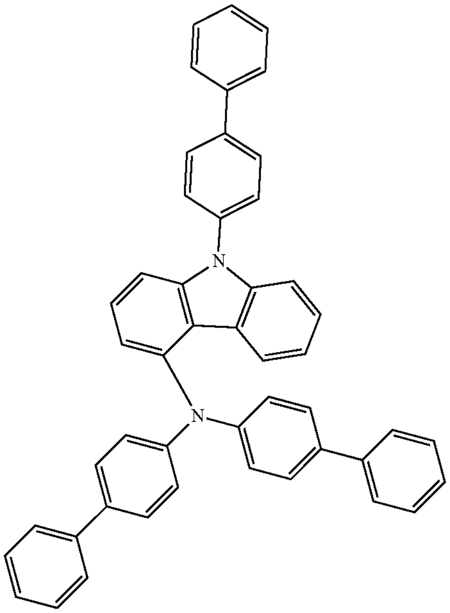

-continued
H-1-17
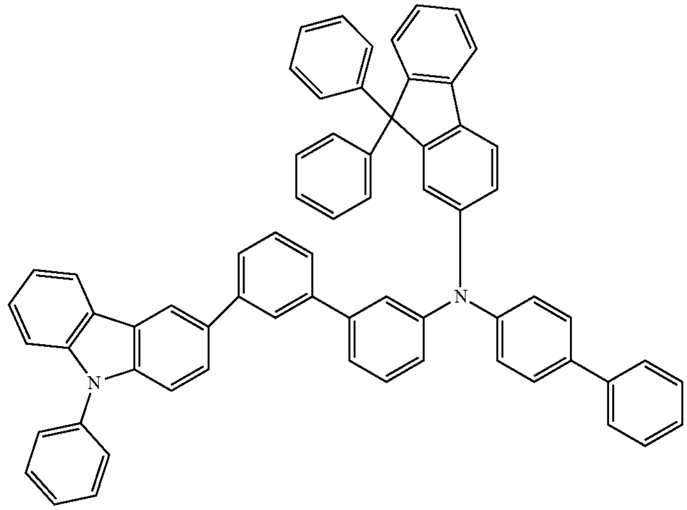
H-1-18
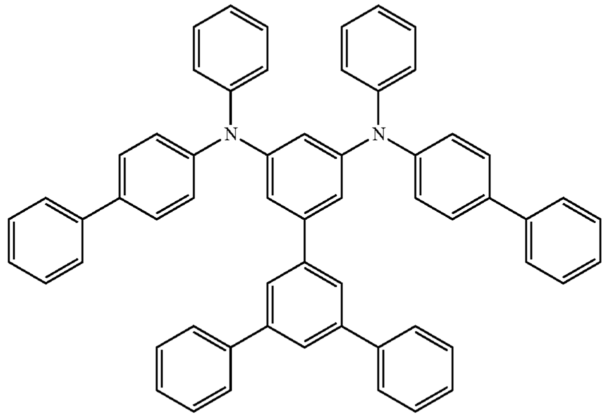
H-1-19
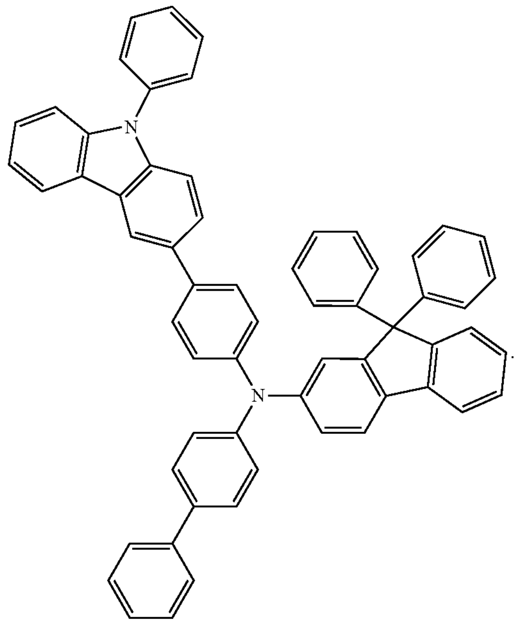
The hole transport region HTR may include a phthalocyanine compound such as copper phthalocyanine; $N^1$,$N^{1'}$-([1,1'-biphenyl]-4,4'-diyl)bis($N^1$-phenyl-$N^4$,$N^4$-di-m-tolyl-benzene-1,4-diamine) (DNTPD), 4,4',4"-[tris(3-methylphenyl)phenylamino]triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-I-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HATCN), etc.

The hole transport region HTR may include a carbazole-based derivative such as N-phenyl carbazole and polyvinyl carbazole, a fluorene-based derivative, N,N'-bis(3-methylphenyl)-N,N'-diphenyl-[1,1-biphenyl]-4,4'-diamine (TPD), a triphenylamine-based derivative such as 4,4',4"-tris(N-carbazolyl)triphenylamine (TCTA), N,N'-di(naphthalene-I-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

In addition, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the above-described compounds of the hole transport region in at least one of a hole injection layer HIL, a hole transport layer HTL, or an electron blocking layer EBL.

The thickness of the hole transport region HTR may be from about 100 Å to about 10,000 Å, for example, from about 100 Å to about 5,000 Å. When the hole transport region HTR includes the hole injection layer HIL, the hole injection layer HIL may have, for example, a thickness of about 30 Å to about 1,000 Å. When the hole transport region HTR includes the hole transport layer HTL, the hole transport layer HTL may have a thickness of about 30 Å to about 1,000 Å. For example, when the hole transport region HTR includes the electron blocking layer EBL, the electron blocking layer EBL may have a thickness of about 10 Å to about 1,000 Å. If the thicknesses of the hole transport region HTR, the hole injection layer HIL, the hole transport layer HTL and the electron blocking layer EBL satisfy the above-described ranges, suitable or satisfactory hole transport properties may be achieved without a substantial increase in driving voltage.

The hole transport region HTR may further include a charge generating material to increase conductivity (e.g., electrical conductivity) in addition to the above-described materials. The charge generating material may be dispersed uniformly or non-uniformly in the hole transport region HTR. The charge generating material may be, for example, a p-dopant. The p-dopant may include at least one of a halogenated metal compound, a quinone derivative, a metal oxide, or a cyano group-containing compound, but embodiments of the present disclosure are not limited thereto. For example, the p-dopant may include a metal halide compound such as CuI and RbI, a quinone derivative such as tetracyanoquinodimethane (TCNQ) and 2,3,5,6-tetrafluoro-7,7'8,8-tetracyanoquinodimethane (F4-TCNQ), a metal oxide such as tungsten oxide and molybdenum oxide, a cyano group-containing compound such as dipyrazino[2,3-f: 2',3'-h]quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., but embodiments of the present disclosure are not limited thereto.

As described above, the hole transport region HTR may further include at least one of the buffer layer or the electron blocking layer EBL in addition to the hole injection layer HIL and the hole transport layer HTL. The buffer layer may compensate for a resonance distance according to the wavelength of light emitted from the emission layer EML and may thus increase light emission efficiency. A material that may be contained in the hole transport region HTR may be used as a material to be contained in the buffer layer. The electron blocking layer EBL is a layer that serves to prevent or reduce the injection of electrons from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed of a single material, a single layer formed of a plurality of different materials, or a multilayer structure having a plurality of layers formed of a plurality of different materials.

The emission layer EML in the light emitting device ED according to an embodiment may include a fused polycyclic compound of an embodiment.

The fused polycyclic compound of an embodiment may include a structure in which a plurality of first aromatic rings are fused through at least one boron atom and at least two heteroatoms. In some embodiments, the fused polycyclic compound of an embodiment may include a structure in which the plurality of first aromatic rings are fused through at least one boron atom and at least two nitrogen atoms to form a fused cycle and a second aromatic ring is linked to the nitrogen atoms that are constituent atoms in the fused cycle. The first aromatic ring and the second aromatic ring that are adjacent may be bonded to each other to form a ring. In the present specification, the first aromatic ring and the second aromatic ring contained in the fused polycyclic compound of an embodiment may be referred to as a "fused cyclic core."

In addition, the fused polycyclic compound of an embodiment may include a first substituent, which is a steric hindrance substituent, in the fused cyclic core. The first substituent is a substituent in which an alkyl group is introduced to carbon at a particular position of a benzene moiety, and may be directly linked to the fused cyclic core, or may be linked to the fused cyclic core by interposing a second substituent different from the first substituent therebetween. When the first substituent is directly linked to the fused cyclic core, the first substituent may be essentially linked to a particular ring selected from among the aromatic rings constituting the fused cyclic core. In some embodiments, when the first substituent is linked to the fused cyclic core by interposing the second substituent therebetween, the second substituent substituted with the first substituent may be linked to at least one selected from among the aromatic rings constituting the fused cyclic core. In the present specification, the term "first substituent" may mean a substituent represented by Formula 2 below, and the term "second substituent" may mean a substituent represented by Formula 3 below.

The fused polycyclic compound of an embodiment is represented by Formula 1 below:

Formula 1

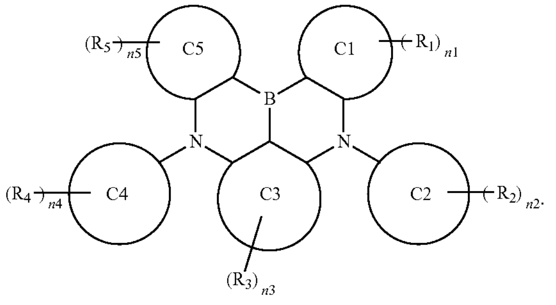

The fused polycyclic compound represented by Formula 1 of an embodiment includes a structure in which three aromatic rings are fused via one boron atom and two nitrogen atoms. In addition, the fused compound of an embodiment may have a structure in which an additional aromatic ring is fused via an additional boron atom and an additional heteroatom, on the basis of a structure in which three aromatic rings are fused around one boron atom.

In Formula 1, C1 to C5 are each independently a monocyclic aromatic hydrocarbon ring having 6 to 30 ring-forming carbon atoms, or a monocyclic aromatic heterocycle having 2 to 30 ring-forming carbon atoms. C1 to C5 may be each independently a 5-membered or 6-membered aromatic hydrocarbon ring, or a 5-membered or 6-membered aromatic heterocycle. In an embodiment, C1 to C5 may be each independently a 6-membered aromatic hydrocarbon ring, or a 6-membered aromatic heterocycle. For example, C1 to C5 may be each independently a benzene ring. In some embodiments, C1 to C5 may each independently be bonded to an adjacent ring or adjacent substituent to form a fused ring.

In Formula 1, $R_1$ to $R_5$ are each independently a hydrogen atom, a deuterium atom, a halogen atom, a substituted or unsubstituted boron group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, the substituent represented by Formula 2 below, or the substituent represented by Formula 3. In some embodiments, each of $R_1$ to $R_5$ may be bonded to an adjacent group to form a ring. For example, $R_1$ to $R_5$ may be each independently a hydrogen atom, a deuterium atom, a substituted or unsubstituted arylboron group, a substituted or unsubstituted arylamine group, a substituted or unsubstituted aryloxy group, a substituted or unsubstituted t-butyl group, a substituted or unsubstituted phenyl group, a substituted or unsubstituted biphenyl group, the substituent represented by Formula 2 below, or the substituent represented by Formula 3.

In Formula 1, $R_1$ to $R_3$ are all represented by Formula 2, or at least one selected from among $R_1$ to $R_5$ is represented by Formula 3. For the fused polycyclic compound represented by Formula 1 of an embodiment, the substituents represented by Formula 2 may be linked to all of C1 to C3, or the substituent represented by Formula 3 may be linked to at least one selected from among C1 to C5 in Formula 1.

For example, $R_1$ to $R_3$ selected from among $R_1$ to $R_5$ may all be represented by Formula 2. In this case, $R_4$ and $R_5$ are each independently a hydrogen atom, a deuterium atom, a halogen atom, a substituted or unsubstituted boron group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, the substituent represented by Formula 2, or the substituent represented by Formula 3.

In addition, at least one selected from among $R_1$ to $R_5$ in Formula 1 may be represented by Formula 3. In Formula 1, the substituent, which is not represented by Formula 3, selected from among $R_1$ to $R_5$ may be a hydrogen atom, a deuterium atom, a halogen atom, a substituted or unsubstituted boron group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or the substituent represented by Formula 2.

In Formula 1, n1 and n5 are each independently an integer of 1 to 4, n2 and n4 are each independently an integer of 1 to 5, and n3 is an integer of 1 to 3. When each of n1 to n5 is an integer of 2 or more, a plurality of $R_1$'s to $R_5$'s may each be the same or at least one selected from among the plurality of $R_1$'s to $R_5$'s may be different from the others.

In an embodiment, the first substituent may be represented by Formula 2 below. The first substituent includes a benzene moiety, and a structure in which an alkyl group is substituted at carbon at a particular position of the benzene moiety. In some embodiments, the first substituent may include a structure in which an alkyl group is introduced to the ortho-position on the basis of "——*" position of Formula 2.

Formula 2

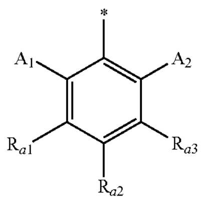

In Formula 2, $A_1$ and $A_2$ are each independently an alkyl group having 1 to 20 carbon atoms. In an embodiment, $A_1$ and $A_2$ may be each independently a substituted or unsubstituted methyl group, or a substituted or unsubstituted isopropyl group. For example, $A_1$ and $A_2$ may be each independently an unsubstituted methyl group, or an unsubstituted isopropyl group.

In Formula 2, $R_{a1}$ to $R_{a3}$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In an embodiment, $R_{a1}$ to $R_{a3}$ may be each independently a hydrogen atom, a deuterium atom, or a substituted or unsubstituted isopropyl group. For example, $R_{a1}$ to $R_{a3}$ may be each independently a hydrogen atom, a deuterium atom, or an unsubstituted isopropyl group.

In Formula 2, "——*" may be a part bonded to the aromatic ring in Formula 1. In some embodiments, in Formula 2, "——*" may be a part bonded to a benzene ring in Formula 3, which will be further described herein below.

In an embodiment, the second substituent may be represented by Formula 3 below. The second substituent includes a structure in which two aromatic rings are each linked to a nitrogen atom. The two aromatic rings of the second substituent may be bonded to each other to form a ring. In addition, the second substituent includes substituents represented by $Z_1$ and $Z_2$ which are linked to two aromatic rings, respectively, and the substituents represented by $Z_1$ and $Z_2$ may be substituted at the para-position with the nitrogen atom in Formula 3.

Formula 3

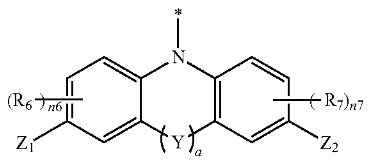

In Formula 3, a is 0 or 1, and when a is 1, Y is a direct linkage. For example, the case where a is 0 may mean that the two benzene rings linked to the nitrogen atom in Formula 3 are not linked via Y. In some embodiments, when a is 0, the substituent represented by Formula 3 may include a diphenylamine moiety. In addition, the case where a is 1 may mean that the two benzene rings linked to the nitrogen atom in Formula 3 is linked via a direct linkage. In some embodiments, when a is 1, the substituent represented by Formula 3 may include a carbazole moiety.

In Formula 3, $Z_1$ and $Z_2$ are each independently represented by Formula 2.

In Formula 3, $R_6$ and $R_7$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $R_6$ and $R_7$ may be each independently a hydrogen atom or a deuterium atom.

In Formula 3, n6 and n7 are each independently an integer of 0 to 4. If each of n6 and n7 is 0, the fused polycyclic compound of an embodiment may not be substituted with each of $R_6$ and $R_7$. In Formula 3, the case where each of n6 and n7 is 4 and $R_6$'s and $R_7$'s are each hydrogen atoms may be the same as the case where each of n6 and n7 is 0. When each of n6 and n7 is an integer of 2 or more, a plurality of $R_6$'s and $R_7$'s may each be the same or at least one selected from among the plurality of $R_6$'s and $R_7$'s may be different from the others.

In Formula 3, "——*" may be a part bonded to the aromatic ring in Formula 1.

In an embodiment, the fused polycyclic compound represented by Formula 1 may be represented by Formula 1-1 below:

Formula 1-1

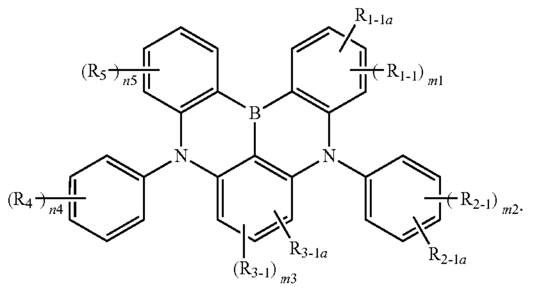

The fused polycyclic compound of an embodiment may include a structure in which the substituent represented by Formula 2 is bonded, at a particular position, to a main skeleton represented by Formula 1-1. Formula 1-1 represents that, in Formula 1, C1 to C5 are specified as a substituted or unsubstituted benzene ring, and the substituent kinds of $R_1$ to $R_3$ are specified. In some embodiments, Formula 1-1 represents the case where, in Formula 1, the substituents represented by $R_1$ to $R_3$ are all represented by Formula 2.

In Formula 1-1, $R_{1-1}$ to $R_{3-1}$ may be each independently a hydrogen atom, a deuterium atom, a halogen atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms. In some embodiments, $R_{1-1}$ to $R_{3-1}$ may each be bonded to an adjacent group to form a ring. For example, $R_{1-1}$ to $R_{3-1}$ may be each independently a hydrogen atom or a deuterium atom.

In Formula 1-1, $R_{1-1a}$ to $R_{3-1a}$ may be each independently represented by Formula 2. $R_{1-1a}$ to $R_{3-1a}$ may all be represented by Formula 2.

In Formula 1-1, m1 is an integer of 0 to 3, m2 is an integer of 0 to 4, and m3 is an integer of 0 to 2.

If m1 is 0, the fused polycyclic compound of an embodiment may not be substituted with $R_{1-1}$. The case where, in Formula 1-1, m1 is 3 and $R_{1-1}$'s are all hydrogen atoms may be the same as the case where m1 is 0 in Formula 1-1. If $m_1$ is an integer of 2 or more, a plurality of $R_{1-1}$'s may all be the same, or at least one of the plurality of $R_{1-1}$'s may be different from the others.

If m2 is 0, the fused polycyclic compound of an embodiment may not be substituted with $R_{2-1}$. The case where, in Formula 1-1, m2 is 4 and $R_{2-1}$'s are all hydrogen atoms may be the same as the case where m2 is 0 in Formula 1-1. If m2 is an integer of 2 or more, a plurality of $R_{2-1}$'s may all be the same, or at least one of the plurality of $R_{2-1}$'s may be different from the others.

If m3 is 0, the fused polycyclic compound of an embodiment may not be substituted with $R_{3-1}$. The case where, in Formula 1-1, m3 is 2 and $R_{3-1}$'s are all hydrogen atoms may be the same as the case where m3 is 0 in Formula 1-1. If m3 is 2, a plurality of $R_{3-1}$'s may all be the same, or at least one of the plurality of $R_{3-1}$'s may be different from the others.

The same as defined with respect to Formula 1 above may be applied to $R_4$, $R_5$, n4, and n5 in Formula 1-1.

In an embodiment, the fused polycyclic compound represented by Formula 1-1 may be represented by Formula 1-2-1 or Formula 1-2-2 below:

Formula 1-2-1

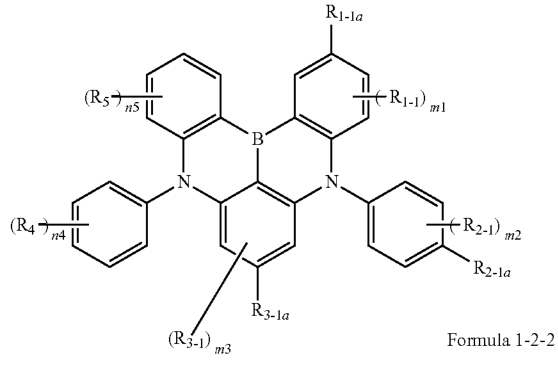

Formula 1-2-2

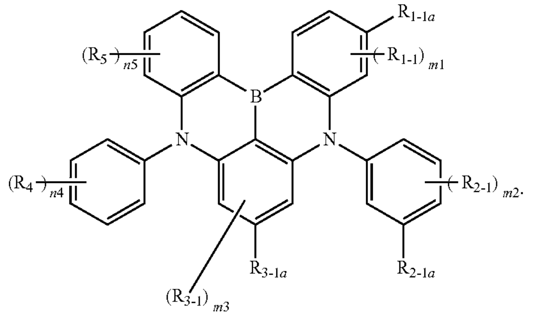

Formula 1-2-1 and Formula 1-2-2 represent the cases where the substituted positions of $R_{1-1a}$ to $R_{3-1a}$ in Formula 1-1 are specified. Formula 1-2-1 represents the case where, in Formula 1-1, $R_{1-1a}$ is substituted at the meta-position with the boron atom, $R_{2-1a}$ is substituted at the para-position with the nitrogen atom, and $R_{3-1a}$ is substituted at the para-position with the boron atom. Formula 1-2-2 represents the case where, in Formula 1-1, $R_{1-1a}$ is substituted at the para-position with the boron atom, $R_{2-1a}$ is substituted at the meta-position with the nitrogen atom, and $R_{3-1a}$ is substituted at the para-position with the boron atom.

In Formula 1-2-1 and Formula 1-2-2, the same as defined with respect to Formula 1 and Formula 1-1 above may be applied to $R_{1-1}$ to $R_{3-1}$, $R_{1-1a}$ to $R_{3-1a}$, m1 to m3, $R_4$, $R_5$, n4, and n5.

In an embodiment, the fused polycyclic compound represented by Formula 1 may be represented by Formula 1-3-1 or Formula 1-3-2 below:

Formula 1-3-1

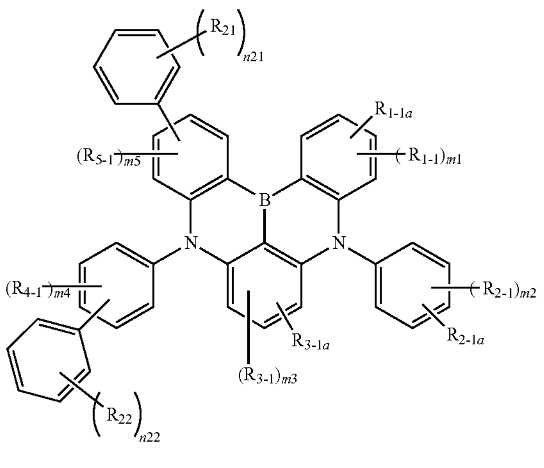

-continued

Formula 1-3-2

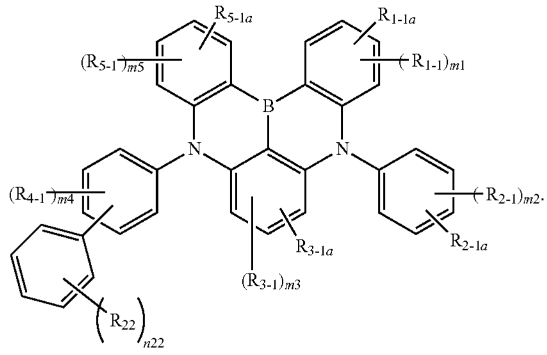

Formula 1-3-1 and Formula 1-3-2 represent that, in Formula 1, C1 to C5 are specified as a substituted or unsubstituted benzene ring, and the types (e.g., kinds) of substituents, $R_1$ to $R_5$ are specified. Formula 1-3-1 and Formula 1-3-2 represent the case where the substituents represented by $R_1$ to $R_3$ are all represented by Formula 2, and the substituents represented by $R_4$ and $R_5$ are each independently a substituted or unsubstituted phenyl group or a substituent represented by Formula 3.

In Formula 1-3-1 and Formula 1-3-2, $R_{4-1}$ and $R_{5-1}$ may be each independently a hydrogen atom, a deuterium atom, a halogen atom, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms. In some embodiments, $R_{4-1}$ and $R_{5-1}$ may each be bonded to an adjacent group to form a ring. For example, $R_{4-1}$ and $R_{5-1}$ may be each independently a hydrogen atom, a deuterium atom, or a substituted or unsubstituted phenyl group.

In Formula 1-3-2, $R_{5-1a}$ may be represented by Formula 3 above.

In Formula 1-3-1 and Formula 1-3-2, $R_{21}$ and $R_{22}$ may be each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $R_{21}$ and $R_{22}$ may be each independently a hydrogen atom, a deuterium atom, a substituted or unsubstituted methyl group, a substituted or unsubstituted isopropyl group, or a substituted or unsubstituted phenyl group.

In Formula 1-3-1 and Formula 1-3-2, m4 is an integer of 0 to 4, m5 is an integer of 0 to 3, and n21 and n22 are each independently an integer of 0 to 5.

If m4 is 0, the fused polycyclic compound of an embodiment may not be substituted with $R_{4-1}$. The case where m4 is 4 and $R_{4-1}$'s are all hydrogen atoms may be the same as the case where m4 is 0. If m4 is an integer of 2 or more, a plurality of $R_{4-1}$'s may all be the same, or at least one of the plurality of $R_{4-1}$'s may be different from the others.

If m5 is 0, the fused polycyclic compound of an embodiment may not be substituted with $R_{5-1}$. The case where m5 is 3 and $R_{5-1}$'s are all hydrogen atoms may be the same as the case where m5 is 0. If m5 is an integer of 2 or more, a plurality of $R_{5-1}$'s may all be the same, or at least one of the plurality of $R_{5-1}$'s may be different from the others.

If each of n21 and n22 is 0, the fused polycyclic compound of an embodiment may not be substituted with each of $R_{21}$ and $R_{22}$. The case where each of n21 and n22 is 5 and $R_{21}$'s and $R_{22}$'s are each hydrogen atoms may be the same as the case where each of n21 and n22 is 0. When each of n21 and n22 is an integer of 2 or more, a plurality of $R_{21}$'s and $R_{22}$'s may each be the same or at least one selected from among the plurality of $R_{21}$'s and $R_{22}$'s may be different from the others.

In Formula 1-3-1 and Formula 1-3-2, the same as defined with respect to Formula 1 and Formula 1-1 above may be applied to $R_{1-1}$ to $R_{3-1}$, $R_{1-1a}$ to $R_{3-1a}$, and m1 to m3.

In an embodiment, the substituent represented by Formula 2 may be represented by Formula 2-1 or Formula 2-2 below:

Formula 2-1

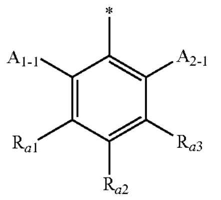

Formula 2-2

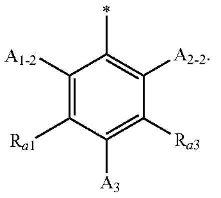

In Formula 2-1, $A_{1-1}$ and $A_{2-1}$ may be each independently a substituted or unsubstituted alkyl group having 1 to 10 carbon atoms. In an embodiment, $A_{1-1}$ and $A_{2-1}$ may be each independently a substituted or unsubstituted methyl group, or a substituted or unsubstituted isopropyl group. For example, $A_{1-1}$ and $A_{2-1}$ may be each independently an unsubstituted methyl group, or an unsubstituted isopropyl group.

In Formula 2-2, $A_{1-2}$, $A_{2-2}$, and $A_3$ may be each independently a substituted or unsubstituted alkyl group having 3 to 10 carbon atoms. In an embodiment, $A_{1-2}$, $A_{2-2}$, and $A_3$ may be each independently a substituted or unsubstituted isopropyl group. For example, $A_{1-1}$ and $A_{2-1}$ may be each independently an unsubstituted isopropyl group.

In Formula 2-1 and Formula 2-2, "——*" may be a part bonded to the aromatic ring in Formula 1. In some embodiments, in Formula 2-1 and Formula 2-2, "——*" may be a part bonded to a benzene ring in Formula 3.

In Formula 2-1 and Formula 2-2, the same as defined with respect to Formula 2 above may be applied to $R_{a1}$ to $R_{a3}$.

In an embodiment, the substituent represented by Formula 3 may be represented by Formula 3-1 or Formula 3-2 below:

Formula 3-1

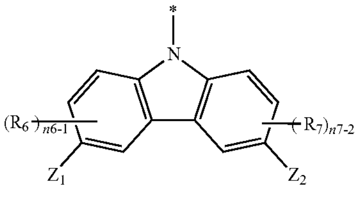

-continued

Formula 3-2

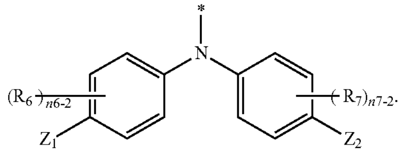

In Formula 3-1, n6-1 and n7-1 are each independently an integer of 0 to 3. If each of n6-1 and n7-1 is 0, the fused polycyclic compound of an embodiment may not be substituted with each of $R_6$ and $R_7$. The case where, in Formula 3-1, each of n6-1 and n7-1 is 3 and $R_6$'s and $R_7$'s are each hydrogen atoms may be the same as the case where each of n6-1 and n7-1 in Formula 3-1 is 0. When each of n6-1 and n7-1 is an integer of 2 or more, a plurality of $R_6$'s and $R_7$'s may each be the same or at least one selected from among the plurality of $R_6$'s and $R_7$'s may be different from the others.

In Formula 3-2, n6-2 and n7-2 are each independently an integer of 0 to 4. If each of n6-2 and n7-2 is 0, the fused polycyclic compound of an embodiment may not be substituted with each of $R_6$ and $R_7$. The case where, in Formula 3-2, each of n6-2 and n7-2 is 4 and $R_6$'s and $R_7$'s are each hydrogen atoms may be the same as the case where each of n6-2 and n7-2 in Formula 3-2 is 0. When each of n6-2 and n7-2 is an integer of 2 or more, a plurality of $R_6$'s and $R_7$'s may each be the same or at least one selected from among the plurality of $R_6$'s and $R_7$'s may be different from the others.

In Formula 3-1 and Formula 3-2, "——*" may be a part bonded to the aromatic ring in Formula 1.

In Formula 3-1 and Formula 3-2, the same as defined with respect to Formula 3 above may be applied to $Z_1$, $Z_2$, $R_6$, and $R_7$.

In an embodiment, the fused polycyclic compound represented by Formula 1 may be represented by Formula 1-4-1 or Formula 1-4-2 below:

Formula 1-4-1

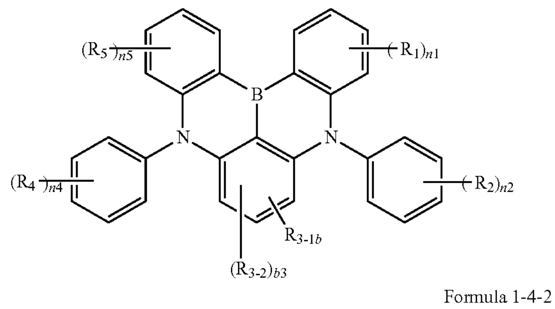

Formula 1-4-2

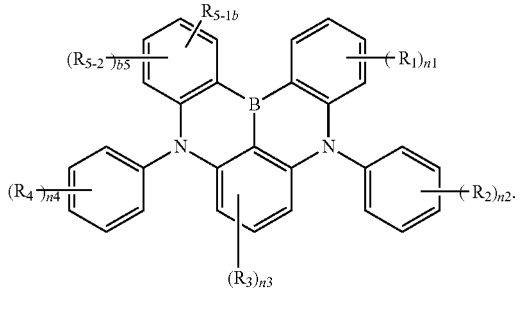

Formula 1-4-1 and Formula 1-4-2 represent that, in Formula 1, C1 to C5 are specified as a substituted or unsubstituted benzene ring, and the types (e.g., kinds) of substituent, $R_3$ or $R_5$ are specified. In some embodiments, Formula 1-4-1 and Formula 1-4-2 represent the case where any one selected from among the substituents represented by $R_1$ to $R_5$ in Formula 1 is essentially represented by Formula 3. Formula 1-4-1 represents the case where, in Formula 1, the substituent represented by $R_3$ is represented by Formula 3. Formula 1-4-2 represents the case where, in Formula 1, the substituent represented by $R_5$ is represented by Formula 3.

In Formula 1-4-1 and Formula 1-4-2, $R_{3-2}$ and $R_{5-2}$ may be each independently a hydrogen atom, a deuterium atom, a halogen atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms. In some embodiments, $R_{3-2}$ and $R_{5-2}$ may each be bonded to an adjacent group to form a ring. For example, $R_{3-2}$ and $R_{5-2}$ may be each independently a hydrogen atom or a deuterium atom.

In Formula 1-4-1 and Formula 1-4-2, $R_{3-1b}$ and $R_{5-1b}$ may be each independently represented by Formula 3 above.

In Formula 1-4-1, b3 is an integer of 0 to 2. If b3 is 0, the fused polycyclic compound of an embodiment may not be substituted with $R_{3-2}$. The case where, in Formula 1-4-1, b3 is 2 and $R_{3-2}$'s are all hydrogen atoms may be the same as the case where b3 is 0 in Formula 1-4-1. If b3 is 2, a plurality of $R_{3-2}$'s may all be the same, or at least one of the plurality of $R_{3-2}$'s may be different from the others.

In Formula 1-4-2, b5 is an integer of 0 to 3. If b5 is 0, the fused polycyclic compound of an embodiment may not be substituted with $R_{5-2}$. The case where, in Formula 1-4-2, b5 is 3 and $R_{5-2}$'s are all hydrogen atoms may be the same as the case where b5 is 0 in Formula 1-4-2. If b5 is an integer of 2 or more, a plurality of $R_{5-2}$'s may all be the same, or at least one of the plurality of $R_{5-2}$'s may be different from the others.

In Formula 1-4-1 and Formula 1-4-2, the same as defined with respect to Formula 1 above may be applied to $R_1$ to $R_5$, and n1 to n5.

In an embodiment, the fused polycyclic compound represented by Formula 1 may be represented by Formula 1-5-1 or Formula 1-5-2 below:

Formula 1-5-1

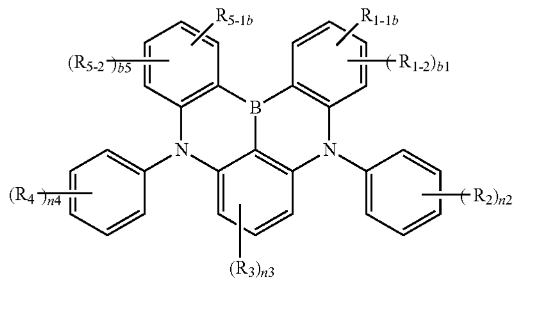

-continued

Formula 1-5-2

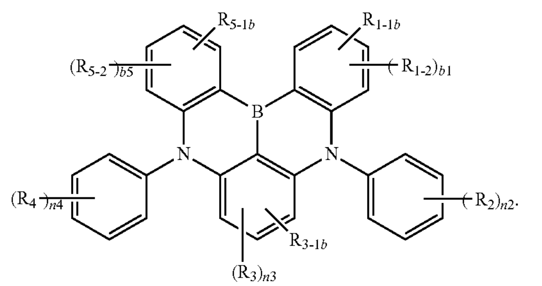

Formula 1-5-1 and Formula 1-5-2 represent that, in Formula 1, C1 to C5 are specified as a substituted or unsubstituted benzene ring, and the types (e.g., kinds) of substituent, $R_1$, $R_3$, or $R_5$ are specified. In some embodiments, Formula 1-5-1 and Formula 1-5-2 represent the case where at least two selected from among the substituents represented by $R_1$ to $R_5$ in Formula 1 are represented by Formula 3. Formula 1-5-1 represents the case where, in Formula 1, the substituents represented by $R_1$ and $R_5$ are represented by Formula 3. Formula 1-5-2 represents the case where, in Formula 1, the substituents represented by $R_1$, $R_3$, and $R_5$ are represented by Formula 3.

In Formula 1-5-1 and Formula 1-5-2, $R_{1-2}$, $R_{3-2}$, and $R_{5-2}$ may be each independently a hydrogen atom, a deuterium atom, a halogen atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms. In some embodiments, $R_{1-2}$, $R_{3-2}$, and $R_{5-2}$ may each be bonded to an adjacent group to form a ring. For example, $R_{1-2}$, $R_{3-2}$, and $R_{5-2}$ may be each independently a hydrogen atom or a deuterium atom.

In Formula 1-5-1 and Formula 1-5-2, $R_{1-1b}$, $R_{3-1b}$, and $R_{5-1b}$ may be each independently represented by Formula 3.

In Formula 1-5-1 and Formula 1-5-2, b1 and b5 are each independently an integer of 0 to 3. If each of b1 and b5 is 0, the fused polycyclic compound of an embodiment may not be substituted with each of $R_{1-2}$ and $R_{5-2}$. The case where, in Formula 1-5-1 and Formula 1-5-2, each of b1 and b5 is 3 and $R_{1-2}$'s and $R_{5-2}$'s are each hydrogen atoms may be the same as the case where each of b1 and b5 is 0 in Formula 1-5-1 and Formula 1-5-2. When each of b1 and b5 is an integer of 2 or more, a plurality of $R_{1-2}$'s and $R_{5-2}$'s may each be the same or at least one selected from among the plurality of $R_{1-2}$'s and $R_{5-2}$'s may be different from the others.

In Formula 1-5-2, b3 is an integer of 0 to 2. If b3 is 0, the fused polycyclic compound of an embodiment may not be substituted with $R_{3-2}$. The case where, in Formula 1-5-2, b3 is 2 and $R_{3-2}$'s are all hydrogen atoms may be the same as the case where b3 is 0 in Formula 1-5-2. If b3 is 2, a plurality of $R_{3-2}$'s may all be the same, or at least one of the plurality of $R_{3-2}$'s may be different from the others.

In Formula 1-5-1 and Formula 1-5-2, the same as defined with respect to Formula 1 above may be applied to $R_2$ to $R_4$, and n2 to n4.

In an embodiment, the condensed polycyclic compound represented by Formula 1 may be represented by Formula 1-6 below:

Formula 1-6

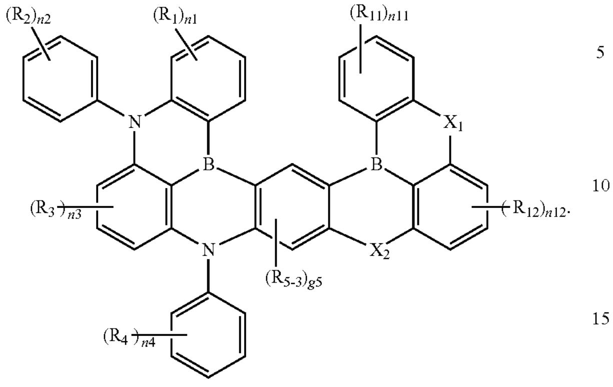

Formula 1-6 represents the case where, in Formula 1, $R_5$'s are provided in plurality, are linked to the para-position and the meta-position with the boron atom, and are bonded to each other to form an additional ring. Formula 1-6 represents a structure in which two rings are further fused via an additional boron atom, $X_1$, and $X_2$ in the fused cyclic core in Formula 1.

In Formula 1-6, $X_1$ and $X_2$ may be each independently $NR_{13}$, or O.

In Formula 1-6, $R_{5-3}$, and $R_{11}$ to $R_{13}$ may be each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, a substituted or unsubstituted heteroaryl group of 2 to 30 ring-forming carbon atoms, the substituent represented by Formula 2, or the substituent represented by Formula 3. For example, $R_{5-3}$, and $R_{11}$ to $R_{13}$ may be each independently a hydrogen atom, a deuterium atom, a substituted or unsubstituted t-butyl group, a substituted or unsubstituted phenyl group, a substituted or unsubstituted biphenyl group, a substituted or unsubstituted terphenyl group, a substituted or unsubstituted amine group, a substituted or unsubstituted carbazole group, the substituent represented by Formula 2, or the substituent represented by Formula 3.

In Formula 1-6, n11 is an integer of 0 to 4, n12 is an integer of 0 to 3, and g5 is an integer of 0 to 2.

If n11 is 0, the fused polycyclic compound of an embodiment may not be substituted with $R_{11}$. The case where n11 is 4 and $R_{11}$'s are all hydrogen atoms may be the same as the case where n11 is 0. If n11 is an integer of 2 or more, a plurality of $R_{11}$'s may all be the same, or at least one of the plurality of $R_{11}$'s may be different from the others.

If n12 is 0, the fused polycyclic compound of an embodiment may not be substituted with $R_{12}$. The case where n12 is 3 and $R_{12}$'s are all hydrogen atoms may be the same as the case where n12 is 0. If n12 is an integer of 2 or more, a plurality of $R_{12}$'s may all be the same, or at least one of the plurality of $R_{12}$'s may be different from the others.

If g5 is 0, the fused polycyclic compound of an embodiment may not be substituted with $R_{5-3}$. The case where g5 is 2 and $R_{5-3}$'s are all hydrogen atoms may be the same as the case where g5 is 0. If g5 is 2, a plurality of $R_{5-3}$'s may all be the same, or at least one of the plurality of $R_{5-3}$'s may be different from the others.

As described above in Formula 1, in Formula 1-6, $R_1$ to $R_3$ are all represented by Formula 2, or at least one selected from among $R_1$ to $R_5$ is represented by Formula 3.

In Formula 1-6, the same as defined with respect to Formula 1 above may be applied to $R_1$ to $R_4$, and n1 to n4.

In an embodiment, the fused polycyclic compound represented by Formula 1-6 may be represented by Formula 1-7-1 or Formula 1-7-2 below:

Formula 1-7-1

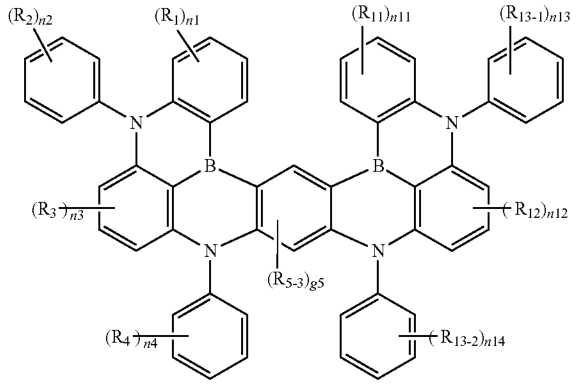

Formula 1-7-2

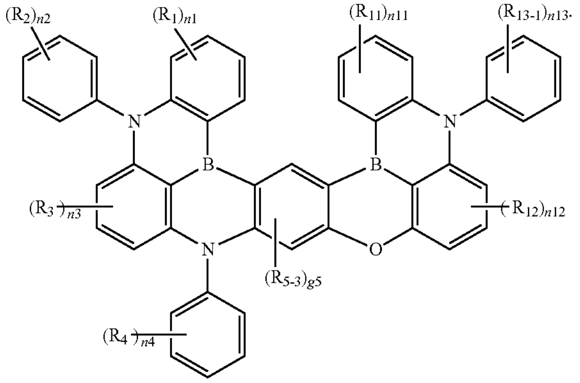

Formula 1-7-1 and Formula 1-7-2 represent cases where the types (e.g., kinds) of substituents, $X_1$ and $X_2$ are specified in Formula 1-6.

In Formula 1-7-1 and Formula 1-7-2, $R_{13-1}$ and $R_{13-2}$ may be each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, or the substituent represented by Formula 2. For example, $R_{13-1}$ and $R_{13-2}$ may be each independently a hydrogen atom, a deuterium atom, a substituted or unsubstituted phenyl group, or the substituent represented by Formula 2.

In Formula 1-7-1 and Formula 1-7-2, n13 and n14 are each independently an integer of 0 to 5. If each of n13 and n14 is 0, the fused polycyclic compound of an embodiment may not be substituted with each of $R_{13-1}$ and $R_{13-2}$. The case where each of n13 and n14 is 5 and $R_{13-1}$'s and $R_{13-2}$'s are each hydrogen atoms may be the same as the case where each of n13 and n14 is 0. When each of n13 and n14 is an integer of 2 or more, a plurality of $R_{13-1}$'s and $R_{13-2}$'s may each be the same or at least one selected from among the plurality of $R_{13-1}$'s and $R_{13-2}$'s may be different from the others.

In Formula 1-7-1 and Formula 1-7-2, the same as defined with respect to Formula 1 and Formula 1-6 above may be applied to $R_1$ to $R_4$, $R_{5-3}$, $R_{11}$, $R_{12}$, n1 to n4, g5, n11 and n12.

The fused polycyclic compound of an embodiment may be any one selected from among the compounds represented in Compound Group 1 below. The light emitting device ED of an embodiment may include at least one fused polycyclic compound selected from among the compounds represented by Compound Group 1 in the emission layer EML.
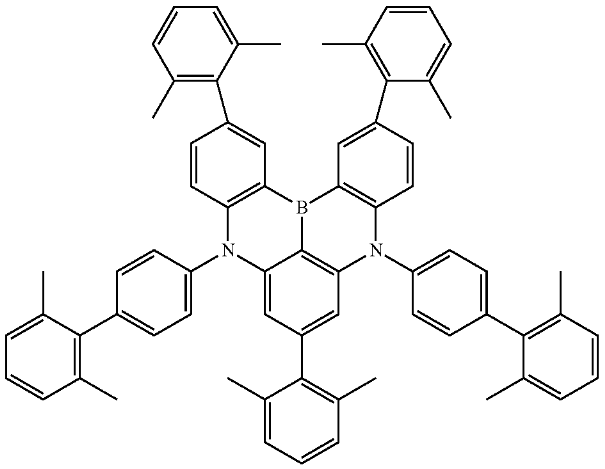
1
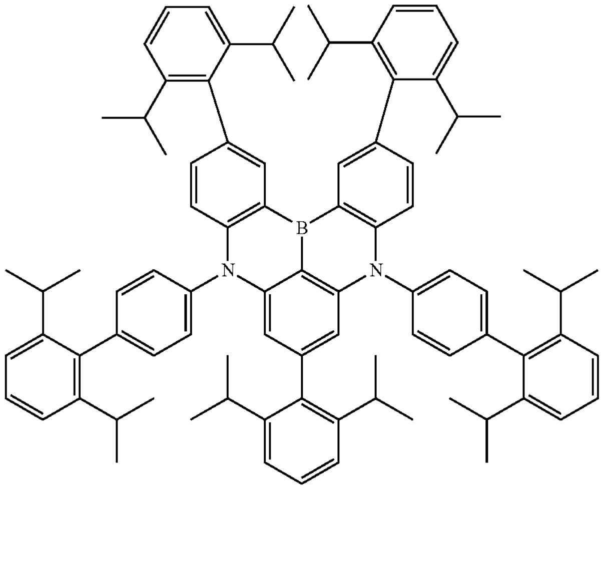
2

-continued
3
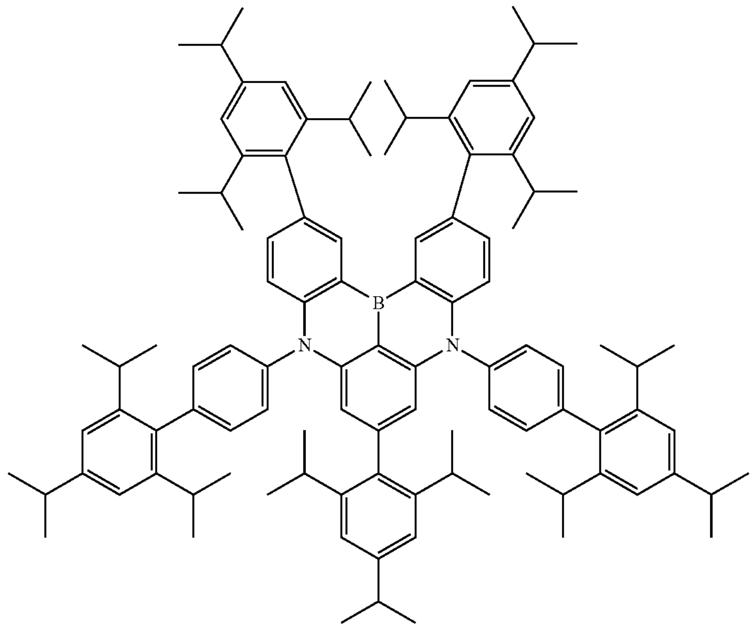
4
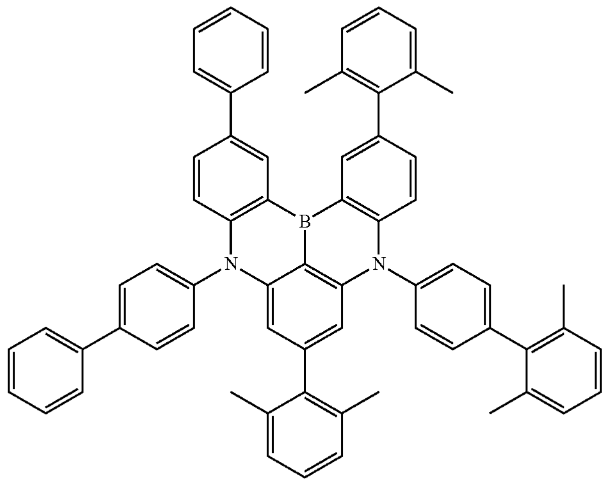
5
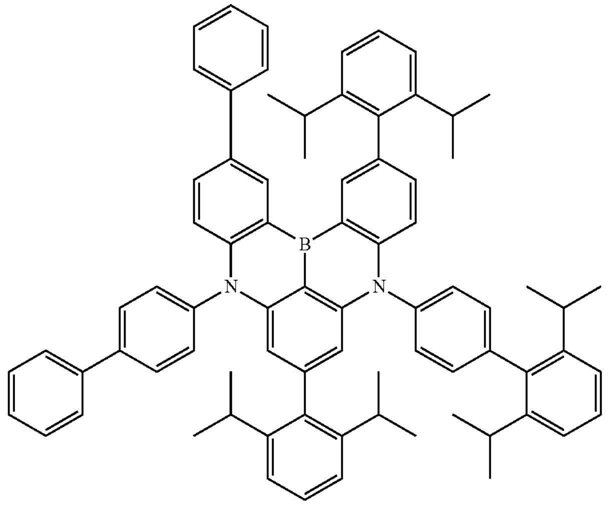

-continued
6
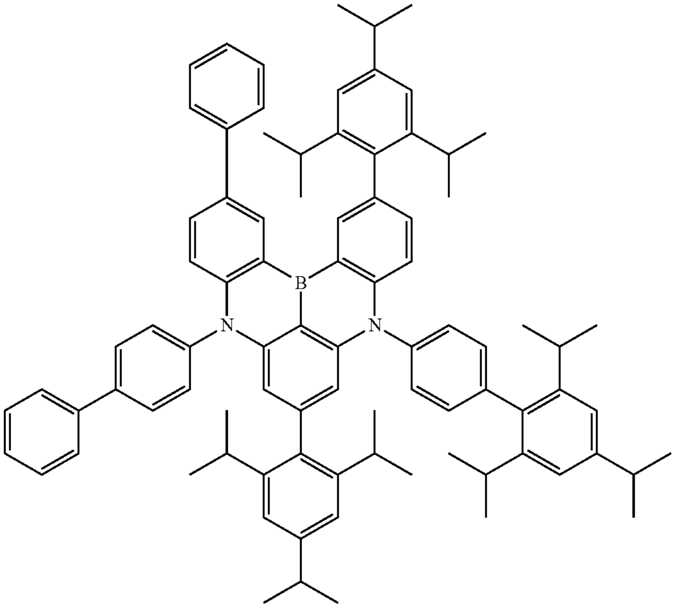
7
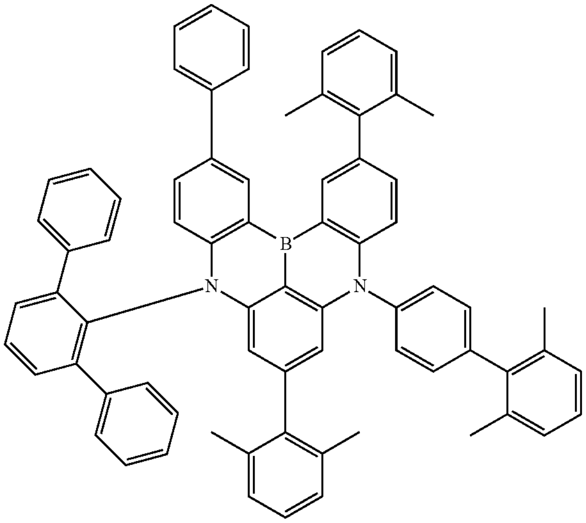
8
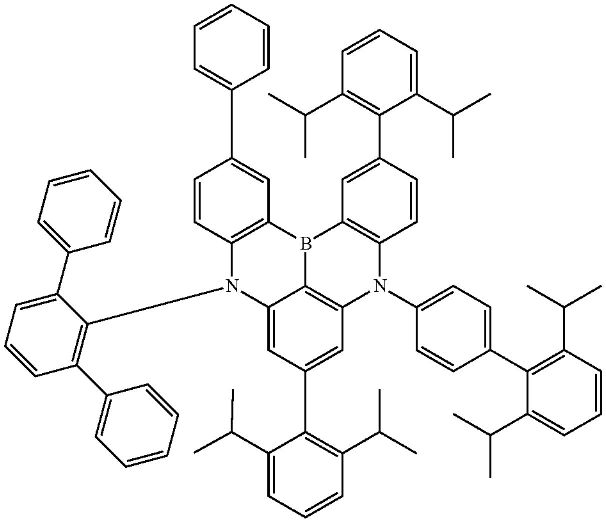

-continued
9
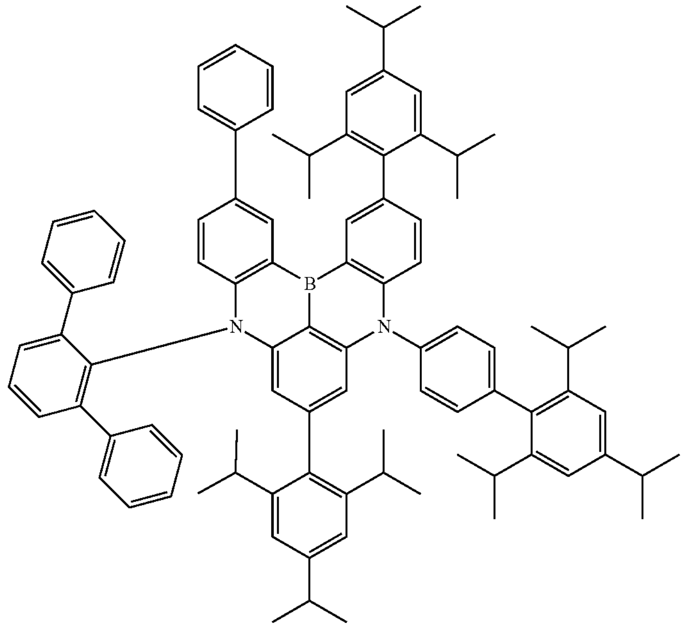
10
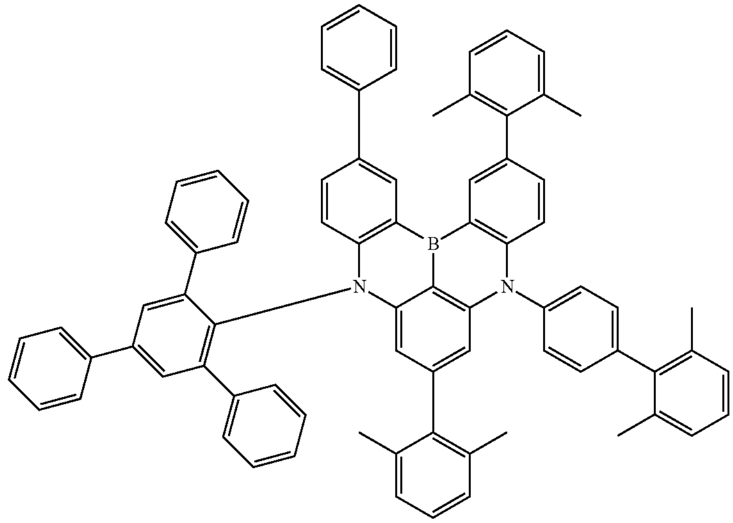

-continued
11
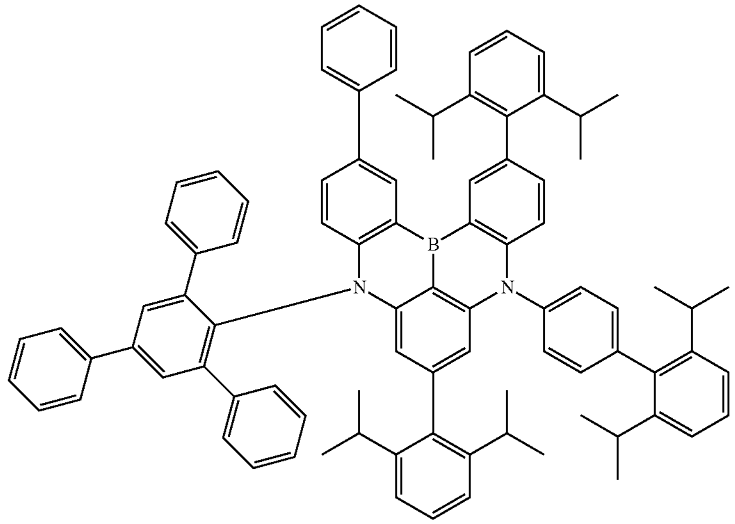
12
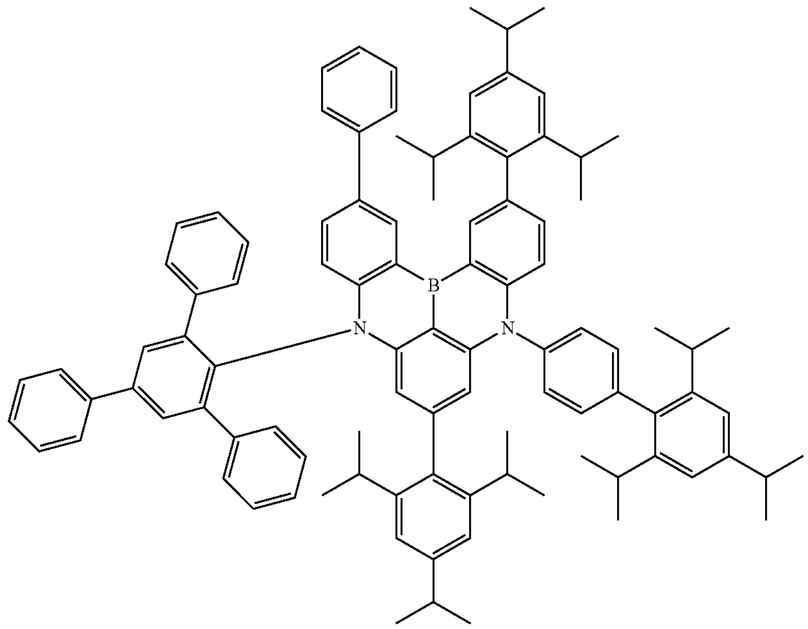

-continued
13
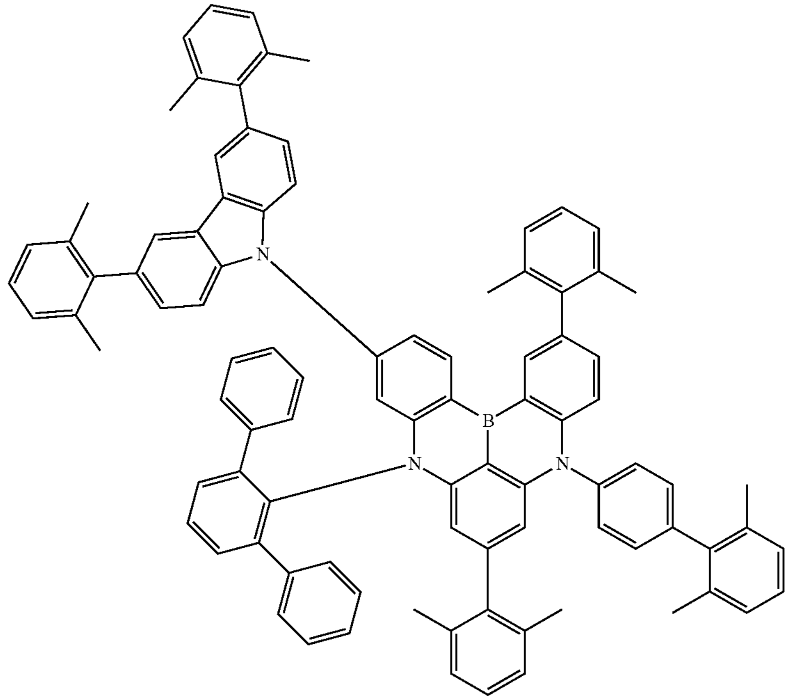
14
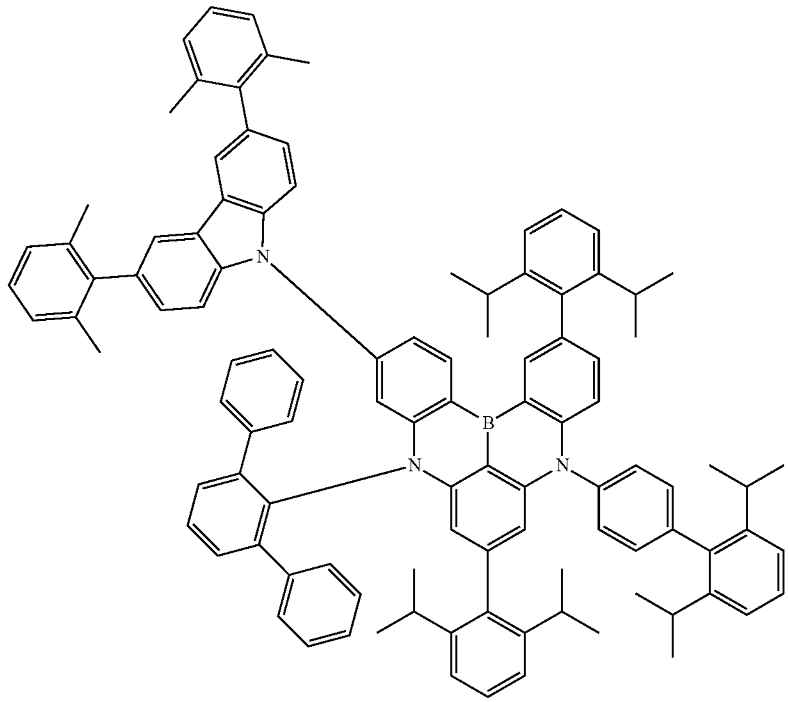

-continued
15
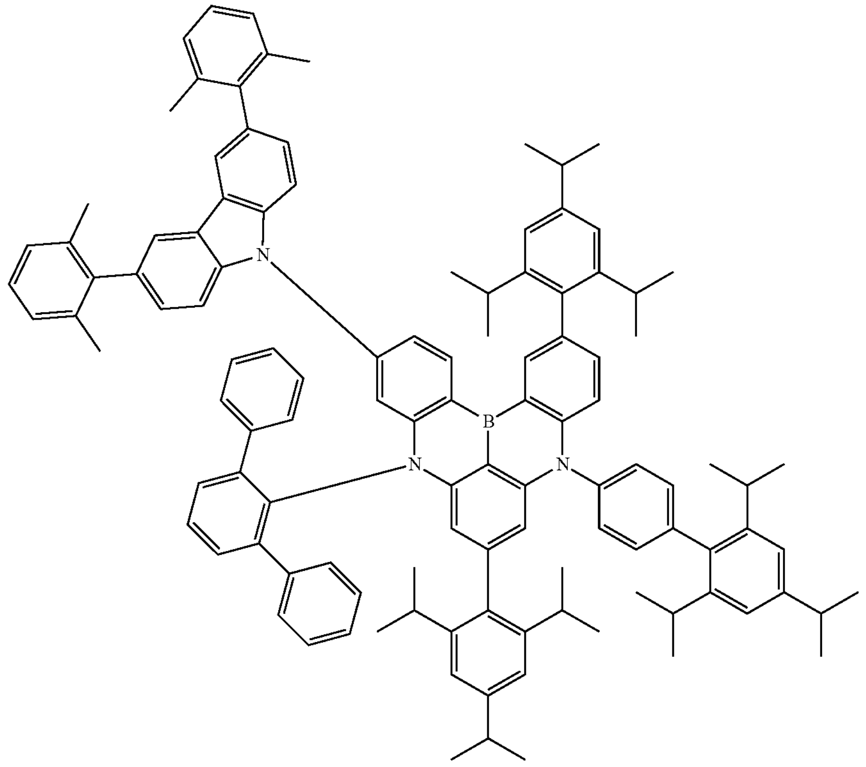
16
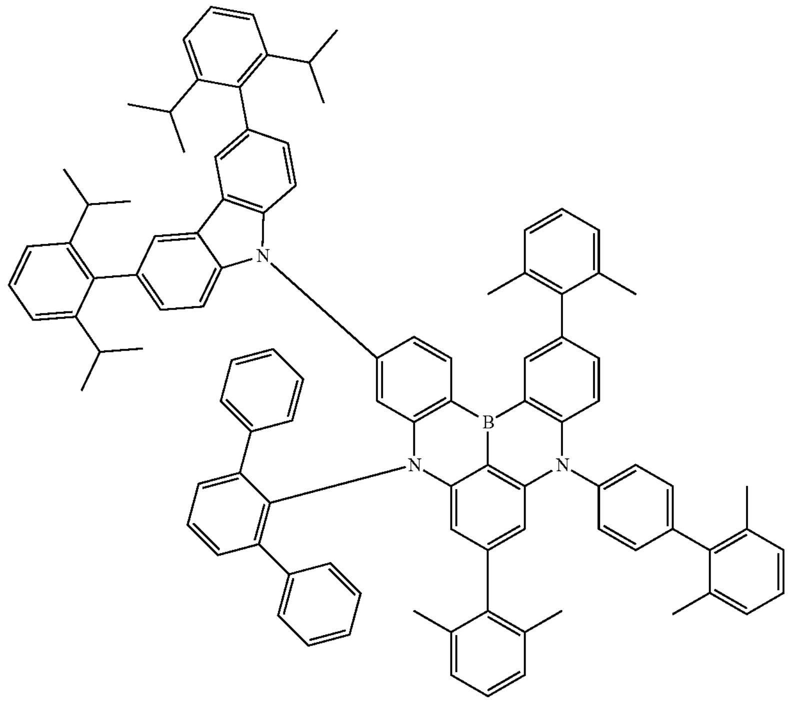

-continued
17
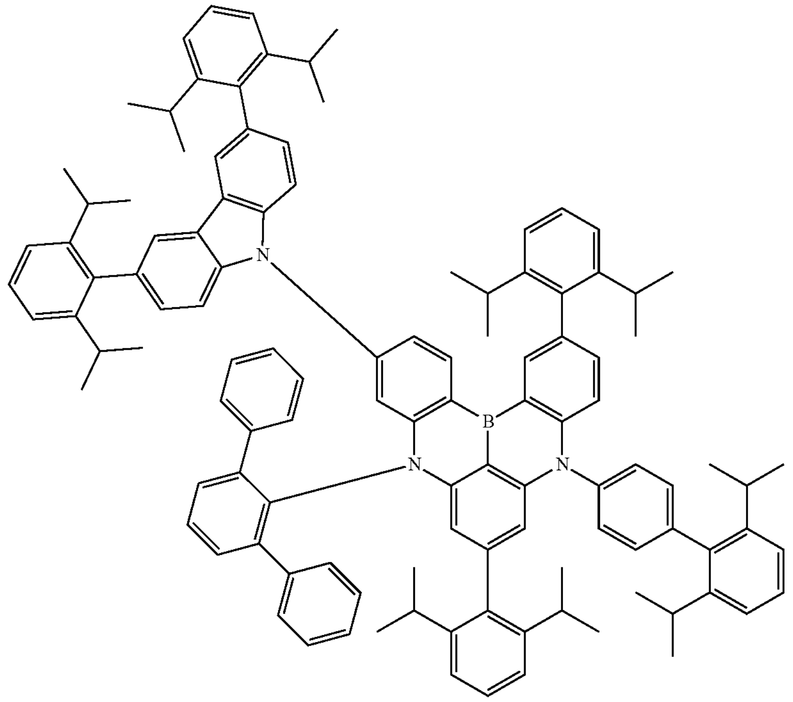
18
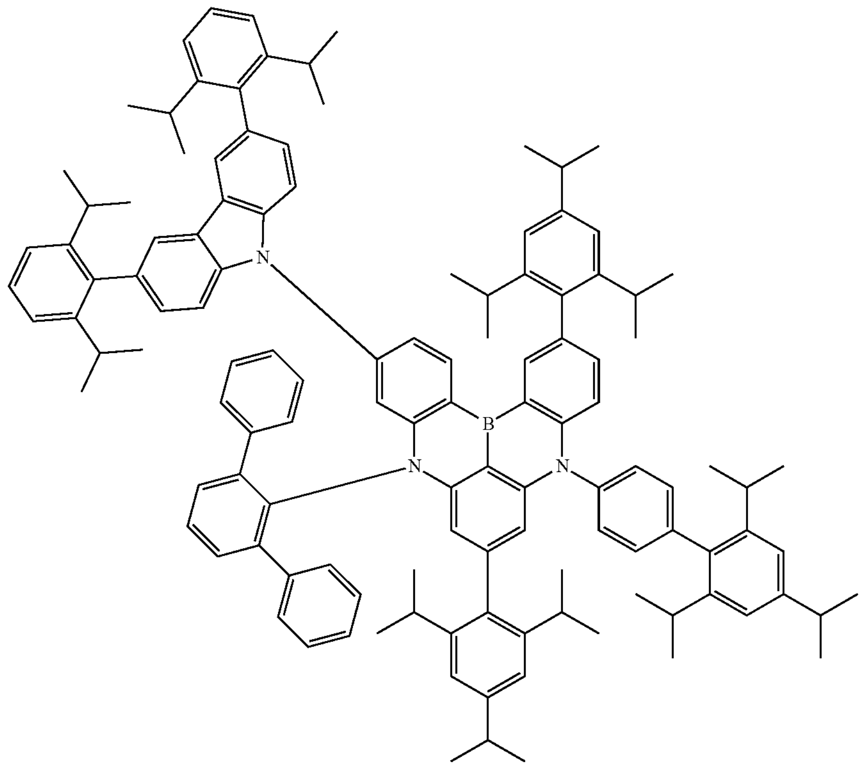

-continued
19
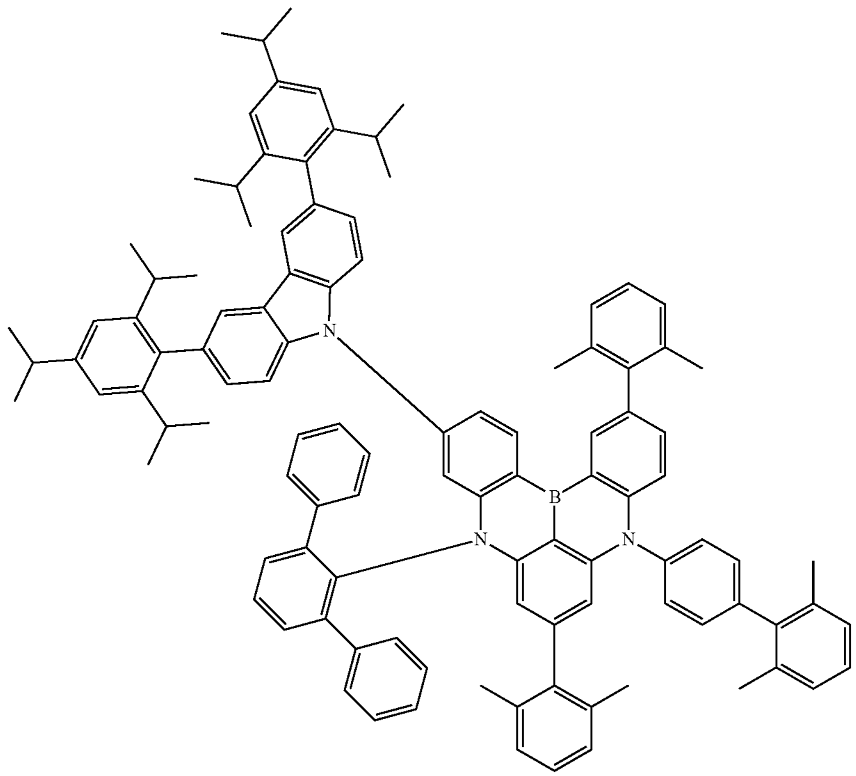
20
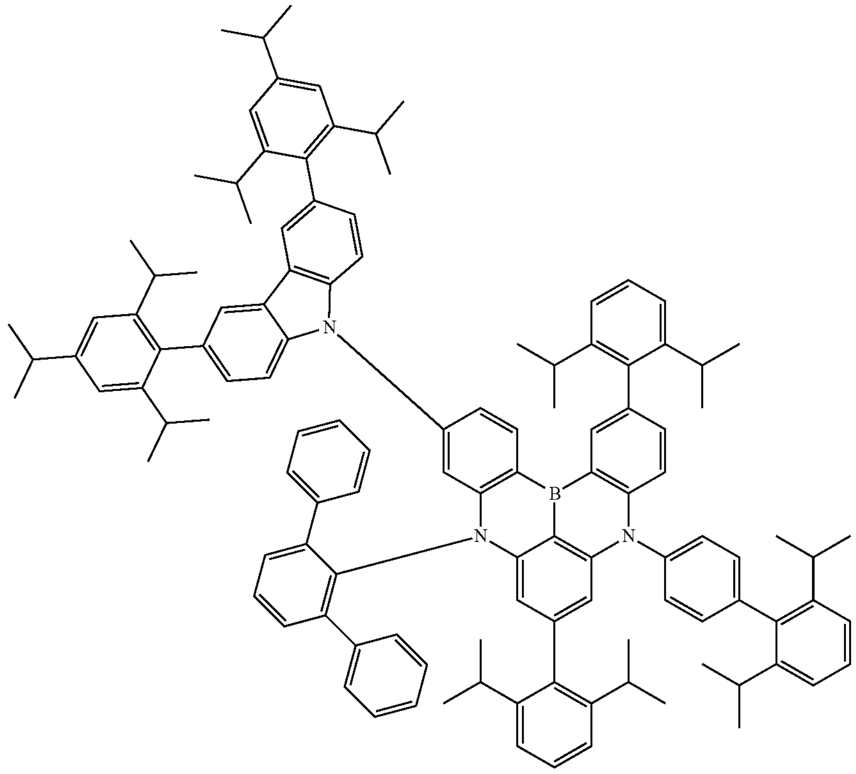

-continued
21
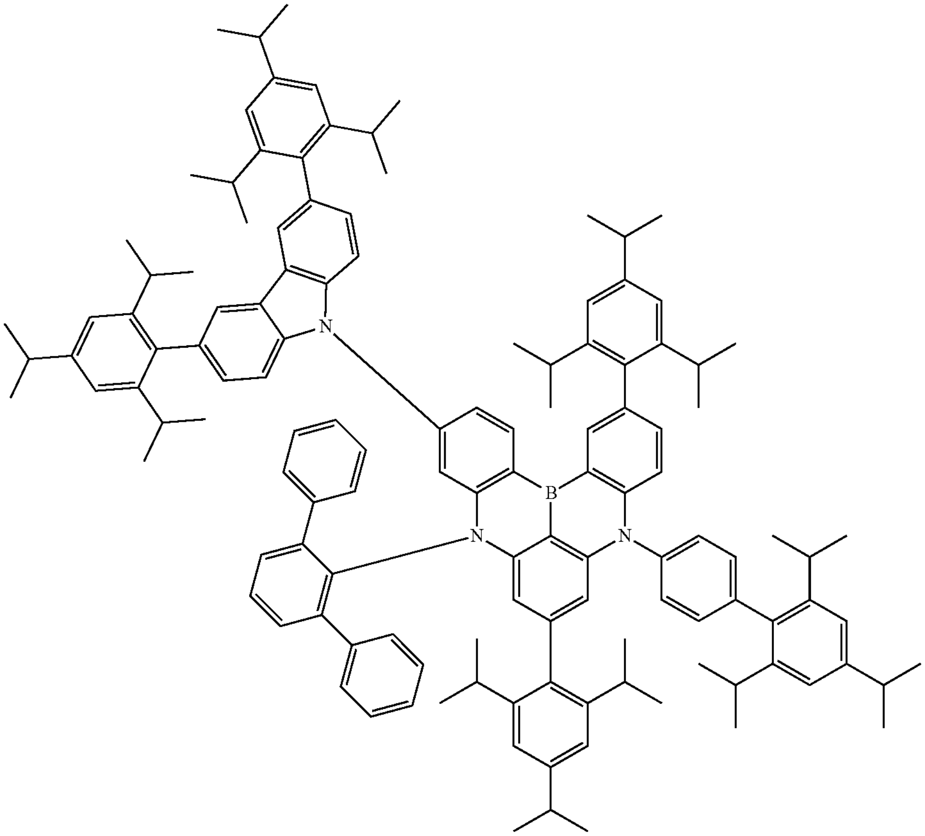
22
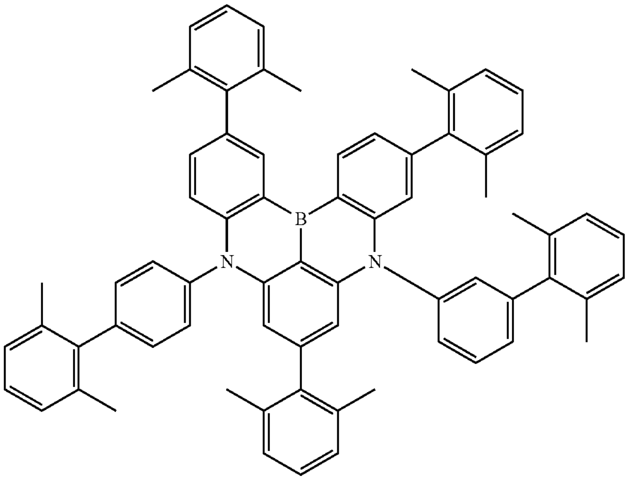

-continued
23
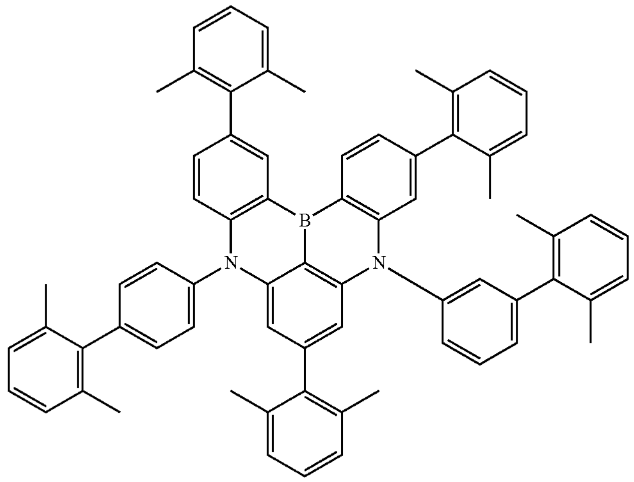
24
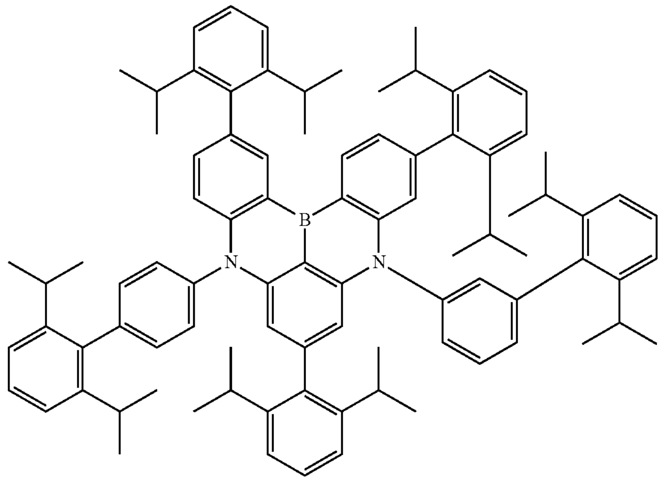
25
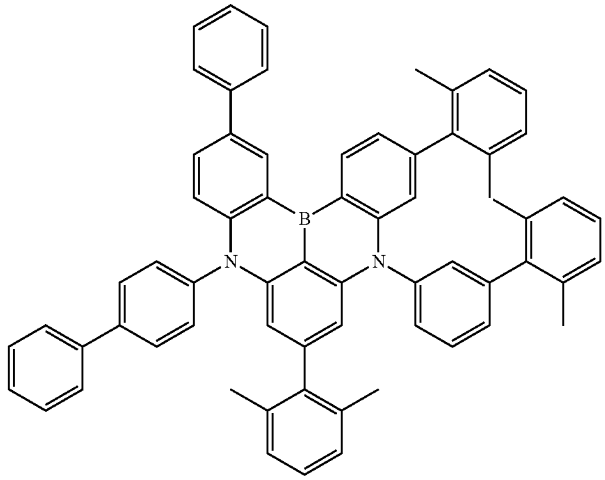

-continued
26
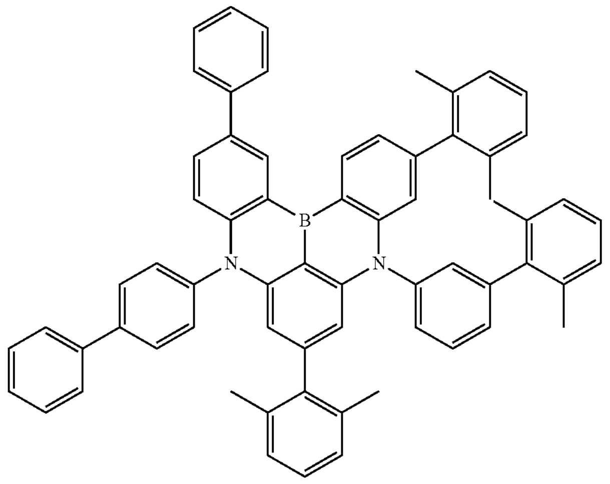
27
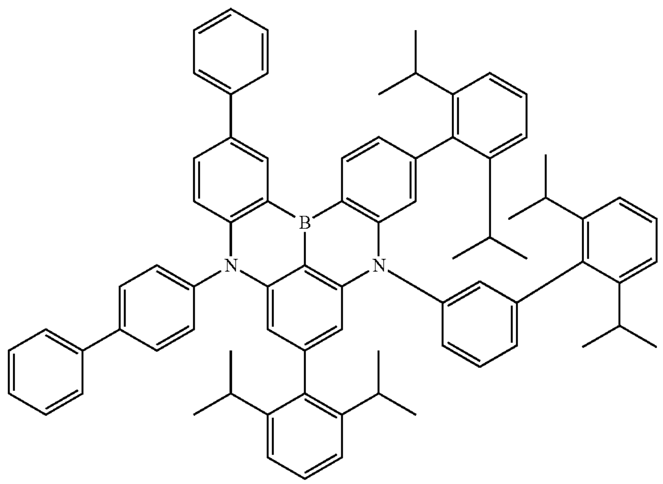
28
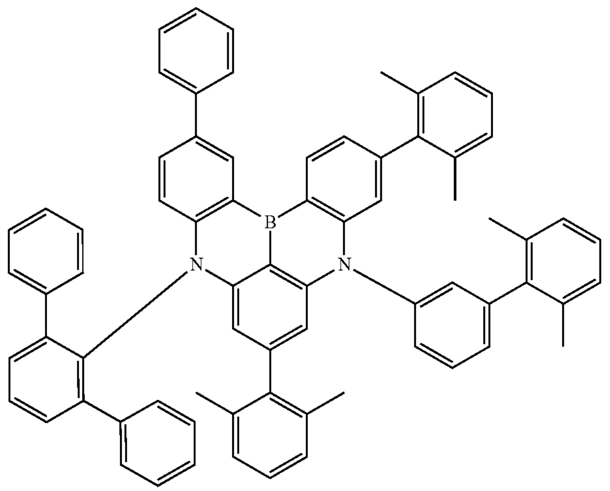

-continued
29
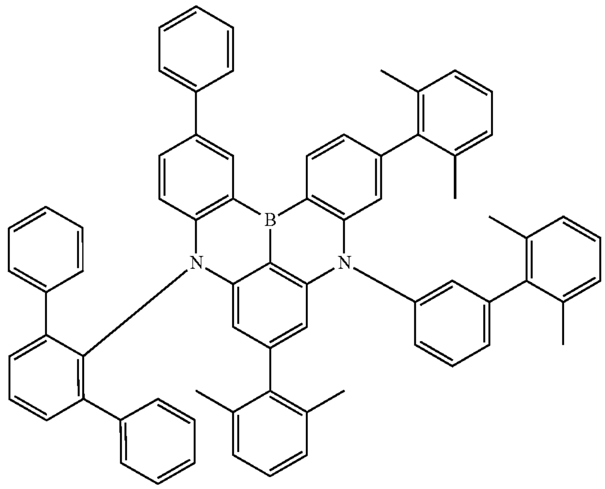
30
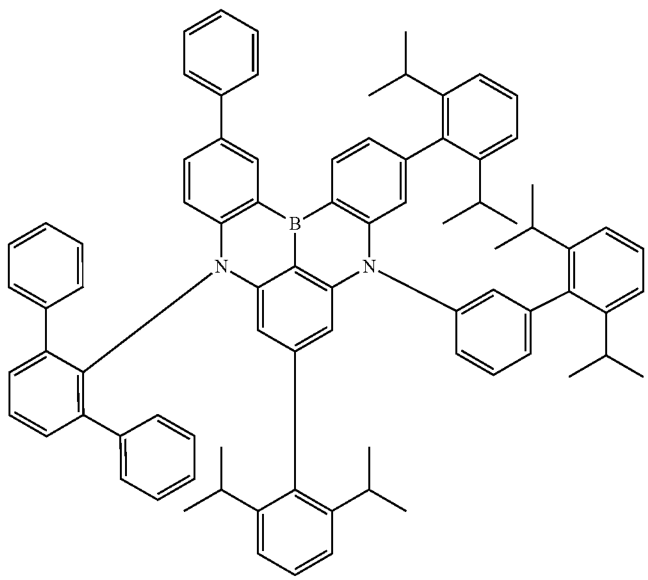
31
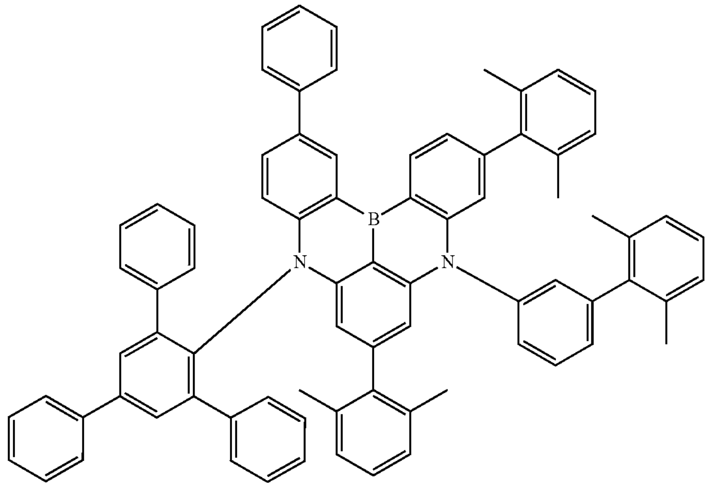

-continued
32
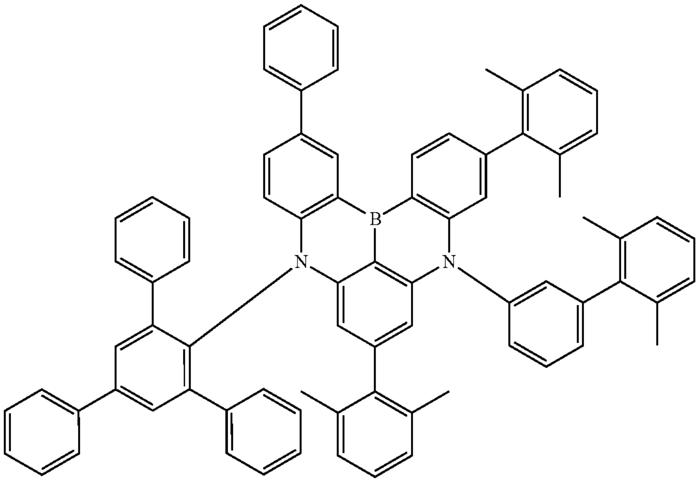
33
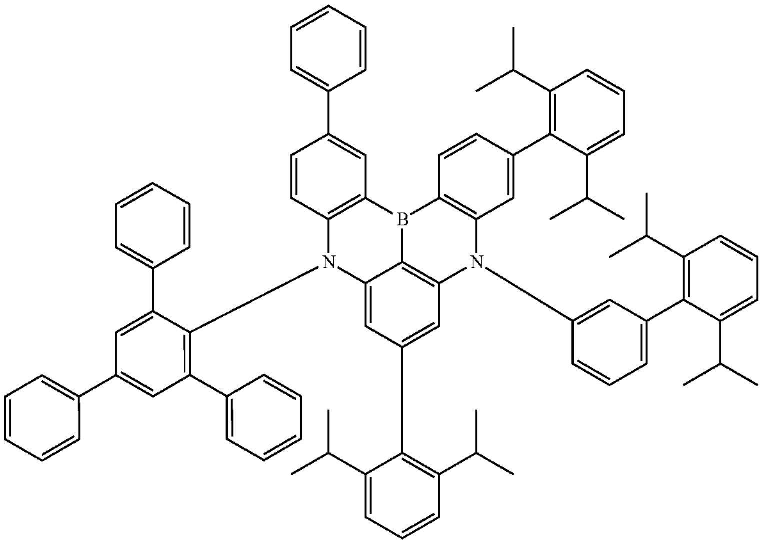
34
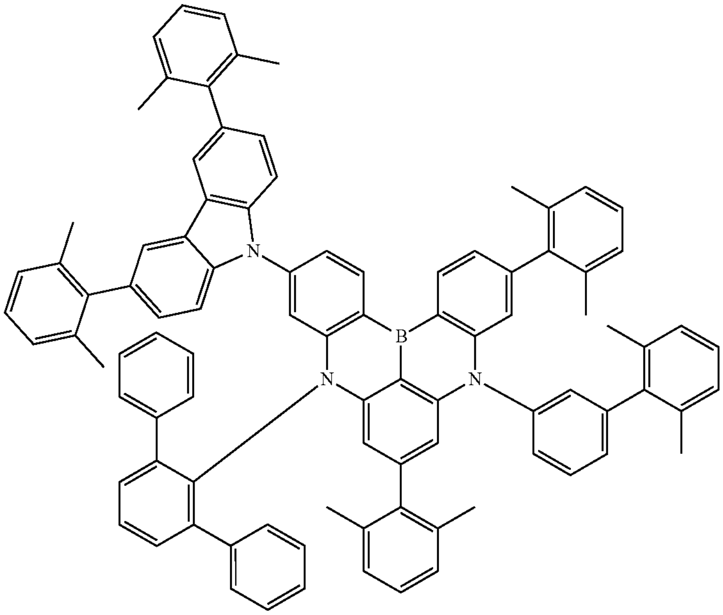

-continued
35
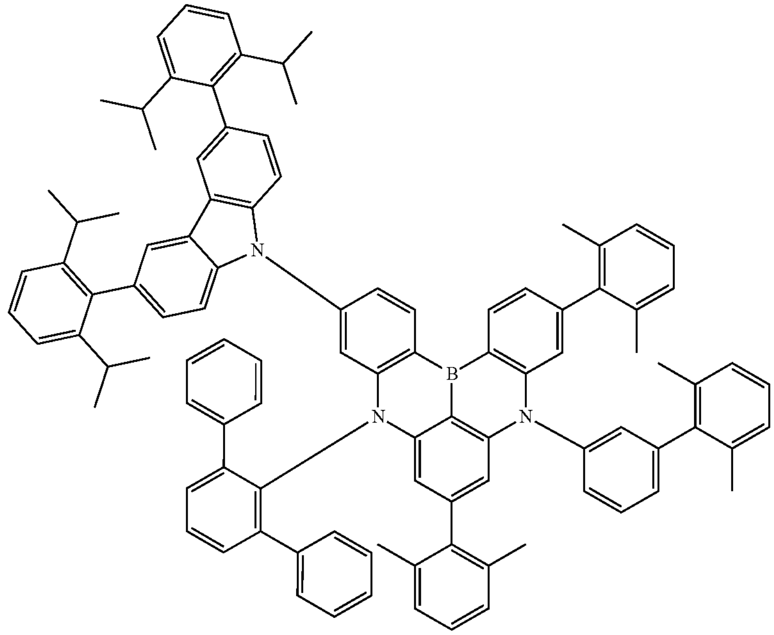
36
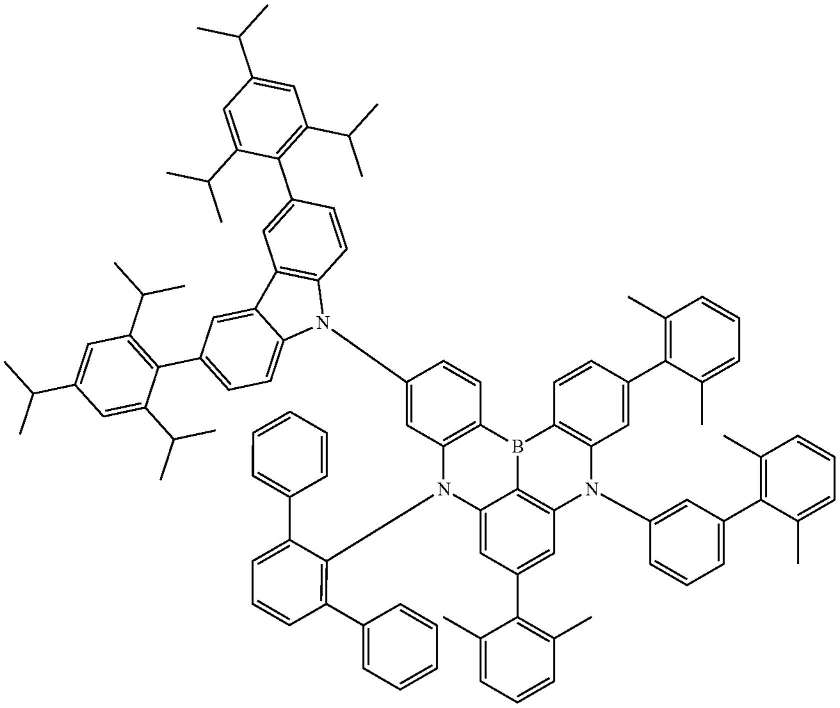

-continued
37
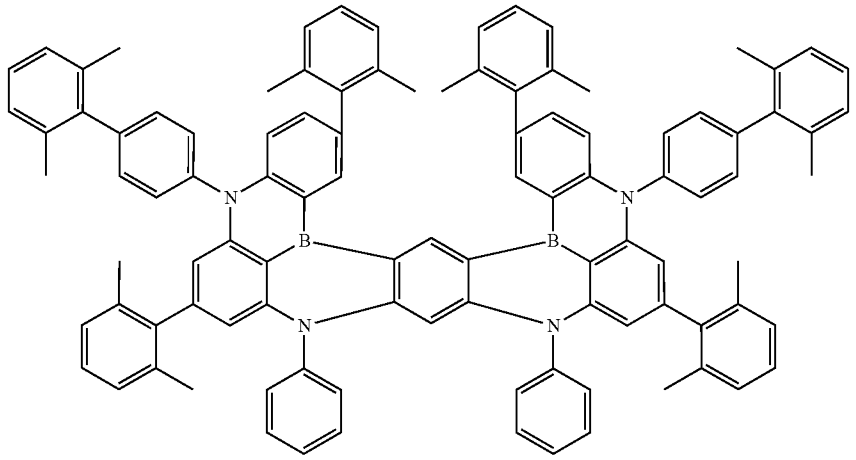
38
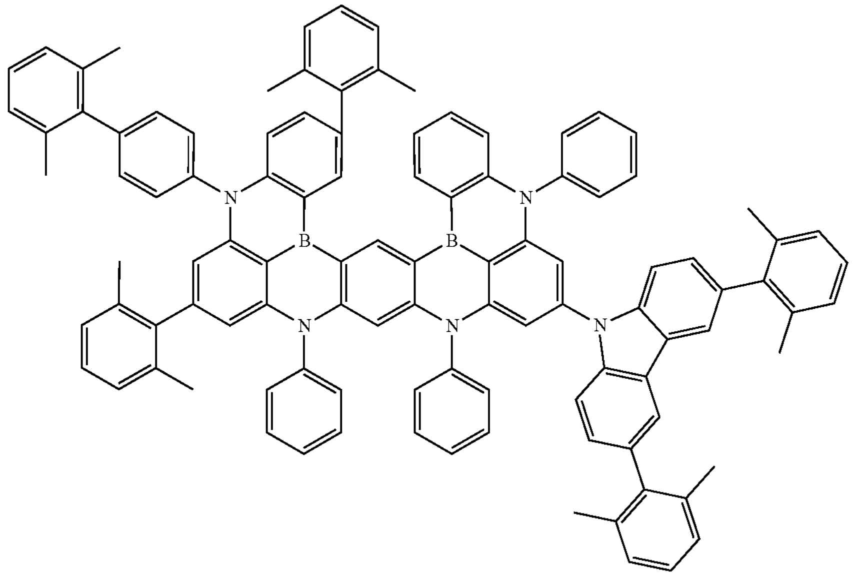
39
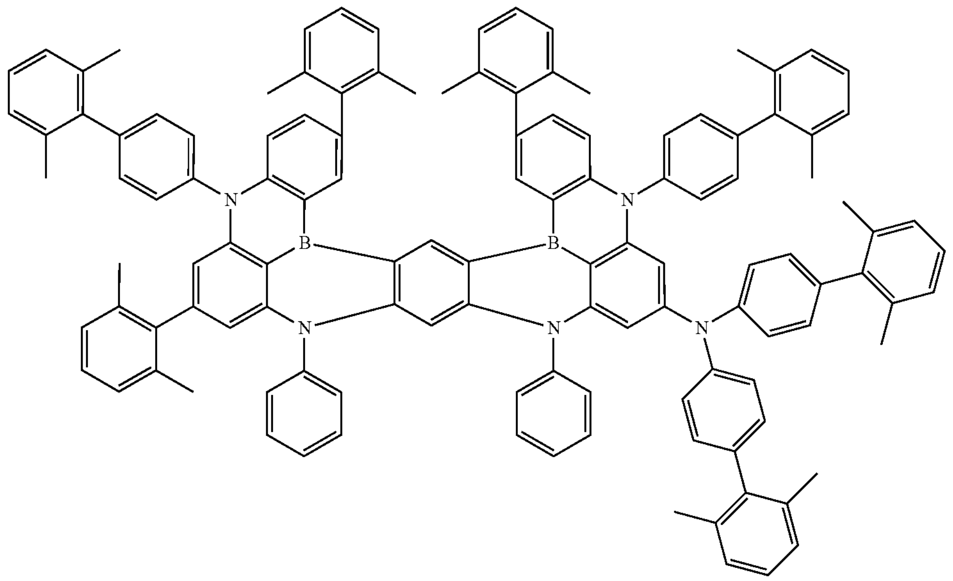

-continued
40
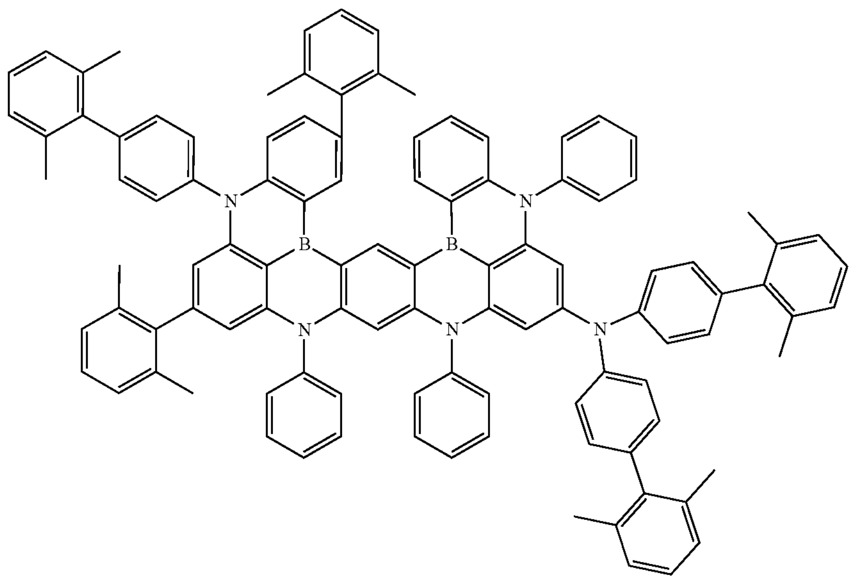
41
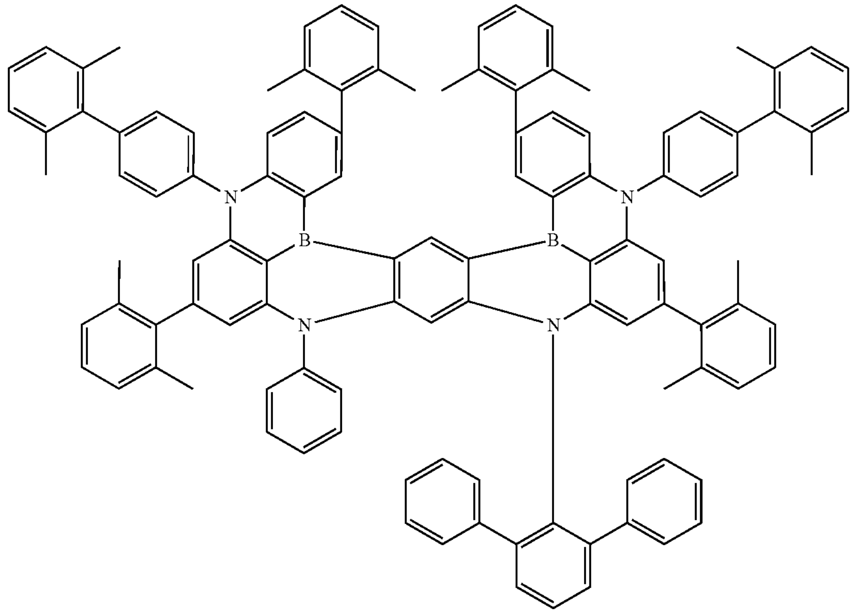

-continued
42
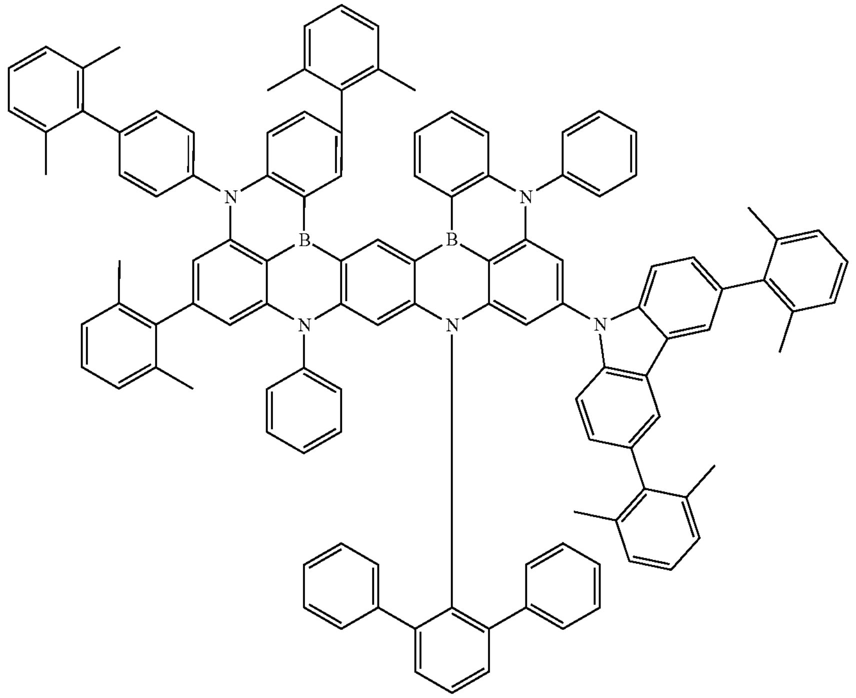
43
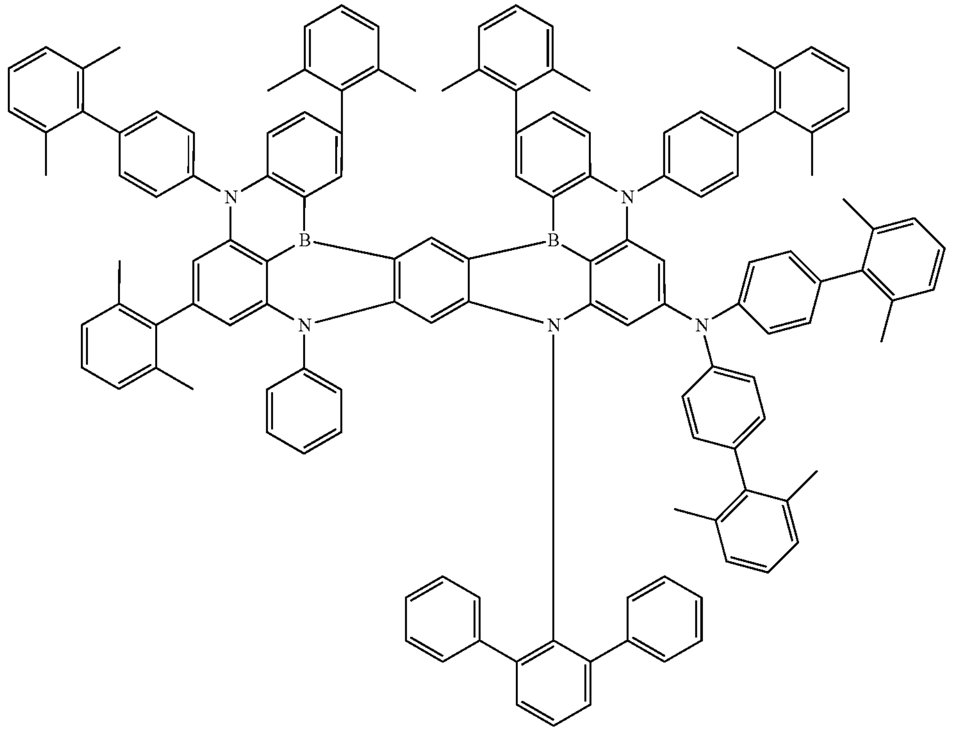

-continued
44
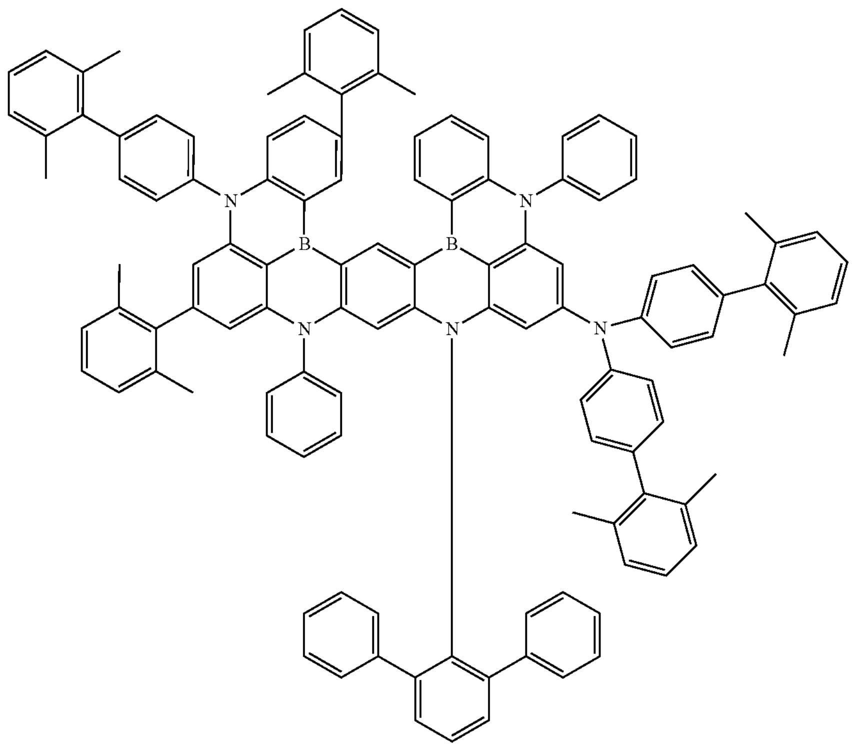
45
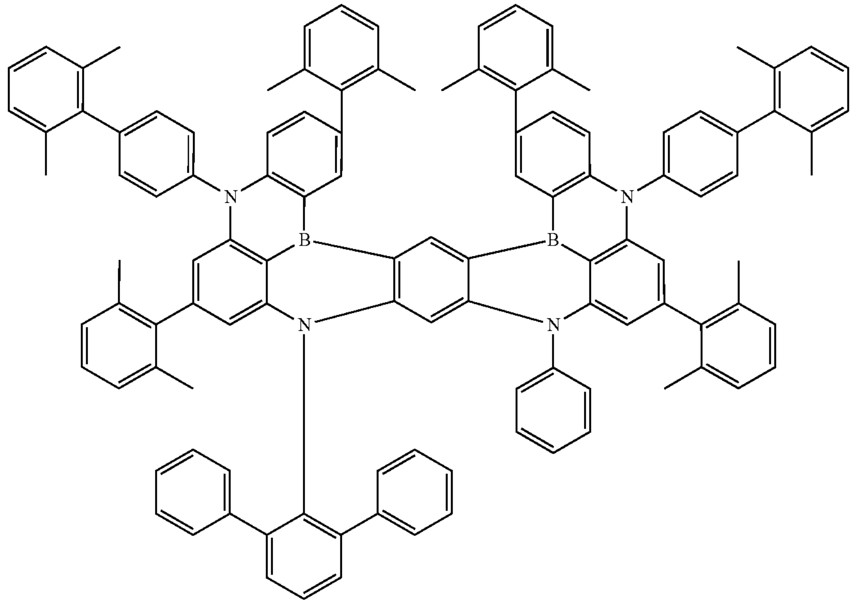

-continued
46
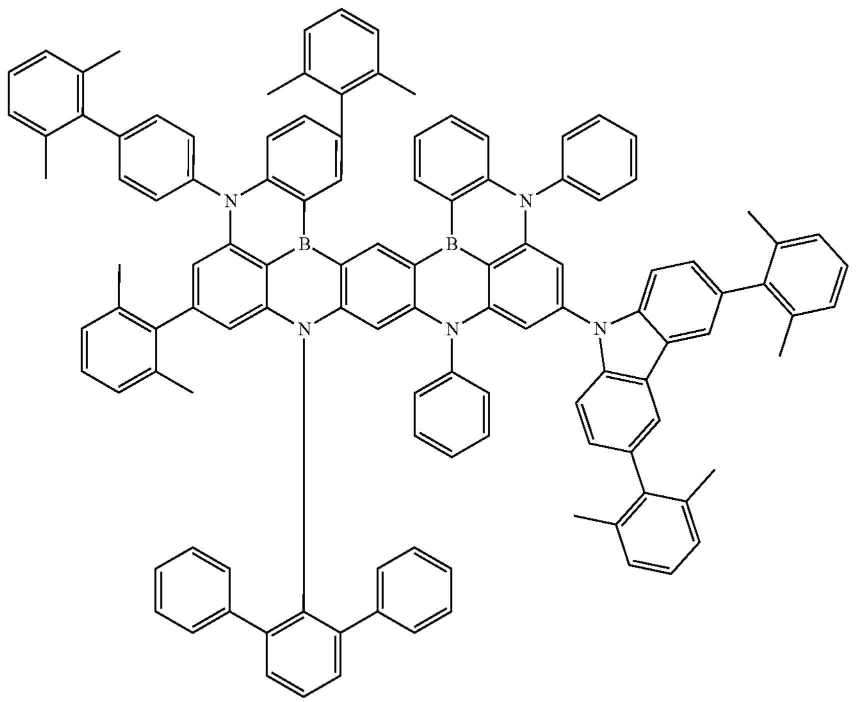
47
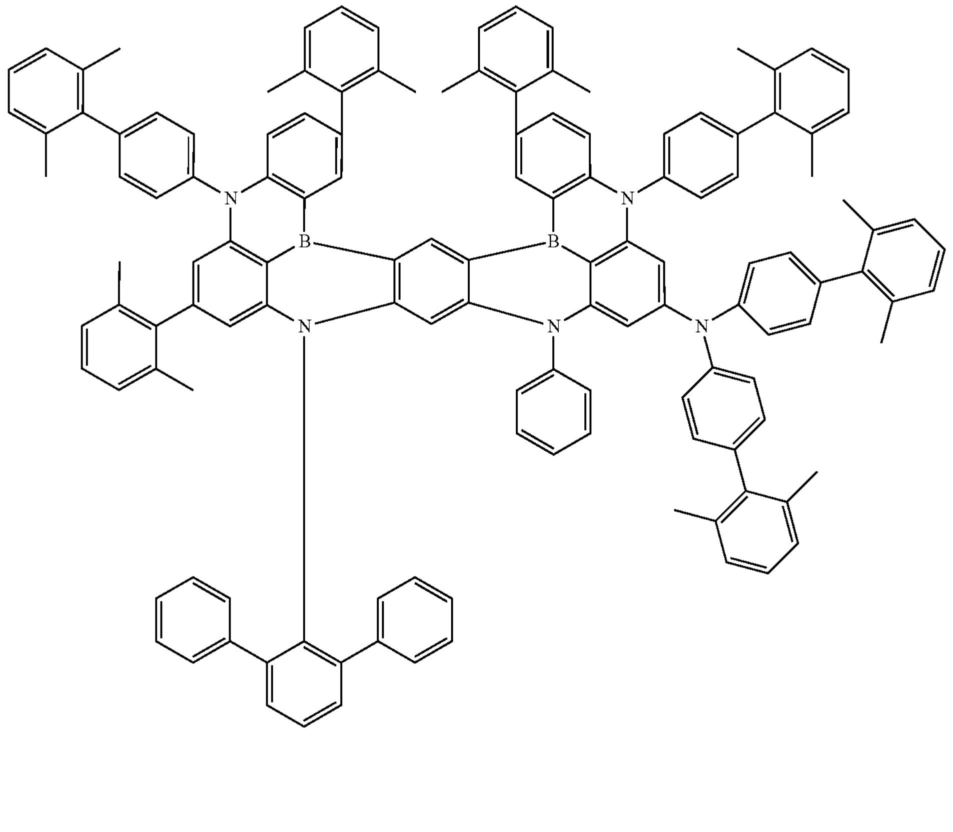

-continued
48
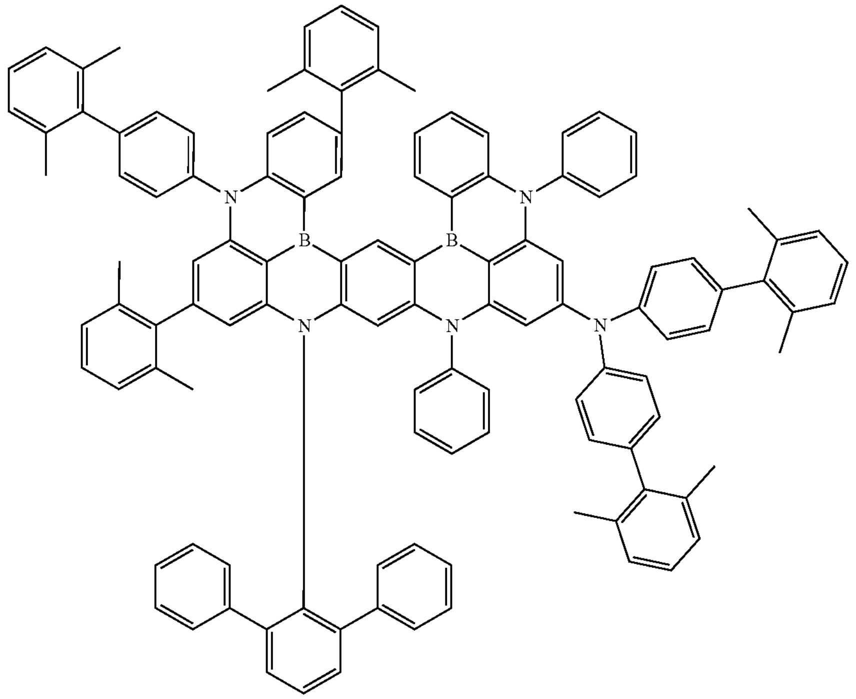
49
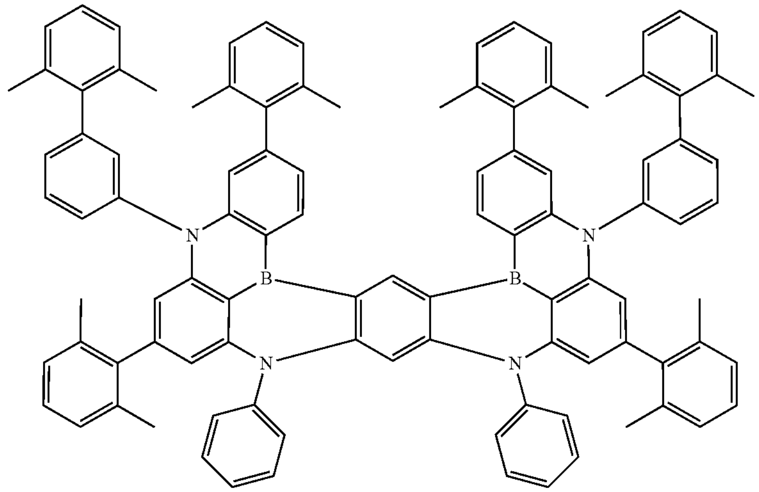

-continued
50
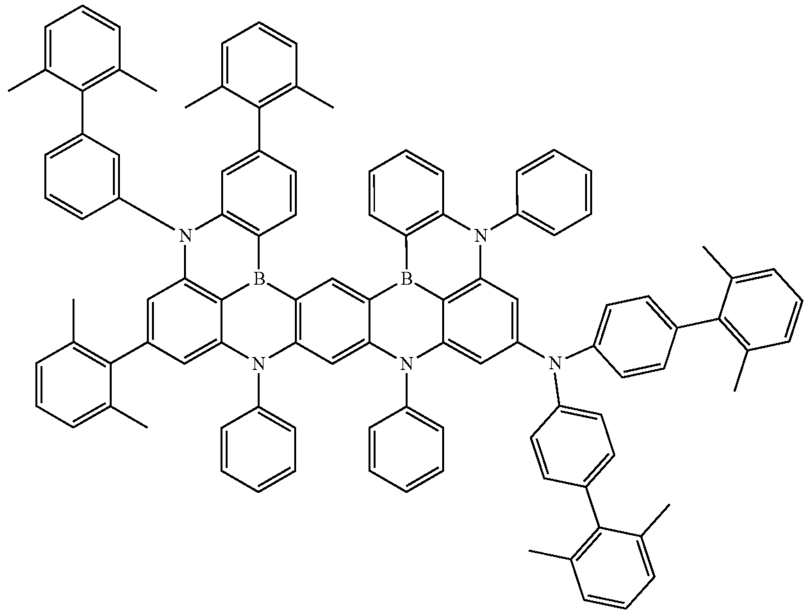
51
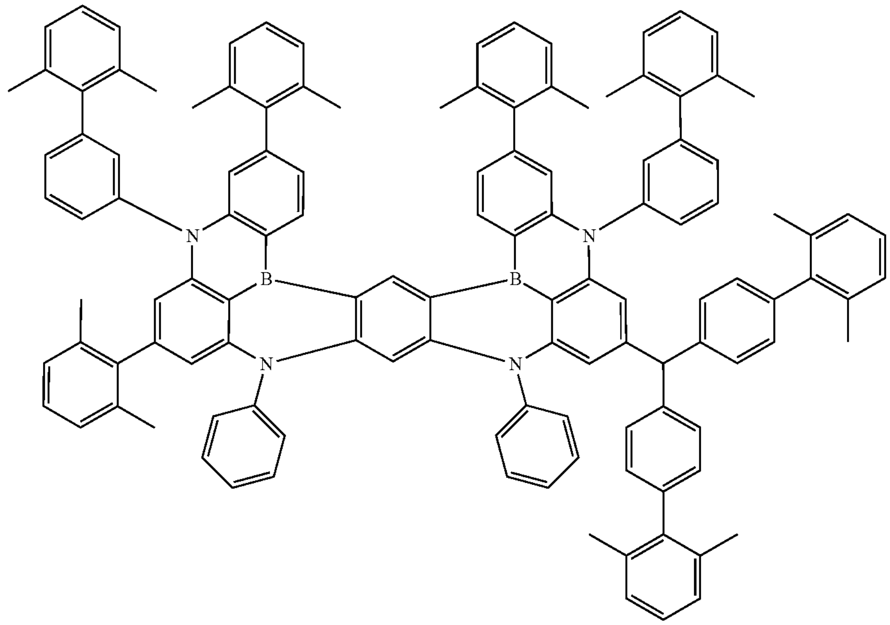

-continued
52
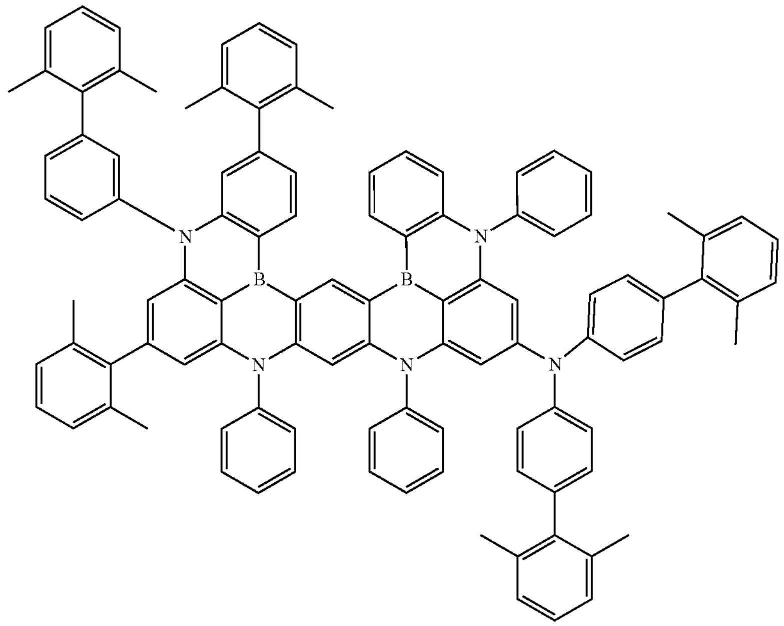
53
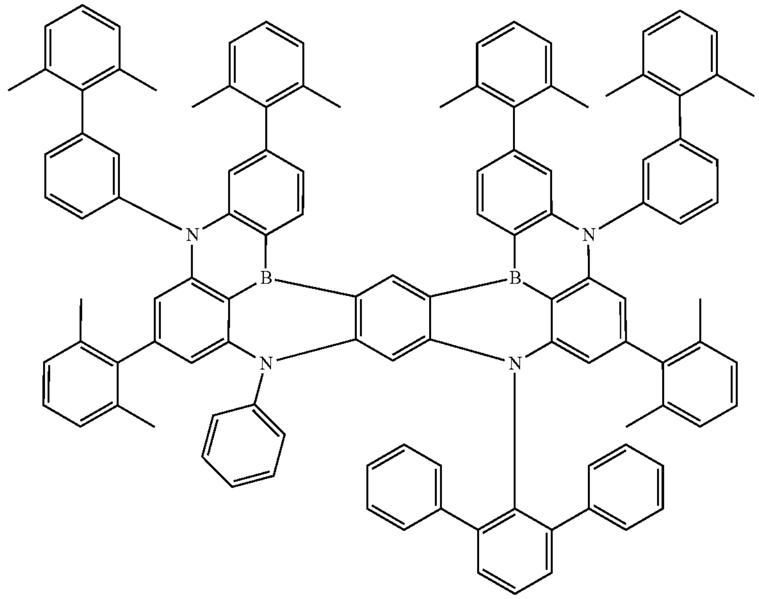

-continued
54
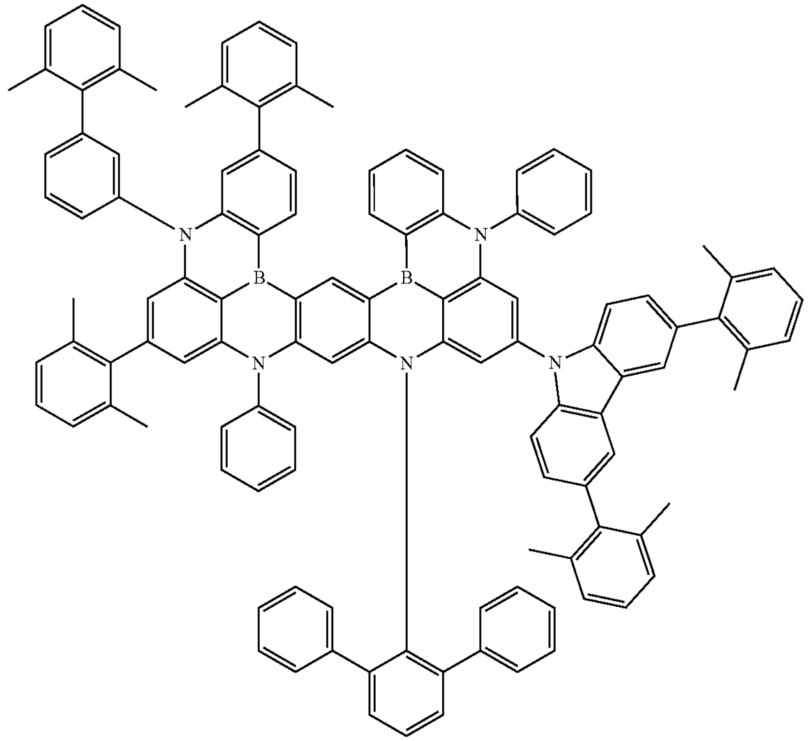
55
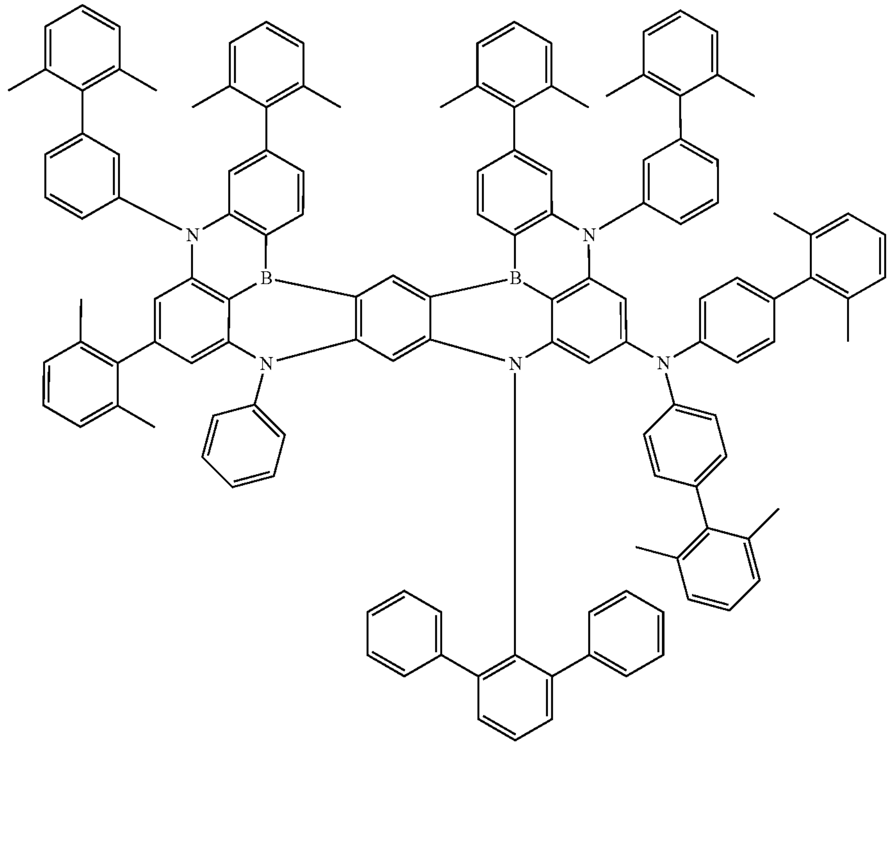

-continued
56
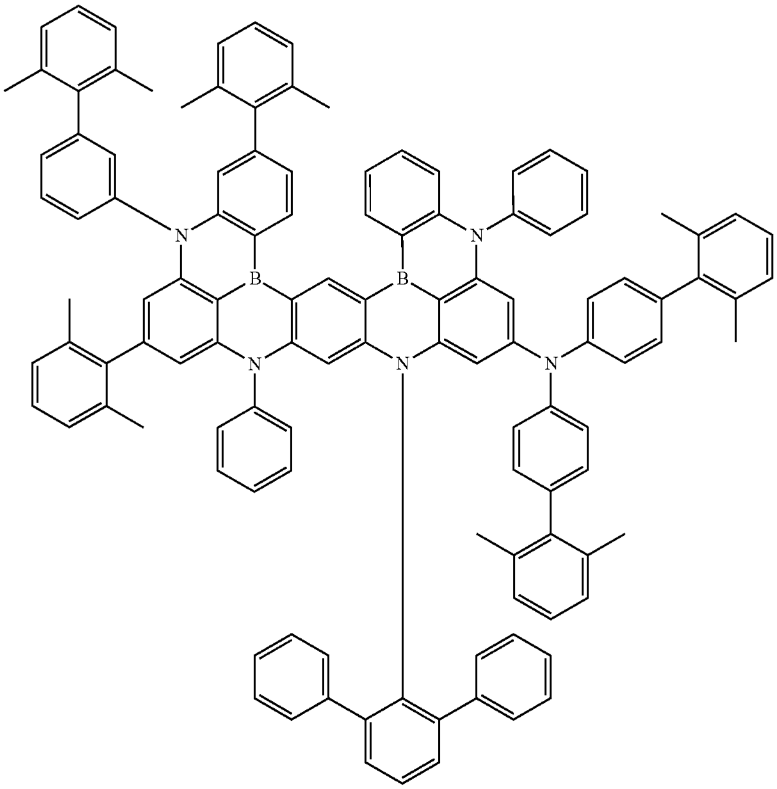
57
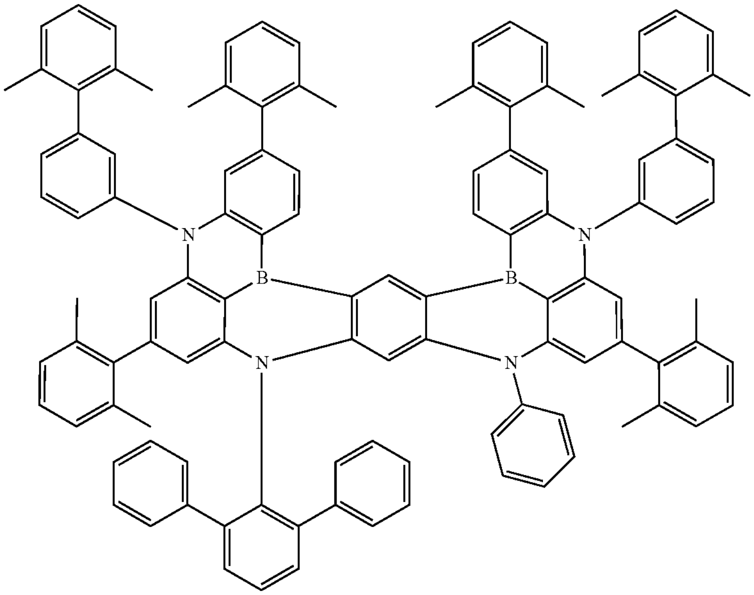

-continued
58
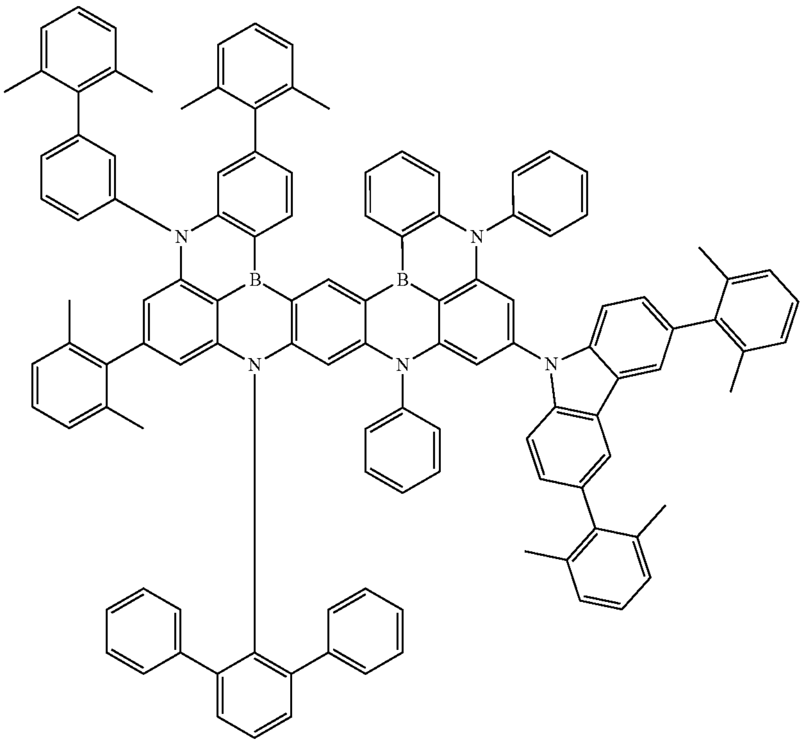
59
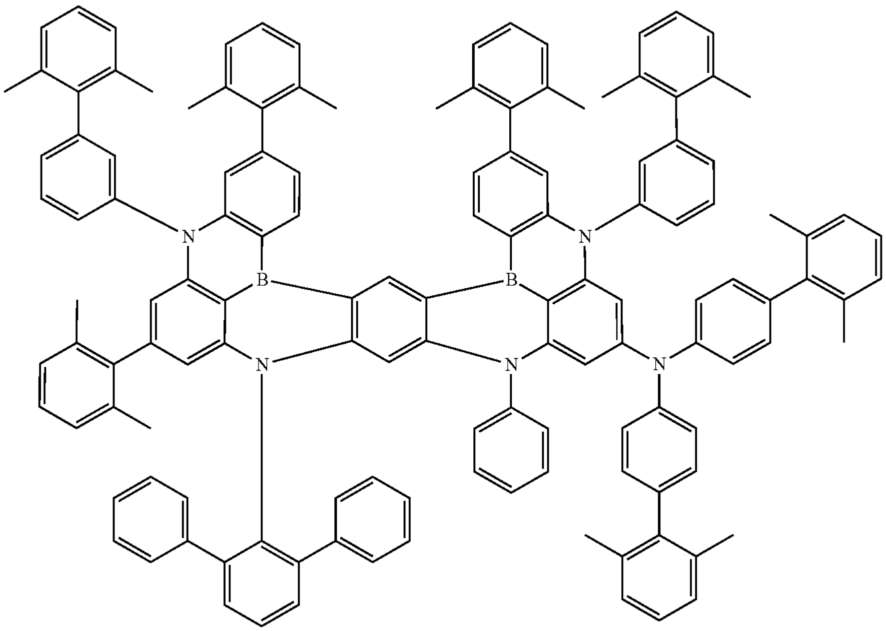

-continued
60
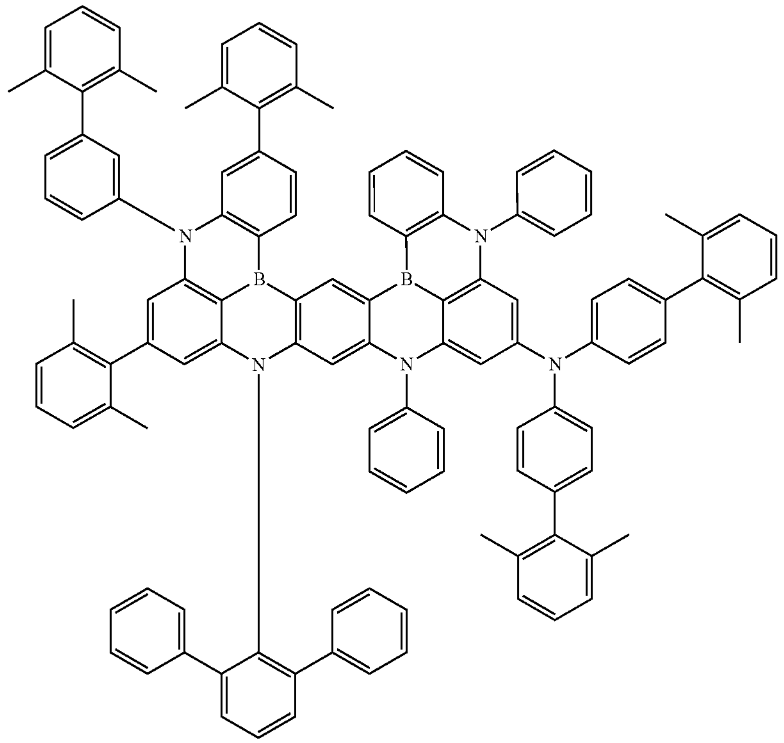
61
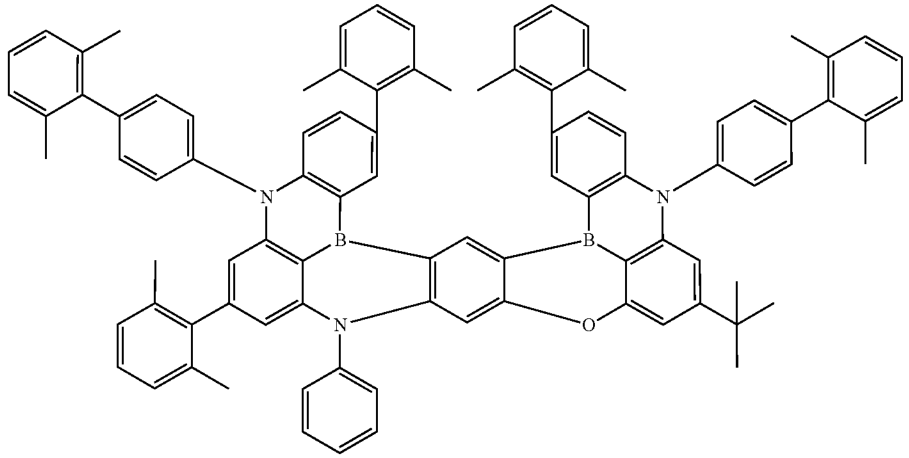
62
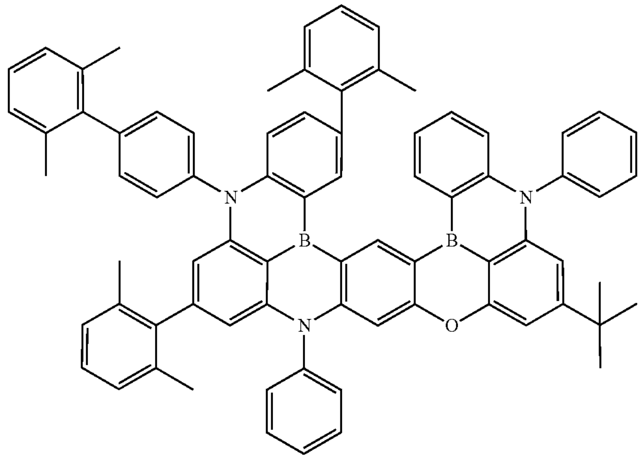

-continued
63
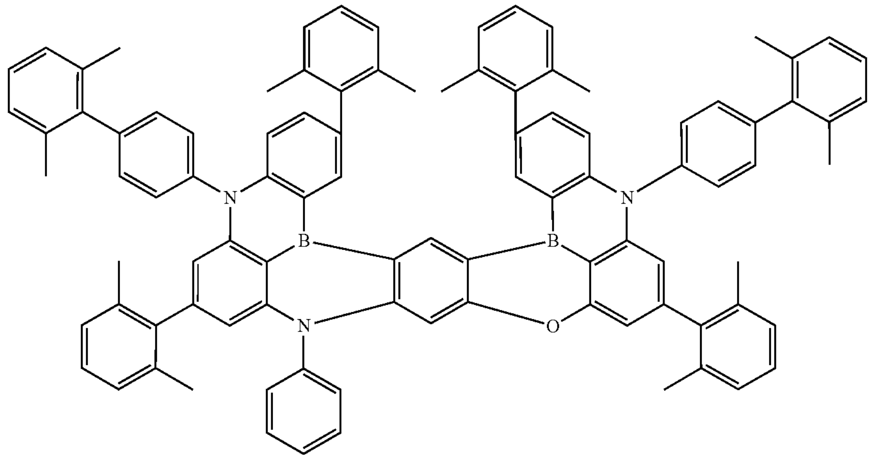
64
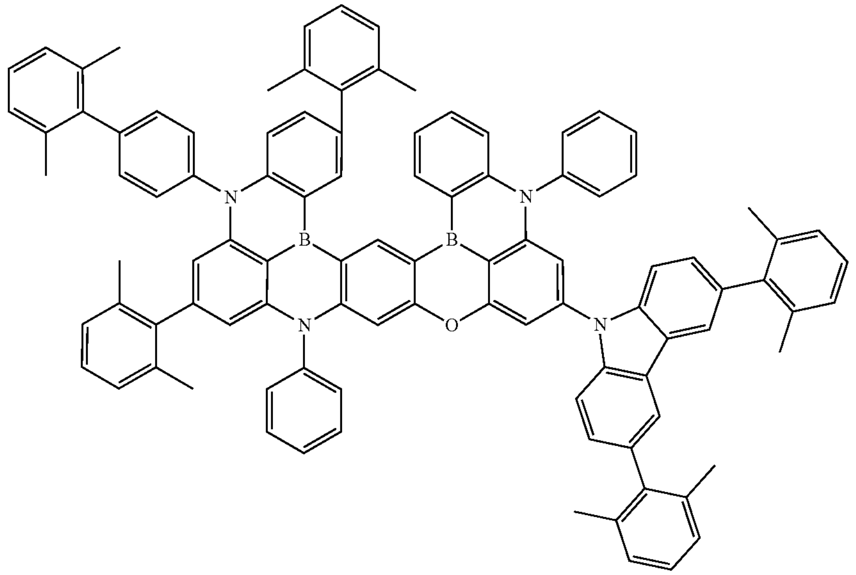
65
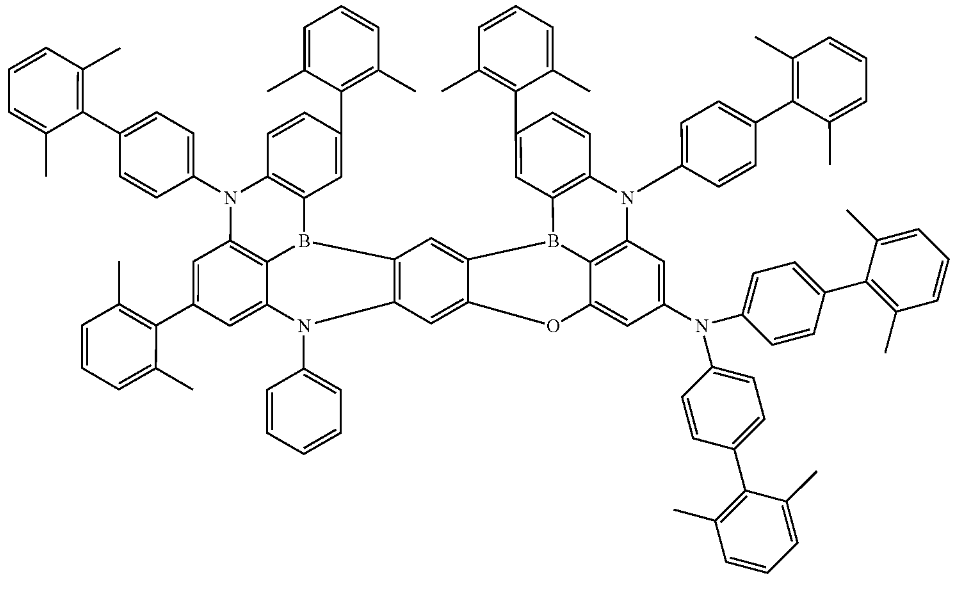

-continued
66
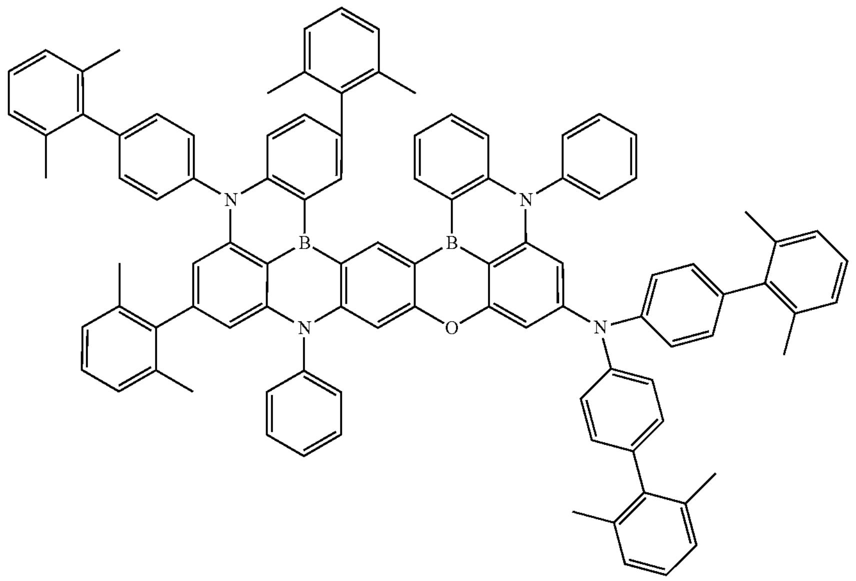
67
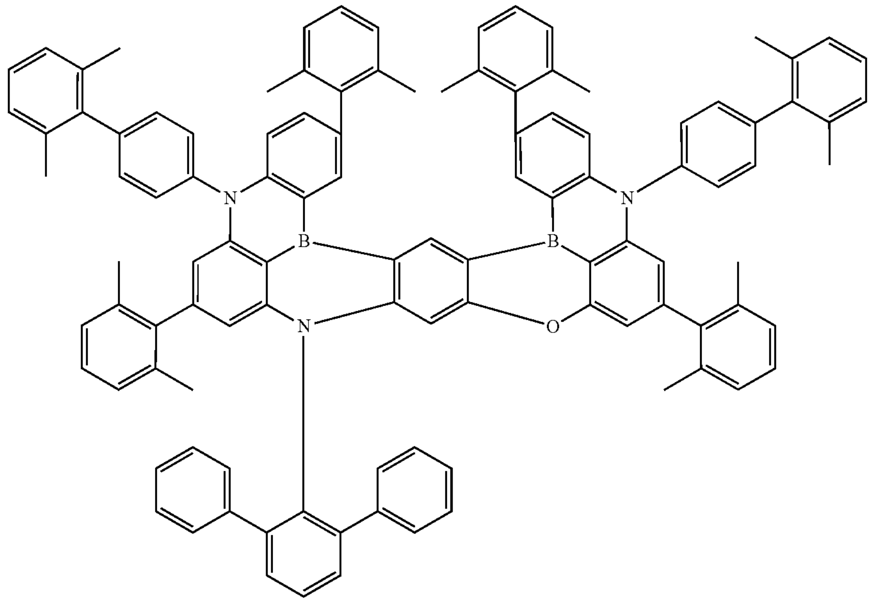

-continued
68
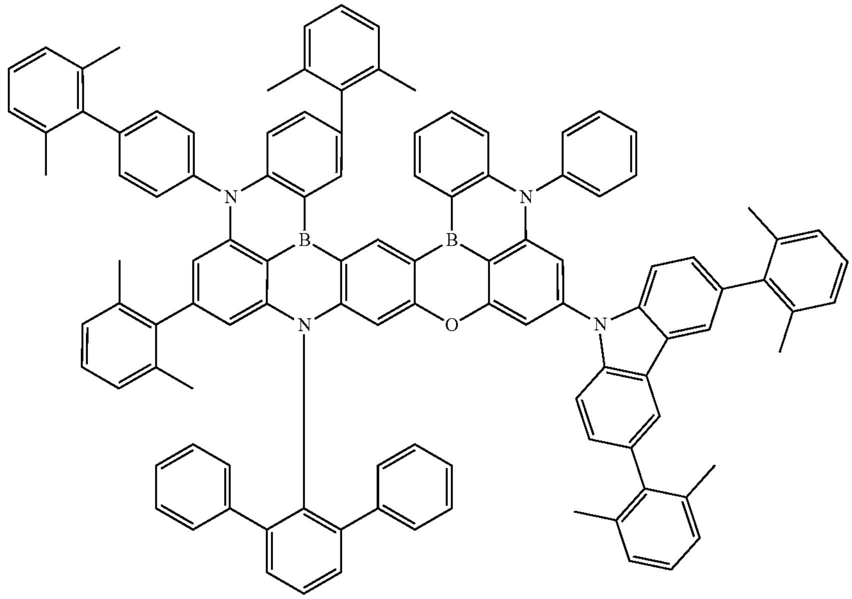
69
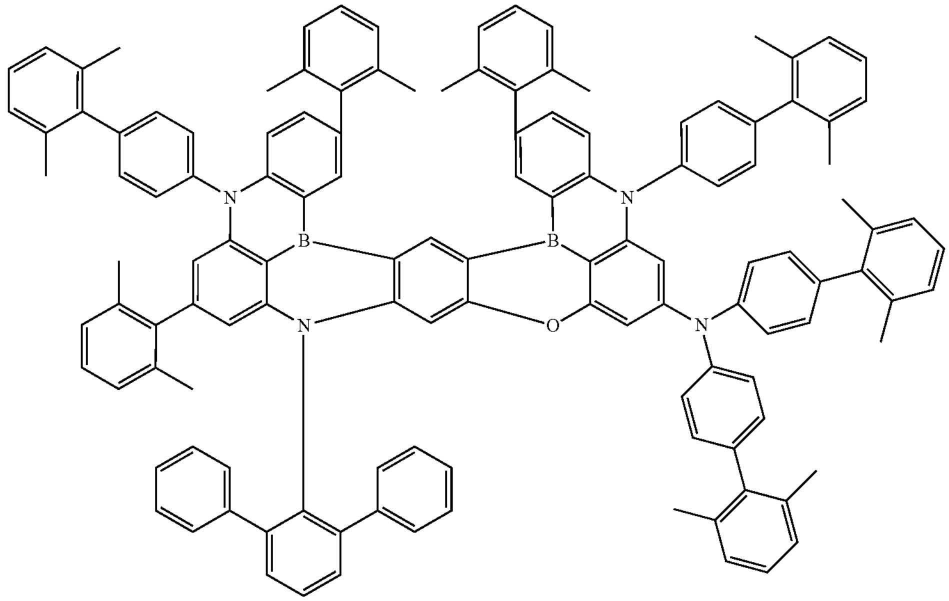

-continued
70
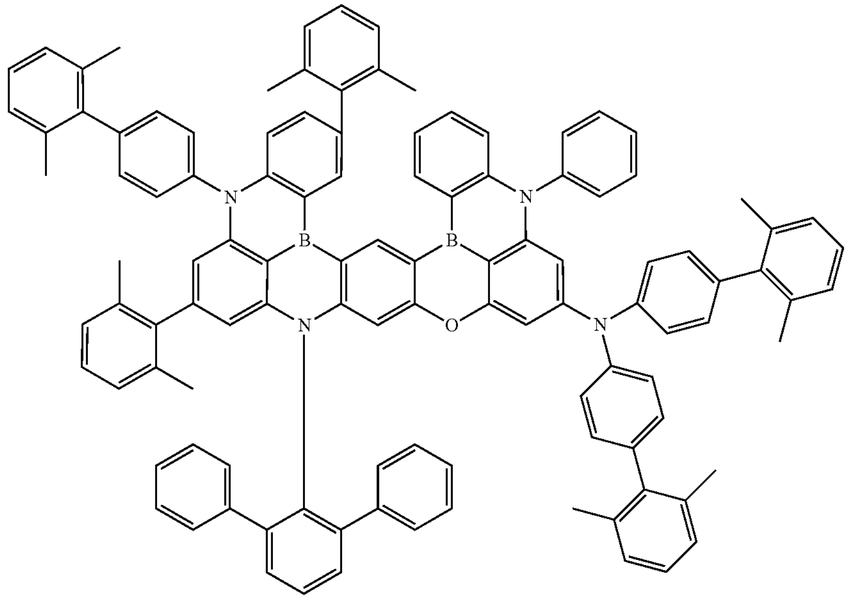
71
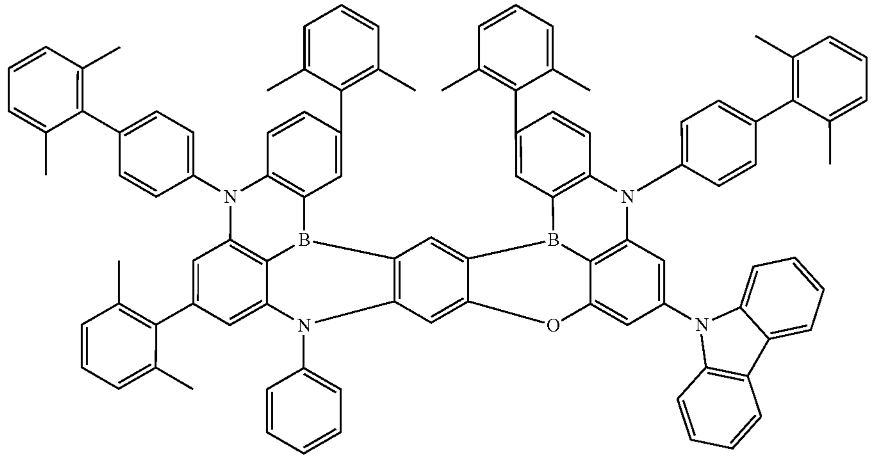
72
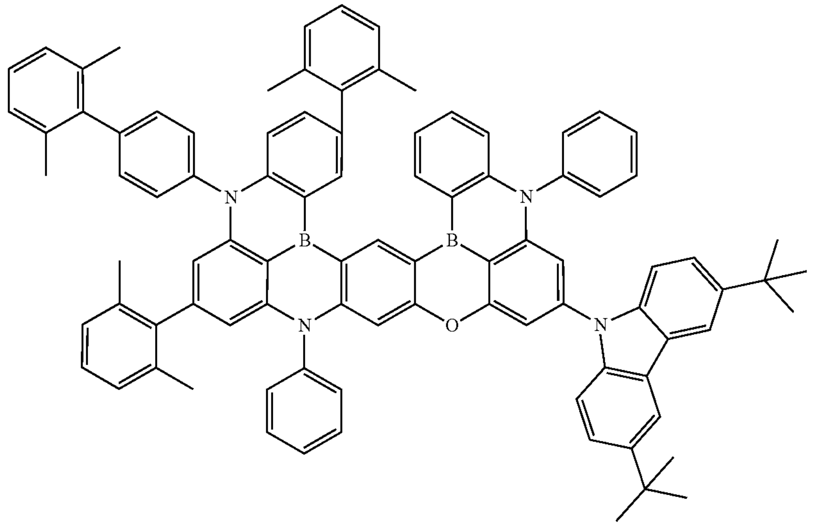

-continued
73
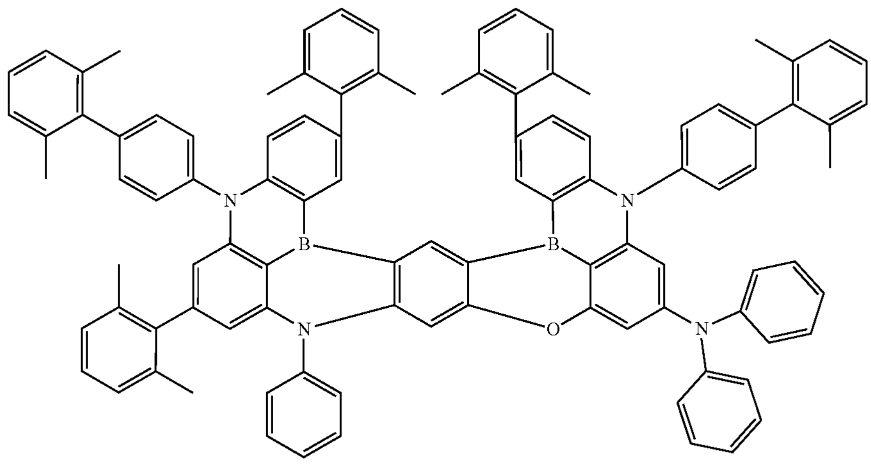
74
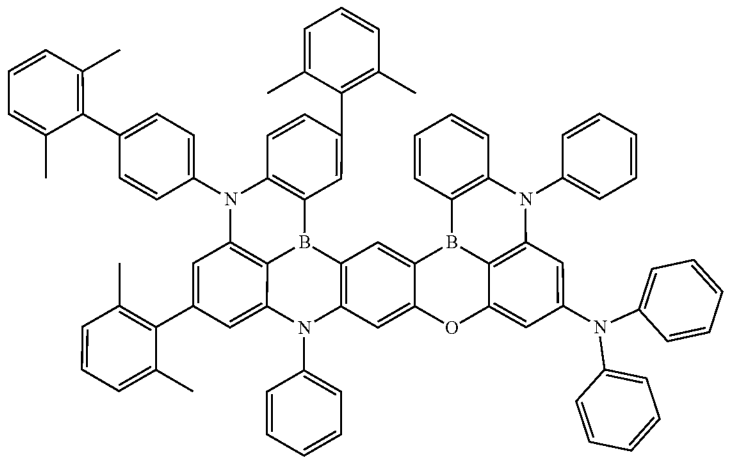
75
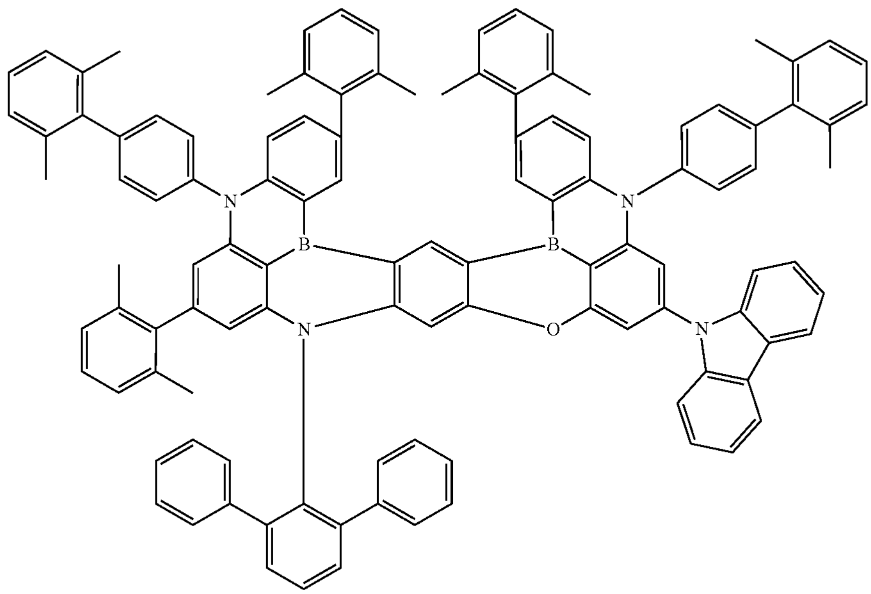

-continued
76
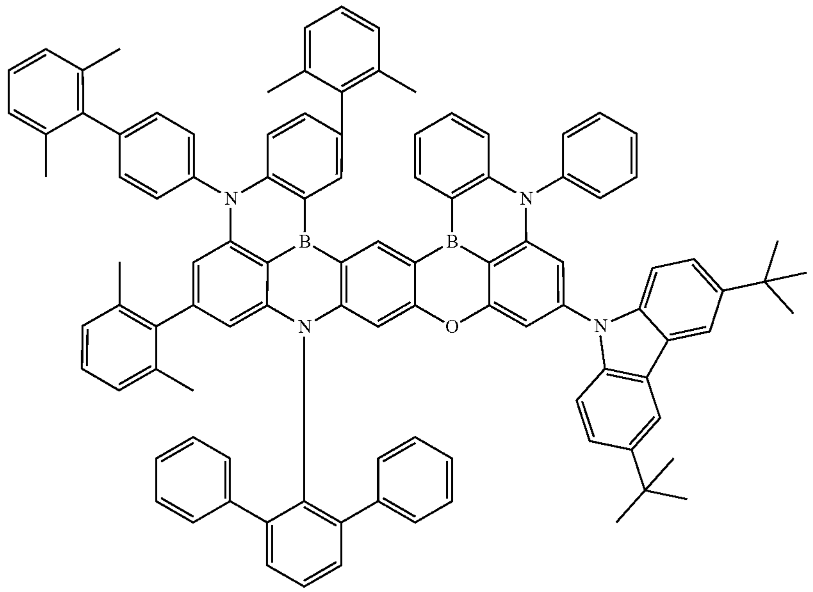
77
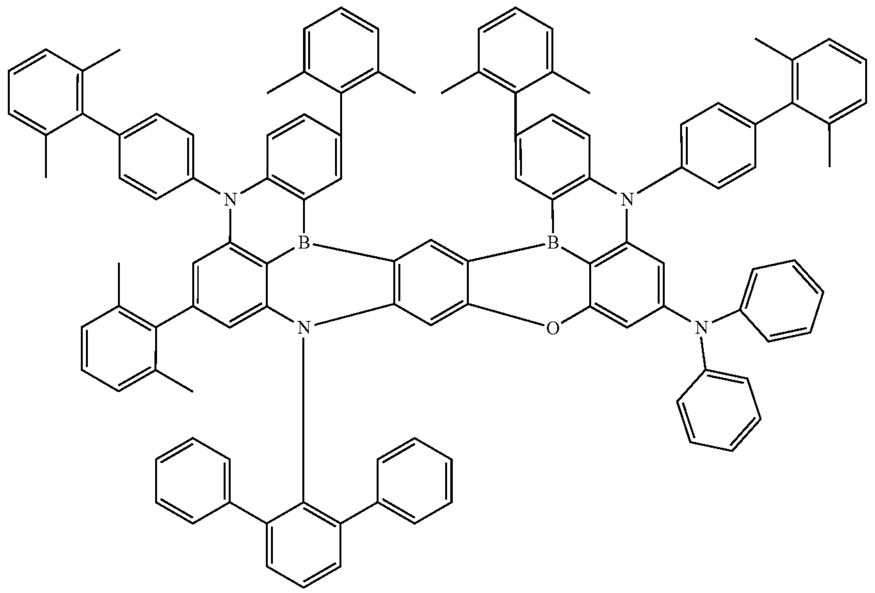

-continued
78
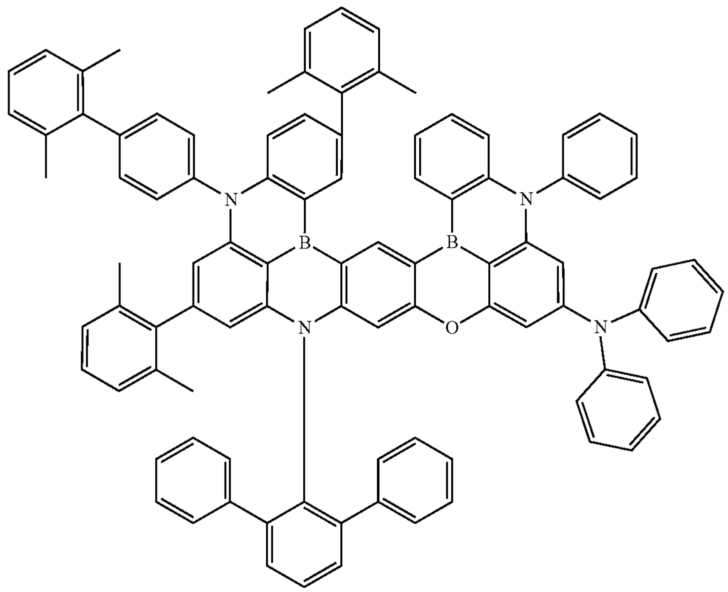
79
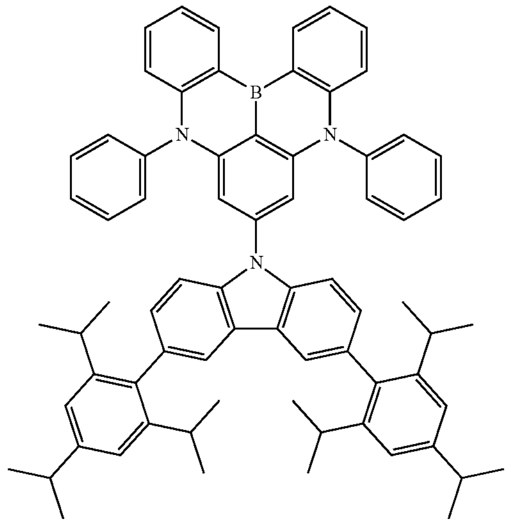

-continued
80
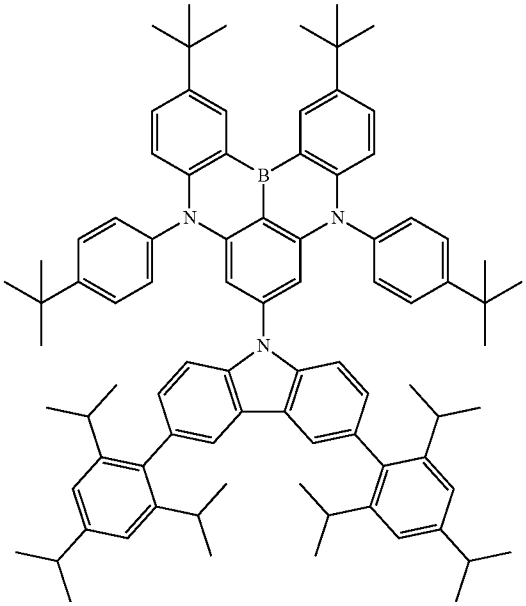
81
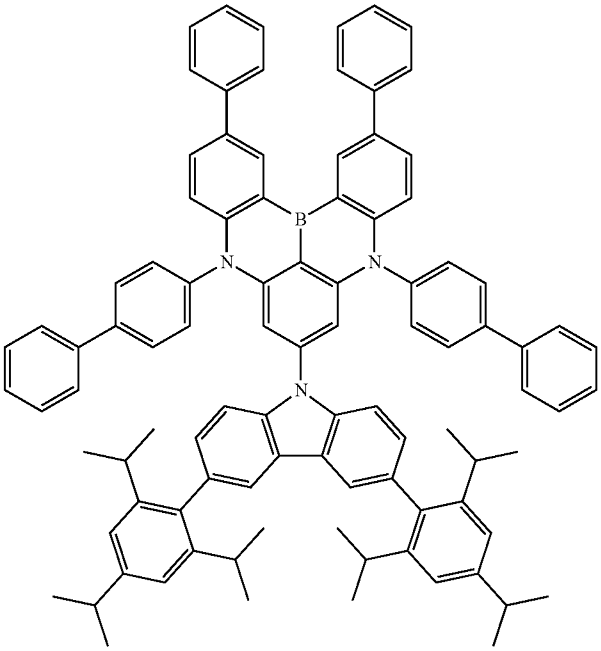

-continued
82
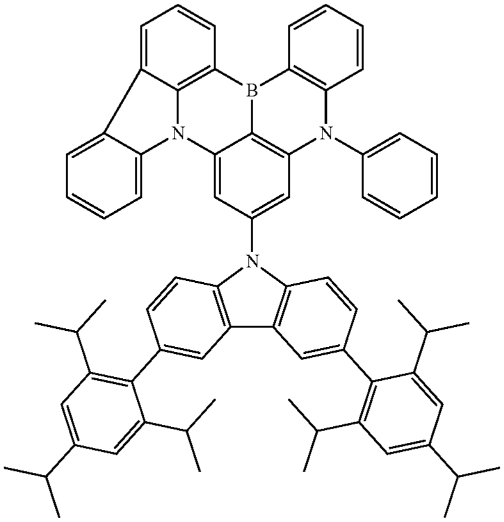
83
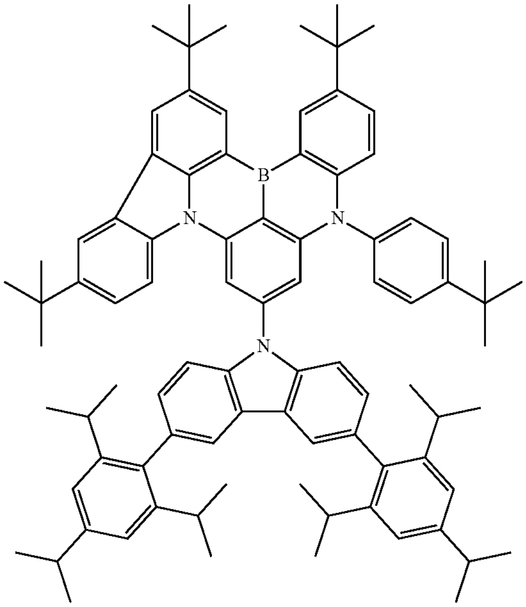

-continued
84
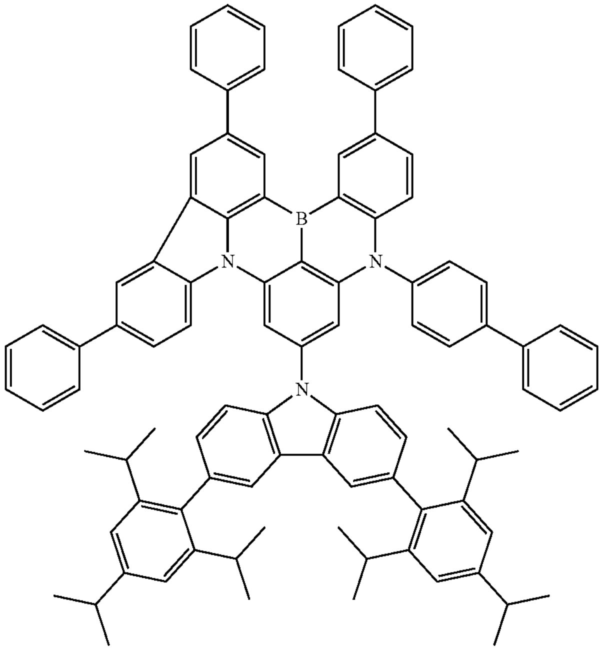
85
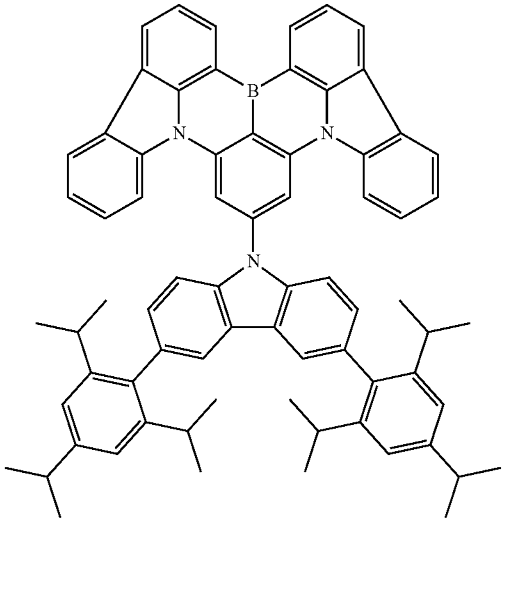

-continued
86
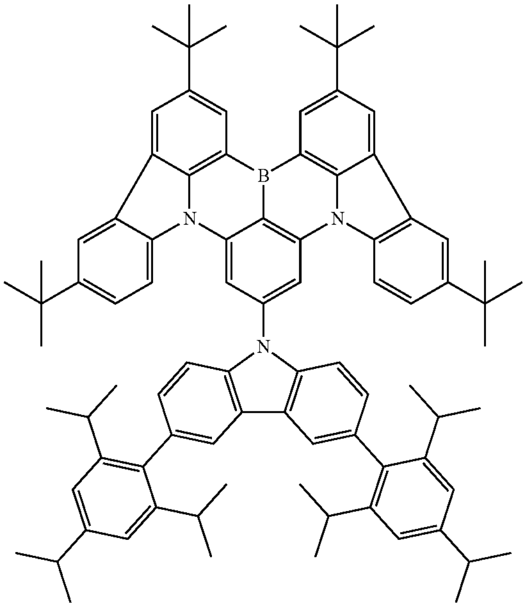
87
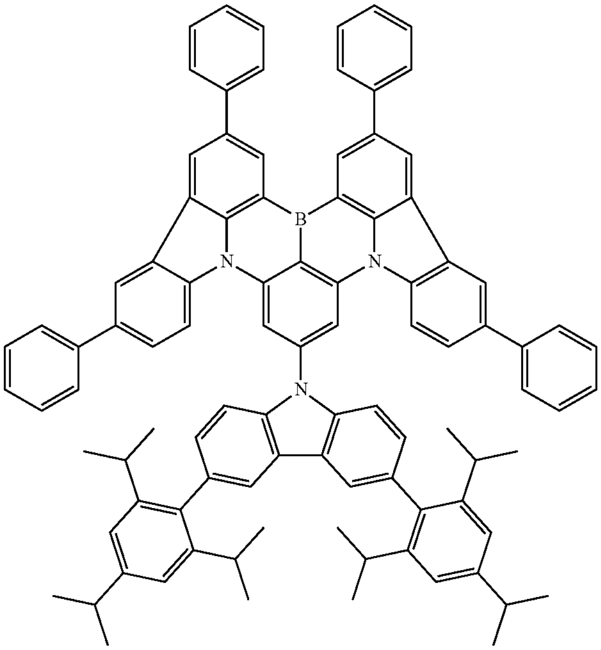

-continued
88
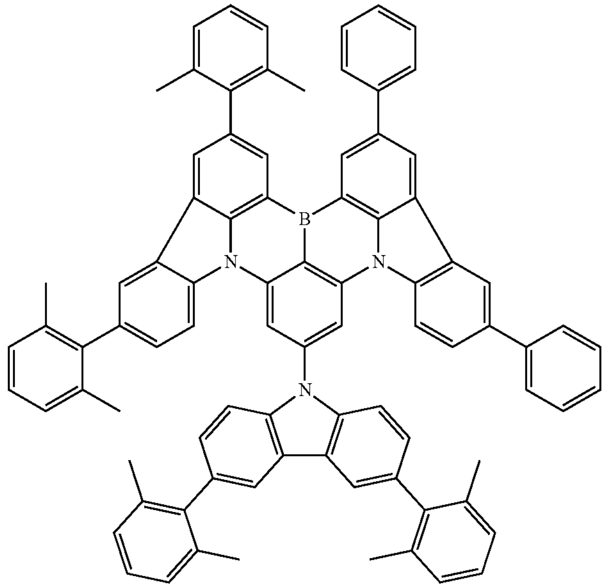
89
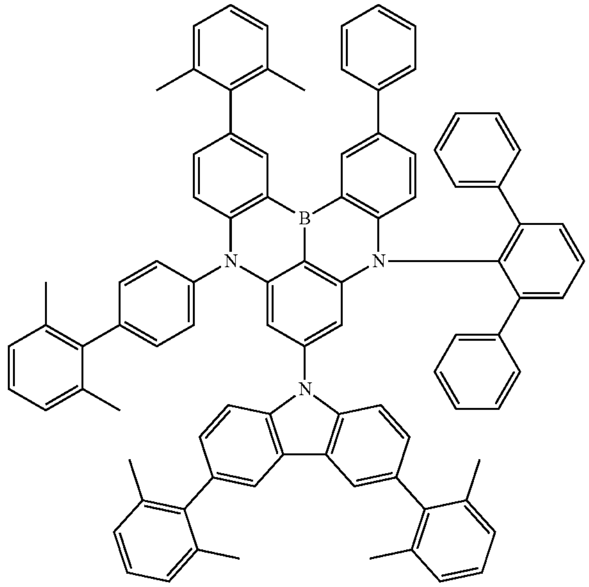

-continued
90
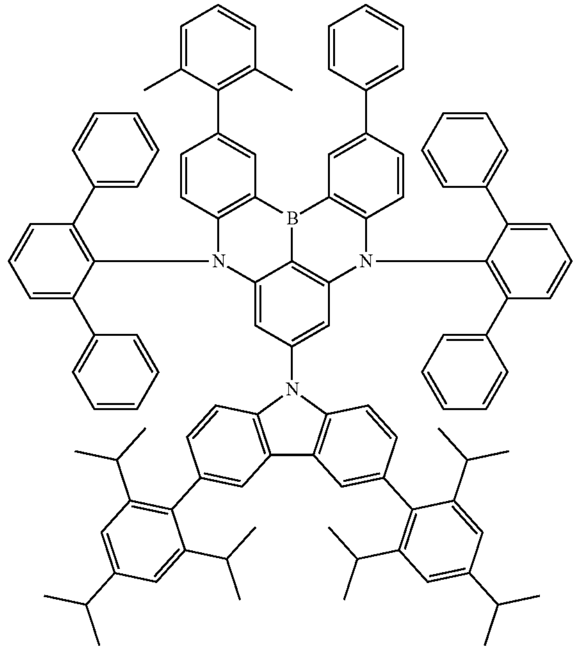
91
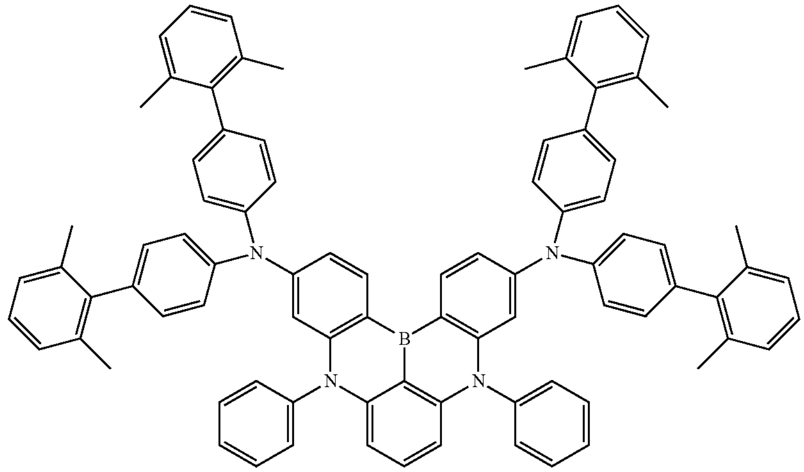
92
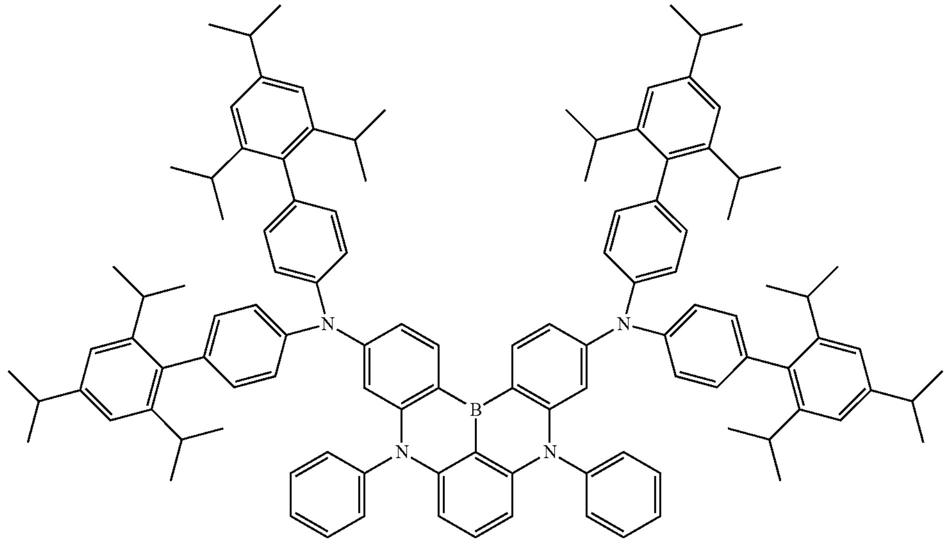

-continued
93
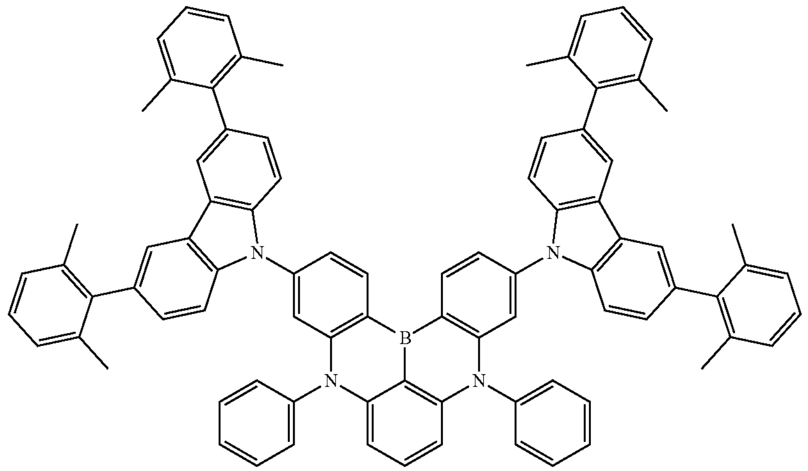
94
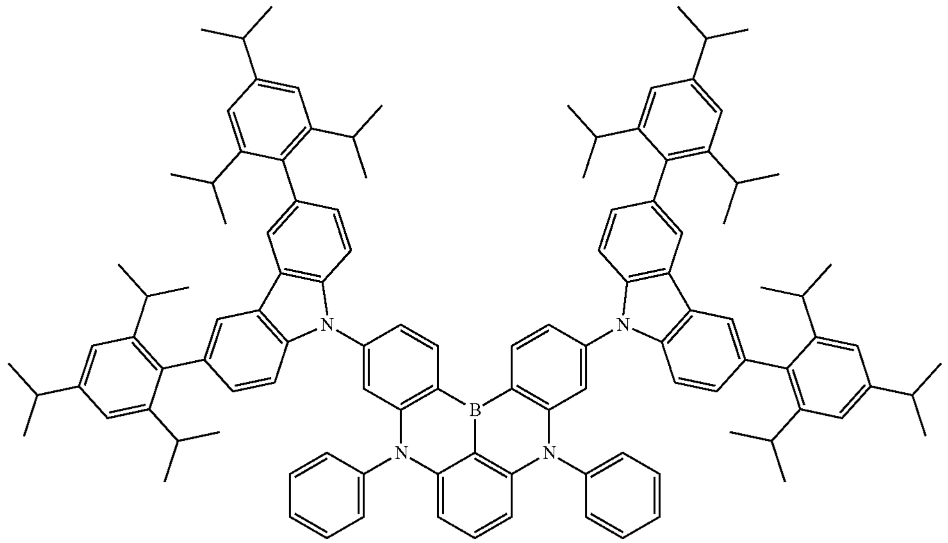
95
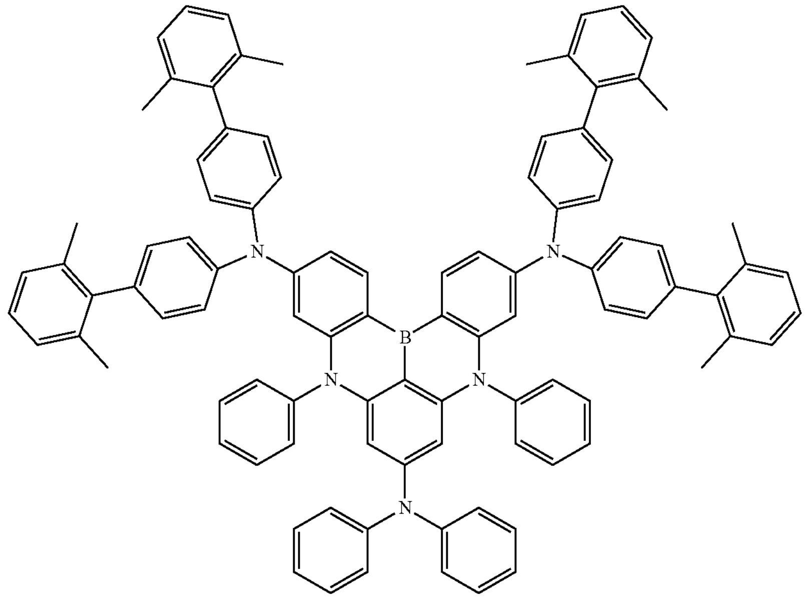

-continued
96
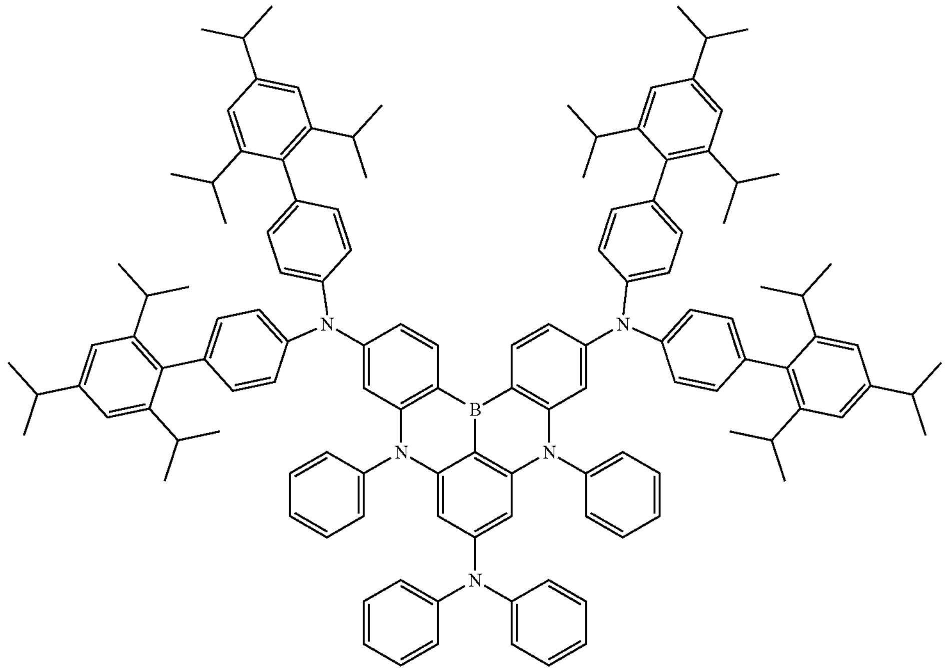
97
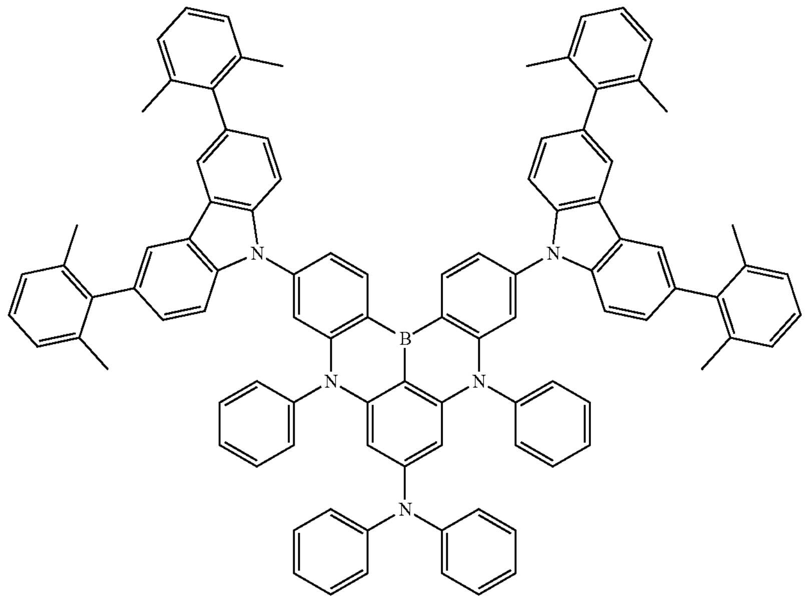

-continued
98
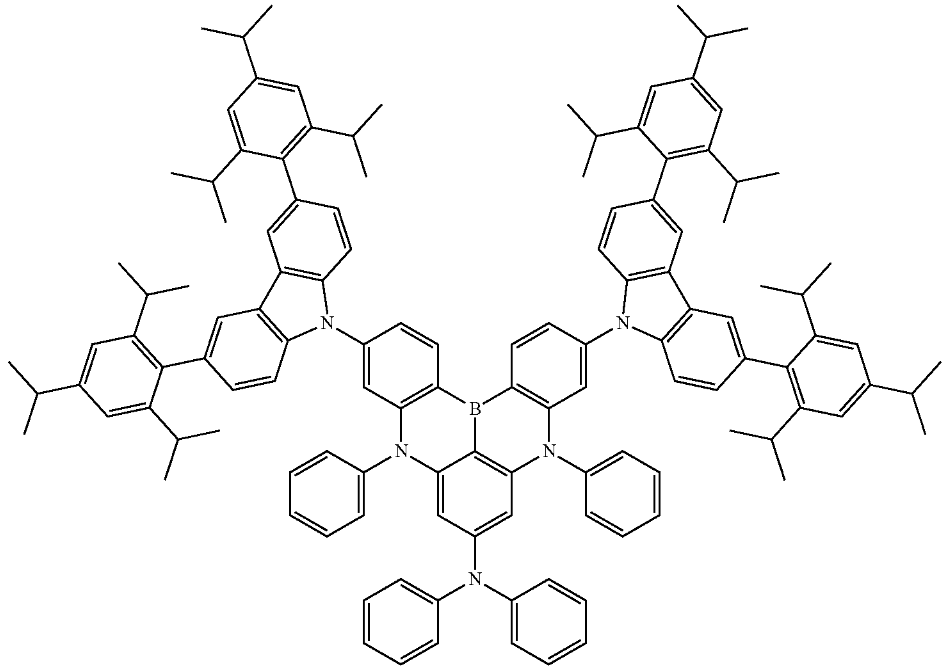
99
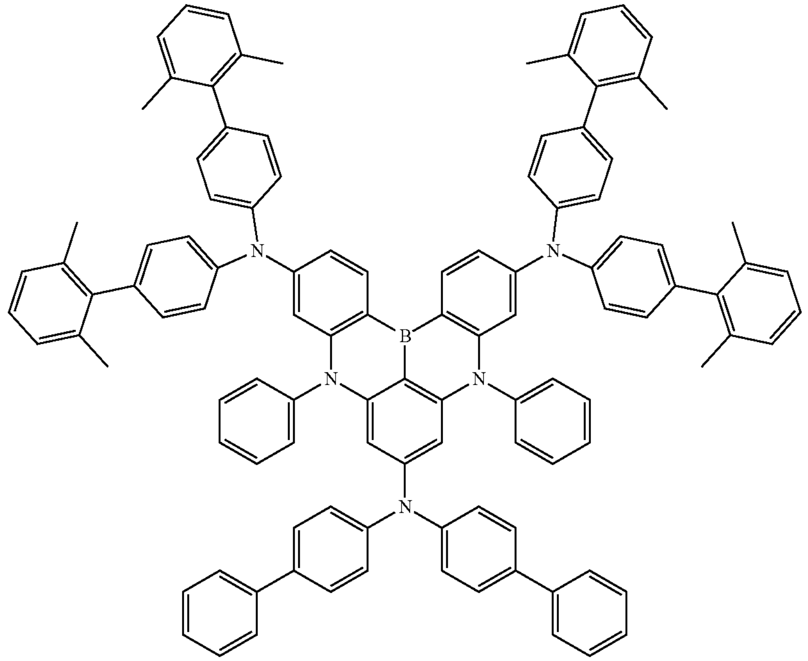

-continued
100
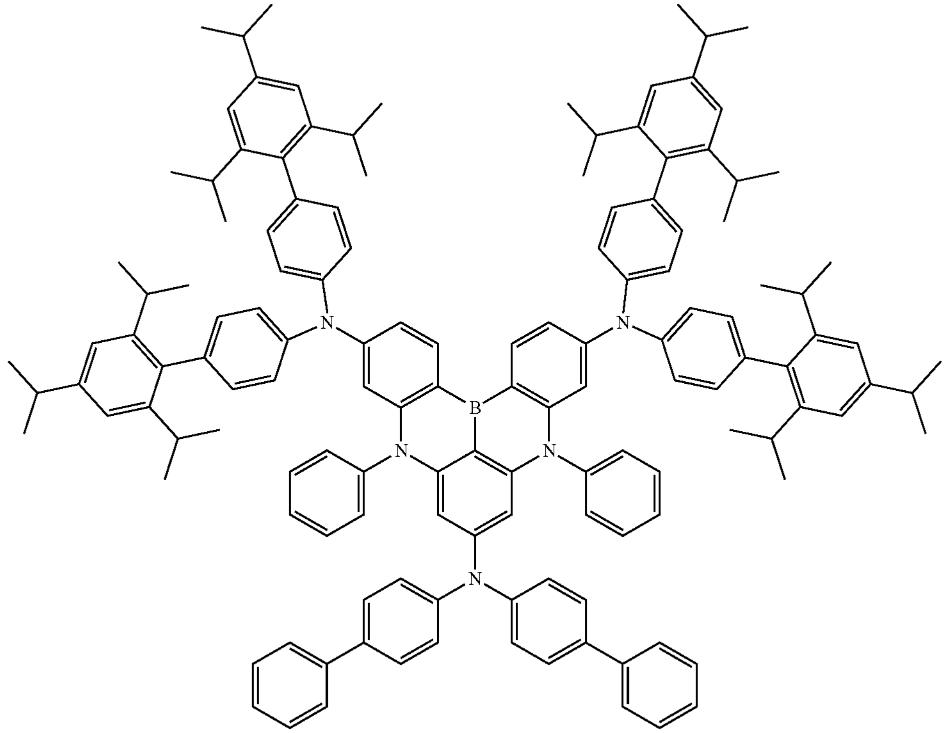
101
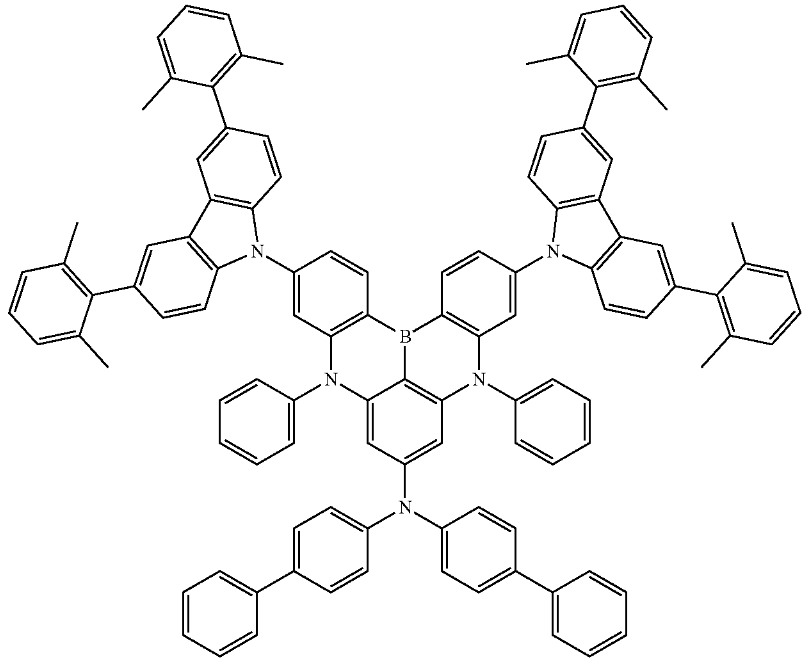

-continued
102
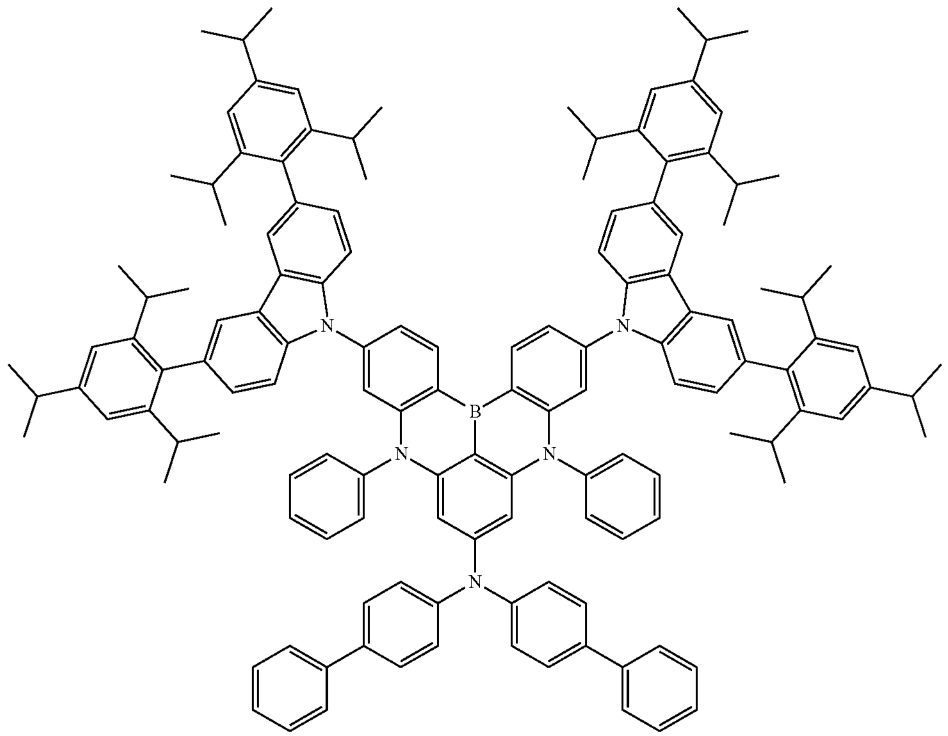
103
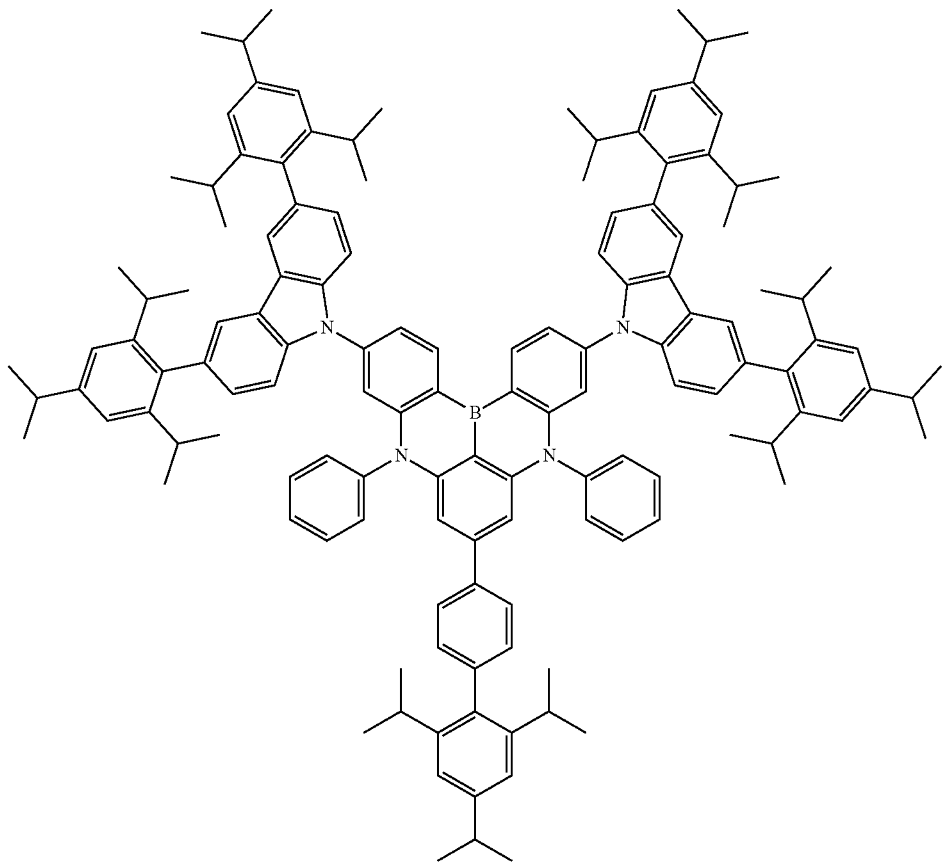

-continued
104
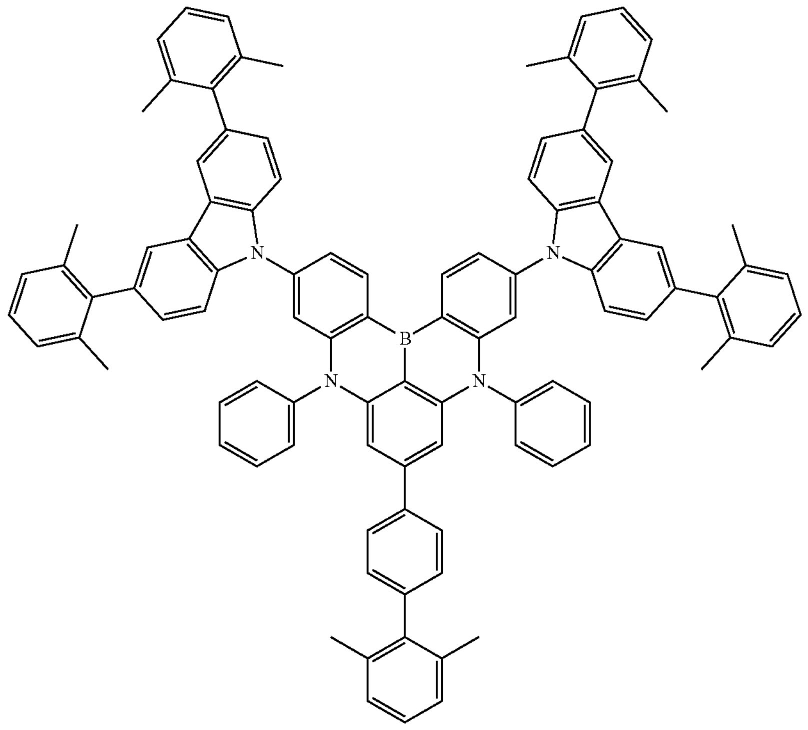
105
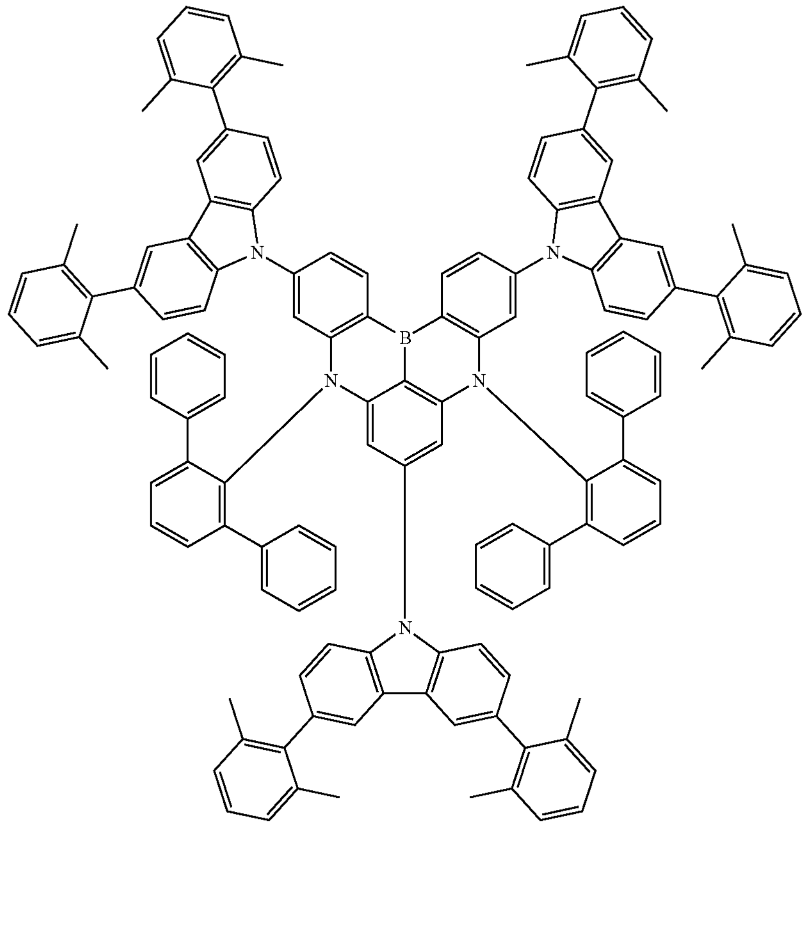

-continued
106
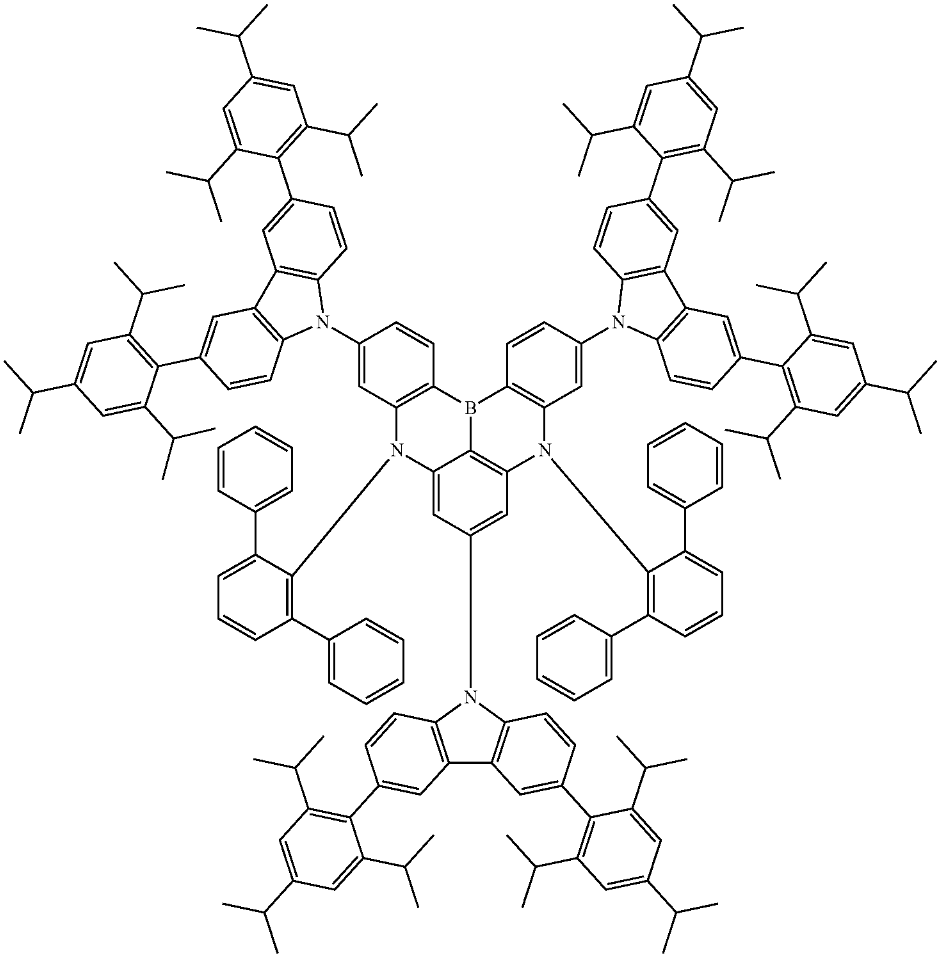

-continued
107
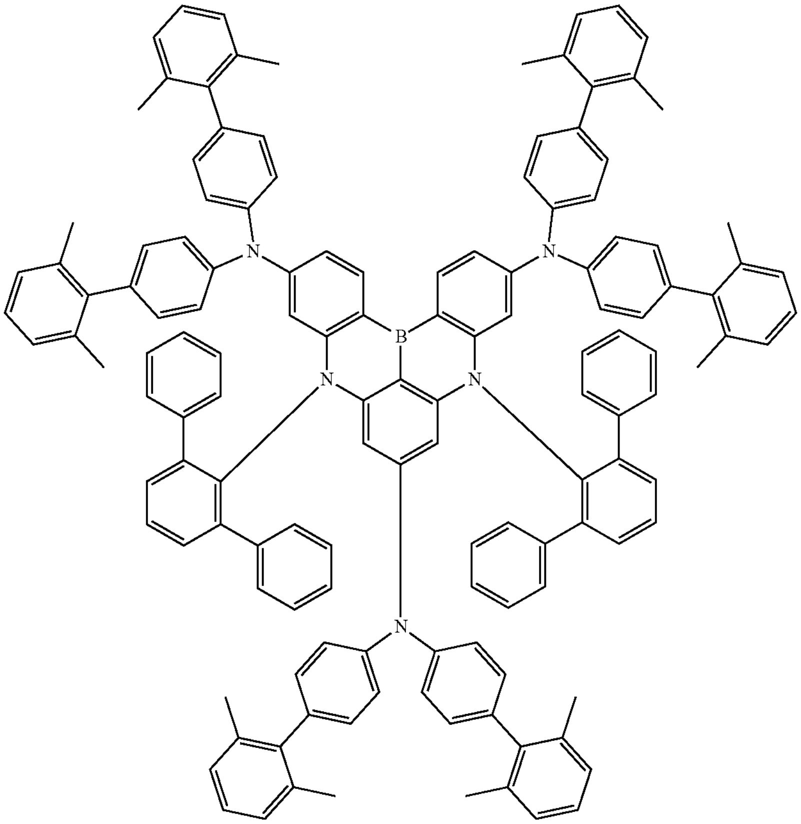

-continued
108
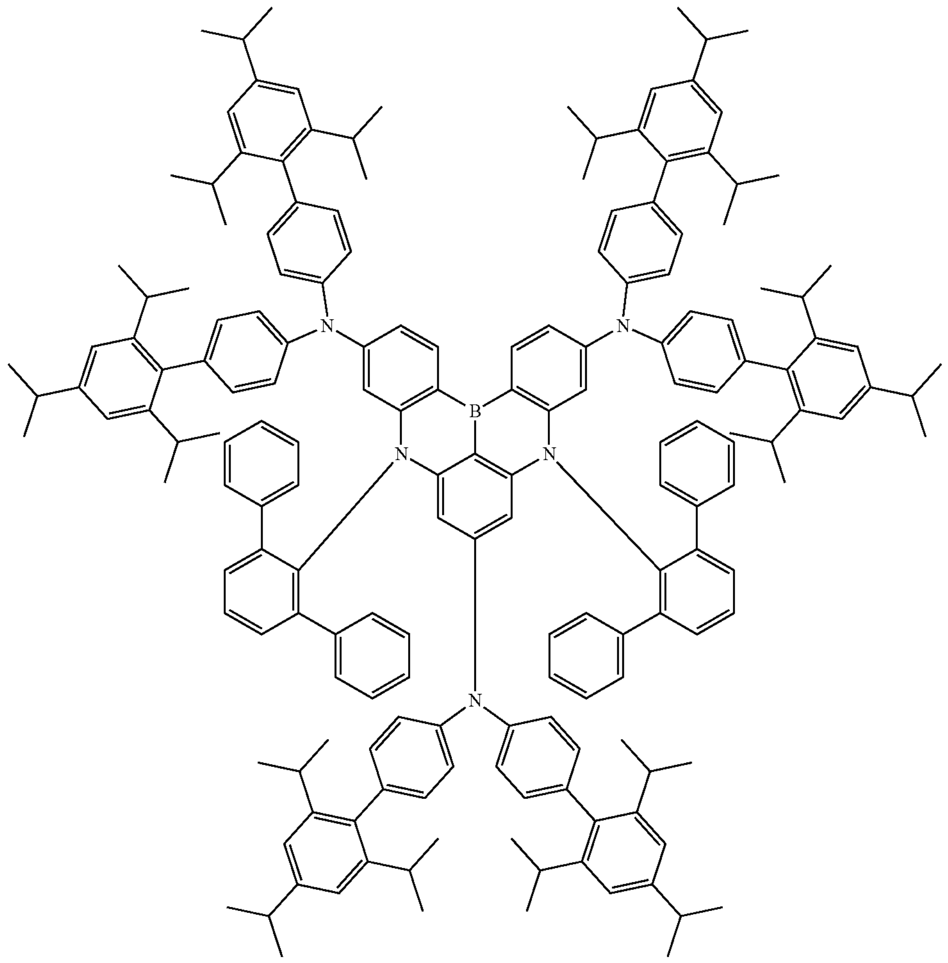
109
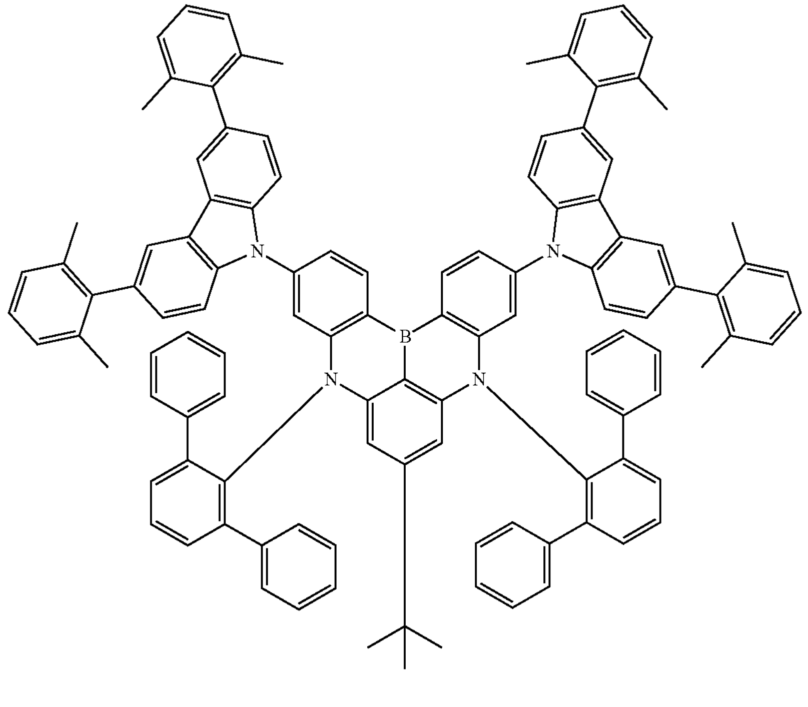

-continued
110
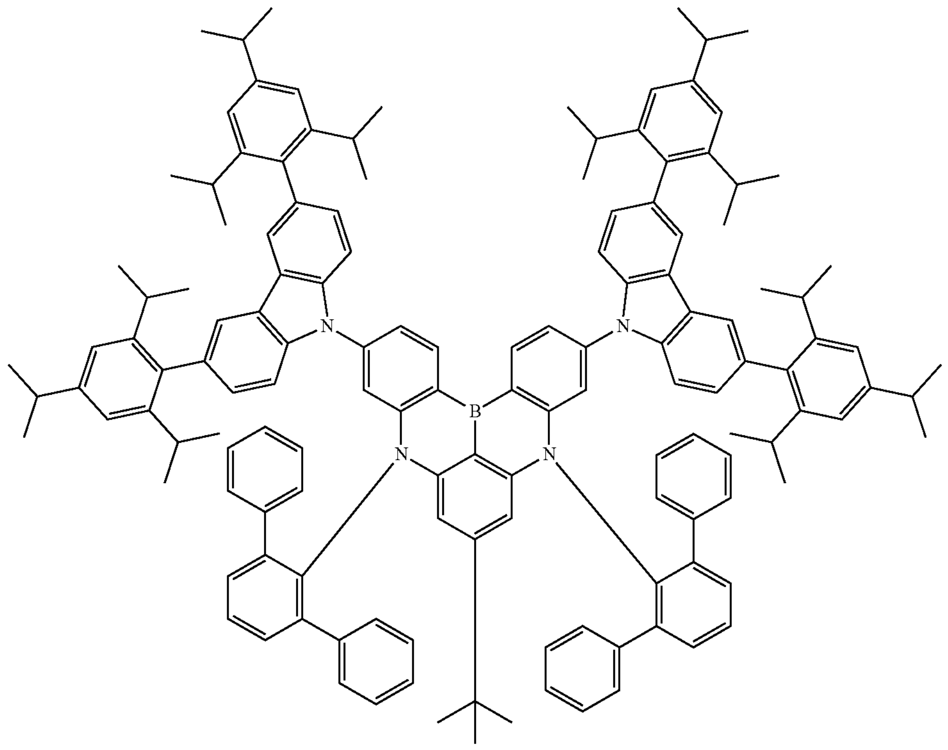
111
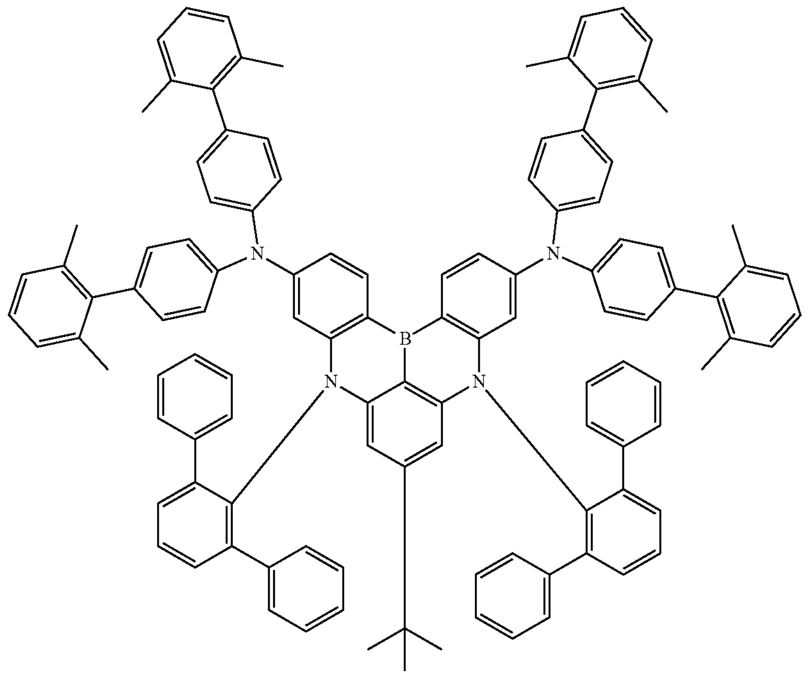

-continued
112
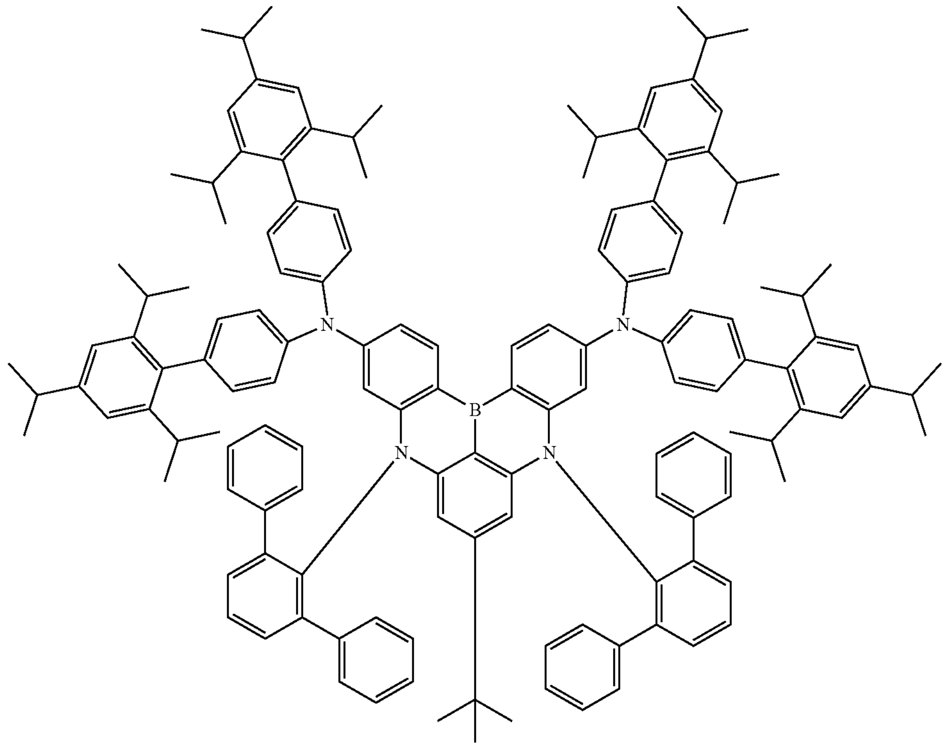
113
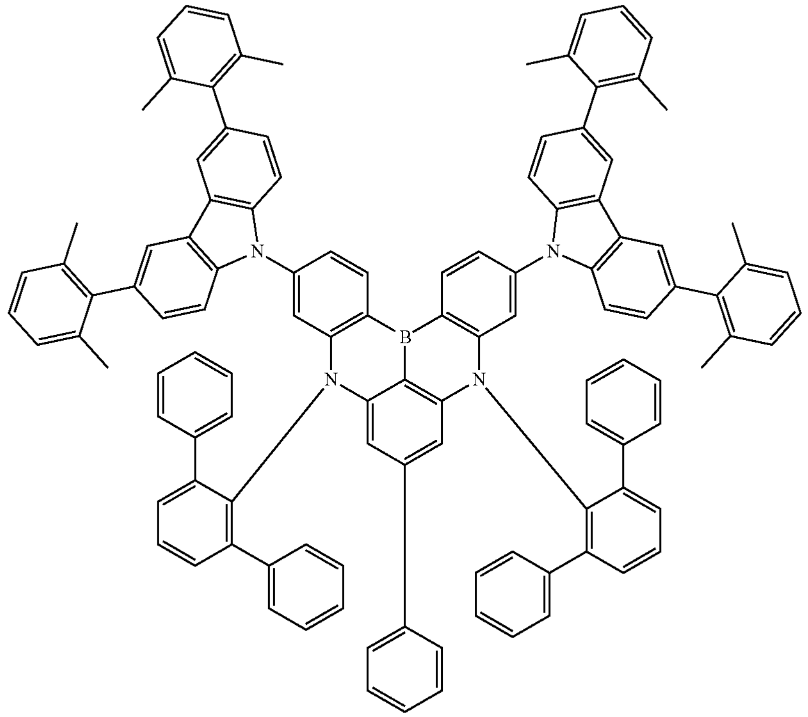

-continued
114
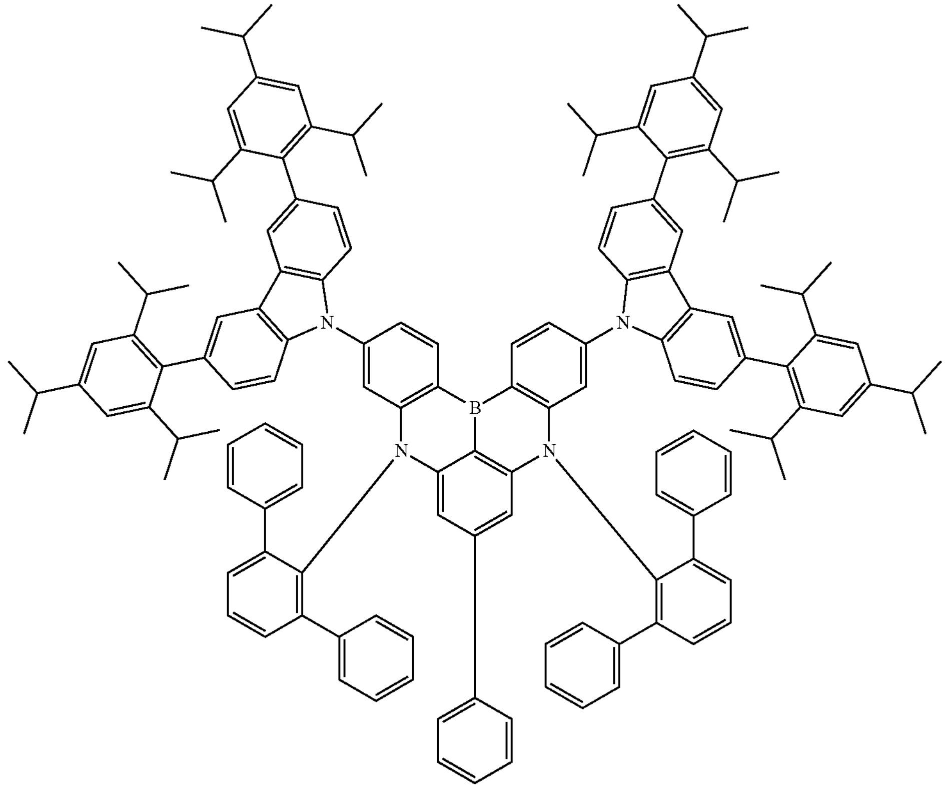
115
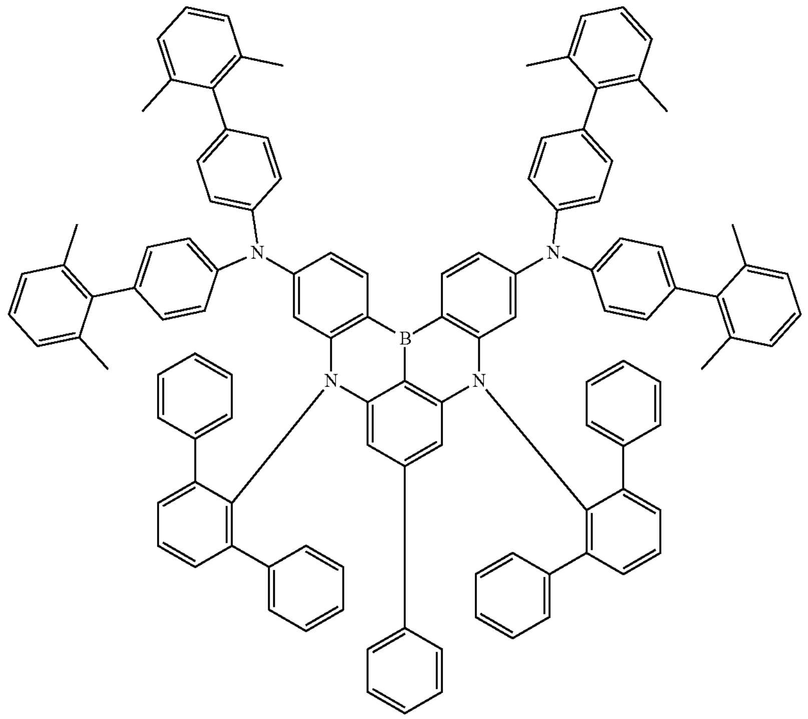

-continued
116
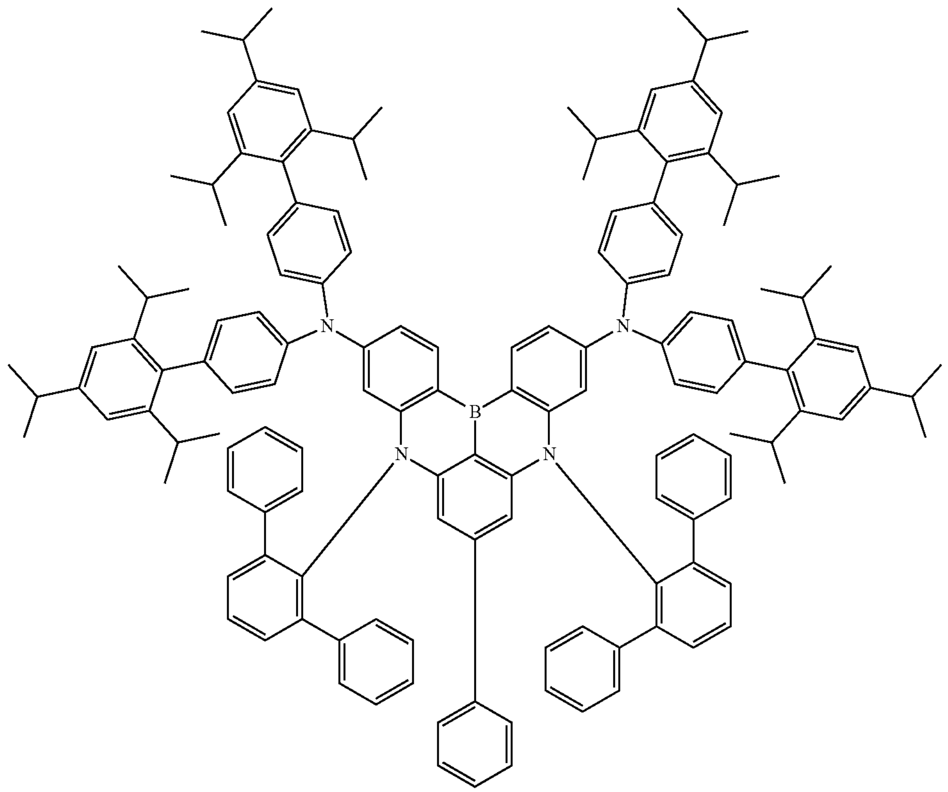
117
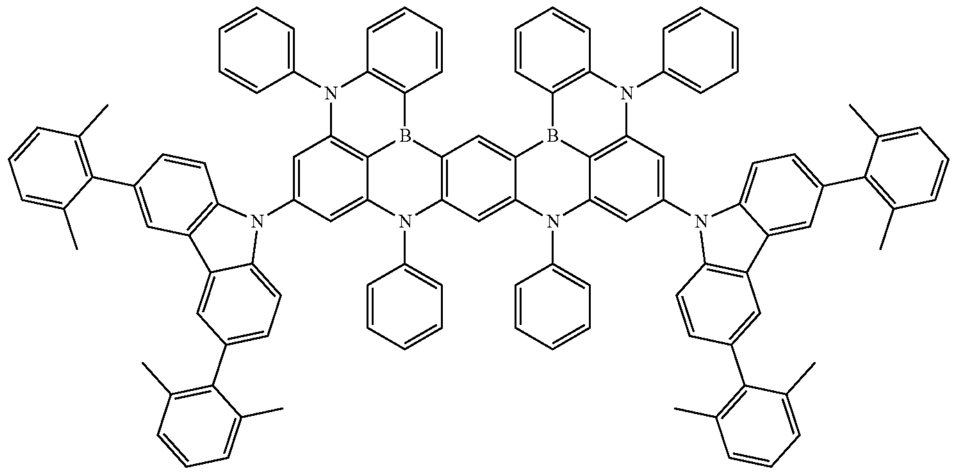

-continued
118
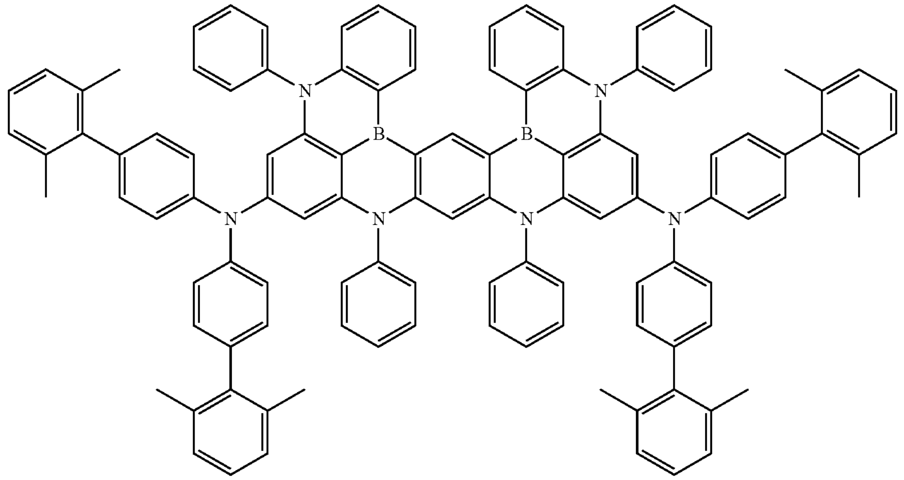
119
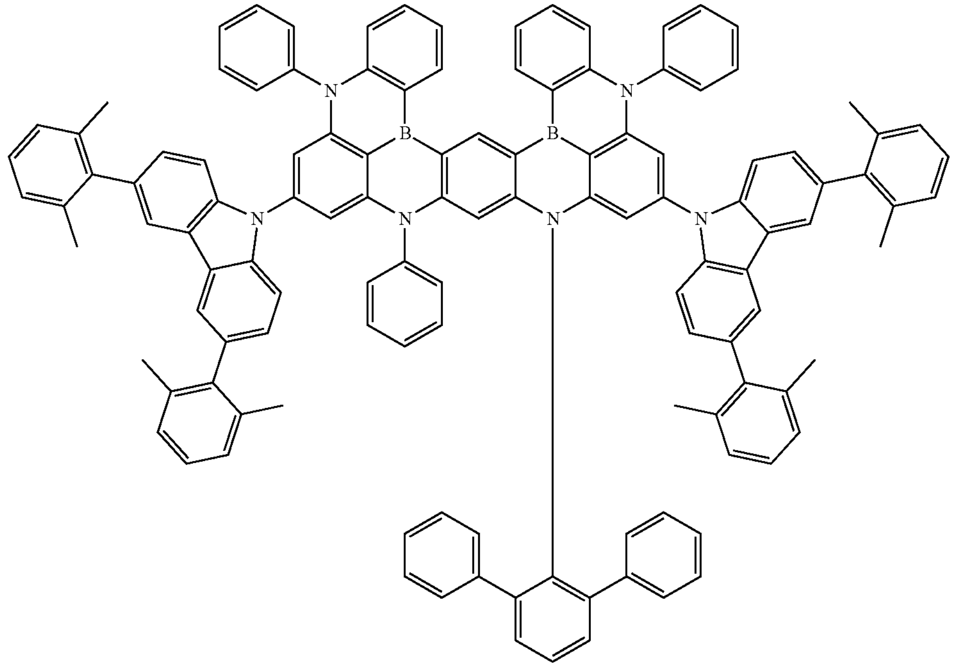

-continued
120
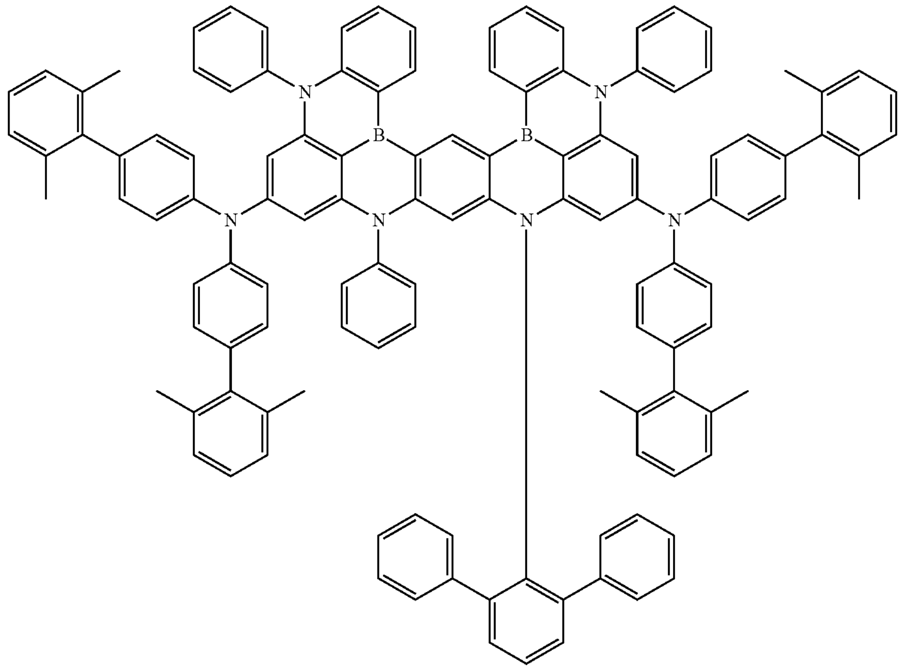
121
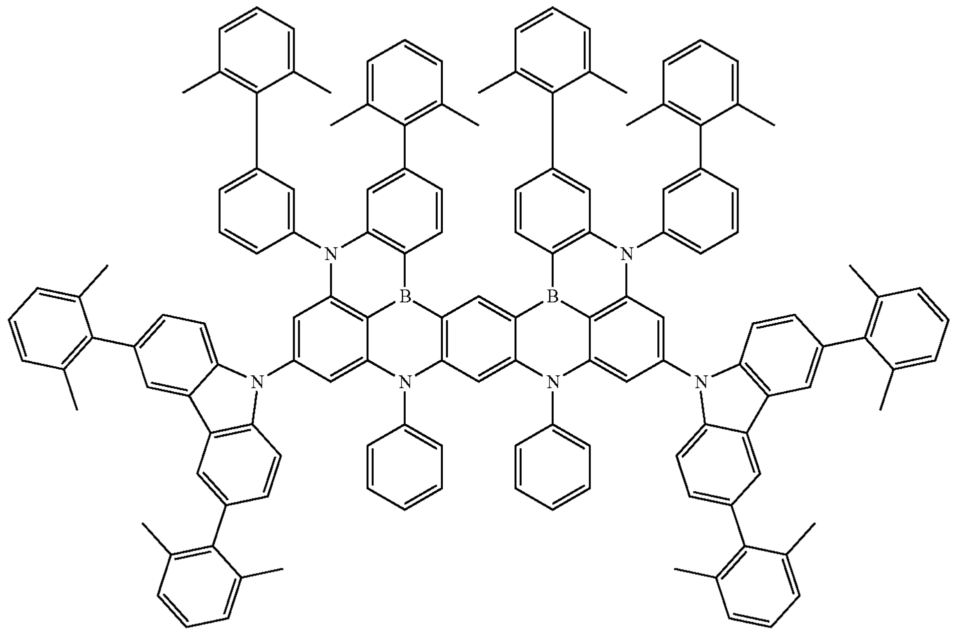

-continued
122
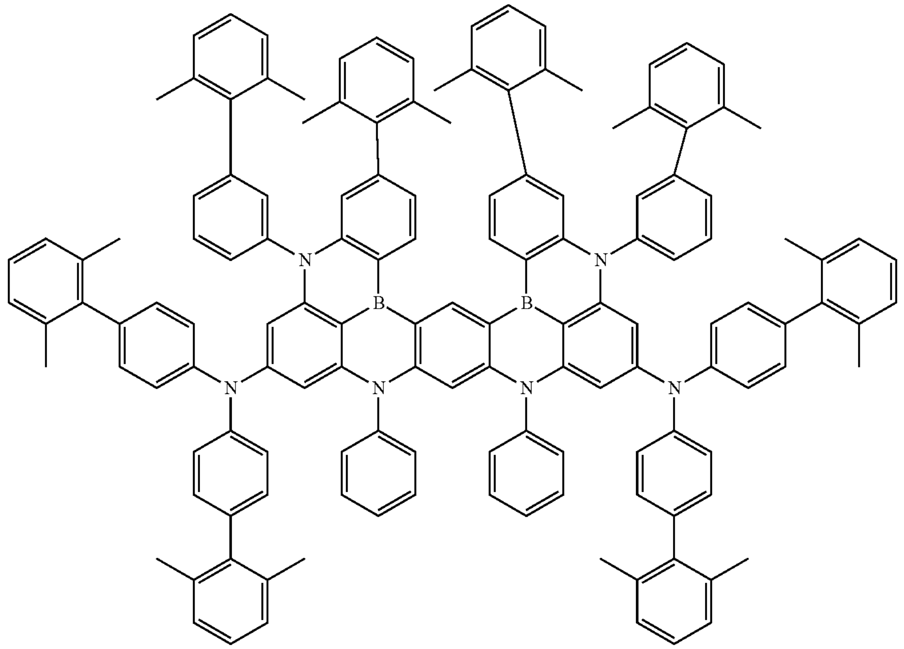
123
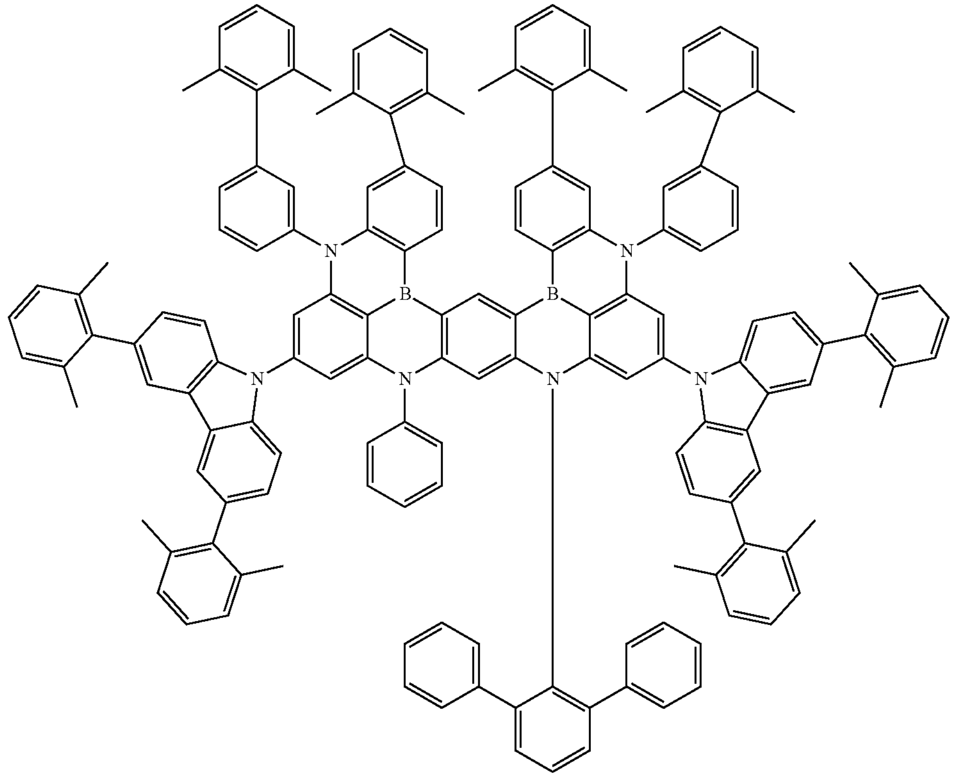

-continued
124
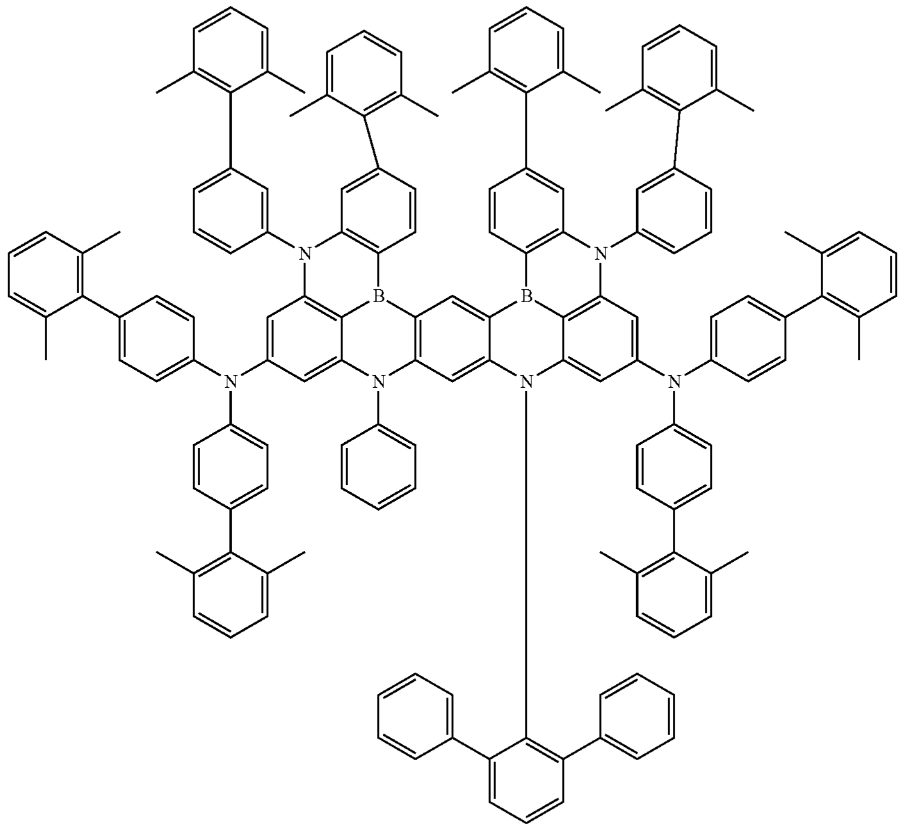
125
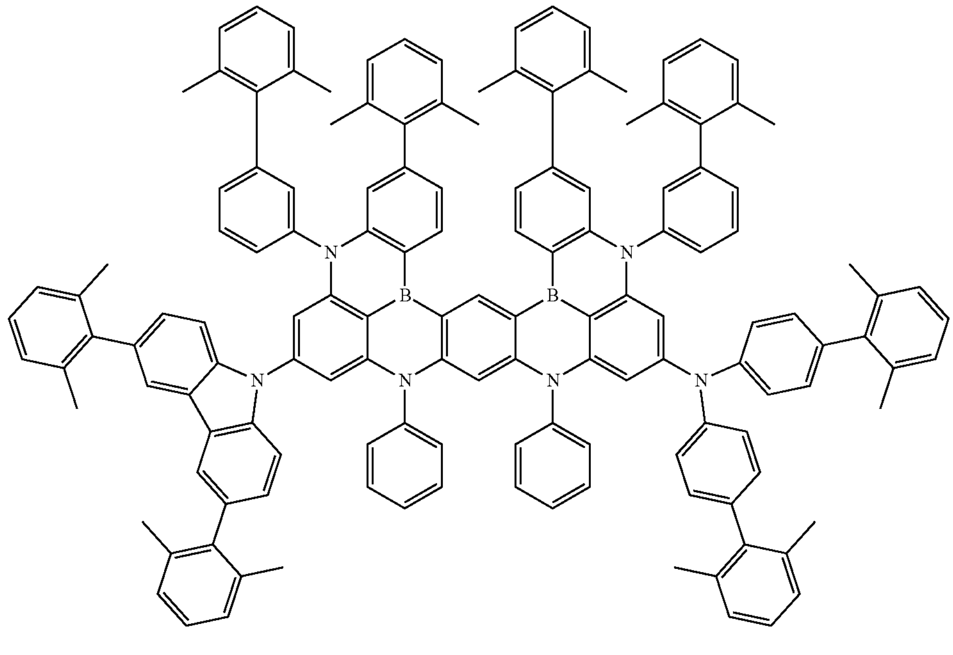

-continued
126
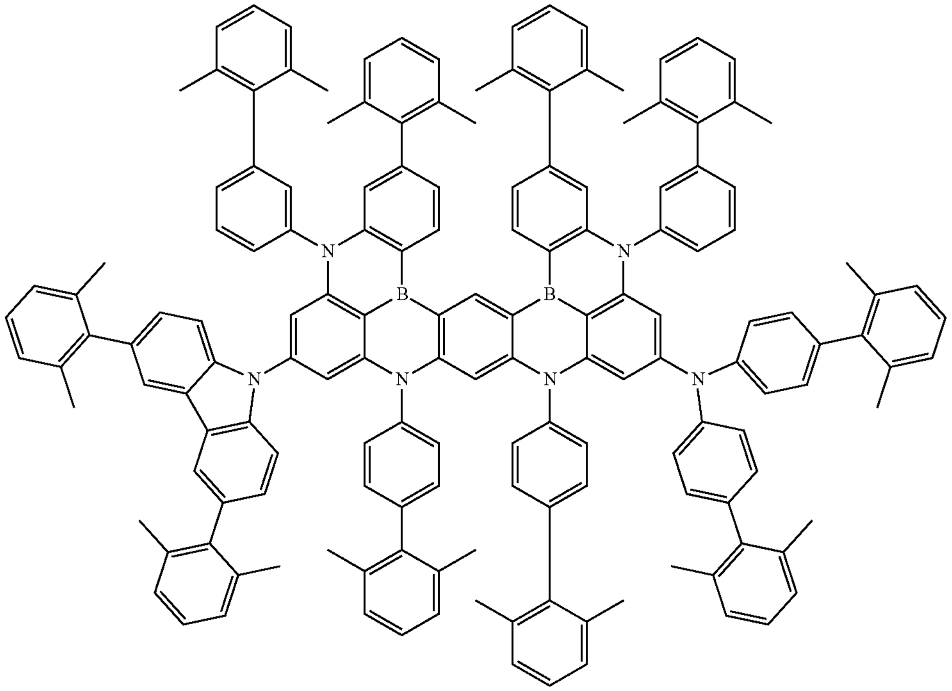
127
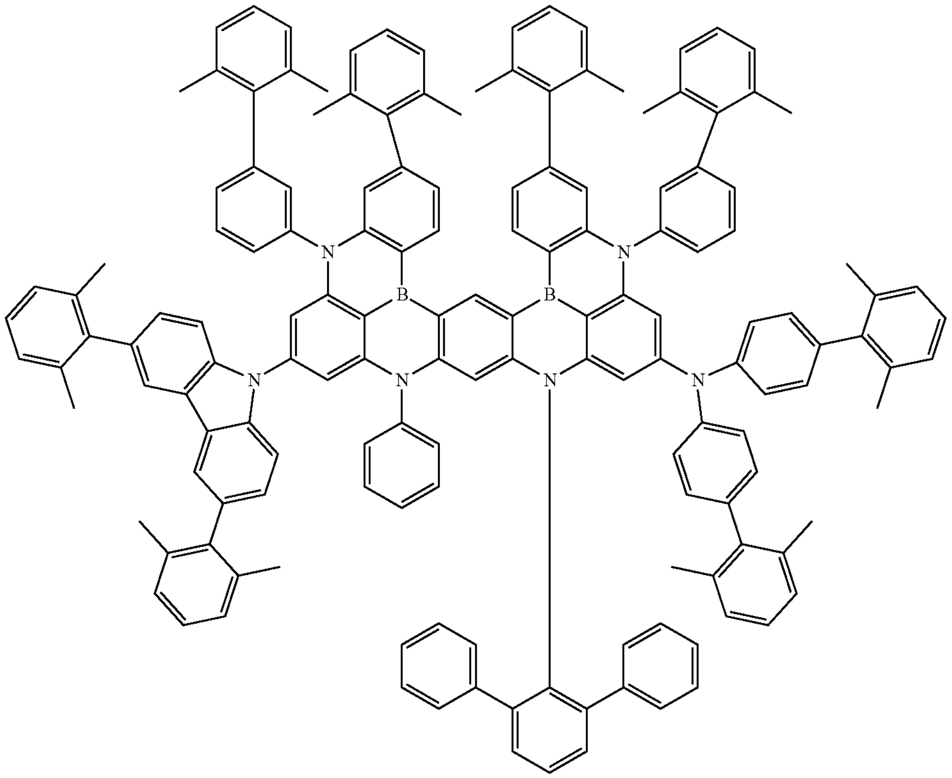

-continued
128
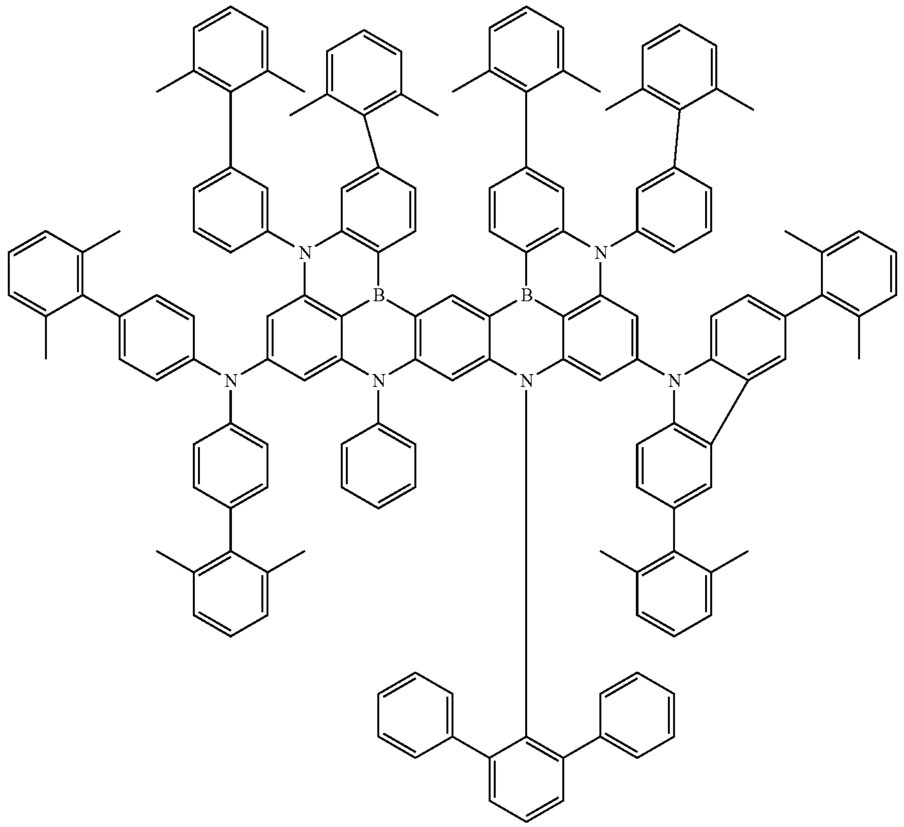
132
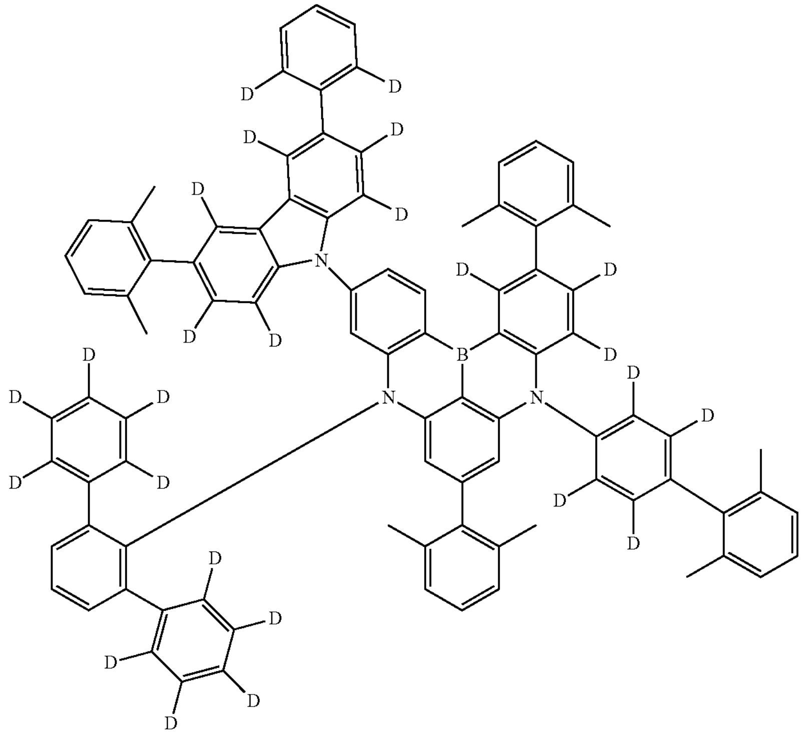

-continued
133
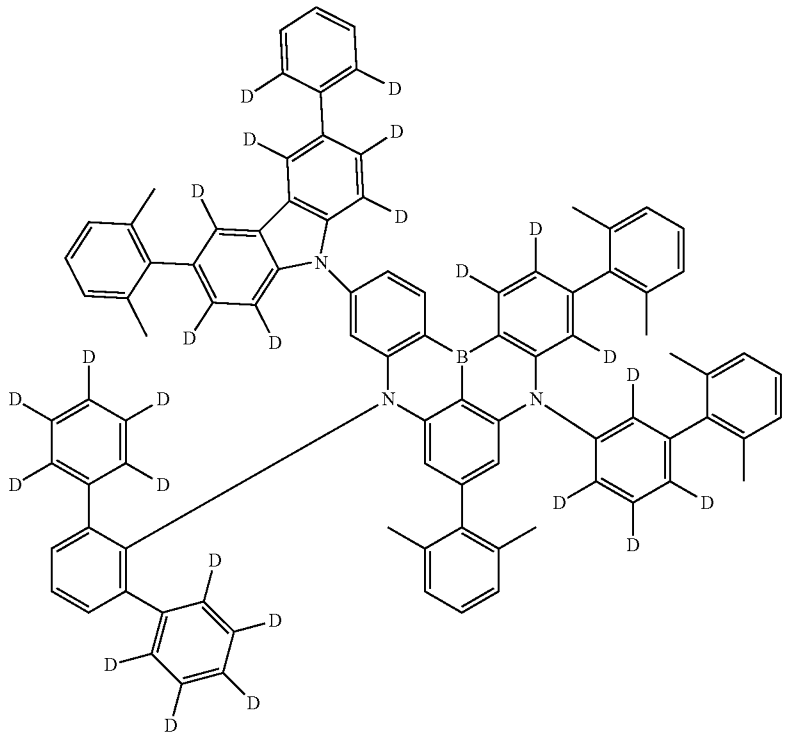
134
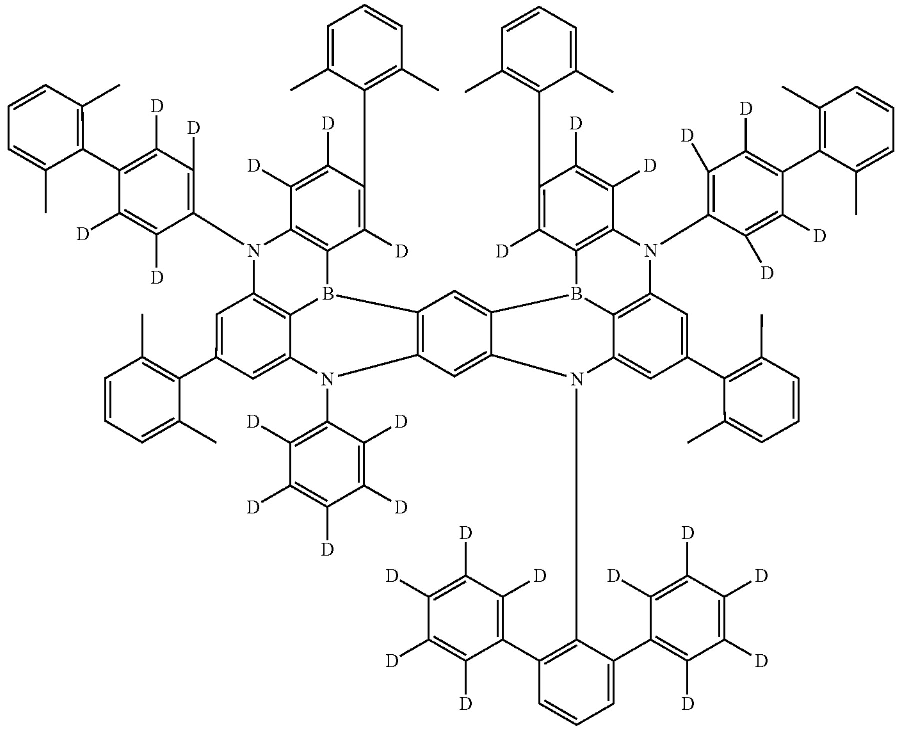

-continued
135
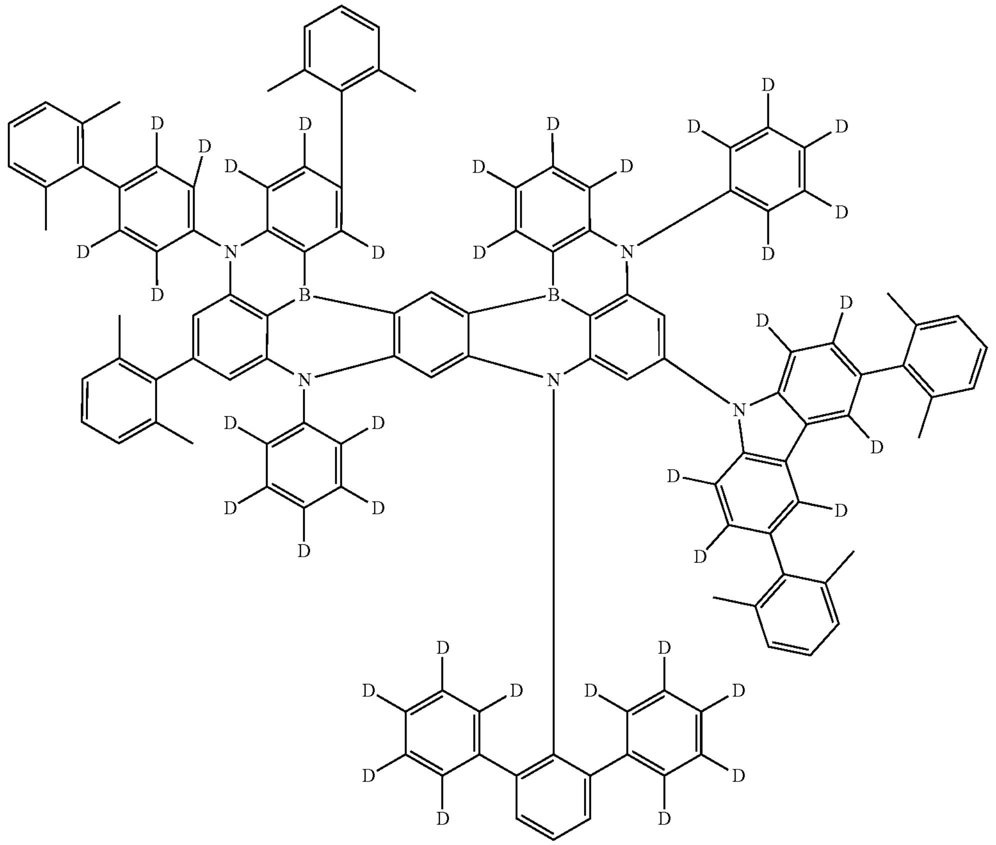
136
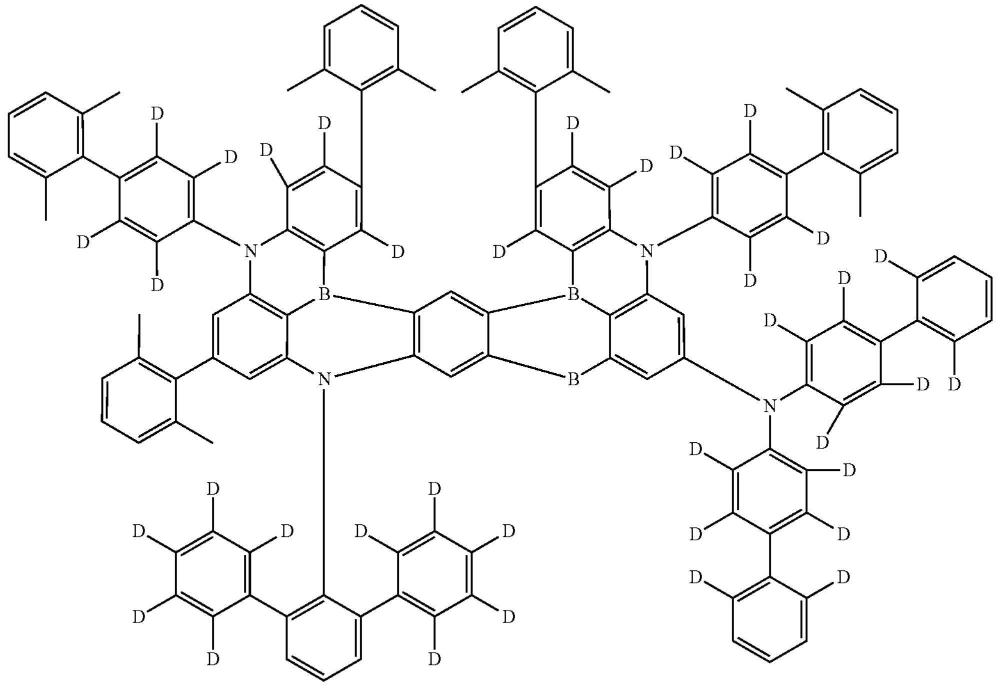

-continued
137
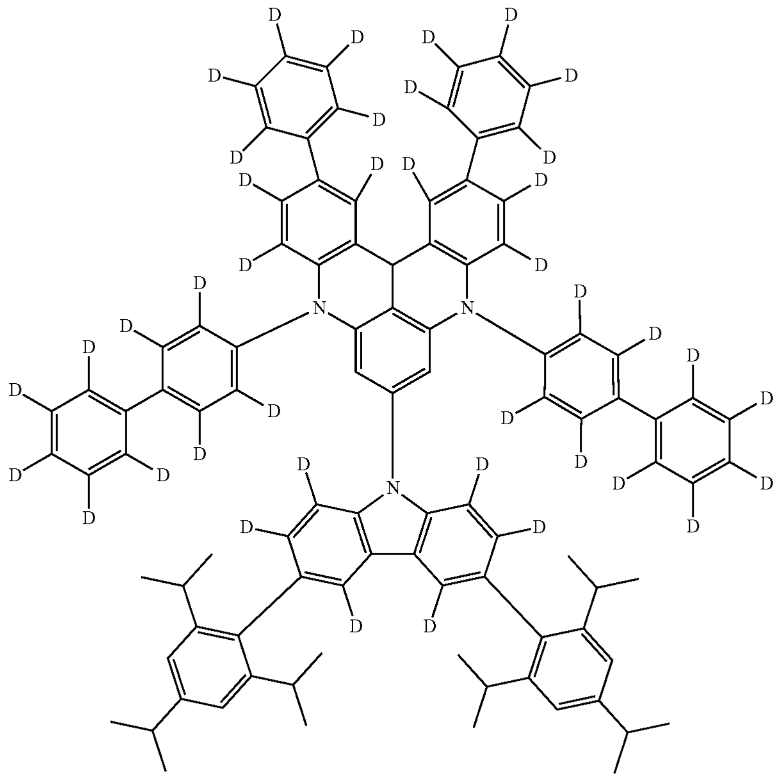
138
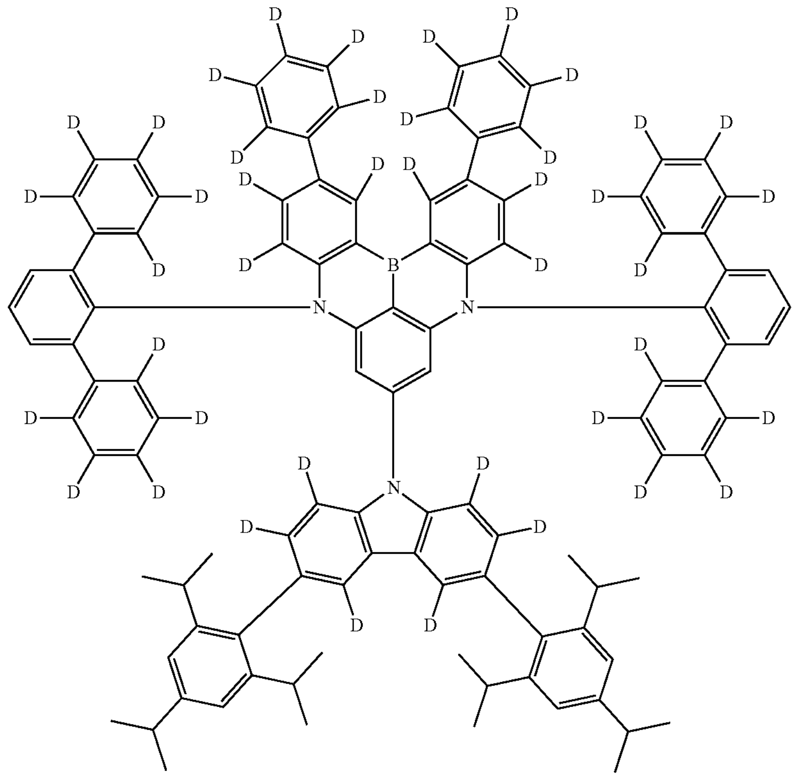

-continued

139

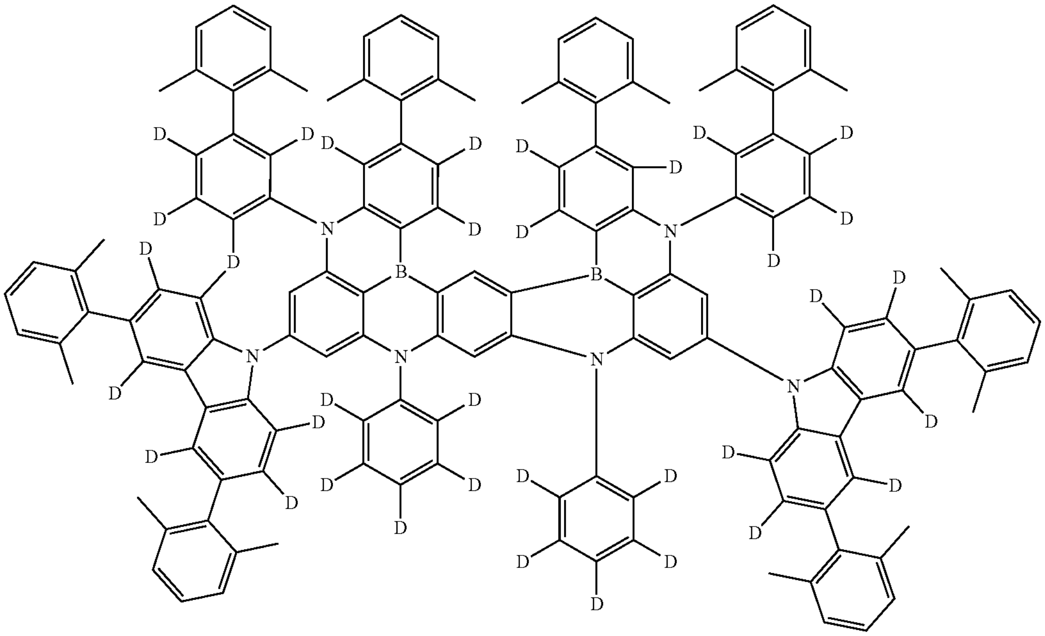

In the structure of the compounds shown herein, D may mean a deuterium atom.

The fused polycyclic compound represented by Formula 1 according to an embodiment may achieve a long service life, may reduce the luminescence wavelength (blue shift), and at the same time may finely control the luminescence wavelength, by introducing the first substituent represented by Formula 2 or the substituent represented by Formula 3 into the fused cyclic core.

The fused polycyclic compound of an embodiment includes a structure in which the first substituent represented by Formula 2 is essentially linked to a particular ring selected from among the aromatic rings constituting the fused cyclic core, or a structure in which the fused cyclic core contains at least one second substituent represented by Formula 3. Accordingly, the fused polycyclic compound of an embodiment may have an increase in the luminous efficiency because the intermolecular interaction may be suppressed or reduced through the steric hindrance effects by the first substituent or the second substituent, thereby controlling the formation of excimer and/or exciplex. In addition, the fused polycyclic compound represented by Formula 1 of an embodiment has a bulky structure, and thus the intermolecular distance may be widened to reduce Dexter energy transfer. The Dexter energy transfer is a phenomenon, in which a triplet exciton moves between molecules, and increases when the intermolecular distance is short, and may become a factor that increases a quenching phenomenon due to the increase of triplet concentration. According to embodiments of the present disclosure, the fused polycyclic compound of an embodiment has an increase in the distance between adjacent molecules due to the bulky structure to thereby suppress or reduce the Dexter energy transfer, and thus, may suppress or reduce the deterioration of service life due to the increase of triplet concentration. Therefore, when the fused polycyclic compound of an embodiment is applied to the emission layer EML of the light emitting device ED, the luminous efficiency may be increased and the device service life may also be improved.

In addition, the fused polycyclic compound represented by Formula 1 of an embodiment includes the first substituent represented by Formula 2 in the fused cyclic core, and thus, the dihedral angle between the plane including the fused cyclic core structure having the boron atom at the center and the plane including the first substituent may be increased. Accordingly, the effective conjugation length of the fused polycyclic compound represented by Formula 1 is shortened, and as a result, the luminescence wavelength may be reduced (blue shift). Furthermore, according to the steric hindrance characteristics due to the molecular structure or the position or number in which the first substituent represented by Formula 2 is substituted at the fused cyclic core, the conjugation length of the whole molecule may be controlled, and thus, the luminescence wavelength may be finely controlled.

The emission spectrum of the fused polycyclic compound represented by Formula 1 of an embodiment has a full width of half maximum of about 10 nm to about 50 nm, and, for example, a full width of half maximum of about 20 nm to about 40 nm. The emission spectrum of the fused polycyclic compound represented by Formula 1 of an embodiment has the above range of full width of half maximum, thereby improving luminous efficiency when applied to a device. In addition, when the fused polycyclic compound of an embodiment is used as a blue light emitting device material for the luminescence device, the service life of the device may be improved.

The fused polycyclic compound represented by Formula 1 of an embodiment may be a thermally activated delayed fluorescence emitting material. Furthermore, the fused polycyclic compound represented by Formula 1 of an embodiment may be a thermally activated delayed fluorescence dopant having the difference ($\Delta E_{ST}$) between the lowest triplet exciton energy level (T1 level) and the lowest singlet exciton energy level (S1 level) of about 0.3 eV or less. For example, $\Delta E_{ST}$ of the fused polycyclic compound represented by Formula 1 of an embodiment may be about 0.1 eV or less.

The fused polycyclic compound represented by Formula 1 of an embodiment may be a luminescent material having a luminescence center wavelength in a wavelength region of about 430 nm to about 490 nm. For example, the fused polycyclic compound of an embodiment, represented by Formula 1 may be a blue thermally activated delayed fluorescence (TADF) dopant. However, embodiments of the present disclosure are not limited thereto, and in case of using the fused polycyclic compound of an embodiment as the light-emitting material, the fused polycyclic compound may be used as a dopant material emitting light in various suitable wavelength regions, such as a red emitting dopant and a green emitting dopant.

The emission layer EML in the light emitting device ED of an embodiment may emit delayed fluorescence. For example, the emission layer EML may emit thermally activated delayed fluorescence (TADF).

In addition, the emission layer EML of the light emitting device ED may emit blue light. For example, the emission layer EML of the light emitting device ED of an embodiment may emit blue light in the region of about 490 nm or less. However, embodiments of the present disclosure are not limited thereto, and the emission layer EML may emit green light or red light.

In some embodiments, the light emitting device ED of an embodiment may include a plurality of emission layers. The plurality of emission layers may be sequentially stacked, and for example, the light emitting device ED including the plurality of emission layers may emit white light. The organic electroluminescence device including a plurality of emission layers may be an organic electroluminescence device having a tandem structure. When the light emitting device ED includes a plurality of emission layers, at least one emission layer EML may include the fused polycyclic compound of an embodiment as described above.

In an embodiment, the emission layer EML includes a host and a dopant, and may include the above-described fused polycyclic compound as a dopant. For example, the emission layer EML in the light emitting device ED of an embodiment may include a host for emitting delayed fluorescence and a dopant for emitting delayed fluorescence, and may include the above-described fused polycyclic compound as a dopant for emitting delayed fluorescence. The emission layer EML may include at least one selected from among the fused polycyclic compounds represented by Compound Group 1 as described above as a thermally activated delayed fluorescence dopant.

In the light emitting device ED of an embodiment, the emission layer EML may include an anthracene derivative, a pyrene derivative, a fluoranthene derivative, a chrysene derivative, a dehydrobenzanthracene derivative, or a triphenylene derivative. In some embodiments, the emission layer EML may include the anthracene derivative or the pyrene derivative.

In each light emitting device ED of embodiments illustrated in FIGS. 3 to 6, the emission layer EML may further include any suitable host and dopant other than the above-described host and dopant, and the emission layer EML may include a compound represented by Formula E-1 below. The compound represented by Formula E-1 below may be used as a fluorescent host material.

Formula E-1

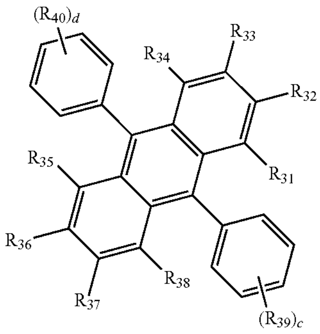

In Formula E-1, $R_{31}$ to $R_{40}$ may be each independently a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In some embodiments, $R_{31}$ to $R_{40}$ may be bonded to an adjacent group to form a saturated hydrocarbon ring or an unsaturated hydrocarbon ring, a saturated heterocycle, or an unsaturated heterocycle.

In Formula E-1, c and d may be each independently an integer of 0 to 5.

Formula E-1 may be represented by any one selected from among Compound E1 to Compound E19 below:

E1

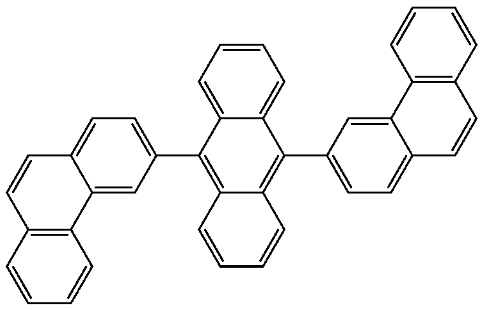

E2

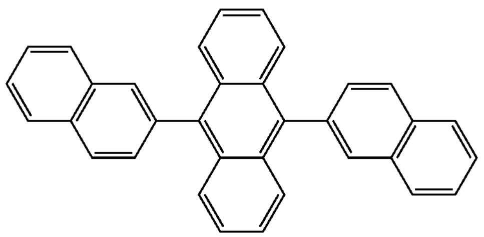

-continued
E3
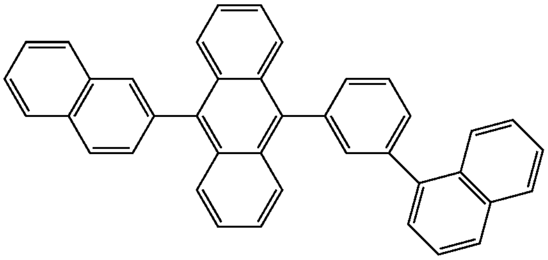
E4
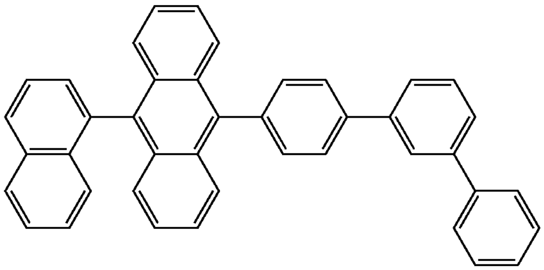
E5
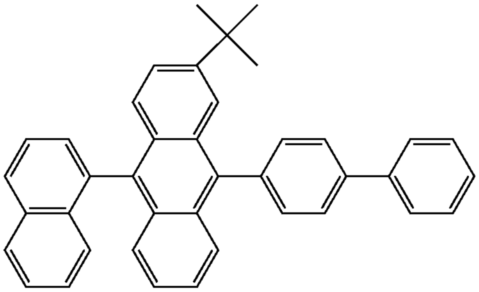
E6
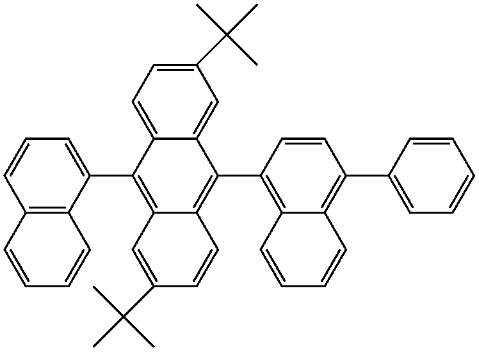
E7
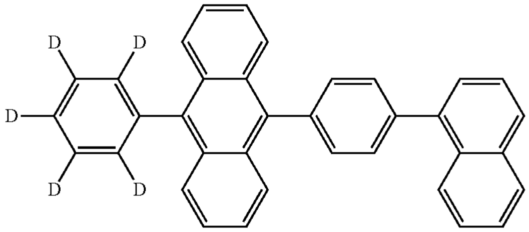
-continued
E8
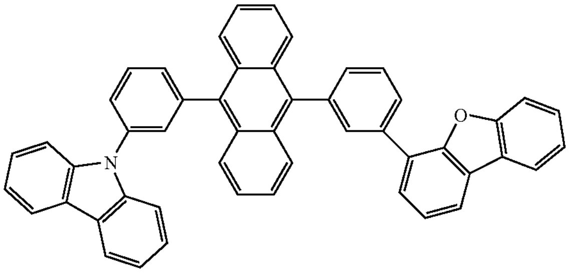
E9
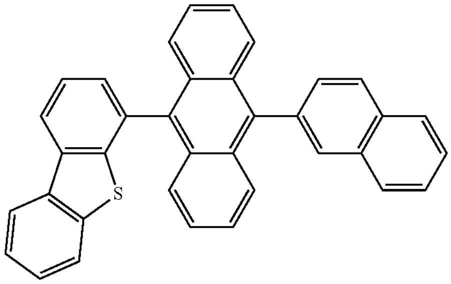
E10
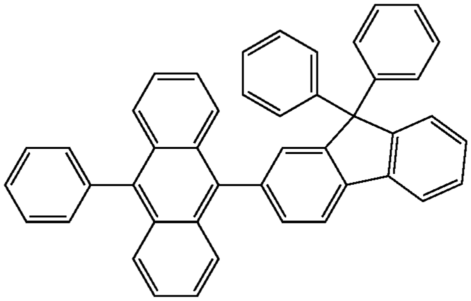
E11
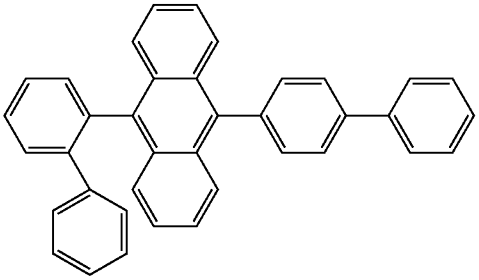
E12
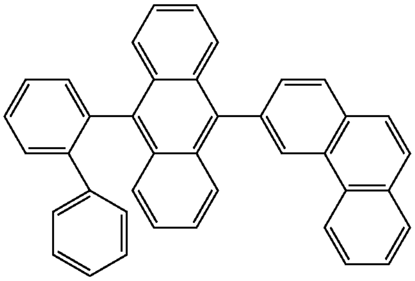

-continued
E13
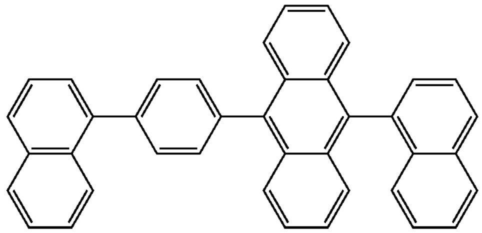
E14
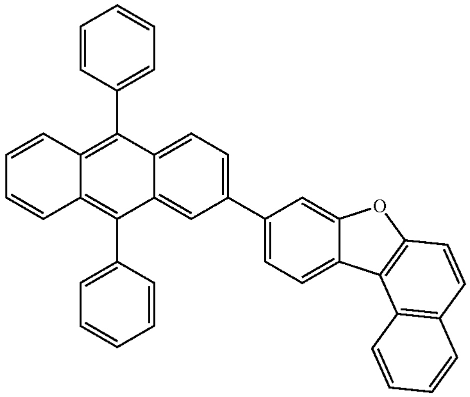
E15
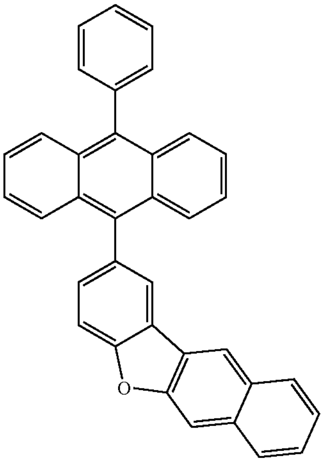
E16
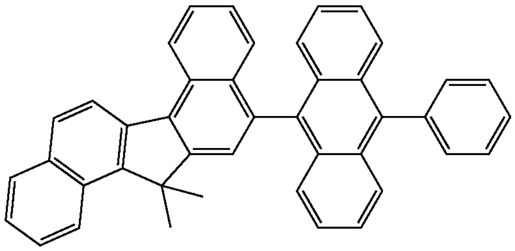
-continued
E17
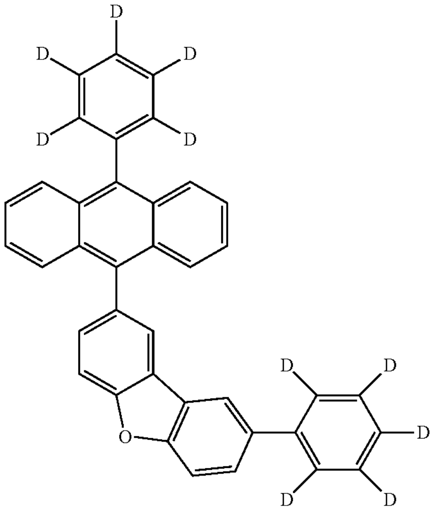
E18
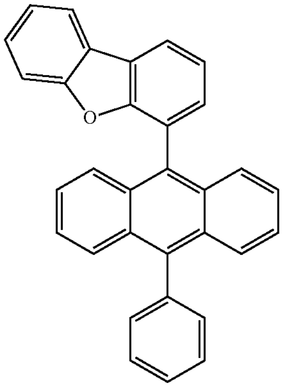
E19
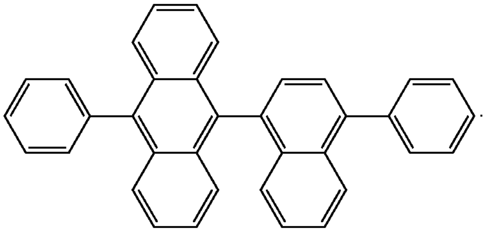
In an embodiment, the emission layer EML may include a compound represented by Formula E-2a or Formula E-2b below. The compound represented by Formula E-2a or Formula E-2b below may be used as a phosphorescent host material.

Formula E-2a

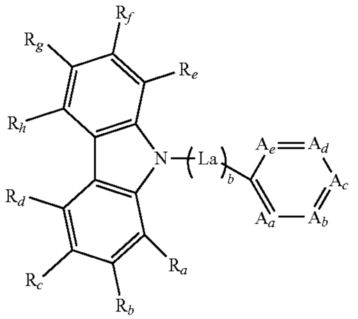

In Formula E-2a, a may be an integer of 0 to 10, and $L_a$ may be a direct linkage, a substituted or unsubstituted arylene group having 6 to 30 ring-forming carbon atoms, or a substituted or unsubstituted heteroarylene group having 2 to 30 ring-forming carbon atoms. When b is an integer of 2 or more, a plurality of $L_a$'s may be each independently a substituted or unsubstituted arylene group having 6 to 30 ring-forming carbon atoms, or a substituted or unsubstituted heteroarylene group having 2 to 30 ring-forming carbon atoms.

In addition, in Formula E-2a, $A_a$ to $A_e$ may be each independently N or $CR_i$. $R_a$ to $R_i$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $R_a$ to $R_i$ may be bonded to an adjacent group to form a hydrocarbon ring or a heterocycle containing N, O, S, etc. as a ring-forming atom.

In Formula E-2a, two or three selected from among $A_a$ to $A_e$ may be N, and the rest may be $CR_i$.

Formula E-2b $$(Cbz1)-(L_b)_c-(Cbz2)$$

In Formula E-2b, Cbz1 and Cbz2 may be each independently an unsubstituted carbazole group, or a carbazole group substituted with an aryl group having 6 to 30 ring-forming carbon atoms. $L_b$ is a direct linkage, a substituted or unsubstituted arylene group having 6 to 30 ring-forming carbon atoms, or a substituted or unsubstituted heteroarylene group having 2 to 30 ring-forming carbon atoms. c is an integer of 0 to 10, and when c is an integer of 2 or more, a plurality of $L_b$'s may be each independently a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one selected from among the compounds of Compound Group E-2 below. However, the compounds listed in Compound Group E-2 below are examples, and the compound represented by Formula E-2a or Formula E-2b is not limited to those represented in Compound Group E-2 below.

Compound Group E-2

E-2-1

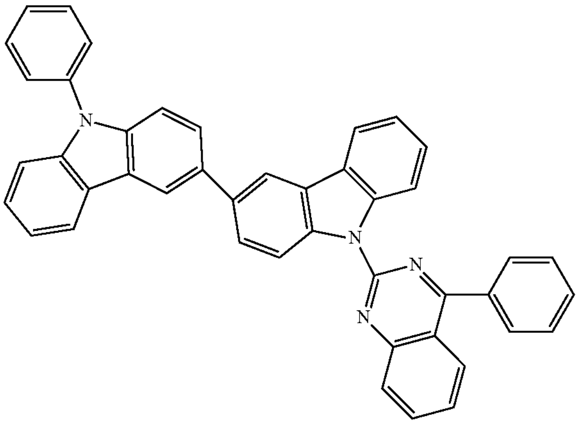

E-2-2

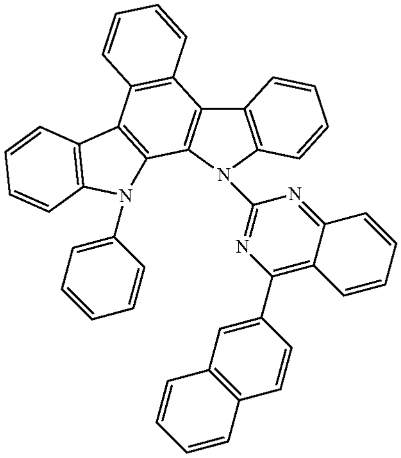

E-2-3

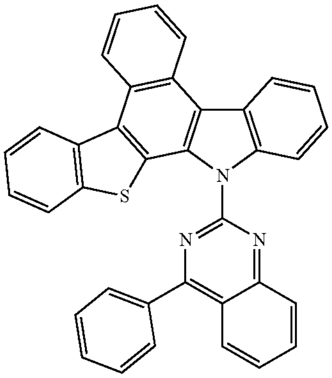

-continued
E-2-4
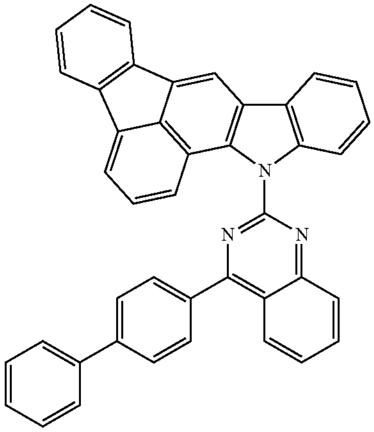
E-2-5
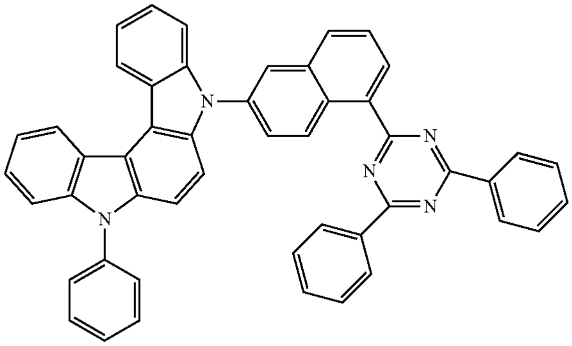
E-2-6
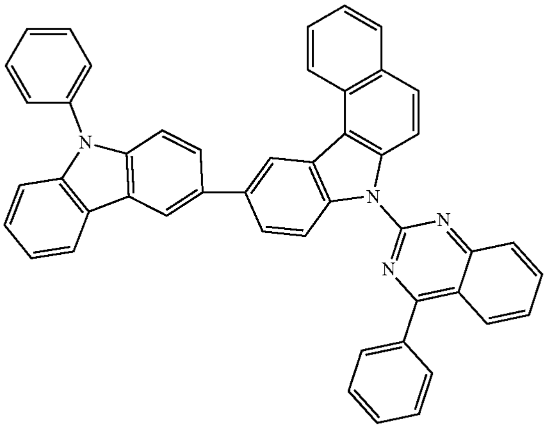
-continued
E-2-7
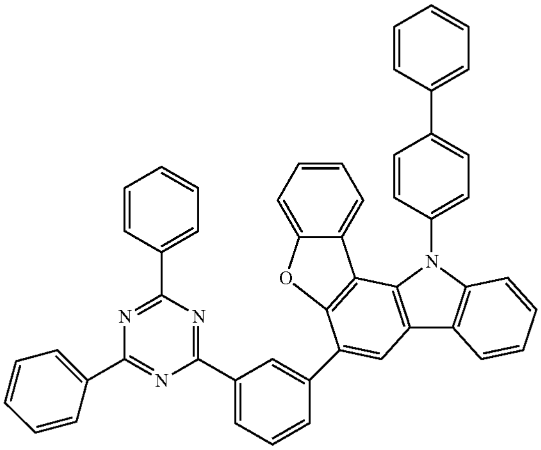
E-2-8
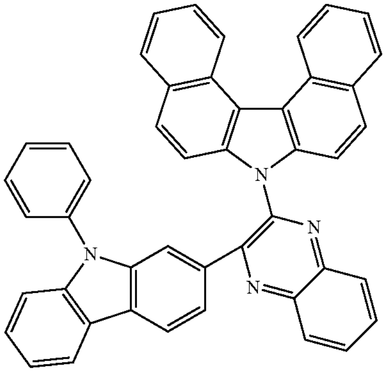
E-2-9
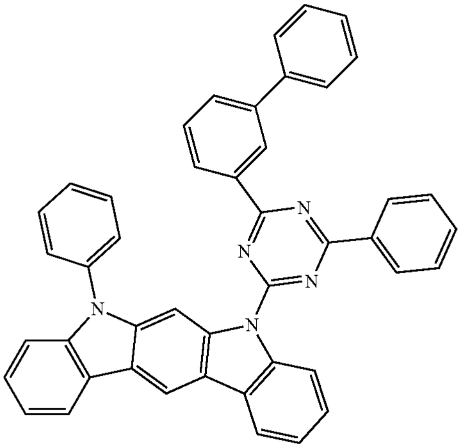

E-2-10
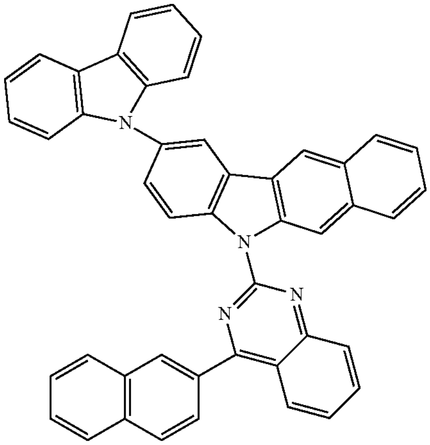
E-2-11
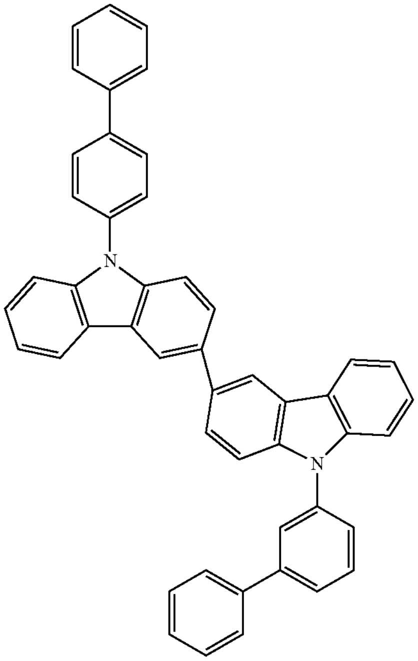
E-2-12
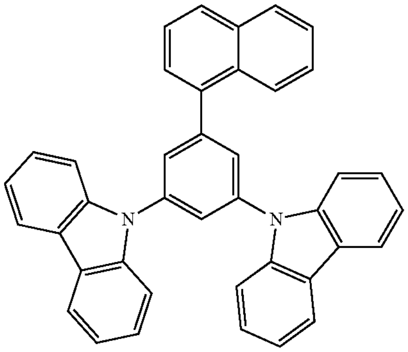
E-2-13
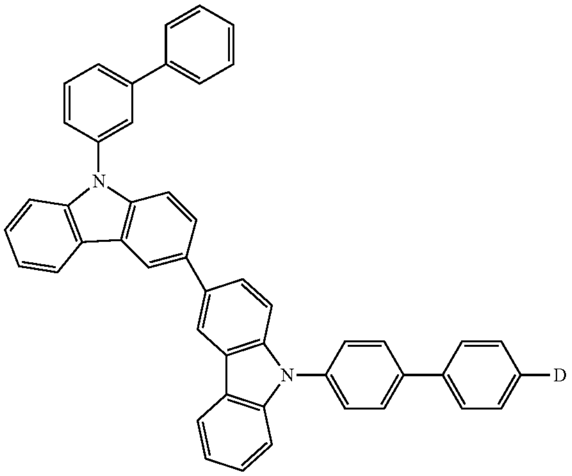
E-2-14
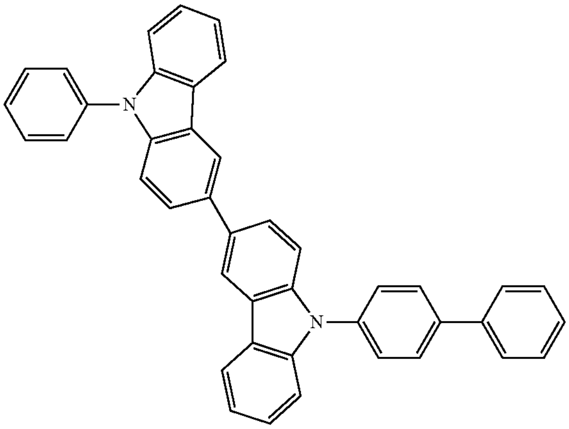
E-2-15
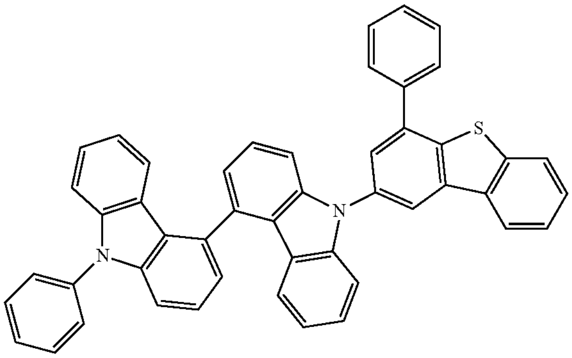

-continued
E-2-16
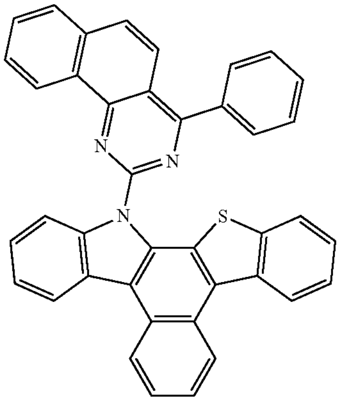
E-2-17
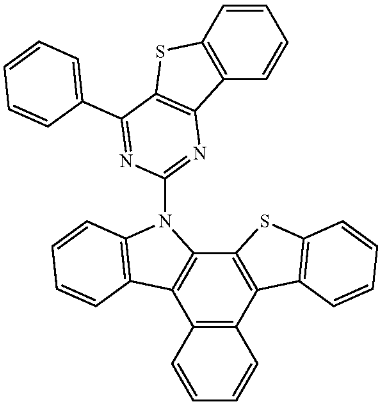
E-2-18
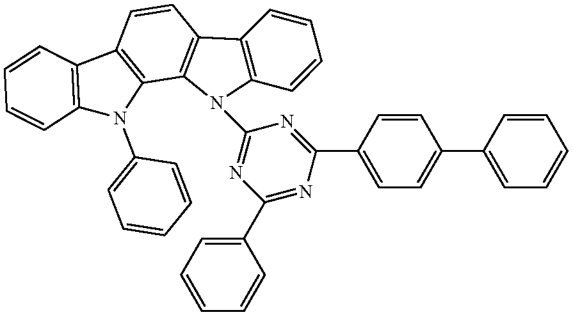
E-2-19
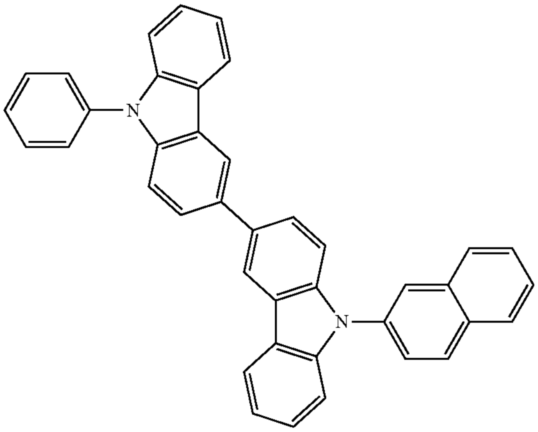
-continued
E-2-20
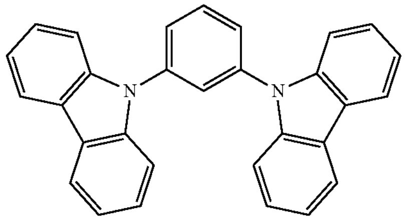
E-2-21
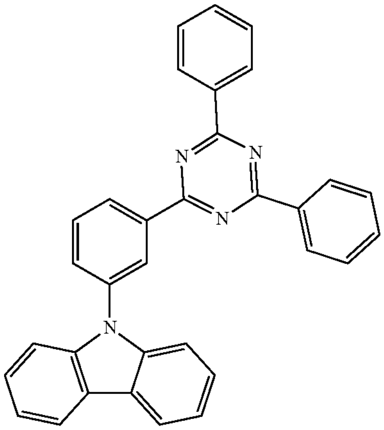
E-2-22
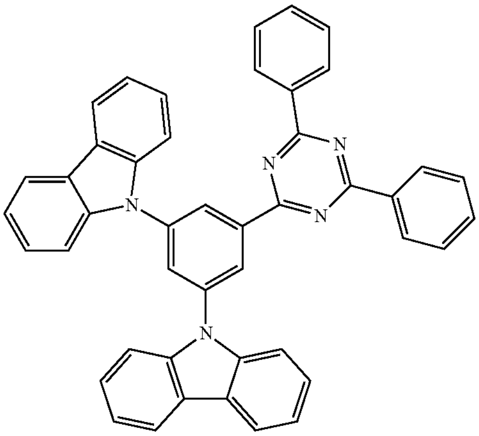
E-2-23
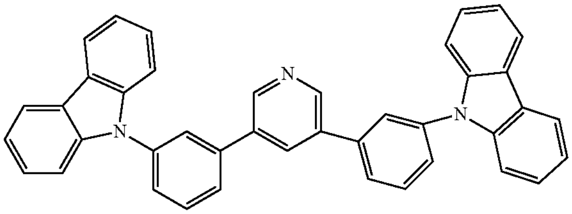

-continued

E-2-24

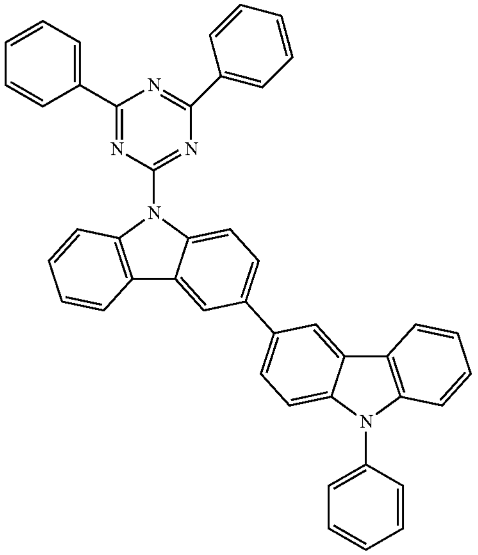

The emission layer EML may further include any suitable material generally used in the art as a host material. For example, the emission layer EML may include, as a host material, at least one of bis(4-(9H-carbazol-9-yl)phenyl) diphenylsilane (BCPDS), (4-(1-(4-(diphenylamino)phenyl) cyclohexyl)phenyl)diphenyl-phosphine oxide (POPCPA), bis[2-(diphenylphosphino)phenyl]ether oxide (DPEPO), 4,4'-bis(N-carbazolyl)-1,1'-biphenyl (CBP), 1,3-bis(carbazol-9-yl)benzene (mCP), 2,8-bis(diphenylphosphoryl) dibenzo[b,d]furan (PPF), 4,4',4"-tris(carbazol-9-yl)-triphenylamine (TCTA), or 1,3,5-tris(1-phenyl-1H-benzo[d] imidazole-2-yl)benzene (TPBi). However, embodiments of the present disclosure are not limited thereto, for example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as a host material.

The emission layer EML may further include a compound represented by Formula M-a or Formula M-b below. The compound represented by Formula M-a or Formula M-b below may be used as a phosphorescence dopant material.

Formula M-a

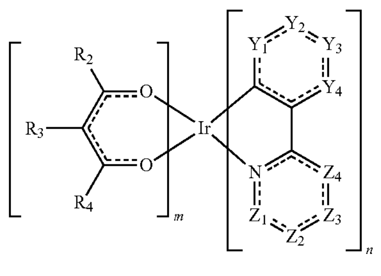

In Formula M-a above, $Y_1$ to $Y_4$ and $Z_1$ to $Z_4$ may be each independently $CR_1$ or N, $R_1$ to $R_4$ may be each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula M-a, m is 0 or 1, and n is 2 or 3. In Formula M-a, when m is 0, n is 3, and when m is 1, n is 2.

The compound represented by Formula M-a may be used as a phosphorescent dopant.

The compound represented by Formula M-a may be represented by any one selected from among Compound M-a1 to Compound M-a25 below. However, Compounds M-a1 to M-a25 below are examples, and the compound represented by Formula M-a is not limited to those represented by Compounds M-a1 to M-a25 below.

M-a1

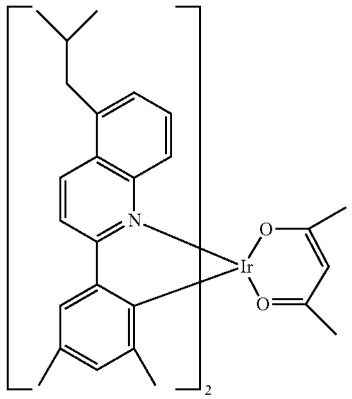

M-a2

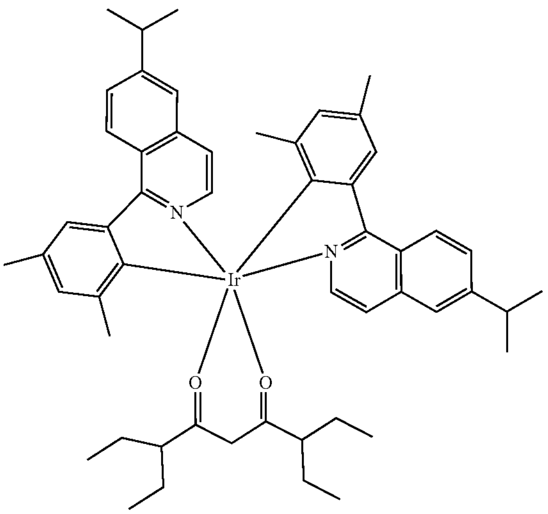

-continued
M-a3
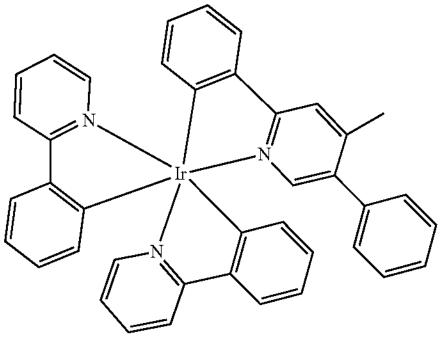
M-a4
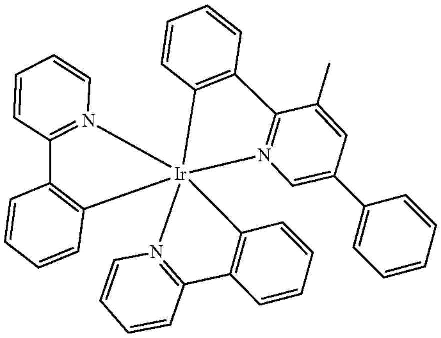
M-a5
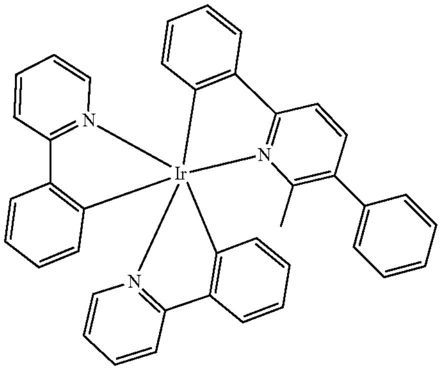
M-a6
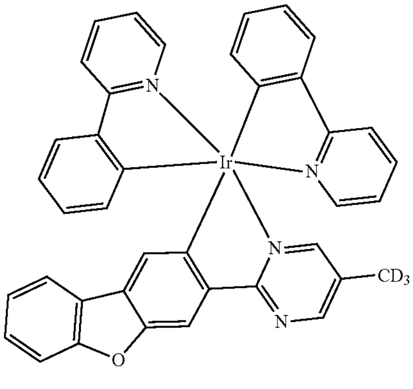
-continued
M-a7
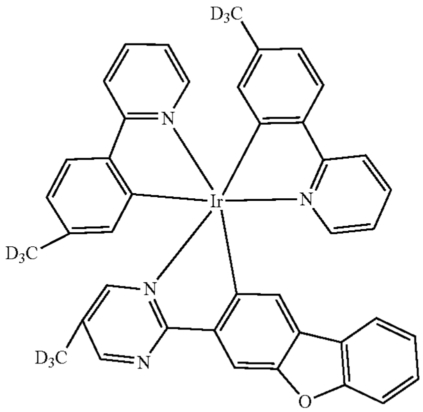
M-a8
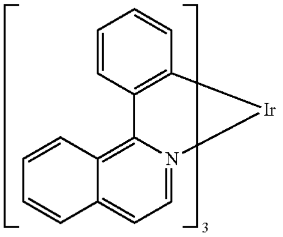
M-a9
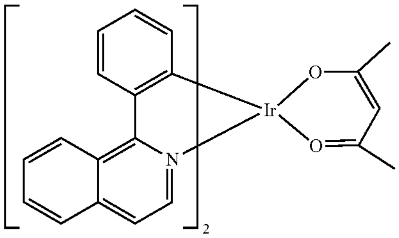
M-a10
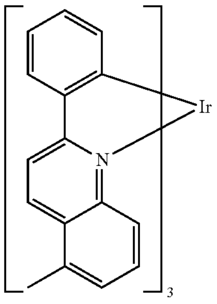
M-a11
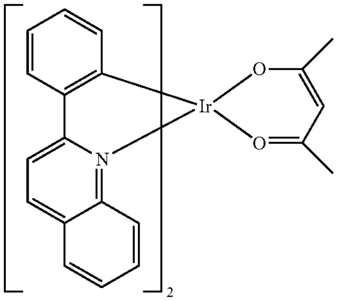

-continued
M-a12
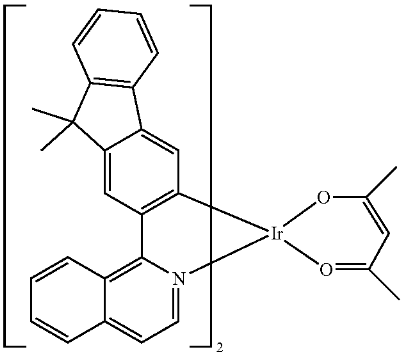
M-a13
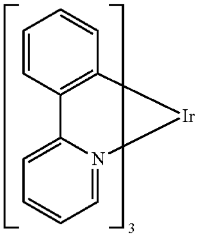
M-a14
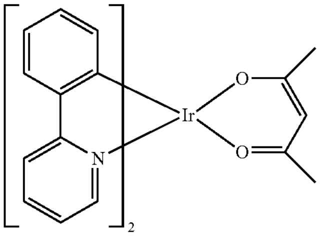
M-a15
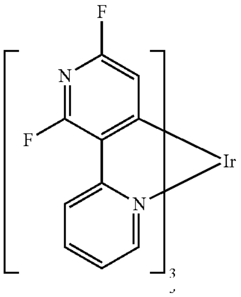
M-a16
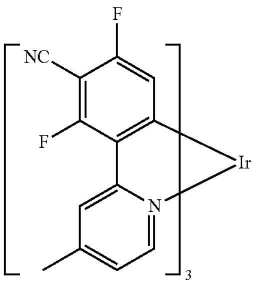
-continued
M-a17
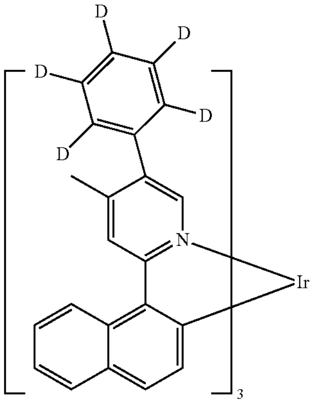
M-a18
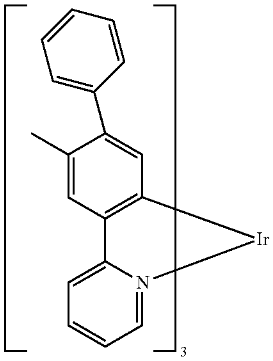
M-a19
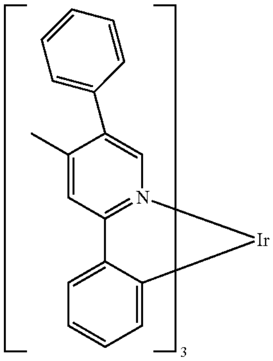
M-a20
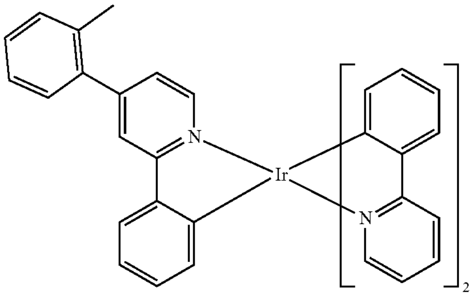

-continued

M-a21

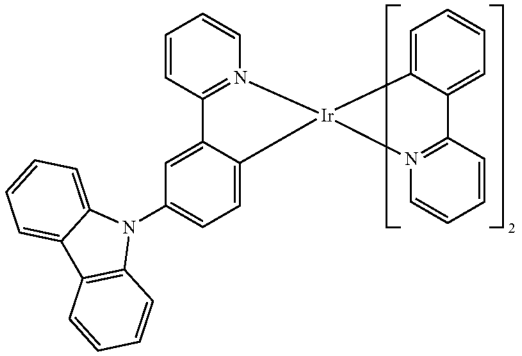

M-a22

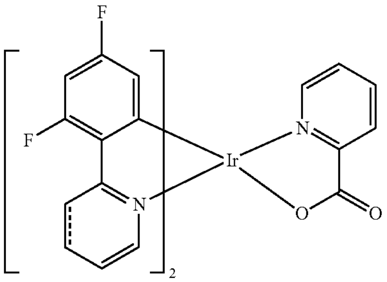

M-a23

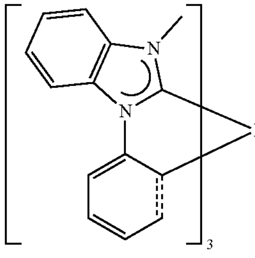

M-a24

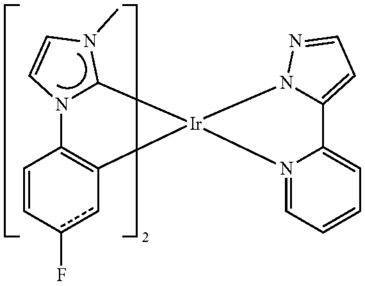

M-a25

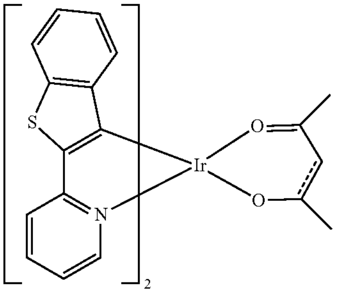

-continued

Formula M-b

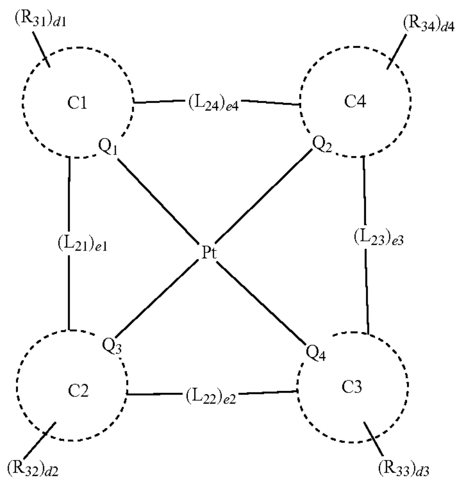

In Formula M-b, $Q_1$ to $Q_4$ are each independently C or N, and C1 to C4 are each independently a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ are each independently a direct linkage,

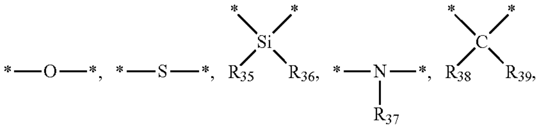

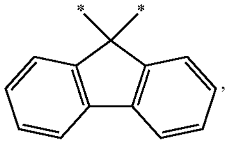

substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 are each independently 0 or 1. $R_{31}$ to $R_{39}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, and d1 to d4 are each independently an integer of 0 to 4.

The compound represented by Formula M-b may be used as a blue phosphorescence dopant or a green phosphorescence dopant.

The compound represented by Formula M-b may be represented by any one selected from among the compounds below. However, the compounds below are examples, and the compound represented by Formula M-b is not limited to those represented by the compounds below.

-continued
M-b-1
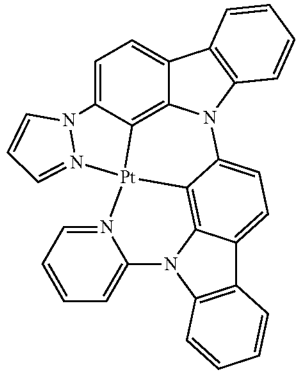
M-b-2
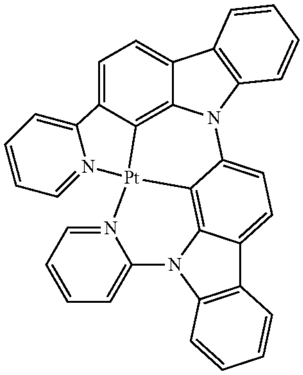
M-b-3
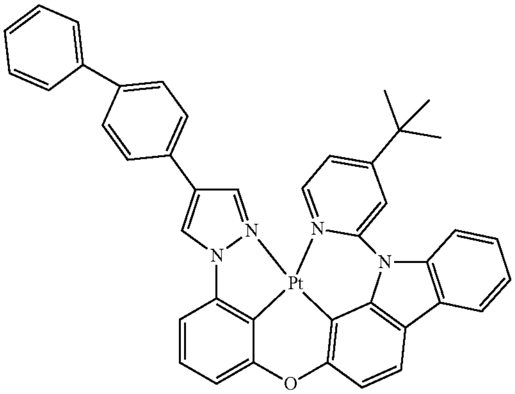
M-b-4
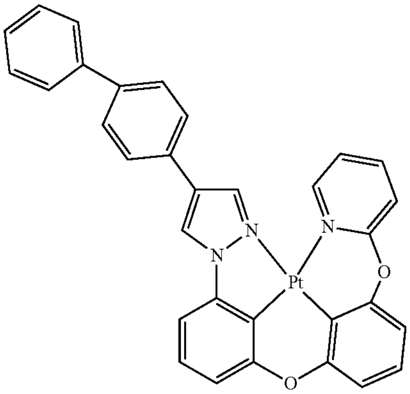
M-b-5
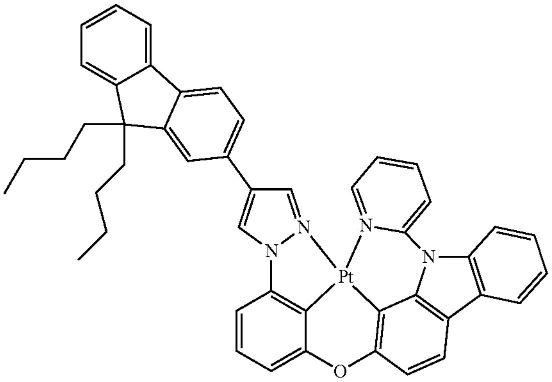
M-b-6
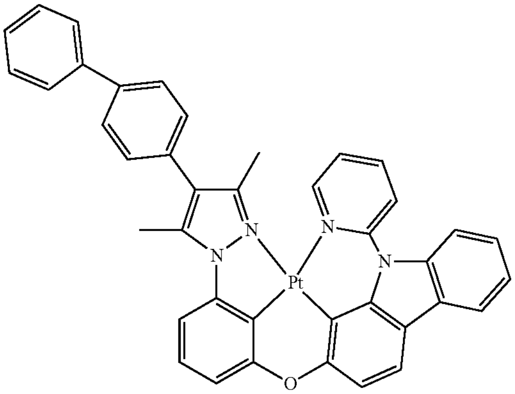
M-b-7
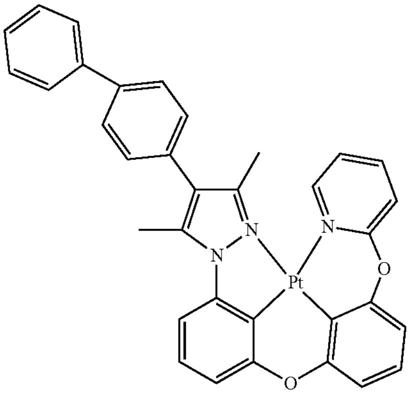
M-b-8
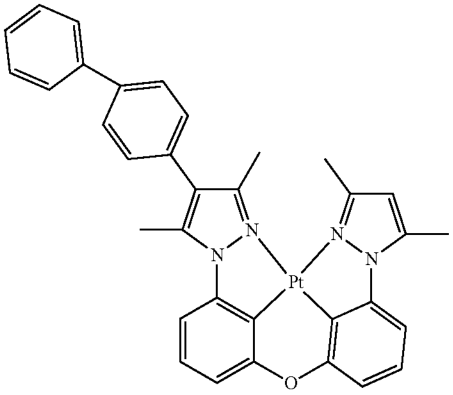

-continued

M-b-9

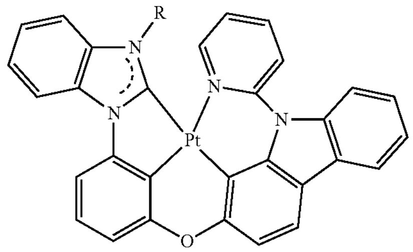

M-b-10

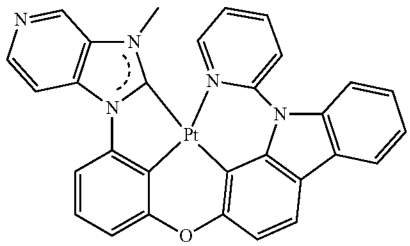

M-b-11

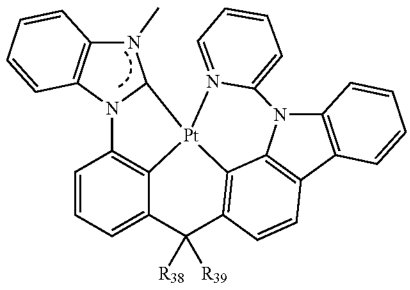

In the compounds of Formula M-b, R, $R_{38}$, and $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may further include a compound represented by any one selected from among Formula F-a to Formula F-c below. The compound represented by Formula F-a or Formula F-c below may be used as a fluorescence dopant material.

Formula F-a

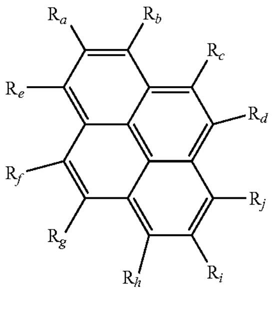

In Formula F-a above, two selected from among $R_a$ to $R_j$ may each independently be substituted with $*$—$NAr_1Ar_2$. The others, which are not substituted with $*$—$NAr_1Ar_2$ selected from among $R_a$ to $R_j$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In $*$—$NAr_1Ar_2$, $Ar_1$ and $Ar_2$ may be each independently a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

Formula F-b

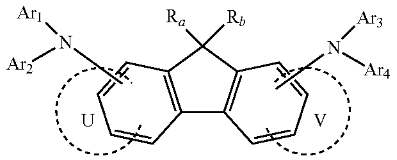

In Formula F-b above, $R_a$ and $R_b$ may be each independently a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-b, U and V may be each independently a substituted or unsubstituted hydrocarbon ring having 5 to 30 ring-forming carbon atoms, or a substituted or unsubstituted heterocycle having 2 to 30 ring-forming carbon atoms. At least one selected from among $Ar_1$ to $Ar_4$ may be a heteroaryl group containing O or S as a ring-forming atom.

In Formula F-b, the number of rings represented by U and V may be each independently 0 or 1. For example, in Formula F-b, it means that when the number of U or V is 1, one ring constitutes a fused ring at a portion indicated by U or V, and when the number of U or V is 0, a ring indicated by U or V does not exist. In some embodiments, when the number of U is 0 and the number of V is 1, or when the number of U is 1 and the number of V is 0, the fused ring having a fluorene core in Formula F-b may be a cyclic compound having four rings. In addition, when each number of U and V is 0, the fused ring in Formula F-b may be a cyclic compound having three rings. In addition, when each number of U and V is 1, the fused ring having a fluorene core in Formula F-b may be a cyclic compound having five rings.

Formula F-c

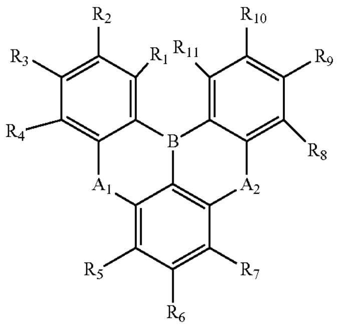

In Formula F-c, $A_1$ and $A_2$ may be each independently O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ are each independently a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring.

In Formula F-c, $A_1$ and $A_2$ may each independently be bonded to substituents of an adjacent ring to form a condensed ring. For example, when $A_1$ and $A_2$ are each independently $NR_m$, $A_1$ may be bonded to $R_4$ or $R_5$ to form a ring. In addition, $A_2$ may be bonded to $R_7$ or $R_8$ to form a ring.

In an embodiment, the emission layer EML may further include any suitable dopant material generally used in the art. In some embodiments, the emission layer EML may further include styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-yl) vinyl)phenyl)-N-phenylbenzenamine (N-BDAVBi), 4,4'-bis [2-(4-(N,N-diphenylamino)phenyl)vinyl]biphenyl (DPAVBi), perylene and/or the derivatives thereof (e.g., 2,5,8,11-tetra-t-butylperylene (TBP)), pyrene and/or the derivatives thereof (e.g., 1,1-dipyrene, 1,4-dipyrenylbenzene, 1,4-bis(N,N-diphenylamino)pyrene), etc.

The emission layer EML may further include any suitable phosphorescence dopant material generally used in the art. In some embodiments, a metal complex containing iridium (Ir), platinum (Pt), osmium (Os), aurum (Au), titanium (Ti), zirconium (Zr), hafnium (Hf), europium (Eu), terbium (Tb), or thulium (Tm) may be used as a phosphorescent dopant. In some embodiments, iridium(III) bis(4,6-difluorophenylpyridinato-N,C2')picolinate (Firpic), bis(2,4-difluorophenylpyridinato)-tetrakis(1-pyrazolyl)borate iridium(III) (Fir6), and/or platinum octaethyl porphyrin (PtOEP) may be used as a phosphorescent dopant. However, embodiments of the present disclosure are not limited thereto.

The emission layer EML may include a quantum dot material. The core of the quantum dot may be selected from among a Group II-VI compound, a Group III-VI compound, a Group I-III-IV compound, a Group III-V compound, a Group III-II-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and/or $In_2Se_3$, a ternary compound such as $InGaS_3$ and/or $InGaSe_3$, or any combination thereof.

The Group I-III-VI compound may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof, or a quaternary compound such as $AgInGaS_2$ and $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. In some embodiments, the Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, a binary compound, a ternary compound, or a quaternary compound may be present in particles in a uniform (e.g., substantially uniform) concentration distribution, or may be present in the same particle in a partially different concentration distribution. In addition, a core/shell structure in which one quantum dot surrounds another quantum dot may also be possible. The core/shell structure may have a concentration gradient in which the concentration of elements present in the shell decreases along a direction toward the core.

In some embodiments, a quantum dot may have the above-described core-shell structure including a core containing nanocrystals and a shell surrounding the core. The shell of the quantum dot may serve as a protection layer to prevent or reduce the chemical deformation of the core so as to maintain semiconductor properties, and/or a charging layer to impart electrophoresis properties to the quantum dot. The shell may be a single layer or a multilayer. An example of the shell of the quantum dot may include a metal and/or non-metal oxide, a semiconductor compound, or a combination thereof.

For example, the metal and/or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but embodiments of the present disclosure are not limited thereto.

Also, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments of the present disclosure are not limited thereto.

The quantum dot may have a full width of half maximum (FWHM) of a light emission wavelength spectrum of about 45 nm or less, about 40 nm or less, or, for example, about 30 nm or less, and color purity or color reproducibility may be improved in the above range. In addition, light emitted through such a quantum dot is emitted in all directions (e.g., substantially all directions), and thus, a wide viewing angle may be improved.

In addition, the form of a quantum dot is not particularly limited. Instead, the quantum dot may have any suitable form generally used in the art. In some embodiments, a quantum dot in the form of spherical, pyramidal, multi-arm, or cubic nanoparticles, nanotubes, nanowires, nanofibers, nanoparticles, etc. may be used.

The quantum dot may control the color of emitted light according to the particle size thereof, and accordingly, the quantum dot may have various suitable emission colors such as blue, red, and green.

In each light emitting device ED of embodiments illustrated in FIGS. 3 to 6, the electron transport region ETR is provided on the emission layer EML. The electron transport region ETR may include at least one of the hole blocking layer HBL, the electron transport layer ETL, or the electron injection layer EIL, but embodiments of the present disclosure are not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of the electron injection layer EIL or the electron transport layer ETL, and may have a single layer structure formed of an electron injection material and an electron transport material. In addition, the electron transport region ETR may have a single layer structure formed of a plurality of different materials, or may have a structure in which an electron transport layer ETL/electron injection layer EIL, a hole blocking layer HBL/electron transport layer ETL/electron injection layer EIL are stacked in order from the emission layer EML, but embodiments of the present disclosure are not limited thereto. The electron transport region ETR may have a thickness, for example, from about 1,000 Å to about 1,500 Å.

The electron transport region ETR may be formed by using various suitable methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below:

Formula ET-1

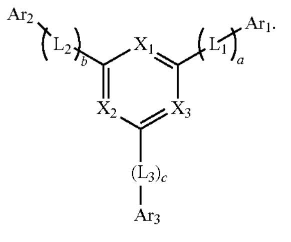

In Formula ET-1, at least one selected from among $X_1$ to $X_3$ is N, and the rest are $CR_a$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $Ar_1$ to $Ar_3$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may be each independently an integer of 0 to 10. In Formula ET-1, $L_1$ to $L_3$ may be each independently a direct linkage, a substituted or unsubstituted arylene group having 6 to 30 ring-forming carbon atoms, or a substituted or unsubstituted heteroarylene group having 2 to 30 ring-forming carbon atoms. When a to c are an integer of 2 or more, $L_1$ to $L_3$ may be each independently a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, embodiments of the present disclosure are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl)anthracene (ADN), 1,3-Bis[3,5-di(pyridin-3-yl)phenyl]benzene (BmPyPhB), or a mixture thereof.

The electron transport region ETR may include at least one selected from among Compound ET1 to Compound ET36 below:

ET1

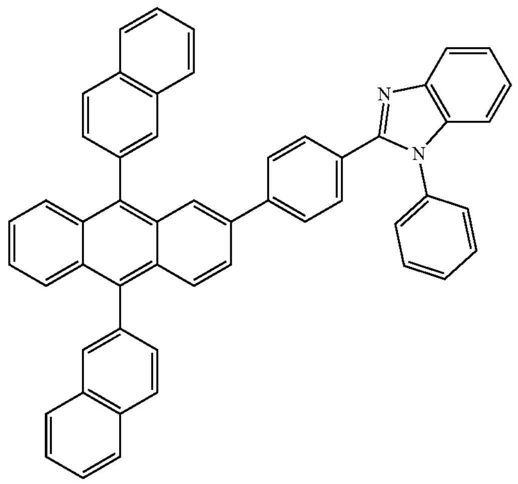

-continued
ET2
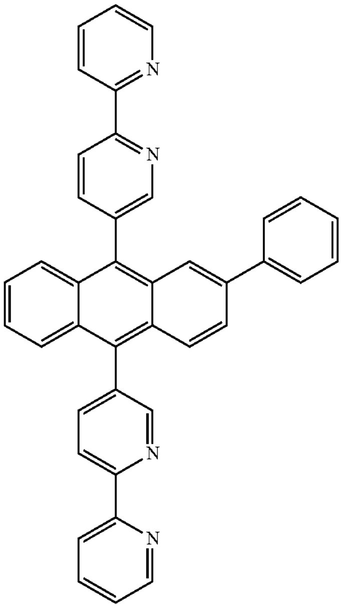
ET3
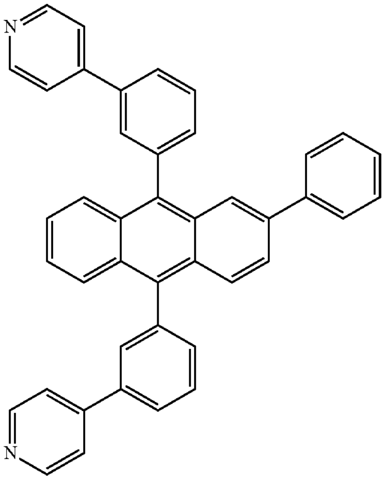
ET4
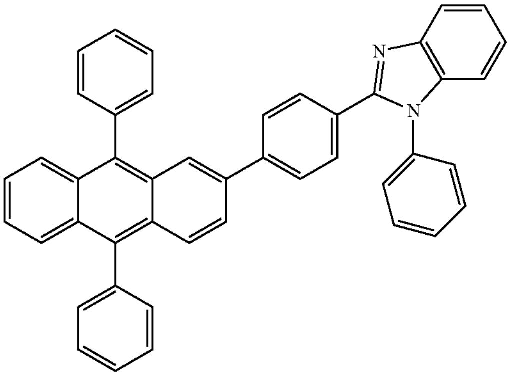
-continued
ET5
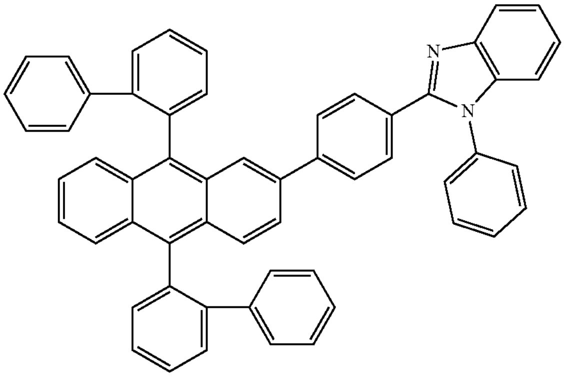
ET6
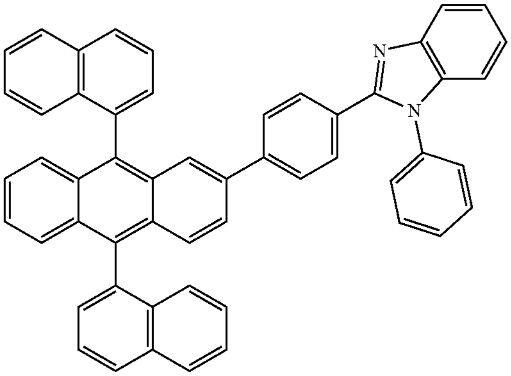
ET7
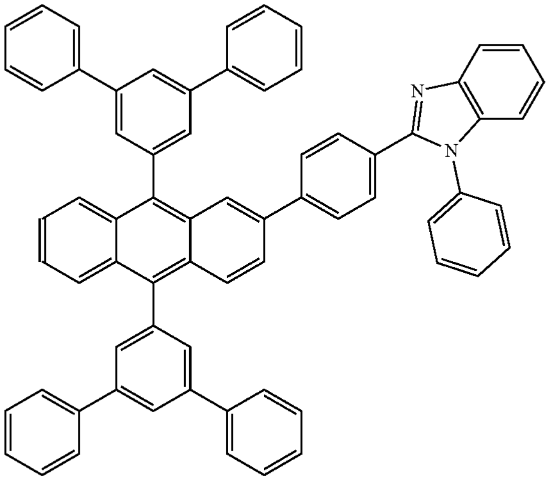

-continued
ET8
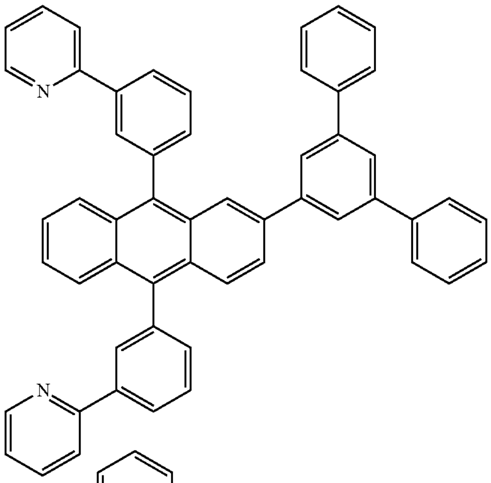
ET9
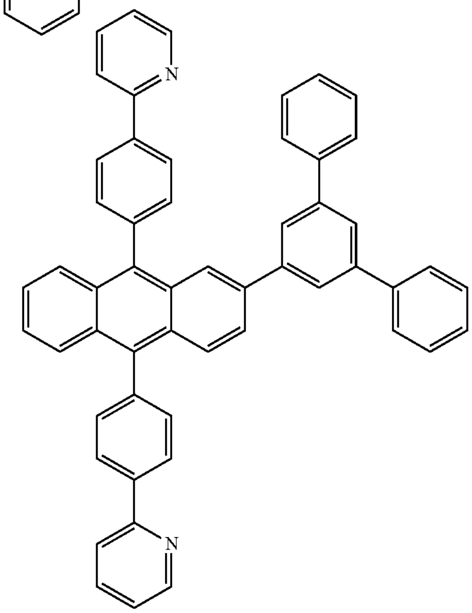
ET10
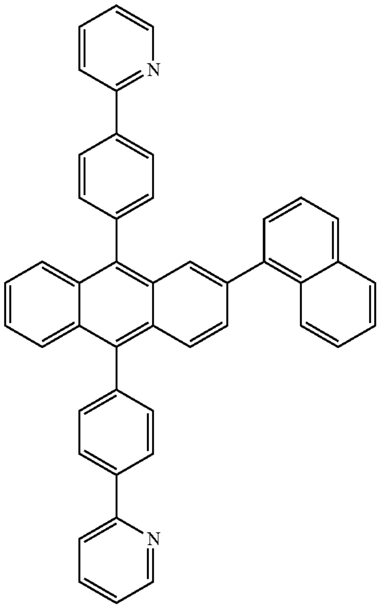
-continued
ET11
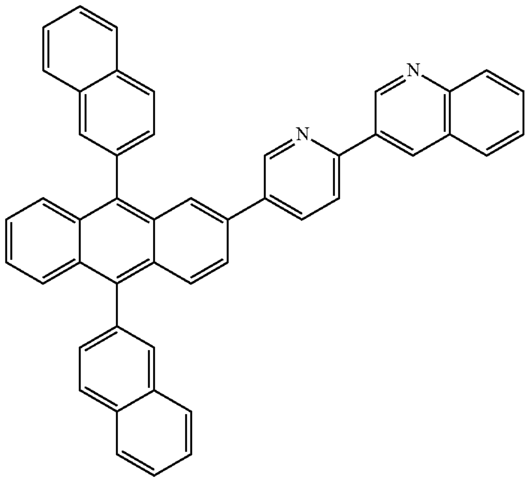
ET12
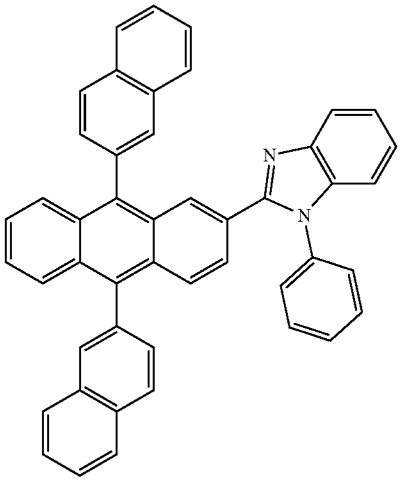
ET13
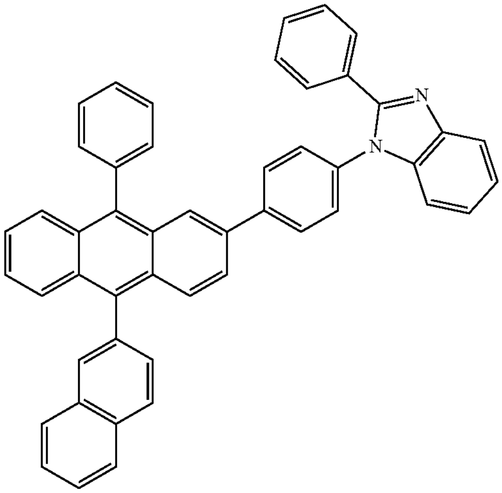

-continued
ET14
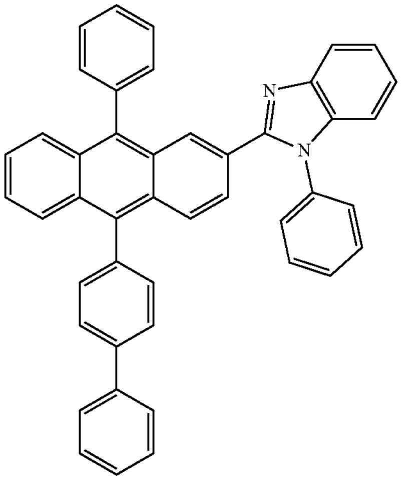
ET15
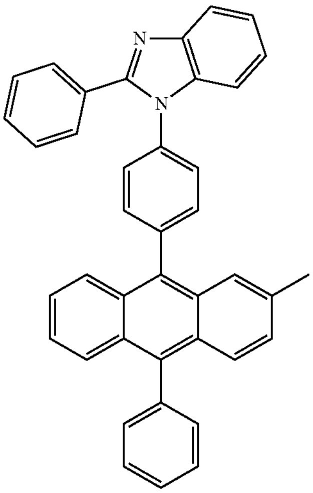
ET16
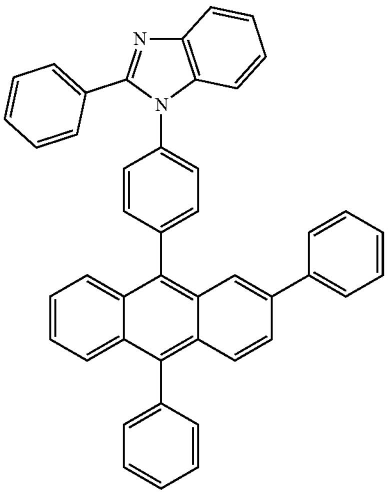
-continued
ET17
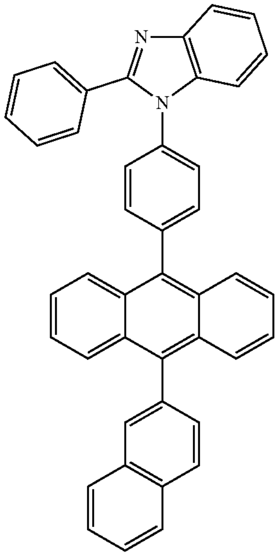
ET18
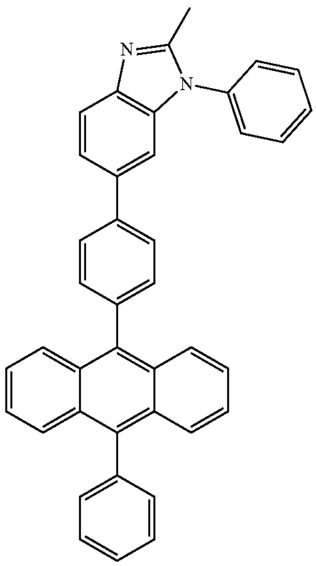
ET19
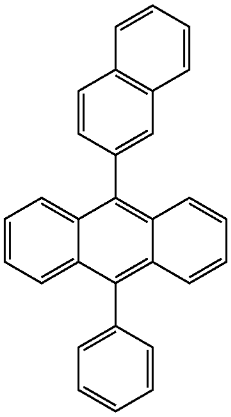

ET20
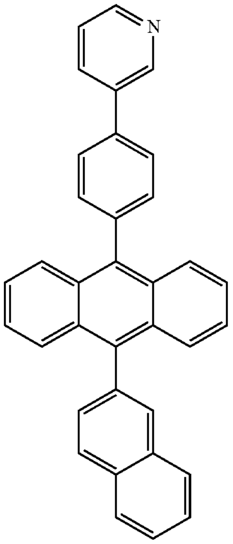
ET21
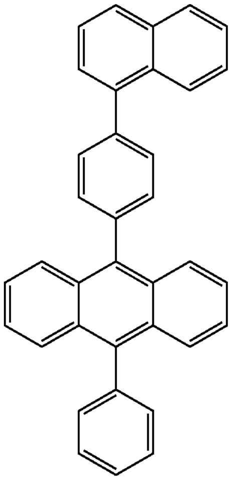
ET22
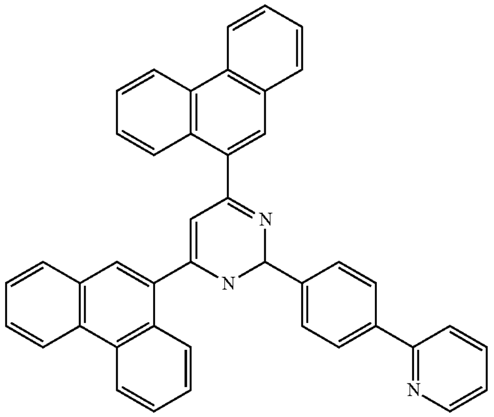
ET23
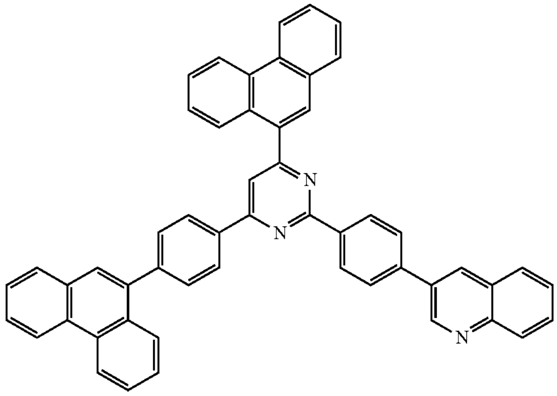
ET24
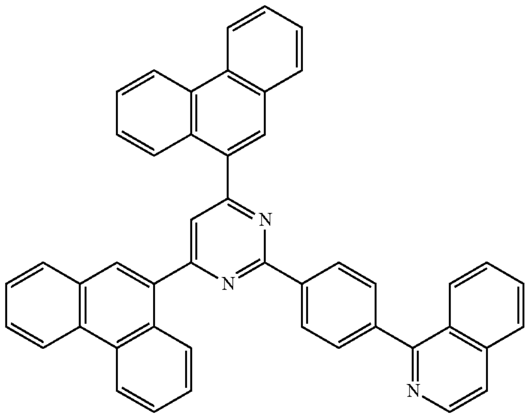
ET25
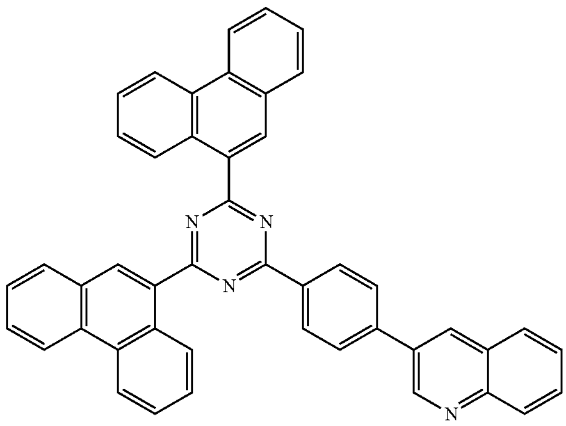

ET26
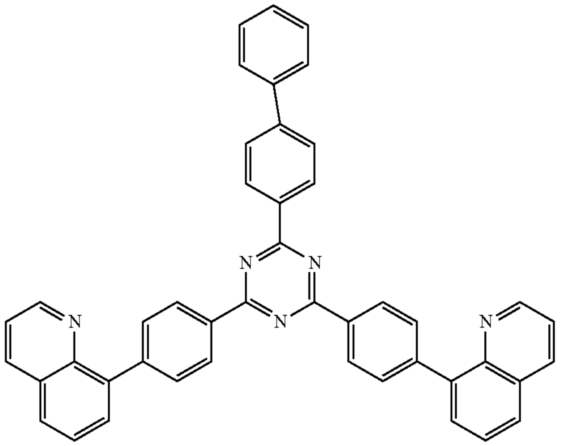
ET27
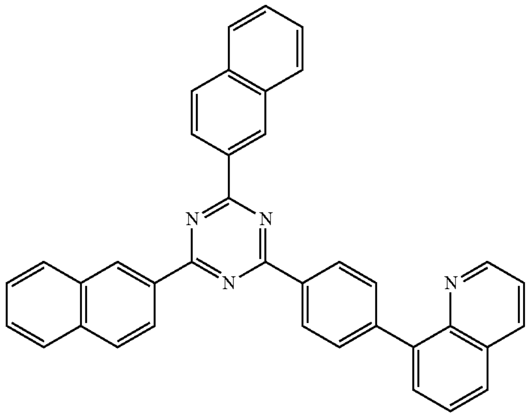
ET28
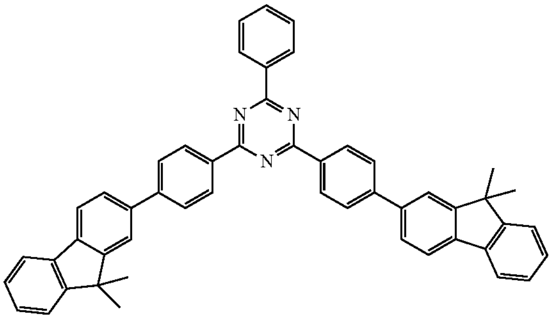
ET29
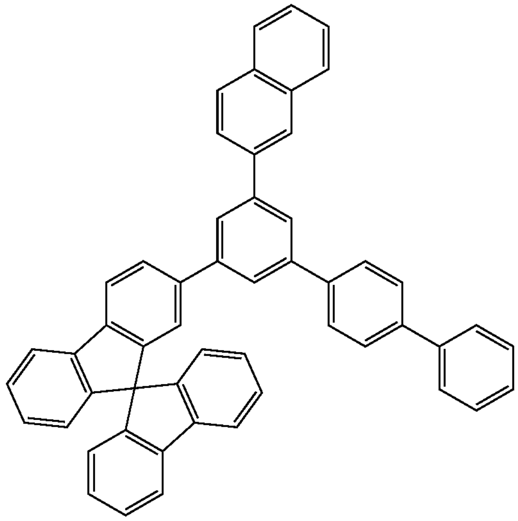
ET30
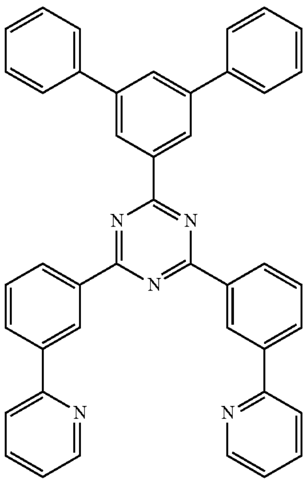
ET31
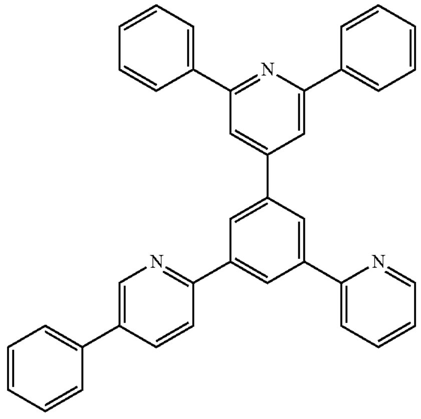

-continued

ET32

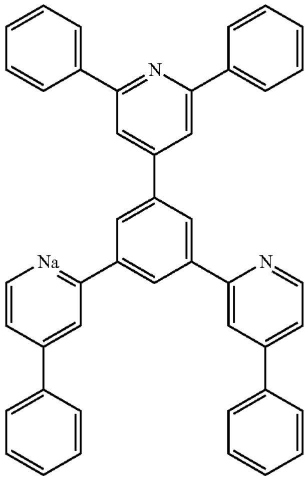

ET33

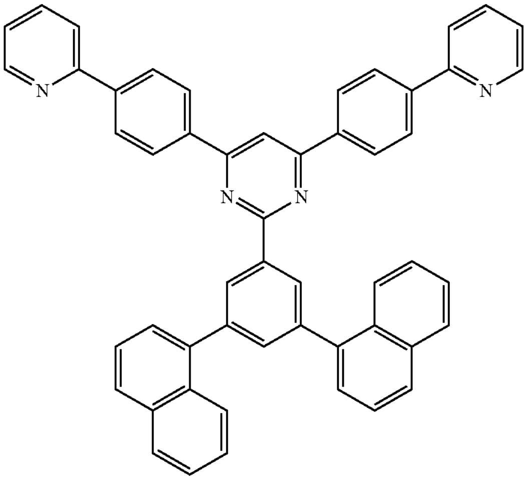

ET34

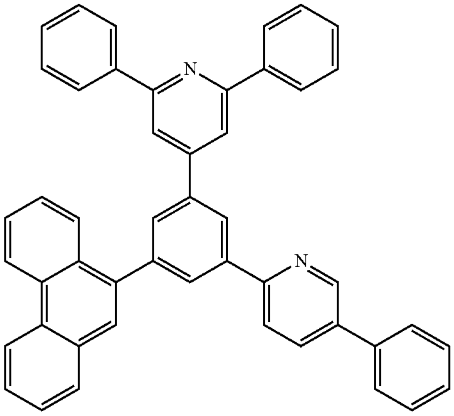

-continued

ET35

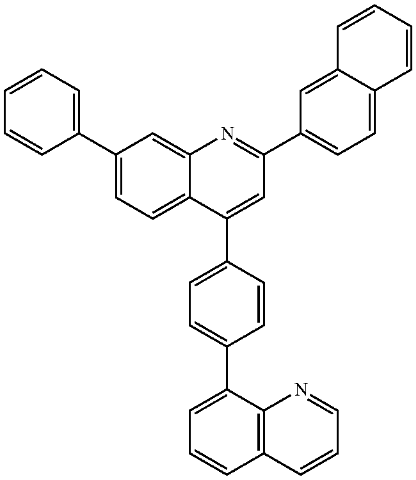

ET36

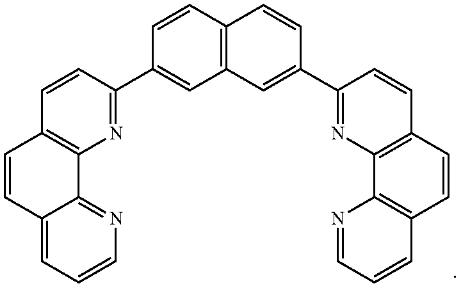

.

In addition, the electron transport regions ETR may include a metal halide such as LiF, NaCl, CsF, RbCl, RbI, CuI, and/or KI, a lanthanide metal such as Yb, and/or a co-deposited material of the metal halide and the lanthanide metal. For example, the electron transport region ETR may include KI:Yb, RbI:Yb, LiF:Yb, etc. as a co-deposited material. In some embodiments, the electron transport region ETR may be formed using a metal oxide such as $Li_2O$ and/or BaO, and/or 8-hydroxyl-lithium quinolate (Liq), etc., but embodiments of the present disclosure are not limited thereto. The electron transport region ETR may also be formed of a mixture material of an electron transport material and an insulating organometallic salt. The organometallic salt may be a material having an energy band gap of about 4 eV or more. In some embodiments, the organometallic salt may include, for example, a metal acetate, a metal benzoate, a metal acetoacetate, a metal acetylacetonate, and/or a metal stearate.

The electron transport region ETR may further include at least one of 2,9-dimethyl-4,7-diphenyl-1,10-phenanthroline (BCP), diphenyl(4-(triphenylsilyl)phenyl)phosphine oxide (TSPO1), or 4,7-diphenyl-1,10-phenanthroline (Bphen) in addition to the above-described materials, but embodiments of the present disclosure are not limited thereto.

The electron transport region ETR may include the above-described compounds of the hole transport region in at least one of the electron injection layer EIL, the electron transport layer ETL, or the hole blocking layer HBL.

When the electron transport region ETR includes the electron transport layer ETL, the electron transport layer ETL may have a thickness of about 100 Å to about 1,000 Å, for example, about 150 Å to about 500 Å. If the thickness of the electron transport layer ETL satisfies the aforementioned range, suitable or satisfactory electron transport characteristics may be obtained without a substantial increase in driving voltage. When the electron transport region ETR includes the electron injection layer EIL, the electron injection layer EIL may have a thickness of about 1 Å to about 100 Å, for example, about 3 Å to about 90 Å. If the thickness of the electron injection layer EIL satisfies the above-described range, suitable or satisfactory electron injection characteristics may be obtained without a substantial increase in driving voltage.

The second electrode EL2 is provided on the electron transport region ETR. The second electrode EL2 may be a common electrode. The second electrode EL2 may be a cathode or an anode, but embodiments of the present disclosure are not limited thereto. For example, when the first electrode EL1 is an anode, the second electrode EL2 may be a cathode, and when the first electrode EL1 is a cathode, the second electrode EL2 may be an anode. The second electrode may include at least one selected from among Ag, Mg, Cu, Al, Pt, Pd, Au, Ni, Nd, Ir, Cr, Li, Ca, LiF, Mo, Ti, W, In, Sn, Zn, a compound of two or more thereof, a mixture of two or more thereof, or an oxide thereof.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, or a compound or mixture thereof (e.g., AgMg, AgYb, or MgAg). In some embodiments, the second electrode EL2 may have a multilayer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, and/or the like.

In some embodiments, the second electrode EL2 may be connected with an auxiliary electrode. If the second electrode EL2 is connected with the auxiliary electrode, the resistance of the second electrode EL2 may decrease.

In some embodiments, a capping layer CPL may further be on the second electrode EL2 of the light emitting device ED of an embodiment. The capping layer CPL may include a multilayer or a single layer.

In an embodiment, the capping layer CPL may be an organic layer and/or an inorganic layer. For example, when the capping layer CPL contains an inorganic material, the inorganic material may include an alkaline metal compound (for example, LiF), an alkaline earth metal compound (for example, $MgF_2$), SiON, $SiN_x$, SiOy, etc.

For example, when the capping layer CPL contains an organic material, the organic material may include α-NPD, NPB, TPD, m-MTDATA, $Alq_3$, CuPc, N4,N4,N4',N4'-tetra (biphenyl-4-yl)biphenyl-4,4'-diamine (TPD15), 4,4',4"-tris (carbazol sol-9-yl)triphenylamine (TCTA), etc., and/or may include an epoxy resin, and/or an acrylate such as a methacrylate. However, embodiments of the present disclosure are not limited thereto, and the capping layer CPL may include at least one selected from among Compounds P1 to P5 below:

P1

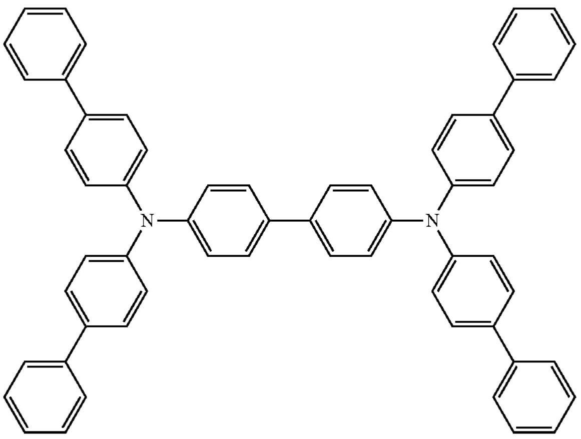

P2

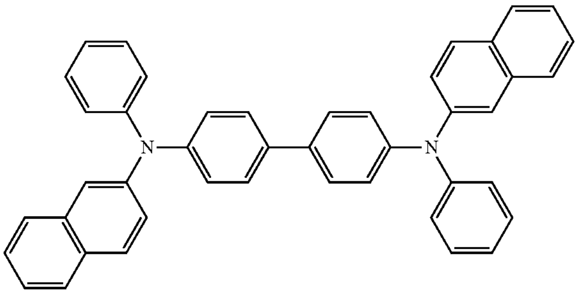

P3

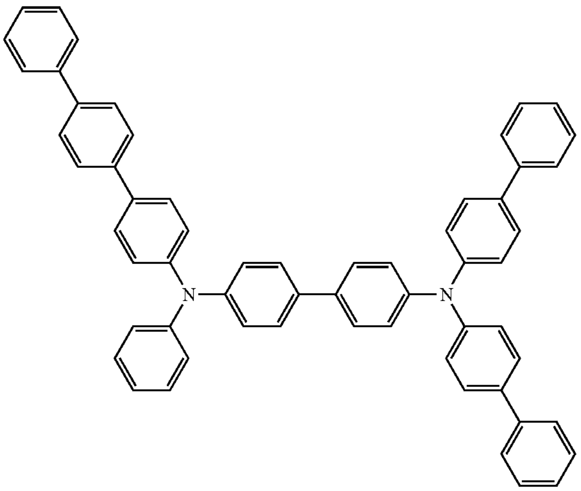

P4

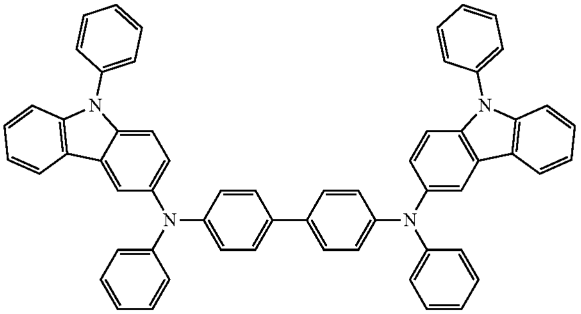

-continued

P5

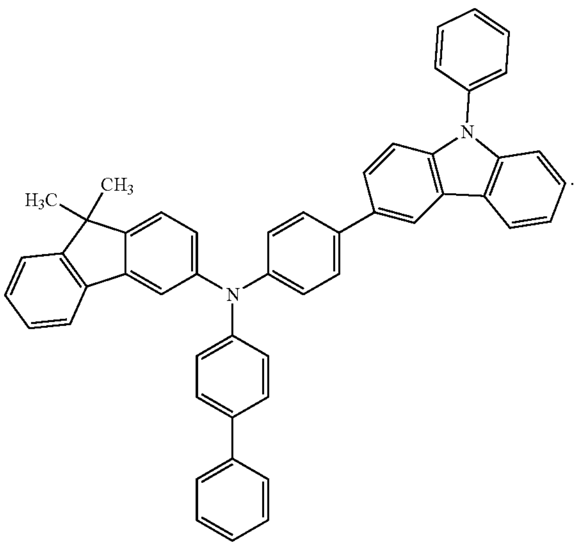

In some embodiments, the refractive index of the capping layer CPL may be about 1.6 or more. For example, the refractive index of the capping layer CPL may be about 1.6 or more with respect to light in a wavelength range of about 550 nm to about 660 nm.

Each of FIGS. 7 to 10 is a cross-sectional view of a display apparatus according to an embodiment of the present disclosure. Hereinafter, in describing the display apparatuses of embodiments with reference to FIGS. 7 to 10, duplicative features which have been described in FIGS. 1 to 6 will not be described again here, but their differences will be mainly described.

Referring to FIG. 7, the display apparatus DD-a according to an embodiment may include a display panel DP including a display device layer DP-ED, a light control layer CCL on the display panel DP, and a color filter layer CFL.

In an embodiment illustrated in FIG. 7, the display panel DP may include a base layer BS, a circuit layer DP-CL provided on the base layer BS, and the display device layer DP-ED, and the display device layer DP-ED may include a light emitting device ED.

The light emitting device ED may include a first electrode EL1, a hole transport region HTR on the first electrode EL1, an emission layer EML on the hole transport region HTR, an electron transport region ETR on the emission layer EML, and a second electrode EL2 on the electron transport region ETR. The structures of the light emitting devices of FIGS. 3 to 6 as described above may be equally applied to the structure of the light emitting device ED illustrated in FIG. 7.

The emission layer EML of the light emitting device ED included in the display apparatus DD-a of an embodiment may include the above-described fused polycyclic compound of an embodiment.

Referring to FIG. 7, the emission layer EML may be in an opening OH defined in a pixel defining film PDL. For example, the emission layer EML which is divided by the pixel defining film PDL and provided corresponding to each light emitting regions PXA-R, PXA-G, and PXA-B may emit light in the same wavelength range. In the display apparatus DD of an embodiment, the emission layer EML may emit blue light. In some embodiments, the emission layer EML may be provided as a common layer in the entire light emitting regions PXA-R, PXA-G, and PXA-B.

The light control layer CCL may be on the display panel DP. The light control layer CCL may include a light conversion body. The light conversion body may be a quantum dot, a phosphor, and/or the like. The light conversion body may emit light by converting a wavelength of light provided to the light conversion body. In some embodiments, the light control layer CCL may include a layer containing the quantum dot and/or a layer containing the phosphor.

The light control layer CCL may include a plurality of light control parts CCP1, CCP2 and CCP3. The light control parts CCP1, CCP2, and CCP3 may be spaced apart from each other.

Referring to FIG. 7, divided patterns BMP may be between the light control parts CCP1, CCP2 and CCP3 which are spaced apart from each other, but embodiments of the present disclosure are not limited thereto. FIG. 7 illustrates that the divided patterns BMP do not overlap (or do not completely overlap) the light control parts CCP1, CCP2 and CCP3, but at least a portion of the edges of the light control parts CCP1, CCP2 and CCP3 may overlap the divided patterns BMP.

The light control layer CCL may include a first light control part CCP1 containing a first quantum dot QD1 which converts a first color light provided from the light emitting device ED into a second color light, a second light control part CCP2 containing a second quantum dot QD2 which converts the first color light into a third color light, and a third light control part CCP3 which transmits the first color light.

In an embodiment, the first light control part CCP1 may provide red light that is the second color light, and the second light control part CCP2 may provide green light that is the third color light. The third light control part CCP3 may provide blue light by transmitting the blue light that is the first color light provided from the light emitting device ED. For example, the first quantum dot QD1 may be a red quantum dot, and the second quantum dot QD2 may be a green quantum dot. The same as described above may be applied with respect to the quantum dots QD1 and QD2.

In addition, the light control layer CCL may further include a scatterer SP (e.g., a light scatterer SP). The first light control part CCP1 may include the first quantum dot QD1 and the scatterer SP, the second light control part CCP2 may include the second quantum dot QD2 and the scatterer SP, and the third light control part CCP3 may not include any quantum dot but may include the scatterer SP.

The scatterer SP may be inorganic particles. For example, the scatterer SP may include at least one of $TiO_2$, ZnO, $Al_2O_3$, $SiO_2$, or hollow silica. The scatterer SP may include any one selected from among $TiO_2$, ZnO, $Al_2O_3$, $SiO_2$, and hollow silica, or may be a mixture of at least two materials selected from among $TiO_2$, ZnO, $Al_2O_3$, $SiO_2$, and hollow silica.

The first light control part CCP1, the second light control part CCP2, and the third light control part CCP3 each may include base resins BR1, BR2, and BR3 in which the quantum dots QD1 and QD2 and the scatterer SP are dispersed. In an embodiment, the first light control part CCP1 may include the first quantum dot QD1 and the scatterer SP dispersed in a first base resin BR1, the second light control part CCP2 may include the second quantum dot QD2 and the scatterer SP dispersed in a second base resin BR2, and the third light control part CCP3 may include the scatterer SP dispersed in a third base resin BR3. The base resins BR1, BR2, and BR3 are media in which the quantum dots QD1 and QD2 and the scatterer SP are dispersed, and may be formed of various suitable resin compositions, which may be generally referred to as a binder. For example, the base resins BR1, BR2, and BR3 may be acrylic-based resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 may be the same as or different from each other.

The light control layer CCL may include a barrier layer BFL1. The barrier layer BFL1 may serve to prevent or reduce penetration of moisture and/or oxygen (hereinafter, referred to as 'moisture/oxygen'). The barrier layer BFL1 may be on the light control parts CCP1, CCP2, and CCP3 to block or reduce exposure of the light control parts CCP1, CCP2 and CCP3 to moisture/oxygen. In some embodiments, the barrier layer BFL1 may cover the light control parts CCP1, CCP2, and CCP3. In addition, the barrier layer BFL2 may be provided between the light control parts CCP1, CCP2, and CCP3 and the color filter layer CFL.

The barrier layers BFL1 and BFL2 may include at least one inorganic layer. In some embodiments, the barrier layers BFL1 and BFL2 may include an inorganic material. For example, the barrier layers BFL1 and BFL2 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. In some embodiments, the barrier layers BFL1 and BFL2 may further include an organic film. The barrier layers BFL1 and BFL2 may be formed of a single layer or a plurality of layers.

In the display apparatus DD of an embodiment, the color filter layer CFL may be on the light control layer CCL. For example, the color filter layer CFL may be directly on the light control layer CCL. In this case, the barrier layer BFL2 may be omitted.

The color filter layer CFL may include color filters CF1, CF2, and CF3. The color filter layer CFL may include a first filter CF1 configured to transmit the second color light, a second filter CF2 configured to transmit the third color light, and a third filter CF3 configured to transmit the first color light. For example, the first filter CF1 may be a red filter, the second filter CF2 may be a green filter, and the third filter CF3 may be a blue filter. The filters CF1, CF2, and CF3 each may include a polymeric photosensitive resin and a pigment and/or dye. The first filter CF1 may include a red pigment or dye, the second filter CF2 may include a green pigment or dye, and the third filter CF3 may include a blue pigment and/or dye. Embodiments of the present disclosure are not limited thereto, however, and the third filter CF3 may not include a pigment and/or dye. The third filter CF3 may include a polymeric photosensitive resin and may not include a pigment and/or dye. The third filter CF3 may be transparent. The third filter CF3 may be formed of a transparent photosensitive resin.

Furthermore, in an embodiment, the first filter CF1 and the second filter CF2 may be a yellow filter. The first filter CF1 and the second filter CF2 may not be separated but be provided as one filter. The first to third filters CF1, CF2, and CF3 may correspond to the red light emitting region PXA-R, the green light emitting region PXA-G, and the blue light emitting region PXA-B, respectively.

In some embodiments, the color filter layer CFL may include a light shielding part. The color filter layer CFL may include a light shielding part overlapping at the boundaries of neighboring filters CF1, CF2, and CF3. The light shielding part may be a black matrix. The light shielding part may include an organic light shielding material and/or an inorganic light shielding material containing a black pigment and/or dye. The light shielding part may separate boundaries between the adjacent filters CF1, CF2, and CF3. In addition, in an embodiment, the light shielding part may be formed of a blue filter.

A base substrate BL may be on the color filter layer CFL. The base substrate BL may be a member which provides a base surface in which the color filter layer CFL, the light control layer CCL, and the like are located. The base substrate BL may be a glass substrate, a metal substrate, a plastic substrate, etc. However, embodiments of the present disclosure are not limited thereto, and the base substrate BL may be an inorganic layer, an organic layer, or a composite material layer. In addition, unlike the configuration illustrated, in an embodiment, the base substrate BL may be omitted.

FIG. 8 is a cross-sectional view illustrating a portion of a display apparatus according to an embodiment of the present disclosure. In the display apparatus DD-TD of an embodiment, the light emitting device ED-BT may include a plurality of light emitting structures OL-B1, OL-B2, and OL-B3. The light emitting device ED-BT may include a first electrode EL1 and a second electrode EL2 which face each other, and the plurality of light emitting structures OL-B1, OL-B2, and OL-B3 sequentially stacked in the thickness direction between the first electrode EL1 and the second electrode EL2. The light emitting structures OL-B1, OL-B2, and OL-B3 each may include an emission layer EML (FIG. 7) and a hole transport region HTR and an electron transport region ETR having the emission layer EML (FIG. 7) therebetween.

In some embodiments, the light emitting device ED-BT included in the display apparatus DD-TD of an embodiment may be a light emitting device having a tandem structure and including a plurality of emission layers.

In an embodiment illustrated in FIG. 8, all light beams respectively emitted from the light emitting structures OL-B1, OL-B2, and OL-B3 may be blue light. However, embodiments of the present disclosure are not limited thereto, and the light beams respectively emitted from the light emitting structures OL-B1, OL-B2, and OL-B3 may have wavelength ranges different from each other. For example, the light emitting device ED-BT including the plurality of light emitting structures OL-B1, OL-B2, and OL-B3 which emit light beams having wavelength ranges different from each other may emit white light.

A charge generation layers CGL1 and CGL2 may be between two of the neighboring light emitting structures OL-B1, OL-B2, and OL-B3. The charge generation layers CGL1 and CGL2 may include a p-type charge generation layer and/or an n-type charge generation layer.

At least one selected from among the light emitting structures OL-B1, OL-B2, and OL-B3 included in the display apparatus DD-TD of an embodiment may contain the above-described fused polycyclic compound of an embodiment.

Referring to FIG. 9, the display apparatus DD-b according to an embodiment may include light emitting devices ED-1, ED-2, and ED-3 in which two emission layers are stacked. Compared to the display apparatus DD of an embodiment illustrated in FIG. 2, an embodiment illustrated in FIG. 9 has a difference in that the first to third light emitting devices ED-1, ED-2, and ED-3 each include two emission layers stacked in the thickness direction. In each of the first to third light emitting devices ED-1, ED-2, and ED-3, the two emission layers may emit light in the same wavelength region.

The first light emitting device ED-1 may include a first red emission layer EML-R1 and a second red emission layer EML-R2. The second light emitting device ED-2 may include a first green emission layer EML-G1 and a second green emission layer EML-G2. In addition, the third light emitting device ED-3 may include a first blue emission layer EML-B1 and a second blue emission layer EML-B2. An emission auxiliary part OG may be between the first red emission layer EML-R1 and the second red emission layer EML-R2, between the first green emission layer EML-G1 and the second green emission layer EML-G2, and between the first blue emission layer EML-B1 and the second blue emission layer EML-B2.

The emission auxiliary part OG may include a single layer or a multilayer. The emission auxiliary part OG may include a charge generation layer. In some embodiments, the emission auxiliary part OG may include an electron transport region, a charge generation layer, and a hole transport region that are sequentially stacked. The emission auxiliary part OG may be provided as a common layer in the whole of the first to third light emitting devices ED-1, ED-2, and ED-3. However, embodiments of the present disclosure are not limited thereto, and the emission auxiliary part OG may be provided by being patterned within the openings OH defined in the pixel defining film PDL.

The first red emission layer EML-R1, the first green emission layer EML-G1, and the first blue emission layer EML-B1 may be between the hole transport region HTR and the emission auxiliary part OG. The second red emission layer EML-R2, the second green emission layer EML-G2, and the second blue emission layer EML-B2 may be between the emission auxiliary part OG and the electron transport region ETR.

In some embodiments, the first light emitting device ED-1 may include the first electrode EL1, the hole transport region HTR, the second red emission layer EML-R2, the emission auxiliary part OG, the first red emission layer EML-R1, the electron transport region ETR, and the second electrode EL2 that are sequentially stacked. The second light emitting device ED-2 may include the first electrode EL1, the hole transport region HTR, the second green emission layer EML-G2, the emission auxiliary part OG, the first green emission layer EML-G1, the electron transport region ETR, and the second electrode EL2 that are sequentially stacked. The third light emitting device ED-3 may include the first electrode EL1, the hole transport region HTR, the second blue emission layer EML-B2, the emission auxiliary part OG, the first blue emission layer EML-B1, the electron transport region ETR, and the second electrode EL2 that are sequentially stacked.

In some embodiments, an optical auxiliary layer PL may be on the display device layer DP-ED. The optical auxiliary layer PL may include a polarizing layer. The optical auxiliary layer PL may be on the display panel DP and control reflected light in the display panel DP due to external light. In some embodiments, the optical auxiliary layer PL in the display apparatus according to an embodiment may be omitted.

Unlike FIGS. 8 and 9, FIG. 10 illustrates that a display apparatus DD-c includes four light emitting structures OL-B1, OL-B2, OL-B3, and OL-C1. A light emitting device ED-CT may include a first electrode EL1 and a second electrode EL2 which face each other, and first to fourth light emitting structures OL-B1, OL-B2, OL-B3, and OL-C1 that are sequentially stacked in the thickness direction between the first electrode EL1 and the second electrode EL2. Charge generation layers CGL1, CGL2, and CGL3 may be between the first to fourth light emitting structures OL-B1, OL-B2, OL-B3, and OL-C1. Among the four light emitting structures, the first to third light emitting structures OL-B1, OL-B2, and OL-B3 may emit blue light, and the fourth light emitting structure OL-C1 may emit green light. However, embodiments of the present disclosure are not limited thereto, and the first to fourth light emitting structures OL-B1, OL-B2, OL-B3, and OL-C1 may emit light beams in different wavelength regions.

The charge generation layers CGL1, CGL2, and CGL3 between adjacent light emitting structures OL-B1, OL-B2, OL-B3, and OL-C1 may include a p-type charge generation layer and/or an n-type charge generation layer.

At least one selected from among the light emitting structures OL-B1, OL-B2, OL-B3, and OL-C1 included in the display apparatus DD-c of an embodiment may contain the above-described fused polycyclic compound of an embodiment.

Hereinafter, with reference to Examples and Comparative Examples, a condensed polycyclic according to an embodiment of the present disclosure and a luminescence device of an embodiment of the present disclosure will be described in more detail. In addition, Examples described below are only illustrations to assist the understanding of the subject matter of the present disclosure, and the scope of the present disclosure is not limited thereto.

EXAMPLES

1. Synthesis of Fused Polycyclic Compound

First, a synthetic method of the fused polycyclic compound according to the current embodiment will be described in more detail by illustrating synthetic methods of Compounds 1, 2, 3, 13, 34, 41, 42, 59, 81, 90, and 121. In addition, the synthetic methods of the fused polycyclic compounds explained below are only examples, and the synthetic method of the fused polycyclic compound according to embodiments of the present disclosure are not limited to the following examples.

(1) Synthesis of Compound 1

Fused Polycyclic Compound 1 according to an example may be synthesized, for example, by the reaction below.

Synthesis of Intermediate A

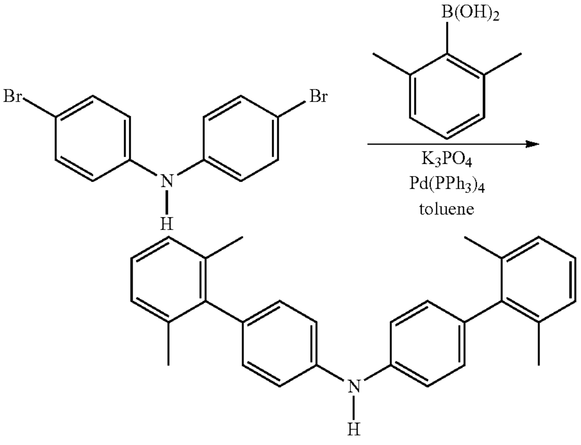

A

In an Ar atmosphere, bis(4-bromophenyl)amine (15.0 g, 45.9 mmol), 2,6-dimethylphenylboronic acid (15.1 g, 100 mmol), $Pd(PPh_3)_4$ (5.3 g, 4.59 mmol), and $K_3PO_4$ (19.5 g, 91.7 mmol) were added to 100 mL of toluene and reacted at about 80° C. for about 6 hours. After cooling and adding water, the resultant mixture was subjected to celite filtering and liquid separation to concentrate an organic layer. The concentrated organic layer was purified by silica gel column chromatography to obtain Intermediate A (13.9 g, yield 80%). The molecular weight of Intermediate A was about 377 as measured by fast atom bombardment mass spectrometry (FAB-MS measurement.

Synthesis of Intermediate B

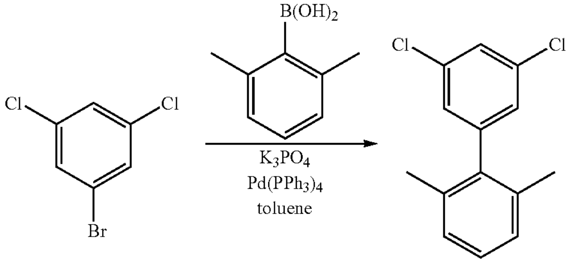

B

Intermediate B was synthesized in substantially the same manner as Intermediate A except that 1,3-dibromo-5-chlorobenzene (15.0 g, 66.4 mmol) was used instead of bis(4-bromophenyl)amine in the synthesis of Intermediate A to obtain Intermediate B (15.0 g, yield 90%). The molecular weight of Intermediate B was about 251 as measured by FAB-MS measurement.

Synthesis of Intermediate C

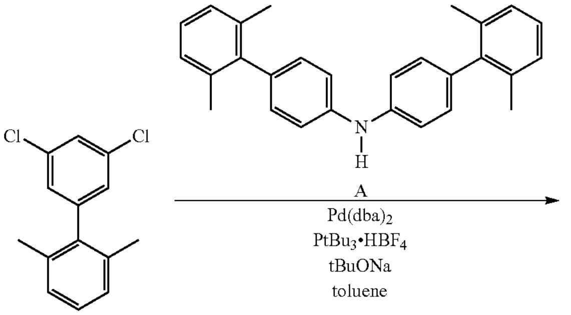

B

-continued

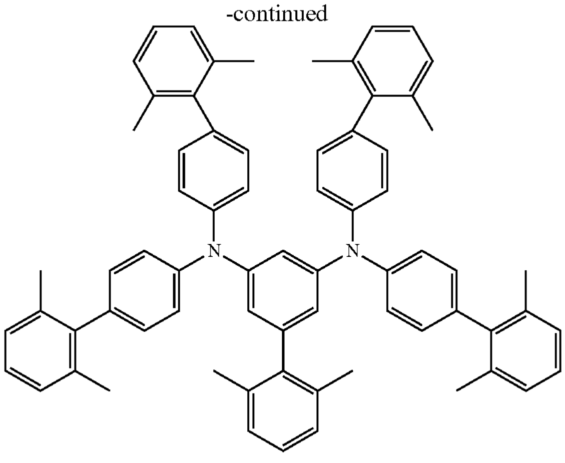

C

In an Ar atmosphere, Intermediate A (21.0 g, 55.7 mmol), Intermediate B (7.0 g, 27.9 mmol), $Pd(dba)_2$ (1.60 g, 2.79 mmol), $P(t-Bu)_3HBF_4$ (1.62 g, 5.57 mmol), and tBuONa (6.16 g, 64.1 mmol) were added to 300 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Intermediate C (22.9 g, yield 88%). The molecular weight of Intermediate C was about 933 as measured by FAB-MS measurement.

Synthesis of Compound 1

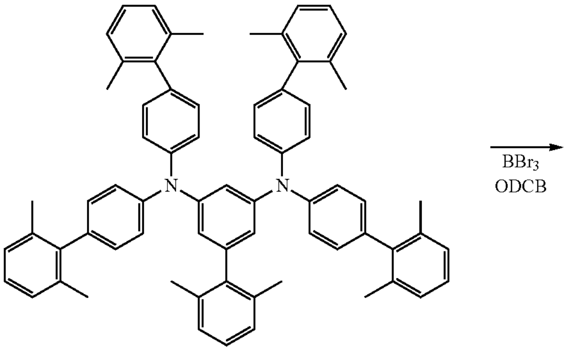

C

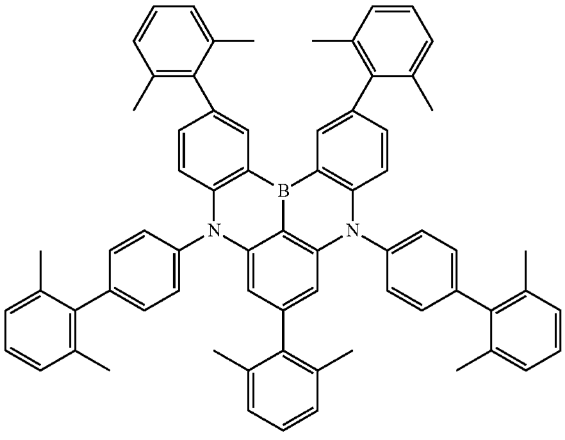

1

In an Ar atmosphere, Intermediate C (12.0 g, 12.9 mmol) was dissolved in 1,2-dichlorobenzene (ODCB, 200 ml), $BBr_3$ (8.0 g, 32.1 mmol) was added thereto, and heated and stirred at about 170° C. for about 10 hours. The resultant mixture was cooled to room temperature, N,N-diisopropylethylamine (19.9 g, 154 mmol) was added thereto and then water was added thereto, and the resultant mixture was subjected to celite filtering and liquid separation to concentrate an organic layer. The concentrated organic layer was purified by silica gel column chromatography to obtain Compound 1 (3.39 g, yield 28%). The molecular weight of Compound 1 was about 941 as measured by FAB-MS. Sublimation purification (380° C., $2.6\times10^{-3}$ Pa) was carried out and device evaluation was performed.

(2) Synthesis of Compound 2

Fused polycyclic compound 2 according to an example may be synthesized by, for example, the reaction below.

Synthesis of Intermediate D

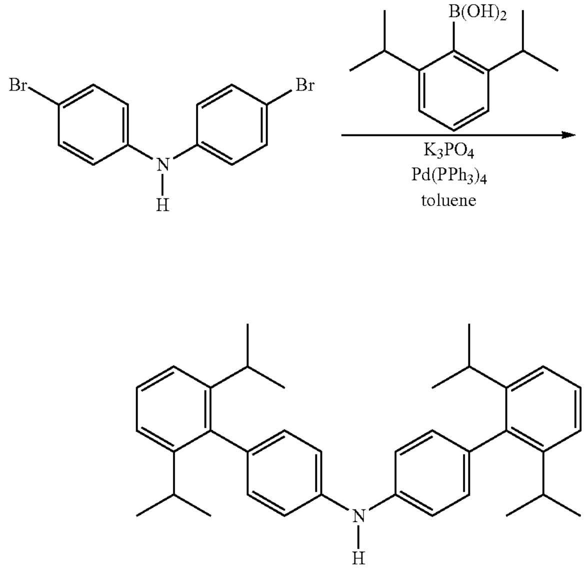

D

Intermediate D was synthesized in substantially the same manner as Intermediate A except that 2,6-diisopropylphenylboronic acid (20.8 g, 101 mmol) was used instead of 2,6-dimethylphenylboronic acid in the synthesis of Intermediate A to obtain Intermediate D (18.0 g, yield 80%). The molecular weight of Intermediate D was about 489 as measured by FAB-MS measurement.

Synthesis of Intermediate E

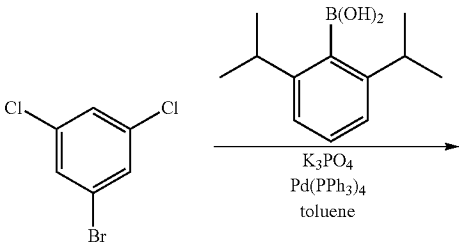

-continued

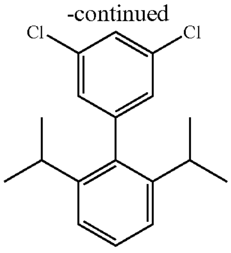

E

Intermediate E was synthesized in substantially the same manner as Intermediate D except for using 1-bromo-3,5-dichlorobenzene (20.0 g, 88.5 mmol) instead of bis(4-bromophenyl)amine in the synthesis of Intermediate D to obtain Intermediate E (27.2 g, yield 75%). The molecular weight of Intermediate E was about 307 as measured by FAB-MS measurement.

Synthesis of Intermediate F

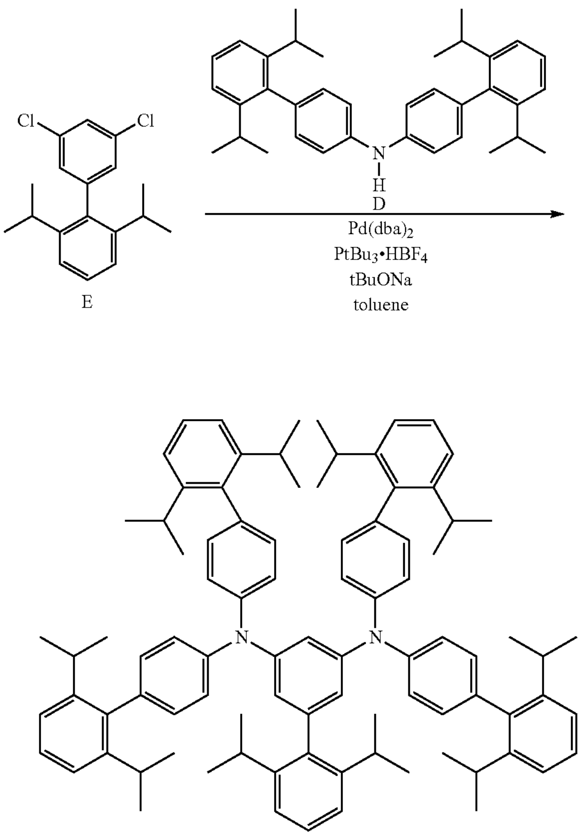

F

Intermediate F was synthesized in substantially the same manner as Intermediate C except for using Compound D (15.9 g, 32.6 mmol) instead of Intermediate A, and using Intermediate E (5.0 g, 16.3 mmol) instead of Intermediate B in the synthesis of Intermediate C to obtain Intermediate F (16.8 g, yield 85%). The molecular weight of Intermediate F was about 1213 as measured by FAB-MS measurement.

Synthesis of Compound 2

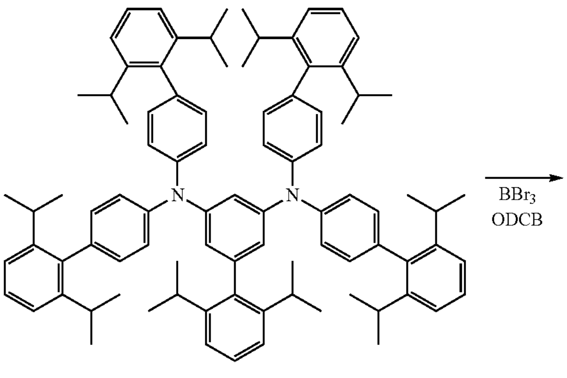

F

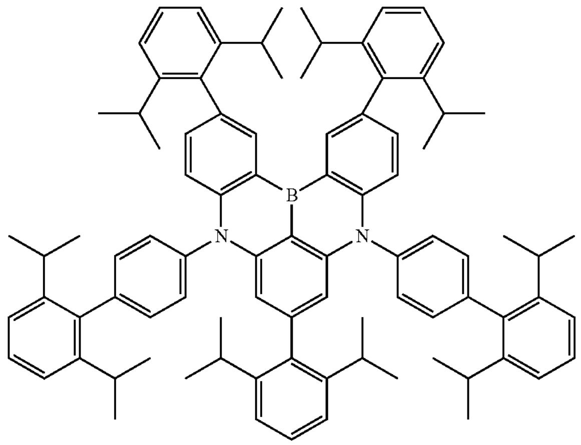

2

Compound 2 (3.22 g, yield 32%) was obtained in substantially the same manner as the synthesis of Compound 1 except that Intermediate F (10.0 g, 8.24 mmol) was used instead of Intermediate C in the synthesis of Compound 1. The molecular weight of Compound 2 was about 1221 as measured by FAB-MS. Sublimation purification (340° C., $2.8\times10^{-3}$ Pa) was carried out and device evaluation was performed.

(3) Synthesis of Compound 3

Fused Polycyclic Compound 3 according to an example may be synthesized, for example, by the reaction below.

Synthesis of Intermediate G

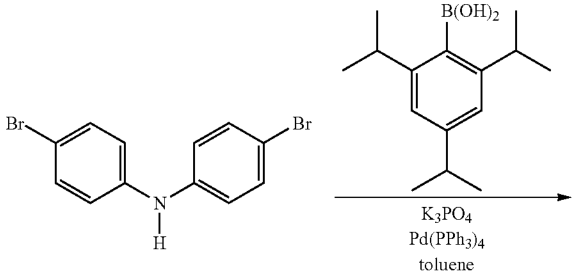

-continued

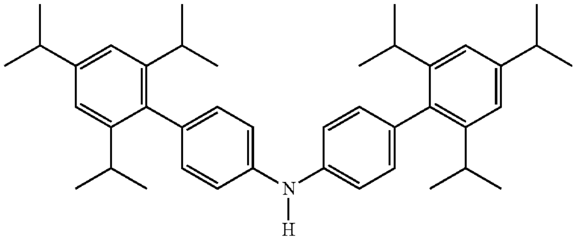

G

Intermediate G was synthesized in substantially the same manner as Intermediate A except that 2,4,6-triisopropylphenylboronic acid (16.7 g, 67.3 mmol) was used instead of 2,6-dimethylphenylboronic acid in the synthesis of Intermediate A to obtain Intermediate G (12.9 g, yield 74%). The molecular weight of Intermediate G was about 574 as measured by FAB-MS measurement.

Synthesis of Intermediate H

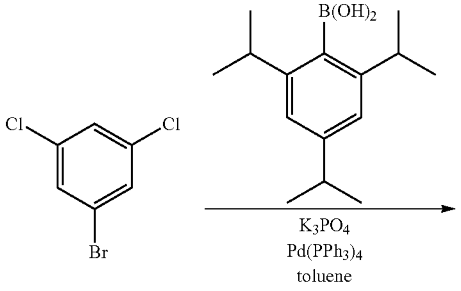

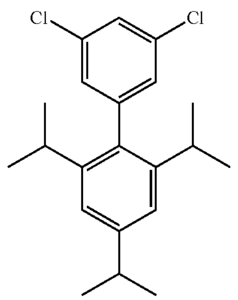

H

Intermediate H was synthesized in substantially the same manner as Intermediate G except that 1-bromo-3,5-dichlorobenzene (15.0 g, 66.4 mmol) was instead of bis(4-bromophenyl)amine in the synthesis of Intermediate G to obtain Intermediate H (16.2 g, yield 70%). The molecular weight of Intermediate H was about 349 as measured by FAB-MS measurement.

Synthesis of Intermediate I

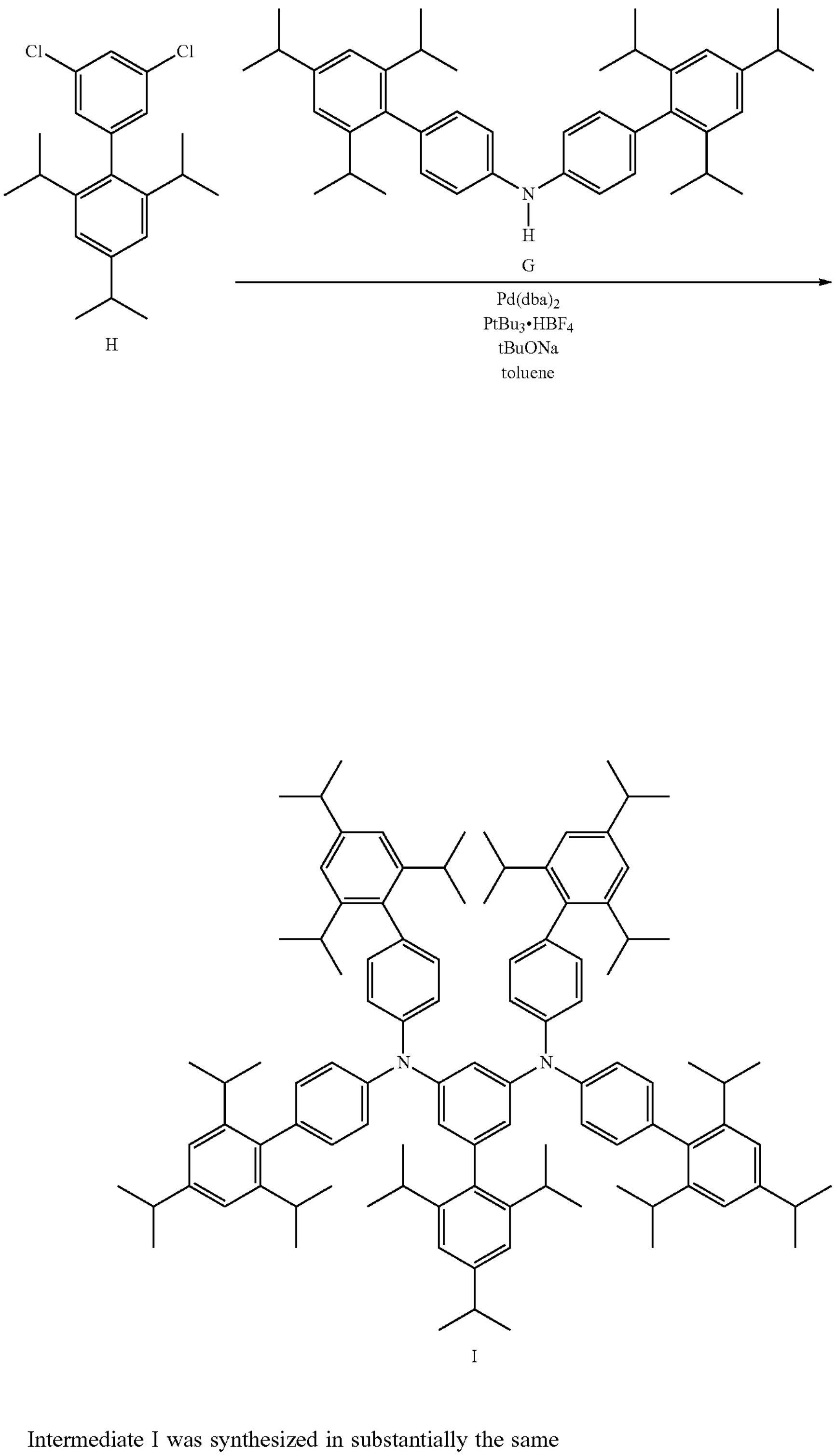

I

Intermediate I was synthesized in substantially the same manner as Intermediate C except that Intermediate G (16.4 g, 28.6 mmol) was used instead of Intermediate A, and Intermediate H (5.0 g, 14.3 mmol) was used instead of Intermediate B in the synthesis of Intermediate C to obtain Intermediate I (17.7 g, yield 87%). The molecular weight of Intermediate I was about 1424 as measured by FAB-MS measurement.

Synthesis of Compound 3

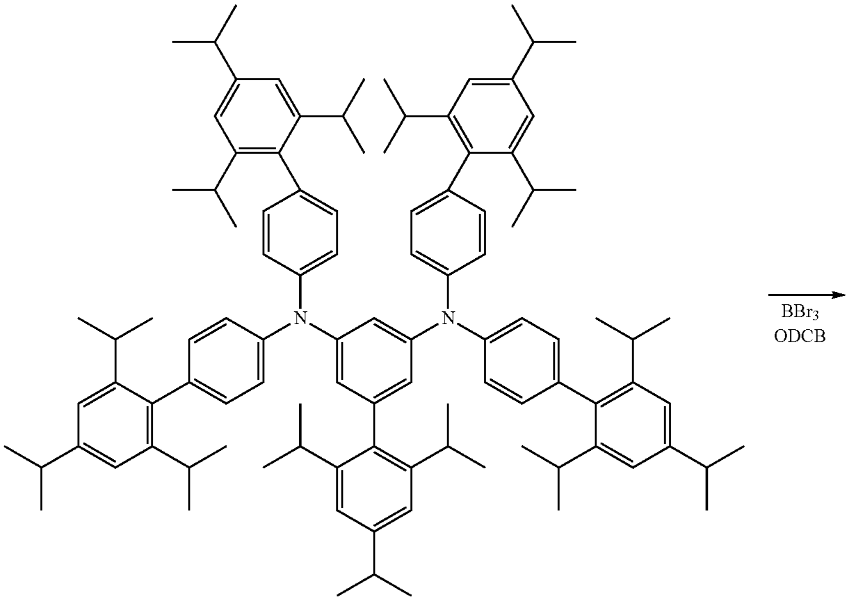

I

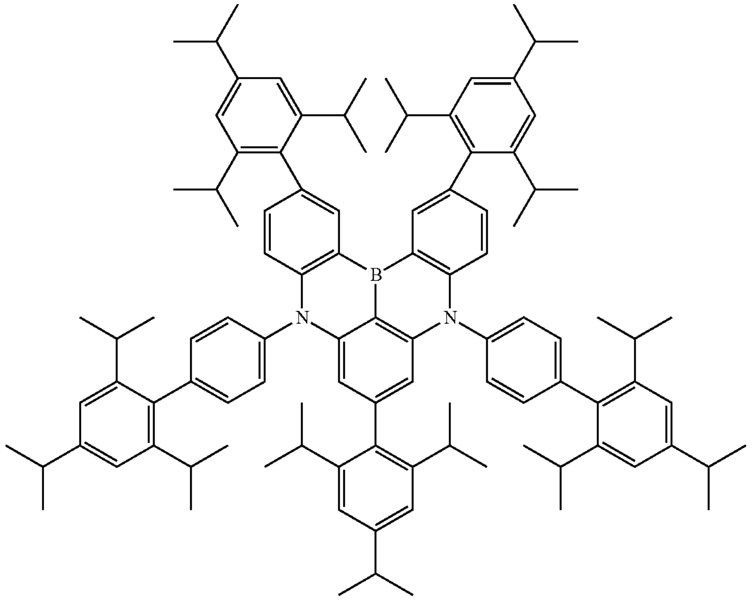

3

Compound 3 (3.52 g, yield 35%) was obtained in substantially the same manner as the synthesis of Compound 1 except that Intermediate I (10.0 g, 7.02 mmol) was used instead of Intermediate C in the synthesis of Compound 1. The molecular weight of Compound 3 was about 1432 as measured by FAB-MS measurement. Sublimation purification (320° C., $3.0\times10^{-3}$ Pa) was carried out and device evaluation was performed.

(4) Synthesis of Compound 13

Fused Polycyclic Compound 13 according to an example may be synthesized, for example, by the reaction below.

Synthesis of Intermediate J

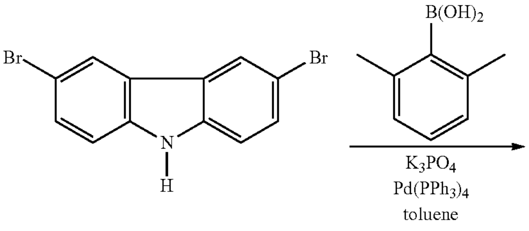

-continued

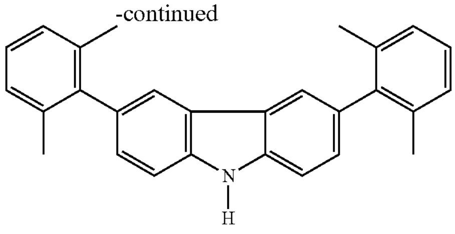

J

Intermediate J was synthesized in substantially the same manner as Intermediate A except that 3,6-dibromocarbazole (10.0 g, 30.8 mmol) was used instead of bis(4-bromophenyl) amine in the synthesis of Intermediate A to obtain Intermediate J (10.6 g, yield 92%). The molecular weight of Intermediate J was about 375 as measured by FAB-MS measurement.

Synthesis of Intermediate K

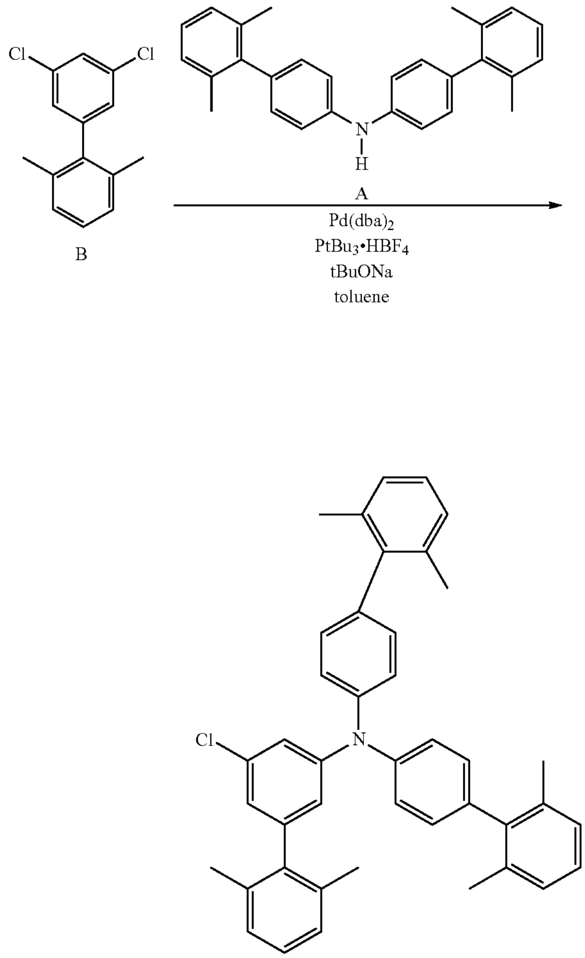

K

In an Ar atmosphere, Intermediate A (23.9 g, 63.7 mmol), Intermediate B (8.0 g, 31.9 mmol), Pd(dba)$_2$ (1.83 g, 63.7 mmol), P(t-Bu)$_3$HBF$_4$ (1.84 g, 6.37 mmol), and tBuONa (7.04 g, 73.3 mmol) were added to 200 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Intermediate K (13.2 g, yield 70%). The molecular weight of Intermediate K was about 592 as measured by FAB-MS measurement.

Synthesis of Intermediate L

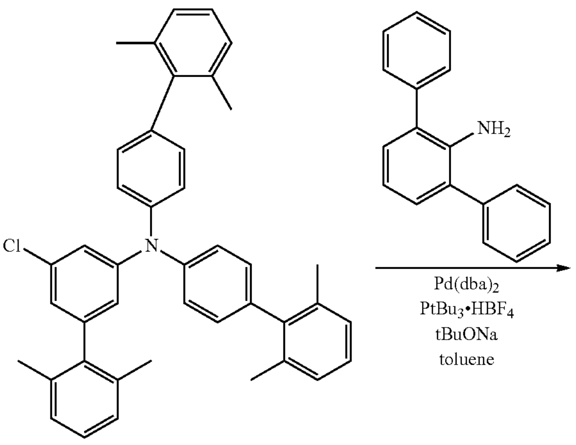

K

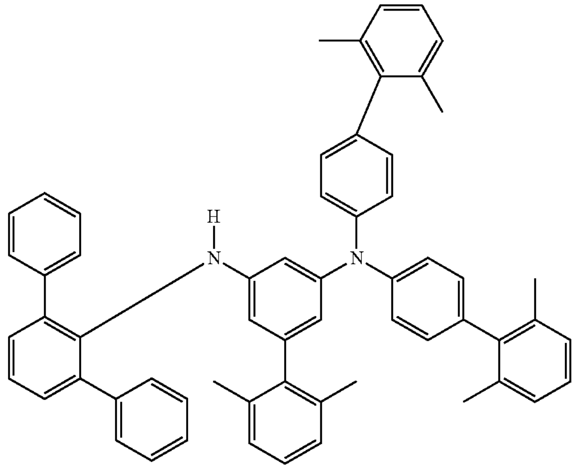

L

In an Ar atmosphere, Intermediate K (12.0 g, 20.6 mmol), 2.6-diphenylaniline (6.46 g, 26.3 mmol), Pd(dba)$_2$ (1.17 g, 2.03 mmol), P(t-Bu)$_3$HBF$_4$ (1.18 g, 4.05 mmol), and tBuONa (4.48 g, 46.6 mmol) were added to 100 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Intermediate L (14.6 g, yield 90%). The molecular weight of Intermediate L was about 801 as measured by FAB-MS measurement.

Synthesis of Intermediate M

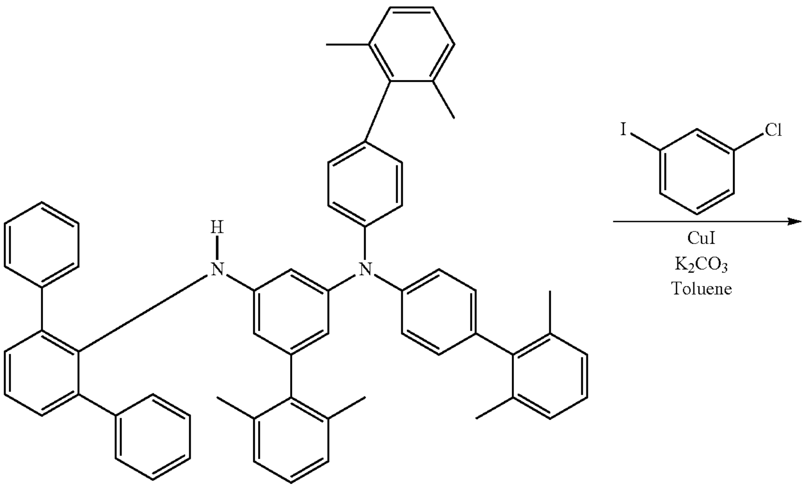

L

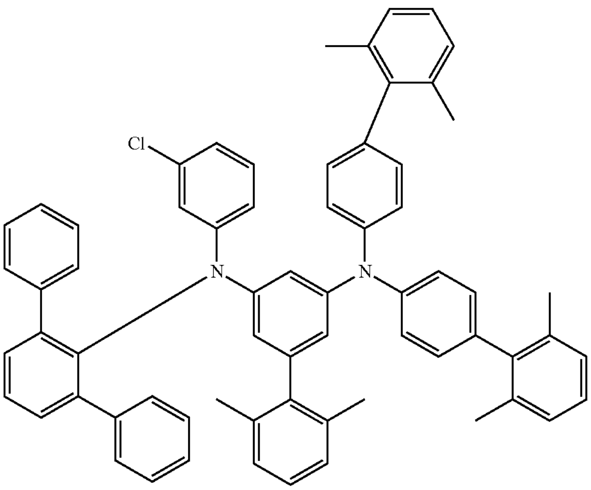

M

To Intermediate L (14.0 g, 17.5 mmol), 3-chloro-1-iodobenzene (62.5 g, 262 mmol), CuI (6.99 g, 36.7 mmol), and $K_2CO_3$ (19.3 g, 140 mmol), about 10 mL of toluene was added, and the resultant mixture was heated for about 24 hours while maintaining the outside temperature at about 215° C. The mixture was diluted with $CH_2Cl_2$, water was added thereto, and the resultant mixture was subjected to celite filtering and liquid separation to concentrate an organic layer. The concentrated organic layer was purified by silica gel column chromatography to obtain Intermediate M (11.2 g, yield 70%). The molecular weight of Intermediate M was about 911 as measured by FAB-MS measurement.

Synthesis of Intermediate N

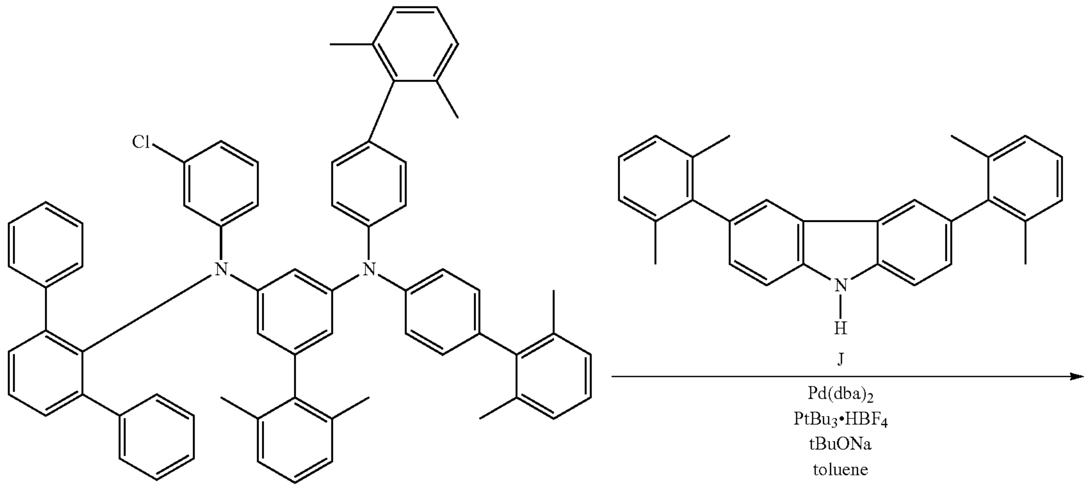

M

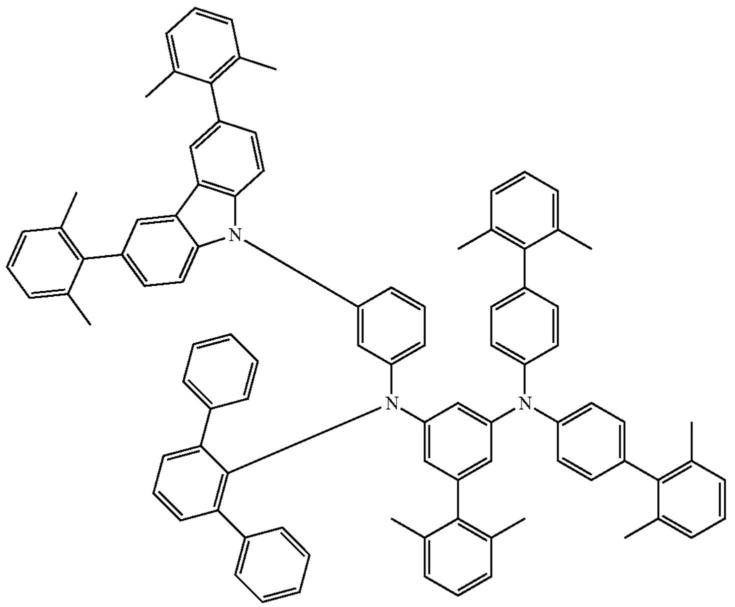

N

In an Ar atmosphere, Intermediate M (12.0 g, 13.2 mmol), Intermediate J (6.43 g, 17.1 mmol), $Pd(dba)_2$ (757 mg, 1.32 mmol), $P(t\text{-}Bu)_3HBF_4$ (764 mg, 2.63 mmol), and tBuONa (2.91 g, 30.3 mmol) were added to 100 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Intermediate N (12.3 g, yield 75%). The molecular weight of Intermediate N was about 1250 as measured by FAB-MS measurement.

Synthesis of Compound 13

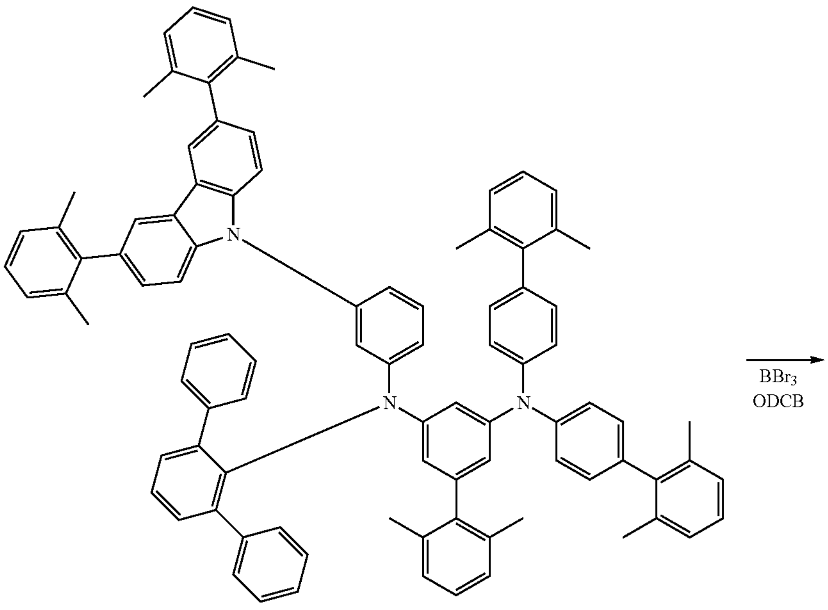

N

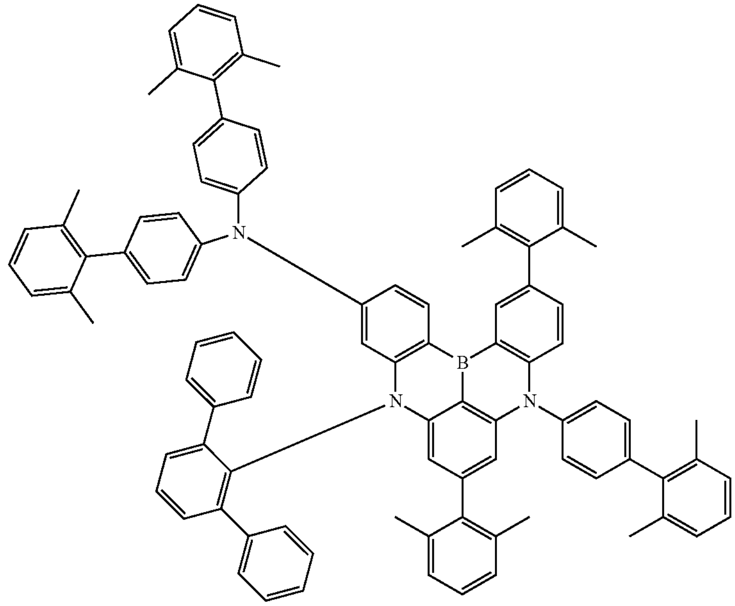

13

Compound 13 (4.13 g, yield 41%) was obtained in substantially the same manner as the synthesis of Compound 1 except that Intermediate N (10.0 g, 8.00 mmol) was used instead of Intermediate C in the synthesis of Compound 1. The molecular weight of Compound 13 was about 1258 as measured by FAB-MS. Sublimation purification (380° C., $2.5\times10^{-3}$ Pa) was carried out and device evaluation was performed.

(5) Synthesis of Compound 34

Fused polycyclic compound 34 according to an example may be synthesized by, for example, the reaction below.

Synthesis of Intermediate O

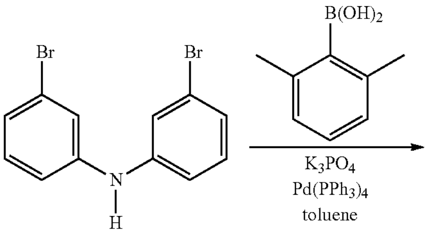

-continued

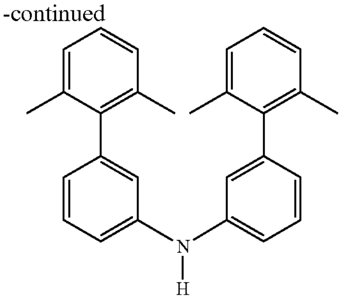

O

Intermediate O was synthesized in substantially the same manner as Intermediate A except that bis(3-bromophenyl) amine (10.0 g, 30.6 mmol) was used instead of bis(4-bromophenyl)amine in the synthesis of Intermediate A to obtain Intermediate O (9.47 g, yield 82%). The molecular weight of Intermediate O was about 377 as measured by FAB-MS measurement.

Synthesis of Intermediate P

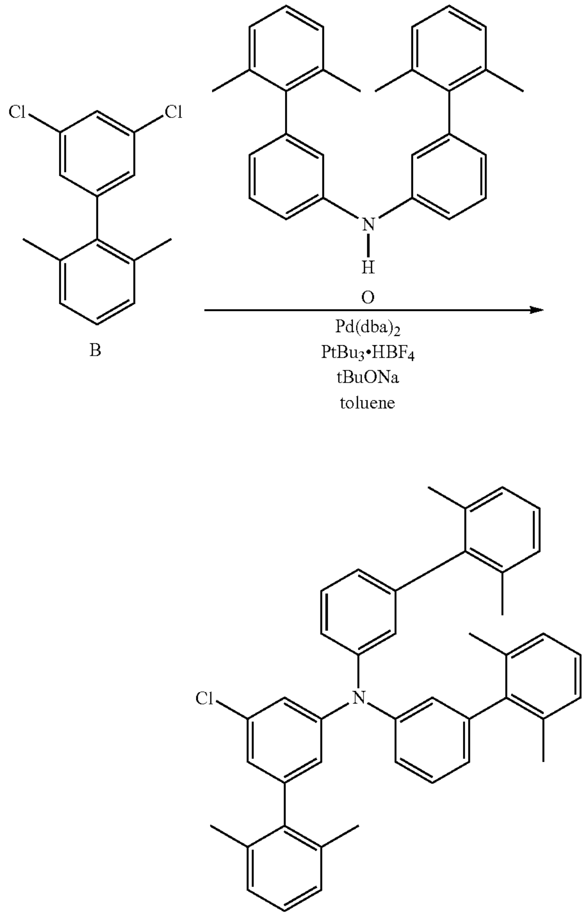

B O P

In an Ar atmosphere, Intermediate O (24.1 g, 63.1 mmol), Intermediate B (8.0 g, 31.9 mmol), Pd(dba)$_2$ (1.83 g, 63.7 mmol), P(t-Bu)$_3$HBF$_4$ (1.84 g, 6.37 mmol), and tBuONa (7.04 g, 73.3 mmol) were added to 200 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Intermediate P (14.1 g, yield 75%). The molecular weight of Intermediate P was about 592 as measured by FAB-MS measurement.

Synthesis of Intermediate Q

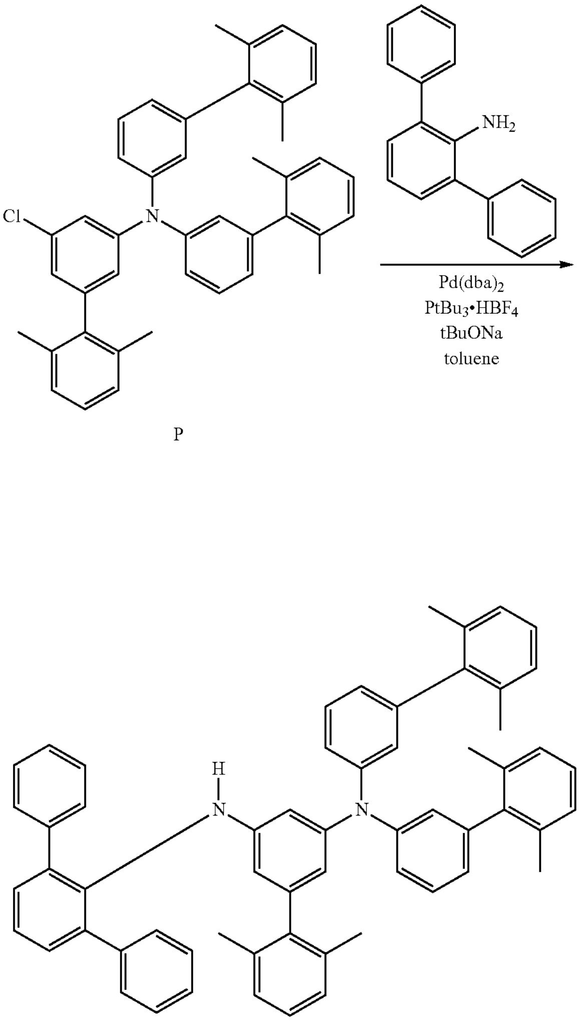

P

Q

In an Ar atmosphere, Intermediate P (13.0 g, 22.0 mmol), 2.6-diphenylaniline (7.00 g, 28.5 mmol), Pd(dba)$_2$ (1.26 g, 2.20 mmol), P(t-Bu)$_3$HBF$_4$ (1.27 g, 4.39 mmol), and tBuONa (4.85 g, 50.5 mmol) were added to 120 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Intermediate Q (16.0 g, yield 91%). The molecular weight of Intermediate Q was about 801 as measured by FAB-MS measurement.

Synthesis of Intermediate R

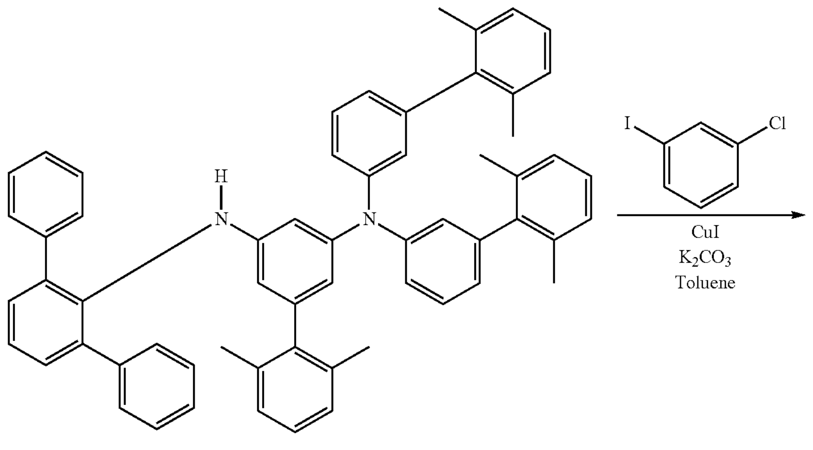

Q

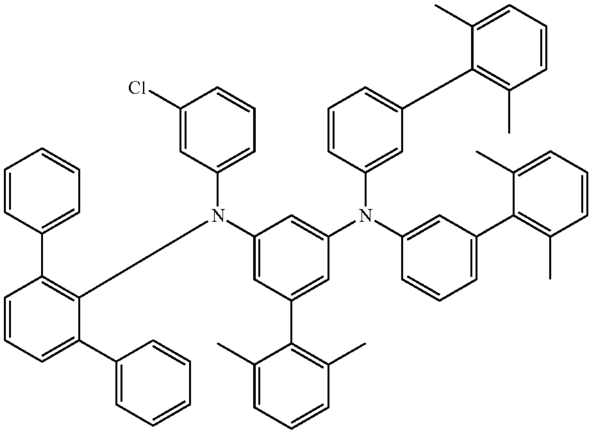

R

To Intermediate Q (14.0 g, 17.5 mmol), 3-chloro-1-iodobenzene (62.5 g, 262 mmol), CuI (6.99 g, 36.7 mmol), and $K_2CO_3$ (19.3 g, 140 mmol), about 10 mL of toluene was added, and the resultant mixture was heated for about 24 hours while maintaining the outside temperature at about 215° C. The mixture was diluted with $CH_2Cl_2$, water was added thereto, and the resultant mixture was subjected to celite filtering and liquid separation to concentrate an organic layer. The concentrated organic layer was purified by silica gel column chromatography to obtain Intermediate R (10.4 g, yield 65%). The molecular weight of Intermediate R was about 911 as measured by FAB-MS measurement.

Synthesis of Intermediate S

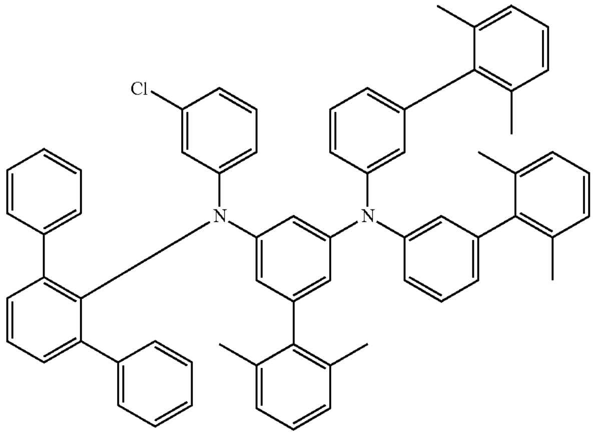

R

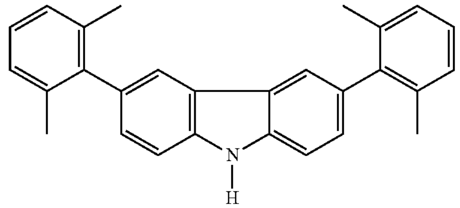

J

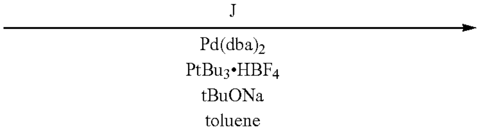

-continued

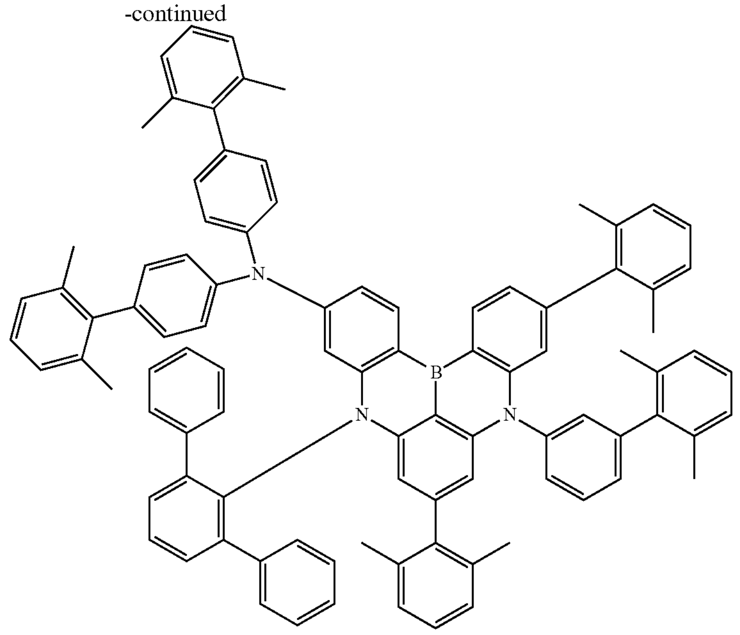

S

In an Ar atmosphere, Intermediate R (10.0 g, 11.0 mmol), Intermediate J (5.36 g, 14.3 mmol), $Pd(dba)_2$ (631 mg, 1.10 mmol), $P(t\text{-}Bu)_3HBF_4$ (637 mg, 2.19 mmol), and tBuONa (2.43 g, 25.2 mmol) were added to 100 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Intermediate S (9.88 g, yield 72%). The molecular weight of Intermediate S was about 1250 as measured by FAB-MS measurement.

Synthesis of Compound 34

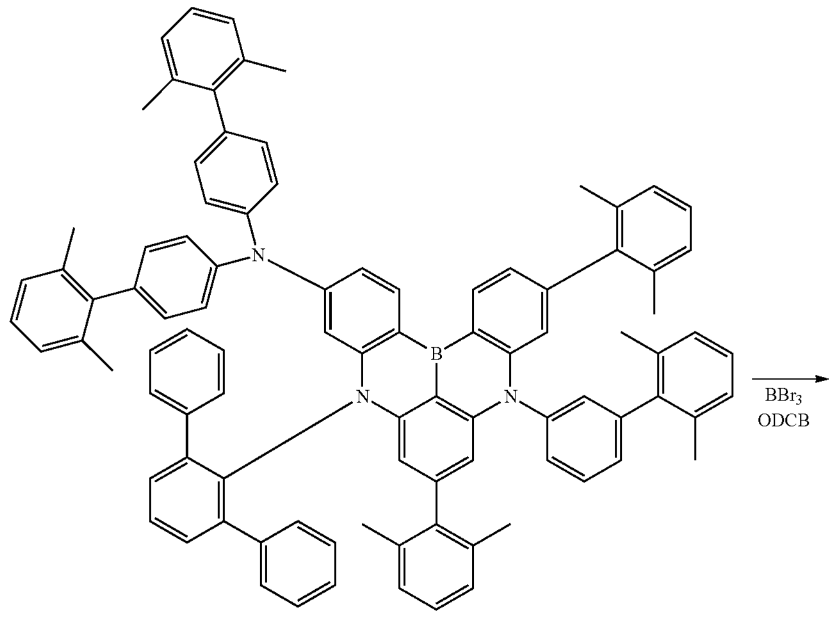

S

-continued

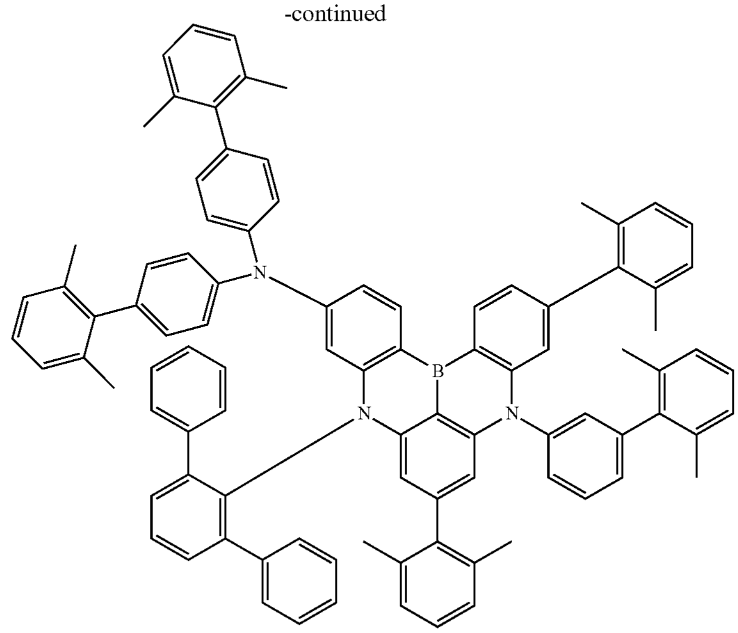

34

Compound 34 (3.44 g, yield 38%) was obtained in substantially the same manner as the synthesis of Compound 1 except that Intermediate S (9.0 g, 7.20 mmol) was used instead of Intermediate C in the synthesis of Compound 1. The molecular weight of Compound 34 was about 1258 as measured by FAB-MS. Sublimation purification (370° C., $2.8\times10^{-3}$ Pa) was carried out and device evaluation was performed.

(6) Synthesis of Compound 41

Fused polycyclic compound 41 according to an example may be synthesized by, for example, the reaction below.

Synthesis of Intermediate T

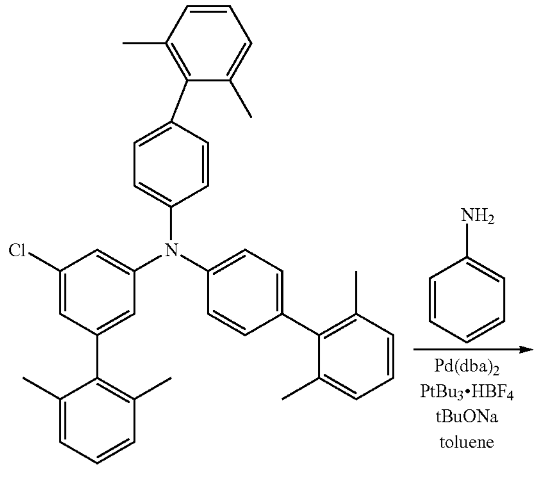

K

-continued

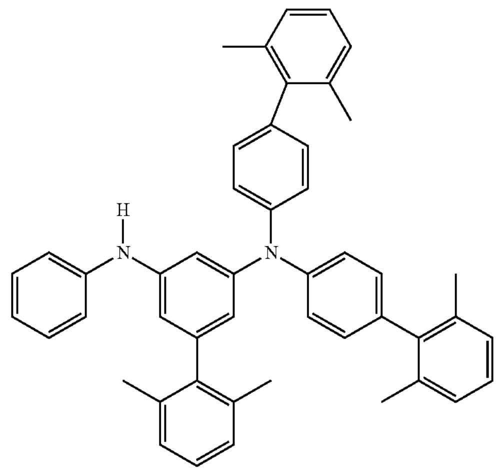

T

In an Ar atmosphere, Intermediate K (13.0 g, 22.0 mmol), aniline (2.66 g, 28.5 mmol), $Pd(dba)_2$ (1.26 g, 2.20 mmol), $P(t\text{-}Bu)_3HBF_4$ (1.27 g, 4.39 mmol), and tBuONa (4.85 g, 50.5 mmol) were added to 200 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Intermediate T (11.8 g, yield 83%). The molecular weight of Intermediate T was about 648 as measured by FAB-MS measurement.

Synthesis of Intermediate U

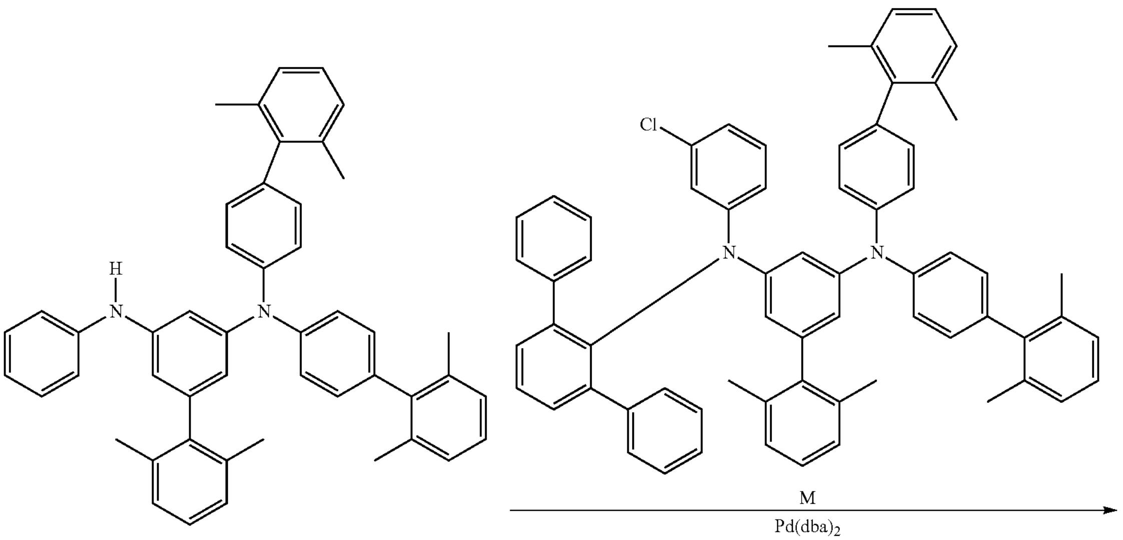

T

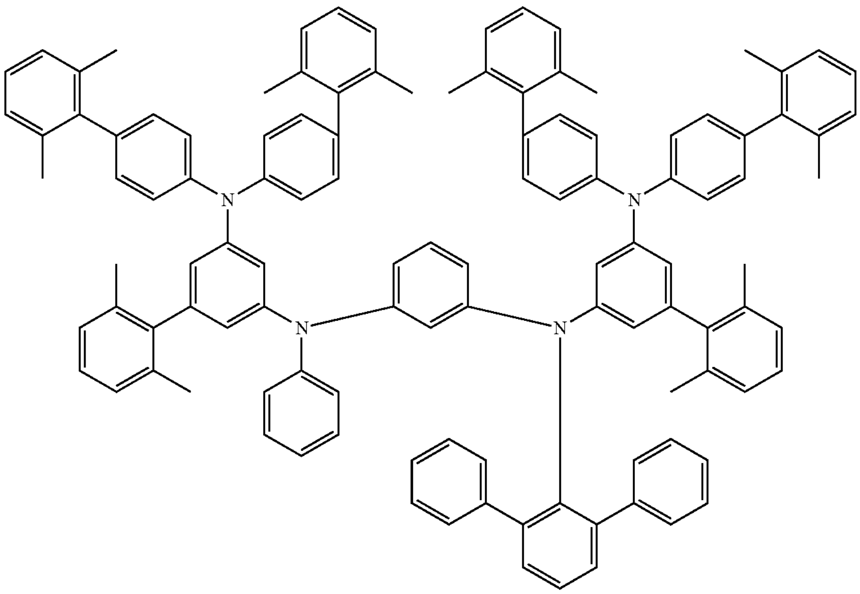

U

In an Ar atmosphere, Intermediate T (5.00 g, 7.71 mmol), Intermediate M (7.02 g, 7.71 mmol), $Pd(dba)_2$ (443 mg, 0.77 mmol), $P(t\text{-}Bu)_3HBF_4$ (447 mg, 1.54 mmol), and tBuONa (1.70 g, 17.7 mmol) were added to 100 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Intermediate U (9.86 g, yield 84%). The molecular weight of Intermediate U was about 1524 as measured by FAB-MS measurement.

Synthesis of Compound 41

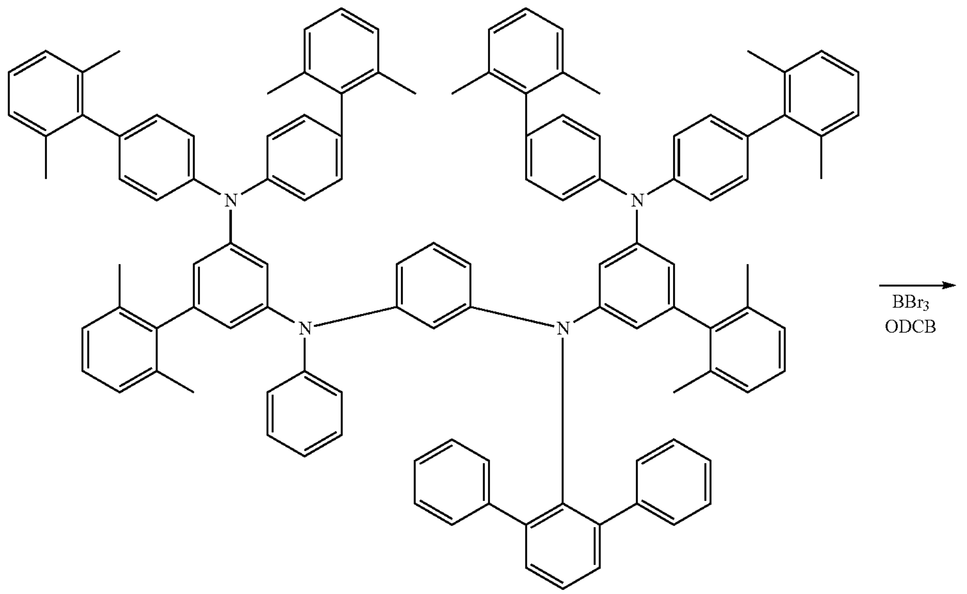

U

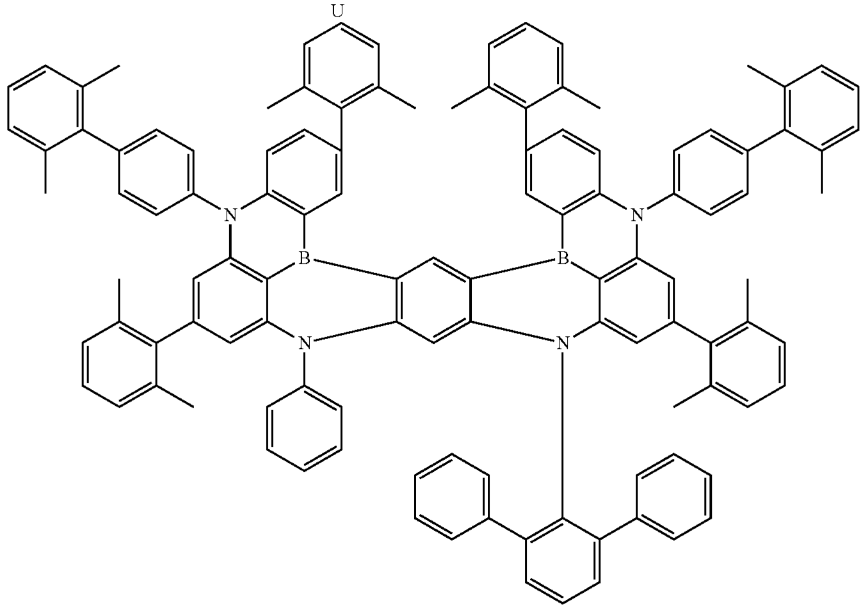

41

Compound 41 (2.27 g, yield 25%) was obtained in substantially the same manner as the synthesis of Compound 1 except that Intermediate U (9.0 g, 5.91 mmol) was used instead of Intermediate C in the synthesis of Compound 1. The molecular weight of Compound 41 was about 1539 as measured by FAB-MS measurement. Sublimation purification (410° C., $1.8\times10^{-3}$ Pa) was carried out and device evaluation was performed.

(7) Synthesis of Compound 42

Fused polycyclic compound 42 according to an example may be synthesized by, for example, the reaction below.

Synthesis of Intermediate V

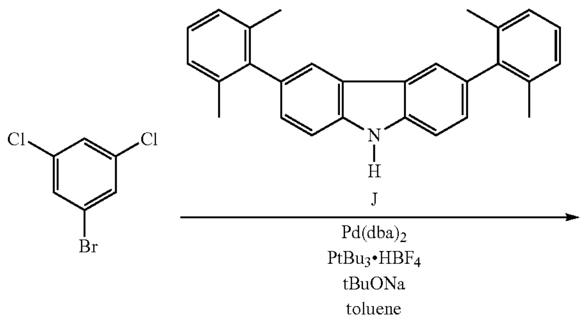

-continued

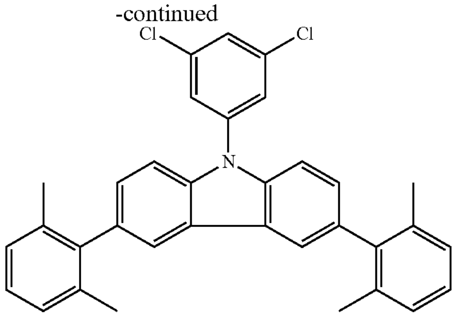

V

In an Ar atmosphere, 1-bromo-3,5-dichlorobenzene (8.0 g, 35.4 mmol), Intermediate J (14.6 g, 39.0 mmol), $Pd(dba)_2$ (2.04 g, 3.54 mmol), $P(t\text{-}Bu)_3HBF_4$ (2.06 g, 7.08 mmol), and tBuONa (7.83 g, 81.5 mmol) were added to 250 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Intermediate V (14.9 g, yield 81%). The molecular weight of Intermediate V was about 520 as measured by FAB-MS measurement.

Synthesis of Intermediate W

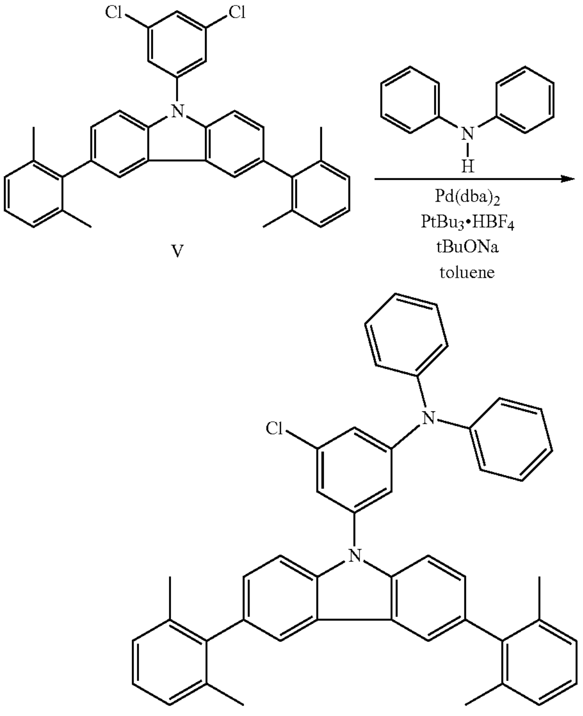

V W

In an Ar atmosphere, Intermediate V (14.0 g, 26.9 mmol), diphenylamine (5.00 g, 29.6 mmol), $Pd(dba)_2$ (1.54 g, 2.69 mmol), $P(t\text{-}Bu)_3HBF_4$ (1.56 g, 2.69 mmol), and tBuONa (5.95 g, 61.9 mmol) were added to 250 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Intermediate W (13.2 g, yield 75%). The molecular weight of Intermediate W was about 653 as measured by FAB-MS measurement.

Synthesis of Intermediate X

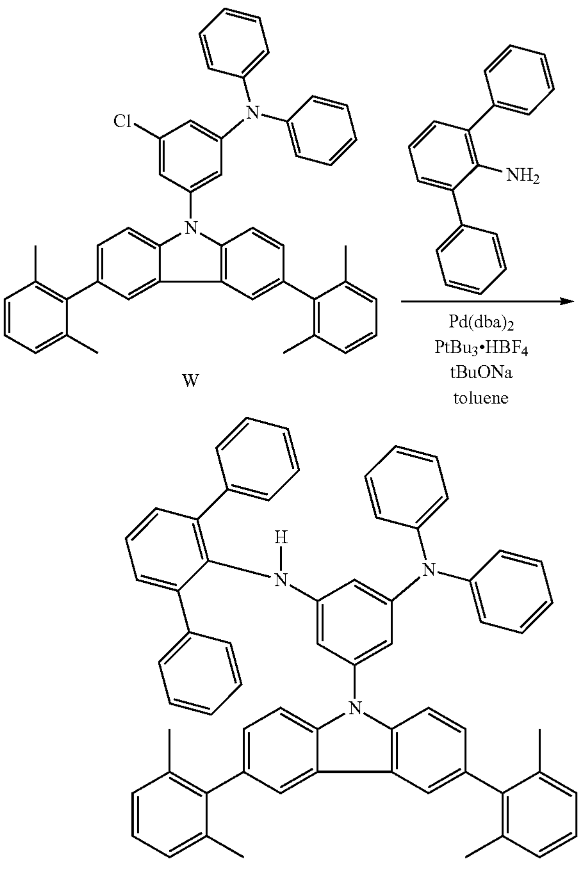

W X

Intermediate X was synthesized in substantially the same manner as Intermediate Q except that Intermediate W (13.0 g, 22.0 mmol) was used instead of Intermediate P in the synthesis of Intermediate Q to obtain Intermediate X (16.0 g, yield 91%). The molecular weight of Intermediate X was about 862 as measured by FAB-MS measurement.

Synthesis of Intermediate Y

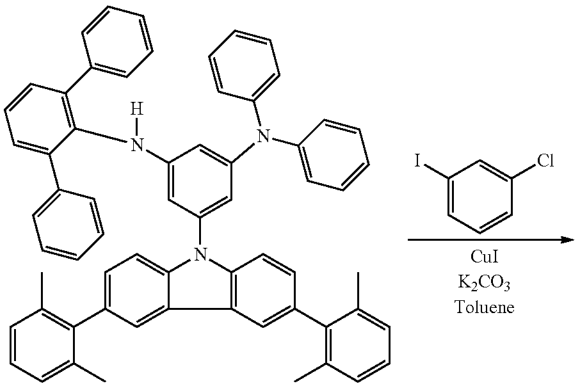

X

-continued
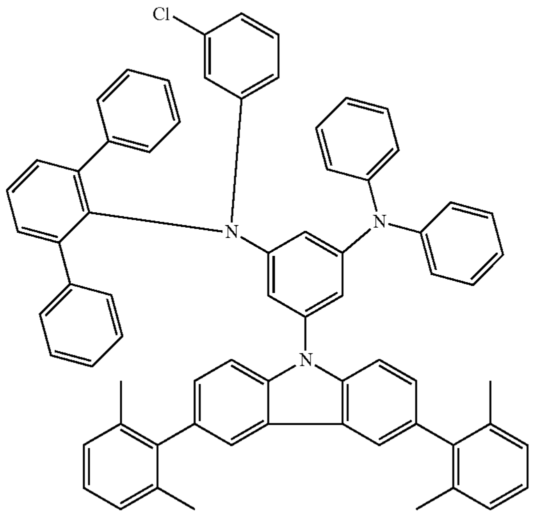
Y
Intermediate Y was synthesized in substantially the same manner as Intermediate R except that Intermediate X (14.0 g, 17.5 mmol) was used instead of Intermediate Q in the synthesis of Intermediate R to obtain Intermediate Y (9.35 g, yield 55%). The molecular weight of Intermediate Y was about 972 as measured by FAB-MS measurement.
Synthesis of Intermediate Z
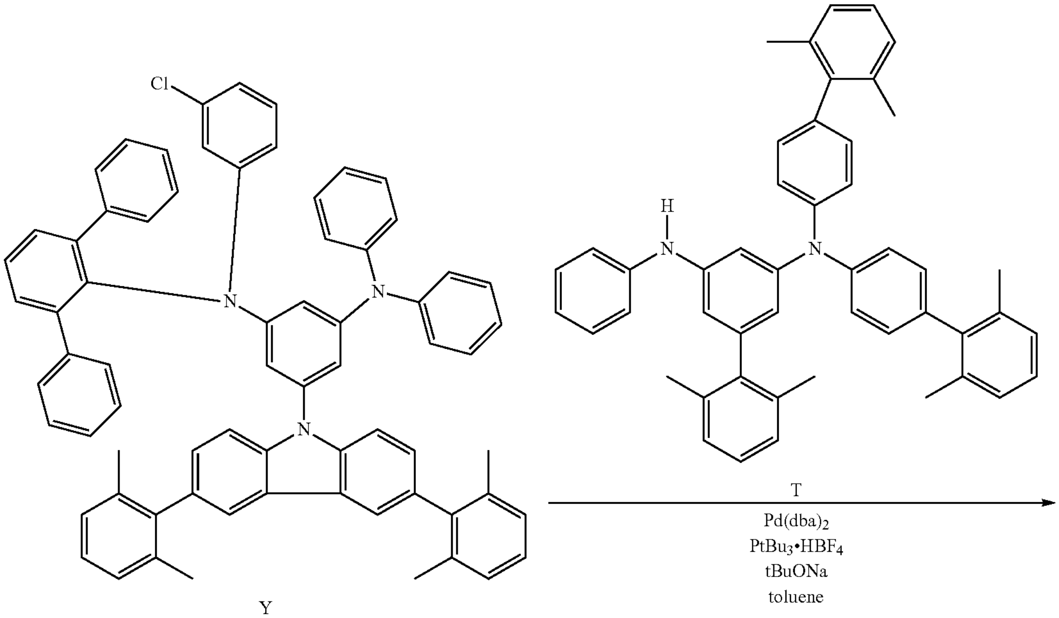

-continued

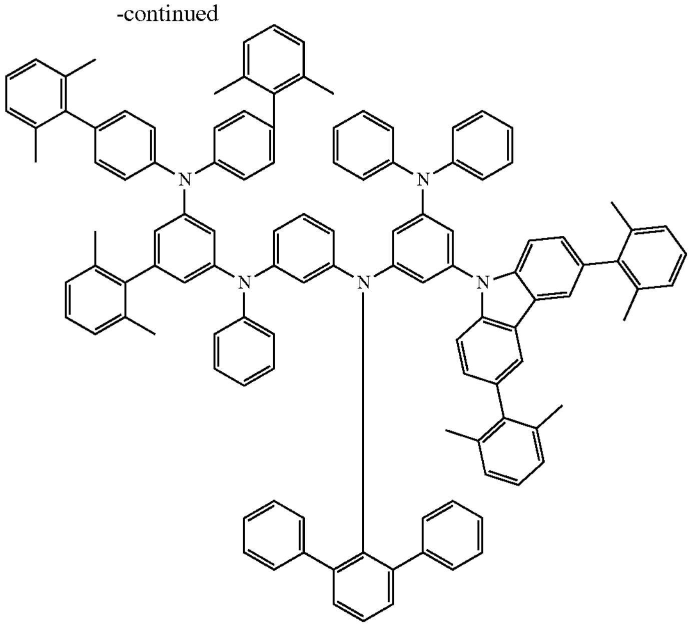

Z

Intermediate Z was synthesized in substantially the same manner as Intermediate U except that Intermediate T (7.00 g, 10.8 mmol) was used instead of Intermediate M, and Intermediate Y (10.5 g, 10.8 mmol) was used instead of Intermediate T in the synthesis of Intermediate U to obtain Intermediate Z (13.5 g, yield 79%). The molecular weight of Intermediate Z was about 1585 as measured by FAB-MS measurement.

Synthesis of Compound 42

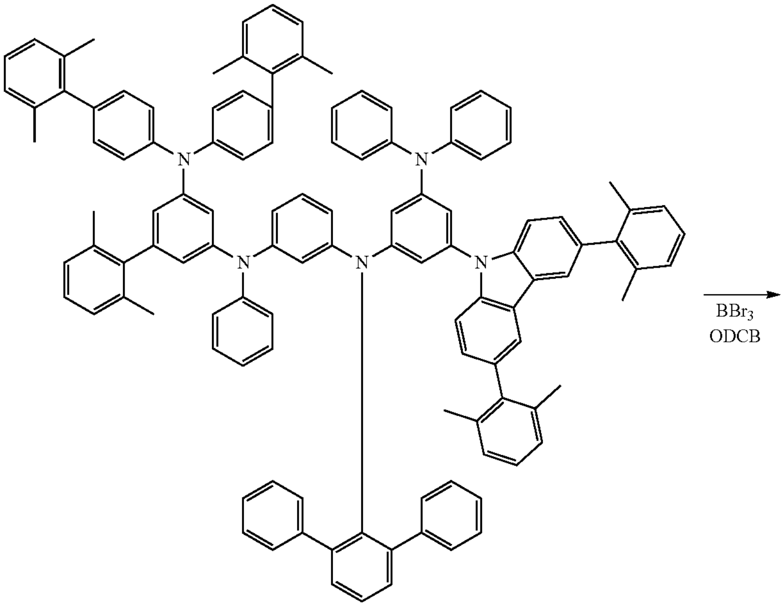

Z

-continued

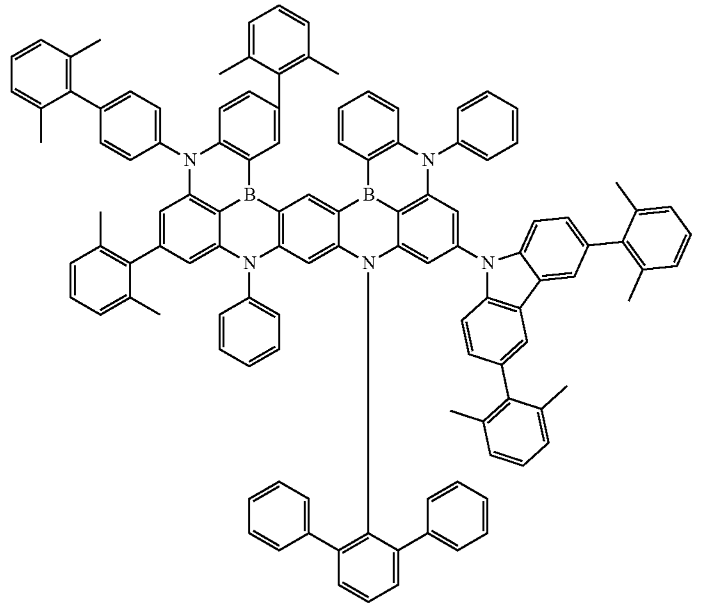

42

Compound 42 (3.27 g, yield 27%) was obtained in substantially the same manner as the synthesis of Compound 1 except that Intermediate Z (12.0 g, 7.57 mmol) was used instead of Intermediate C in the synthesis of Compound 1. The molecular weight of Compound 42 was about 1600 as measured by FAB-MS. Sublimation purification (420° C., $1.5\times10^{-3}$ Pa) was carried out and device evaluation was performed.

(8) Synthesis of Compound 59

Fused polycyclic compound 59 according to an example may be synthesized by, for example, the reaction below.

Synthesis of Intermediate AA

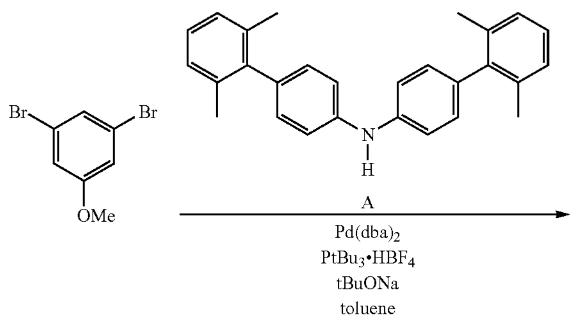

-continued

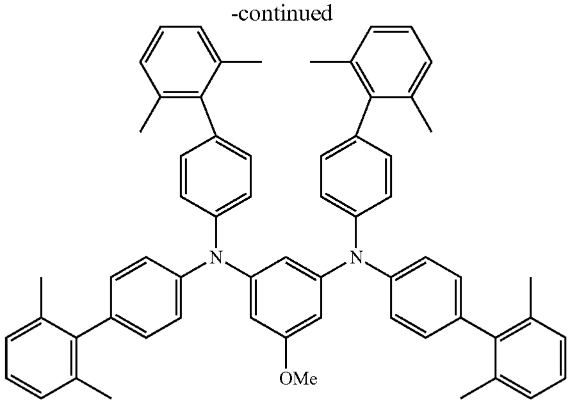

AA

In an Ar atmosphere, 3,5-dibromoanisole (5.00 g, 18.8 mmol), Intermediate A (15.6 g, 41.4 mmol), $Pd(dba)_2$ (1.08 g, 1.88 mmol), $P(t\text{-}Bu)_3HBF_4$ (1.09 g, 3.76 mmol), and tBuONa (4.16 g, 43.2 mmol) were added to 200 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Intermediate AA (14.7 g, yield 91%). The molecular weight of Intermediate AA was about 859 as measured by FAB-MS measurement.

Synthesis of Intermediate AB

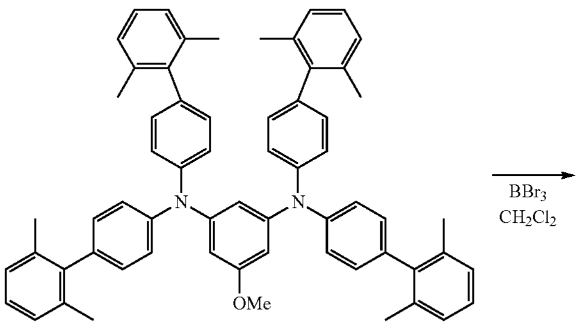

AA

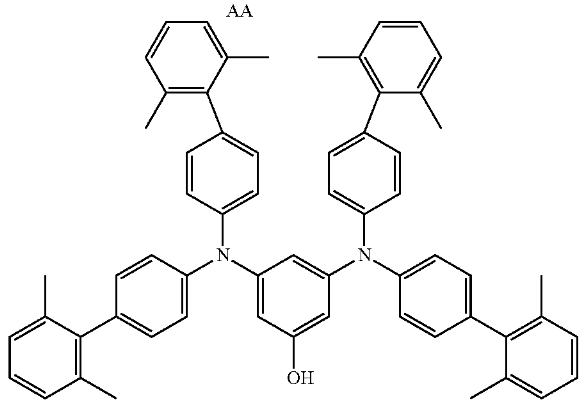

AB

In an Ar atmosphere, Intermediate AA (12.0 g, 14.0 mmol) was dissolved in $CH_2Cl_2$ (200 mL) and $BBr_3$ (8.0 g, 32.1 mmol) was added thereto at about 0° C. The resultant mixture was heated to room temperature and stirred for about 24 hours. The reaction mixture was cooled to about 0° C., 100 mL of water was added thereto, and the resultant mixture was stirred for about 1 hour, and then was subjected to celite filtering and liquid separation to concentrate an organic layer. The concentrated organic layer was purified by silica gel column chromatography to obtain Intermediate AB (9.44 g, yield 80%). The molecular weight of Intermediate AB was about 845 as measured by FAB-MS measurement.

Synthesis of Intermediate AC

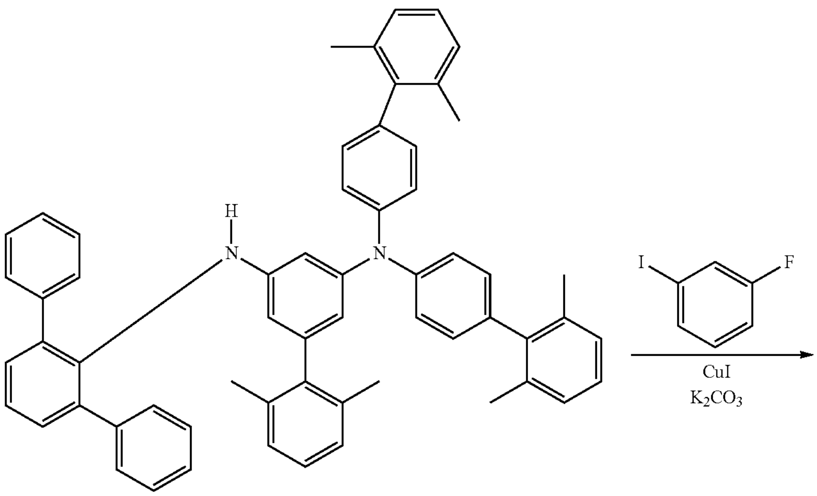

L

-continued

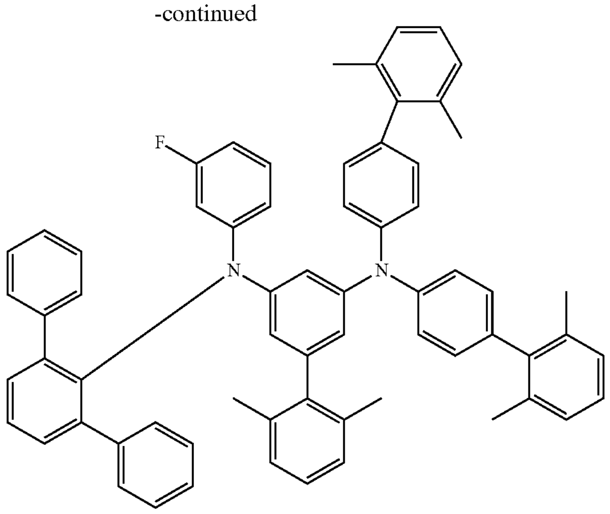

AC

Intermediate AC was synthesized in substantially the same manner as Intermediate R except that Intermediate L (10.0 g, 12.5 mmol) was used instead of Intermediate Q, and 3-fluoro-1-iodobenzene (41.6 g, 187 mmol) was used instead of 3-chloro-1-iodobenzene in the synthesis of Intermediate R to obtain Intermediate AC (7.82 g, yield 70%). The molecular weight of Intermediate AC was about 895 as measured by FAB-MS measurement.

Synthesis of Intermediate AD

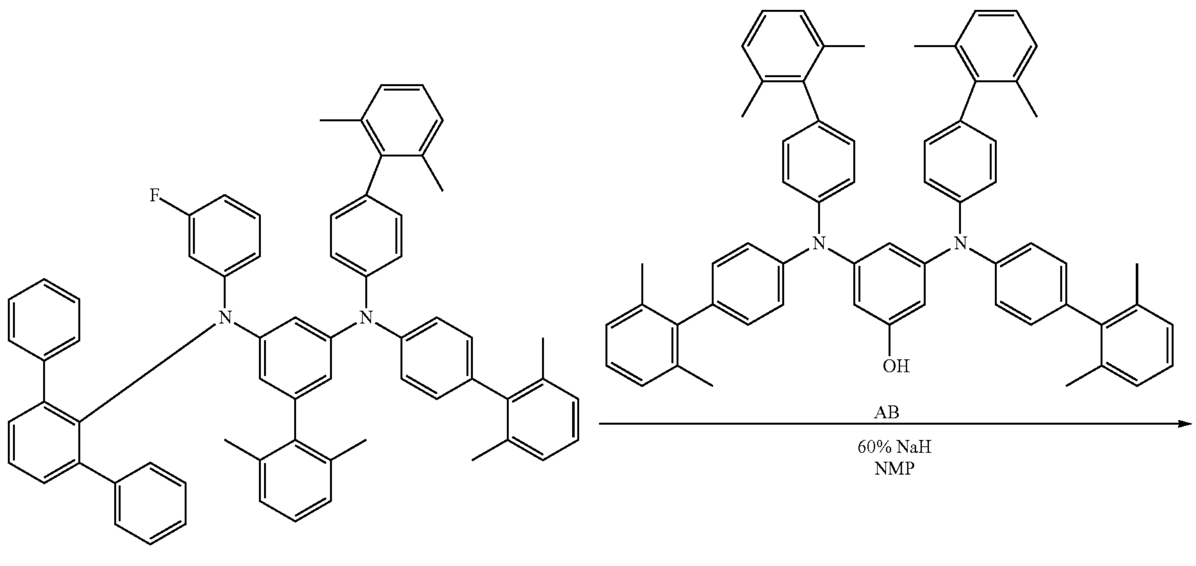

AC

-continued

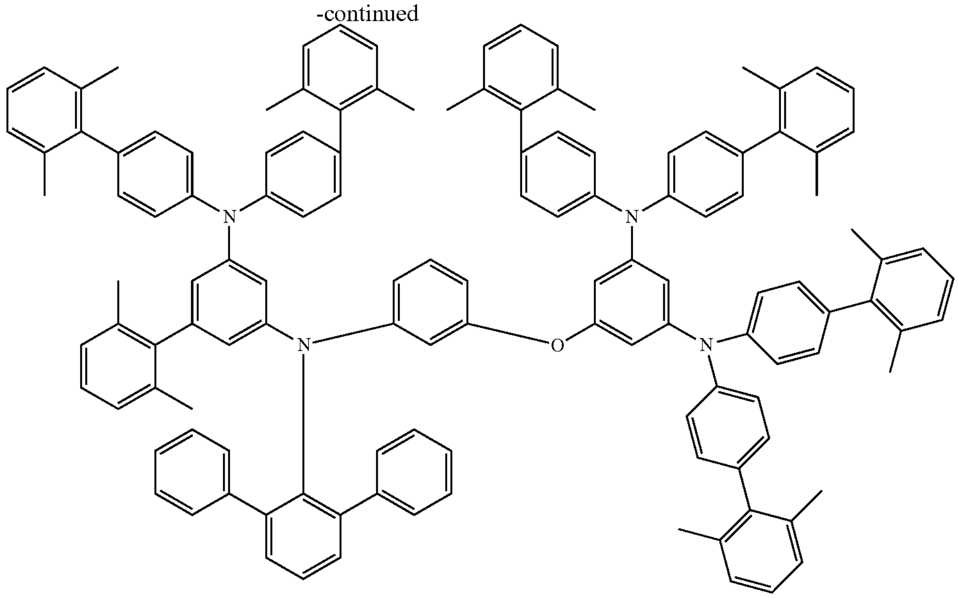

AD

In an Ar atmosphere, Intermediate AC (7.00 g, 7.82 mmol) and Intermediate AB (7.93 g, 9.38 mmol) were added to 1-methyl-2-pyrrolidone (NMP, 150 mL) and maintained at about 0° C., and then 60% NaH (0.63 g, 15.6 mmol) was added thereto, and the resultant mixture was stirred for about 30 minutes, and then stirred at about 100° C. for about 6 hours. Water and toluene were added thereto, and the resultant mixture was stirred for about 1 hour and subjected to celite filtering and liquid separation to concentrate an organic layer. The concentrated organic layer was purified by silica gel column chromatography to obtain Intermediate AD (11.7 g, yield 87%). The molecular weight of Intermediate AD was about 1720 as measured by FAB-MS measurement.

Synthesis of Compound 59

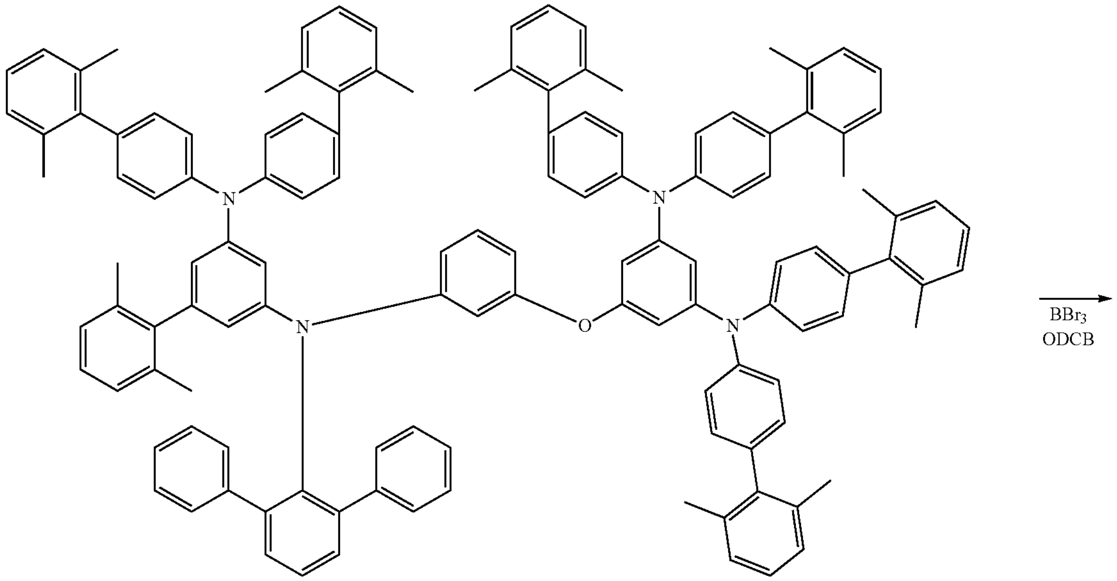

AD

-continued

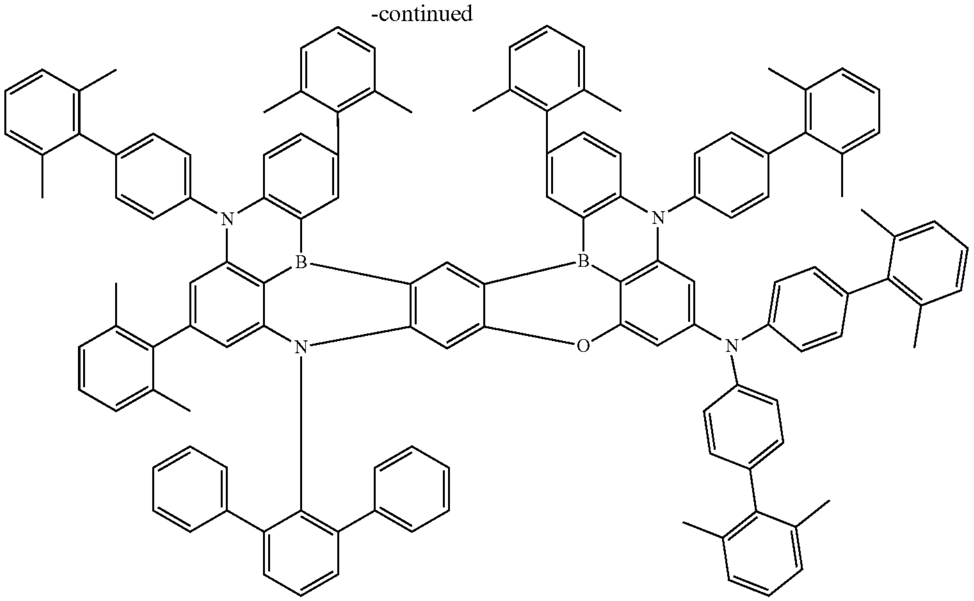

59

Compound 59 (1.81 g, yield 18%) was obtained in substantially the same manner as the synthesis of Compound 1 except that Intermediate AD (10.0 g, 5.81 mmol) was used instead of Intermediate C in the synthesis of Compound 1. The molecular weight of Compound 59 was about 1735 as measured by FAB-MS measurement. Sublimation purification (415° C., $1.7\times10^{-3}$ Pa) was carried out and device evaluation was performed.

(9) Synthesis of Compound 81

Fused polycyclic compound 81 according to an example may be synthesized by, for example, the reaction below.

Synthesis of Intermediate AE

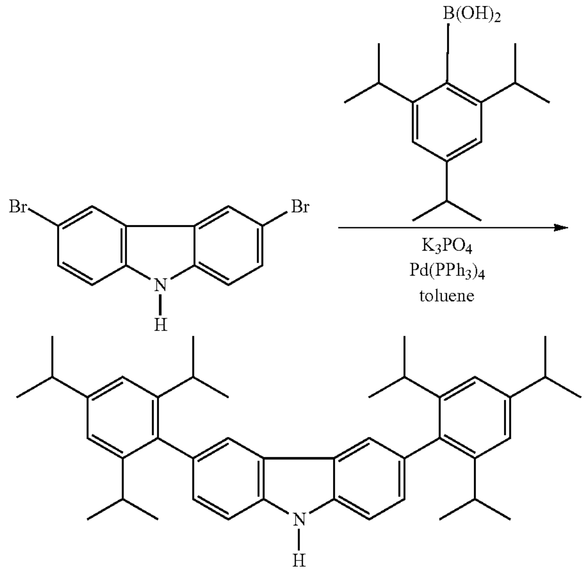

AE

Intermediate AE was synthesized in substantially the same manner as Intermediate A except that 3,6-dibromocarbazole (10.0 g, 30.8 mmol) was used instead of bis(4-bromophenyl)amine, and 2,4,6-triisopropylbenzeneboronic acid (16.8 g, 67.7 mmol) was used instead of 2,6-dimethylphenylboronic acid in the synthesis of Intermediate A to obtain Intermediate AE (14.6 g, yield 83%). The molecular weight of Intermediate AE was about 571 as measured by FAB-MS measurement.

Synthesis of Intermediate AF

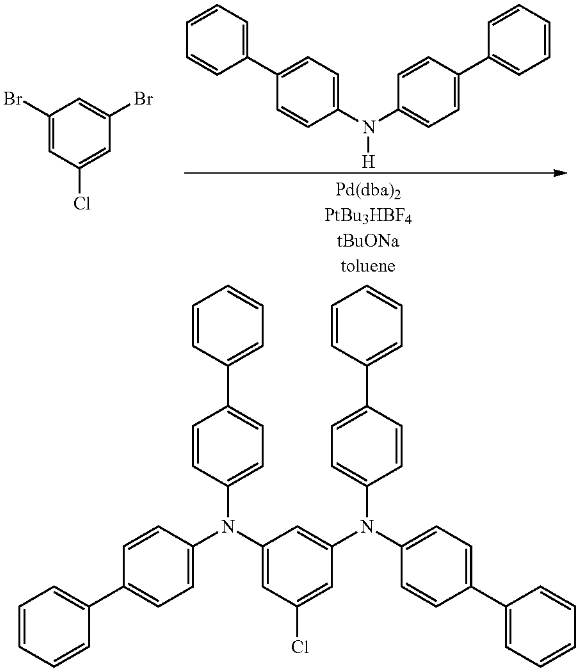

AF

In an Ar atmosphere, 3,5-dibromo-chlorobenzene (5.00 g, 18.5 mmol), bis(4-biphenylyl)amine (13.1 g, 46.7 mmol), $Pd(dba)_2$ (1.06 g, 1.85 mmol), $P(t\text{-}Bu)_3HBF_4$ (1.07 g, 3.70 mmol), and tBuONa (4.09 g, 42.5 mmol) were added to 200 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Intermediate AF (13.9 g, yield 88%). The molecular weight of Intermediate AF was about 751 as measured by FAB-MS measurement.

Synthesis of Intermediate AG

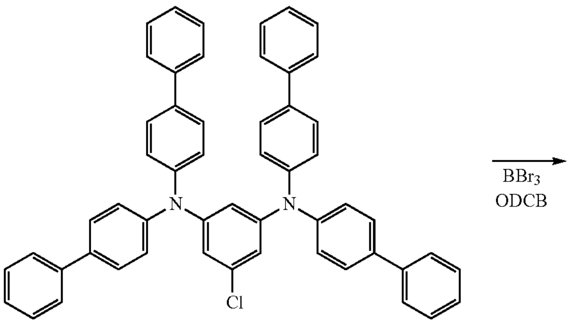

AF

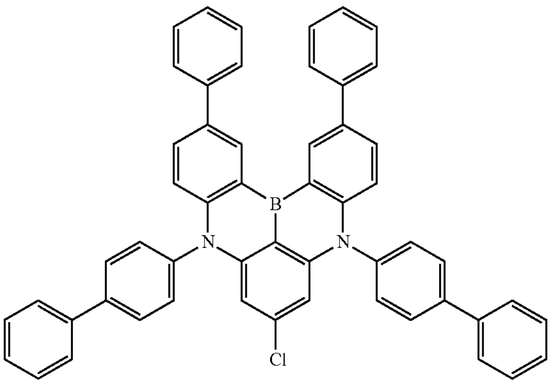

AG

-continued

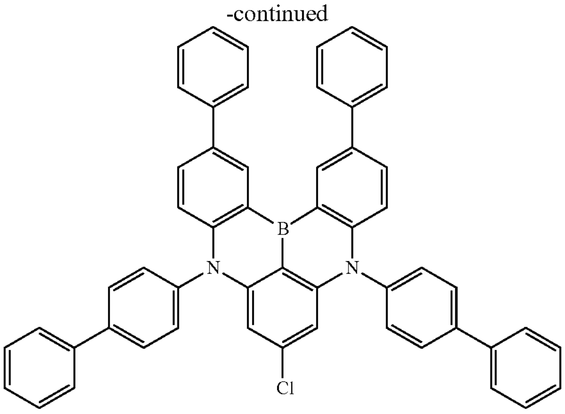

AG

Intermediate AG (4.12 g, yield 40%) was obtained in substantially the same manner as the synthesis of Compound 1 except that Intermediate AF (10.0 g, 13.3 mmol) was used instead of Intermediate C in the synthesis of Compound 1. The molecular weight of Intermediate AG was about 775 as measured by FAB-MS measurement.

Synthesis of Compound 81

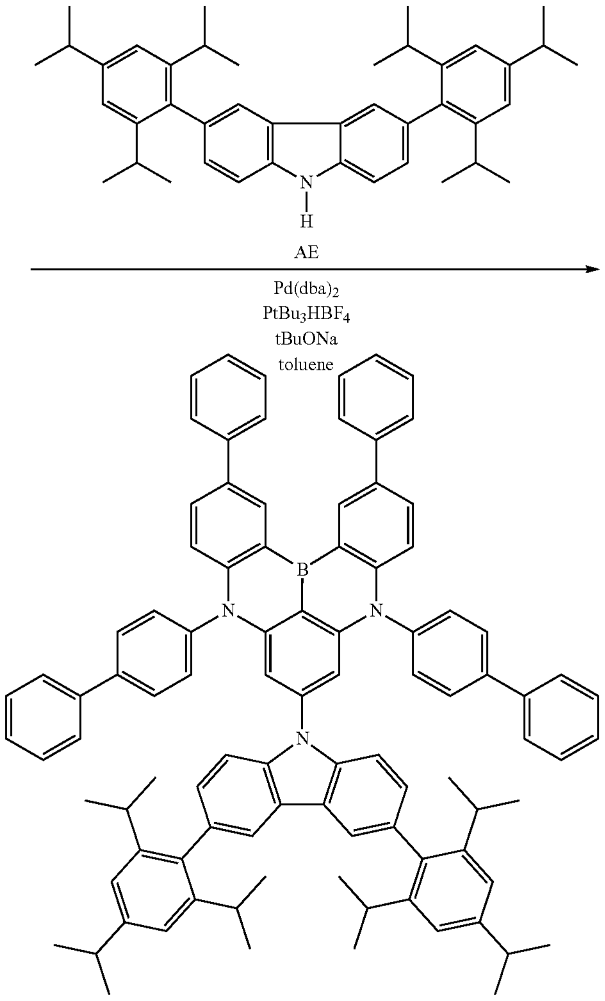

81

In an Ar atmosphere, Intermediate AG (5.00 g, 6.45 mmol), Intermediate AE (5.53 g, 9.67 mmol), $Pd(dba)_2$ (0.37 g, 0.64 mmol), $P(t\text{-}Bu)_3HBF_4$ (0.37 g, 1.29 mmol), and tBuONa (1.43 g, 14.8 mmol) were added to 100 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Compound 81 (7.09 g, yield 85%). The molecular weight of Compound 81 was about 1294 as measured by FAB-MS measurement. Sublimation purification (370° C., 2.7×10−3 Pa) was carried out and device evaluation was performed.

(10) Synthesis of Compound 90

Fused polycyclic compound 90 according to an example may be synthesized by, for example, the reaction below.

Synthesis of Intermediate AH

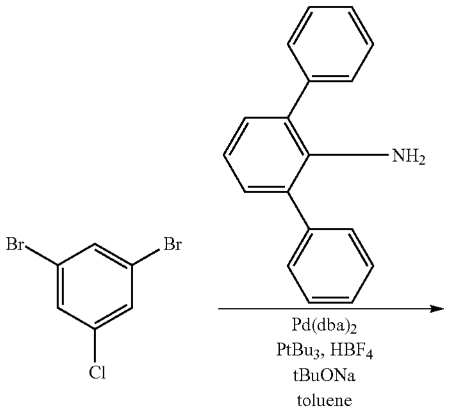

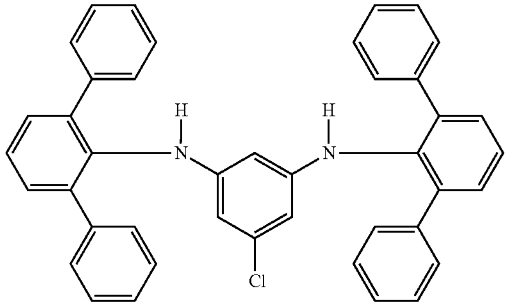

AH

In an Ar atmosphere, 3,5-dibromo-chlorobenzene (5.0 g, 18.5 mmol), 2,6-diphenylaniline (9.98 g, 40.7 mmol), $Pd(dba)_2$ (1.06 g, 1.85 mmol), $P(t\text{-}Bu)_3HBF_4$ (1.07 g, 3.70 mmol), and tBuONa (4.09 g, 42.5 mmol) were added to 100 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Intermediate AH (9.75 g, yield 88%). The molecular weight of Intermediate AH was about 599 as measured by FAB-MS measurement.

Synthesis of Intermediate AI

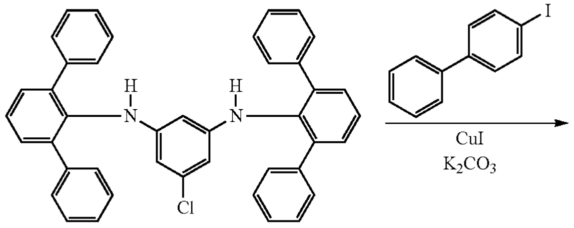

AH

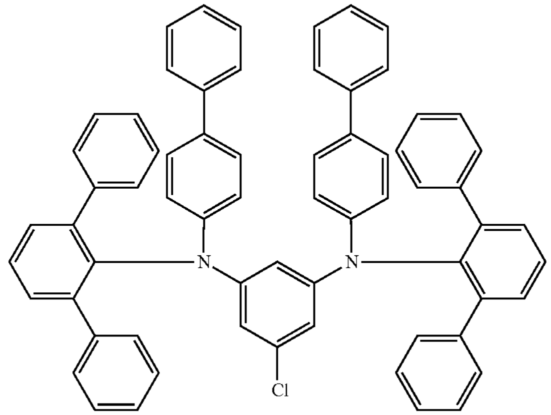

AI

Intermediate AI was synthesized in substantially the same manner as Intermediate R except that Intermediate AH (9.50 g, 15.9 mmol) was used instead of Intermediate Q, and 4-iodobiphenyl (66.6 g, 238 mmol) was used instead of 3-chloro-1-iodobenzene in the synthesis of Intermediate R to obtain Intermediate AI (10.0 g, yield 70%). The molecular weight of Intermediate AI was about 903 as measured by FAB-MS measurement.

Synthesis of Intermediate AJ

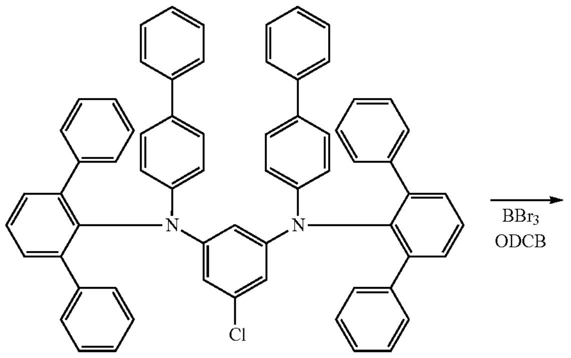

AI

-continued
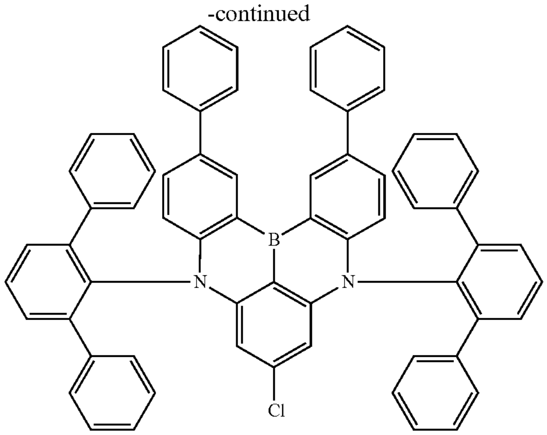
AJ
Intermediate AJ (4.79 g, yield 50%) was obtained in substantially the same manner as the synthesis of Compound 1 except that Intermediate AI (9.50 g, 10.5 mmol) was used instead of Intermediate C in the synthesis of Compound 1. The molecular weight of Intermediate AJ was about 911 as measured by FAB-MS measurement.
Synthesis of Compound 90
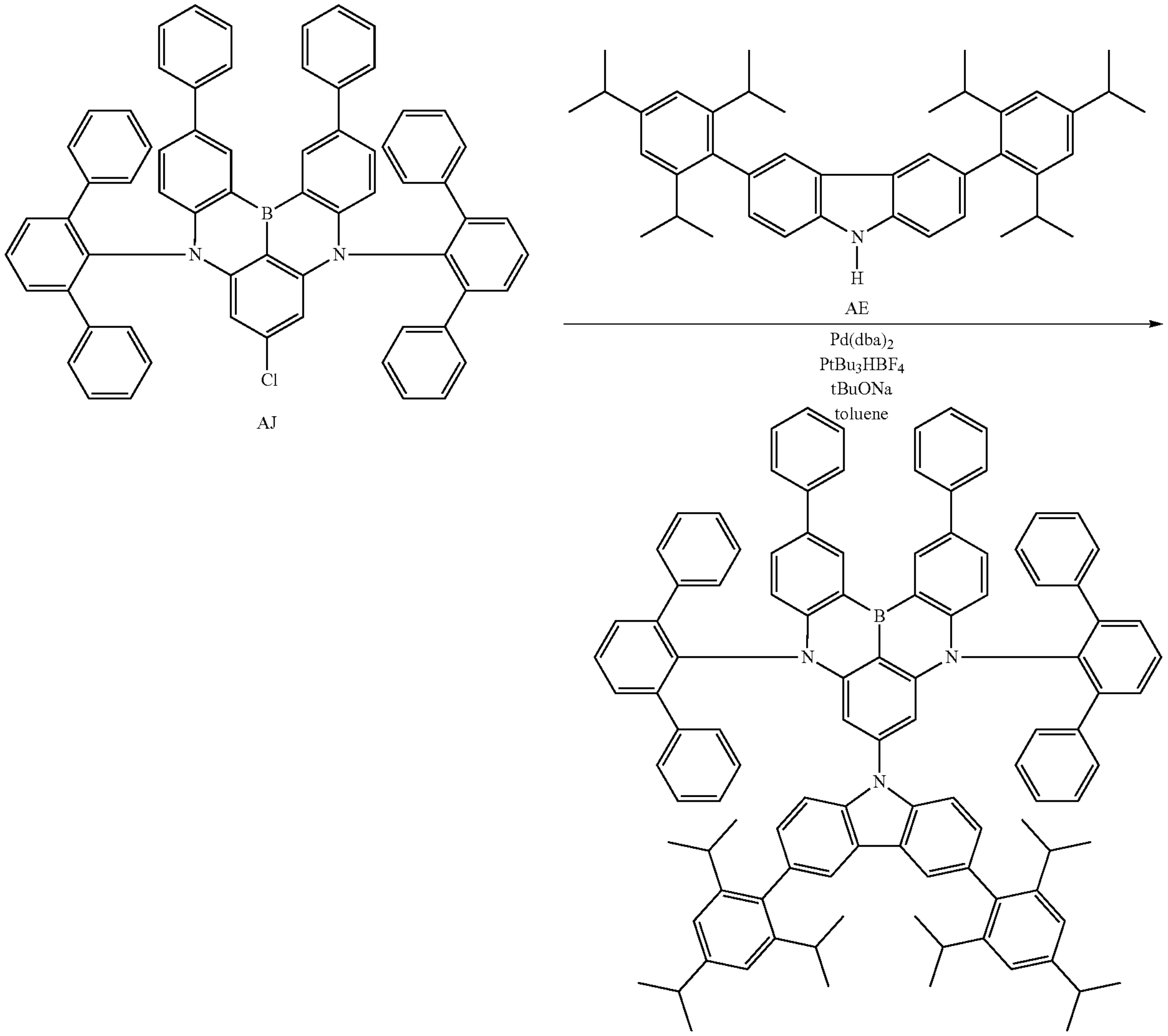
AJ
AE
90

In an Ar atmosphere, Intermediate AJ (3.00 g, 3.29 mmol), Intermediate AE (2.82 g, 4.94 mmol), $Pd(dba)_2$ (189 mg, 0.33 mmol), $P(t\text{-}Bu)_3HBF_4$ (191 g, 0.66 mmol), and tBuONa (723 mg, 7.57 mmol) were added to 50 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Compound 90 (4.24 g, yield 89%). The molecular weight of Compound 90 was about 1446 as measured by FAB-MS. Sublimation purification (350° C., $2.6\times10^{-3}$ Pa) was carried out and device evaluation was performed.

(11) Synthesis of Compound 121

Fused polycyclic compound 121 according to an example may be synthesized by, for example, the reaction below.

Synthesis of Intermediate AK

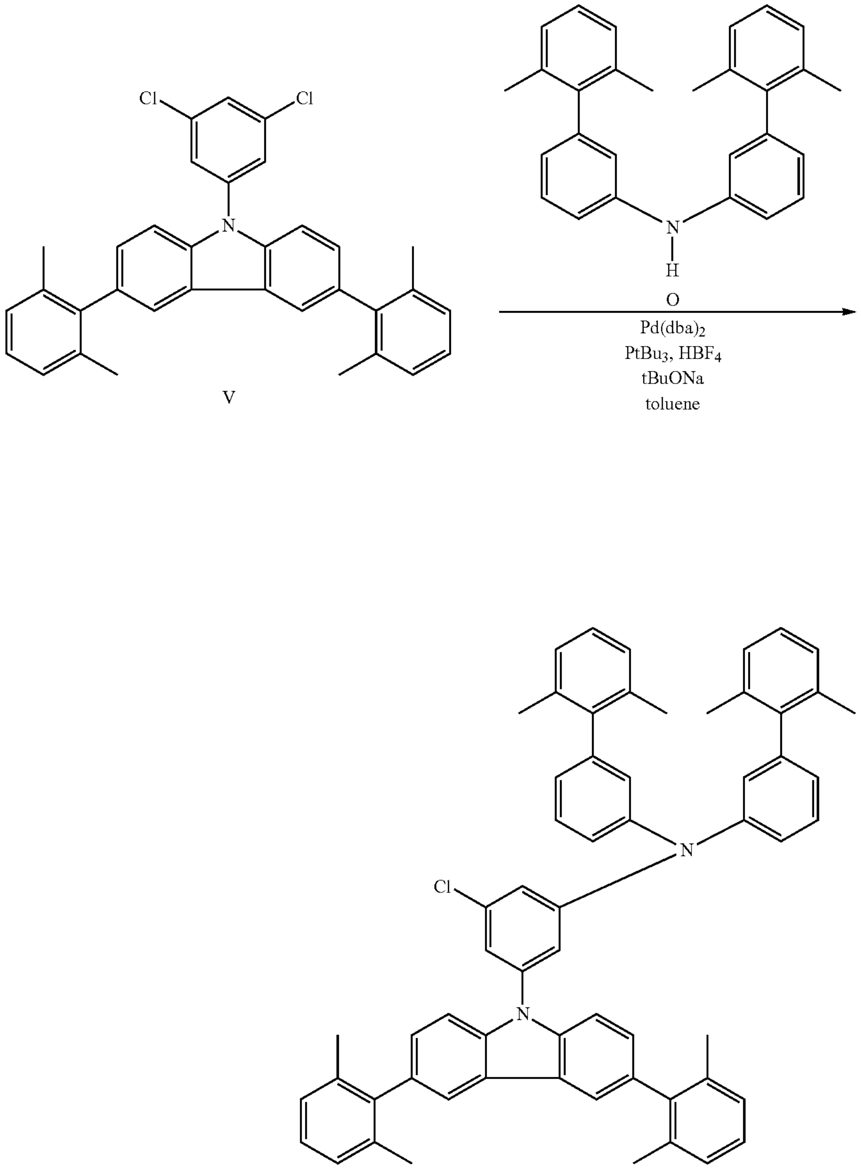

V

AK

In an Ar atmosphere, Intermediate V (14.0 g, 26.9 mmol), Intermediate O (11.2 g, 29.6 mmol), $Pd(dba)_2$ (1.54 g, 2.69 mmol), $P(t\text{-}Bu)_3HBF_4$ (1.56 g, 2.69 mmol), and tBuONa (5.95 g, 61.9 mmol) were added to 250 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Intermediate AK (18.1 g, yield 78%). The molecular weight of Intermediate AK was about 861 as measured by FAB-MS measurement.

Synthesis of Intermediate AL

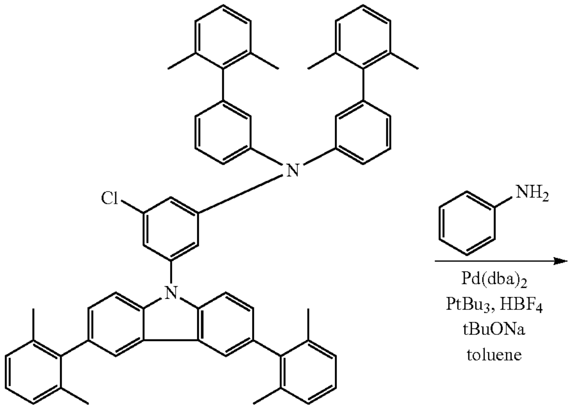

AK

-continued

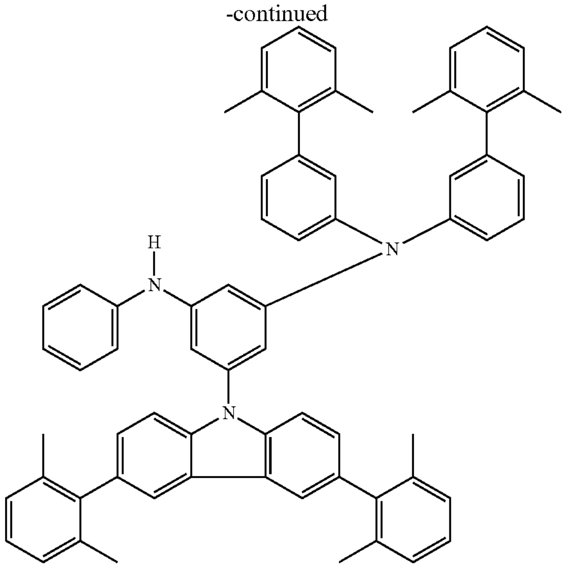

AL

In an Ar atmosphere, Intermediate AK (12.0 g, 13.9 mmol), aniline (1.69 g, 18.1 mmol), $Pd(dba)_2$ (0.80 g, 1.39 mmol), $P(t\text{-}Bu)_3HBF_4$ (808 mg, 2.79 mmol), and tBuONa (3.08 g, 32.0 mmol) were added to 200 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Intermediate AL (10.5 g, yield 82%). The molecular weight of Intermediate AL was about 918 as measured by FAB-MS measurement.

Synthesis of Intermediate AM

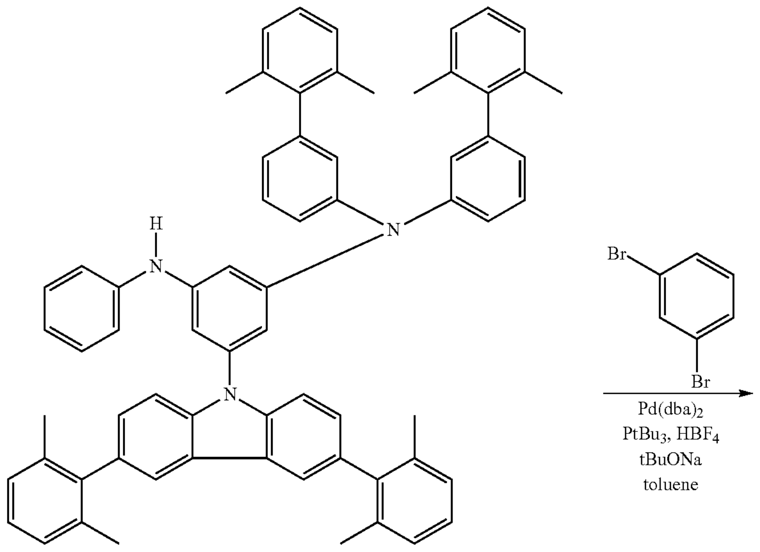

AL

-continued

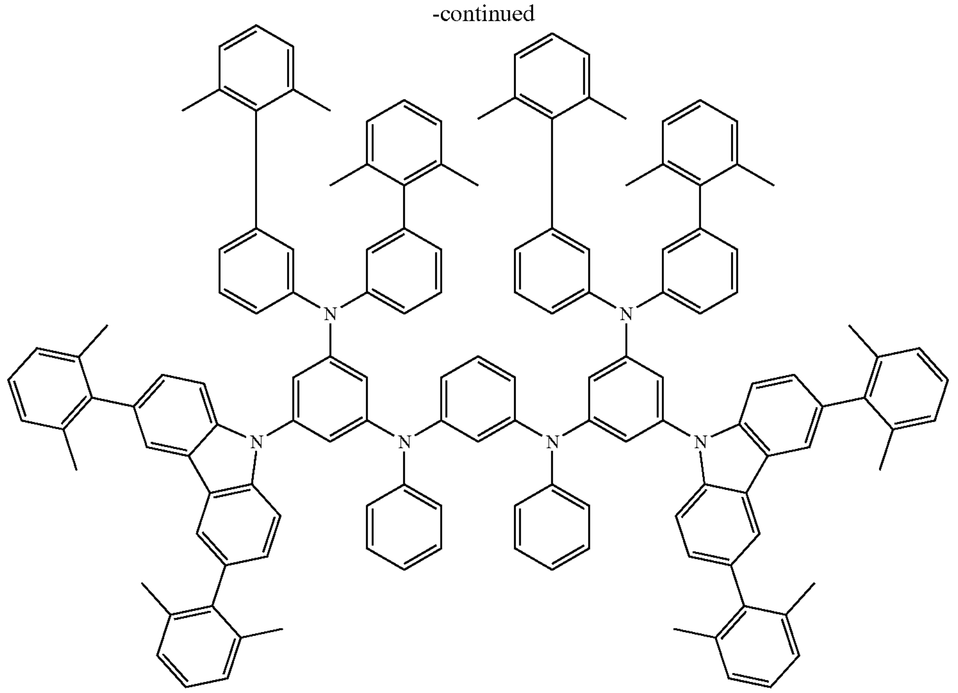

AM

In an Ar atmosphere, Intermediate AL (7.78 g, 8.48 mmol), 1,3-dibromobenzene (1.00 g, 4.24 mmol), $Pd(dba)_2$ (244 mg, 0.42 mmol), $P(t\text{-}Bu)_3HBF_4$ (246 g, 0.85 mmol), and tBuONa (937 mg, 9.75 mmol) were added to 100 mL of toluene, and heated and stirred at about 80° C. for about 2 hours. Water was added thereto, and the resultant mixture was subjected to celite filtering and liquid separation to concentrate an organic layer. The concentrated organic layer was purified by silica gel column chromatography to obtain Intermediate AM (7.53 g, yield 93%). The molecular weight of Intermediate AM was about 1910 as measured by FAB-MS measurement.

Synthesis of Compound 121

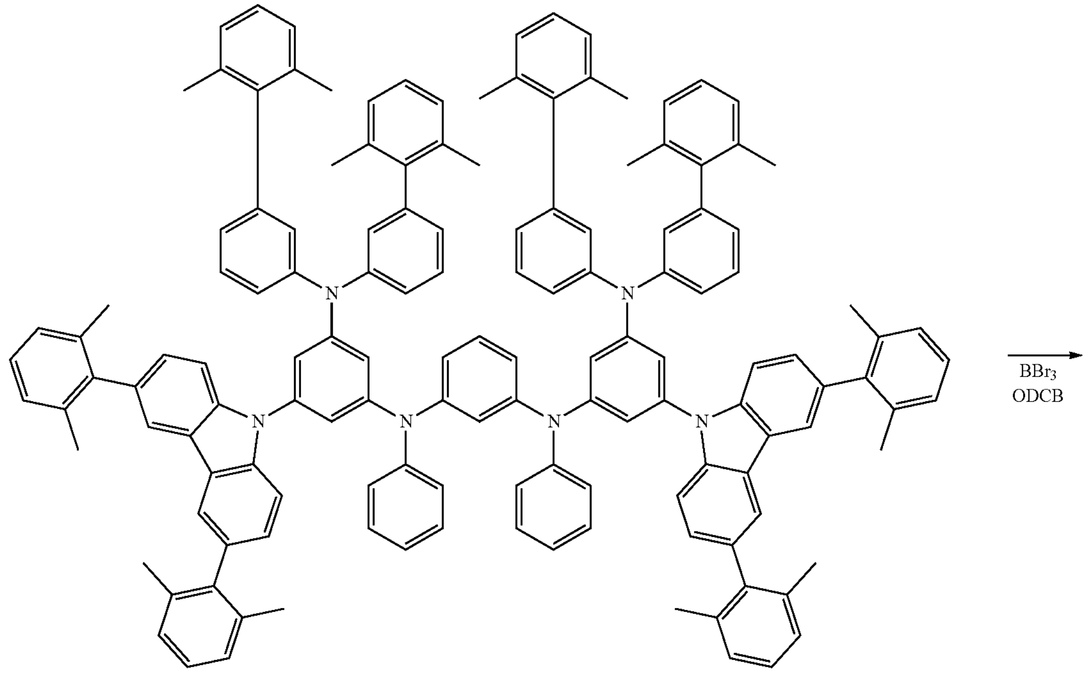

AM

-continued

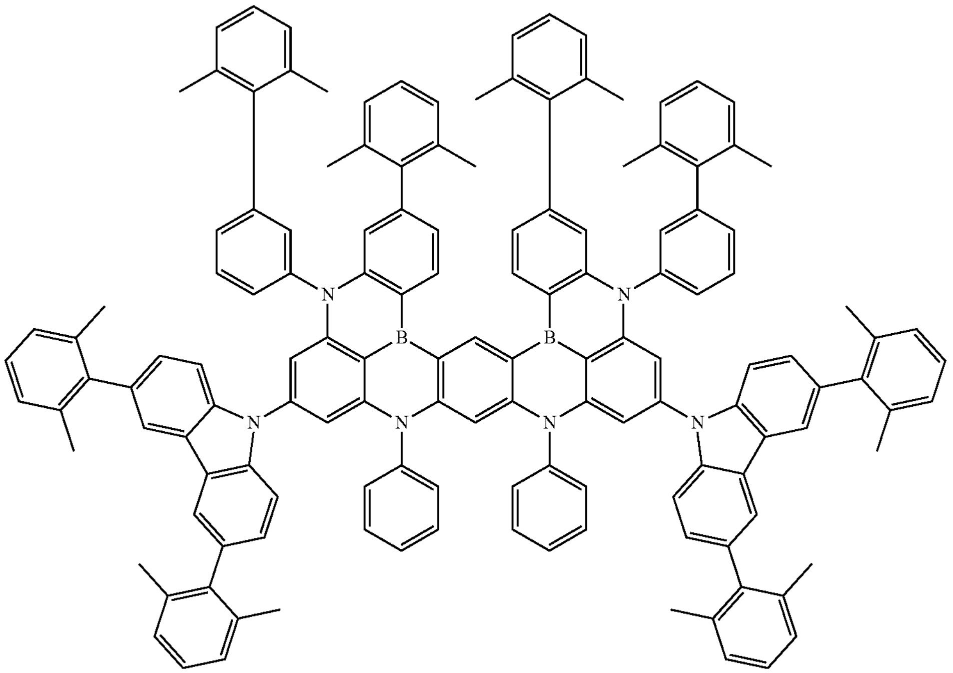

121

Compound 121 (1.61 g, yield 32%) was obtained in substantially the same manner as the synthesis of Compound 1 except that Intermediate AM (5.0 g, 2.62 mmol) was used instead of Intermediate C in the synthesis of Compound 1. The molecular weight of Compound 121 was about 1928 as measured by FAB-MS. Sublimation purification (410° C., $1.3\times10^{-3}$ Pa) was carried out and device evaluation was performed.

2. Manufacture and Evaluation of Light Emitting Device Including Fused Polycyclic Compound Manufacture of Light Emitting Device Compounds 1, 2, 3, 13, 34, 41, 42, 59, 81, 90, and 121 as described above were used as a dopant material of the emission layer to manufacture the light emitting devices of Examples 1 to 11, respectively.

Example Compounds

1

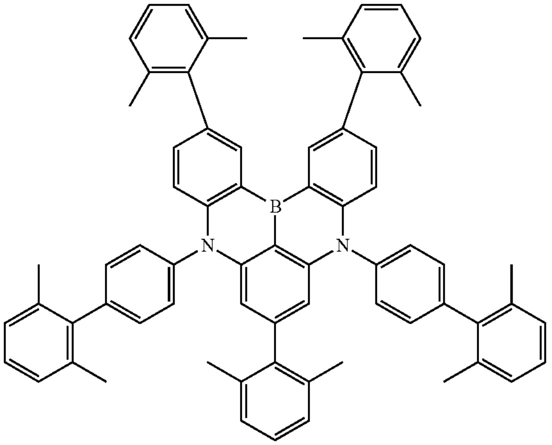

2

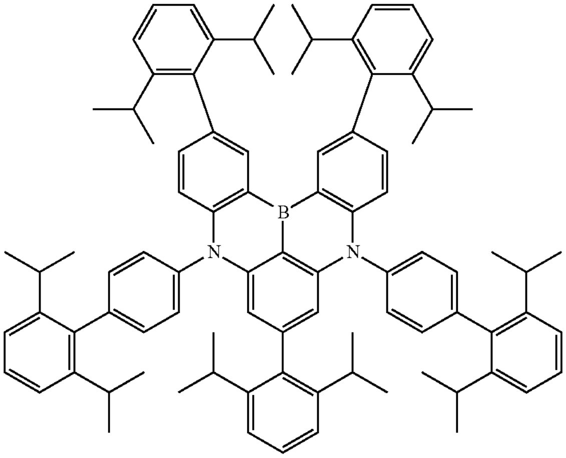

-continued
3
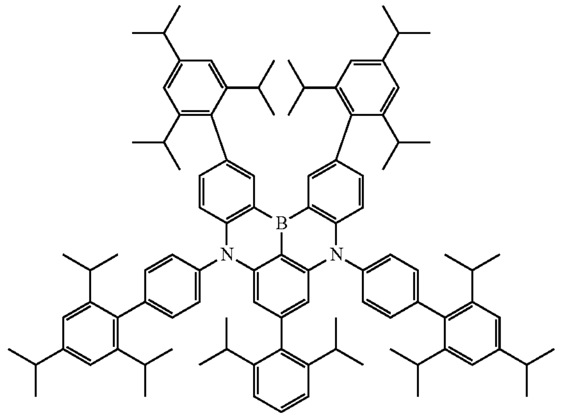
13
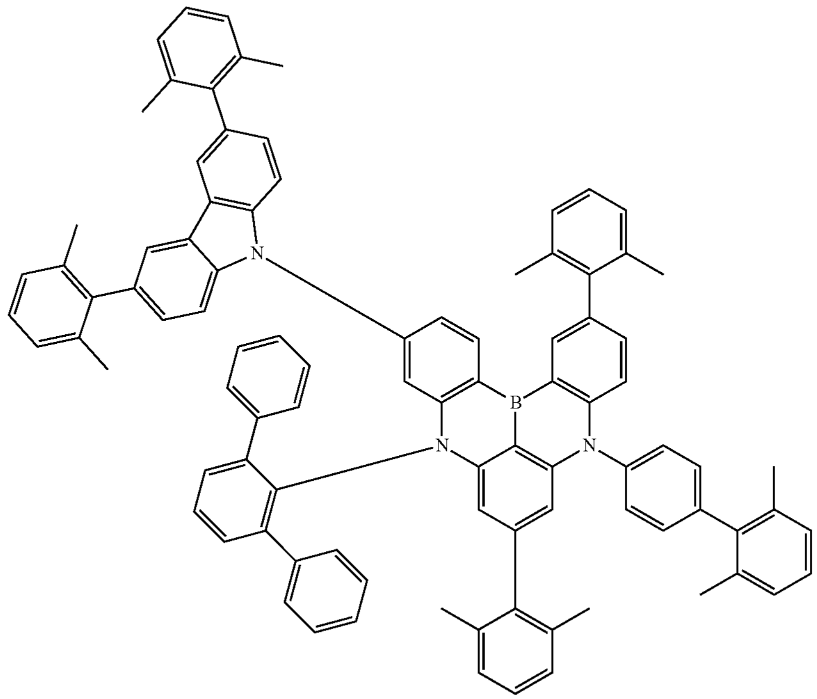

-continued
34
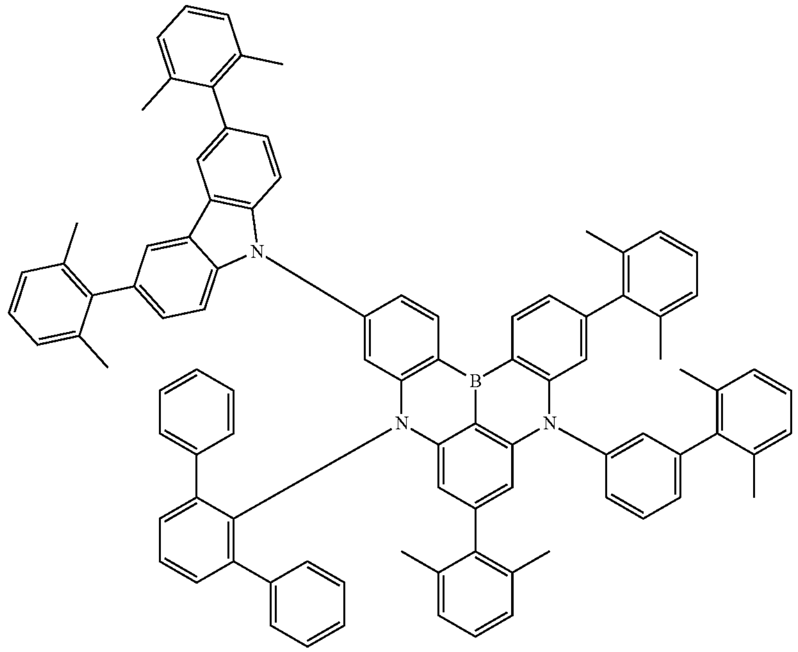
41
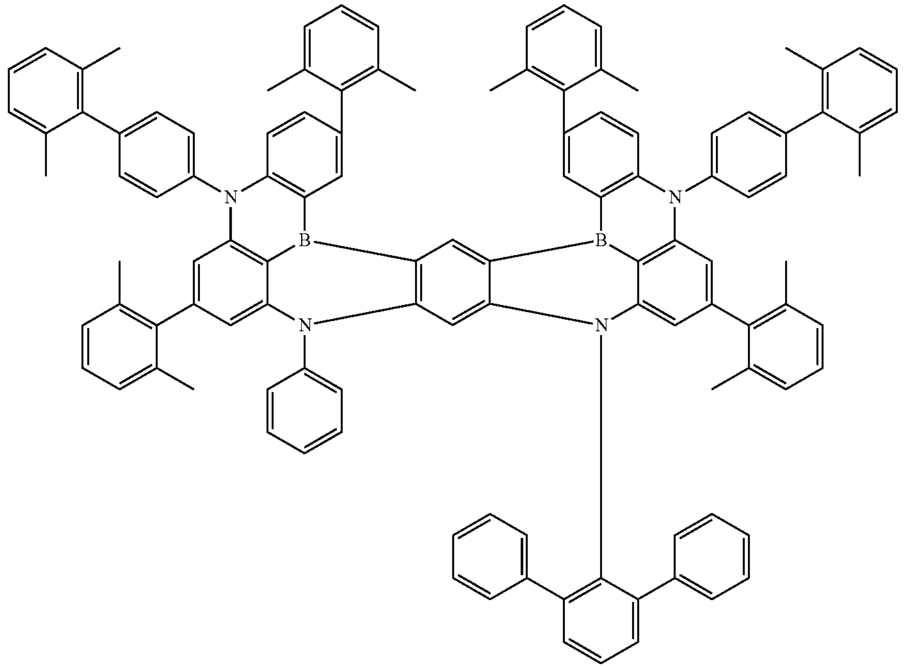

-continued
42
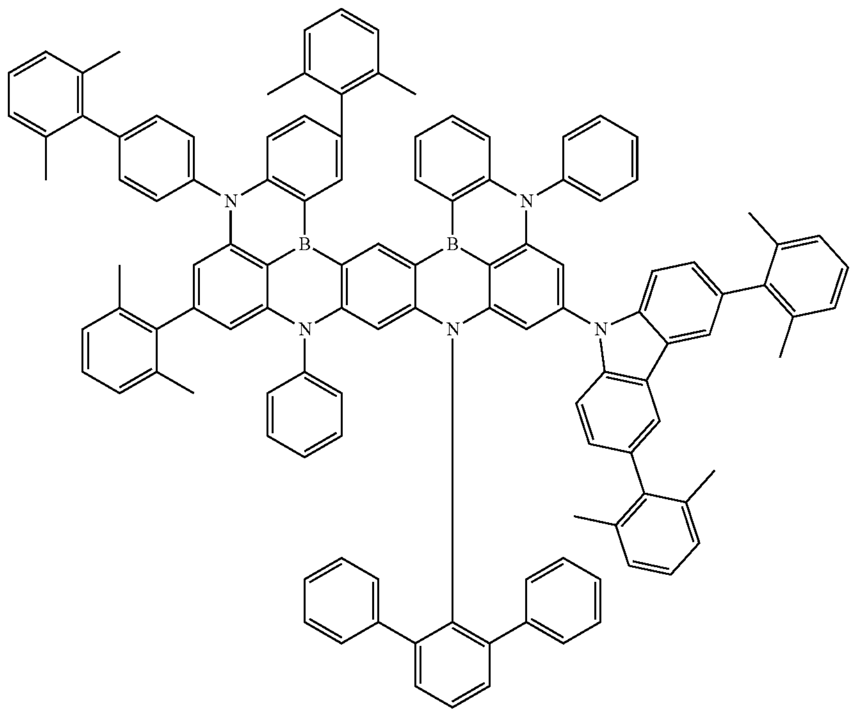
59
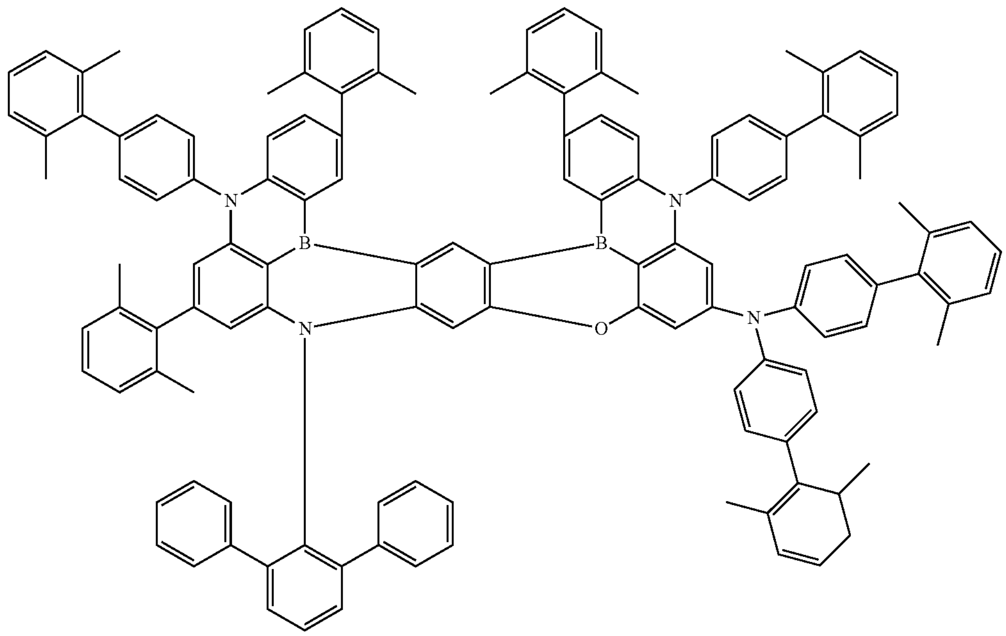

-continued
81
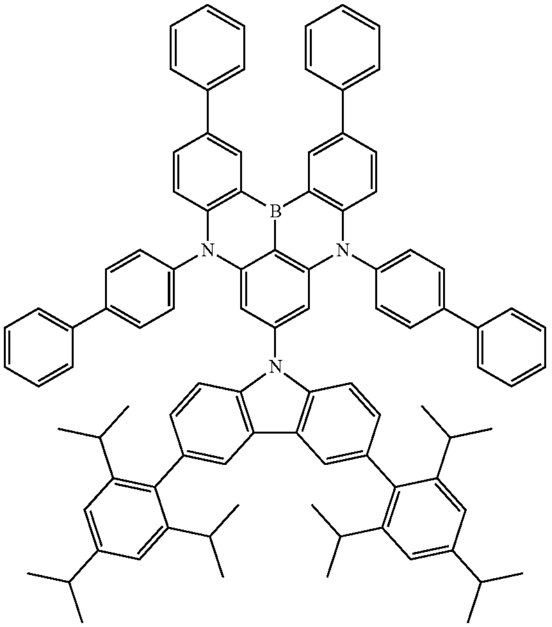
90
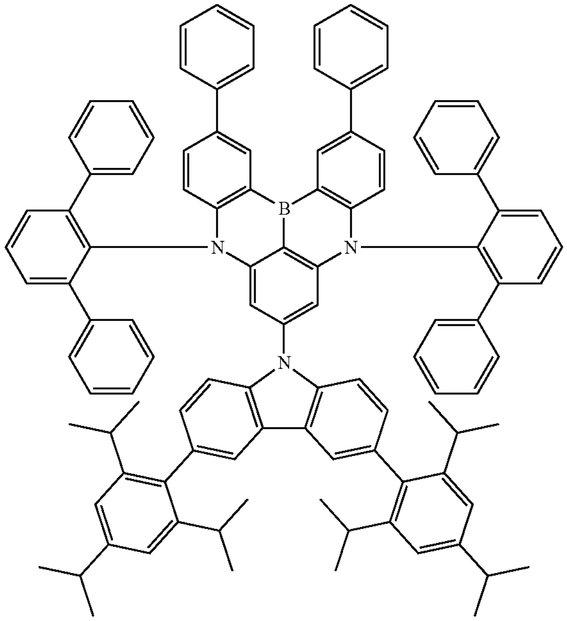
121
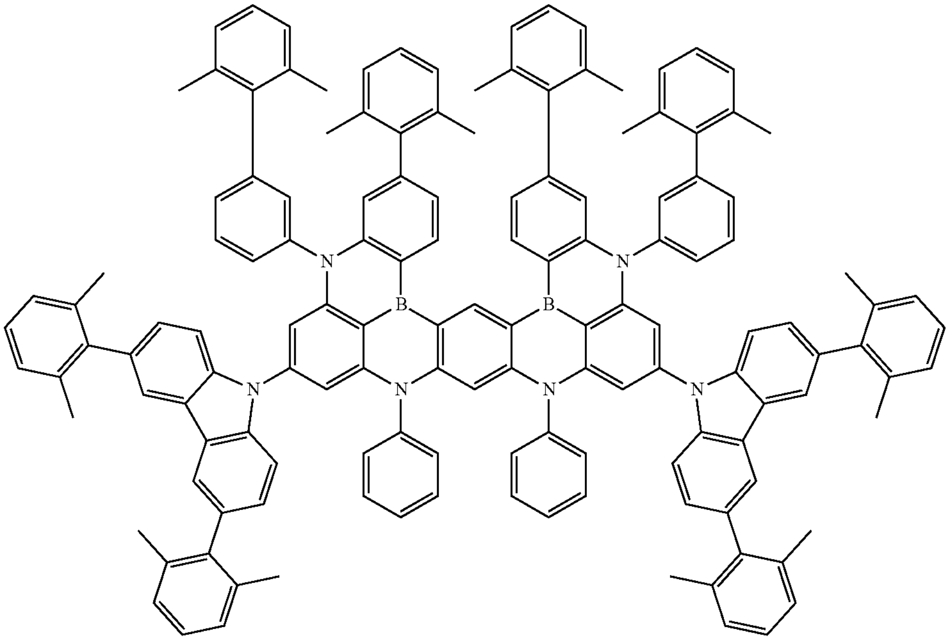
Comparative Example Compounds X1 to X6 below were used to manufacture the devices of Comparative Examples 1 to 6, respectively.

Comparative Example Compounds
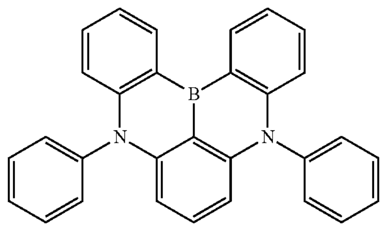
X1
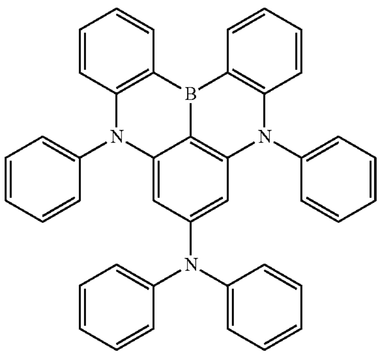
X2
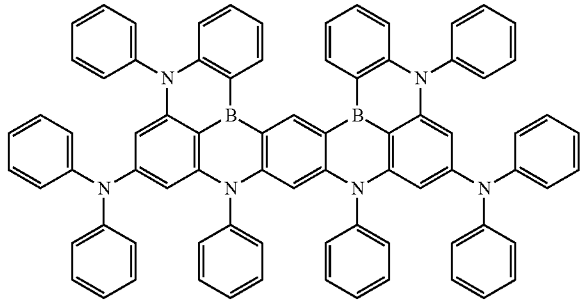
X3
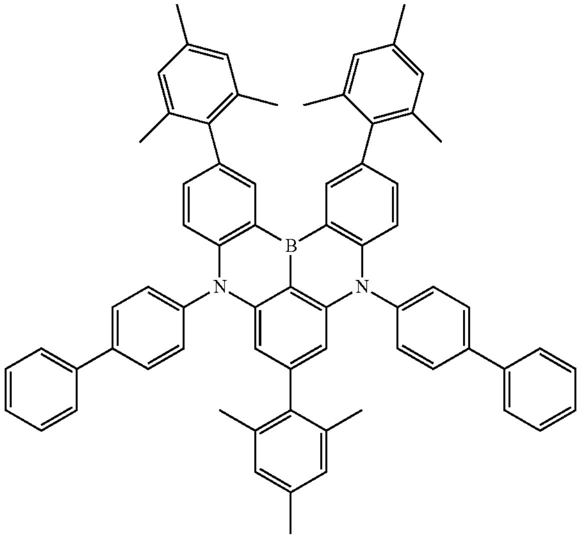
X4
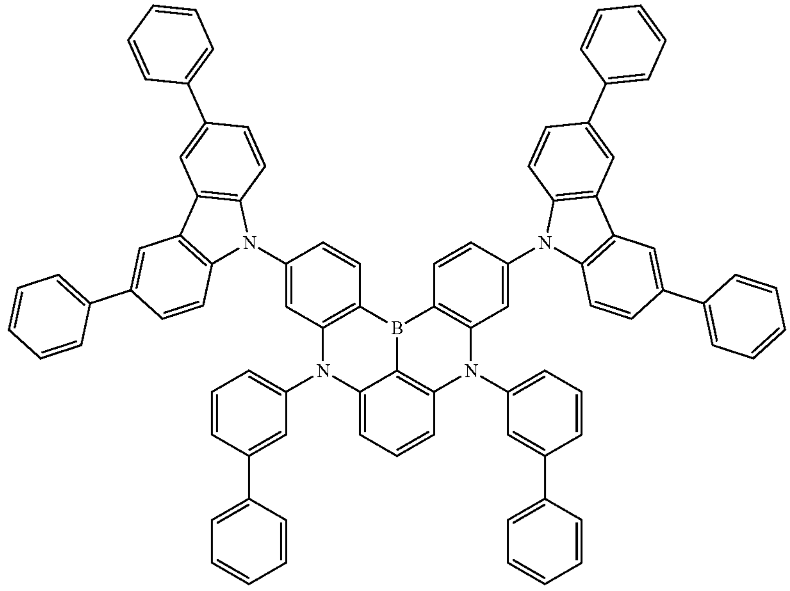
X5

-continued

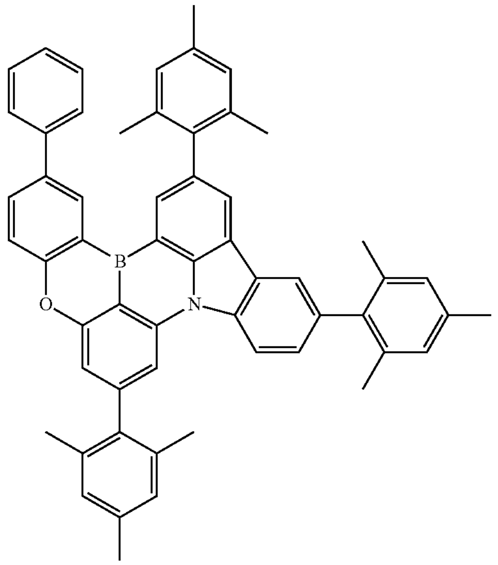

X6

The light emitting device of an example including the fused polycyclic compound of an example in an emission layer was manufactured as follows. Examples 1 to 11 correspond to the light emitting devices manufactured by using Example Compounds 1, 2, 3, 13, 34, 41, 42, 59, 81, 90, and 121 as described above as a luminescent material, respectively. Comparative Examples 1 to 6 correspond to the light emitting devices manufactured by using Comparative Example Compounds X1 to X6 as a luminescent material, respectively.

ITO was used to form a 150 nm-thick first electrode, dipyrazino[2,3-f: 2',3'-h]quinoxaline-2,3,6,7,10,11-hexacarbonitrile (HATCN) was used to form a 10 nm-thick hole injection layer on the first electrode, N,N'-Di(1-naphthyl)-N,N'-diphenyl-(1,1'-biphenyl)-4,4'-diamine (NPD) was used to form a 80 nm-thick hole transport layer on the hole injection layer, 1,3-bis(N-carbazolyl)benzene (mCP) was used to form a 5 nm-thick emission auxiliary layer on the hole transport layer, Example Compound or Comparative Example Compound was doped by 1% to 3,3'-di(9H-carbazol-9-yl)1,1'-biphenyl (mCBP) to form a 20 nm-thick emission layer on the emission auxiliary layer, 2,2',2"-(1,3,5-benzinetriyl)-tris(1-phenyl-1-H-benzimidazole) (TPBi) was used to form a 30 nm-thick electron transport layer on the emission layer, LiF was used to form a 0.5 nm-thick electron injection layer on the electron transport layer, and Al was used to form a 300 nm-thick second electrode on the electron injection layer. Each layer was formed by a deposition method in a vacuum atmosphere.

Compounds used for manufacturing the light emitting devices of Examples and Comparative Examples are disclosed below. Commercial products of the compounds below were subjected to sublimation purification and used to manufacture the devices.

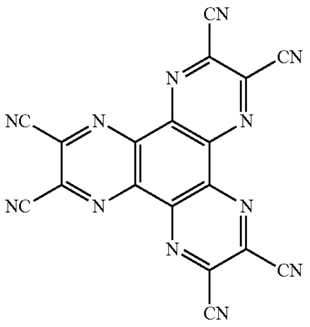

HAT-CN

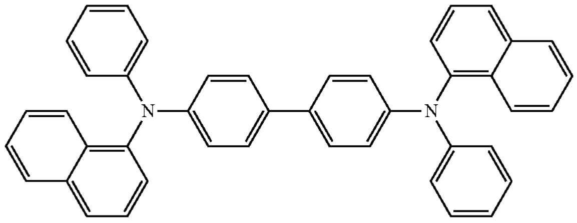

NPD

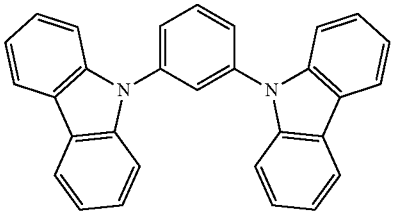

mCP

-continued

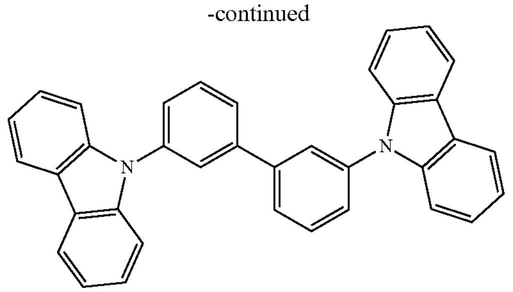

mCBP

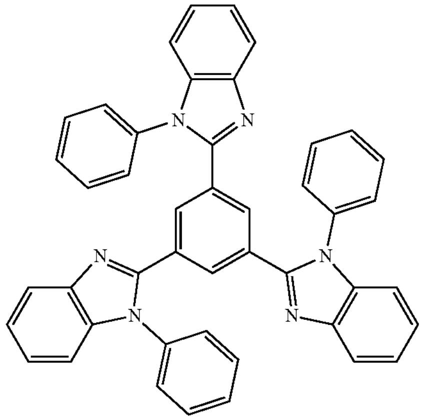

TPBi

Experimental Example

Efficiencies of the devices manufactured with Experimental Example Compounds 1, 2, 3, 13, 34, 41, 42, 59, 81, 90, and 121, and Comparative Example Compounds X1 to X6 as described above were evaluated. The evaluation results are shown in Table 1 below. In the evaluation of the device, current density was evaluated, and luminous efficiencies and device service lives of the light emitting devices were measured at 1,000 cd/m$^2$ and listed. In addition, in the evaluation of the device, the maximum luminescence wavelength of luminescence spectrum is expressed as λmax. LT50 represents a relative service life value when the half service life of Comparative Example Compound $X_3$ of Comparative Example 3 is 1.

TABLE 1

| Device manufacturing examples | Dopant | Luminescence wavelength (λmax, nm) | Delayed fluorescence service life (μS) | Roll-off (%) | LT50 Relative service life |
|---|---|---|---|---|---|
| Example 1 | Example Compound 1 | 457 | 90 | 25.6 | 2.8 |
| Example 2 | Example Compound 2 | 458 | 110 | 27.0 | 3.3 |
| Example 3 | Example Compound 3 | 459 | 120 | 32.0 | 4.2 |
| Example 4 | Example Compound 13 | 458 | 80 | 21.0 | 4.8 |
| Example 5 | Example Compound 34 | 459 | 85 | 23.0 | 5.2 |
| Example 6 | Example Compound 41 | 460 | 12 | 18.1 | 6.1 |
| Example 7 | Example Compound 42 | 459 | 8.0 | 16.2 | 6.2 |
| Example 8 | Example Compound 59 | 460 | 5.0 | 12.2 | 7.2 |

TABLE 1-continued

| Device manufacturing examples | Dopant | Luminescence wavelength (λmax, nm) | Delayed fluorescence service life (μS) | Roll-off (%) | LT50 Relative service life |
|---|---|---|---|---|---|
| Example 9 | Example Compound 81 | 457 | 50 | 17.2 | 4.2 |
| Example 10 | Example Compound 90 | 458 | 55 | 18.2 | 4.9 |
| Example 11 | Example Compound 121 | 459 | 4.2 | 10.2 | 8.2 |
| Comparative Example 1 | Comparative Example Compound X1 | 457 | 130 | 33.2 | 0.3 |
| Comparative Example 2 | Comparative Example Compound X2 | 446 | 11.2 | 30.5 | 0.2 |
| Comparative Example 3 | Comparative Example Compound X3 | 467 | 5.5 | 13.5 | 1 |
| Comparative Example 4 | Comparative Example Compound X4 | 461 | 125 | 45.3 | 0.28 |
| Comparative Example 5 | Comparative Example Compound X5 | 475 | 15 | 35.2 | 0.55 |
| Comparative Example 6 | Comparative Example Compound X6 | 453 | 105 | 55.8 | 0.17 |

Referring to the results of Table 1, it can be seen that Examples of the light emitting devices in which the fused polycyclic compounds according to examples of the present disclosure are used as a luminescent material have an improvement in device service life compared to Comparative Examples, and the luminescence wavelength is reduced, thereby exhibiting color purity close to neutral blue.

Example Compounds have a wide planar structure in which a plurality of aromatic rings are fused around at least one boron atom and at least two nitrogen atoms, thereby increasing multiple resonance effects and having a low $\Delta E_{ST}$. Accordingly, because reverse intersystem crossing (RISC) from the triplet excited state to the singlet excited state easily occurs, delayed fluorescence characteristics may be enhanced, thereby improving the luminous efficiency.

In addition, Example Compounds may reduce the luminescence wavelength by introducing the first substituent represented by Formula 2 or the second substituent represented by Formula 3 into the fused cyclic core structure, and at the same time, may reduce service life deterioration due to intermolecular interaction, thereby achieving long service lives. For example, Example Compounds include a structure in which the first substituent represented by Formula 2 is essentially linked to a particular ring selected from among the aromatic rings constituting the fused cyclic core, or a structure in which the fused cyclic core contains at least one second substituent represented by Formula 3. Accordingly, Example Compounds have a relatively more twisted structural shape than Comparative Example Compounds due to the steric hindrance effects by the first substituent or the second substituent, and thus, a non-radiative transition due to the intermolecular interaction may be prevented or reduced, thereby further enhancing the luminous efficiencies. In addition, Example Compounds include the first substituent represented by Formula 2 in the fused cyclic core, and thus, the dihedral angle between the plane including the fused cyclic core having the boron atom at the center and the plane including the first substituent may be increased. Accordingly, the effective conjugation lengths of Example Compounds are shortened, and as a result, the luminescence wavelength may be reduced.

It can be seen that the luminescence wavelengths of Examples 1 to 11 are all reduced, and thus, the color purity closer to neutral blue is exhibited.

Comparing Examples 1 to 3 and Comparative Example 1, it can be seen that for Example Compounds 1 to 3, the first substituent represented by Formula 2 is substituted at the fused cyclic skeleton structure of Comparative Example 1, but the luminescence wavelengths are not increased compared to Comparative Example 1. In general, the substitution of a substituent causes the luminescence wavelength to deviate toward a long wavelength, but it can be seen that the fused polycyclic compound according to embodiments of the present disclosure has an improvement in service life characteristics by introducing a bulky substituent, and also prevents or reduces increases of the luminescence wavelength.

It can be seen that Examples 1 to 11 has a low roll-off value in proportion to the luminescence service life, and triplet-triplet annihilation (TTA) and singlet-triplet annihilation (STA) are prevented.

Comparing Examples 1 to 3 with Comparative Example 1, it can be seen that Example Compounds 1 to Example Compounds 3 in which the first substituent represented by Formula 2 is introduced into the fused cyclic core have an increase in the relative service life at least 10-fold over Comparative Example Compound X1.

Referring to Comparative Example 4, it can be seen that Comparative Example Compound X4 includes a bulky substituent as Example Compounds, but has a relative service life of 0.28, which is almost unchanged compared to the relative service life of Comparative Example 1. It is believed that Comparative Example Compound X4 does not include a bulky substituent at the aryl group moiety which is a terminal substituent linked to the nitrogen atom, and thus, the service life characteristics are reduced compared to Example Compounds. On the other hand, it can be seen that like Example Compound 3, the first substituent represented by Formula 2 is introduced into the terminal substituent linked to the nitrogen atom, and thus, the relative service life of the device is 4.2, which is largely increased compared to the relative service life of Comparative Example 1. Like the fused polycyclic compound of an embodiment of the present disclosure, when the first substituent is essentially substituted at a particular position of the fused cyclic core, it is possible to effectively improve the service life. In addition, when a substituent having at least three carbon atoms is contained in the structure of the first substituent represented by Formula 2, it is expected to largely improve the service life.

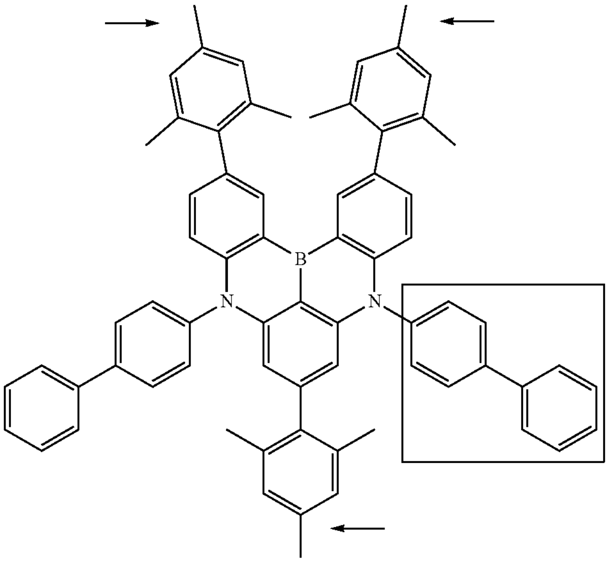

X4

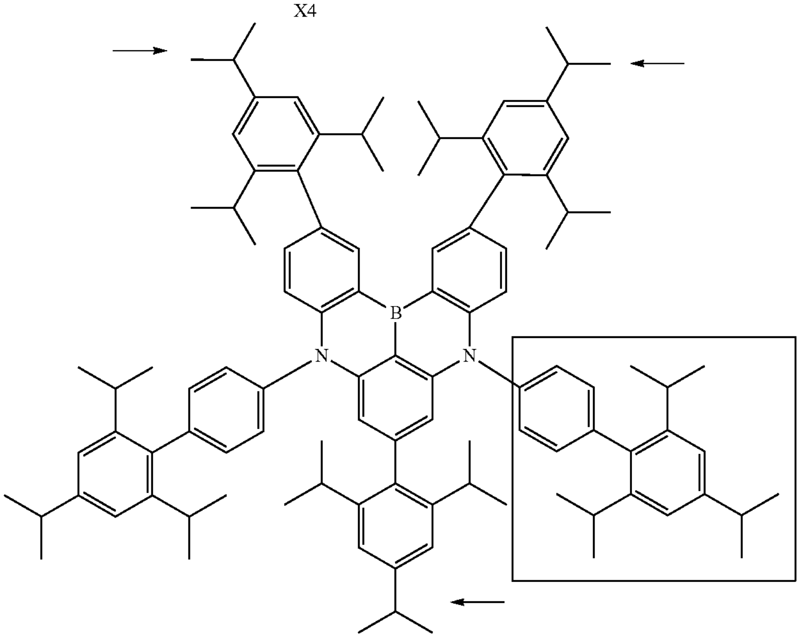

3

Comparing Examples 4, 5, 9 and 10 with Comparative Example 2, it can be seen that the relative service life of Comparative Example 2 is 0.2, the service life of which is significantly reduced. While the present disclosure is not limited by any particular mechanism or theory, it is thought that for Comparative Example Compound X2, a diphenyl amine group having an electron donor property is introduced, as a donor, into the fused cyclic core, and thus, the luminescence wavelength is reduced, but because a bulky substituent is not contained, the interaction between dopants or between a dopant and a host increases, and thus, the relative service life is largely reduced.

Comparing Examples 4, 5, 9, and 10 with Comparative Example 5, Examples 4, 5, 9, and 10 all have a luminescence wavelength of about 460 nm, and exhibit color purity closer to neutral blue, but for Comparative Example 5, although a carbazole group is substituted as a donor, the luminescence wavelength is largely increased to be 475 nm. While the present disclosure is not limited by any particular mechanism or theory, it is thought that for Comparative Example X5, the conjugation is elongated to the phenyl group substituted at the carbazole group, and thus, the luminescence wavelength is increased. On the other hand, it can be seen that for Example Compounds 13, 34, 81, and 90, the first substituent is linked to the carbazole group, which results in the carbazole group and the first substituent being twisted and linked, and thus, the elongation of conjugation is reduced, thereby suppressing or reducing an increase of the luminescence wavelength.

substituent in the planar skeleton, and thus, the relative service life of Comparative Example 3 is reduced.

Comparing Example 1 with Comparative Example 6, it can be seen that Comparative Example Compound X6 contained in Comparative Example 6 includes a structure in which three aromatic rings are fused around one boron atom, and includes a bulky substituent in the fused cyclic core, but the relative service life is 0.17, which is significantly reduced compared to Comparative Examples 1 to 5. While

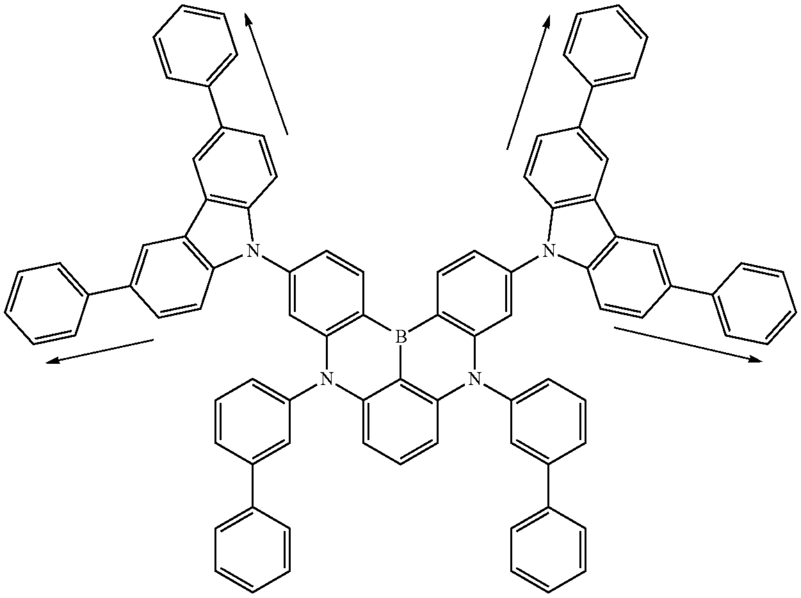

X5

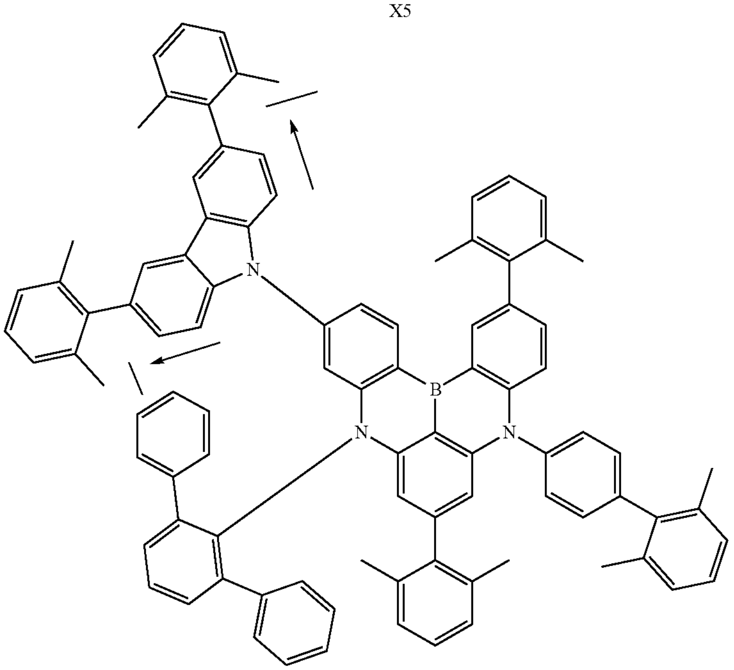

13

Comparing Examples 6, 7, 8, and 11 with Comparative Example 3, it can be seen that Comparative Example Compound X3 contained in Comparative Example 3 includes a wide planar skeleton structure having two boron atoms at the center thereof, but does not include a bulky steric hindrance the present disclosure is not limited by any particular mechanism or theory, it is believed that Comparative Example Compound X6 does not essentially include two nitrogen atoms as two constituent atoms in the fused cycle, and two benzene rings, to which bulky substituents are linked, are linked to each other, and thus, Comparative Example Compound X6 has an increase in the roll-off and a significant decrease in the relative service life compared to Examples.

The light emitting device of an embodiment may exhibit improved device characteristics with high efficiency and a long service life.

The fused polycyclic compound of an embodiment may be included in an emission layer of the light emitting device to contribute to high efficiency and a long service life of the organic electroluminescence device.

Although the subject matter of the present disclosure has been described with reference to example embodiments of the present disclosure, it will be understood that the present disclosure should not be limited to the disclosed embodiments but various suitable changes and modifications can be made by those skilled in the art without departing from the spirit and scope of the present disclosure.

Accordingly, the technical scope of the present disclosure is not intended to be limited to the contents set forth in the detailed description of the present specification, but is intended to be defined by the appended claims, and equivalents thereof.

What is claimed is:

1. A light emitting device comprising:

a first electrode;

a second electrode facing the first electrode; and an emission layer between the first electrode and the second electrode, wherein the emission layer comprises a host and a dopant, and wherein the host comprises a compound represented by Formula E-2a or Formula E-2b, and the dopant comprises a fused polycyclic compound represented by Formula 1:

Formula 1

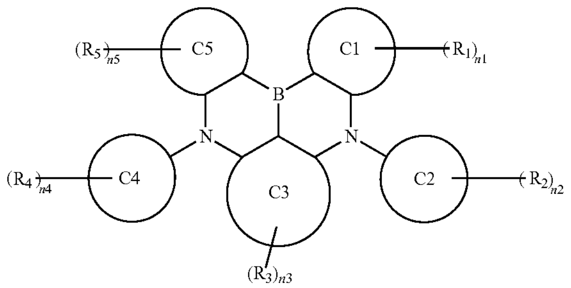

wherein, in Formula 1,

C1, C2, C4, and C5 are each independently a monocyclic aromatic hydrocarbon ring having 6 ring-forming carbon atoms, or a monocyclic aromatic heterocycle having 2 to 5 ring-forming carbon atoms, C3 is a monocyclic aromatic hydrocarbon ring having 6 ring-forming carbon atoms, or a monocyclic aromatic heterocycle having 3 to 5 ring-forming carbon atoms, $R_1$ to $R_5$ are each independently a hydrogen atom, a deuterium atom, a halogen atom, a substituted or unsubstituted boron group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or are bonded to an adjacent group to form a ring, or a substituent represented by Formula 2, or a substituent represented by Formula 3, $R_1$ to $R_3$ are all represented by Formula 2, or at least one selected from among $R_1$ to $R_5$ is represented by Formula 3, n1 and n5 are each independently an integer of 1 to 4, n2 and n4 are each independently an integer of 1 to 5, and n3 is an integer of 1 to 3, Formula 2

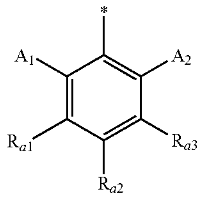

wherein, in Formula 2, $A_1$ and $A_2$ are each independently an alkyl group having 1 to 20 carbon atoms, and $R_{a1}$ to $R_{a3}$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, Formula 3

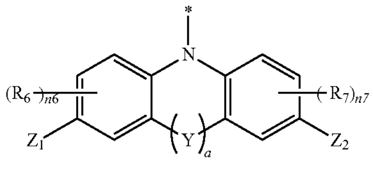

wherein, in Formula 3, a is 0 or 1, when a is 1, Y is a direct linkage, $Z_1$ and $Z_2$ are each independently represented by Formula 2, $R_6$ and $R_7$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and n6 and n7 are each independently an integer of 0 to 4, Formula E-2a

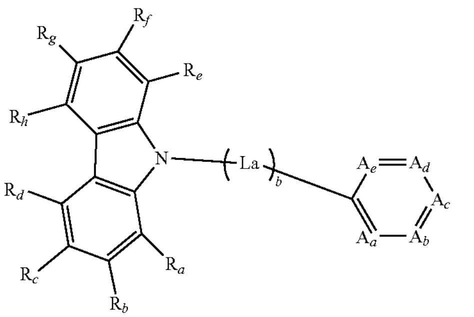

Formula E-2b

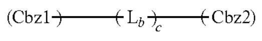

wherein, in Formula E-2a, b is an integer of 0 to 10, $L_a$ is a direct linkage, a substituted or unsubstituted arylene group having 6 to 30 ring-forming carbon atoms, or a substituted or unsubstituted heteroarylene group having 2 to 30 ring-forming carbon atoms, $A_a$ to $A_e$ are each independently N or CRi, $R_a$ to $R_i$ are each independently a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, and two or three selected from among $A_a$ to $A_e$ are N, and the others are $CR_i$, and wherein, in Formula E-2b, Cbz1 and Cbz2 are each independently an unsubstituted carbazole group, or a carbazole group substituted with an aryl group having 6 to 30 ring-forming carbon atoms, $L_b$ is a direct linkage, a substituted or unsubstituted arylene group having 6 to 30 ring-forming carbon atoms, or a substituted or unsubstituted heteroarylene group having 2 to 30 ring-forming carbon atoms, and c is an integer of 0 to 10.

2. The light emitting device of claim 1, wherein the emission layer emits delayed fluorescence.

3. The light emitting device of claim 1, wherein the emission layer emits light having a luminescence center wavelength of about 430 nm to about 490 nm.

4. The light emitting device of claim 1, wherein the fused polycyclic compound represented by Formula 1 is represented by Formula 1-1:

Formula 1-1

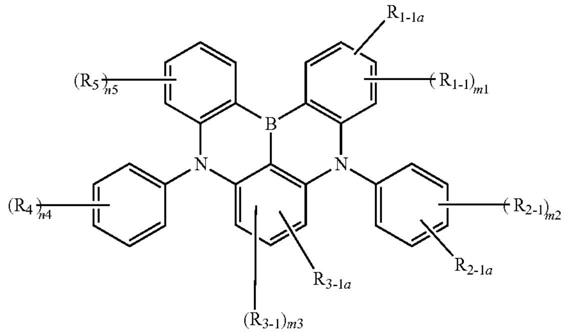

wherein, in Formula 1-1, $R_{1-1}$ to $R_{3-1}$ are each independently a hydrogen atom, a deuterium atom, a halogen atom, a substituted or unsubstituted alkyl group having 1 to 20 carbon group, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, $R_{1-1a}$ to $R_{3-1a}$ are each independently represented by Formula 2, m1 is an integer of 0 to 3, m2 is an integer of 0 to 4, m3 is an integer of 0 to 2, and $R_4$, $R_5$, n4, and n5 are the same as defined with respect to Formula 1.

5. The light emitting device of claim 4, wherein the fused polycyclic compound represented by Formula 1-1 is represented by Formula 1-2-1 or Formula 1-2-2:

Formula 1-2-1

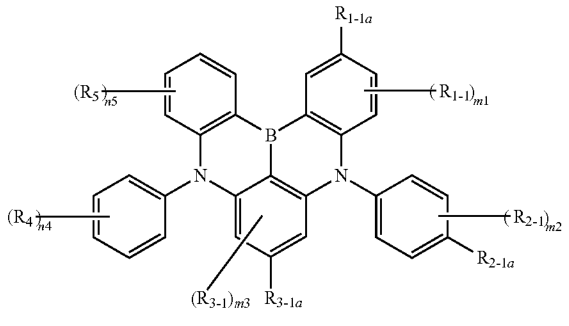

Formula 1-2-2

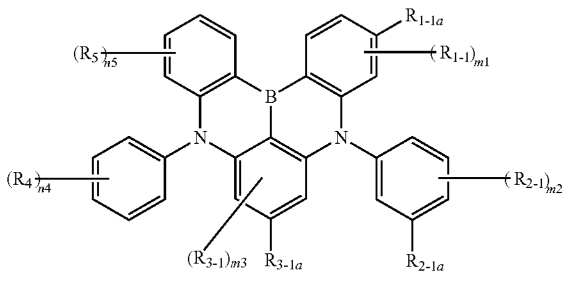

wherein, in Formula 1-2-1 and Formula 1-2-2, $R_{1-1}$ to $R_{3-1}$, $R_{1-1a}$ to $R_{3-1a}$, m1 to m3, $R_4$, $R_5$, n4, and n5 are the same as defined with respect to Formula 1 and Formula 1-1.

6. The light emitting device of claim 4, wherein the fused polycyclic compound represented by Formula 1 is represented by Formula 1-3-1 or Formula 1-3-2:

Formula 1-3-1

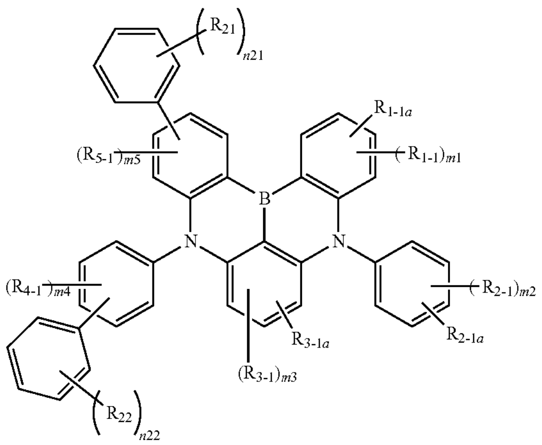

Formula 1-3-2

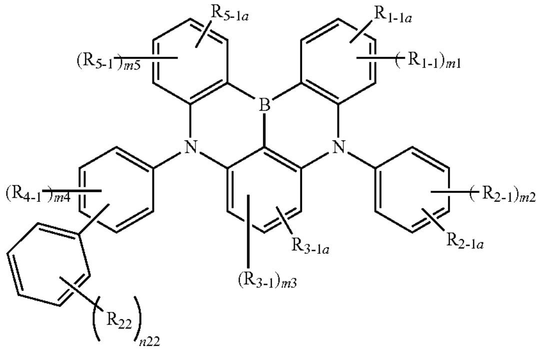

wherein, in Formula 1-3-1 and Formula 1-3-2, $R_{4-1}$ and $R_{5-1}$ are each independently a hydrogen atom, a deuterium atom, a halogen atom, a substituted or unsubstituted amine, a substituted or unsubstituted alkyl group having 1 to 20 carbon group, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, $R_{5-1a}$ is represented by Formula 3, $R_{21}$ and $R_{22}$ are each independently a hydrogen atom, a deuterium atom, a halogen atom, a substituted or unsubstituted alkyl group having 1 to 20 carbon group, a substituted or unsubstituted aryl group having 6 to 30 ring-forming carbon atoms, or a substituted or unsubstituted heteroaryl group having 2 to 30 ring-forming carbon atoms, m4 is an integer of 0 to 4, m5 is an integer of 0 to 3, n21 and n22 are each independently an integer of 0 to 5, and $R_{1-1}$ to $R_{3-1}$, $R_{1-1a}$ to $R_{3-1a}$, and m1 to m3 are the same as defined with respect to Formula 1 and Formula 1-1.

7. The light emitting device of claim 1, wherein the substituent represented by Formula 2 is represented by Formula 2-1 or Formula 2-2:

Formula 2-1

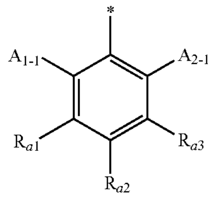

Formula 2-2

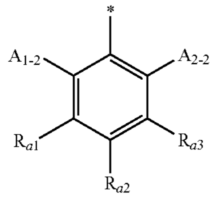

wherein, in Formula 2-1 and Formula 2-2, $A_{1-1}$ and $A_{2-1}$ are each independently a substituted or unsubstituted alkyl group having 1 to 10 carbon atoms, $A_{1-2}$, $A_{2-2}$, and $A_3$ are each independently a substituted or unsubstituted alkyl group having 3 to 10 carbon atoms, and $R_{a1}$ to $R_{a3}$ are the same as defined with respect to Formula 2.

8. The light emitting device of claim 1, wherein the substituent represented by Formula 3 is represented by Formula 3-1 or Formula 3-2:

Formula 3-1

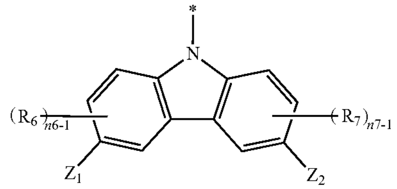

Formula 3-2

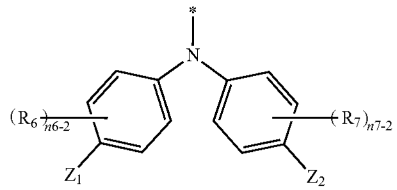

wherein, in Formula 3-1 and Formula 3-2, $n_{6-1}$ and $n_{7-1}$ are each independently an integer of 0 to 3, $n_{6-2}$ and $n_{7-2}$ are each independently an integer of 0 to 4, and $Z_1$, $Z_2$, $R_6$, and $R_7$ are the same as defined with respect to Formula 3.

9. The light emitting device of claim 1, wherein the fused polycyclic compound represented by Formula 1 is represented by Formula 1-4-1 or Formula 1-4-2:

Formula 1-4-1

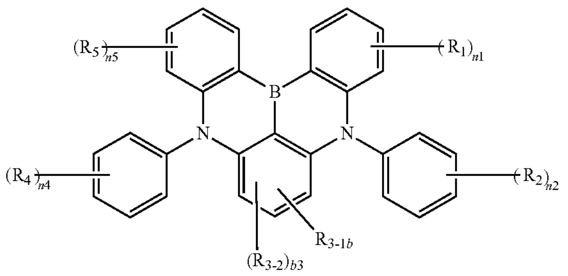

Formula 1-4-2

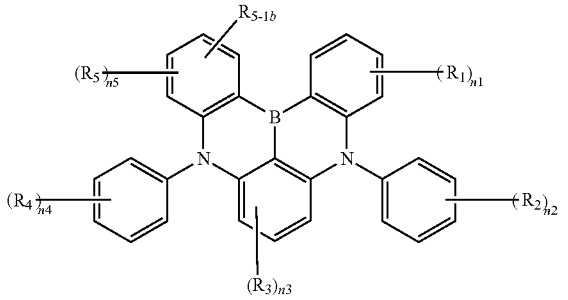

wherein, in Formula 1-4-1 and Formula 1-4-2, $R_{3-2}$ and $R_{5-2}$ are each independently a hydrogen atom, a deuterium atom, a halogen atom, a substituted or unsubstituted alkyl group having 1 to 20 carbon group, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, $R_{3-1b}$ and $R_{5-1b}$ are each independently represented by Formula 3, b3 is an integer of 0 to 2, b5 is an integer of 0 to 3, and $R_1$ to $R_5$, and n1 to n5 are the same as defined with respect to Formula 1.

10. The light emitting device of claim 1, wherein the fused polycyclic compound represented by Formula 1 is represented by Formula 1-5-1 or Formula 1-5-2:

Formula 1-5-1

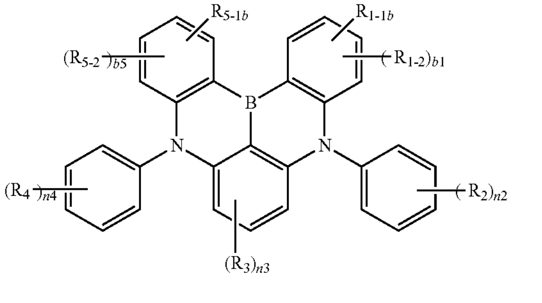

-continued

Formula 1-5-2

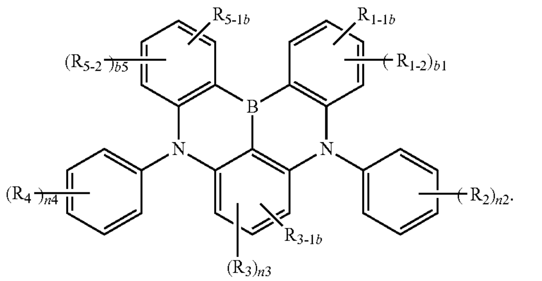

wherein, in Formula 1-5-1 and Formula 1-5-2, $R_{1-2}$, $R_{3-2}$, and $R_{5-2}$ are each independently a hydrogen atom, a deuterium atom, a halogen atom, a substituted or unsubstituted alkyl group having 1 to 20 carbon group, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, $R_{1-1b}$, $R_{3-1b}$ and $R_{5-1b}$ are each independently represented by Formula 3, b1 and b5 are each independently an integer of 0 to 3, b3 is an integer of 0 to 2, and $R_2$ to $R_4$, and n2 to n4 are the same as defined with respect to Formula 1.

11. The light emitting device of claim 1, wherein the fused polycyclic compound represented by Formula 1 is represented by Formula 1-6:

Formula 1-6

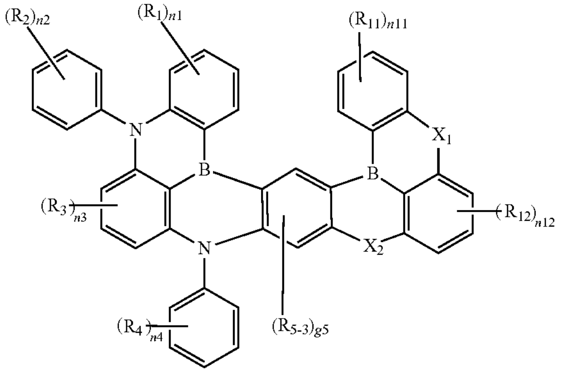

wherein, in Formula 1-6, $X_1$ and $X_2$ are each independently $NR_{13}$ or O, $R_{5-3}$, and $R_{11}$ to $R_{13}$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, a substituted or unsubstituted heteroaryl group of 2 to 30 ring-forming carbon atoms, the substituent represented by Formula 2, or the substituent represented by Formula 3, n11 is an integer of 0 to 4, n12 is an integer of 0 to 3, g5 is an integer of 0 to 2, and $R_1$ to $R_4$, and n1 to n4 are the same as defined with respect to Formula 1.

12. The light emitting device of claim 11, wherein the fused polycyclic compound represented by Formula 1-6 is represented by Formula 1-7-1 or Formula 1-7-2:

Formula 1-7-1

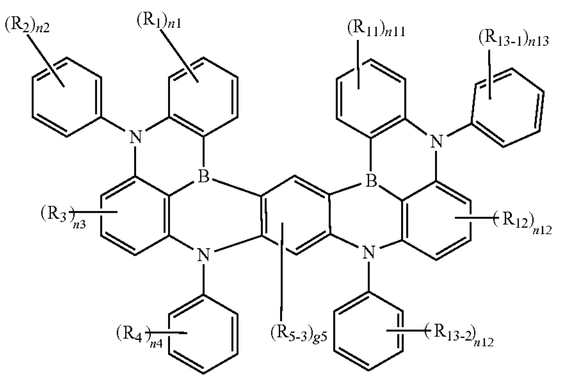

-continued

Formula 1-7-2

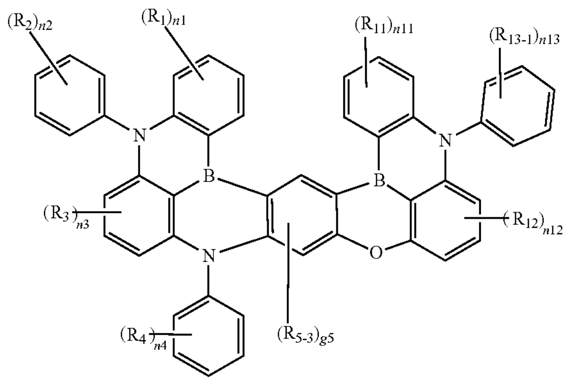

wherein, in Formula 1-7-1 and Formula 1-7-2, $R_{13\text{-}1}$ and $R_{13\text{-}2}$ are each independently a hydrogen atom, a deuterium atom, a halogen atom, a substituted or unsubstituted alkyl group having 1 to 20 carbon group, a substituted or unsubstituted aryl group having 6 to 30 ring-forming carbon atoms, or a substituted or unsubstituted heteroaryl group having 2 to 30 ring-forming carbon atoms, or the substituent represented by Formula 2, n13 and n14 are each independently an integer of 0 to 5, and $R_1$ to $R_4$, $R_{5\text{-}3}$, $R_{11}$ and $R_{12}$, n1 to n4, g5, n11, and n12 are the same as defined with respect to Formula 1 and Formula 1-6.

13. The light emitting device of claim 1, wherein the fused polycyclic compound represented by Formula 1 is represented by one selected from among compounds in Compound Group 1:

Compound Group 1

1

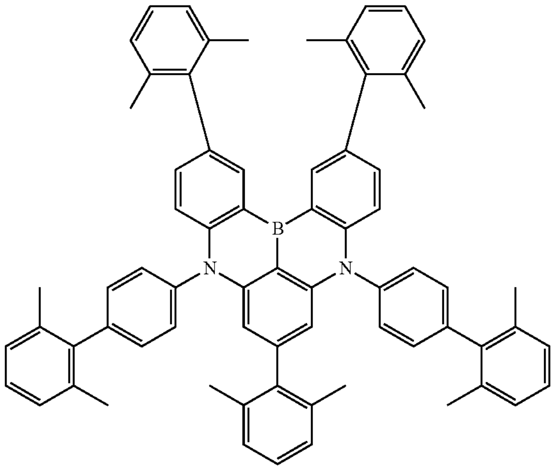

2

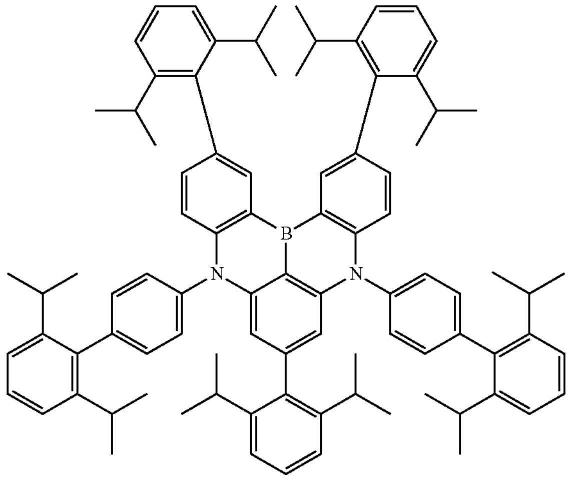

-continued
3
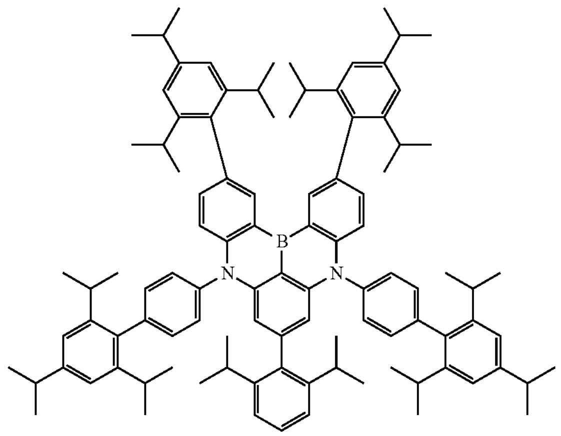
4
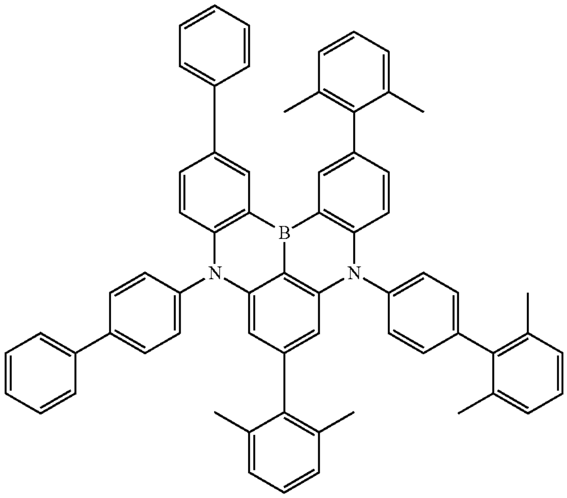
5
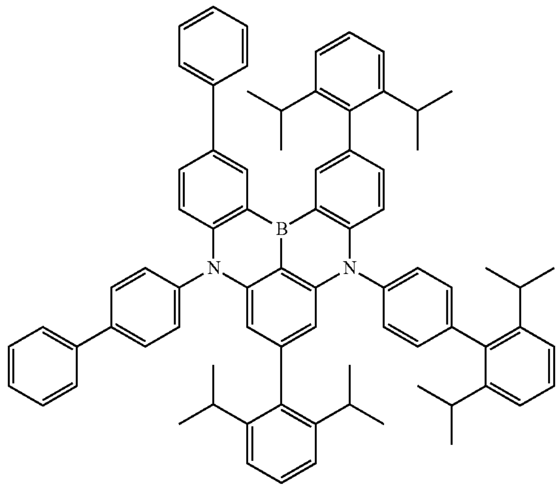
6
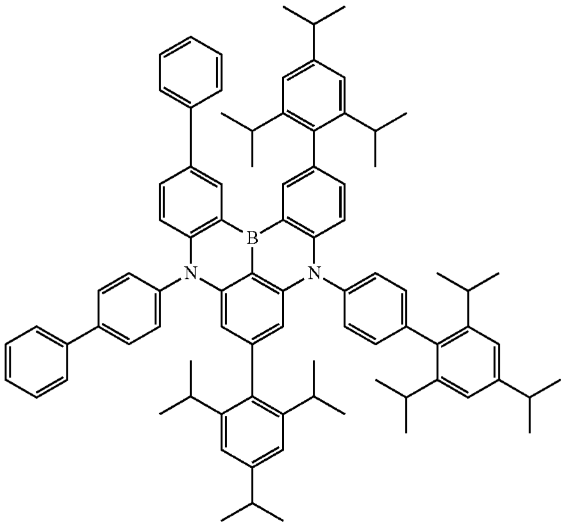
7
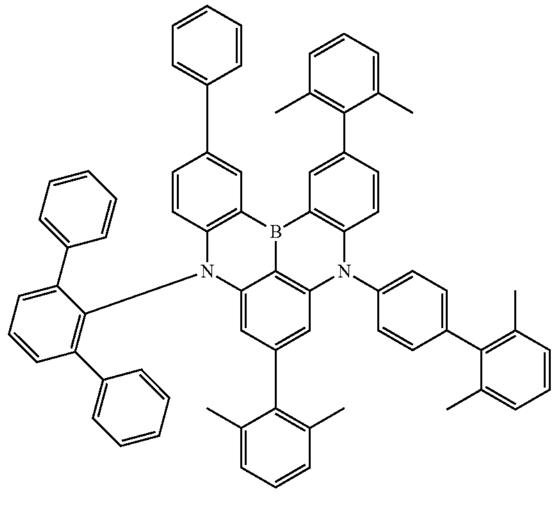
8
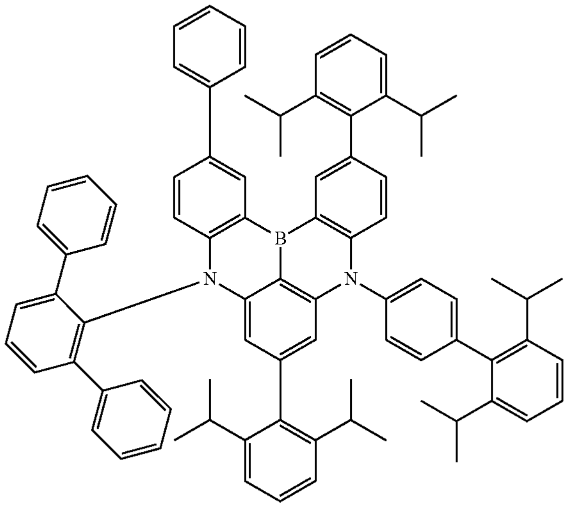

-continued
9
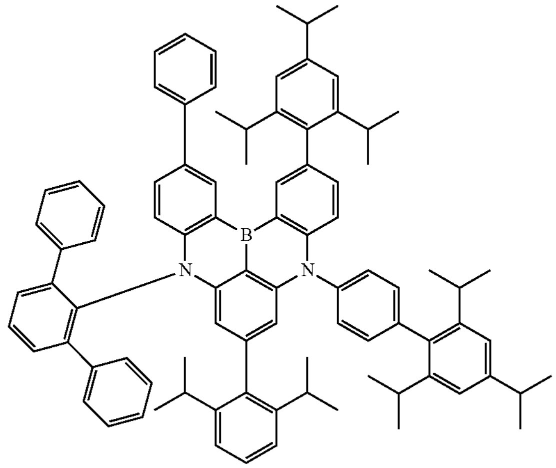
10
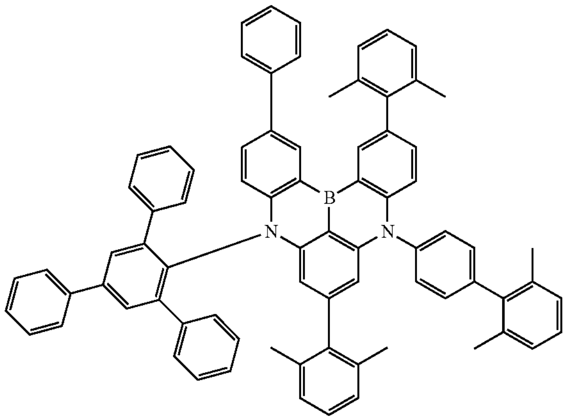
11
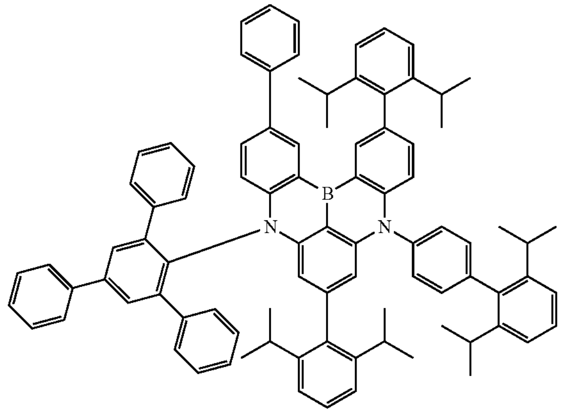
12
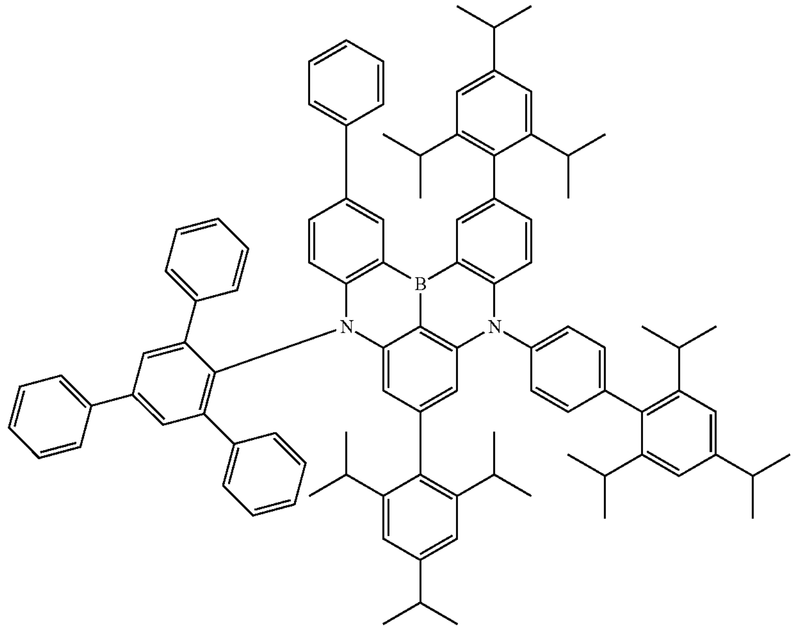

-continued
13
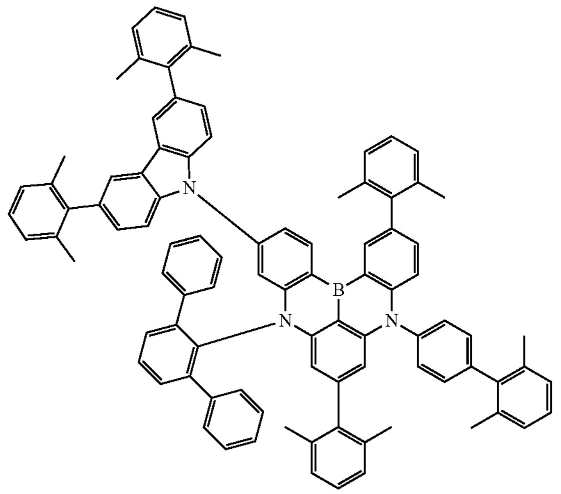
14
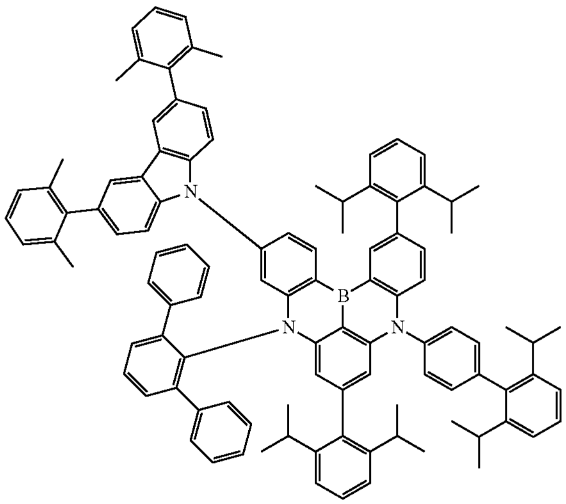
15
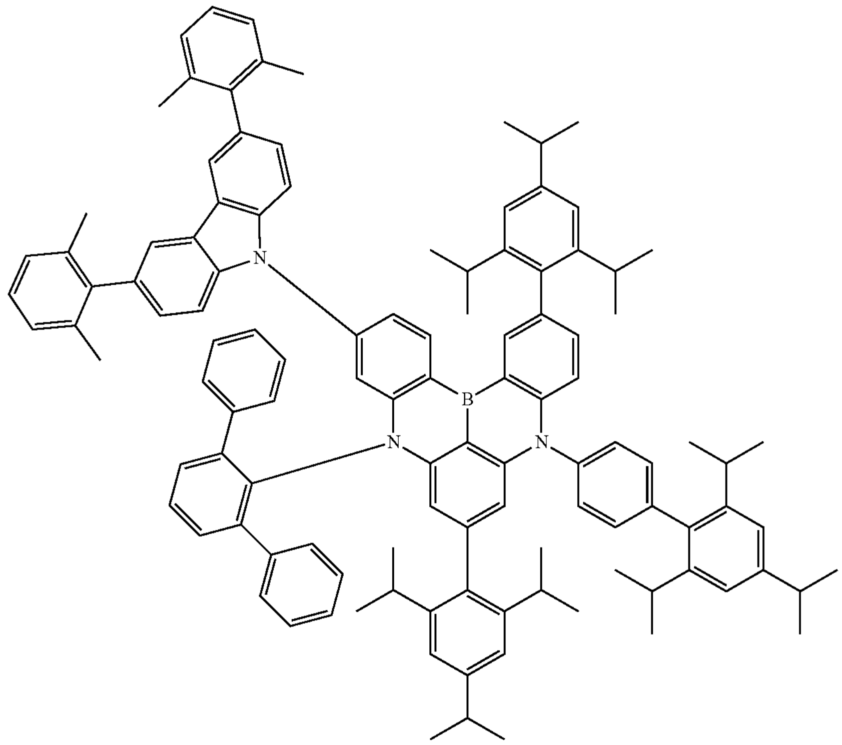

-continued
16
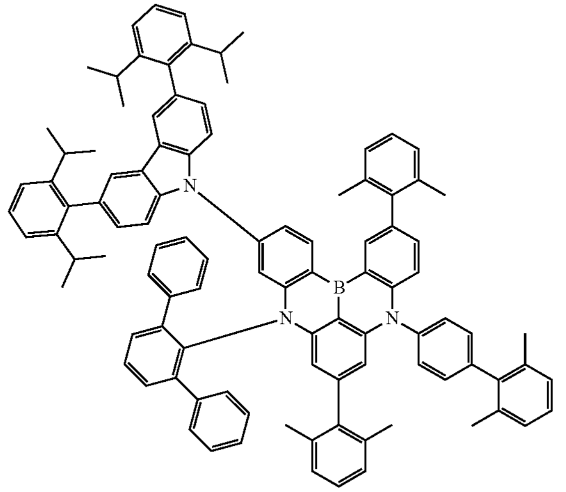
17
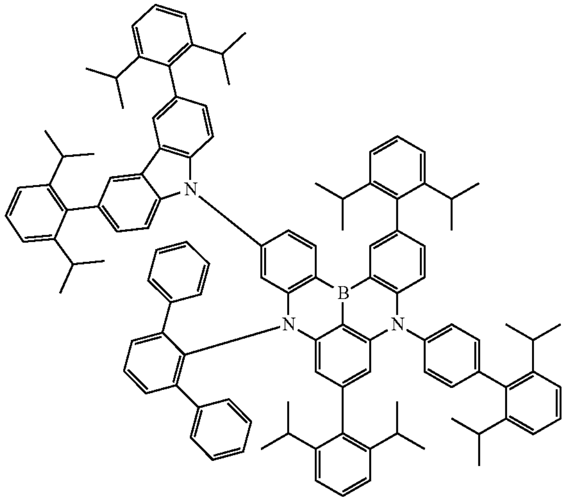
18
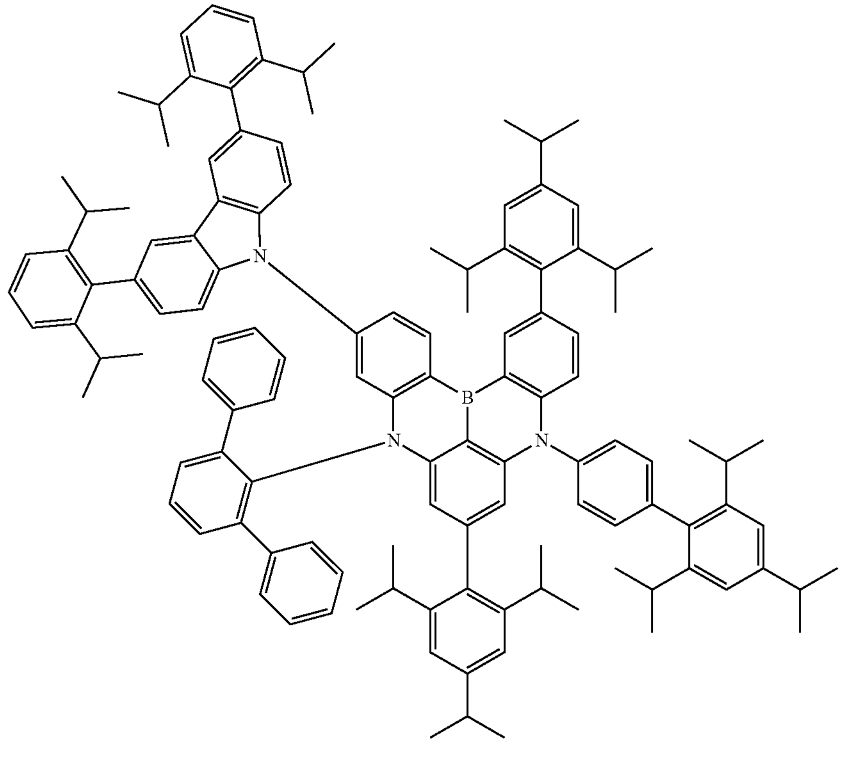

-continued
19
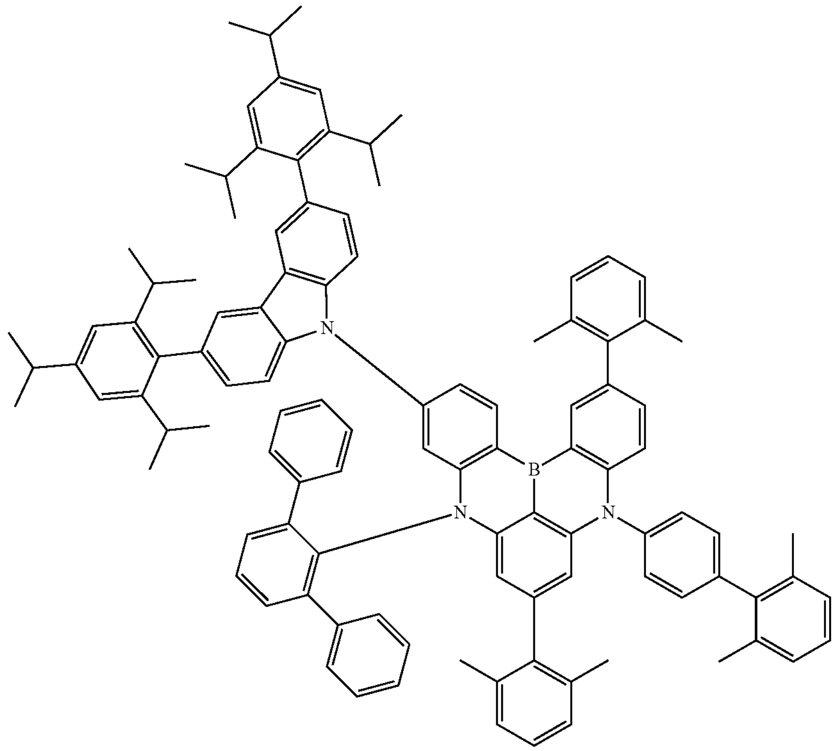
20
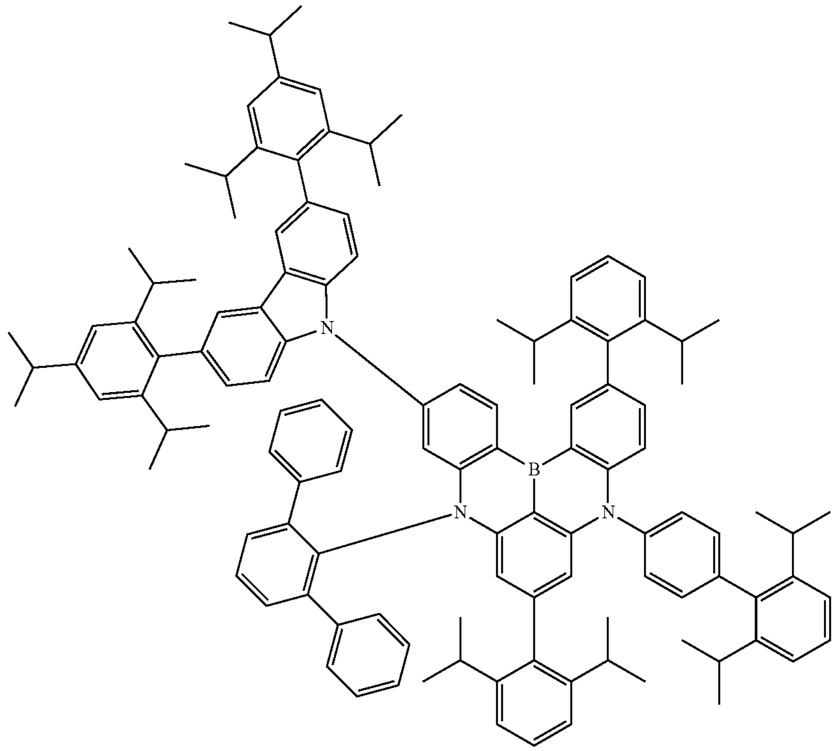

-continued
21
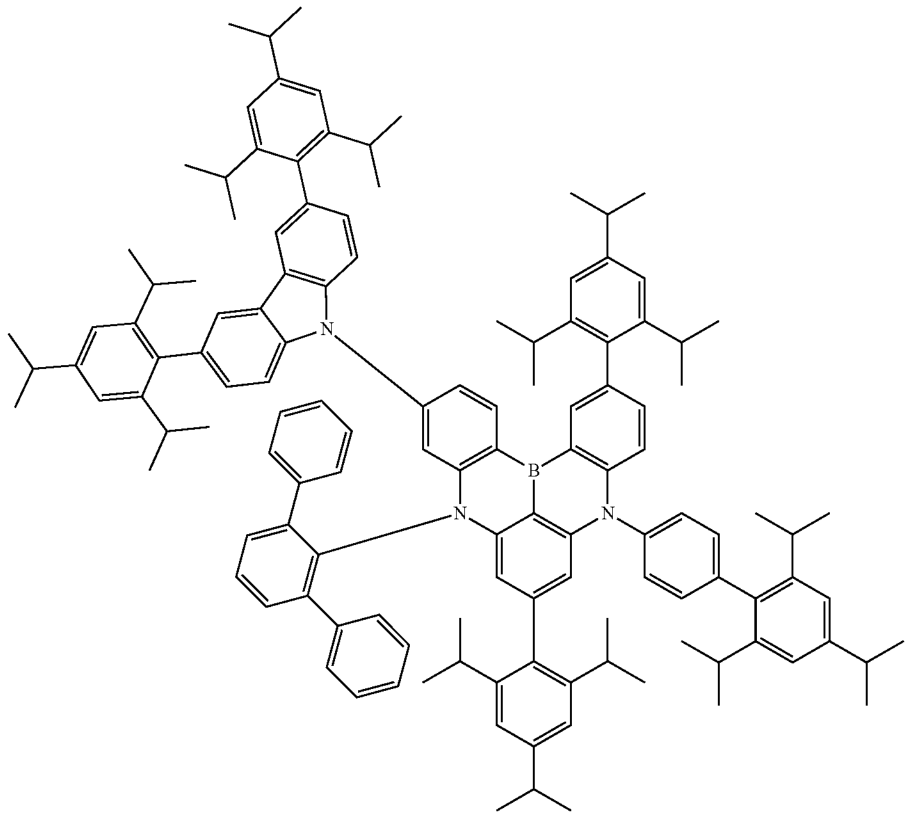
22
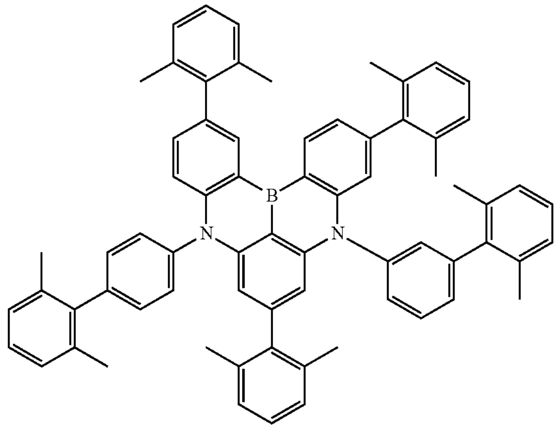
23
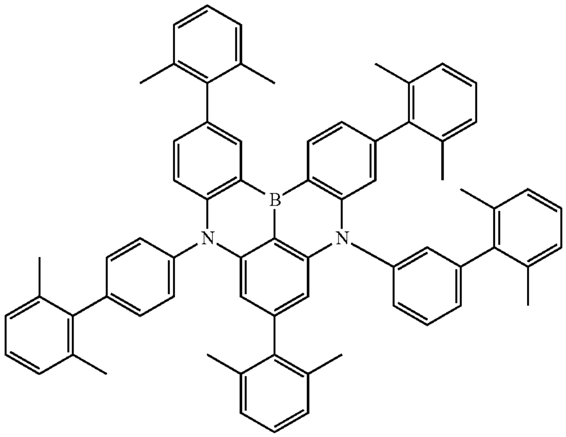

-continued
24
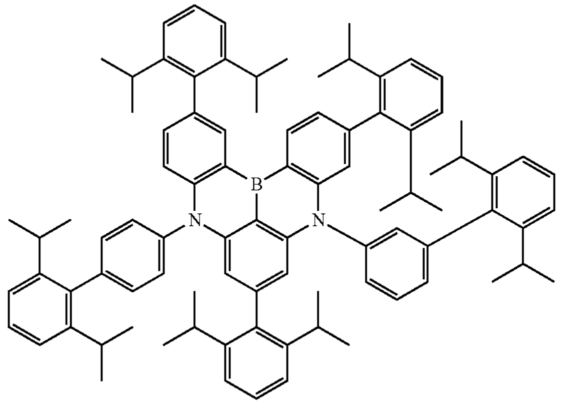
25
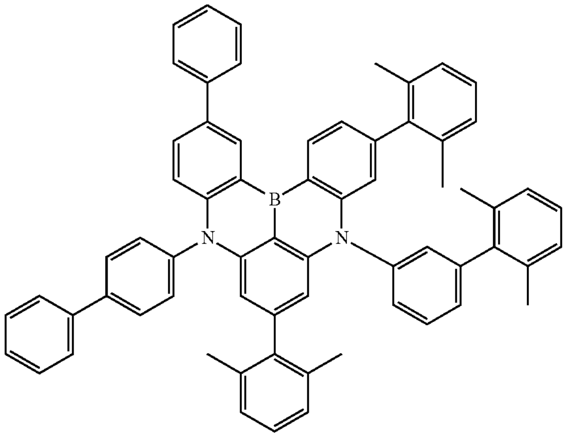
26
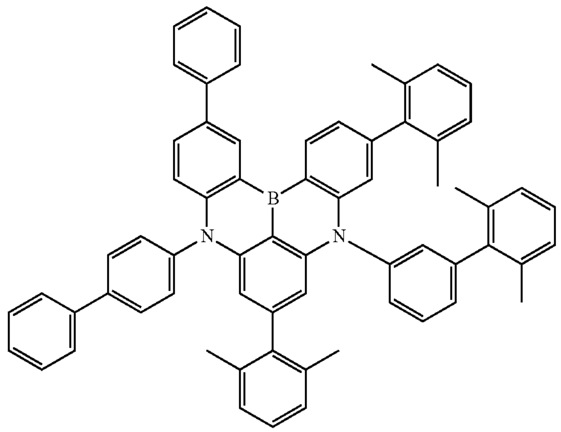
27
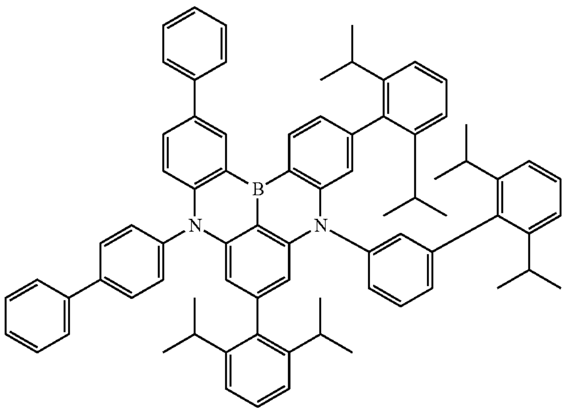
28
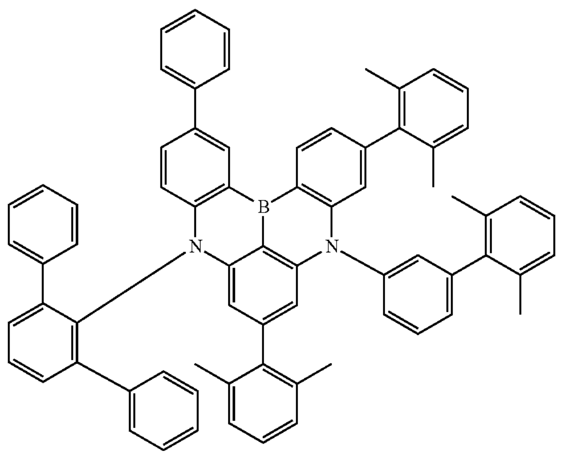
29
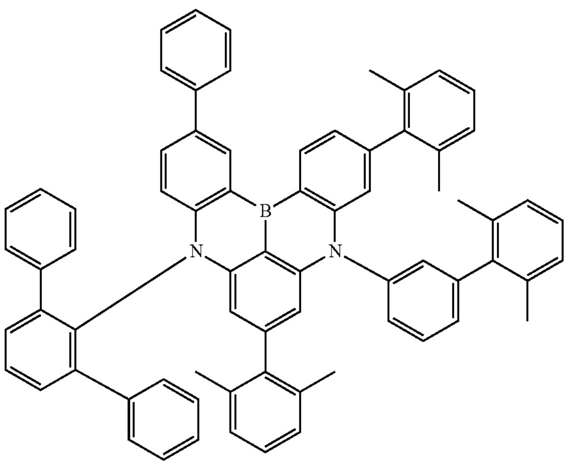

-continued
30
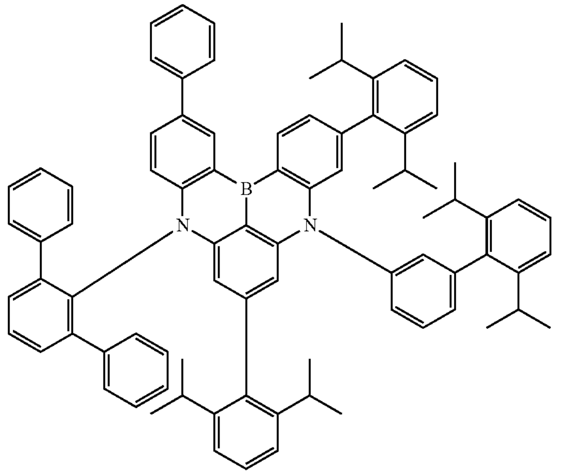
31
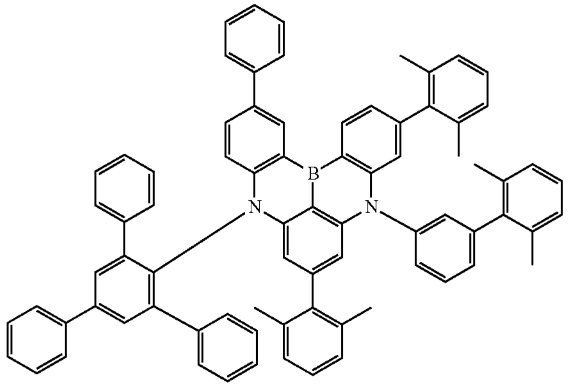
32
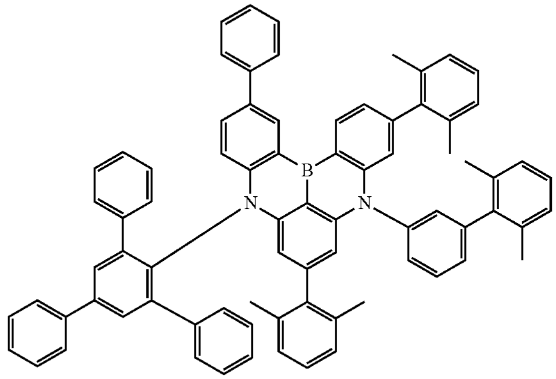
33
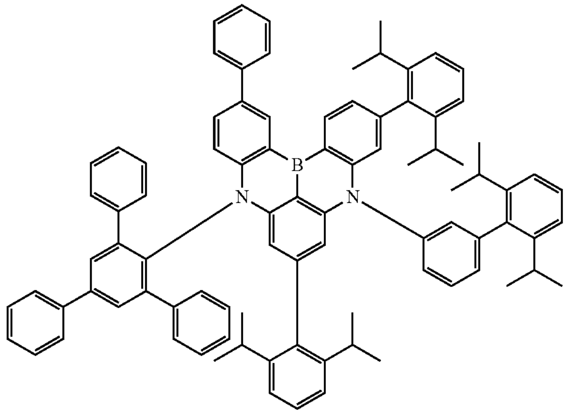
34
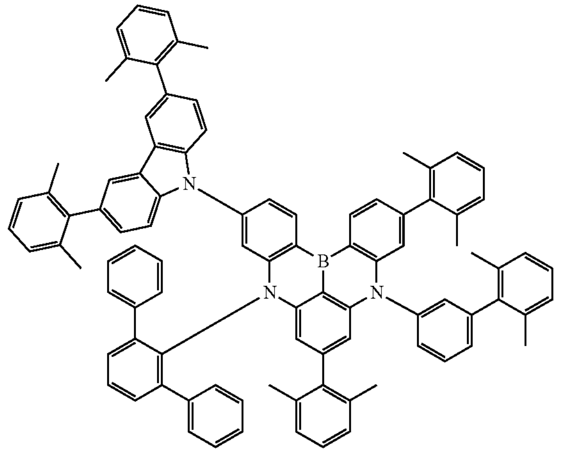
35
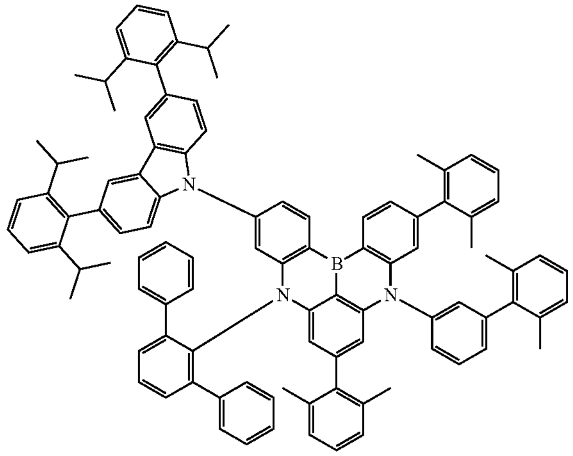

-continued
36
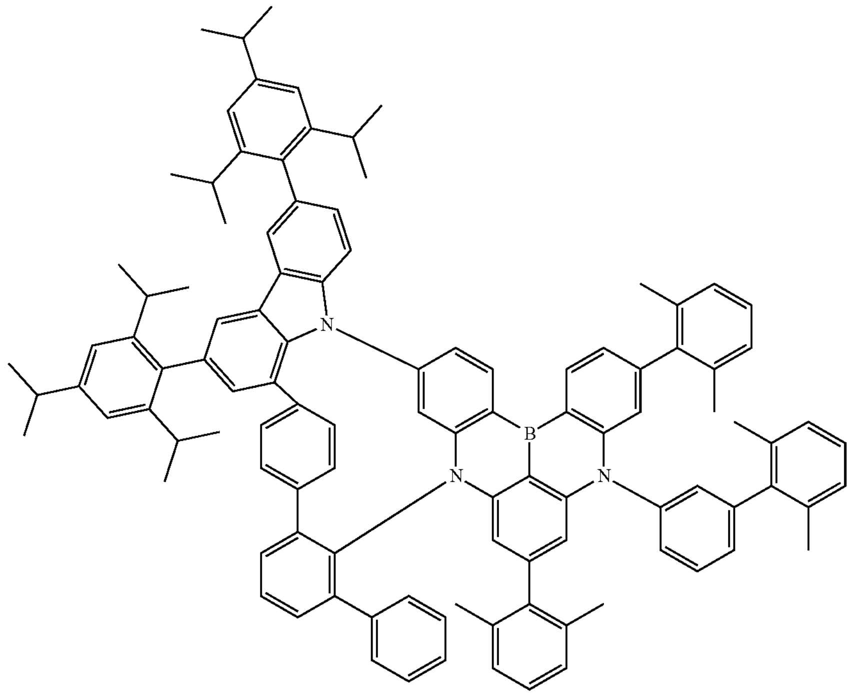
37
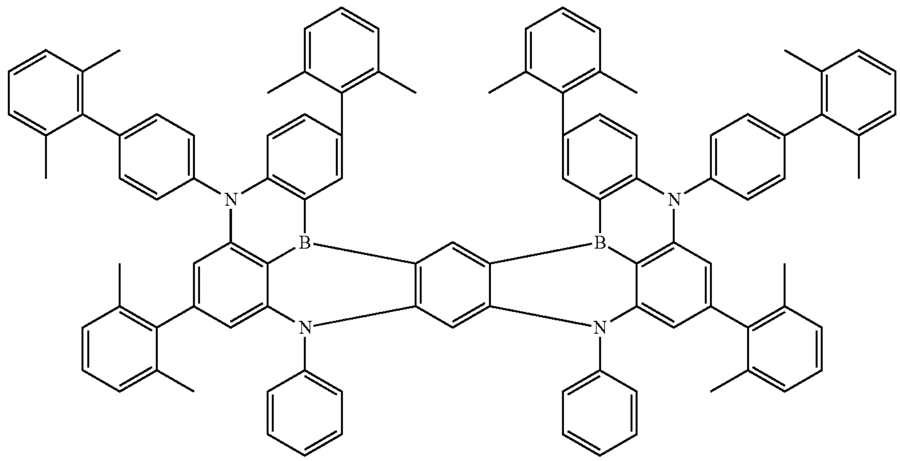

-continued
38
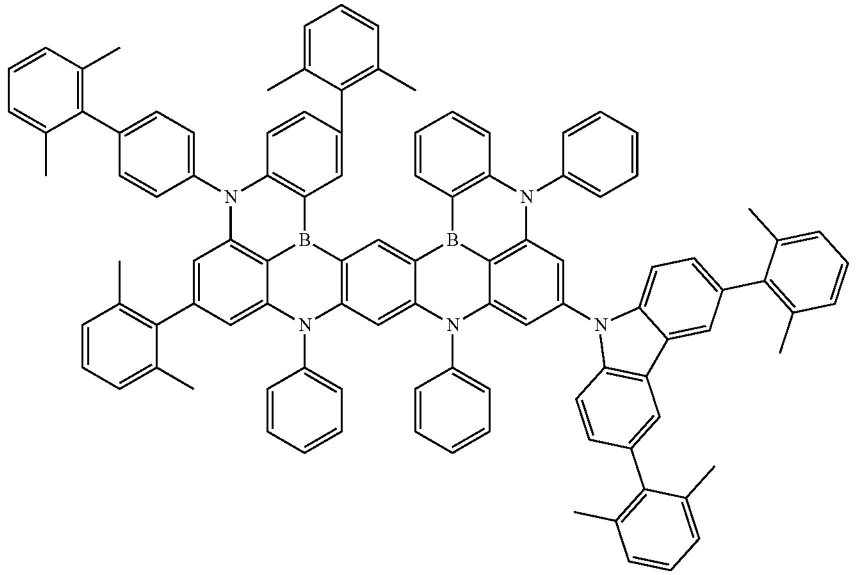
39
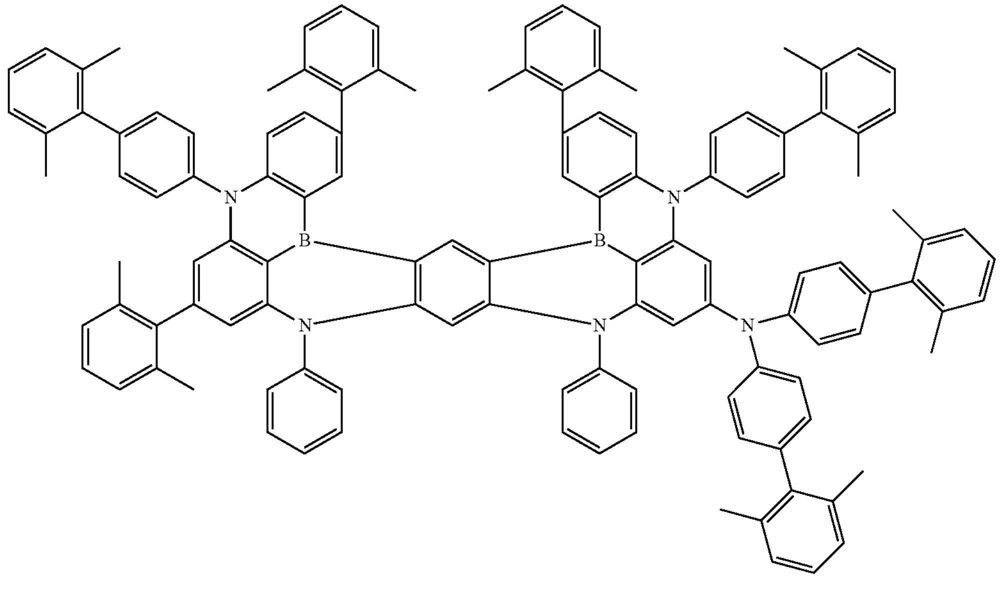

-continued
40
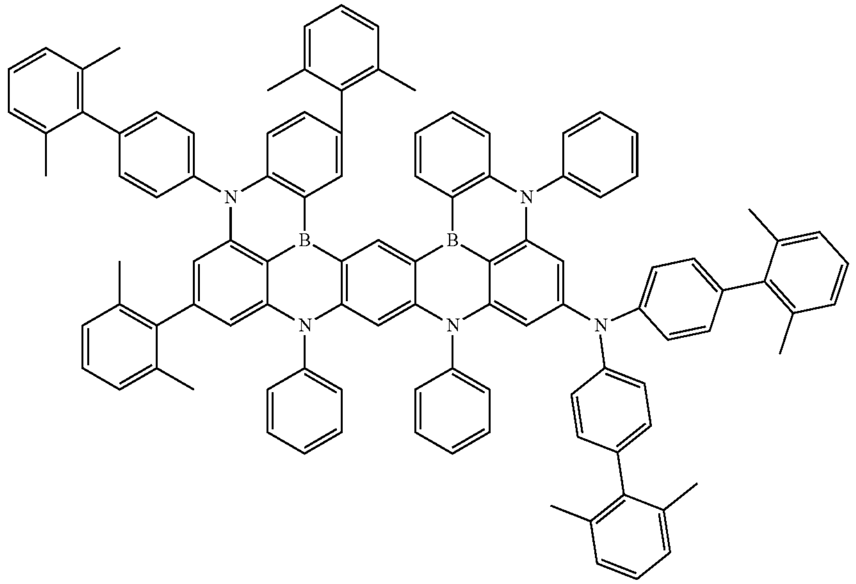
41
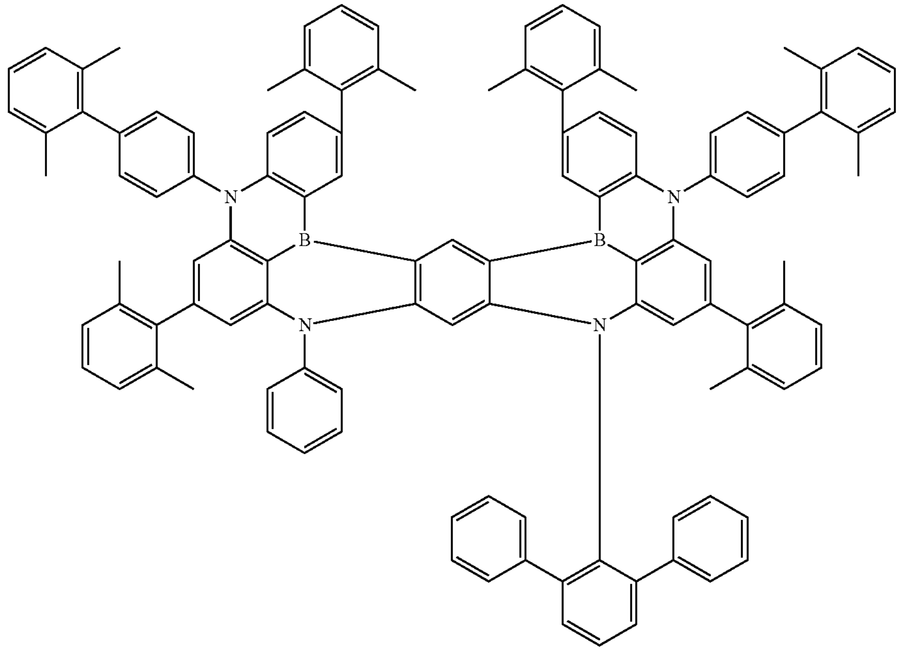

-continued
42
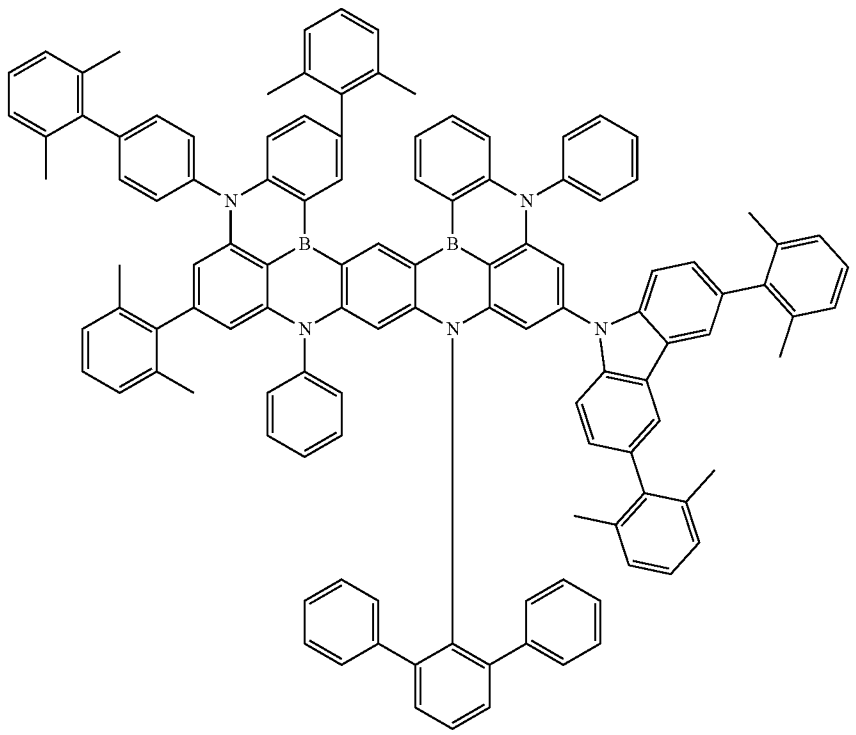
43
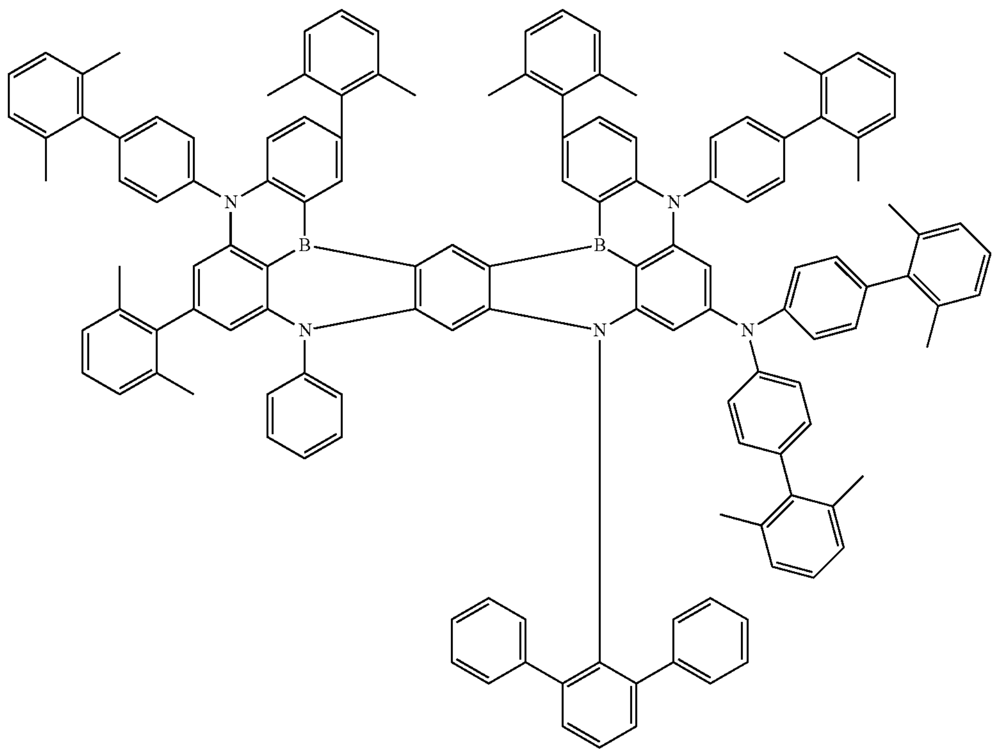

-continued
44
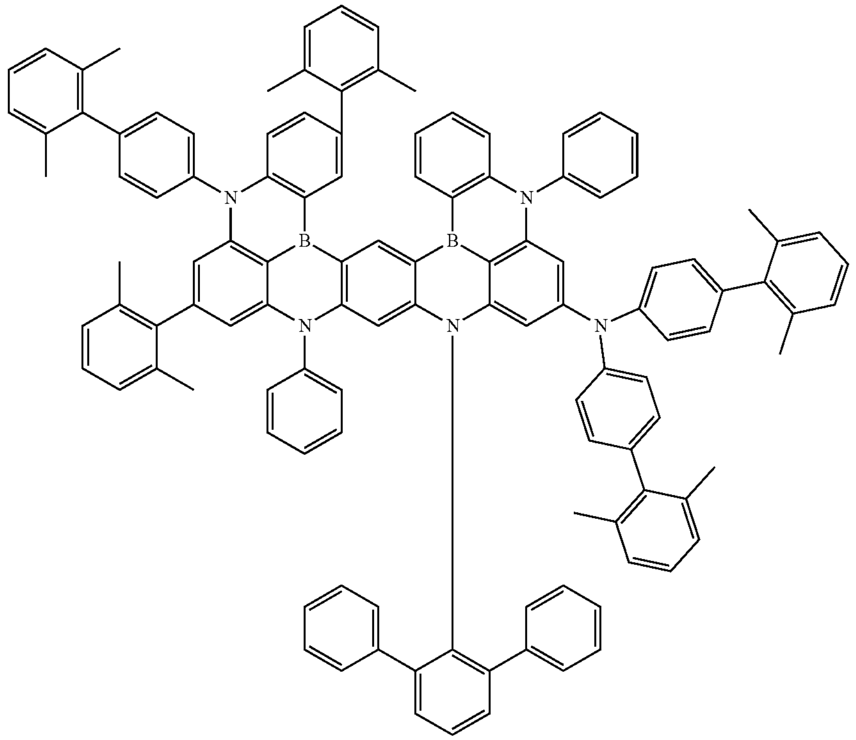
45
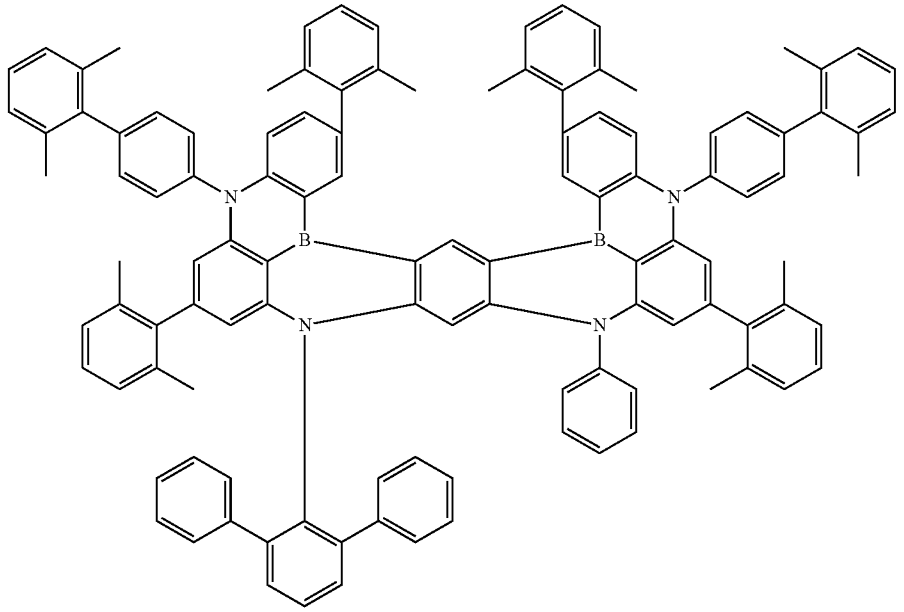

-continued
46
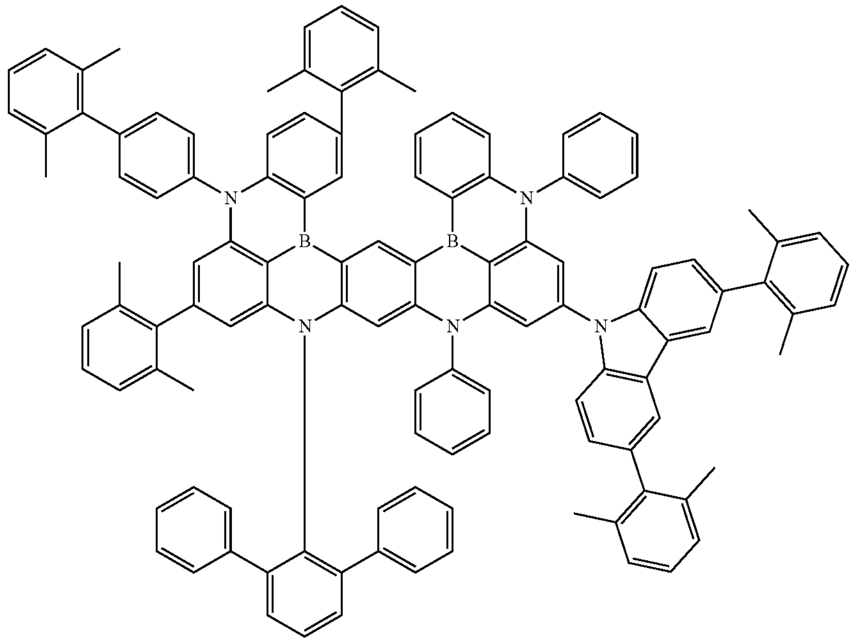
47
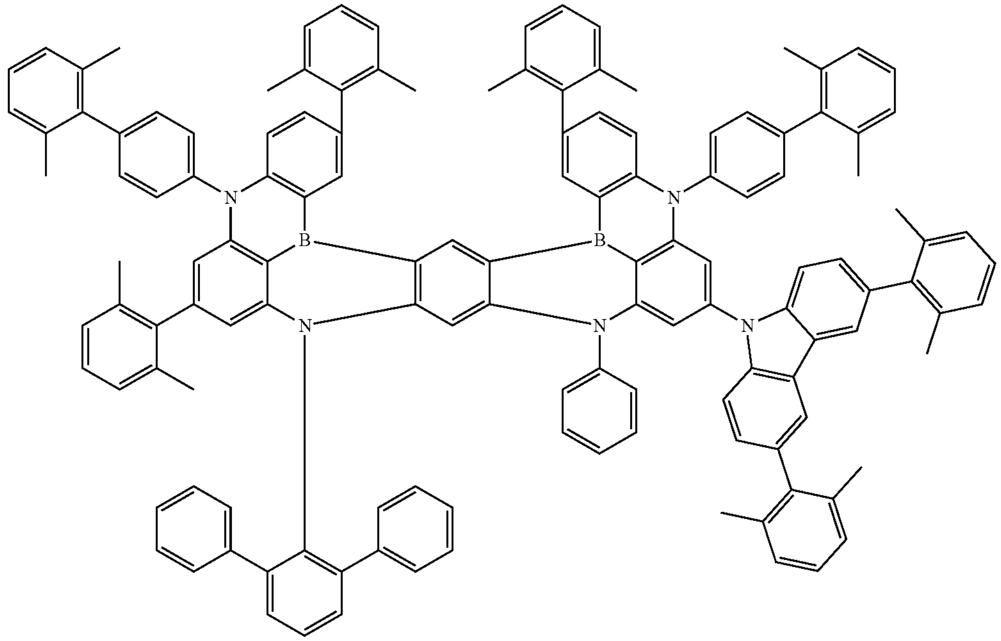

-continued
48
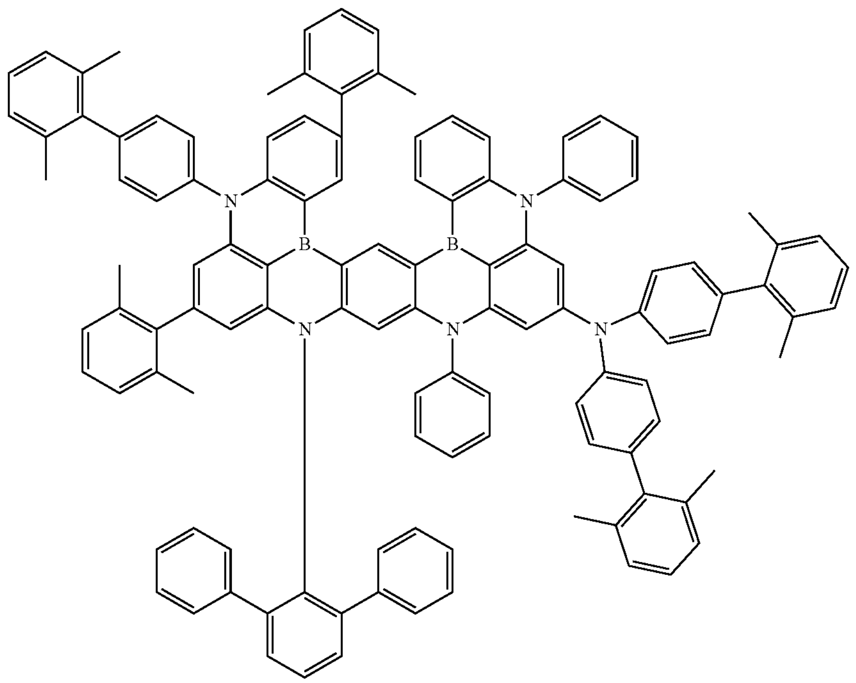
49
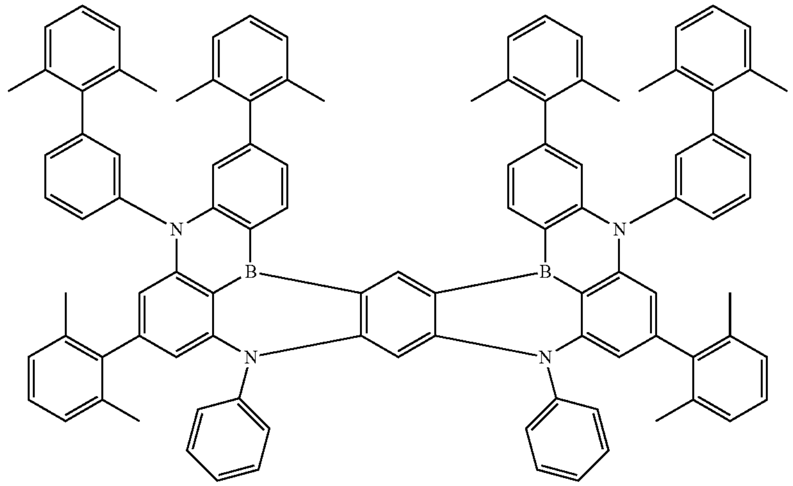

-continued
50
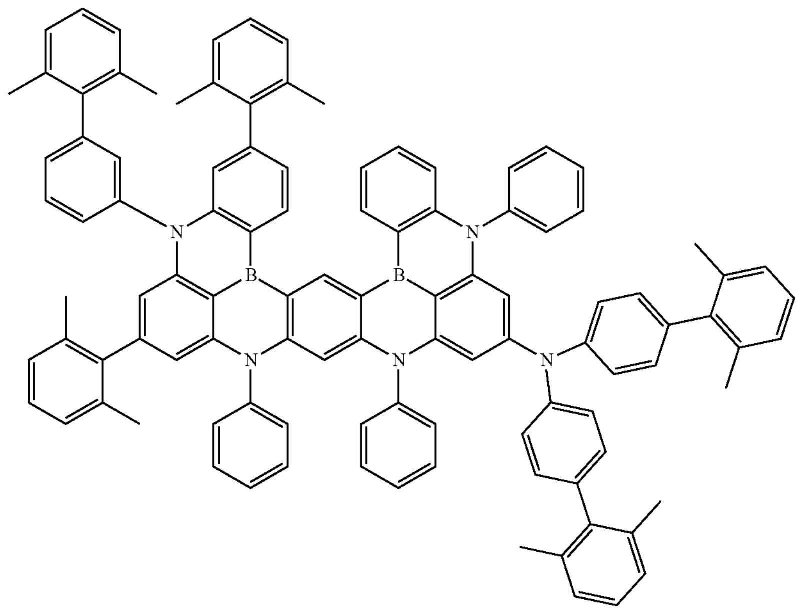
51
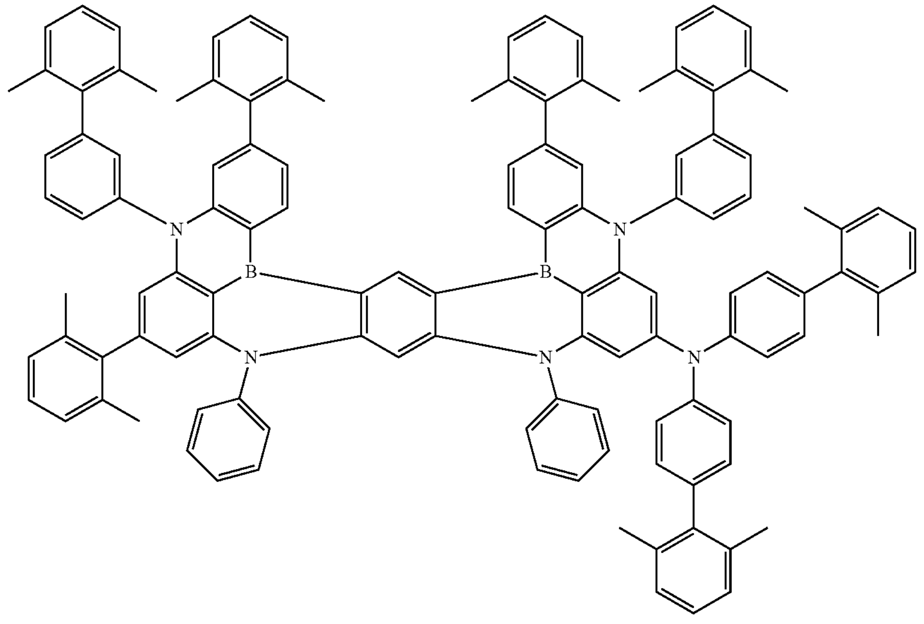

-continued
52
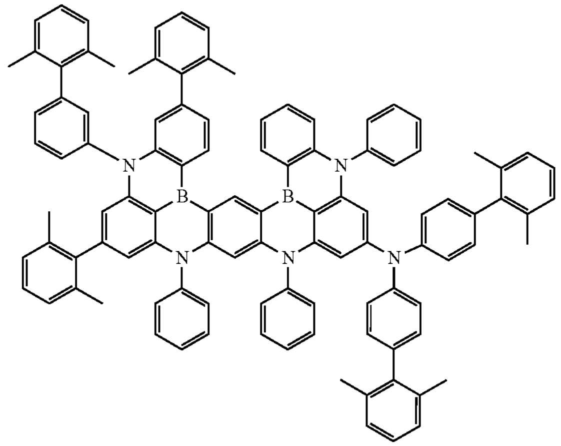
53
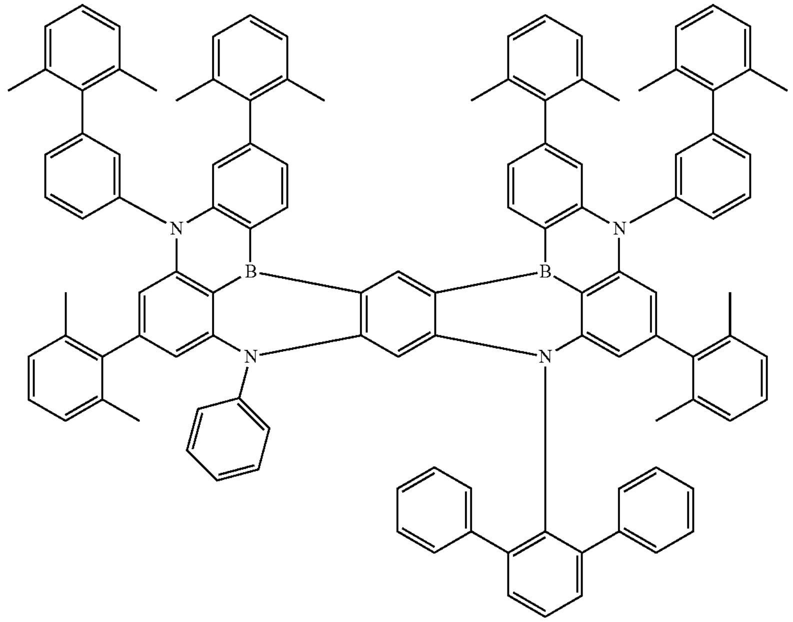

-continued
54
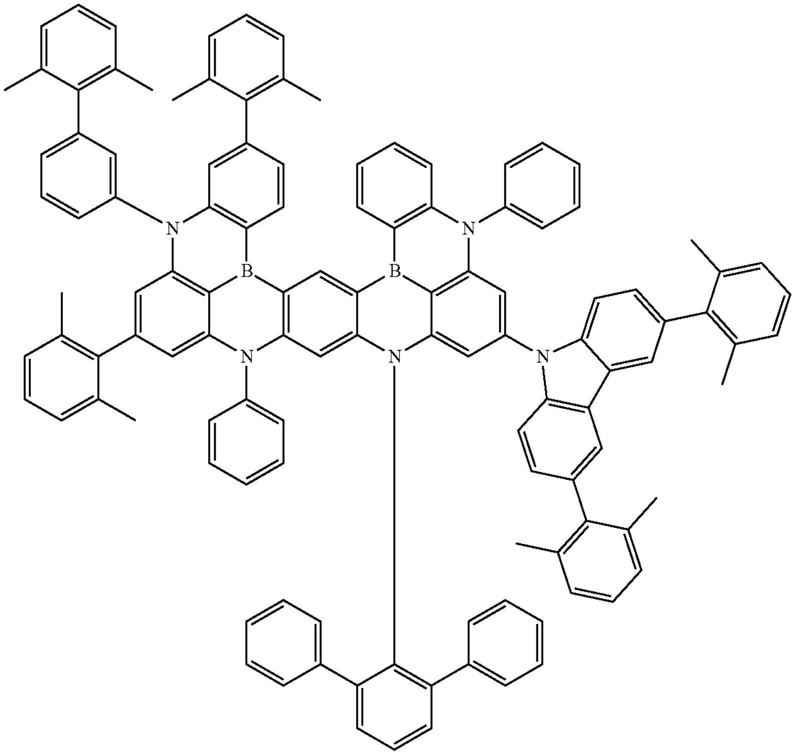
55
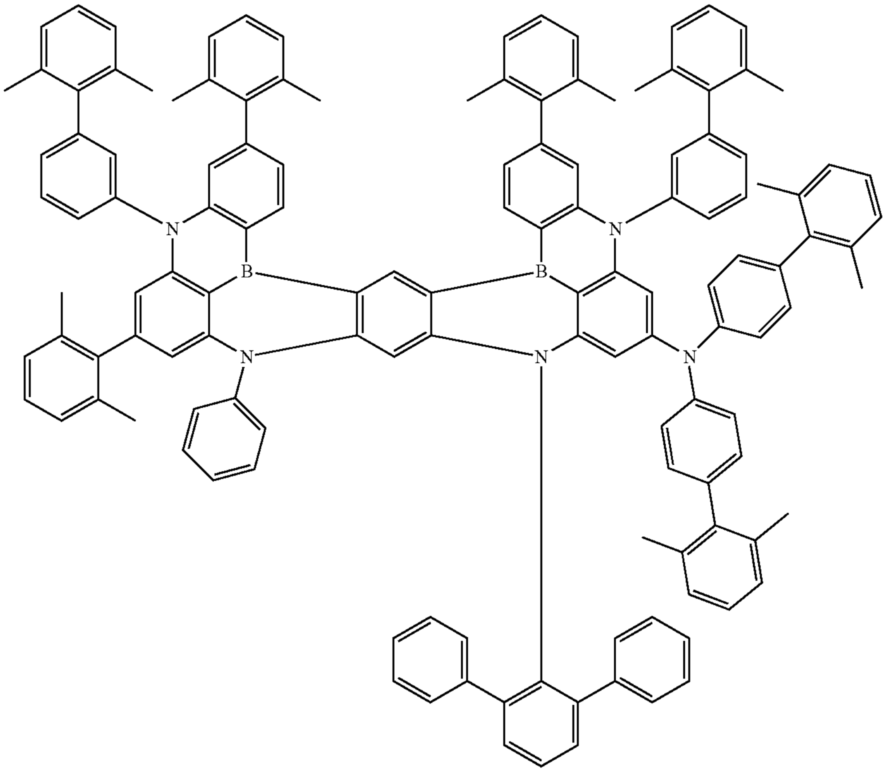

-continued
56
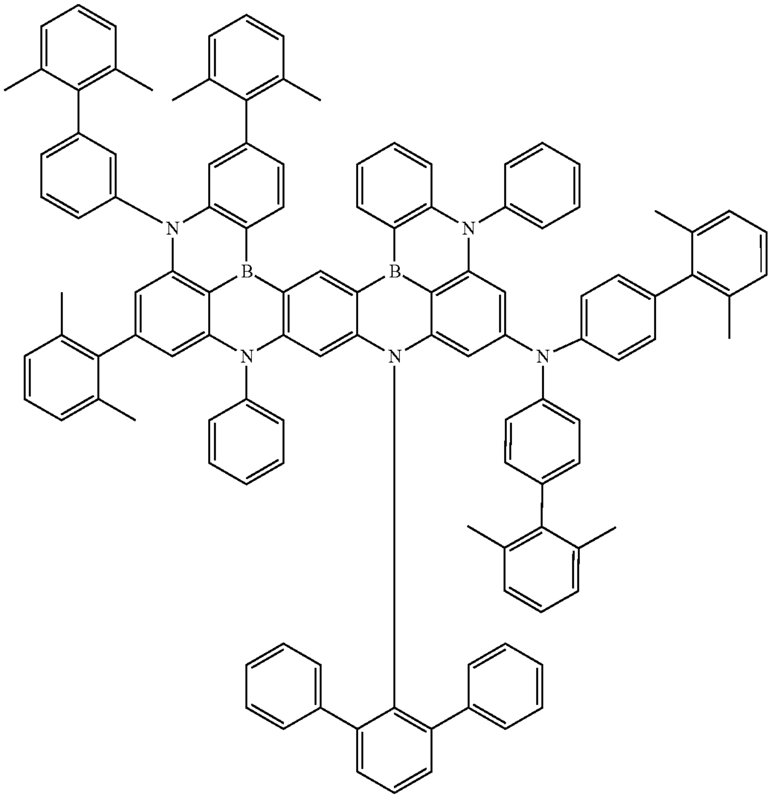
57
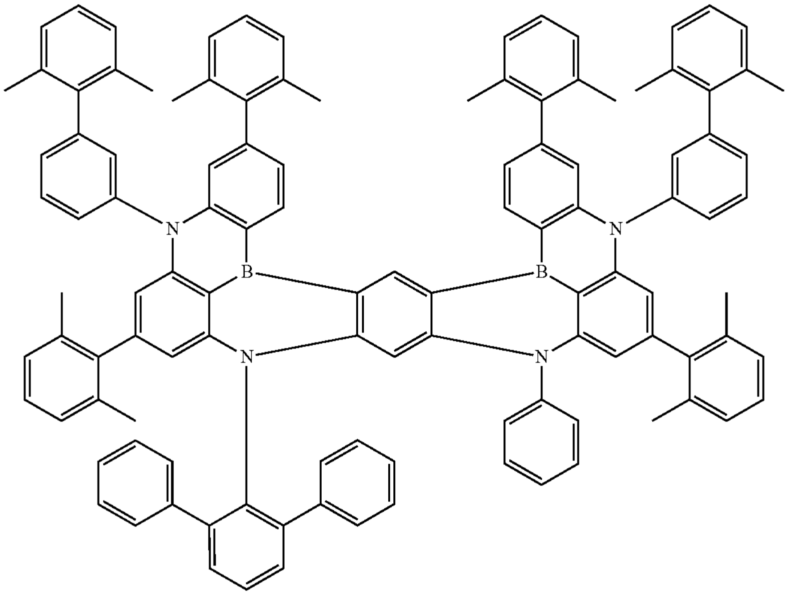

-continued
58
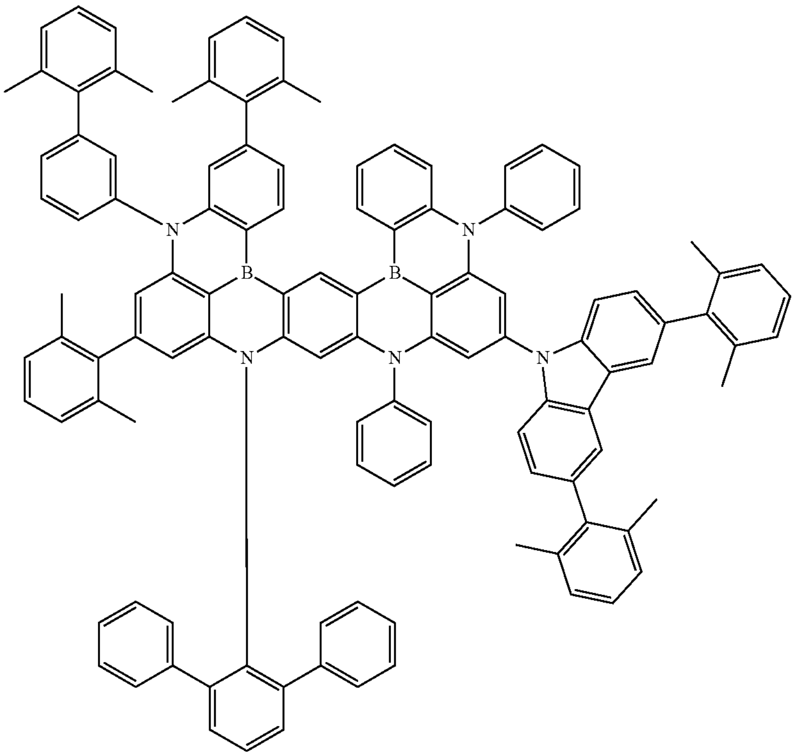
59
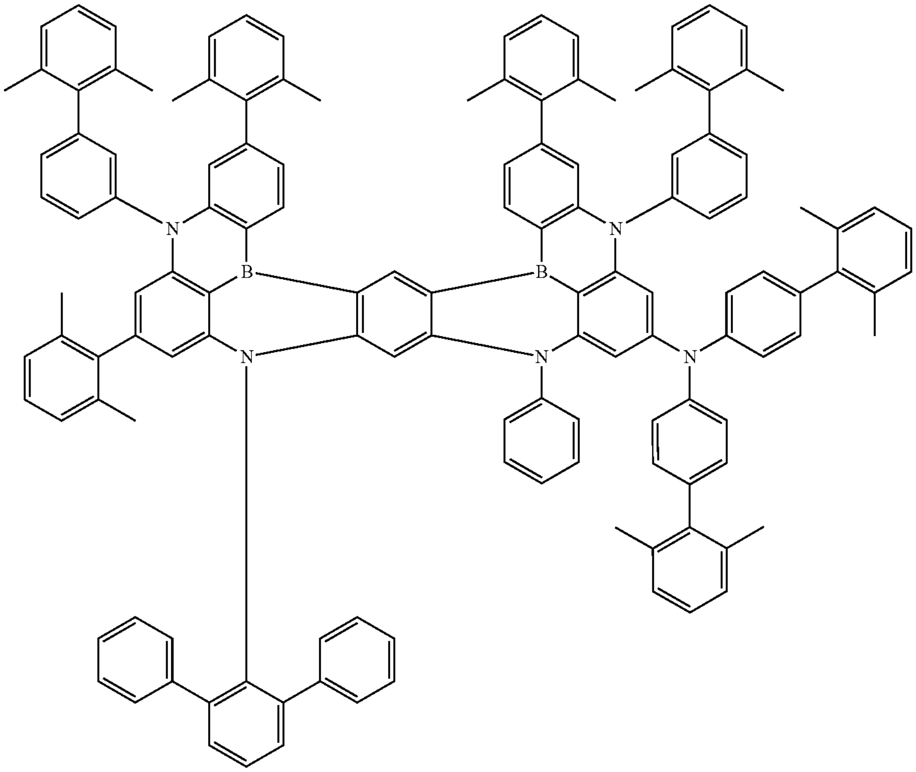

-continued
60
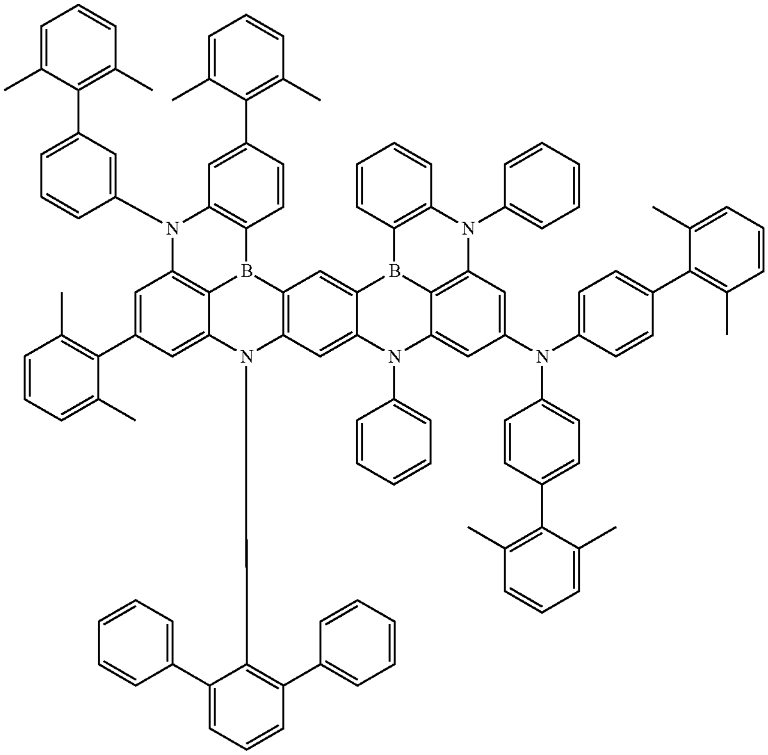
61
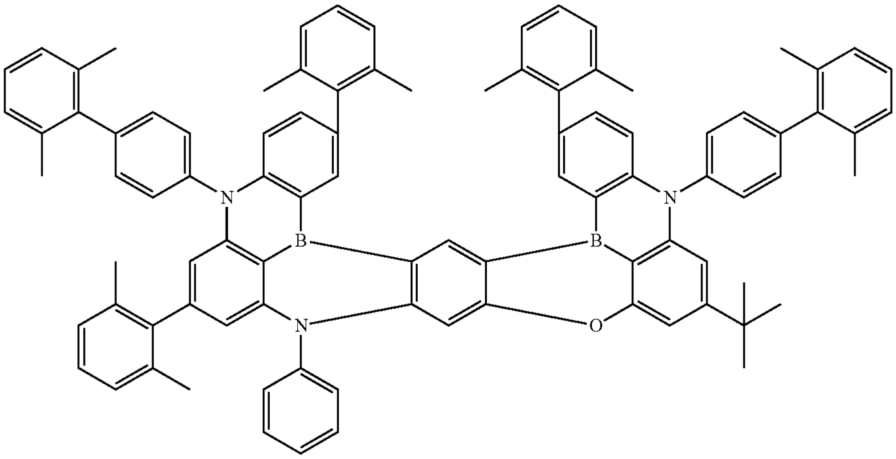
62
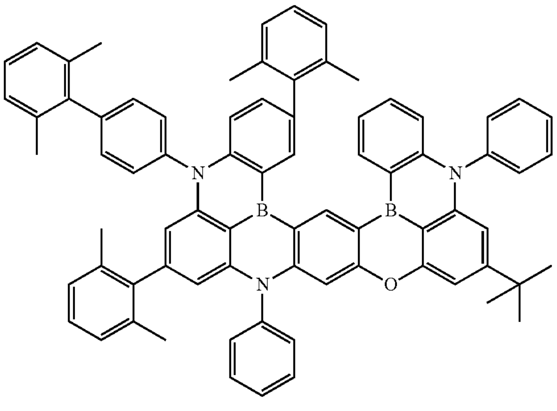

-continued
63
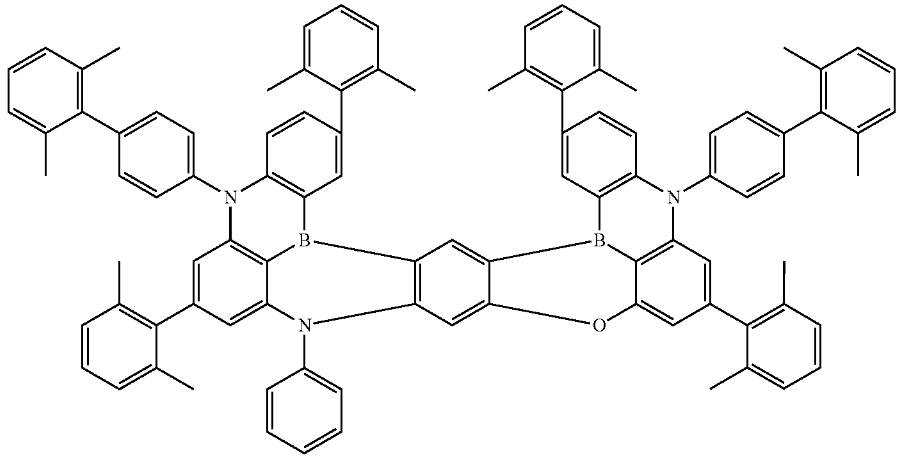
64
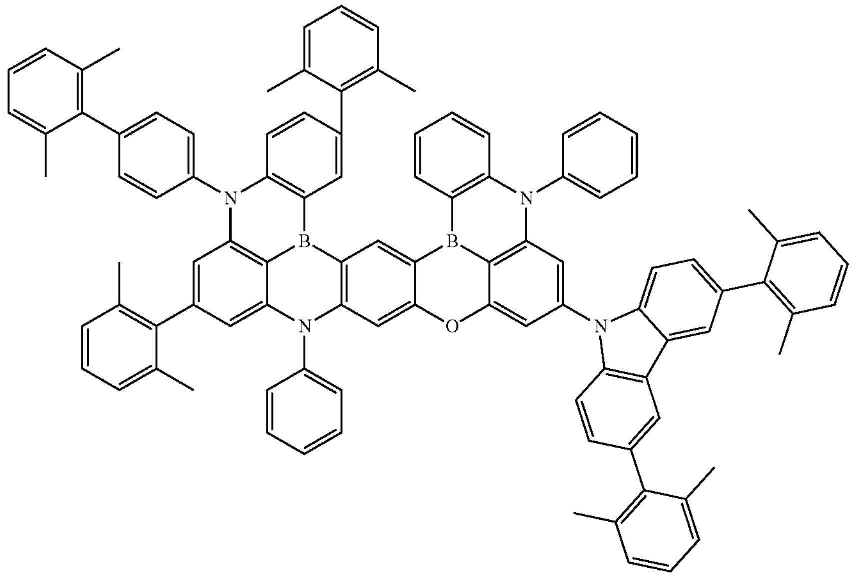
65
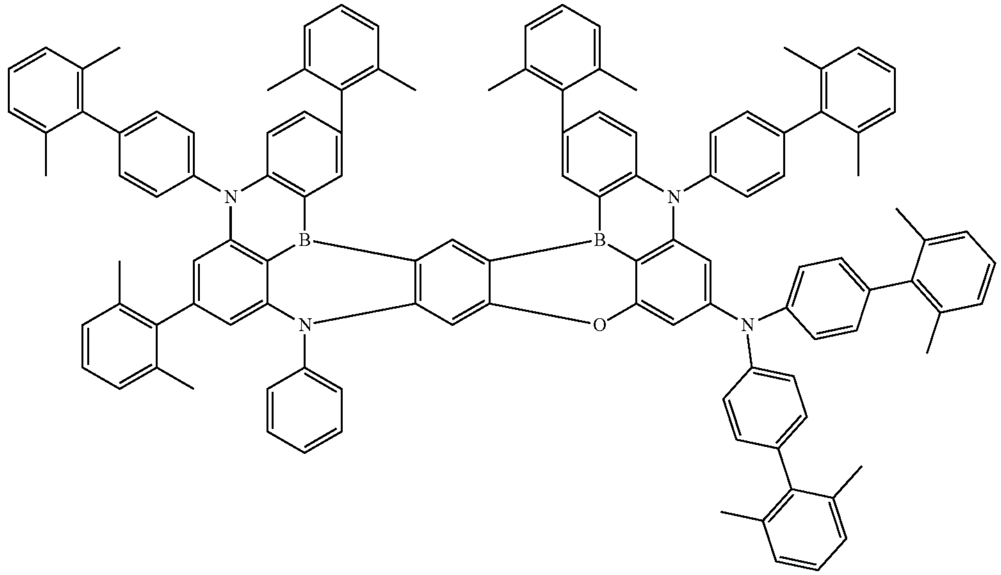

-continued
66
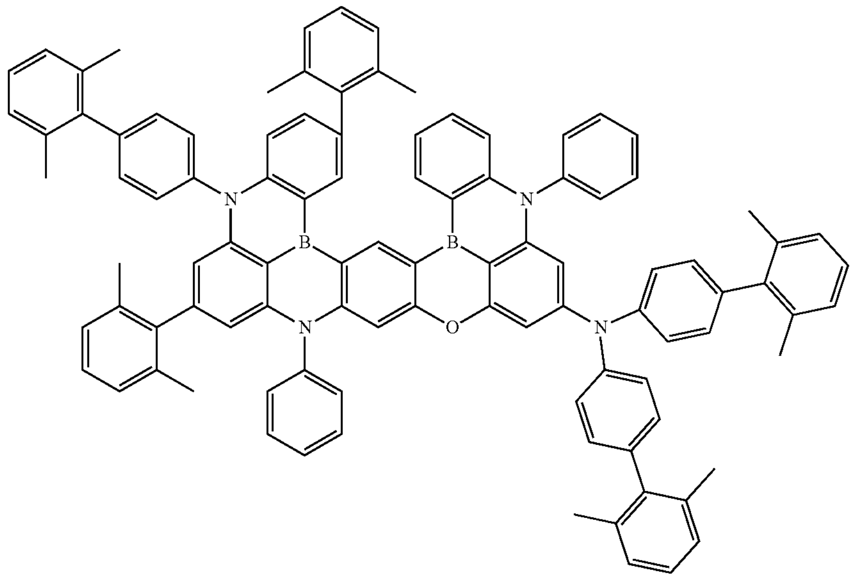
67
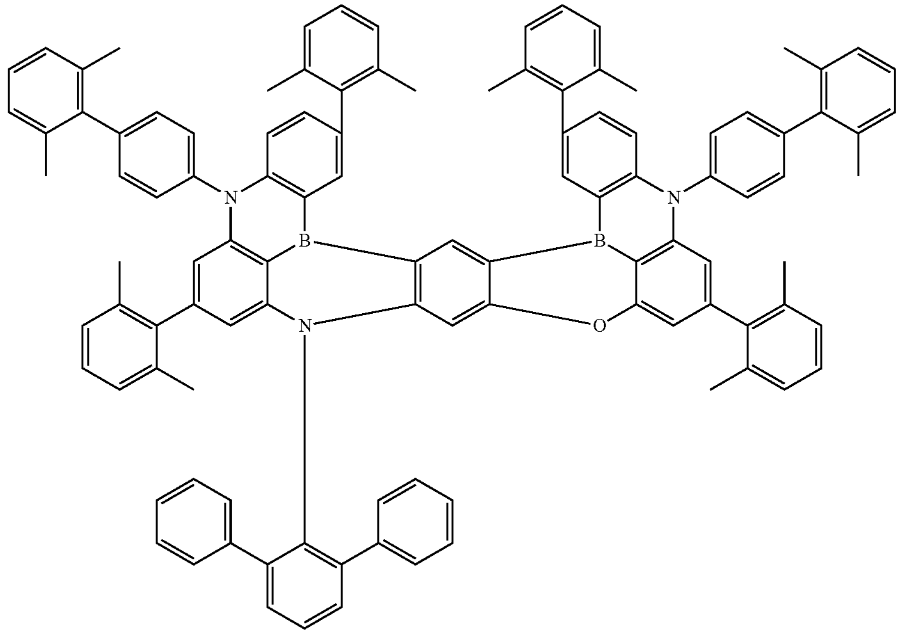

-continued
68
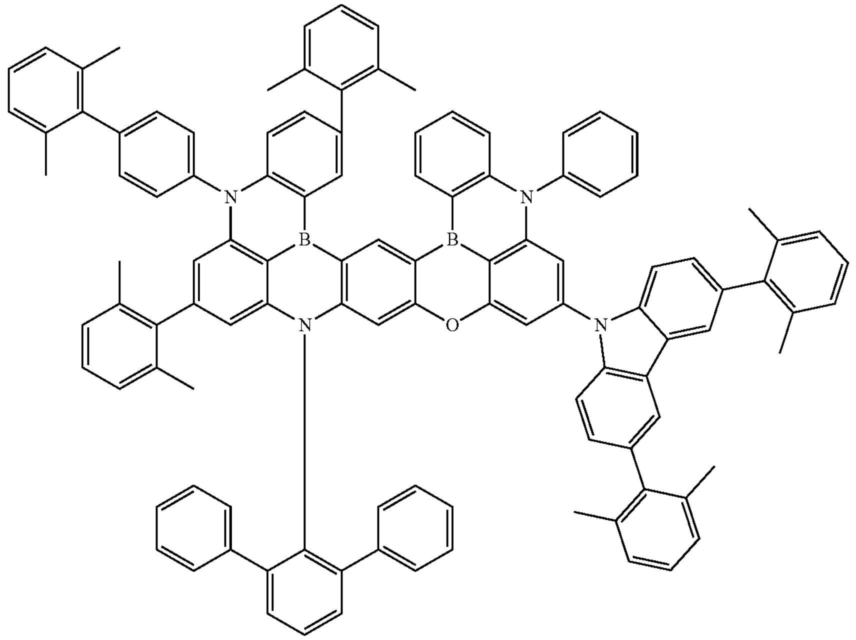
69
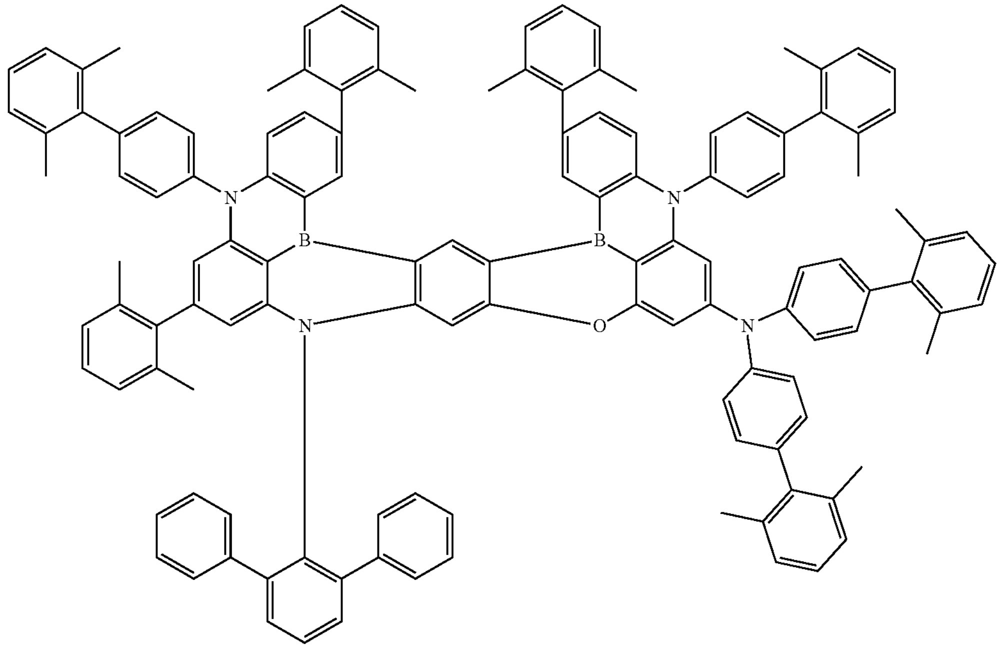

-continued
70
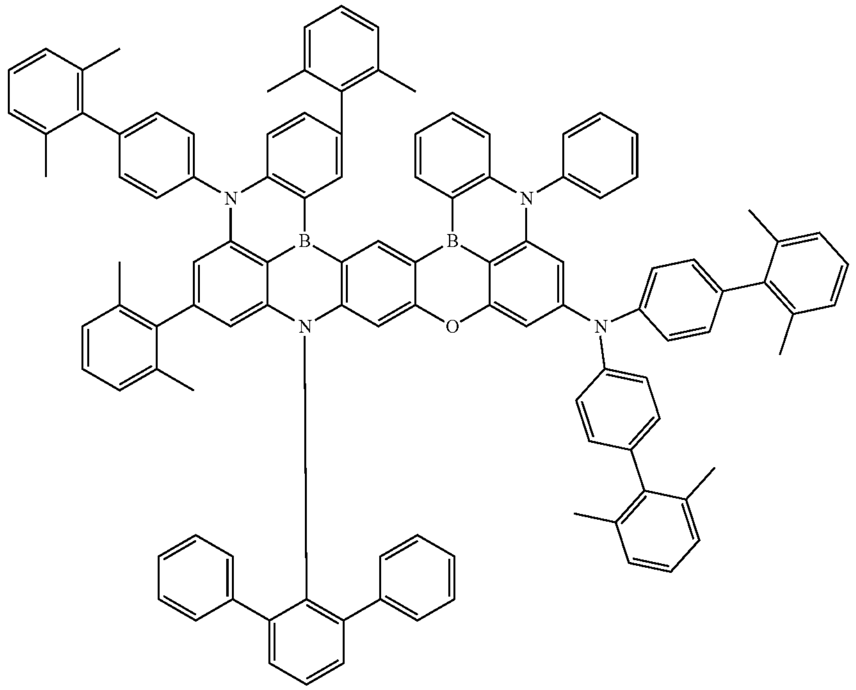
71
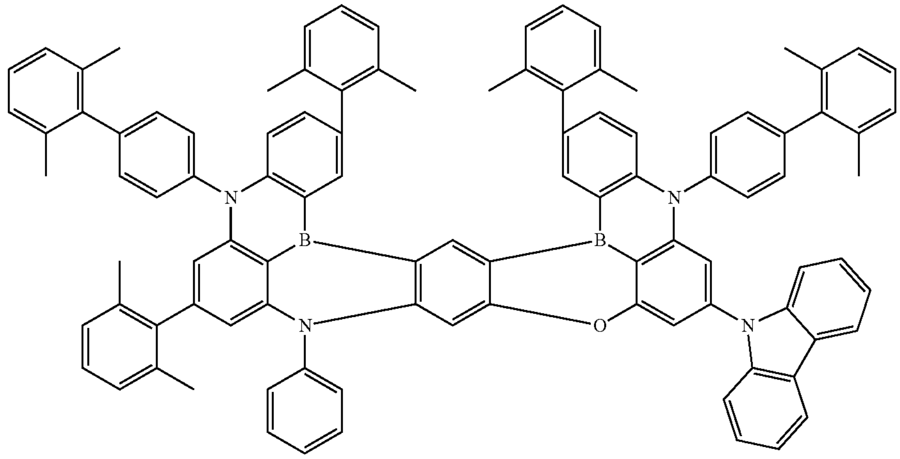

-continued
72
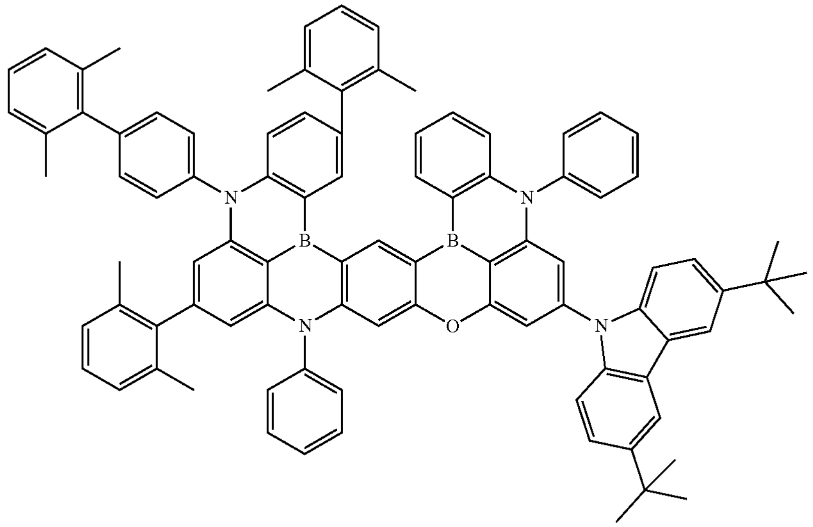
73
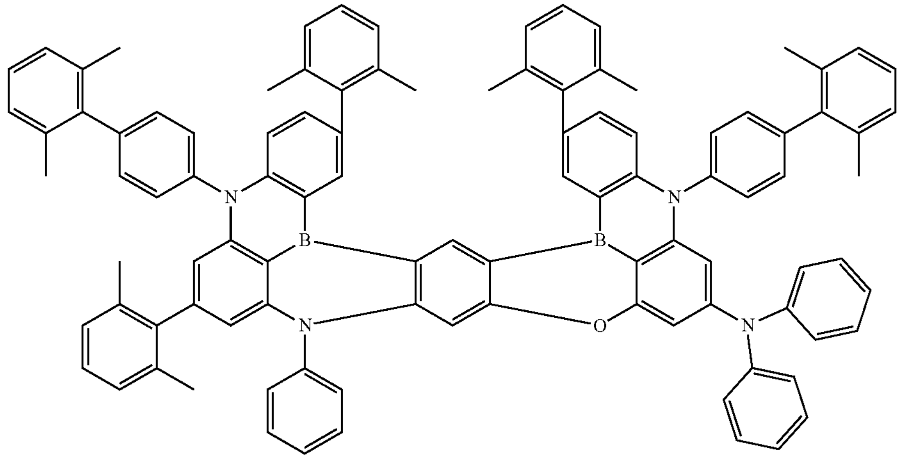
74
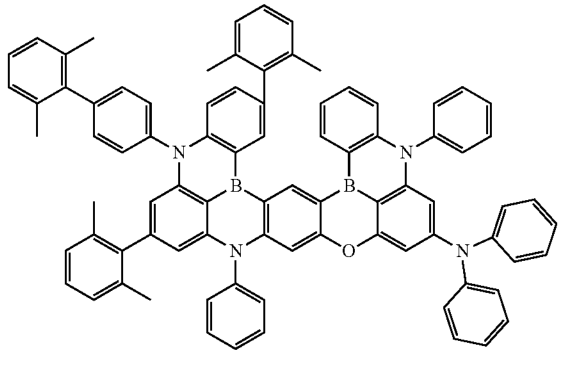

-continued
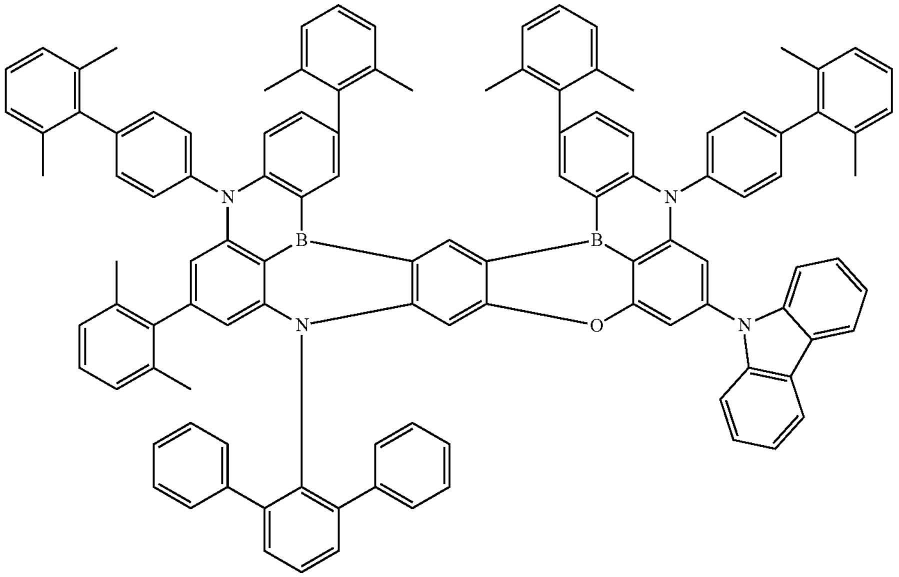
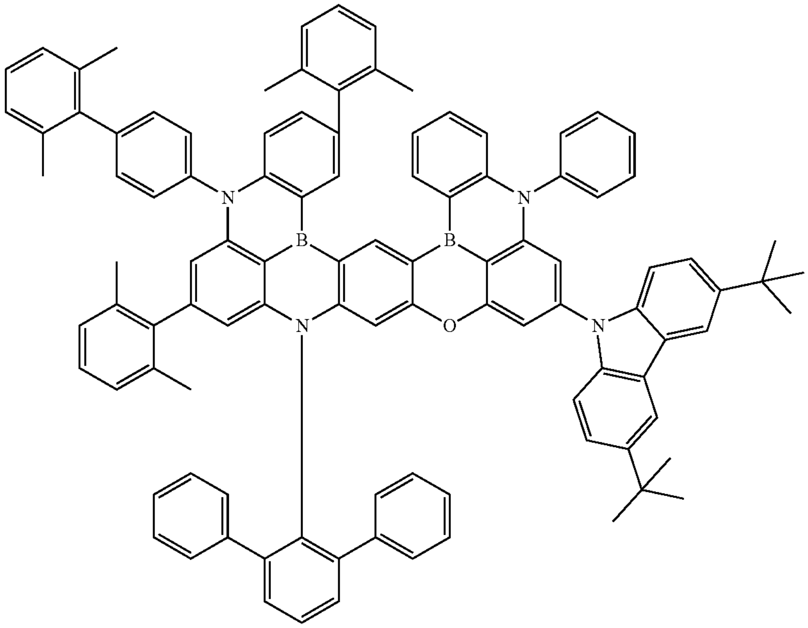

-continued
77
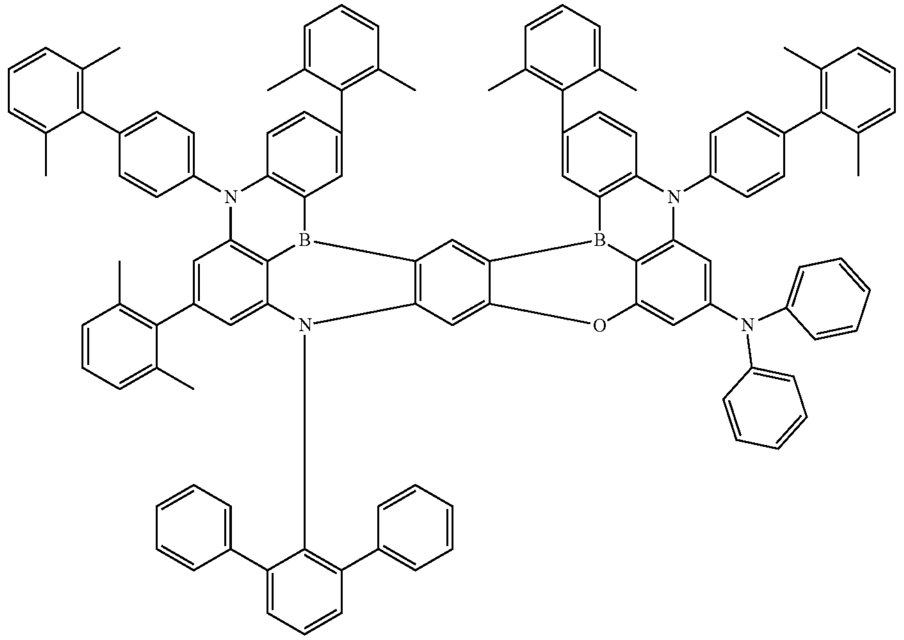
78
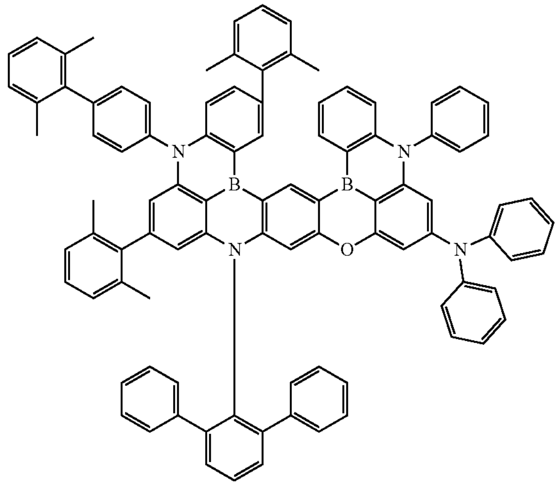
79
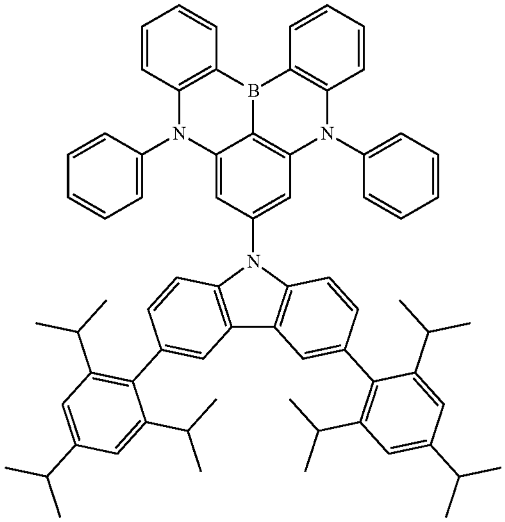

-continued
80
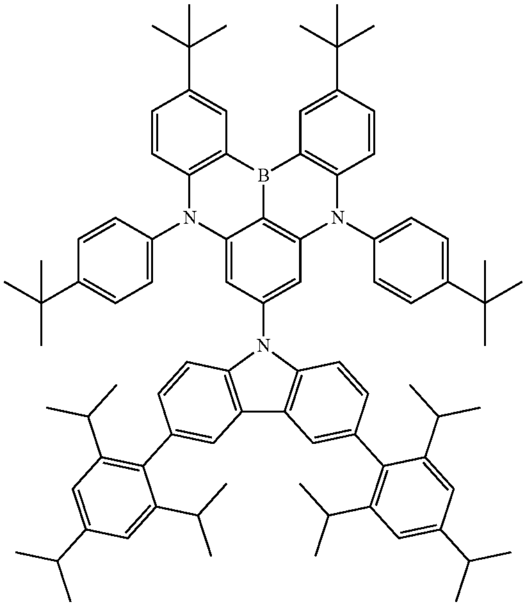
81
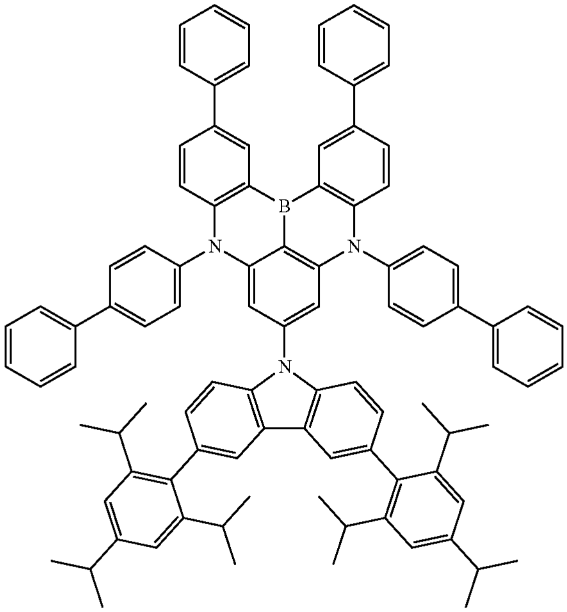
82
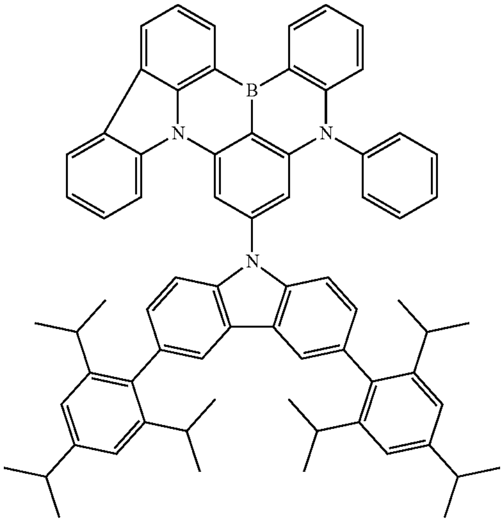
83
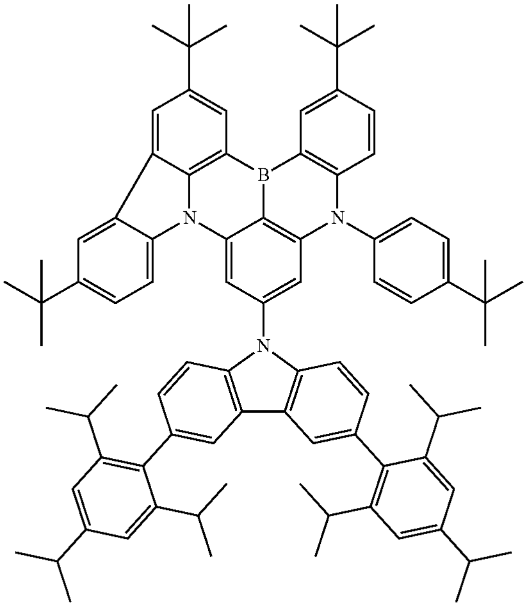

-continued
84
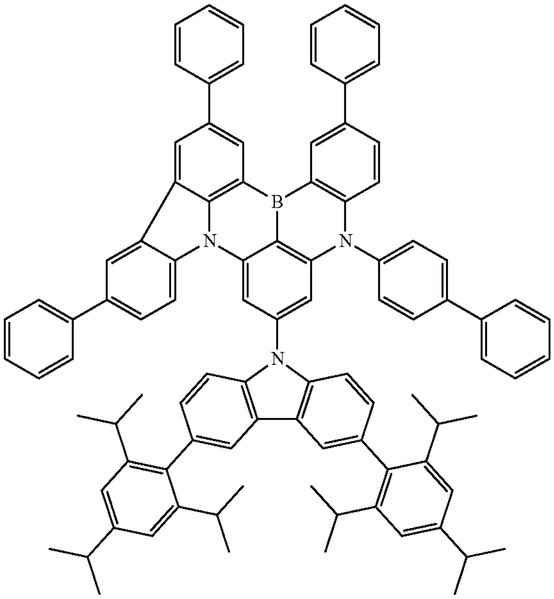
85
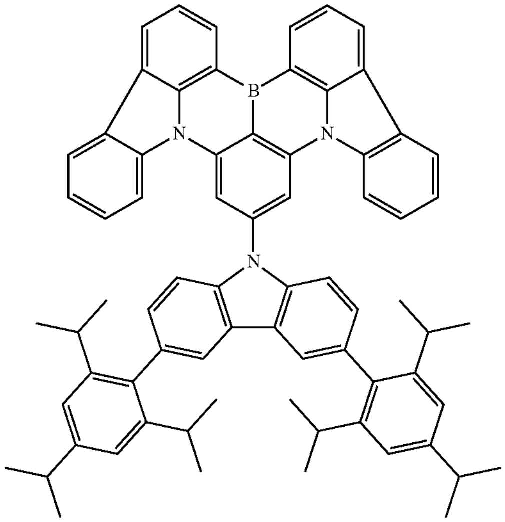
86
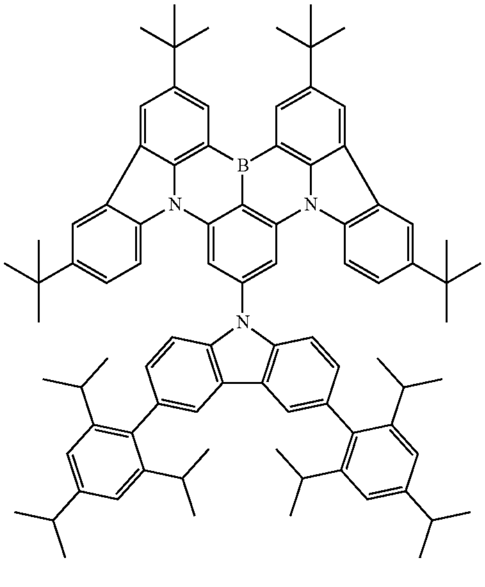
87
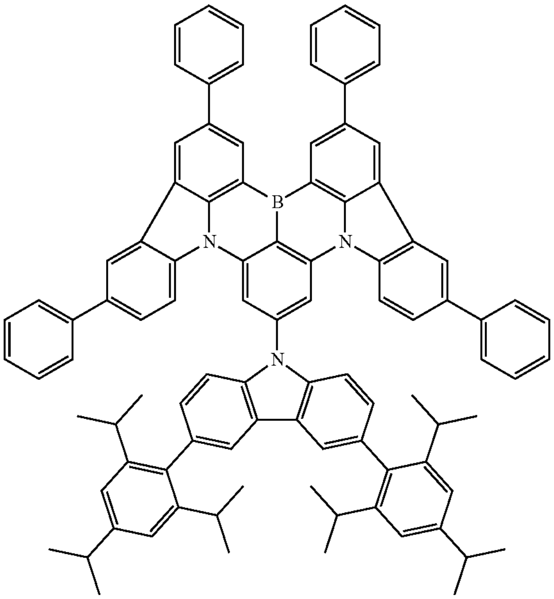

-continued
88
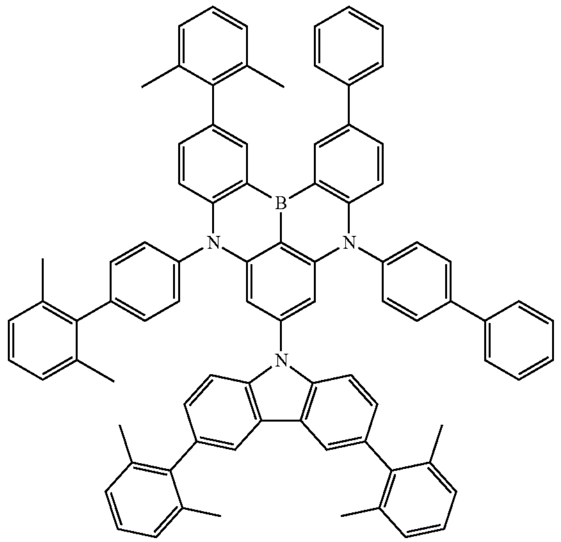
89
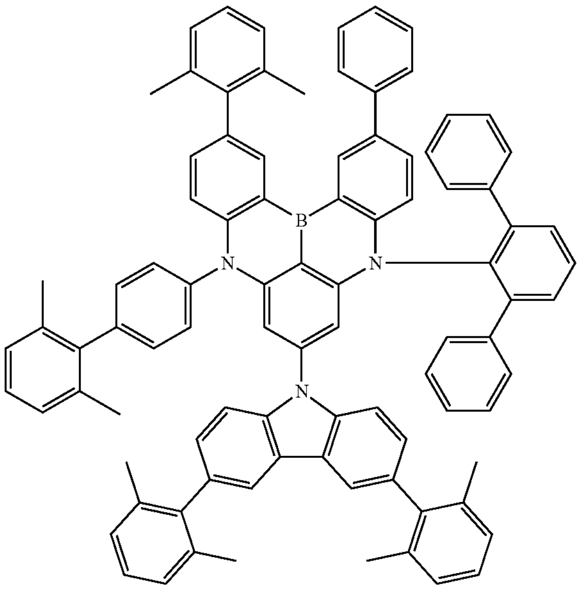
90
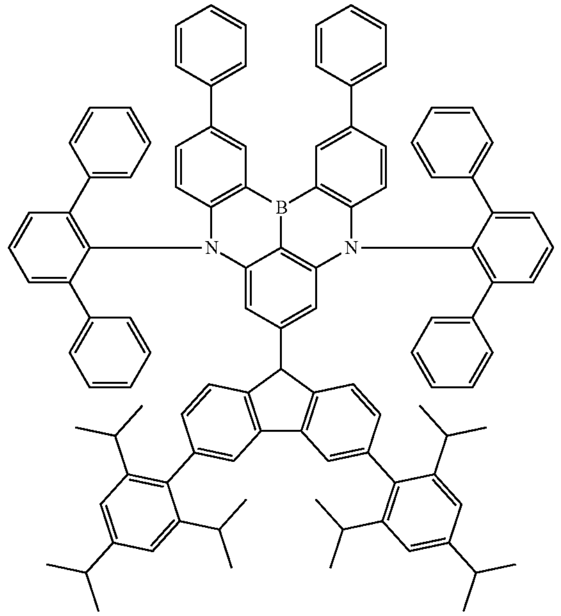

-continued
91
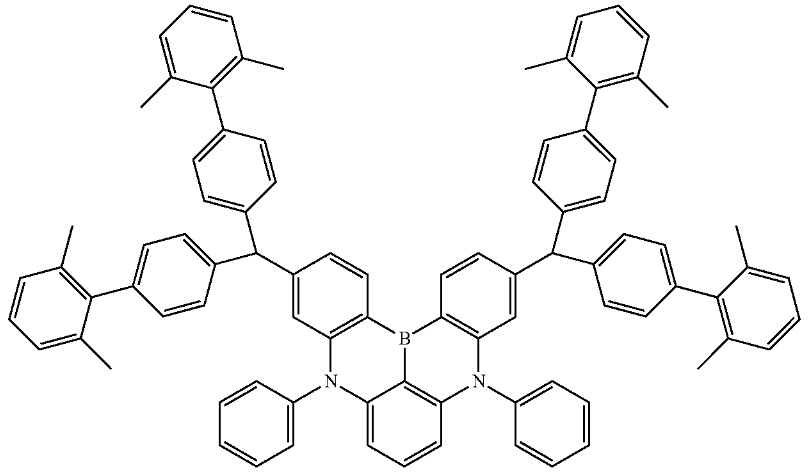
92
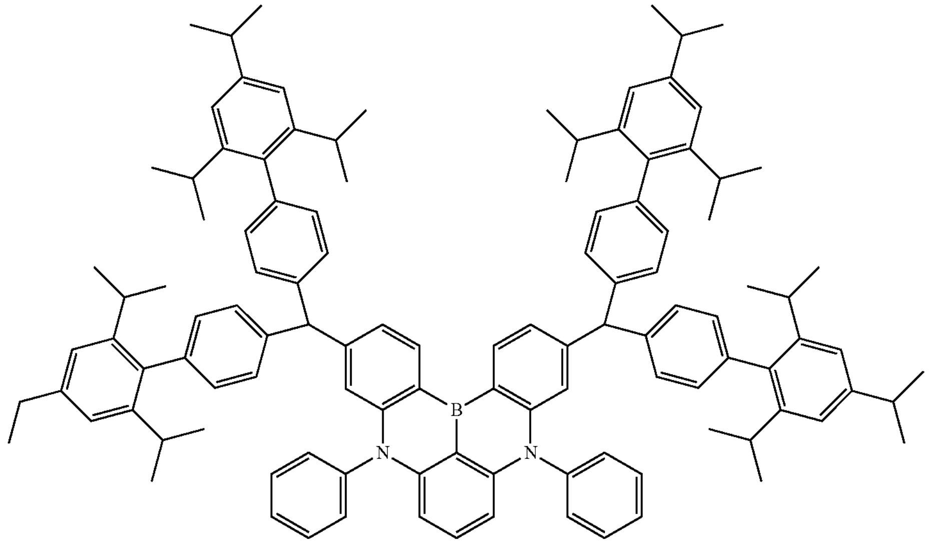
93
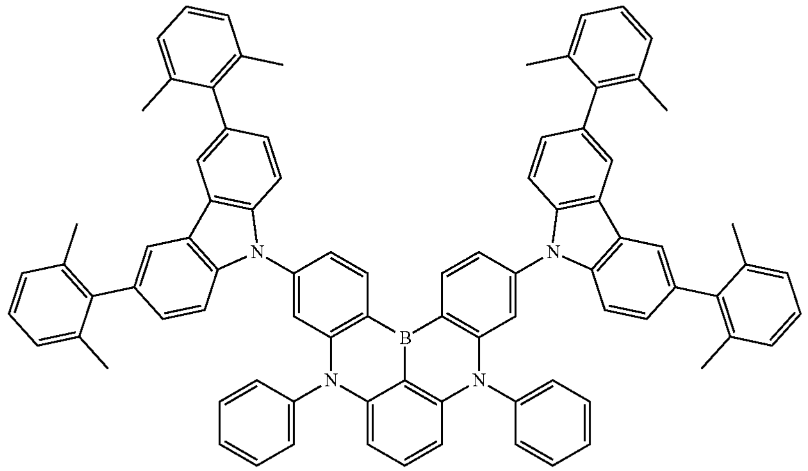

-continued
94
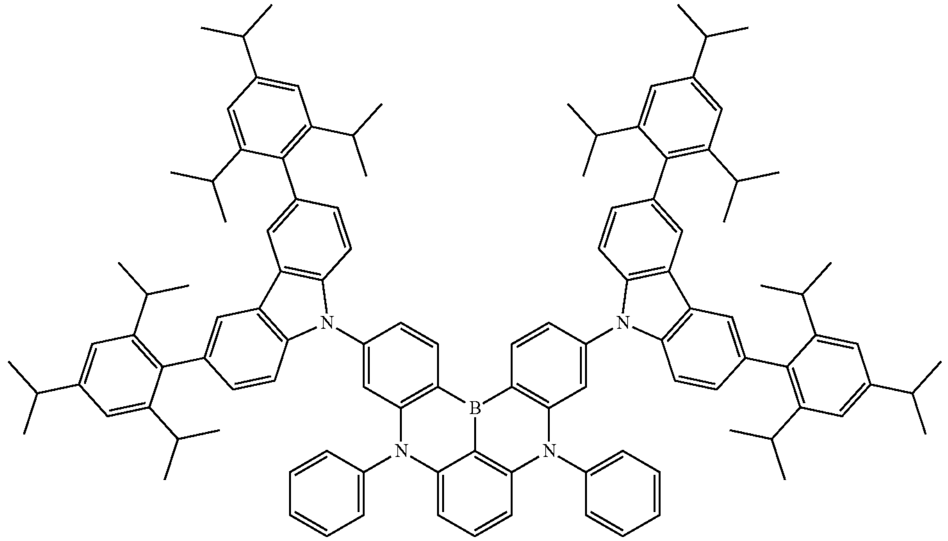
95
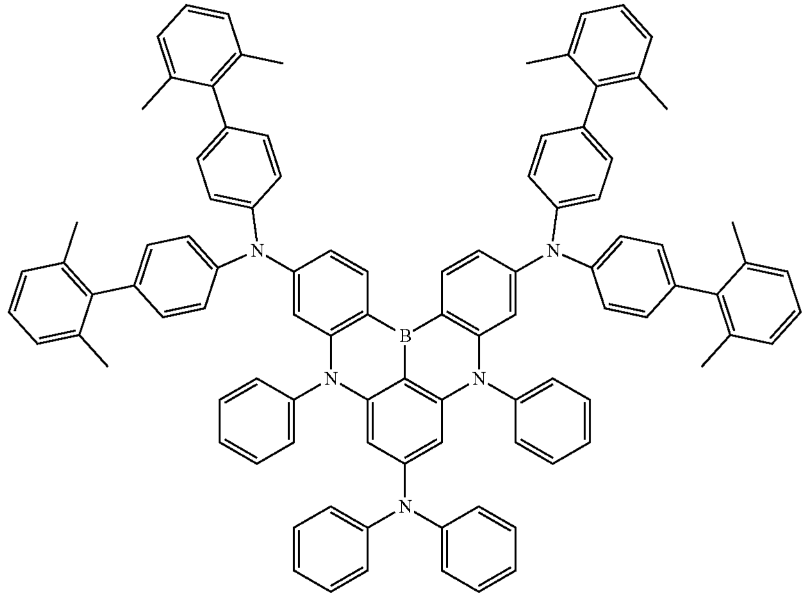

-continued
96
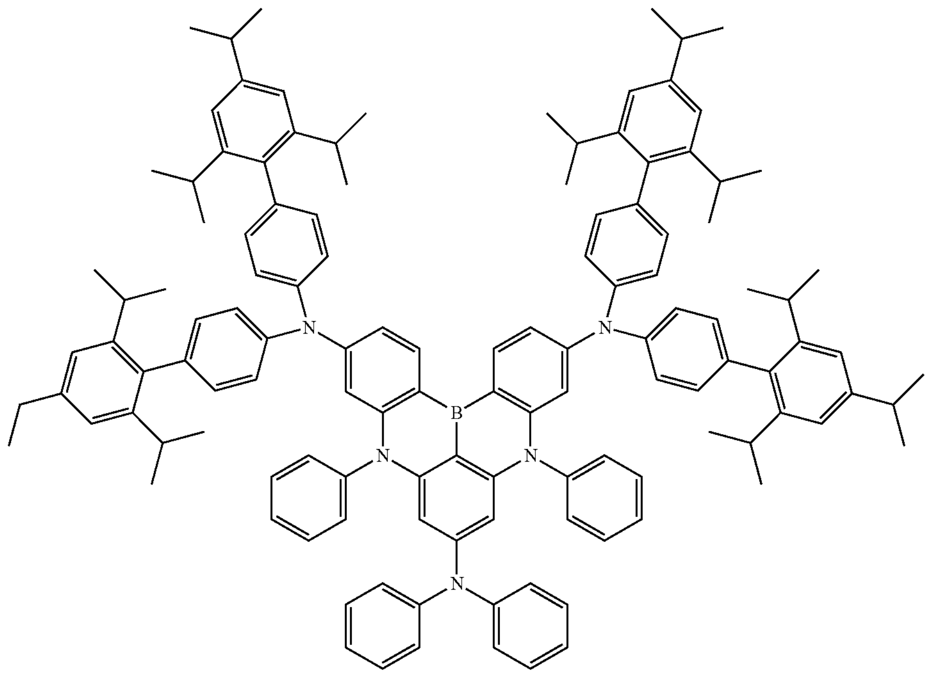
97
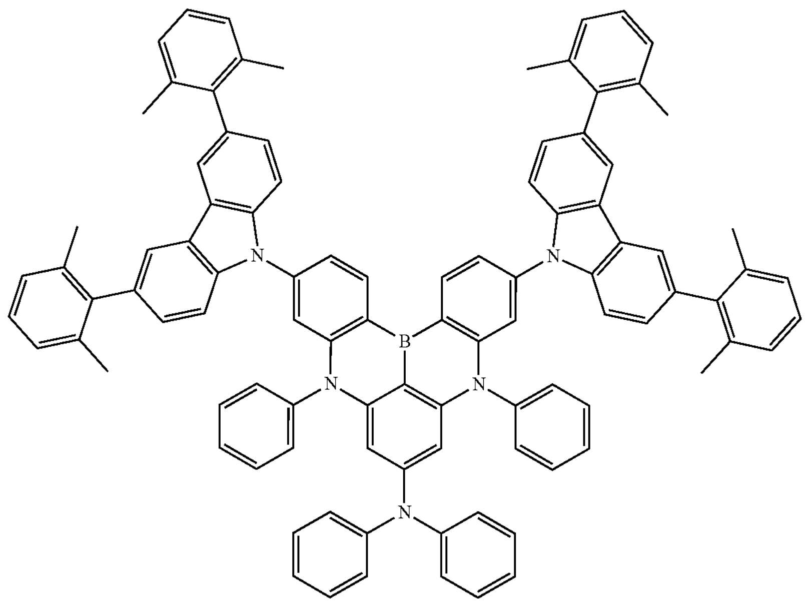

-continued
98
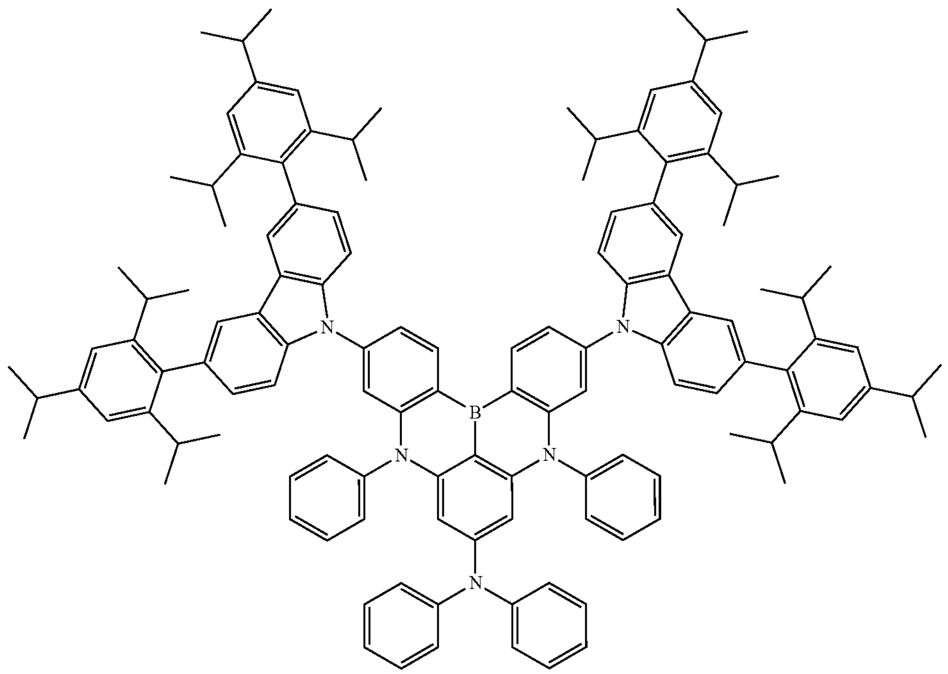
99
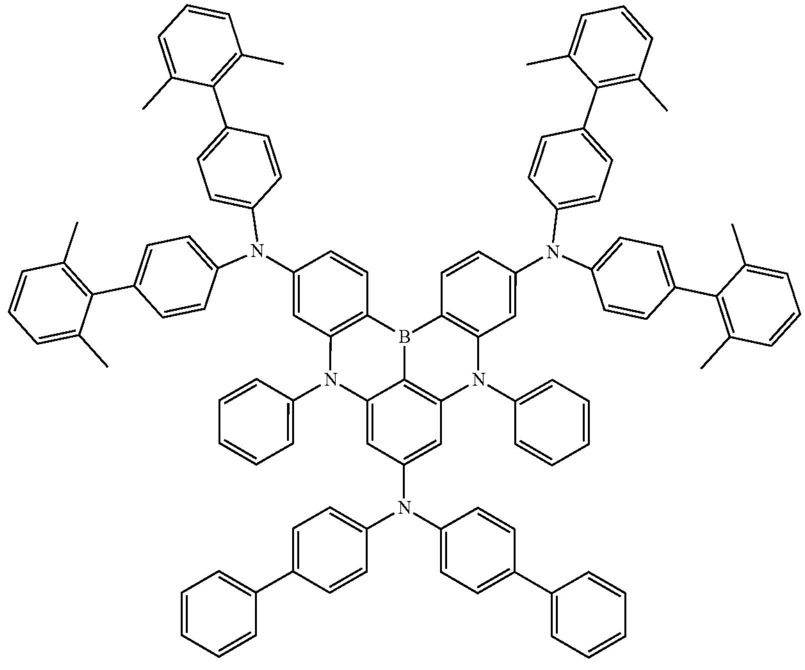

-continued
100
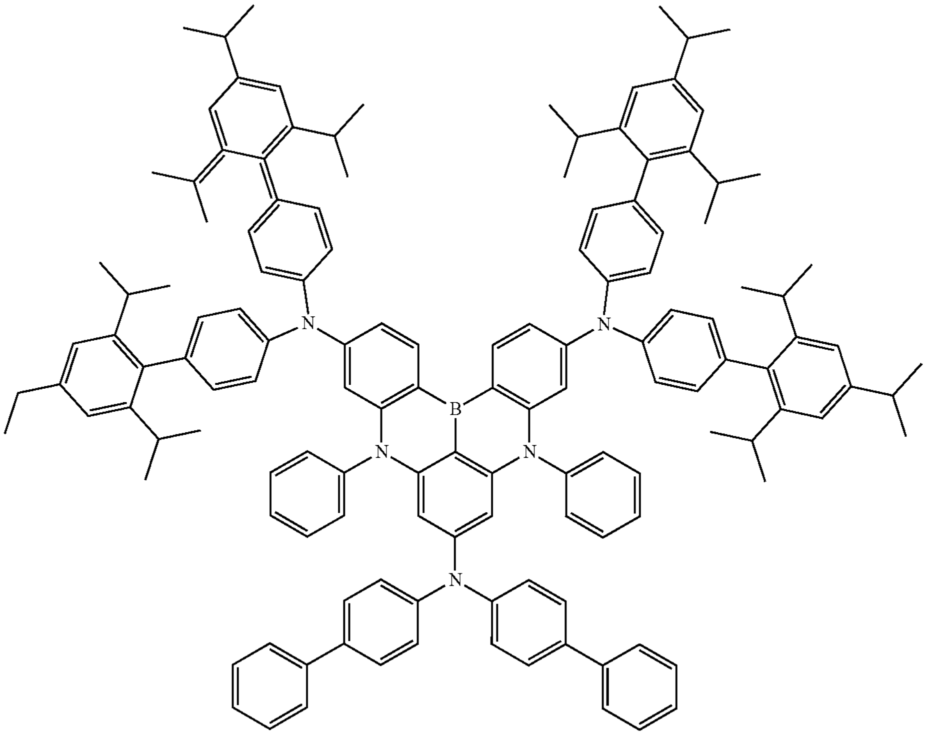
101
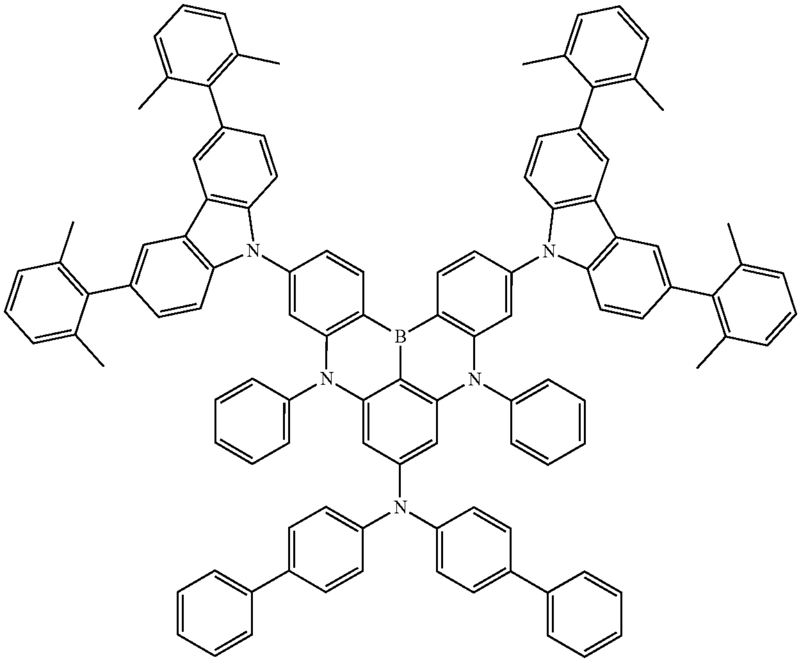

-continued
102
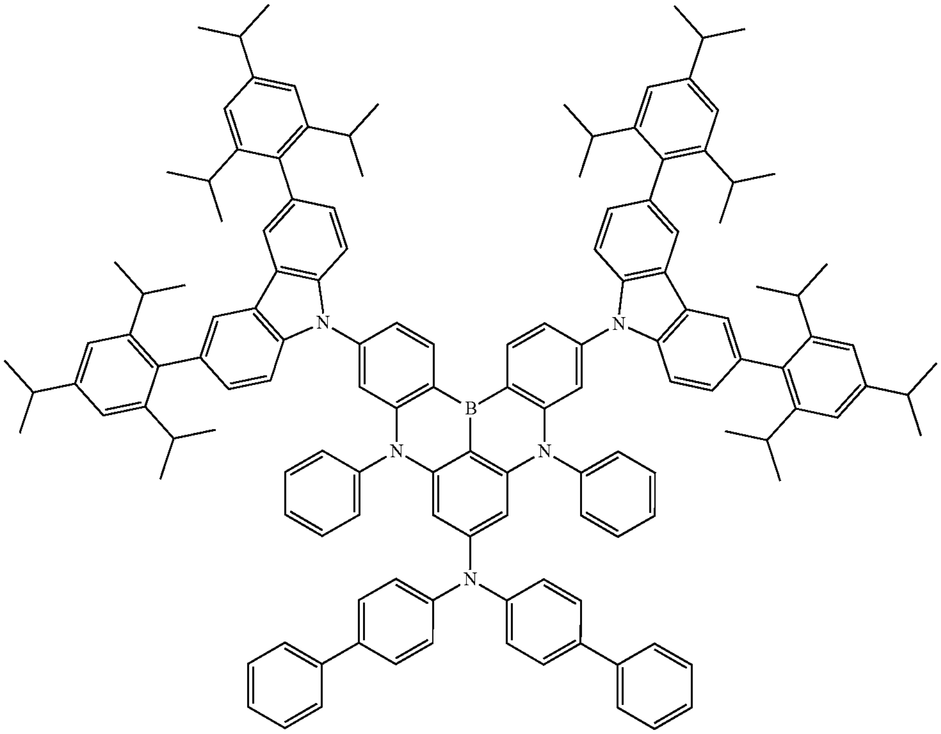
103
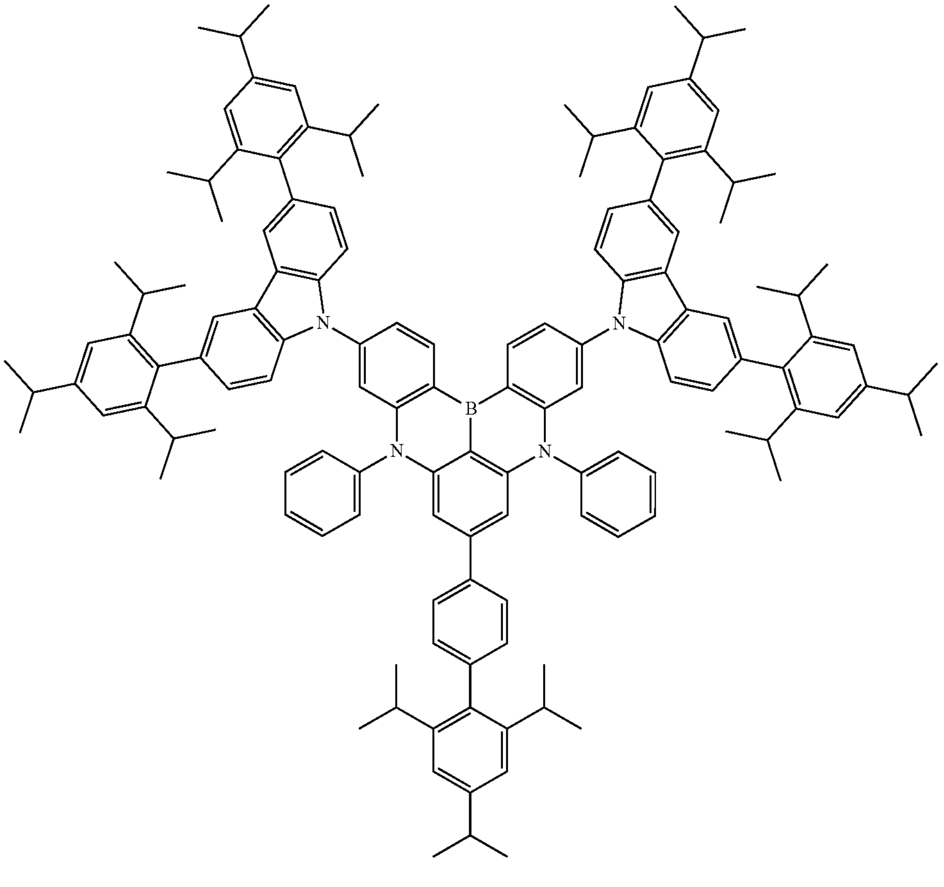

-continued
104
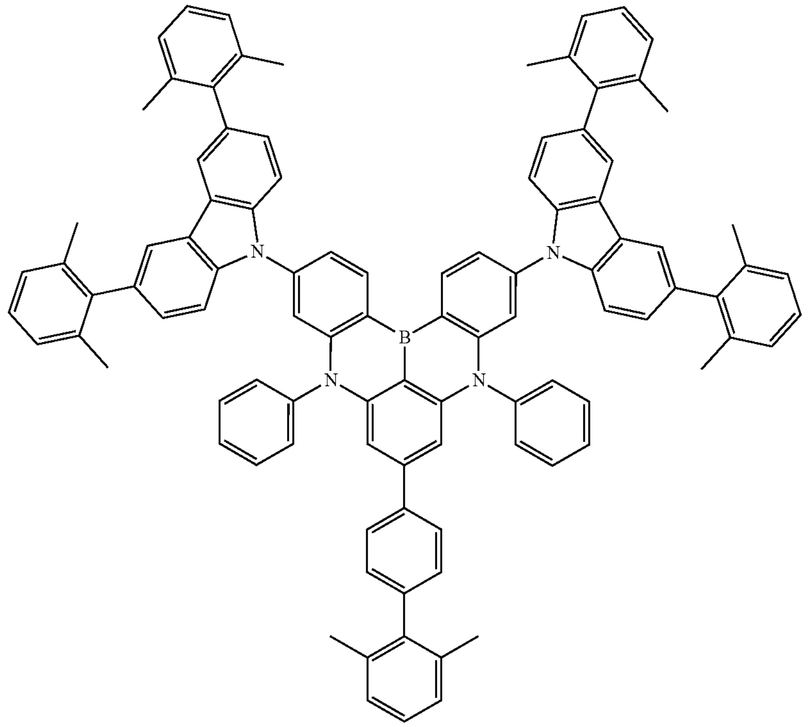
105
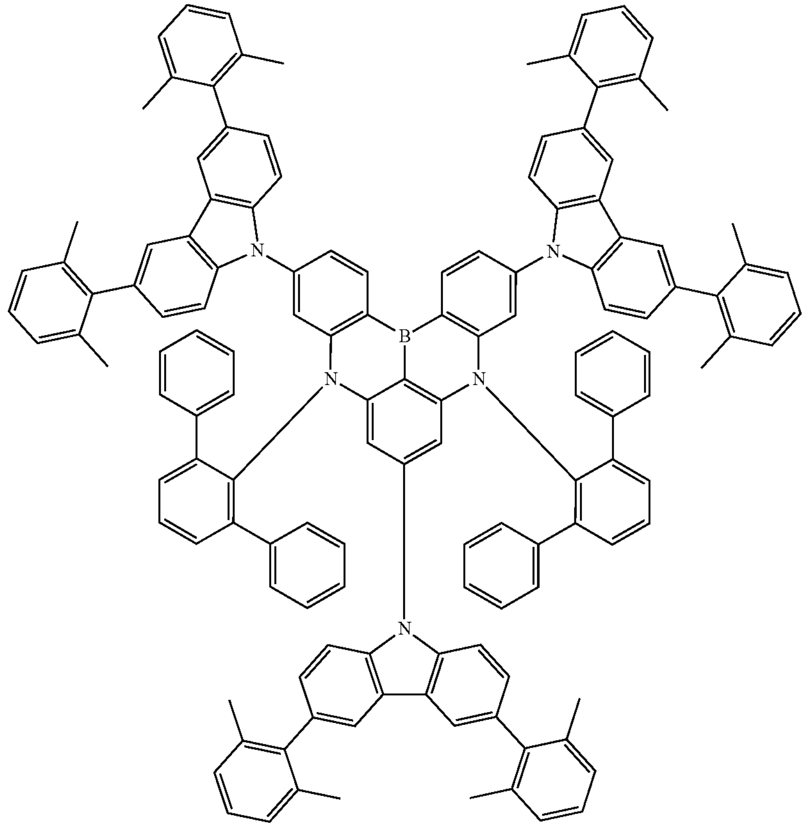

-continued
106
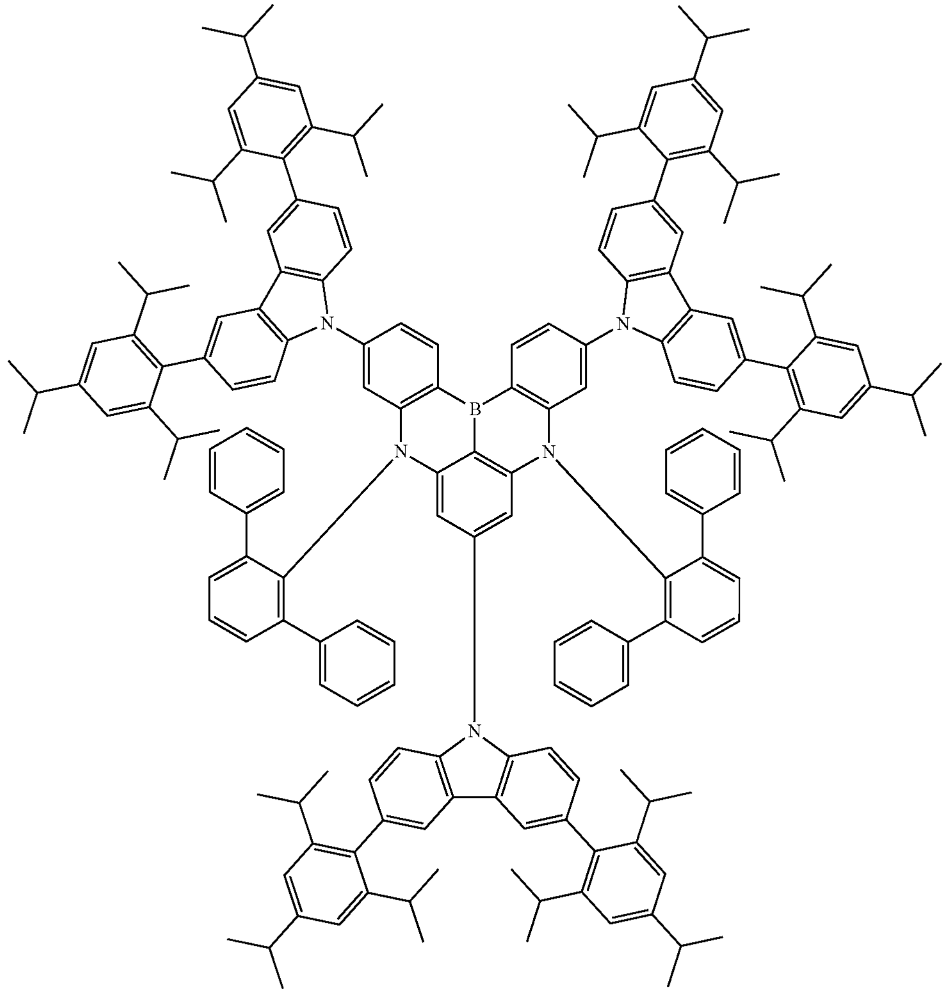

-continued
107
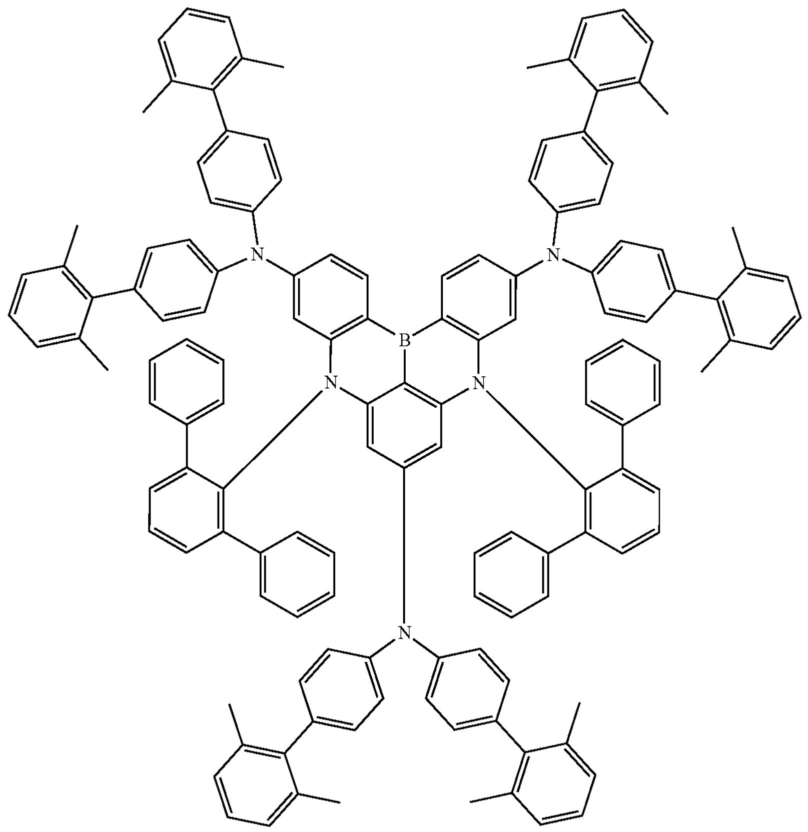

-continued
108
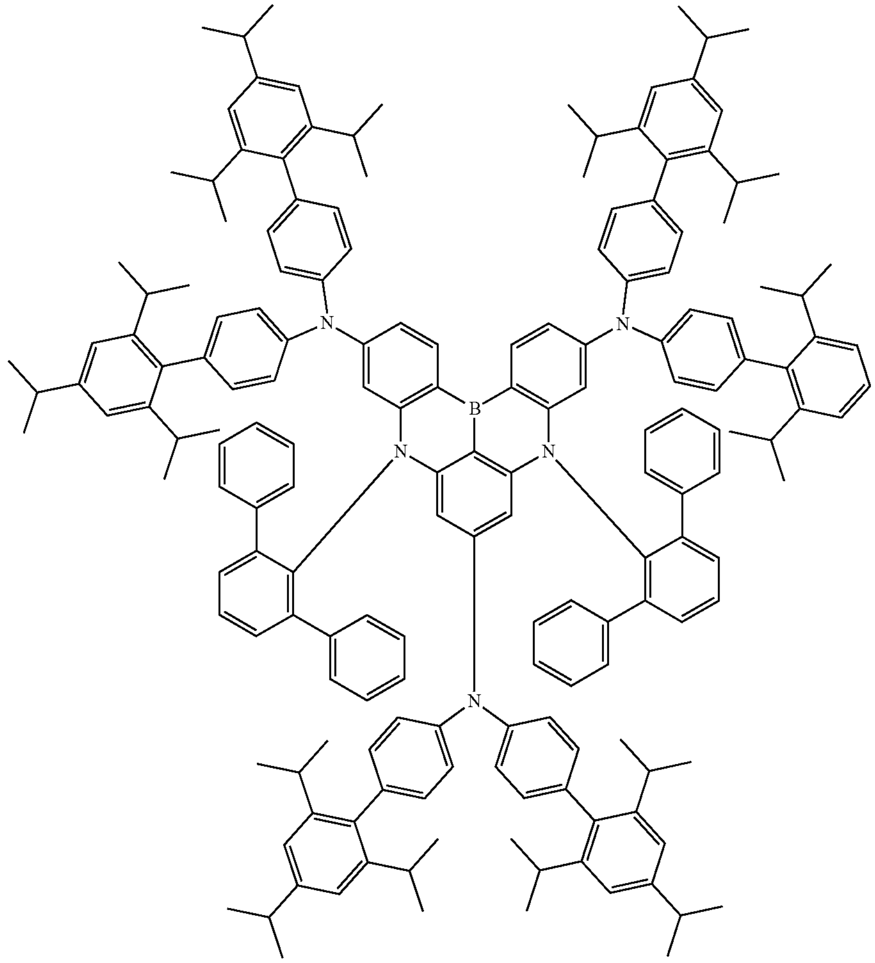
109
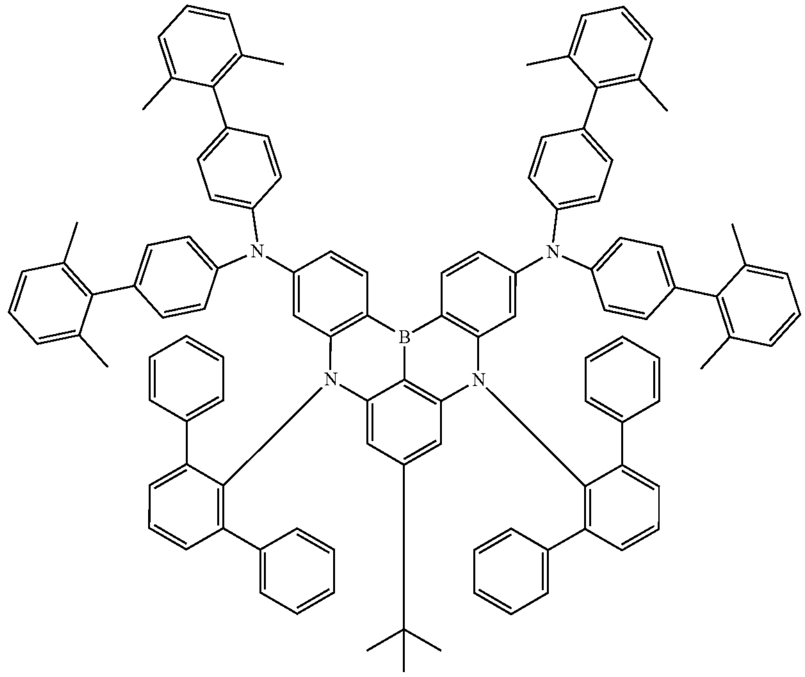

-continued
110
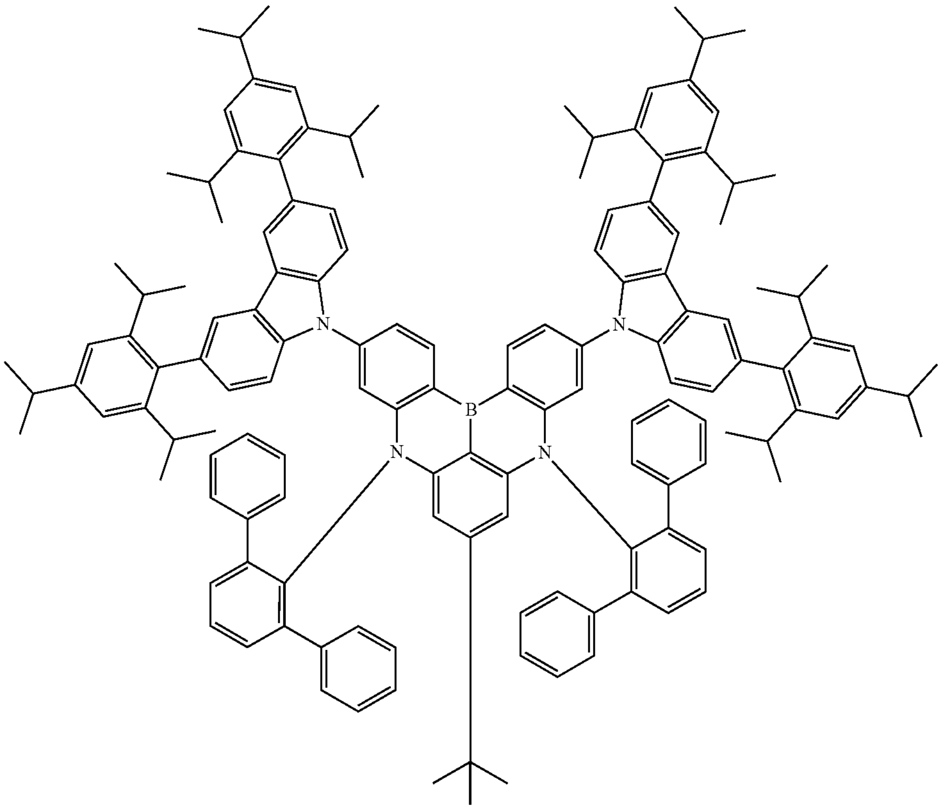
111
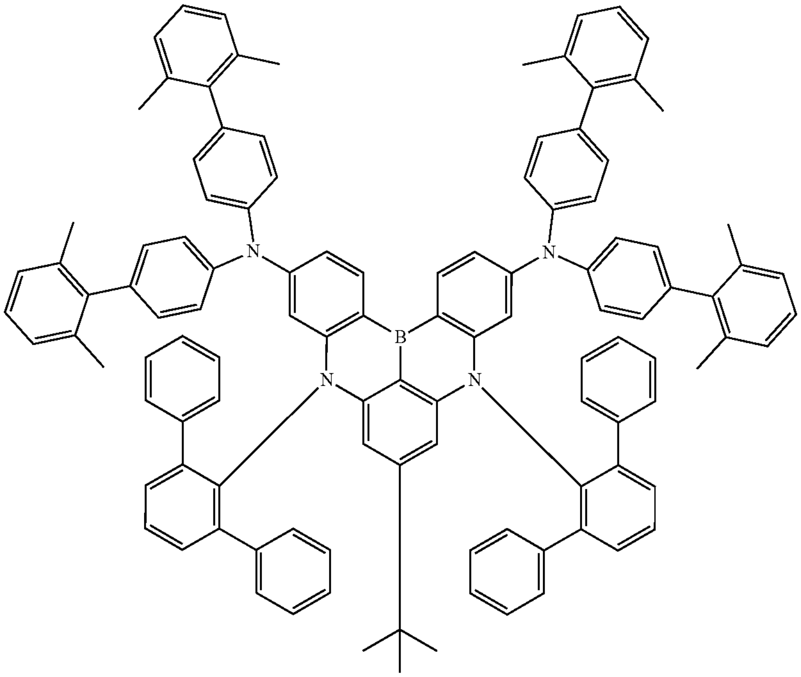

-continued
112
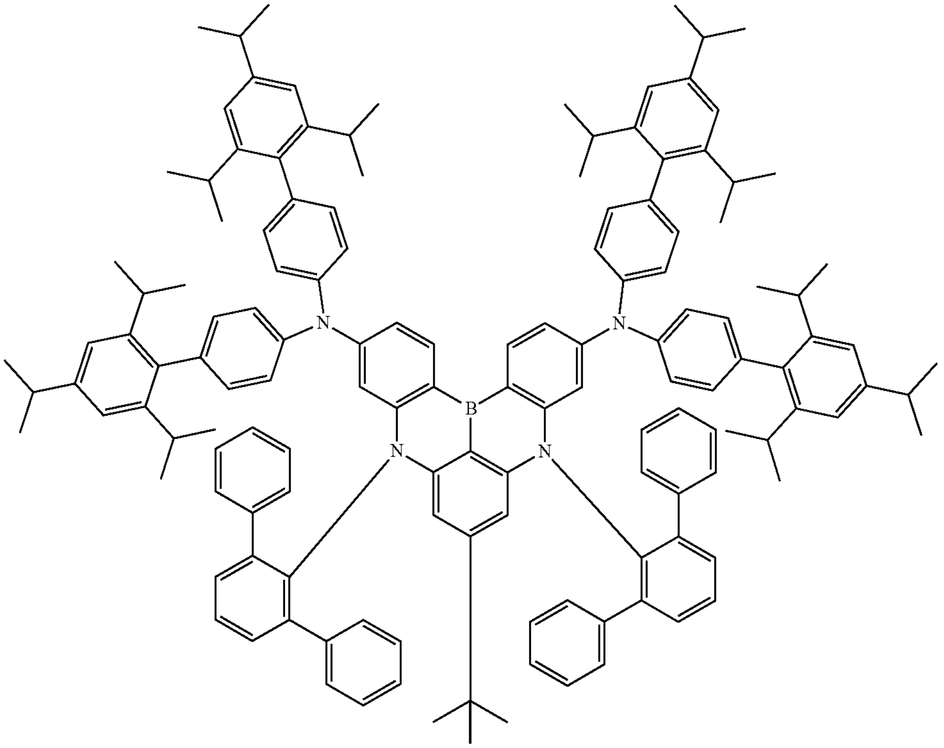
113
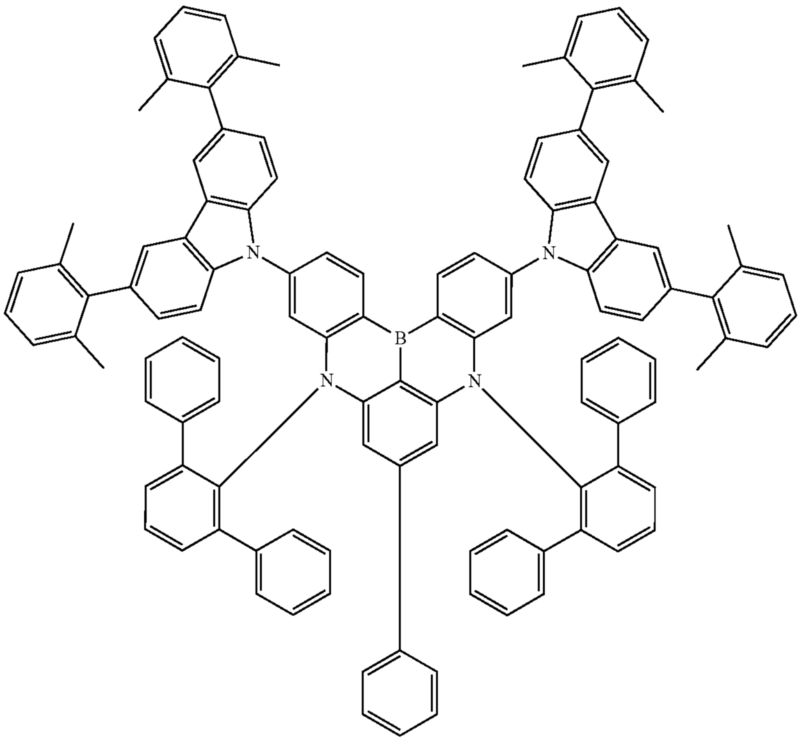

-continued
114
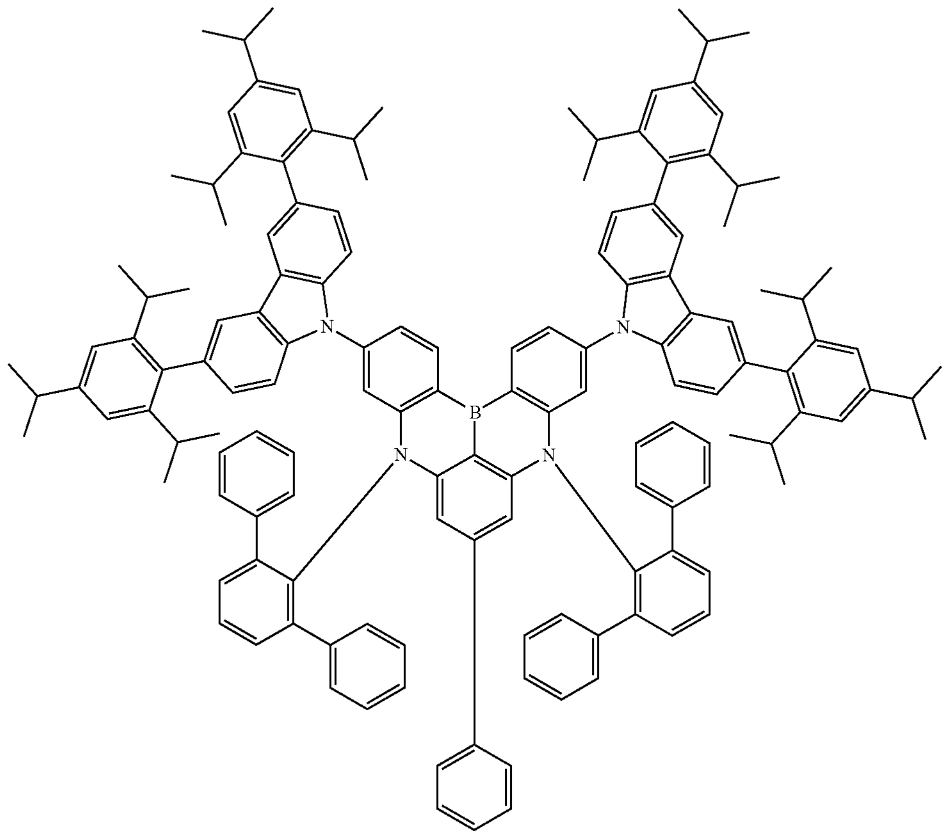
115
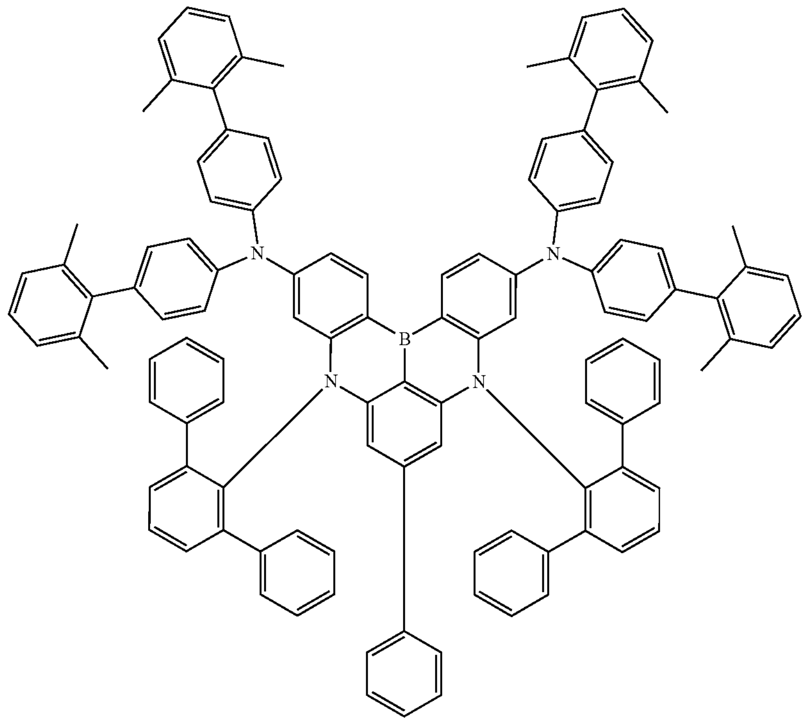

-continued
116
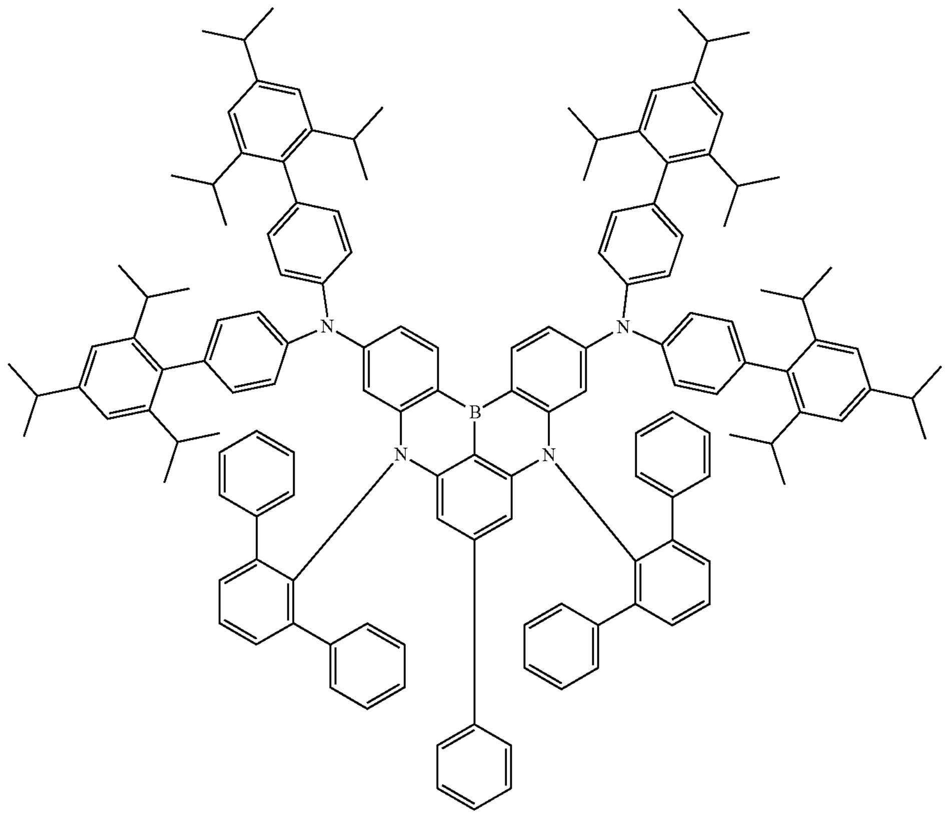
117
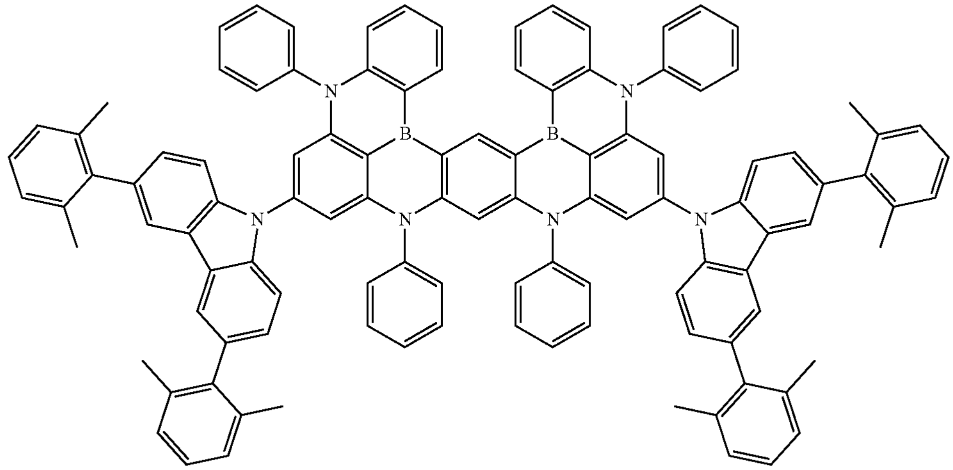

-continued
118
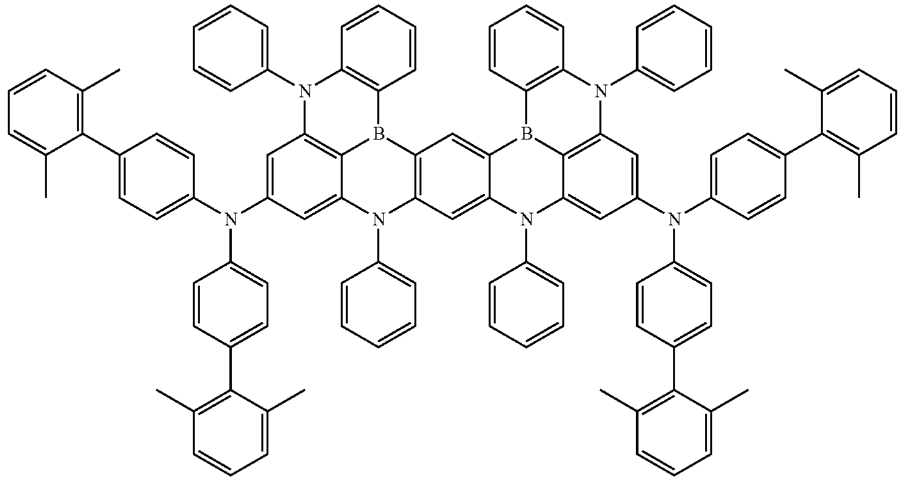
119
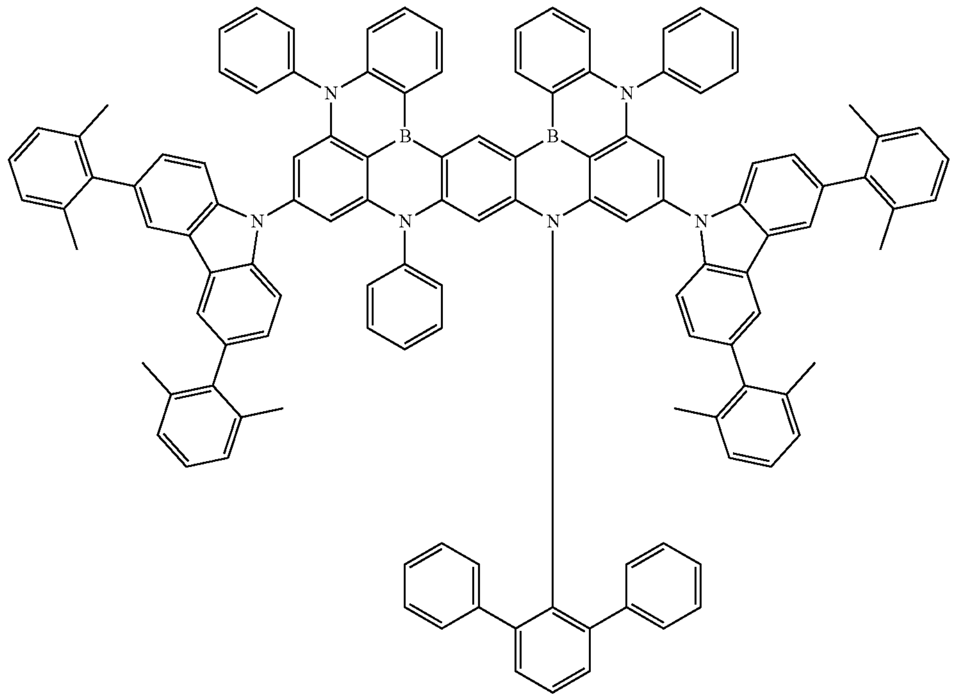

-continued
120
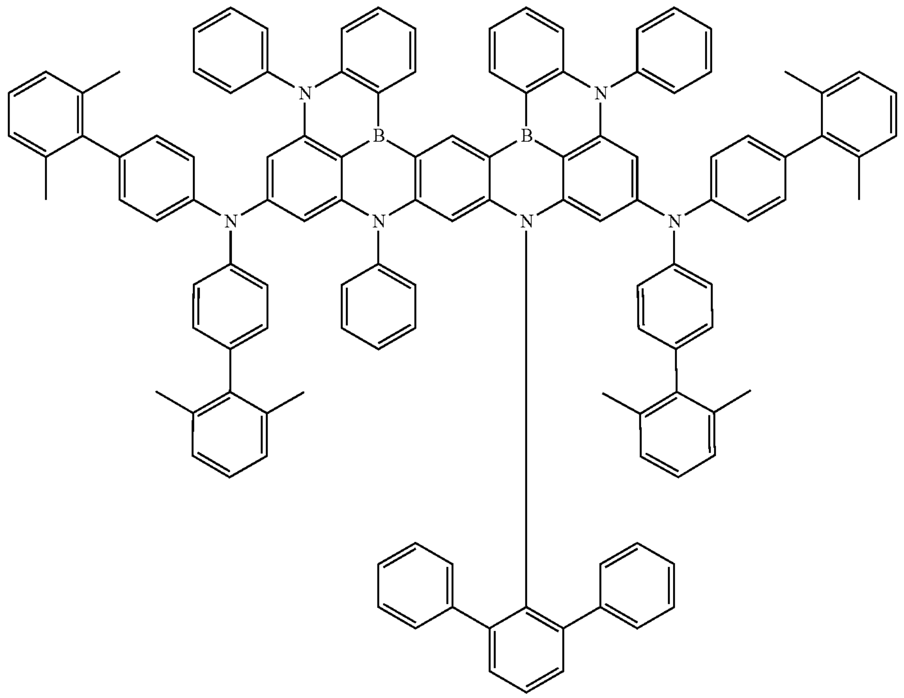
121
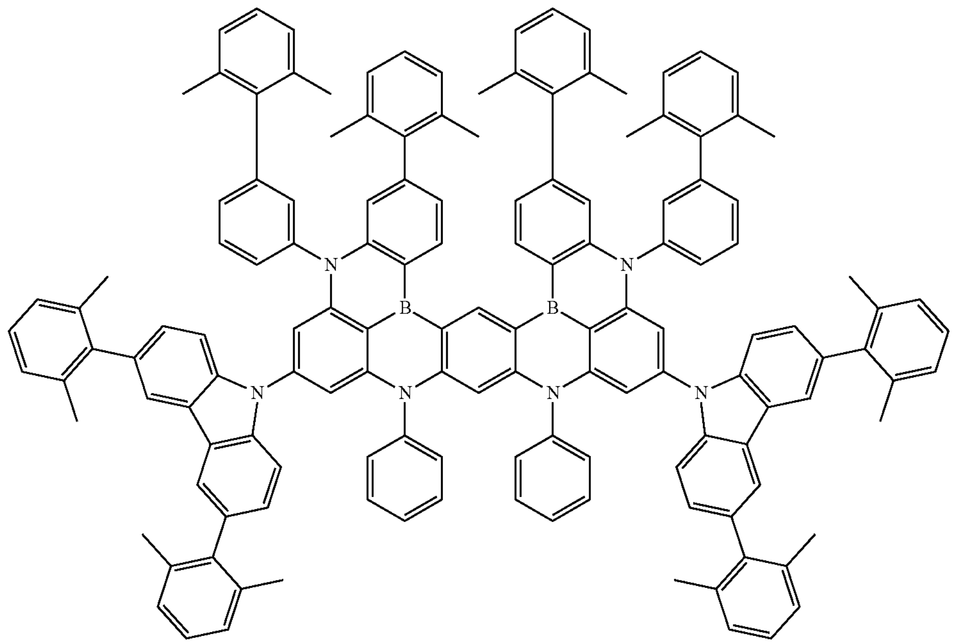

-continued
122
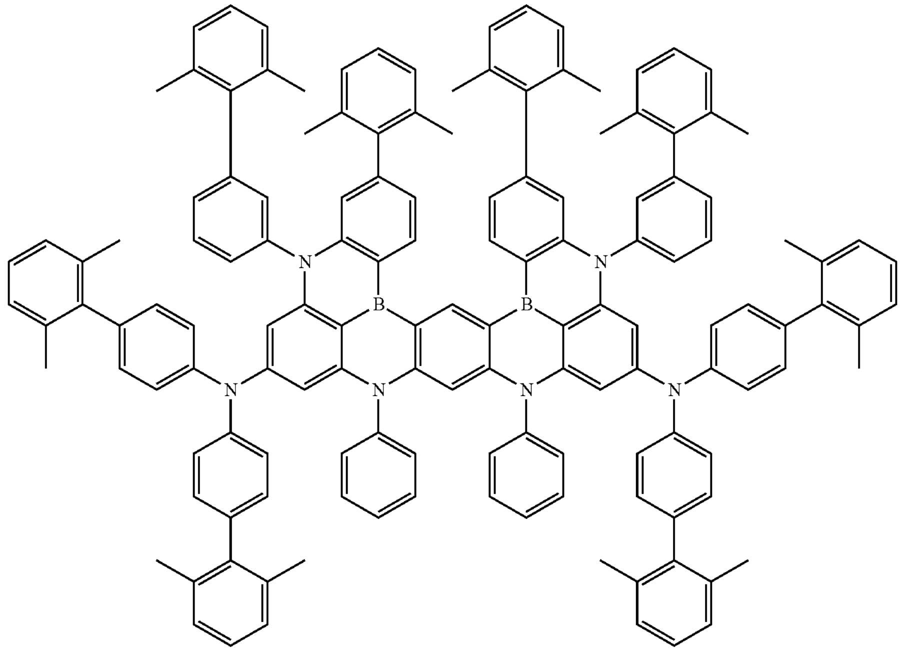
123
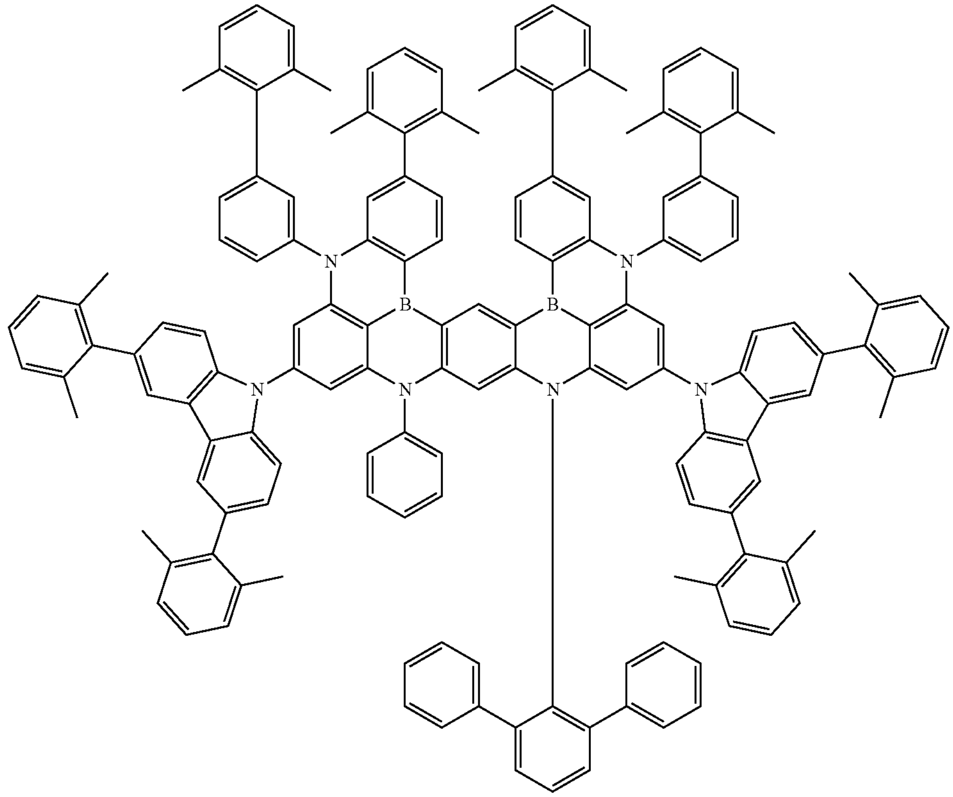

-continued
124
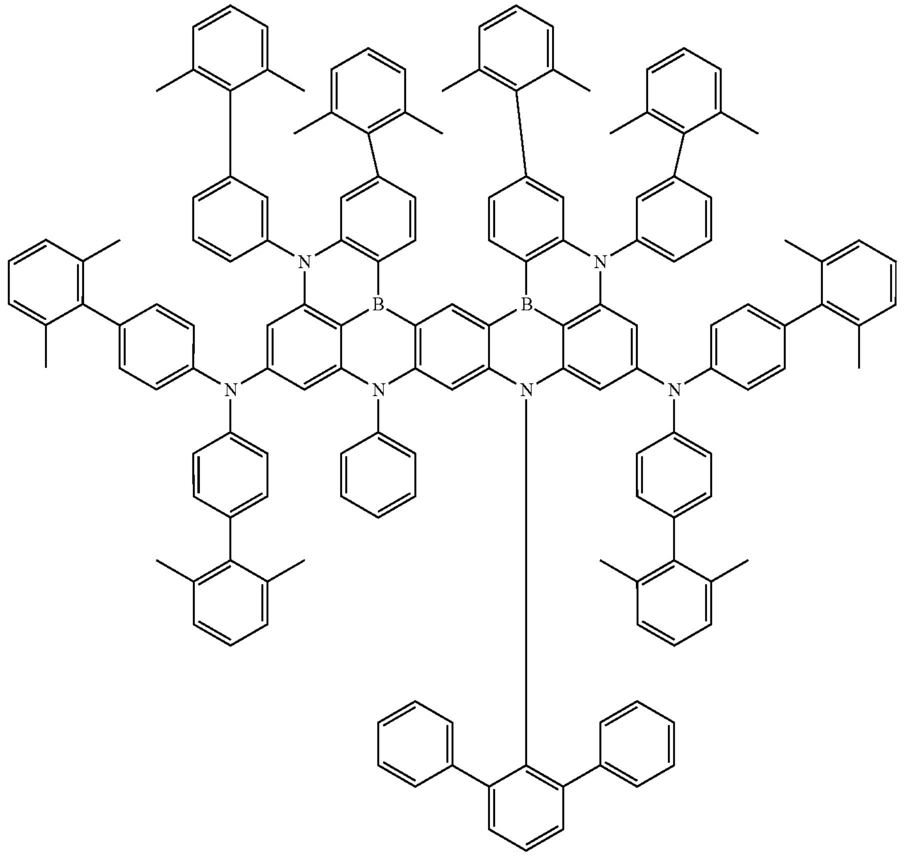
125
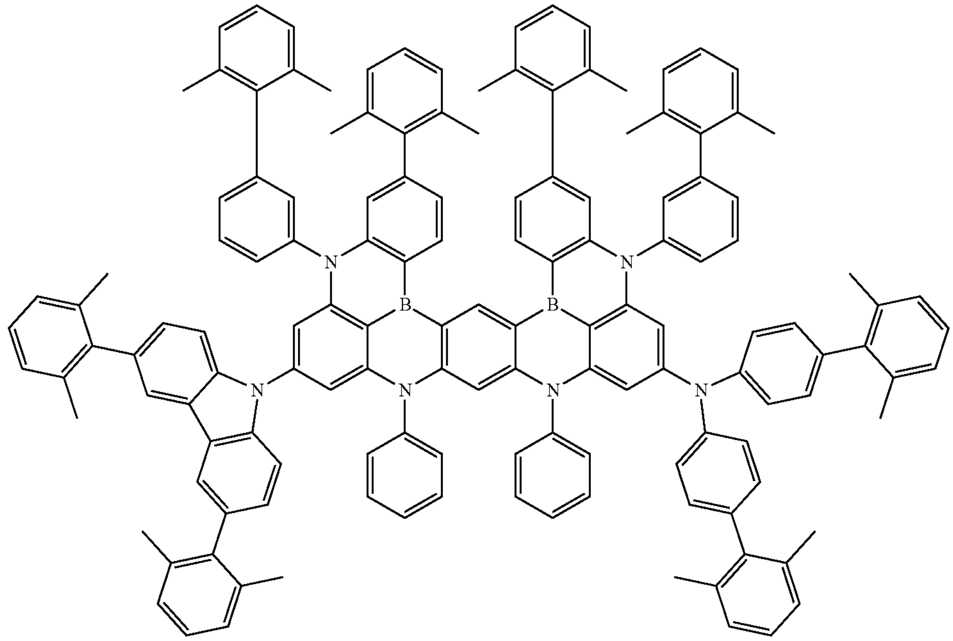

-continued
126
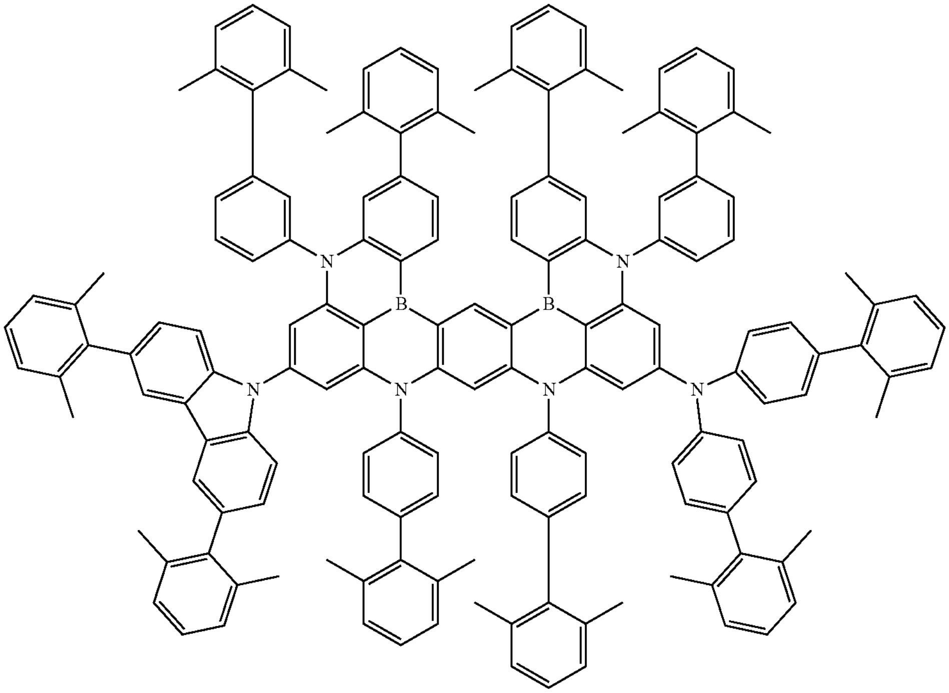
127
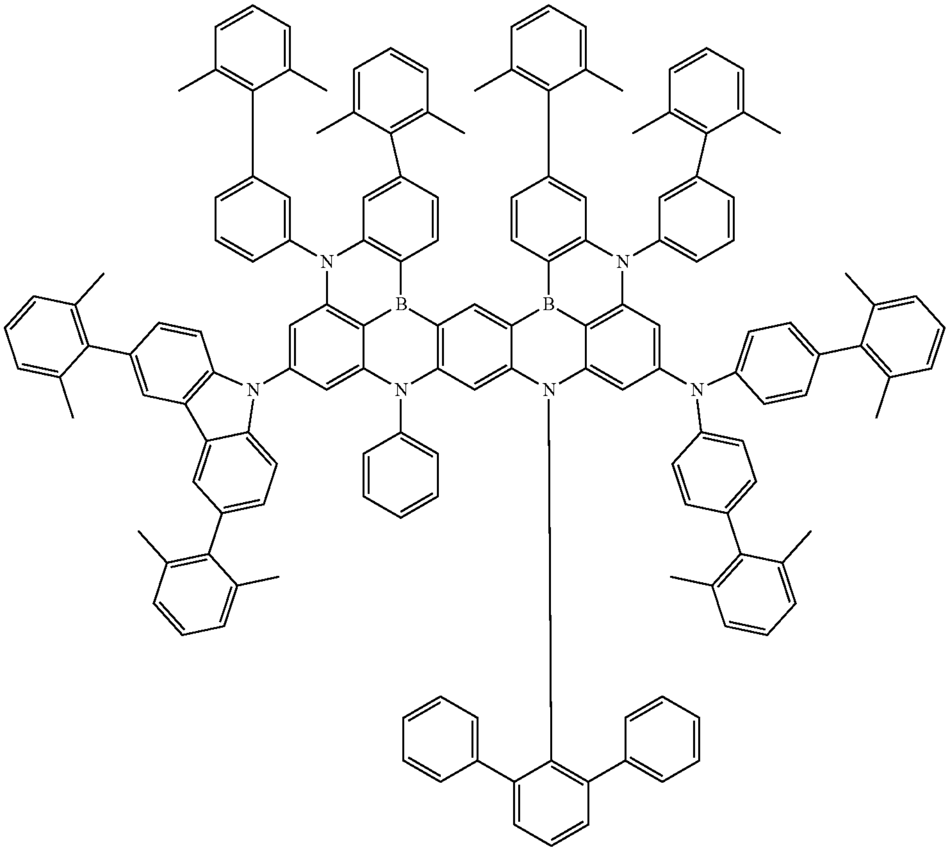

-continued
128
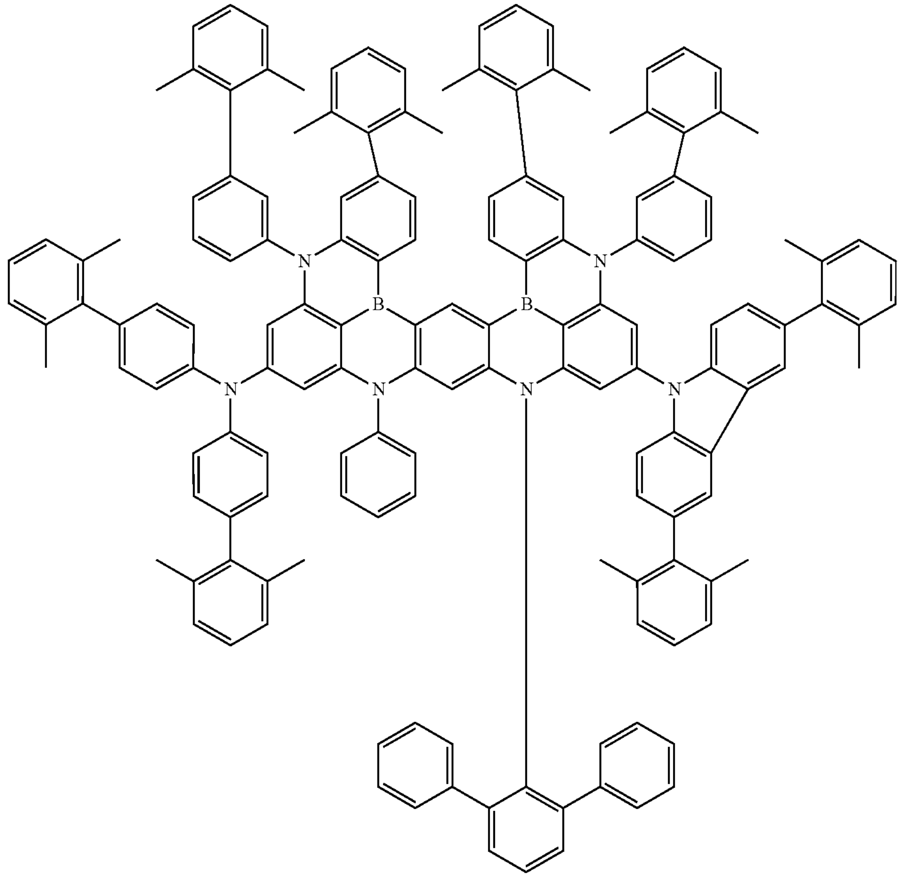
132
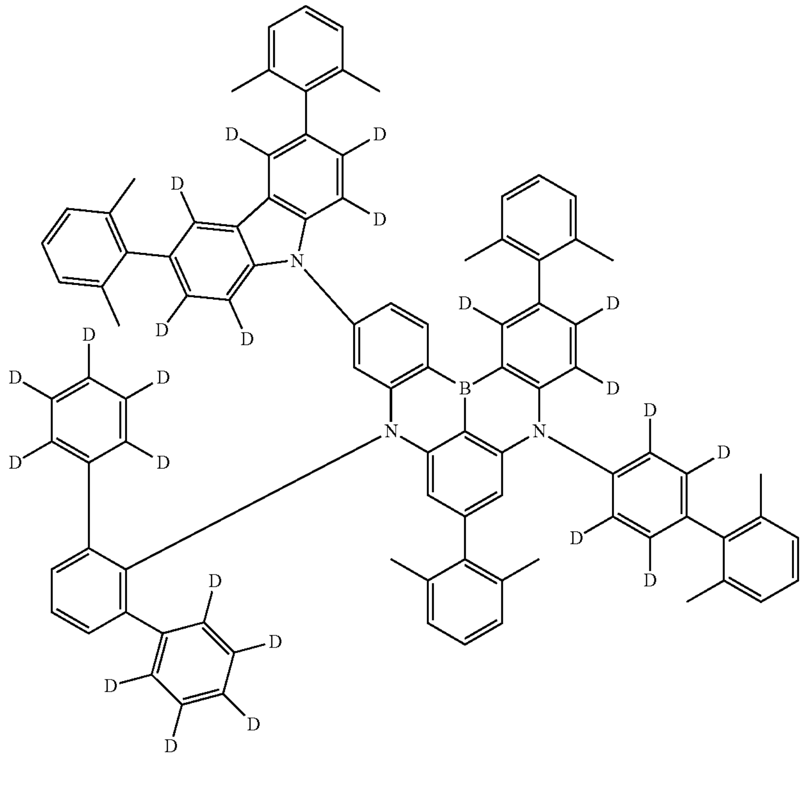

-continued
133
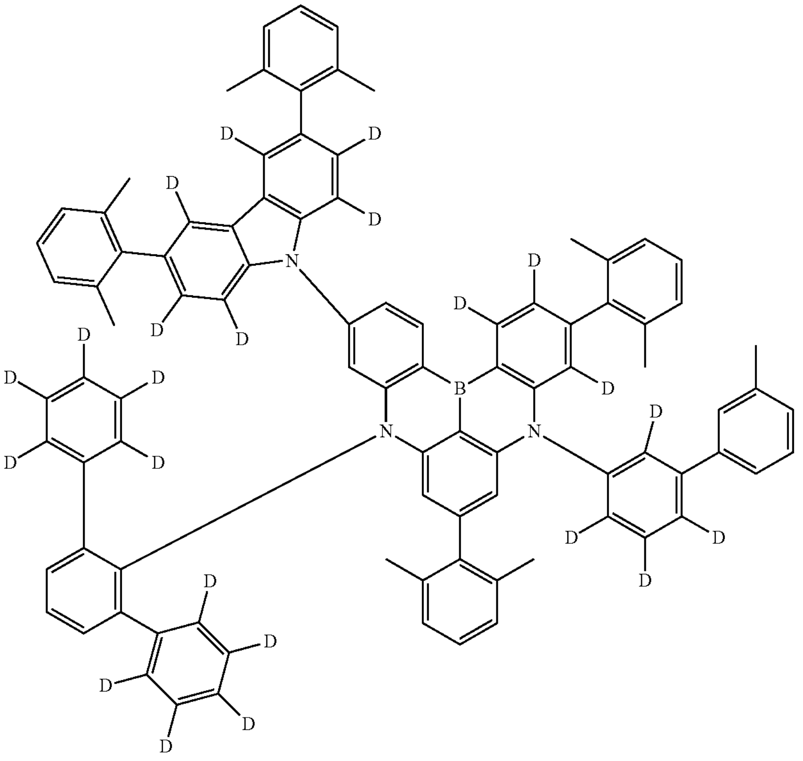
134
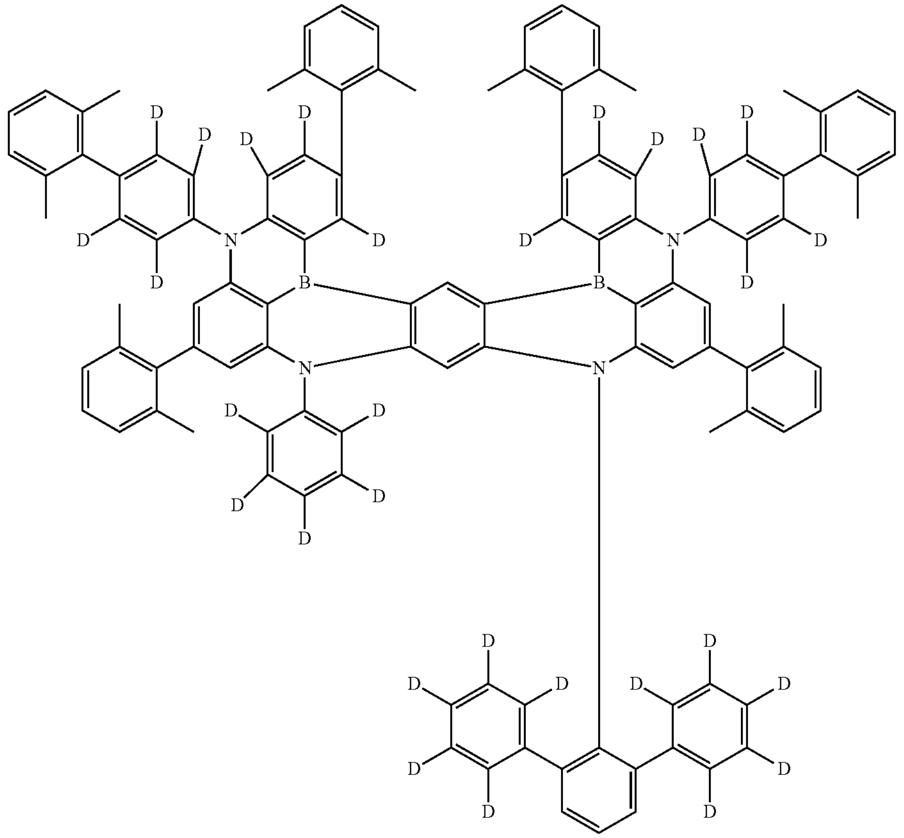

-continued
135
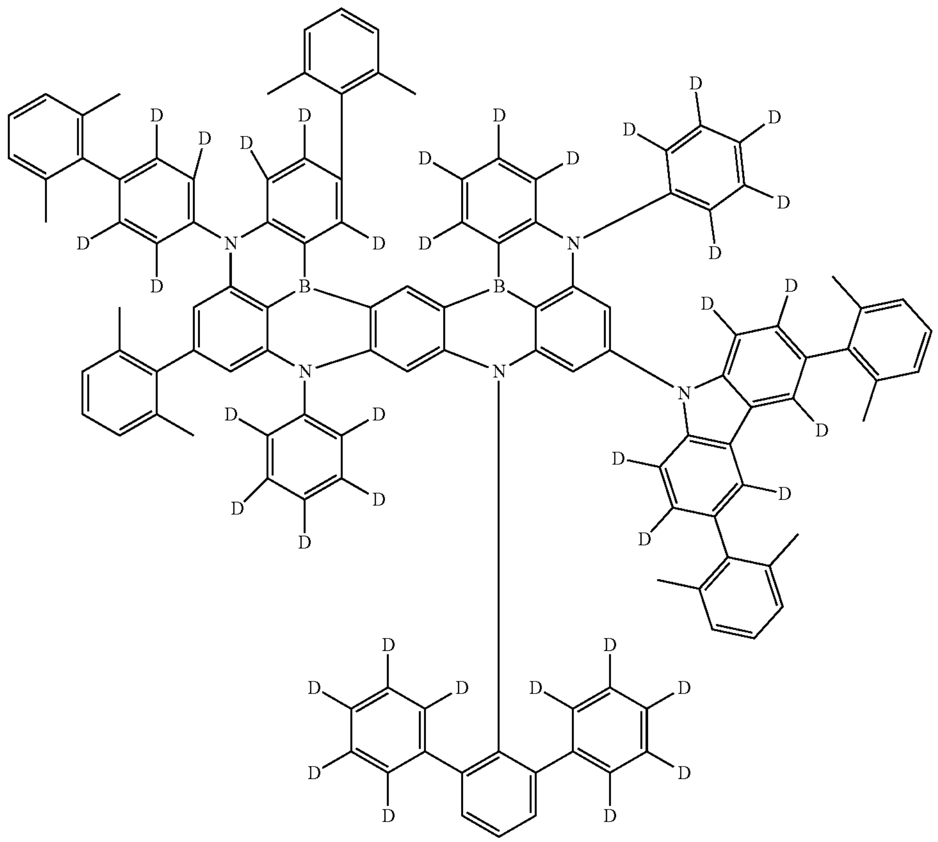
136
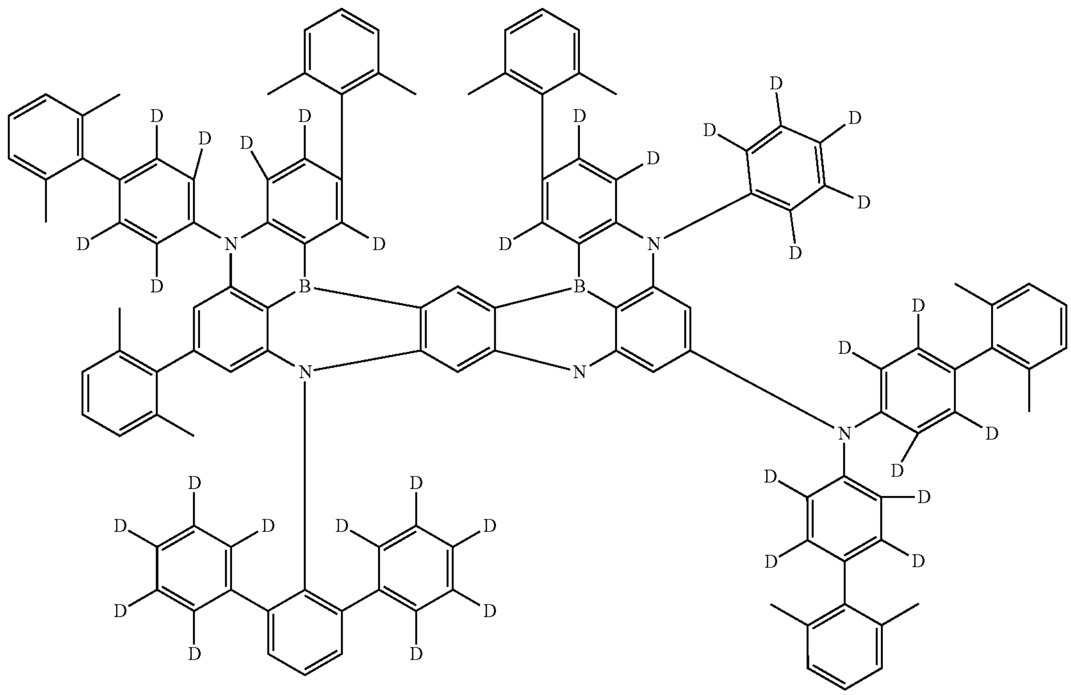

-continued
137
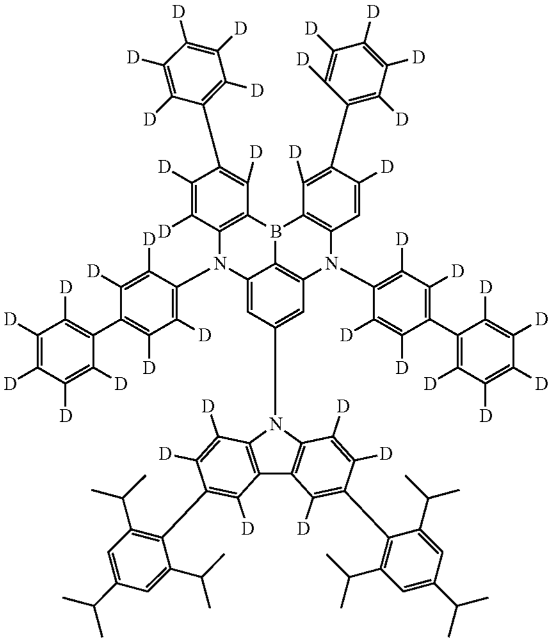
138
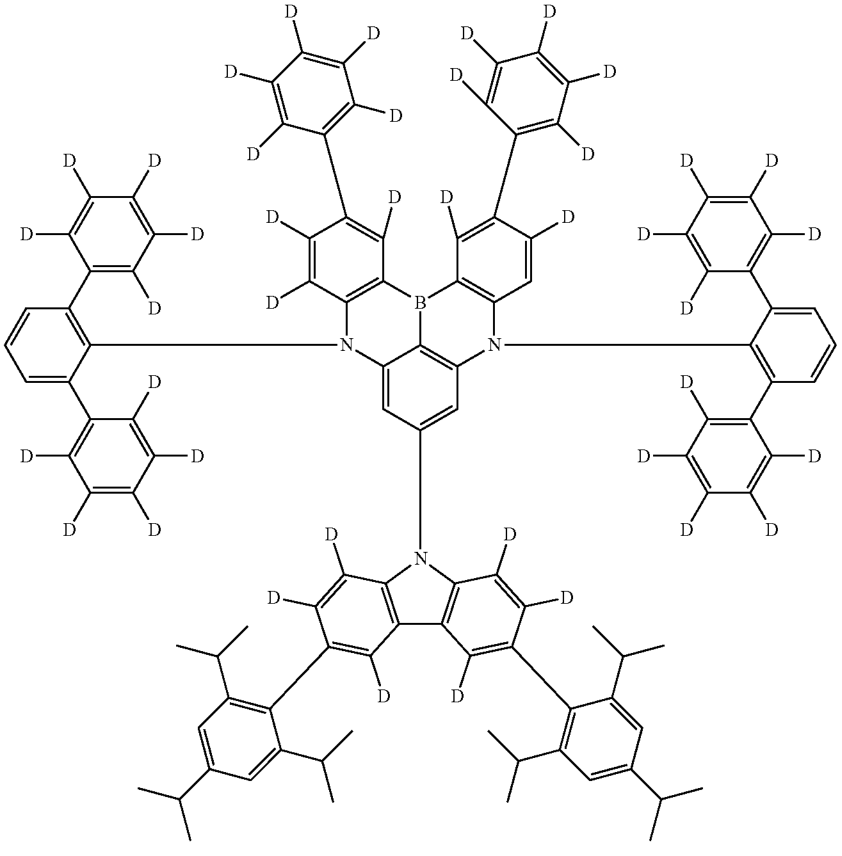

-continued

139

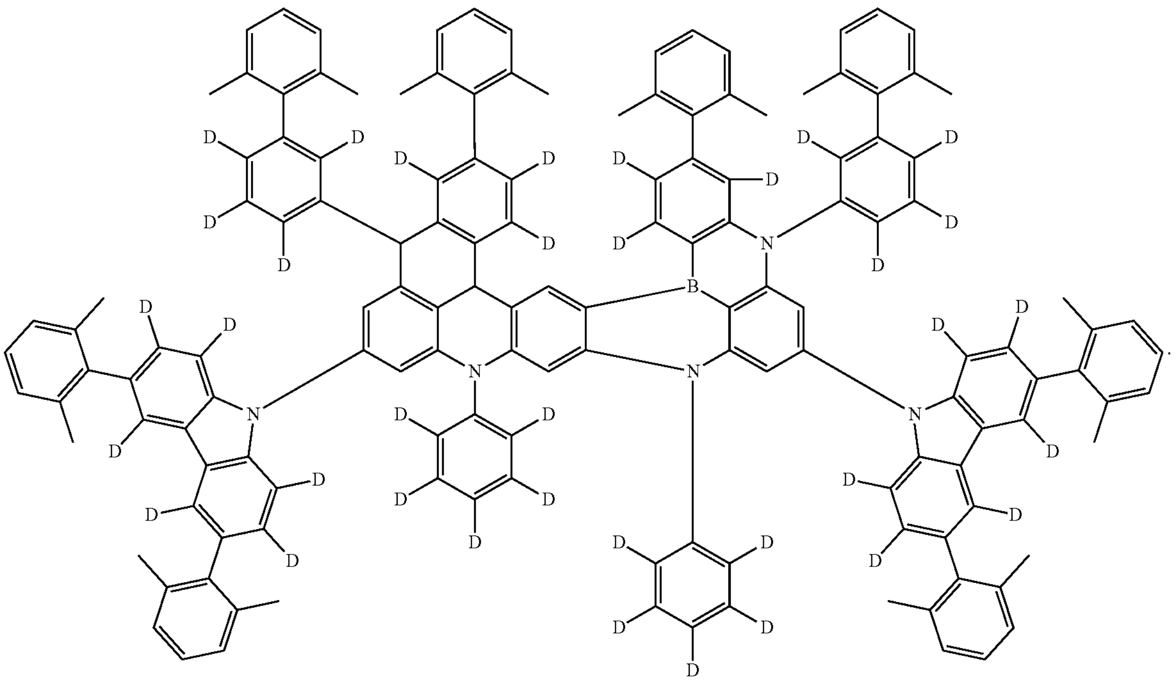

14. A fused polycyclic compound represented by Formula 1:

Formula 1

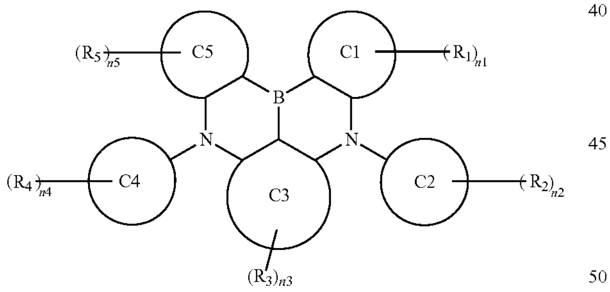

wherein, in Formula 1,

C1, C2, C4, and C5 are each independently a monocyclic aromatic hydrocarbon ring having 6 ring-forming carbon atoms, or a monocyclic aromatic heterocycle having 2 to 5 ring-forming carbon atoms, C3 is a monocyclic aromatic hydrocarbon ring having 6 ring-forming carbon atoms, or a monocyclic aromatic heterocycle having 3 to 5 ring-forming carbon atoms, $R_1$ to $R_5$ are each independently a hydrogen atom, a deuterium atom, a halogen atom, a substituted or unsubstituted boron group, a substituted or unsubstituted amine group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or are bonded to an adjacent group to form a ring, or a substituent represented by Formula 2, or a substituent represented by Formula 3, at least one selected from among $R_1$ to $R_5$ is represented by Formula 3, n1 and n5 are each independently an integer of 1 to 4, n2 and n4 are each independently an integer of 1 to 5, and n3 is an integer of 1 to 3, Formula 2

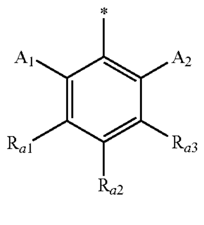

wherein, in Formula 2, $A_1$ and $A_2$ are each independently an alkyl group having 1 to 20 carbon atoms, and $R_{a1}$ to $R_{a3}$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, Formula 3

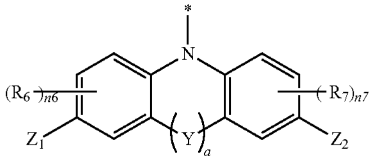

wherein, in Formula 3, a is 0 or 1, when a is 1, Y is a direct linkage, $Z_1$ and $Z_2$ are each independently represented by Formula 2, $R_6$ and $R_7$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and n6 and n7 are each independently an integer of 0 to 4.

15. The fused polycyclic compound of claim 14, wherein the fused polycyclic compound represented by Formula 1 is represented by Formula 1-1:

Formula 1-1

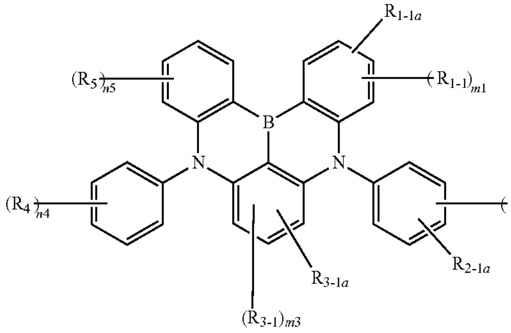

wherein, in Formula 1-1, $R_{1-1}$ to $R_{3-1}$ are each independently a hydrogen atom, a deuterium atom, a halogen atom, a substituted or unsubstituted alkyl group having 1 to 20 carbon group, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, $R_{1-1a}$ to $R_{3-1a}$ are each independently represented by Formula 2, m1 is an integer of 0 to 3, m2 is an integer of 0 to 4, m3 is an integer of 0 to 2, and $R_4$, $R_5$, n4, and n5 are the same as defined with respect to Formula 1.

16. The fused polycyclic compound of claim 15, wherein the fused polycyclic compound represented by Formula 1 is represented by Formula 1-3-1 or Formula 1-3-2:

Formula 1-3-1

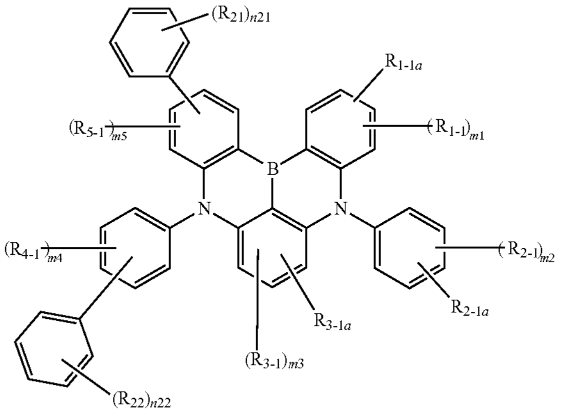

Formula 1-3-2

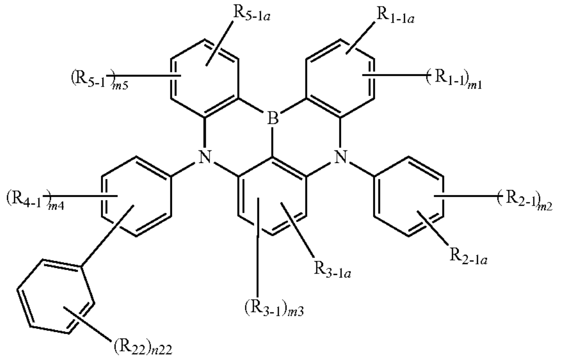

wherein, in Formula 1-3-1 and Formula 1-3-2, $R_{4-1}$ and $R_{5-1}$ are each independently a hydrogen atom, a deuterium atom, a halogen atom, a substituted or unsubstituted amine, a substituted or unsubstituted alkyl group having 1 to 20 carbon group, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, $R_{5-1a}$ is represented by Formula 3, $R_{21}$ and $R_{22}$ are each independently a hydrogen atom, a deuterium atom, a halogen atom, a substituted or unsubstituted alkyl group having 1 to 20 carbon group, a substituted or unsubstituted aryl group having 6 to 30 ring-forming carbon atoms, or a substituted or unsubstituted heteroaryl group having 2 to 30 ring-forming carbon atoms, m4 is an integer of 0 to 4, m5 is an integer of 0 to 3, n21 and n22 are each independently an integer of 0 to 5, and $R_{1-1}$ to $R_{3-1}$, $R_{1-1a}$ to $R_{3-1a}$, and m1 to m3 are the same as defined with respect to Formula 1 and Formula 1-1.

17. The fused polycyclic compound of claim 14, wherein the fused polycyclic compound represented by Formula 1 is represented by Formula 1-4-1 or Formula 1-4-2:

Formula 1-4-1

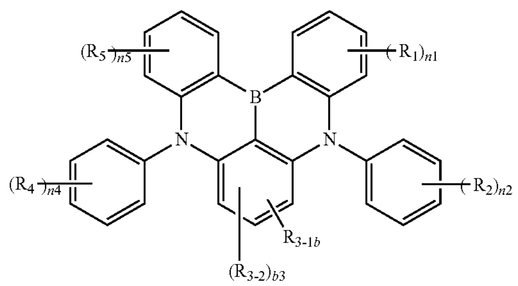

Formula 1-4-2

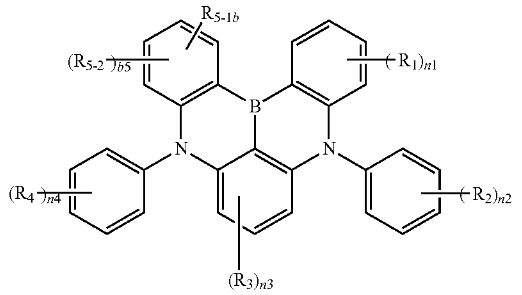

wherein, in Formula 1-4-1 and Formula 1-4-2, $R_{3-2}$ and $R_{5-2}$ are each independently a hydrogen atom, a deuterium atom, a halogen atom, a substituted or unsubstituted alkyl group having 1 to 20 carbon group, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, $R_{3-1b}$ and $R_{5-1b}$ are each independently represented by Formula 3, b3 is an integer of 0 to 2, b5 is an integer of 0 to 3, and $R_1$ to $R_5$, and n1 to n5 are the same as defined with respect to Formula 1.

18. The fused polycyclic compound of claim 14, wherein the fused polycyclic compound represented by Formula 1 is represented by Formula 1-5-1 or Formula 1-5-2:

Formula 1-5-1

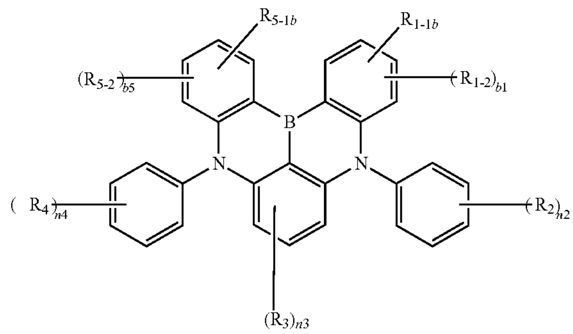

-continued

Formula 1-5-2

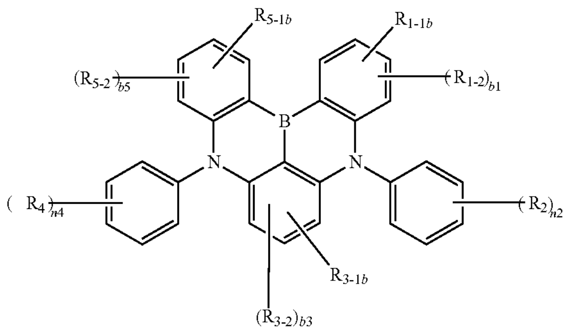

wherein, in Formula 1-5-1 and Formula 1-5-2, $R_{1-2}$, $R_{3-2}$, and $R_{5-2}$ are each independently a hydrogen atom, a deuterium atom, a halogen atom, a substituted or unsubstituted alkyl group having 1 to 20 carbon group, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, $R_{1-1b}$, $R_{3-1b}$ and $R_{5-1b}$ are each independently represented by Formula 3, b1 and b5 are each independently an integer of 0 to 3, b3 is an integer of 0 to 2, and $R_2$ to $R_4$, and n2 to n4 are the same as defined with respect to Formula 1.

19. The fused polycyclic compound of claim 14, wherein the fused polycyclic compound represented by Formula 1 is represented by Formula 1-6:

Formula 1-6

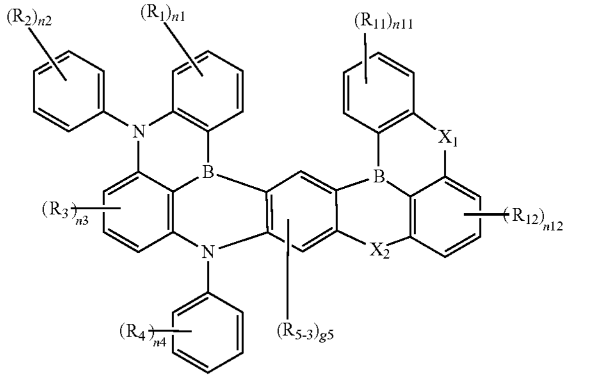

wherein, in Formula 1-6, $X_1$ and $X_2$ are each independently $NR_{13}$ or O, $R_{5-3}$, and $R_{11}$ to $R_{13}$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 30 ring-forming carbon atoms, a substituted or unsubstituted heteroaryl group of 2 to 30 ring-forming carbon atoms, the substituent represented by Formula 2, or the substituent represented by Formula 3, n11 is an integer of 0 to 4, n12 is an integer of 0 to 3, g5 is an integer of 0 to 2, and
$R_1$ to $R_4$, and n1 to n4 are the same as defined with respect to Formula 1.
20. A fused polycyclic compound, wherein the fused polycyclic compound is represented by one selected from among compounds in Compound Group 1:
Compound Group 1
1
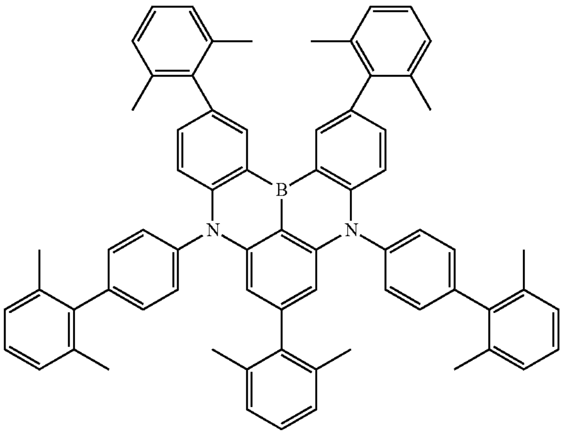
2
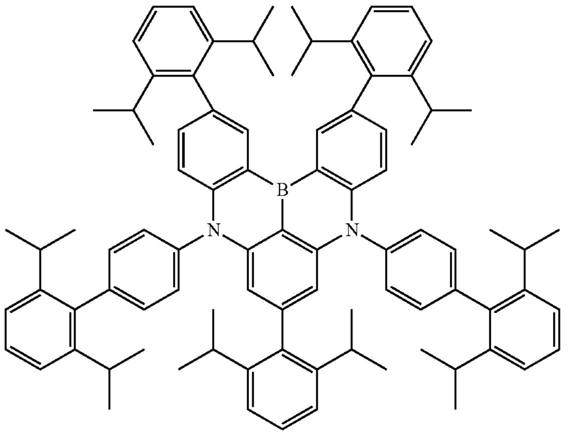
3
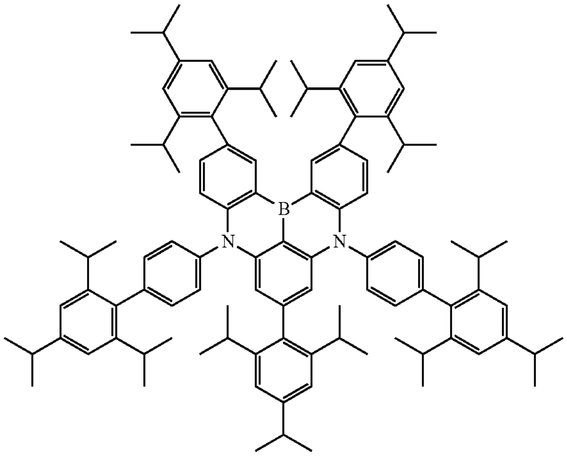
4
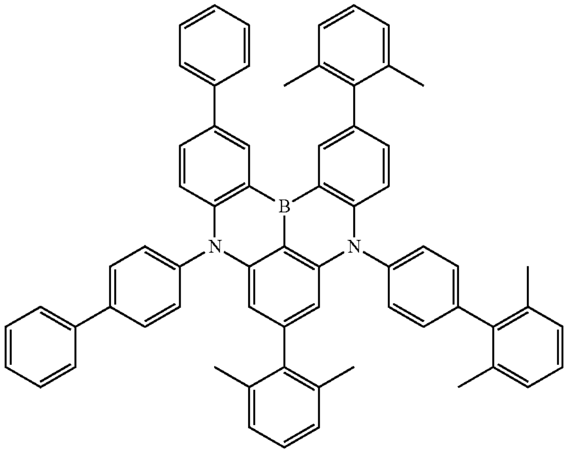
5
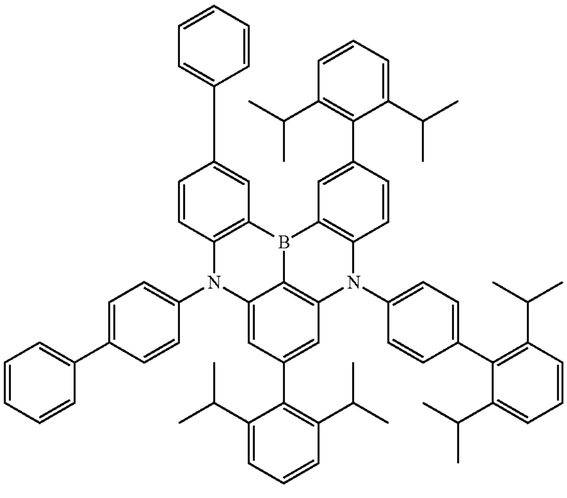
6
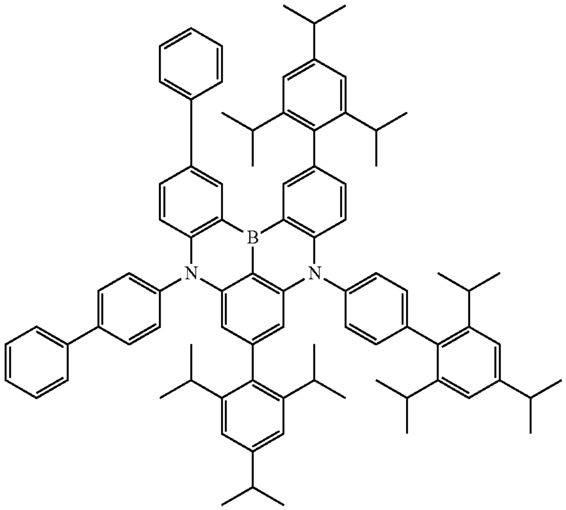

-continued
7
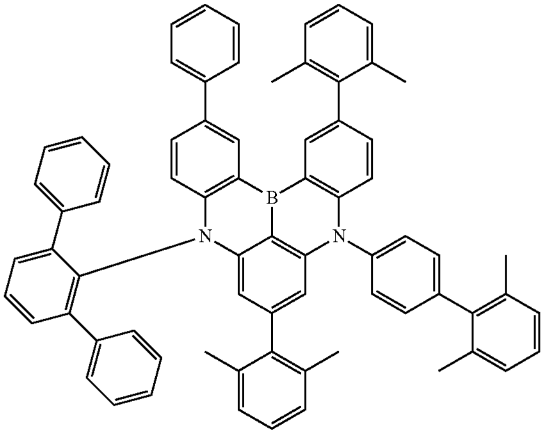
8
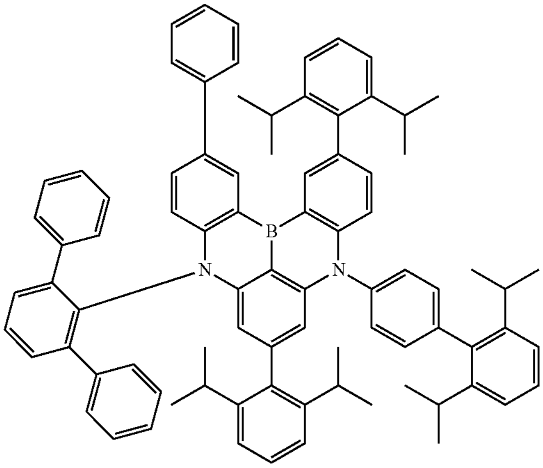
9
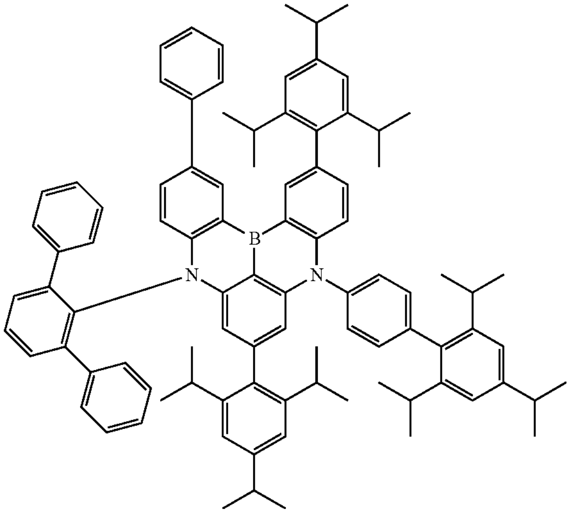
10
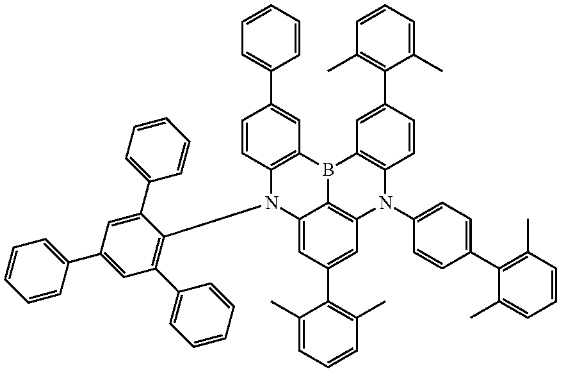
11
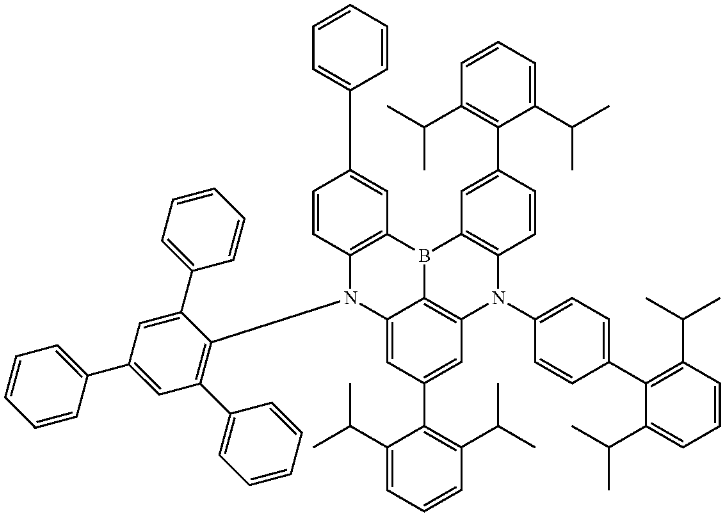

-continued
12
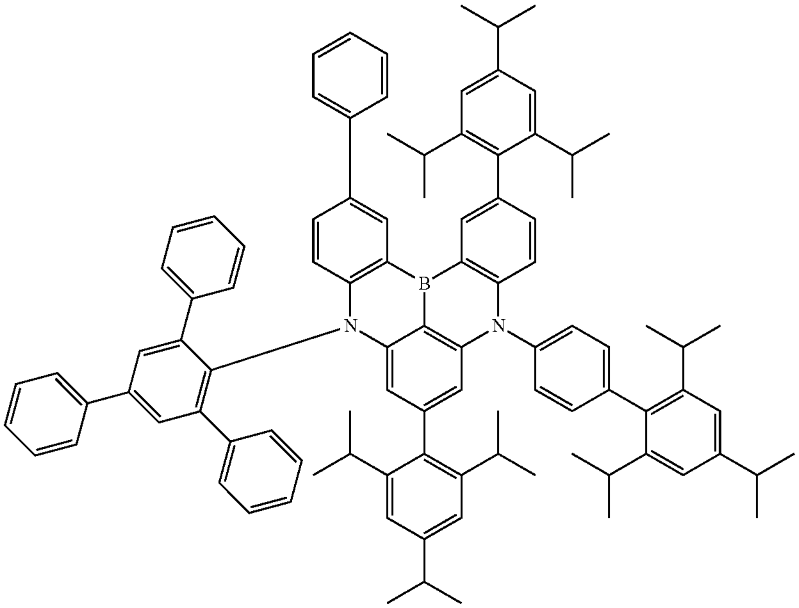
13
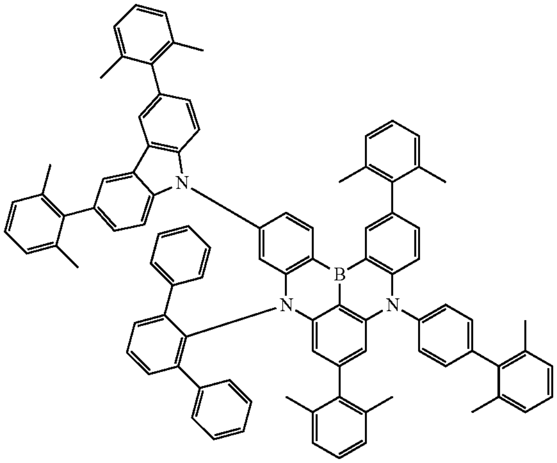
14
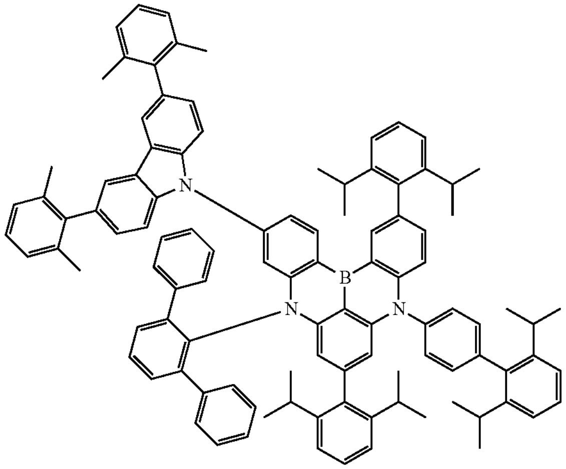
15
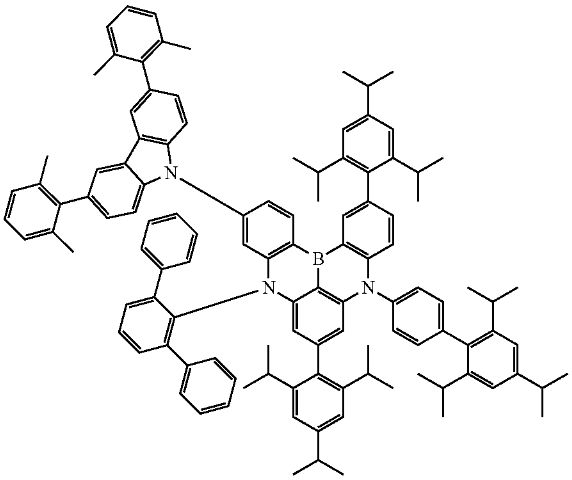
16
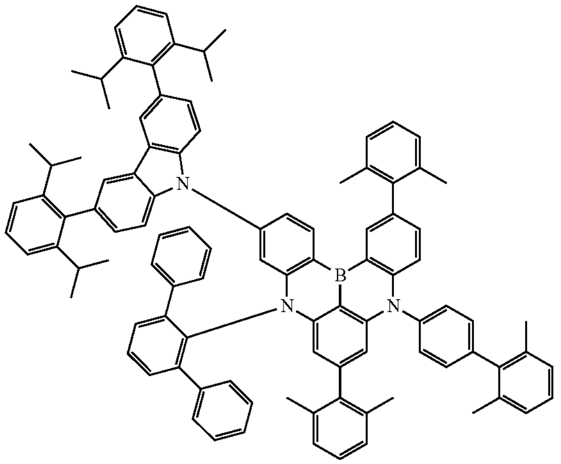

-continued
17
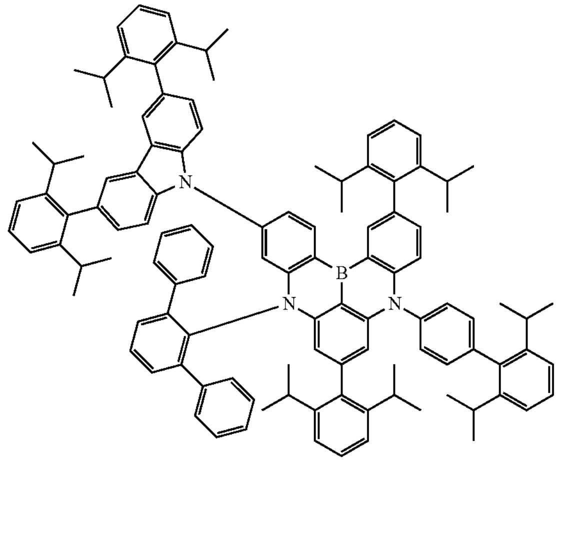
18
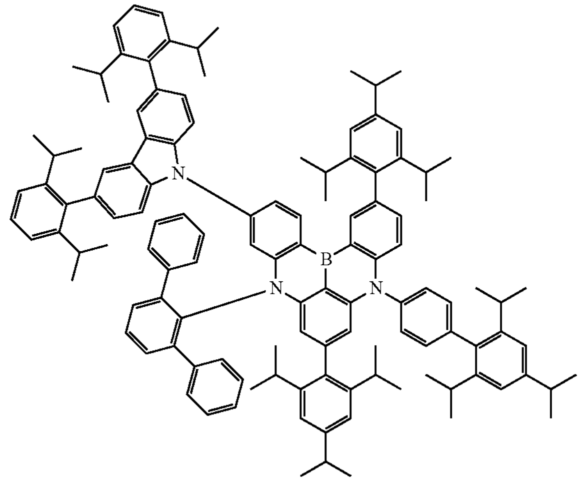
19
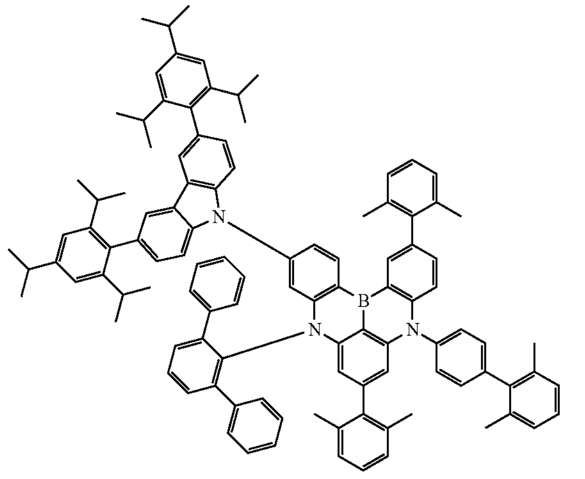
20
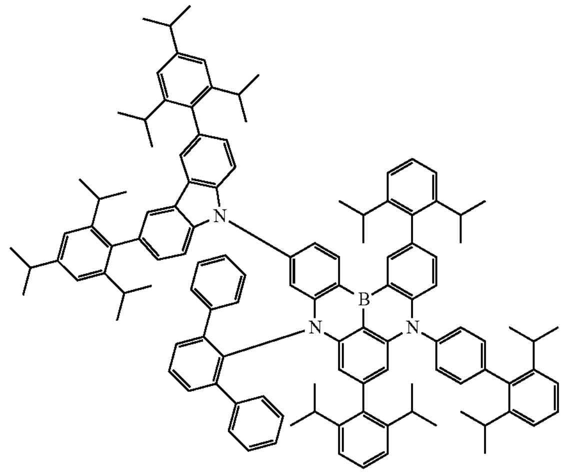
21
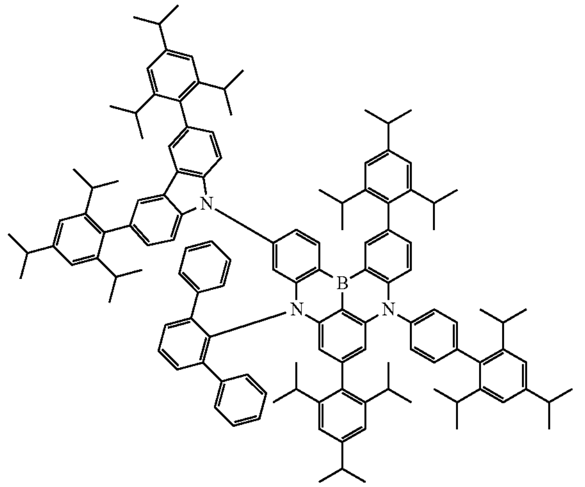
22
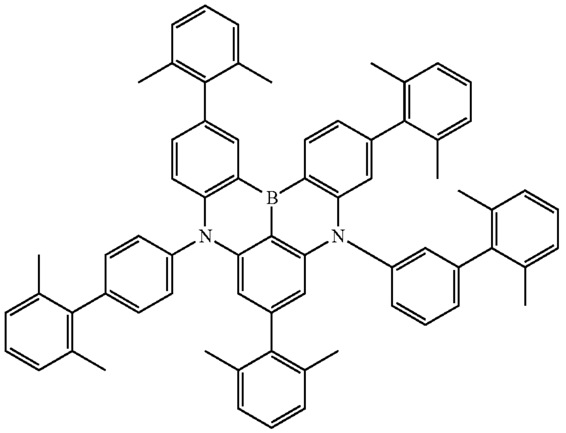

-continued
23
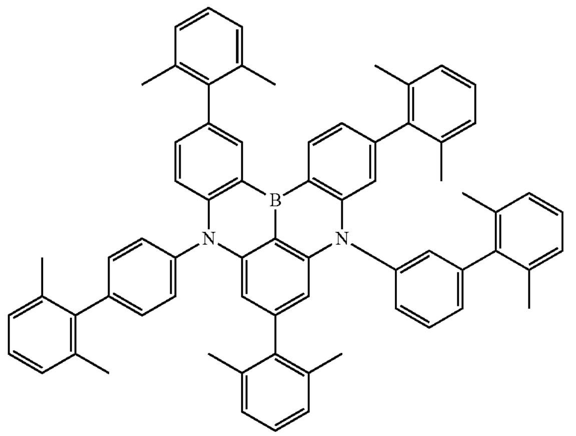
24
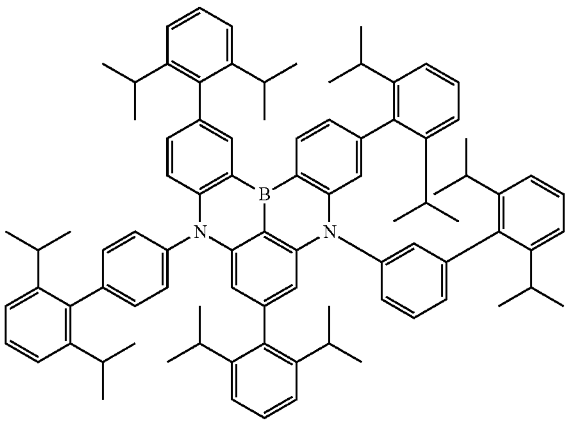
25
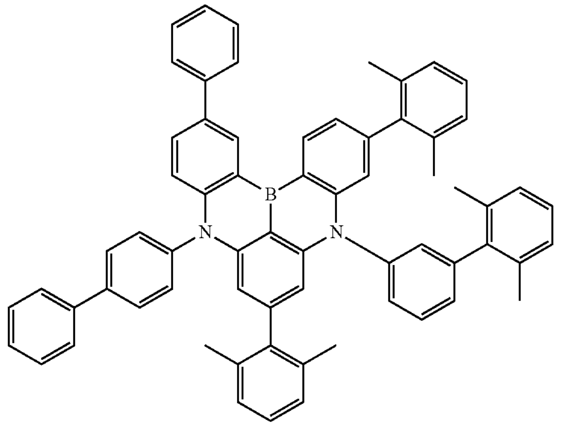
26
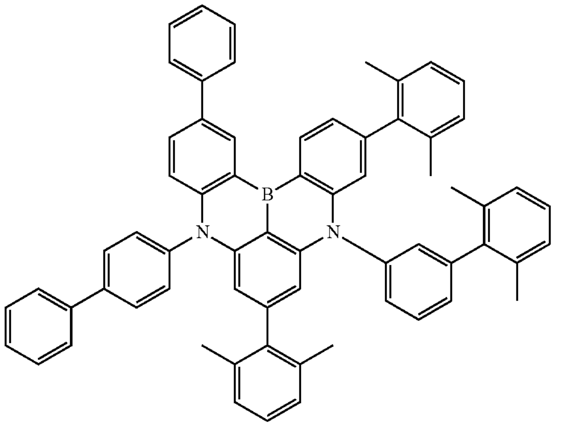
27
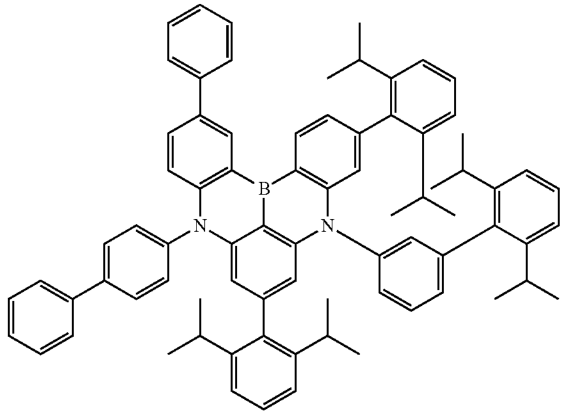
28
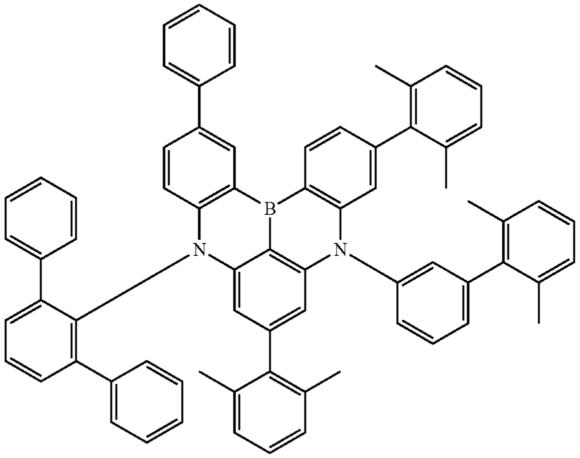

-continued
29
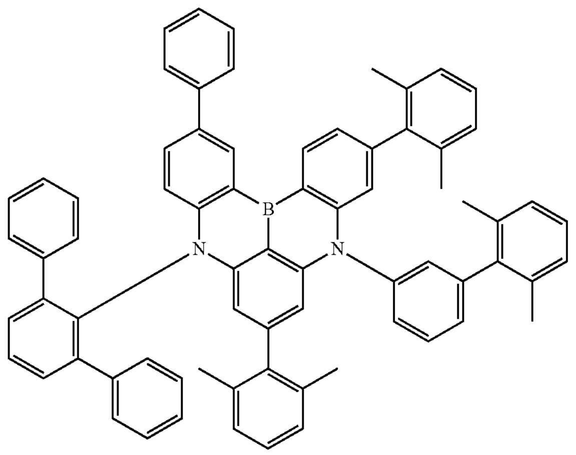
30
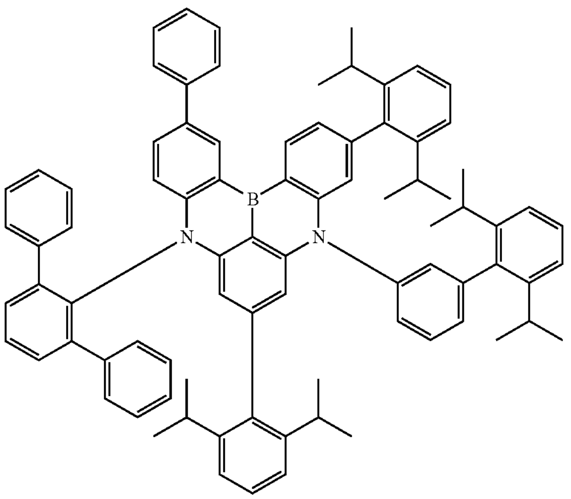
31
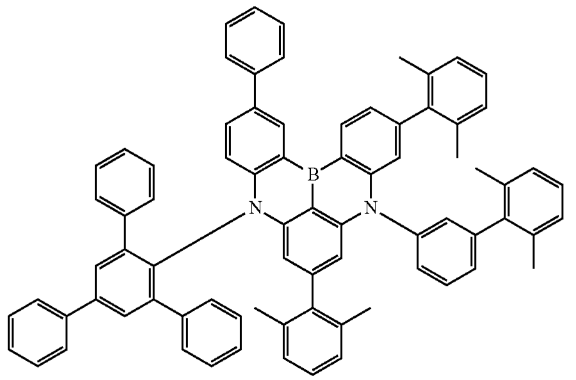
32
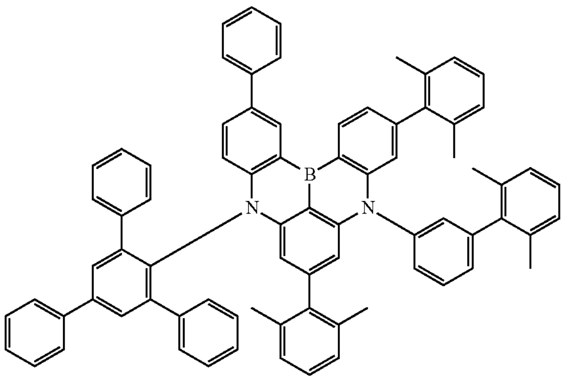
33
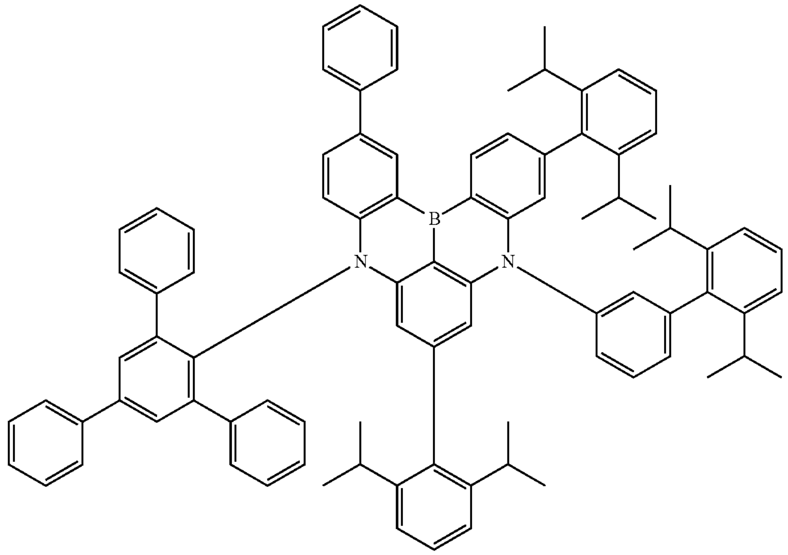

-continued
34
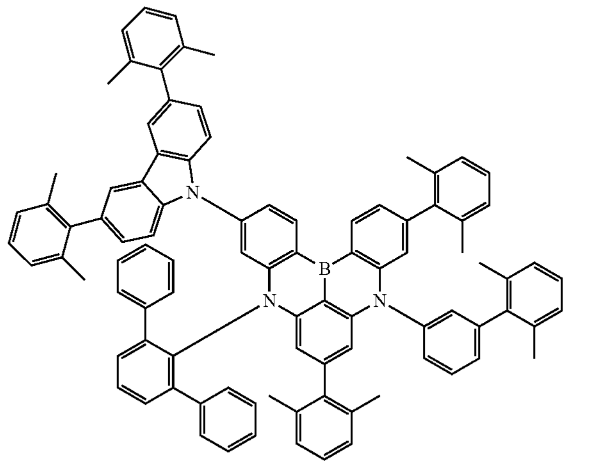
35
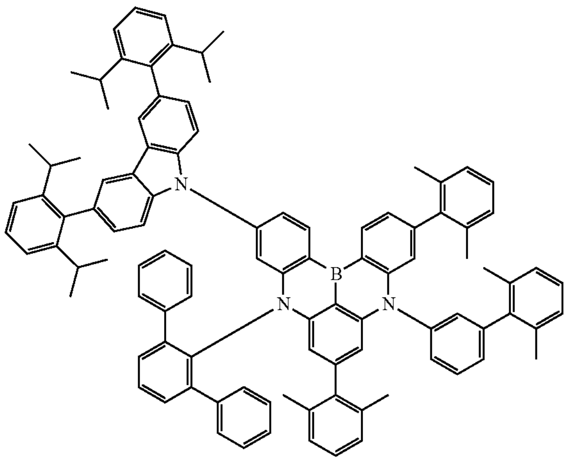
36
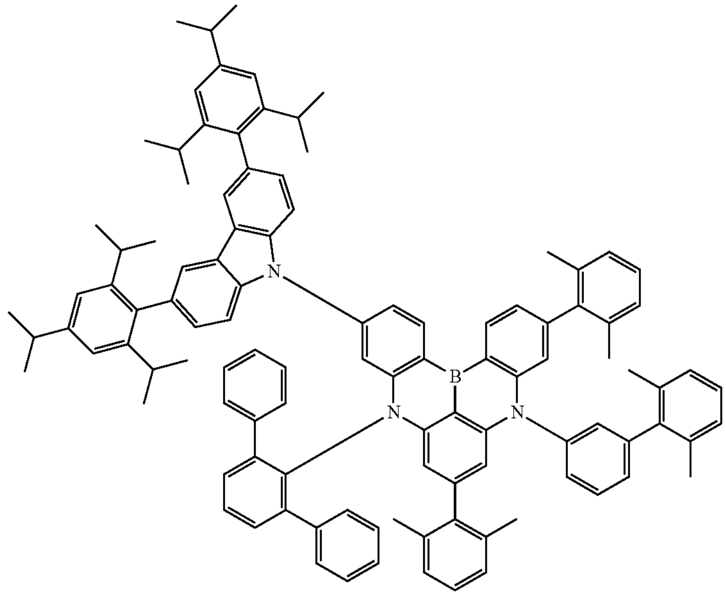
37
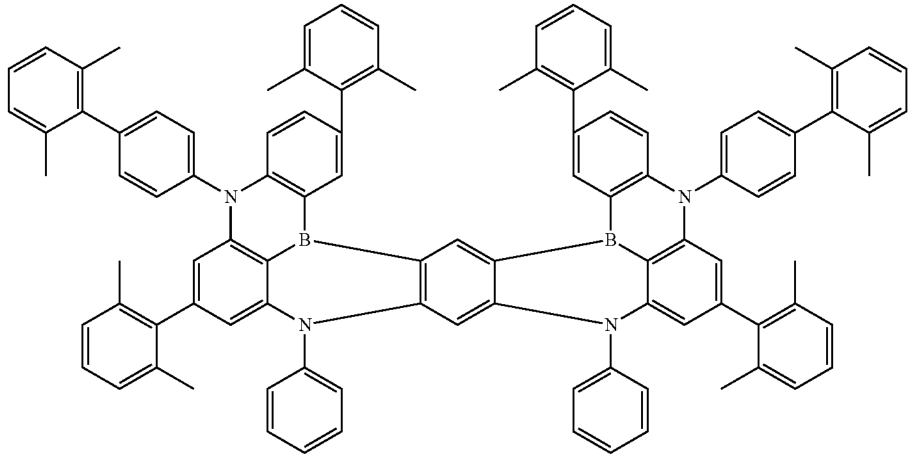

-continued
38
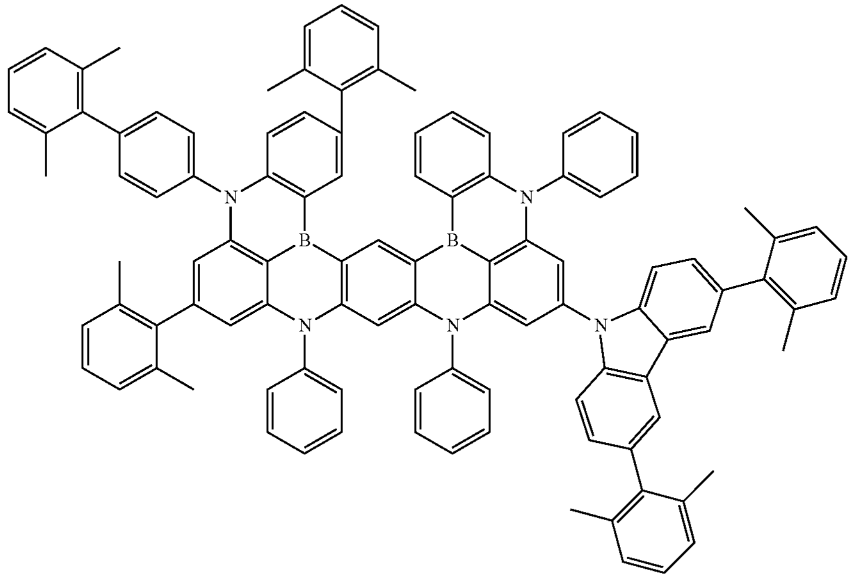
39
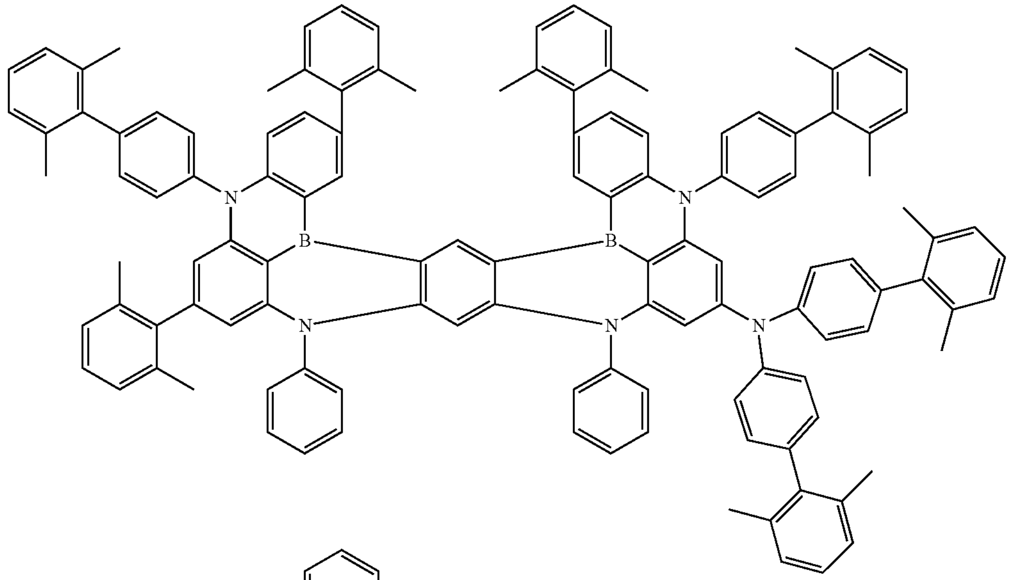
40
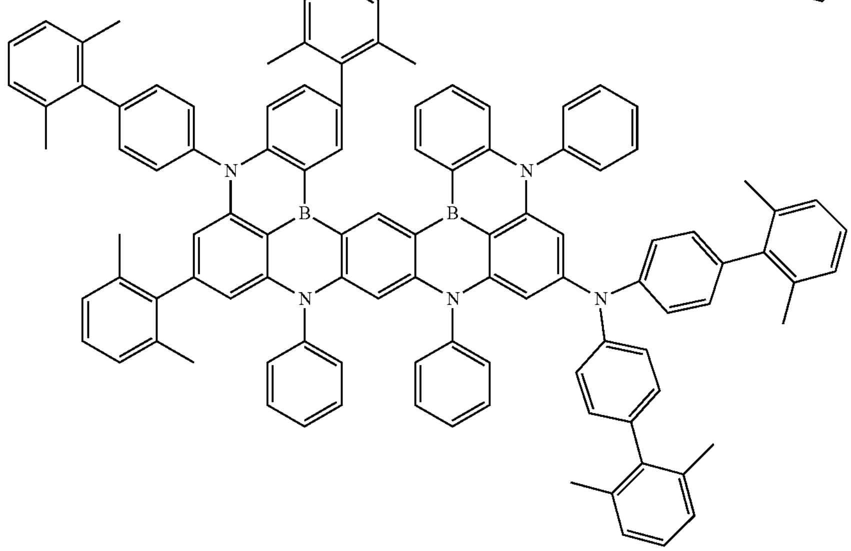

-continued
41
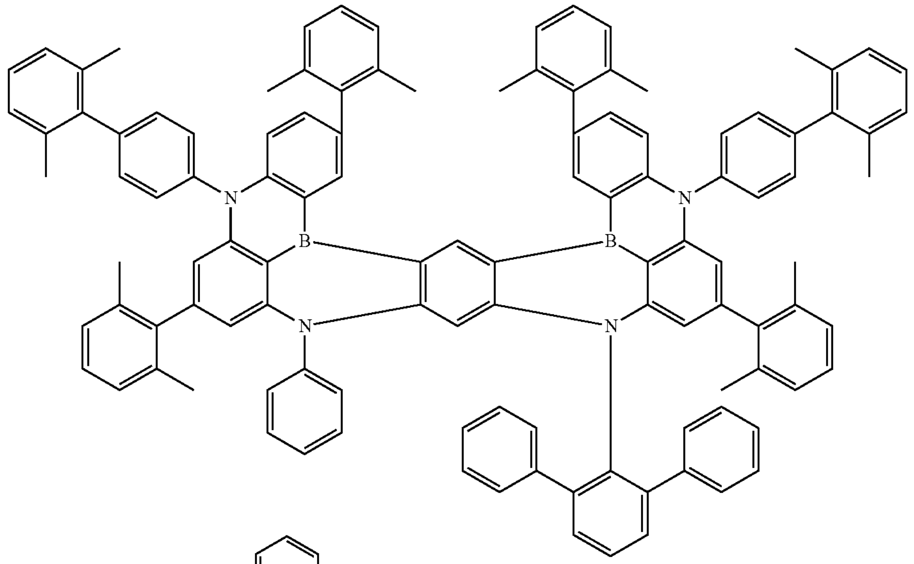
42
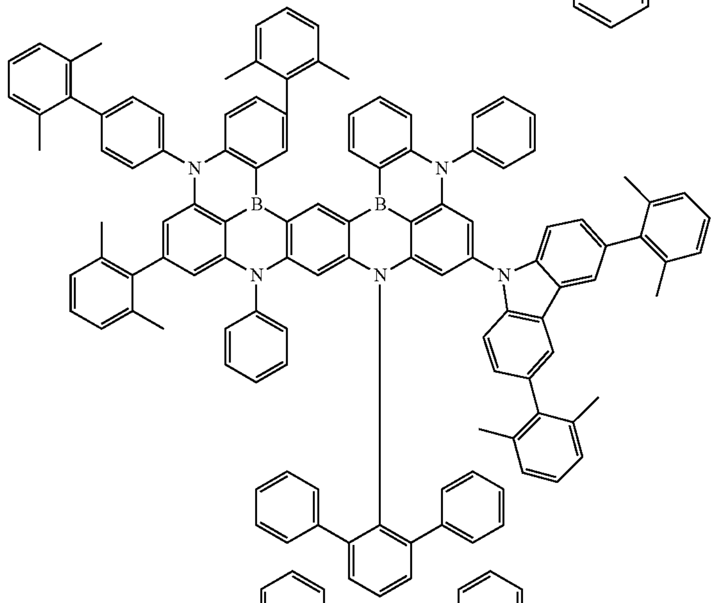
43
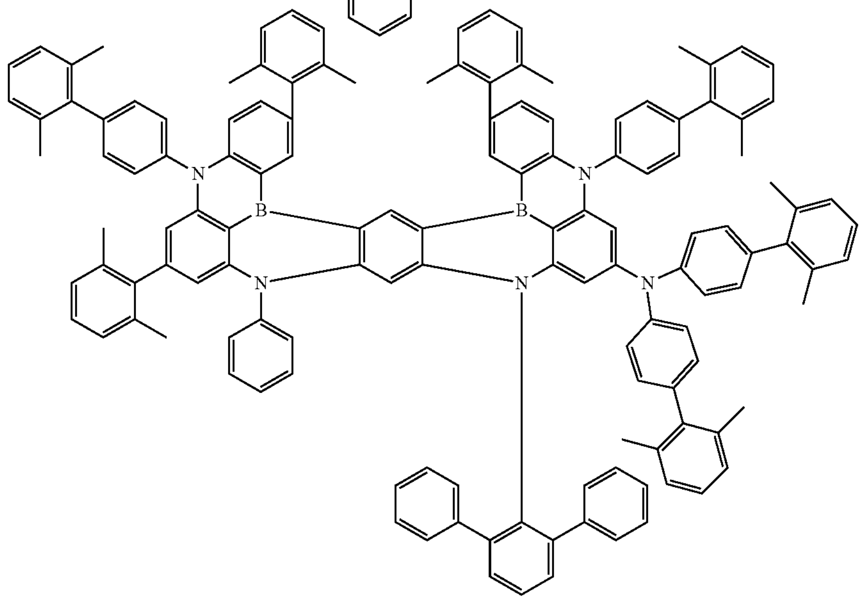

-continued
44
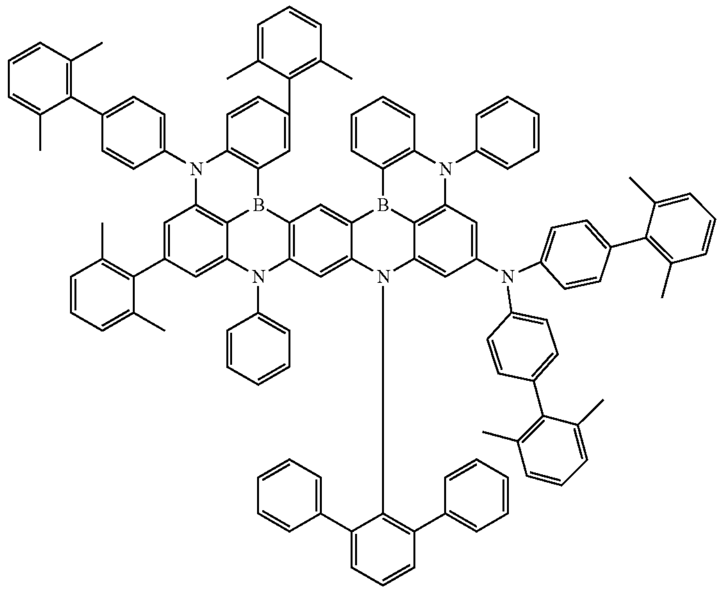
45
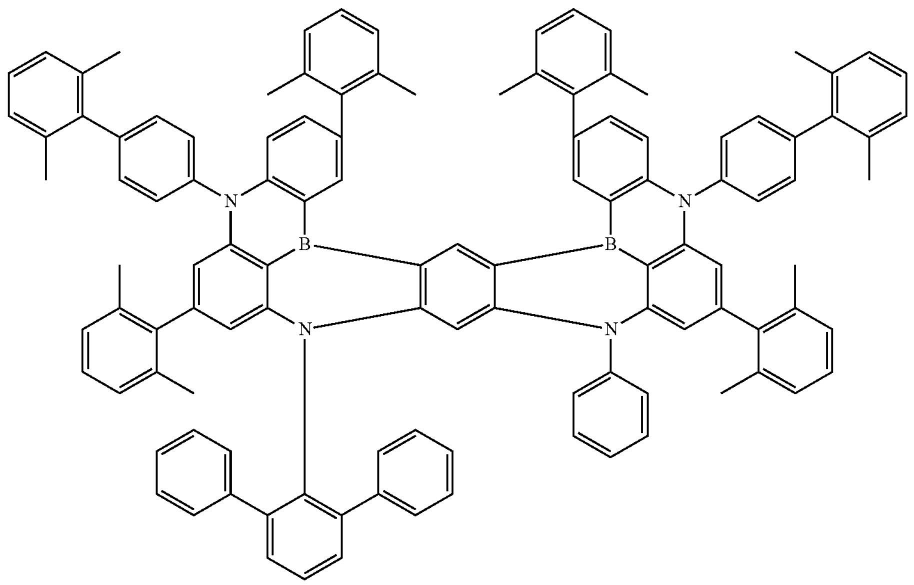

-continued
46
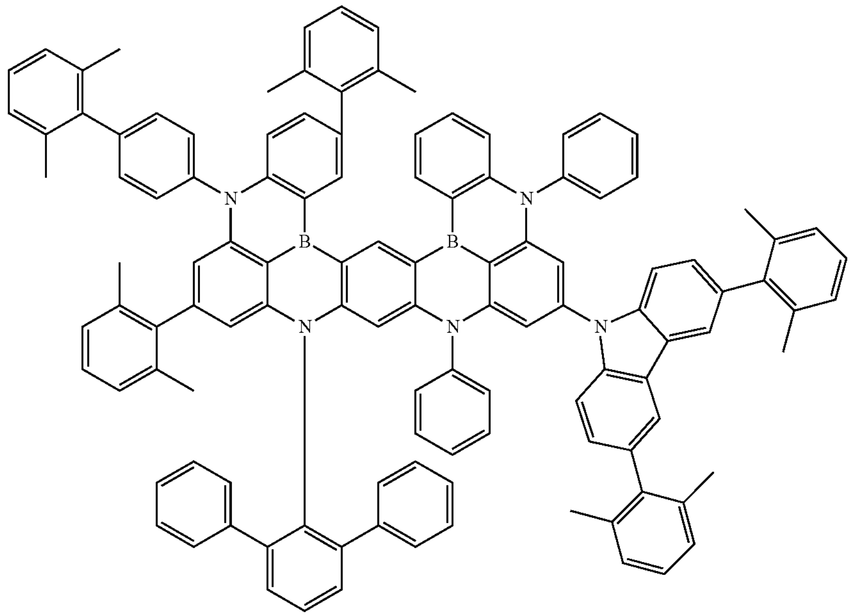
47
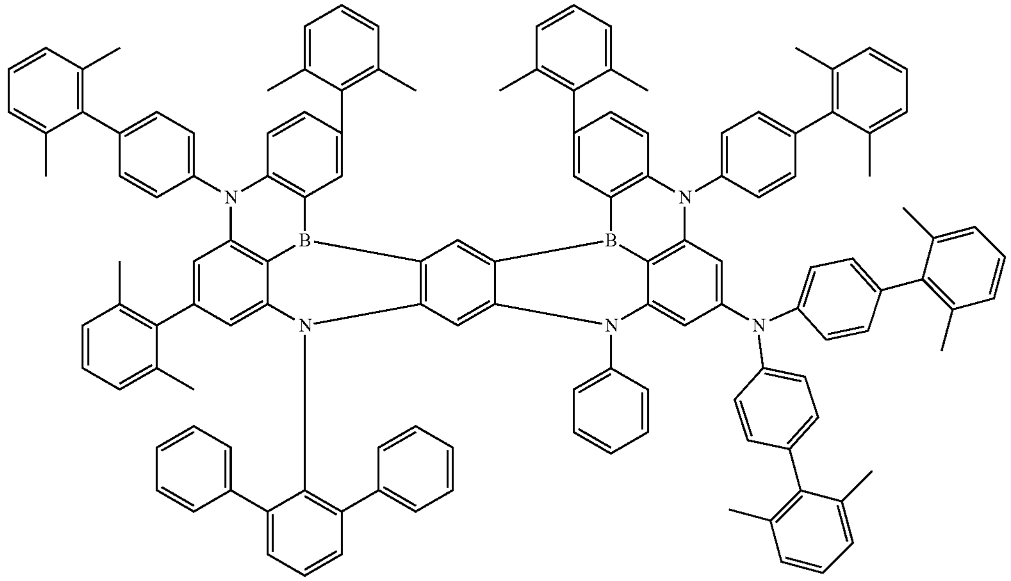

-continued
48
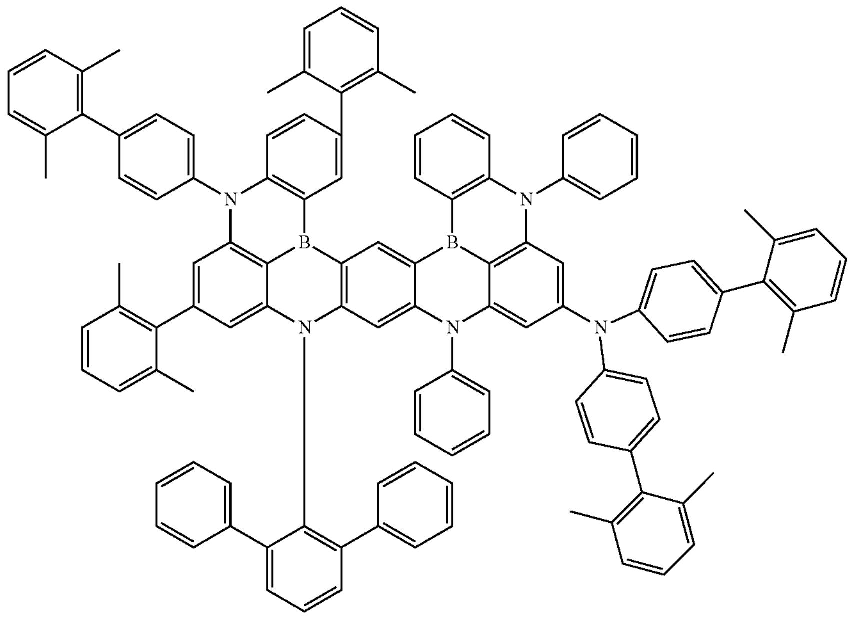
49
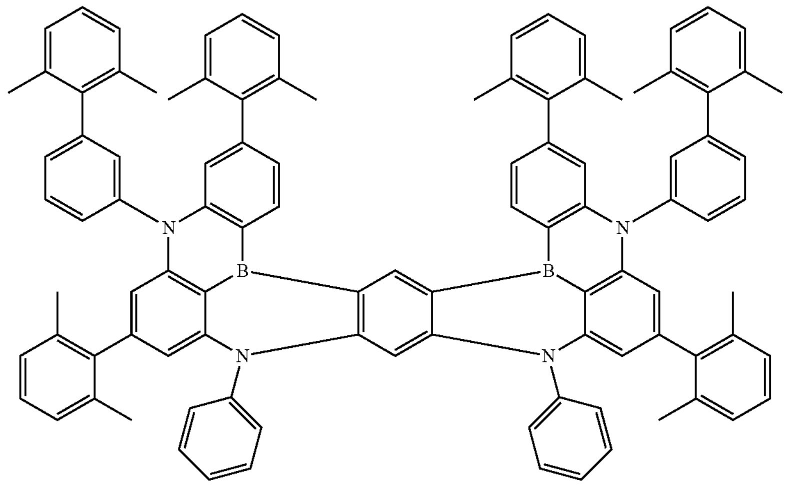

-continued
50
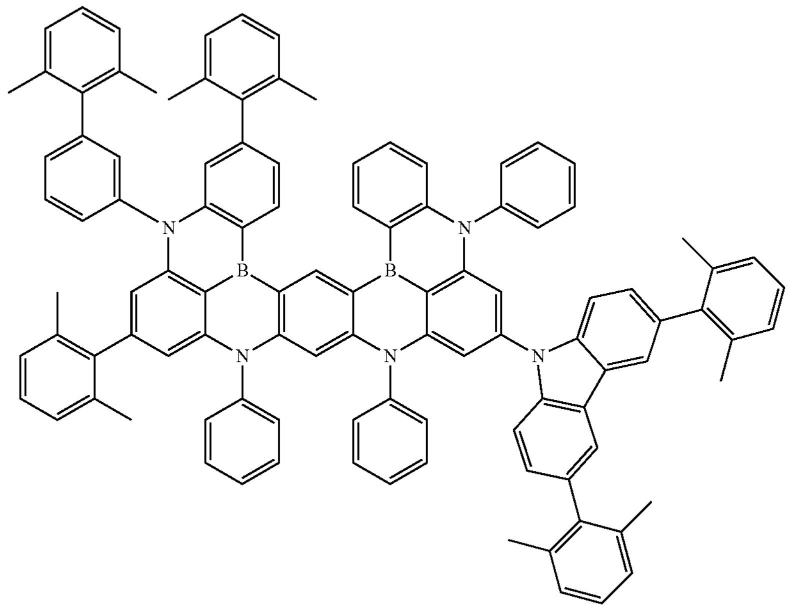
51
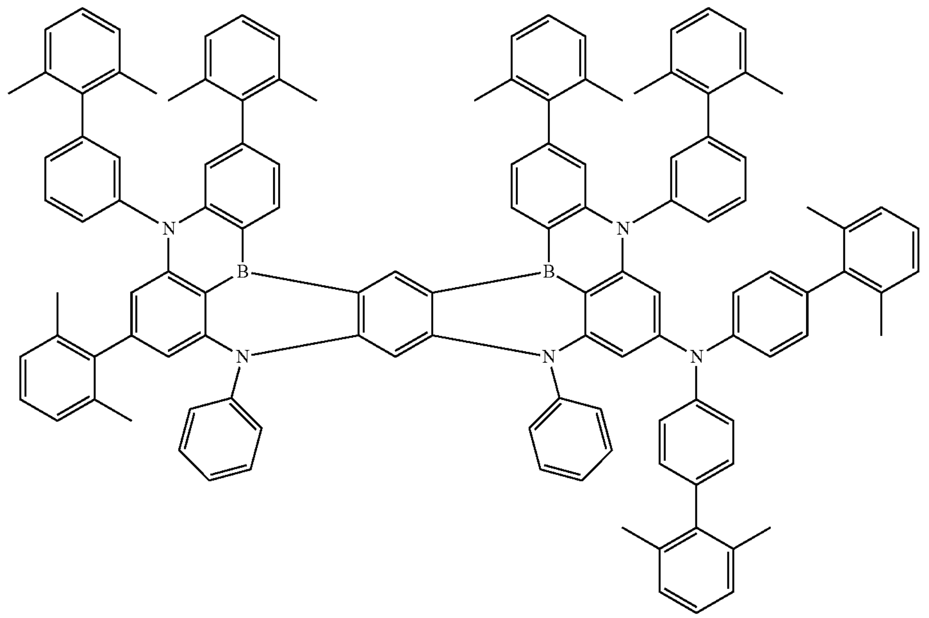

-continued
52
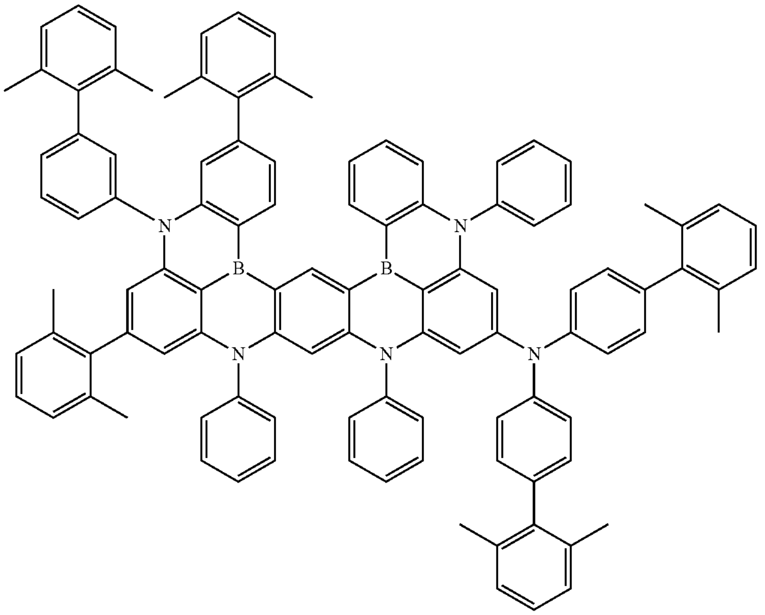
53
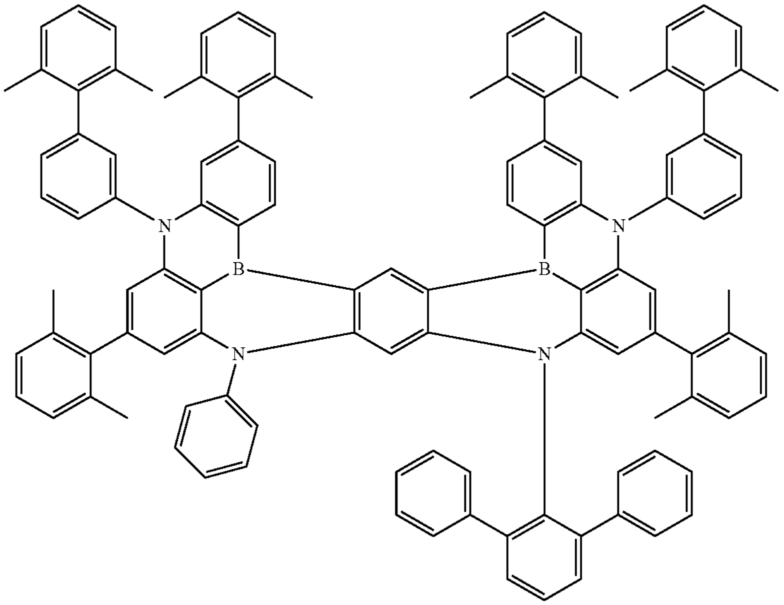

-continued
54
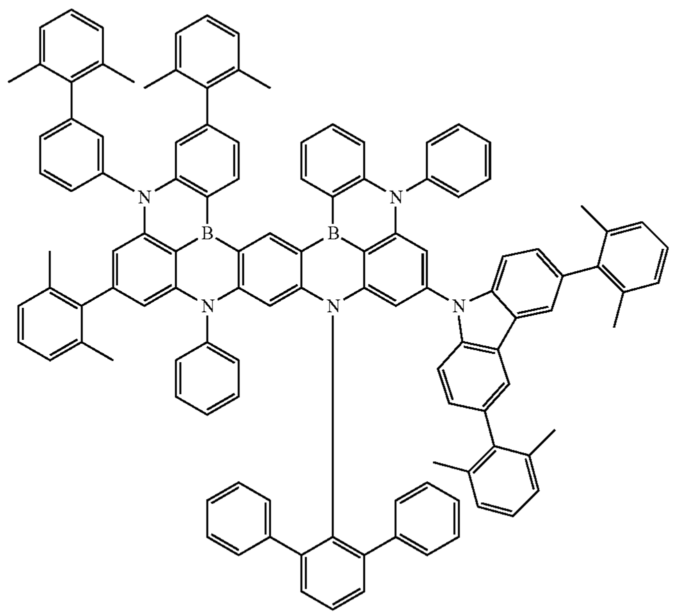
55
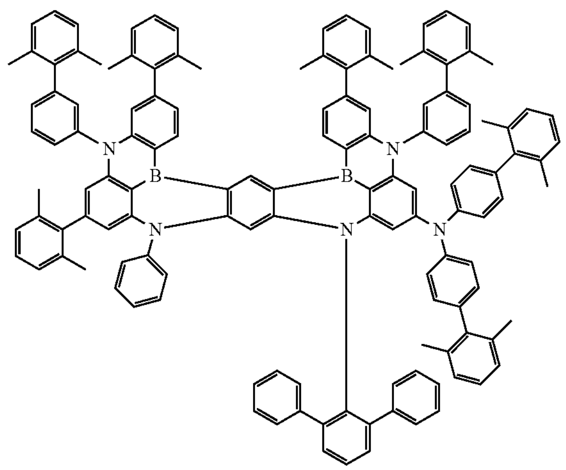
56
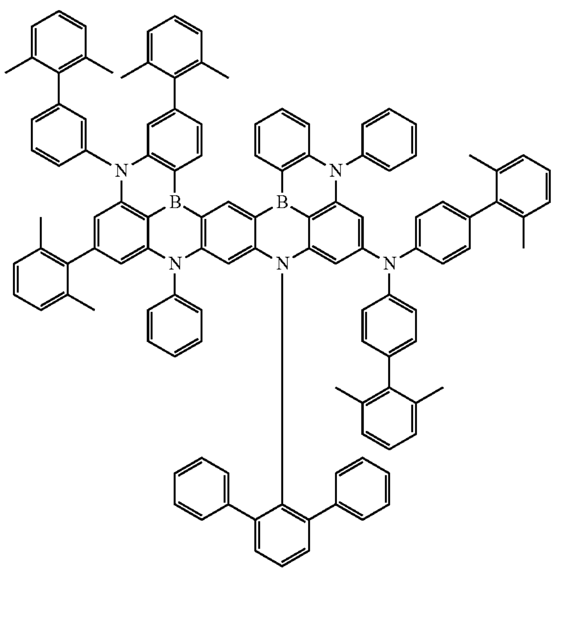

-continued
57
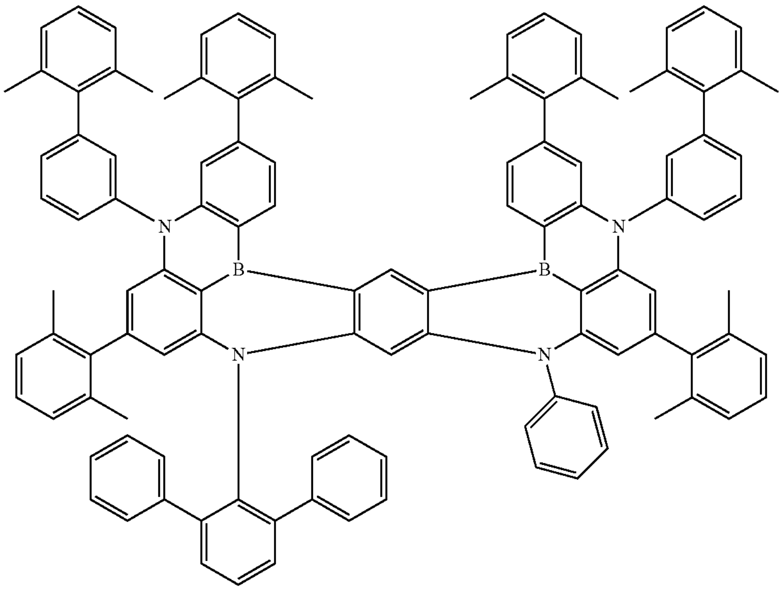
58
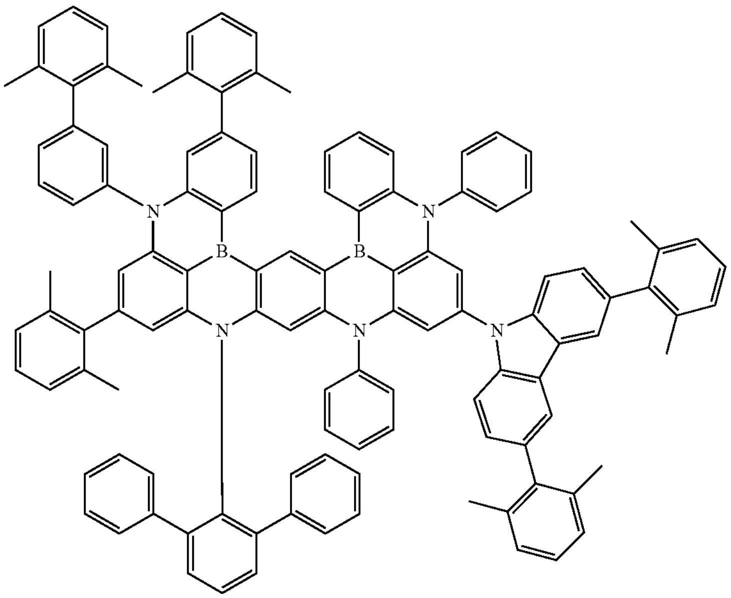

-continued
59
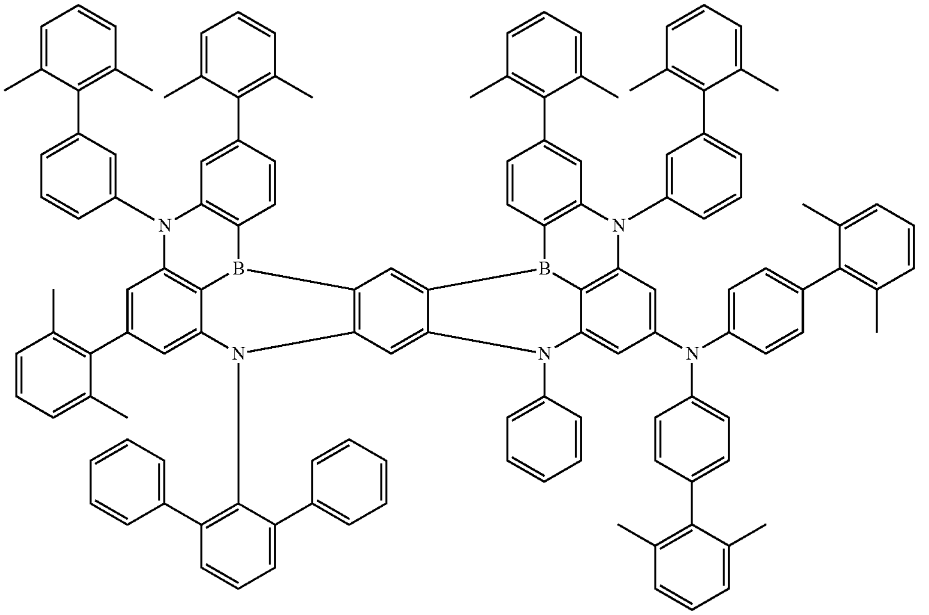
60
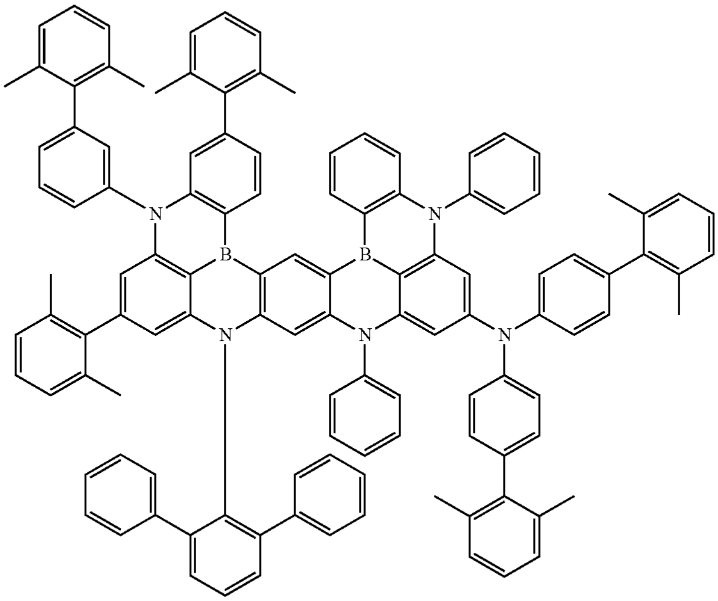

-continued
61
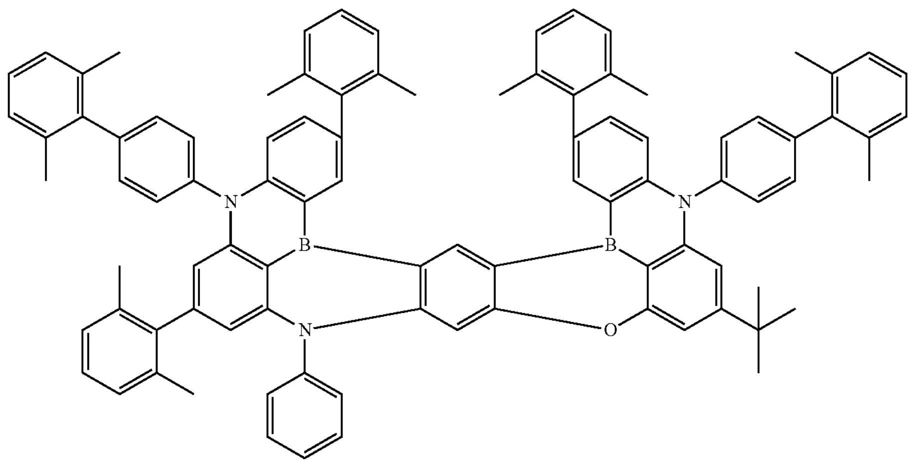
62
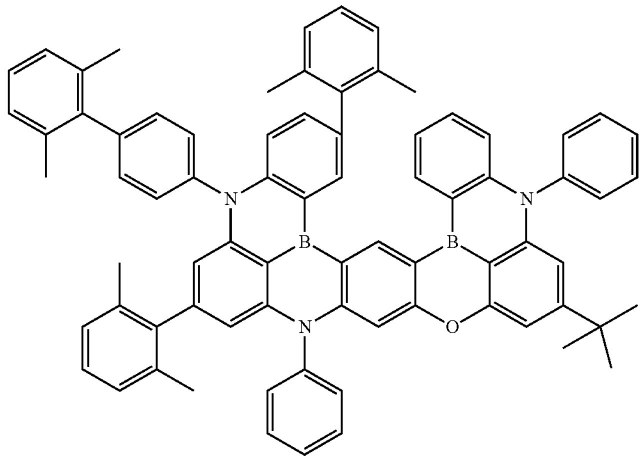
63
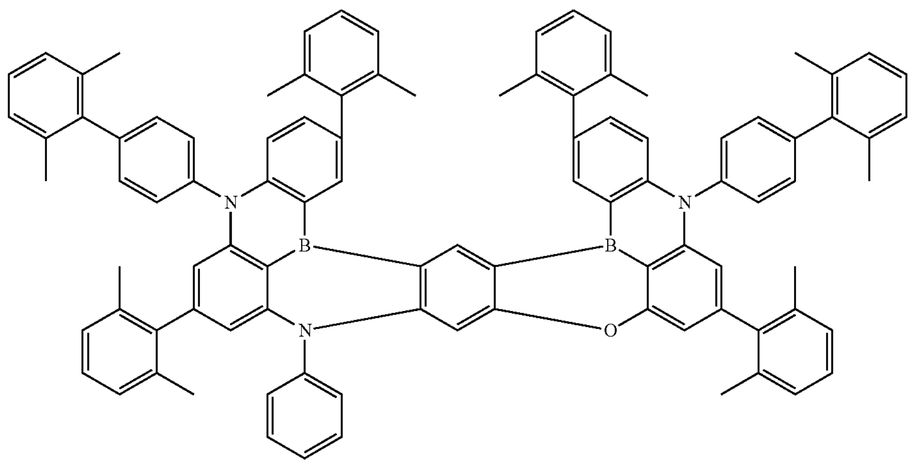

-continued
64
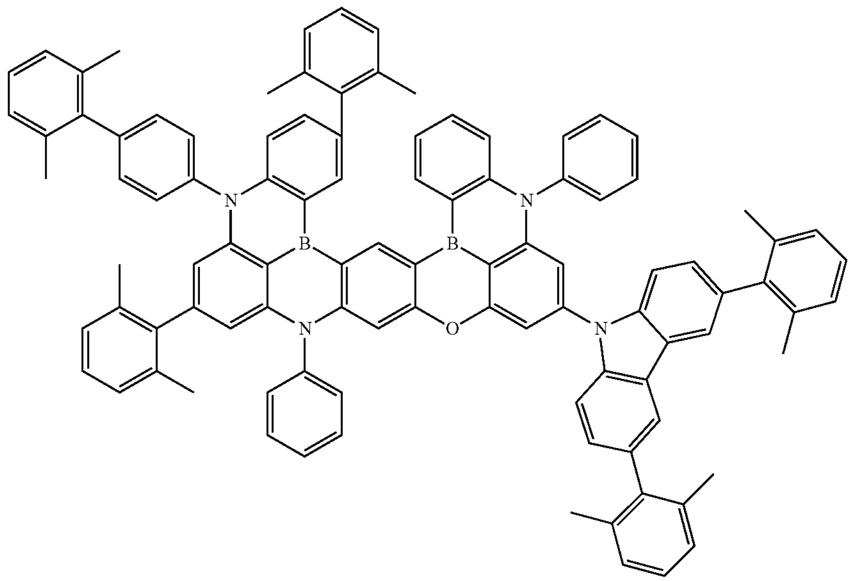
65
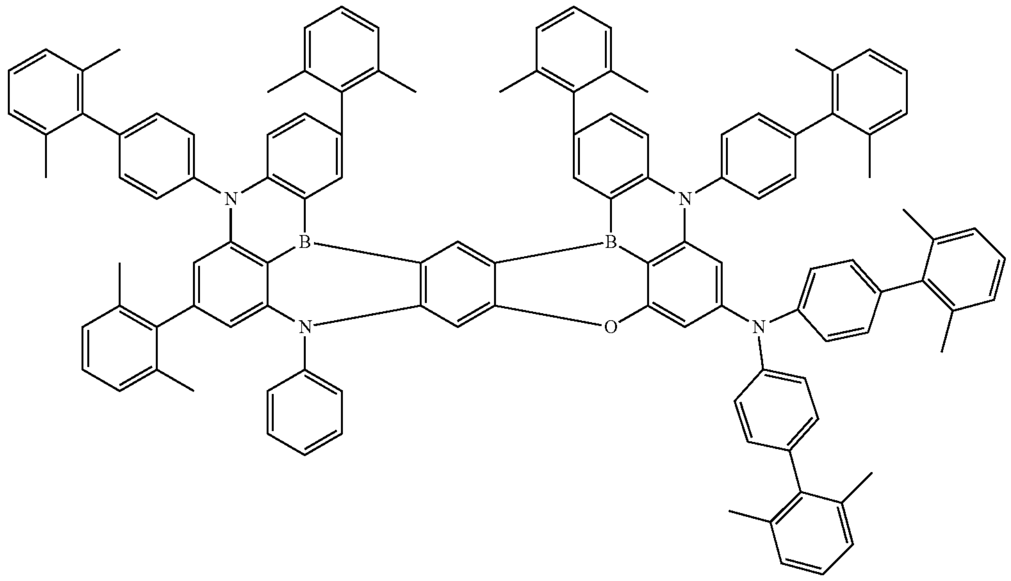

-continued
66
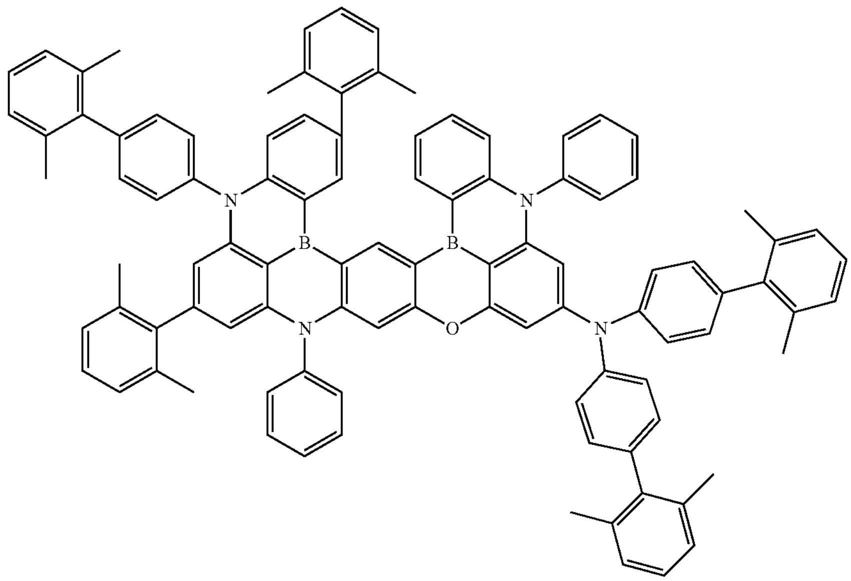
67
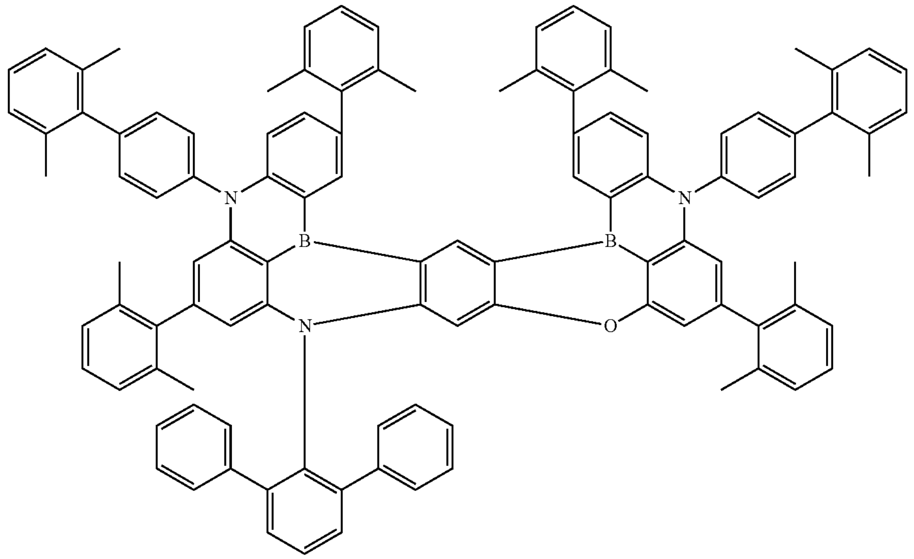

-continued
68
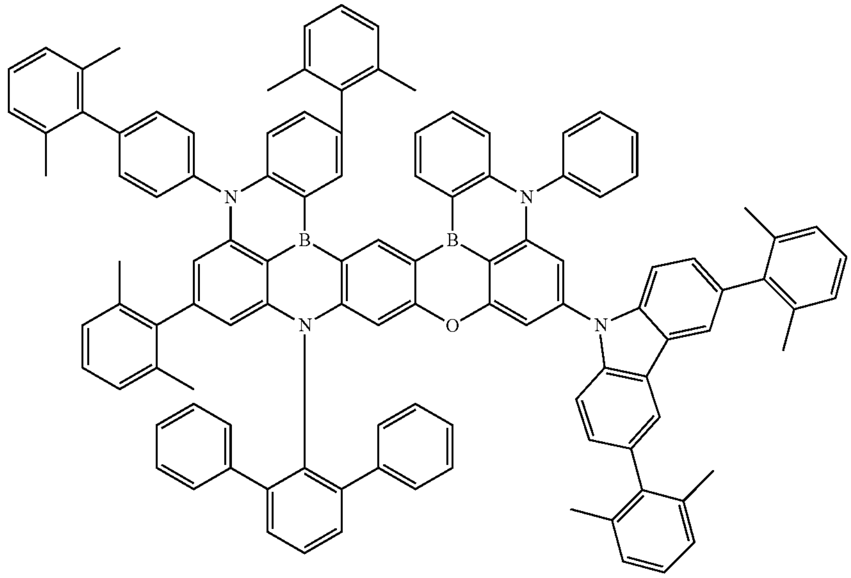
69
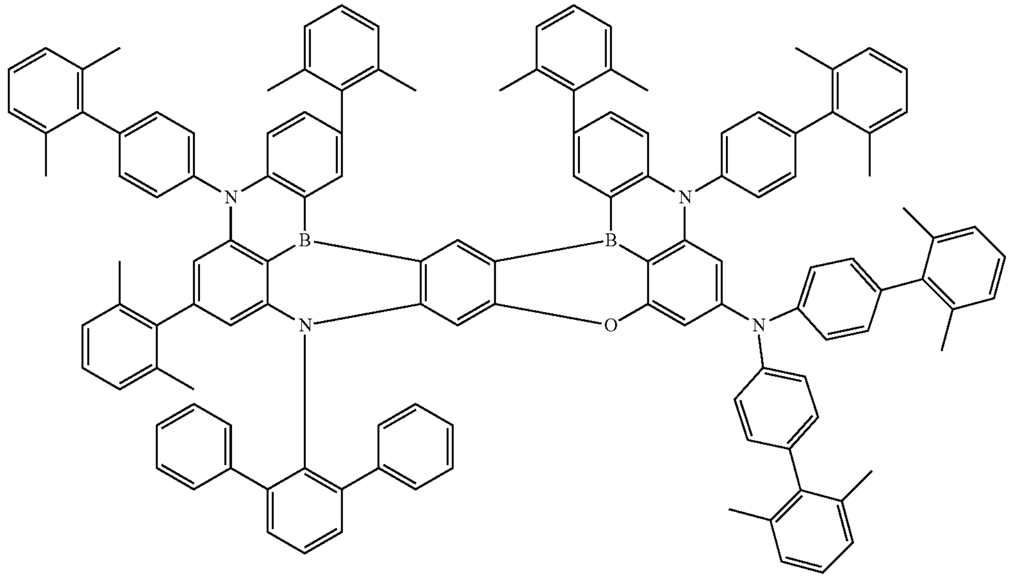

-continued
70
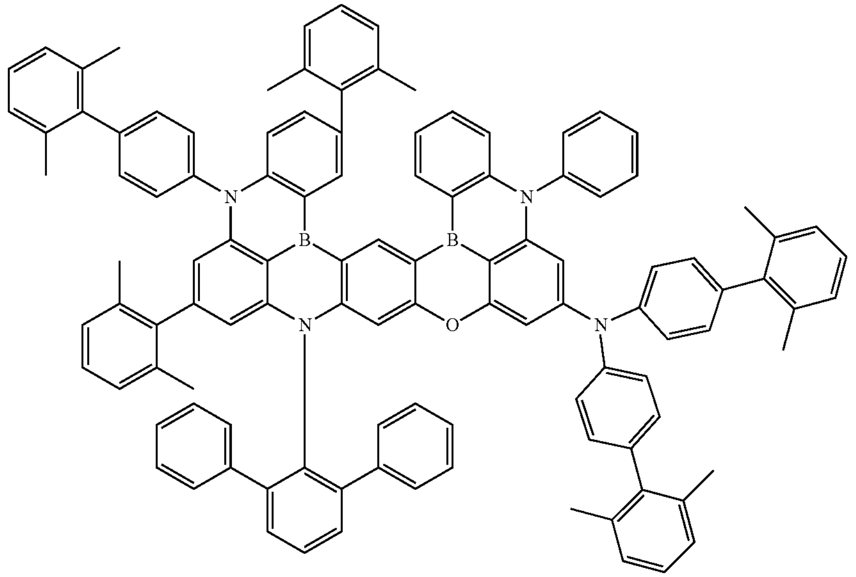
71
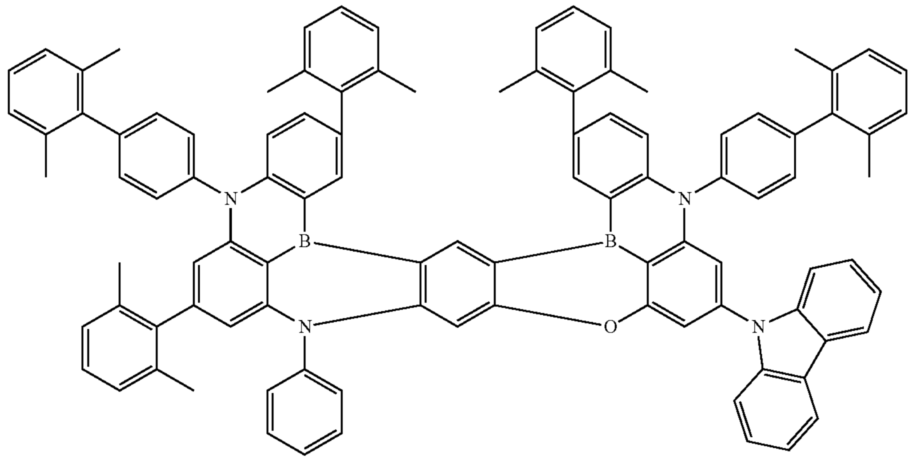
72
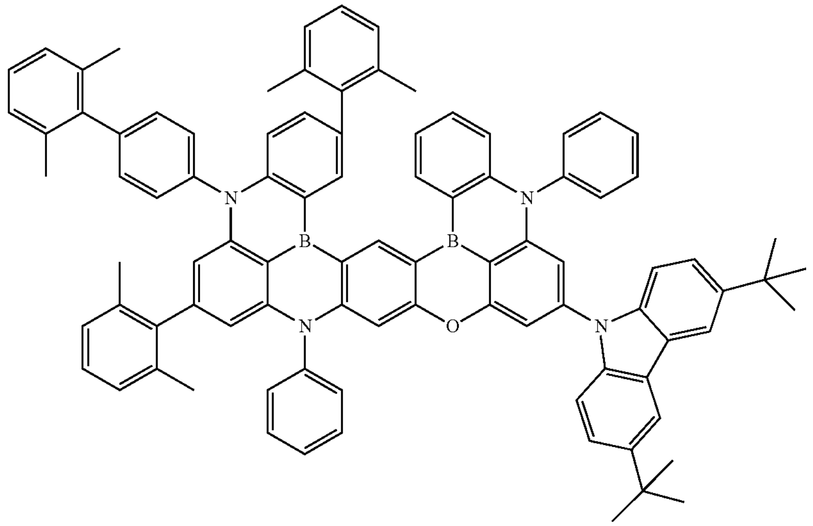

-continued
73
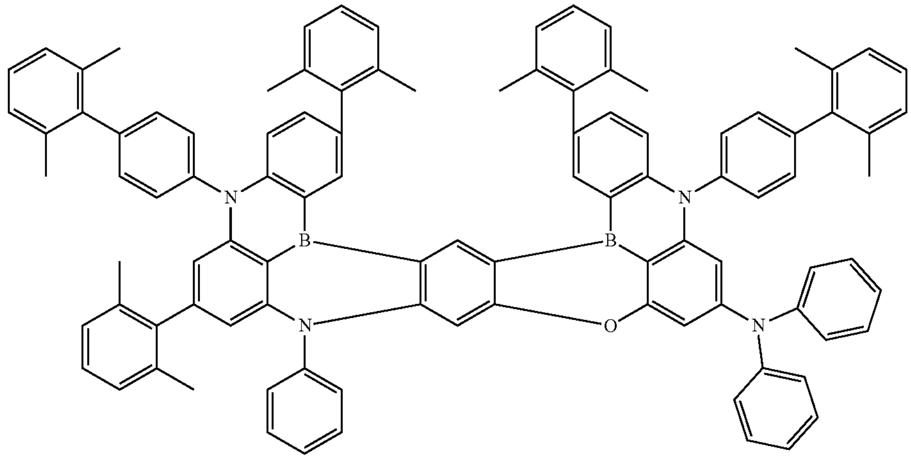
74
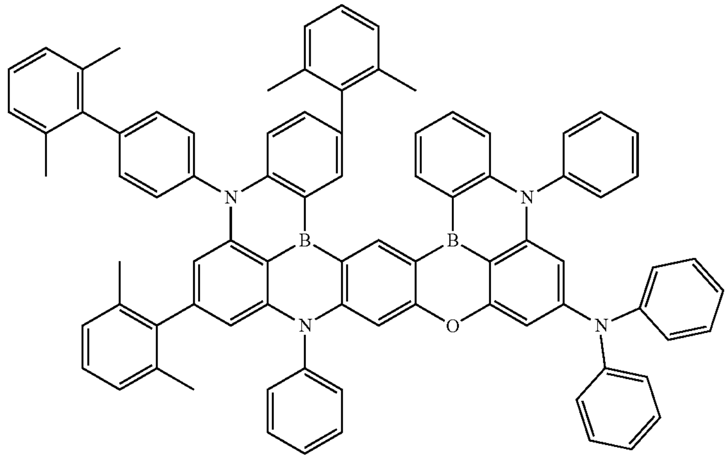
75
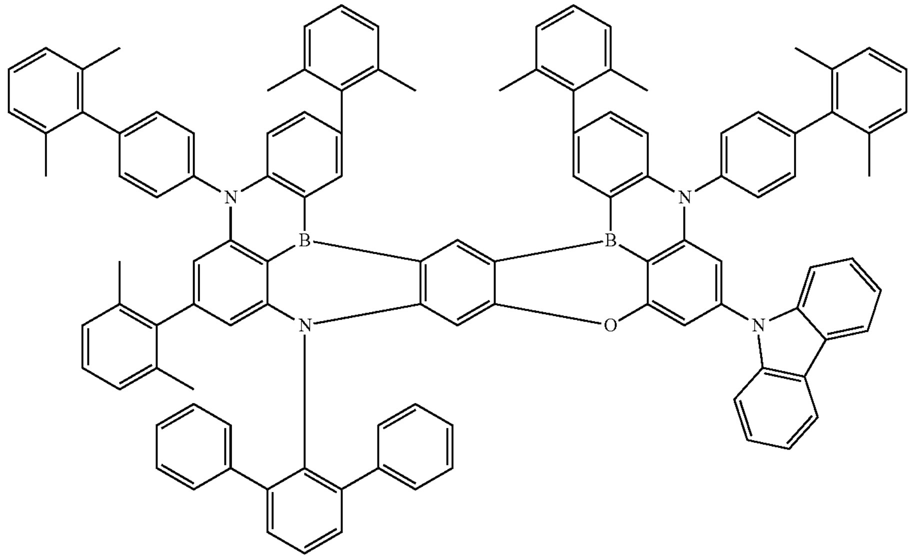

-continued
76
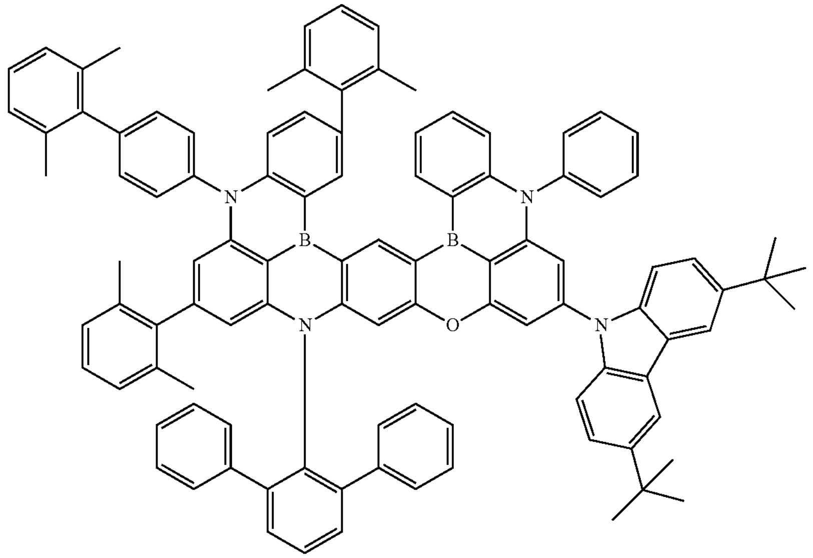
77
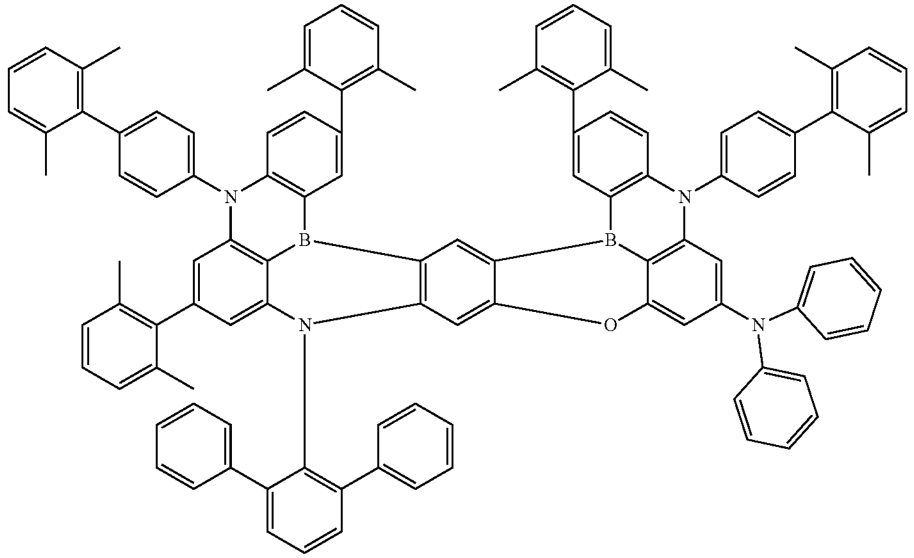
78
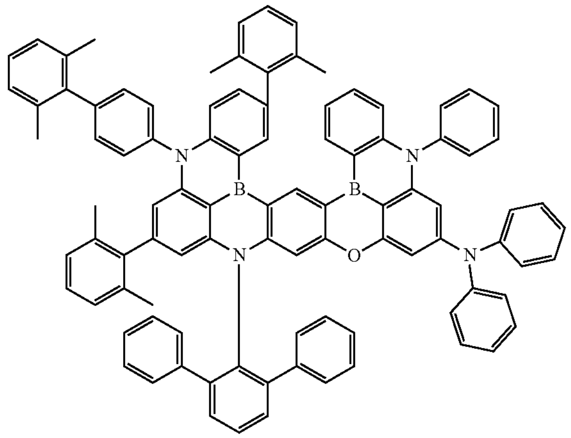
79
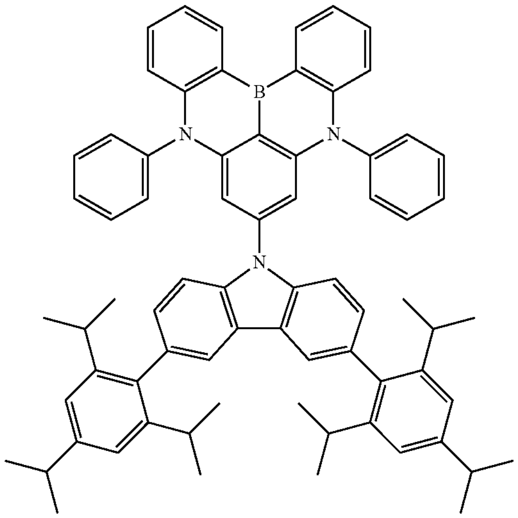

-continued
80
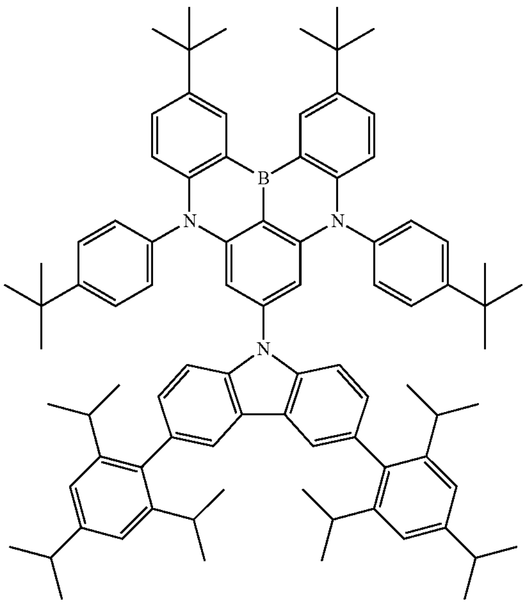
81
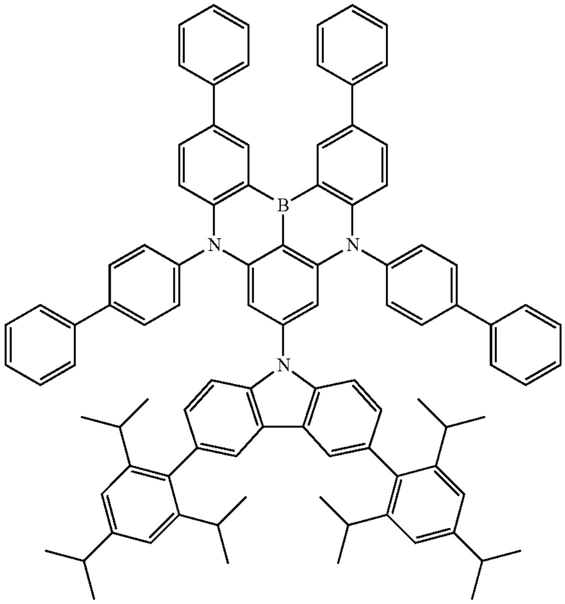
82
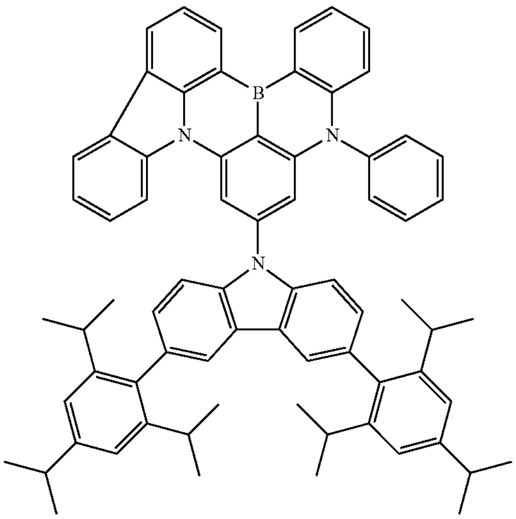
83
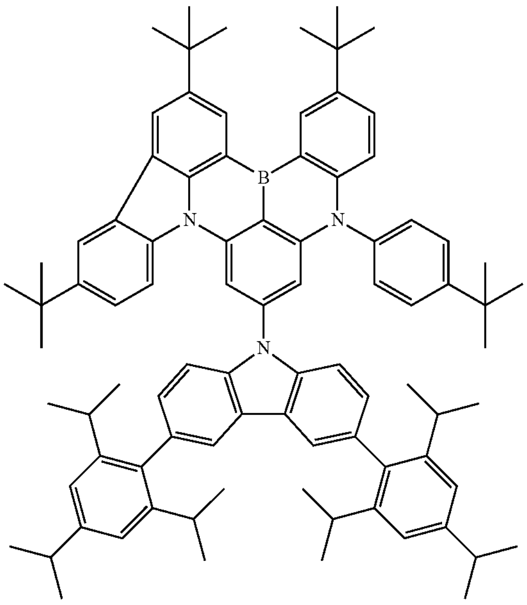

-continued
84
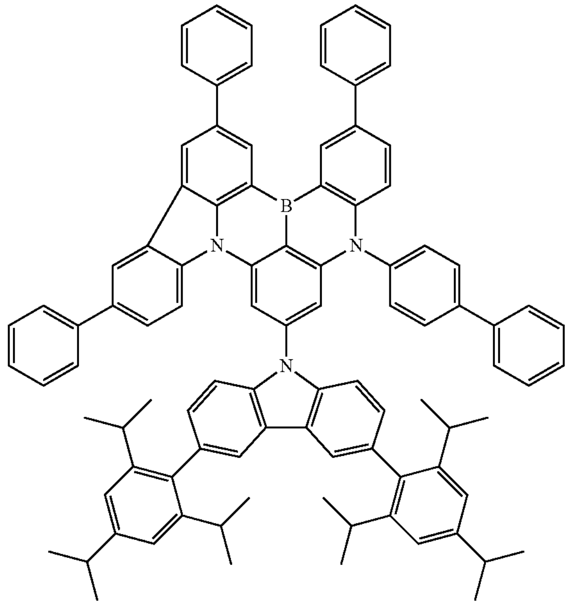
85
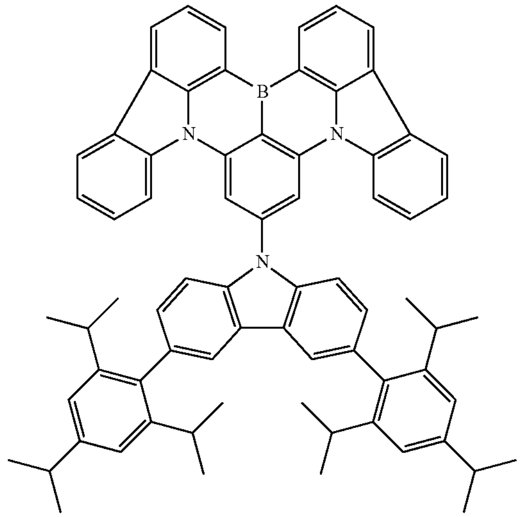
86
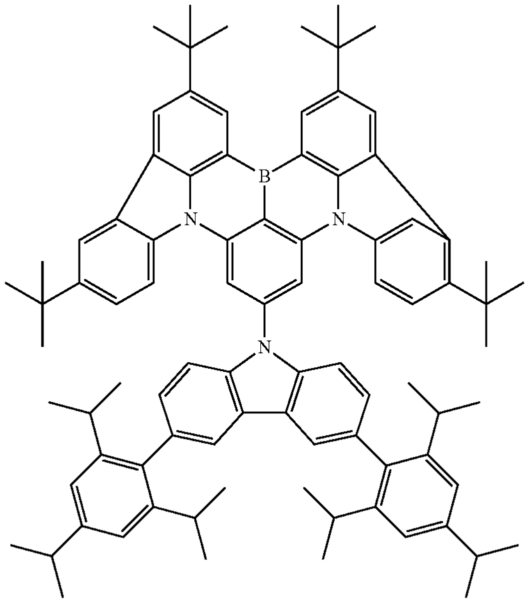

-continued
87
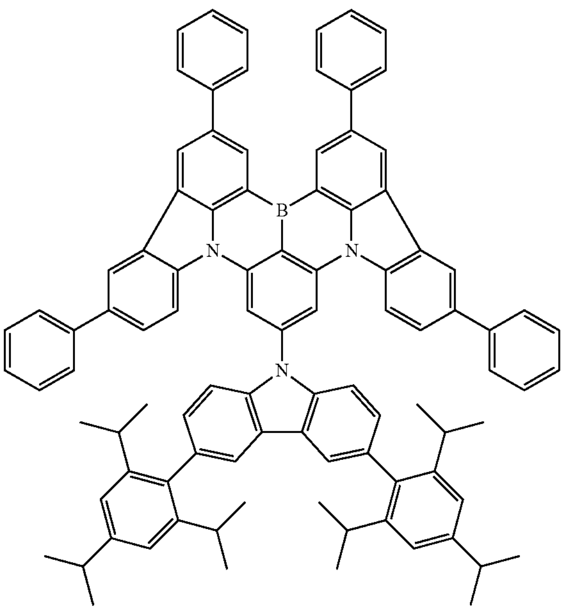
88
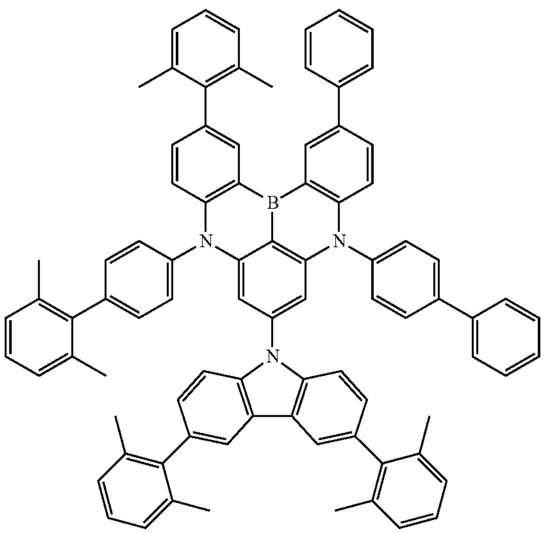
89
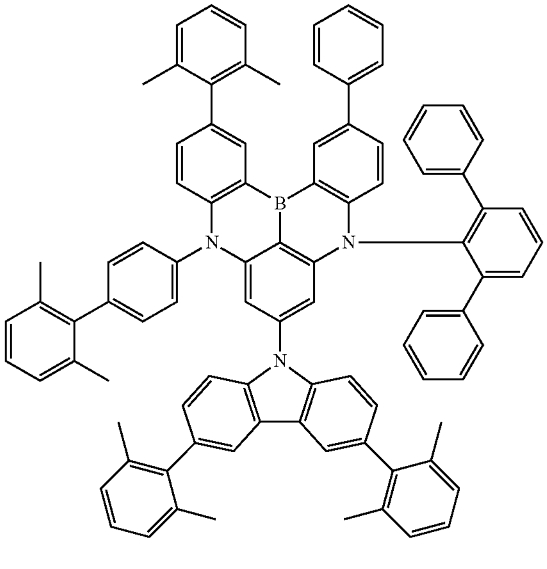
90
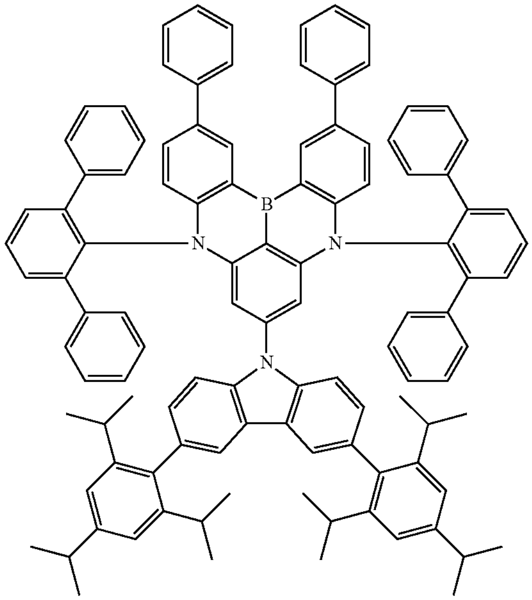

-continued
91
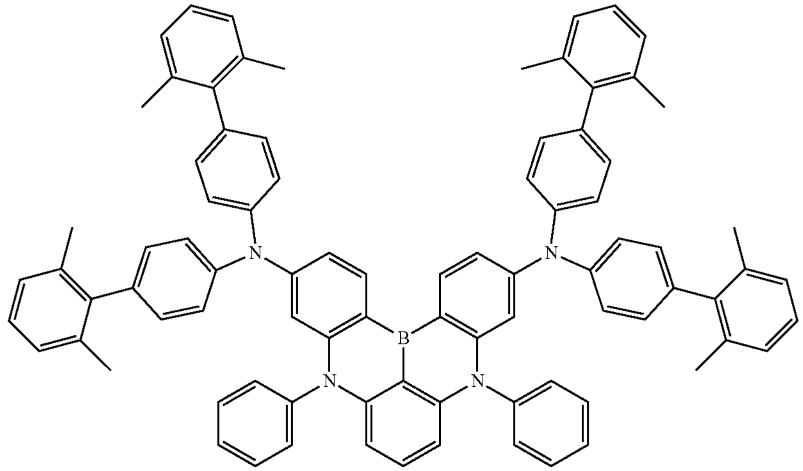
92
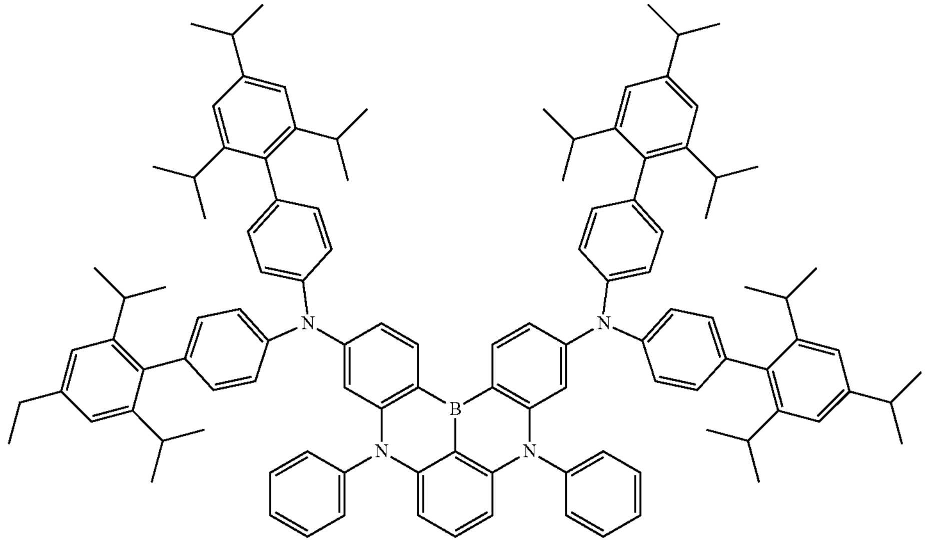
93
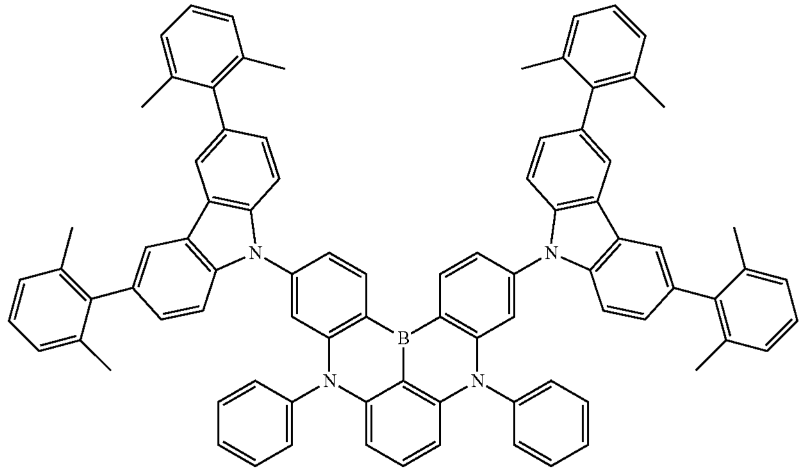

-continued
94
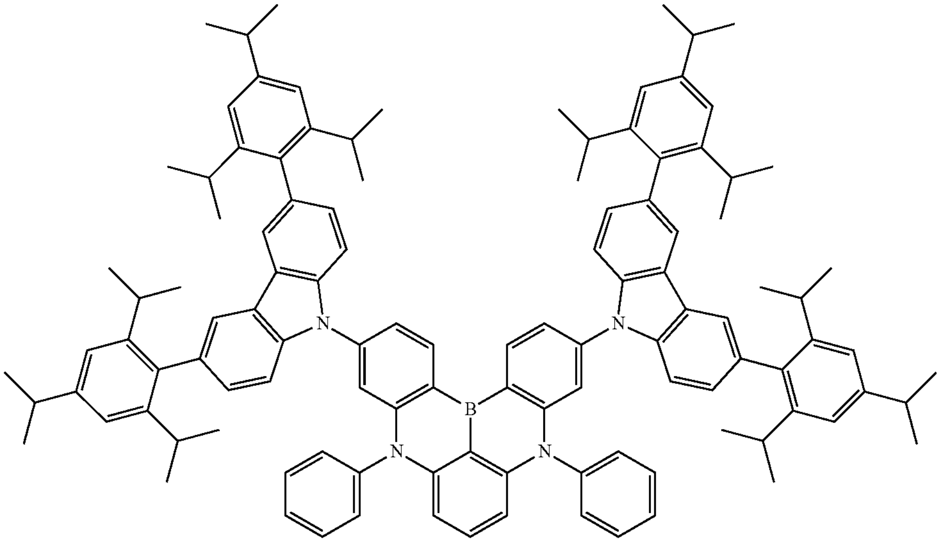
95
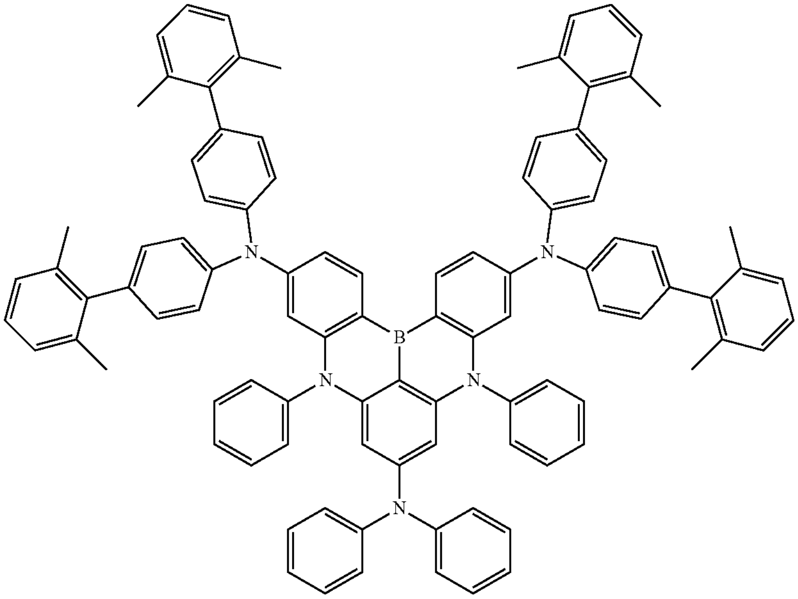

-continued
96
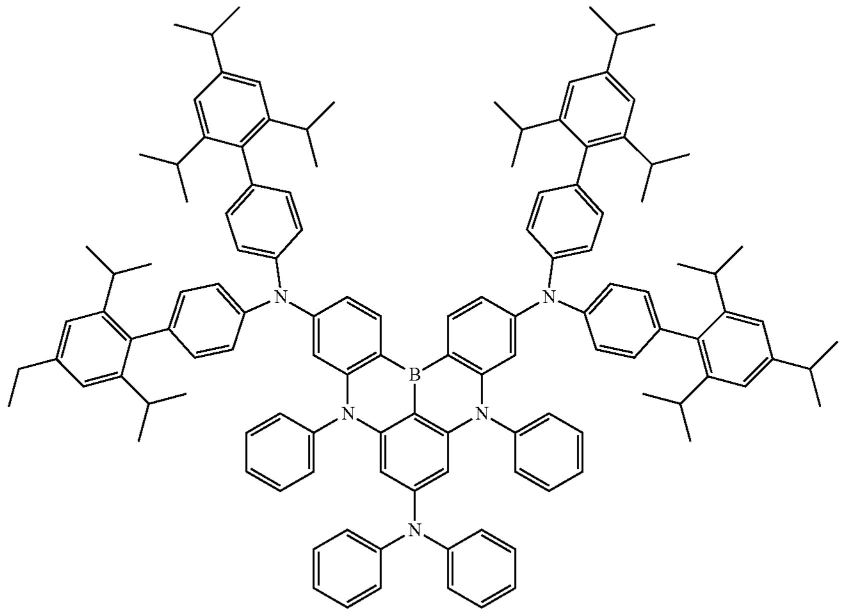
97
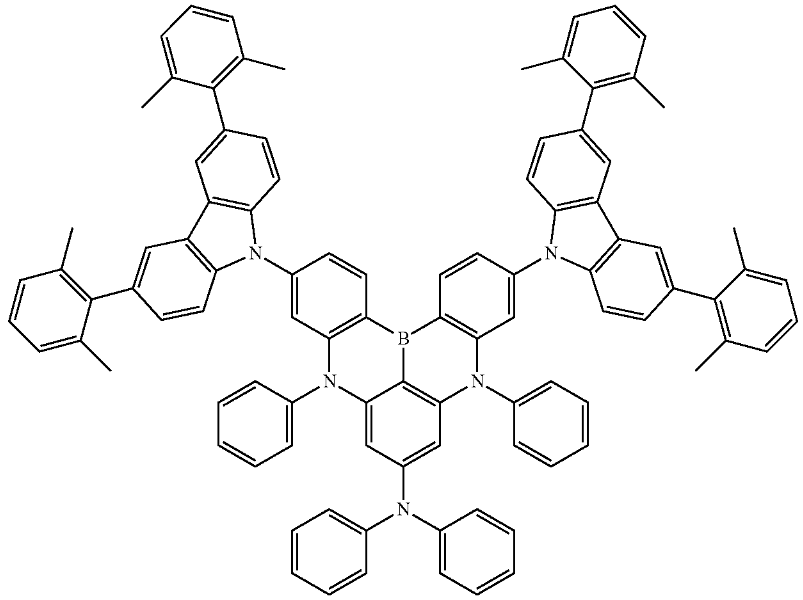

-continued
98
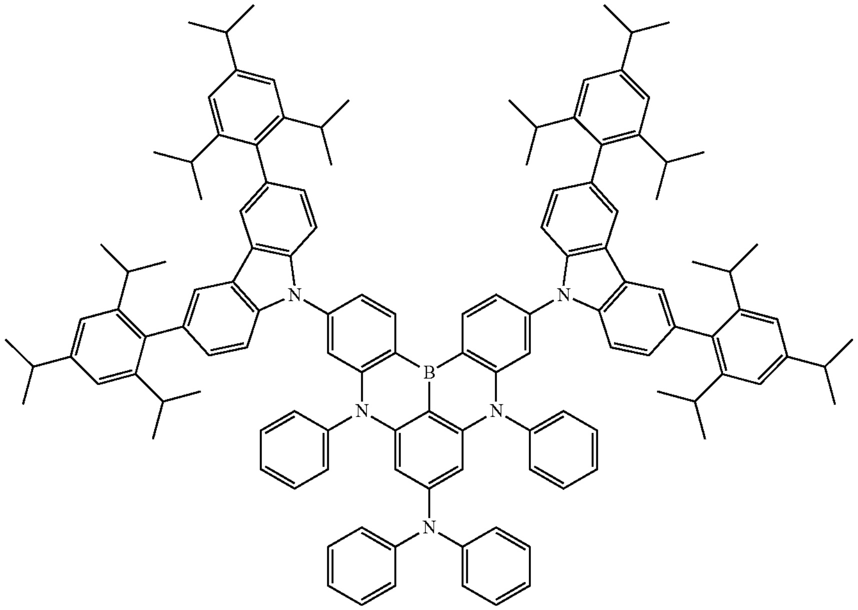
99
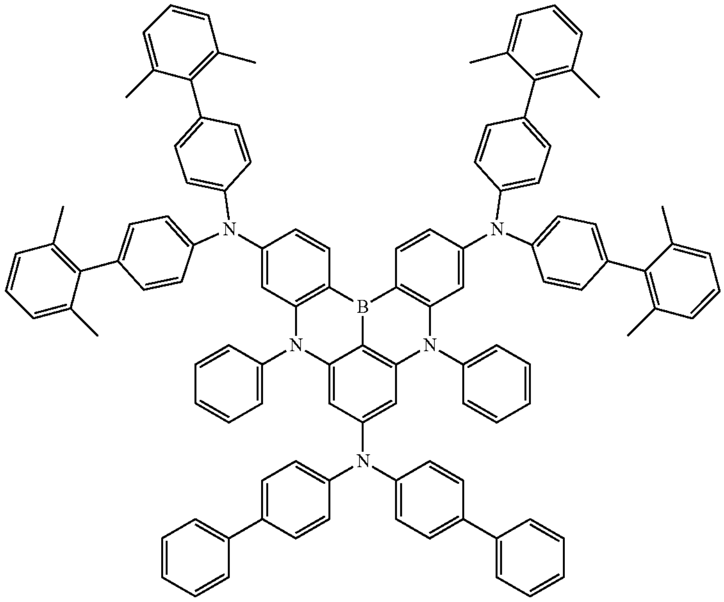

-continued
100
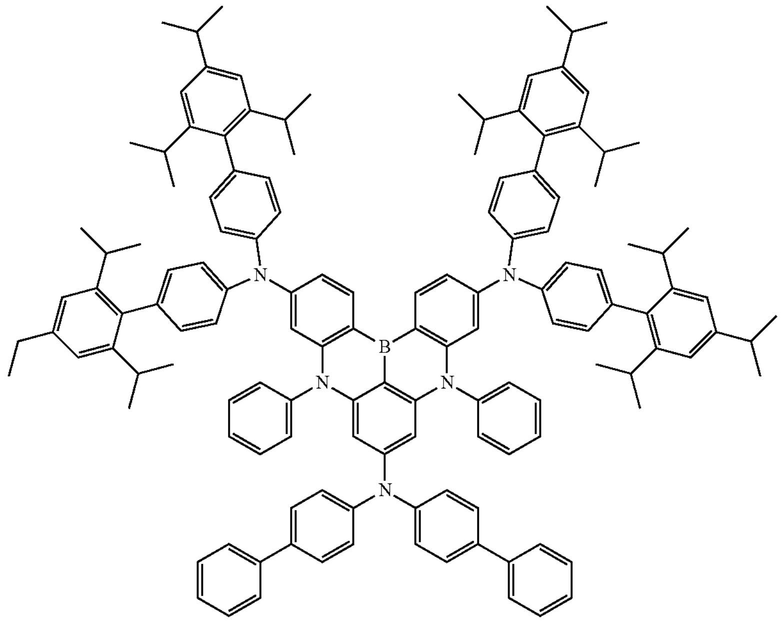
101
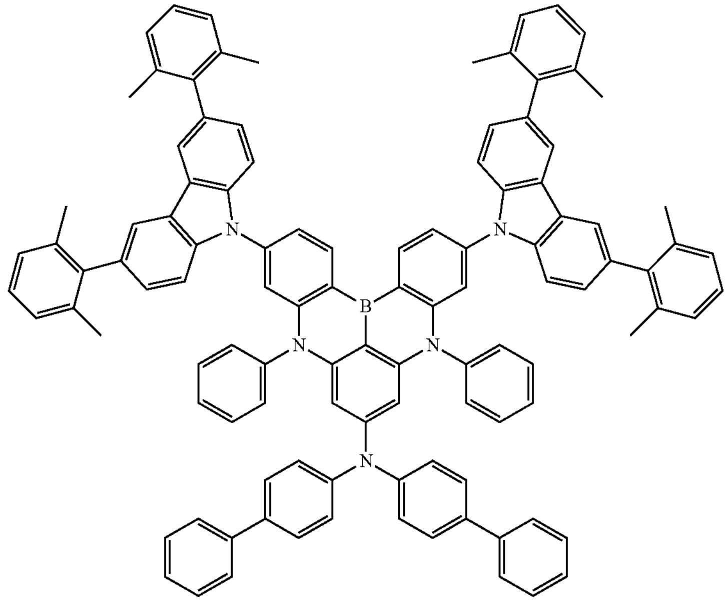

-continued
102
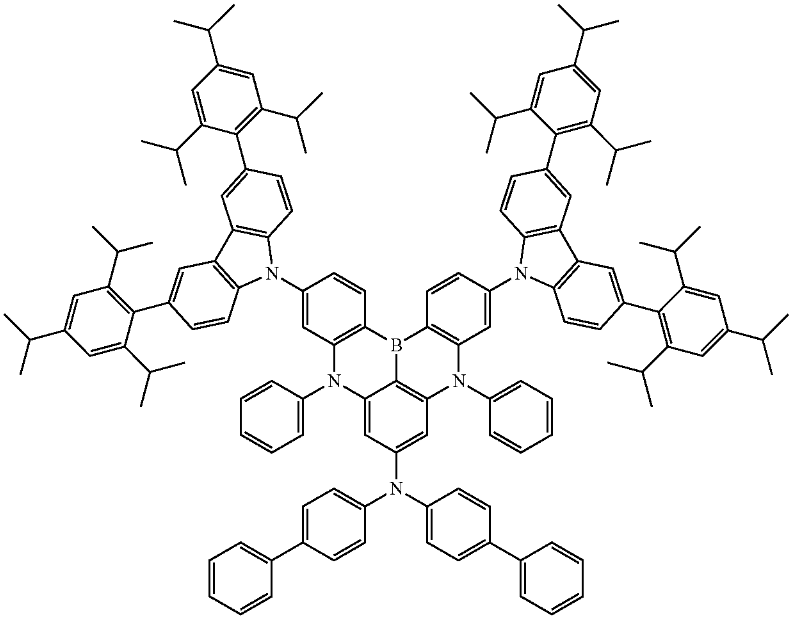
103
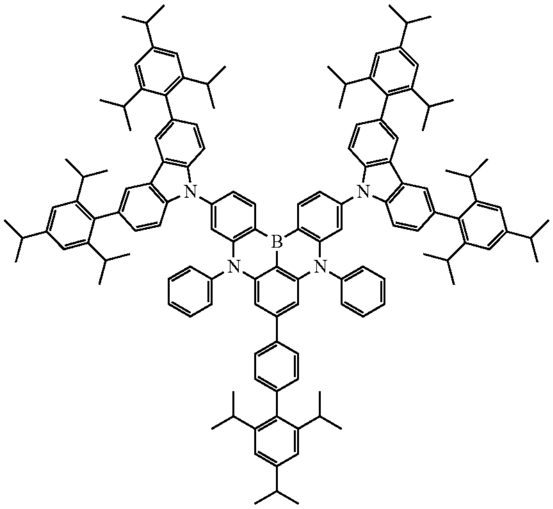
104
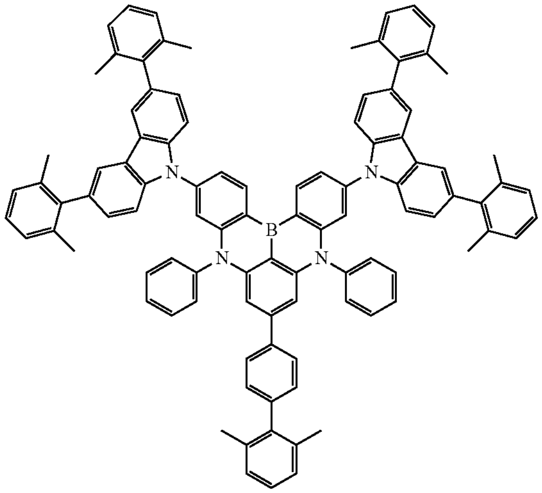

-continued
105
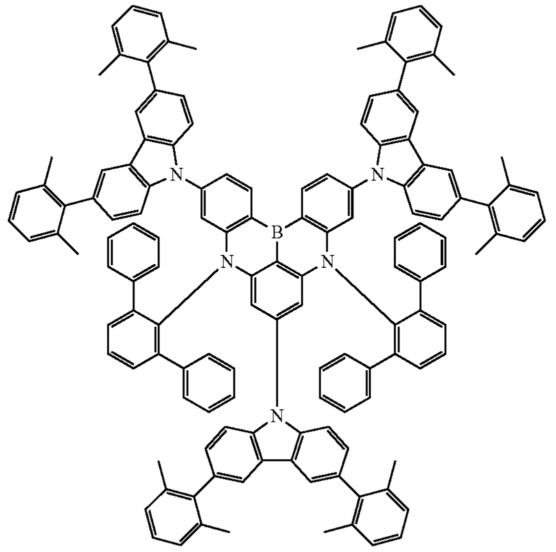
106
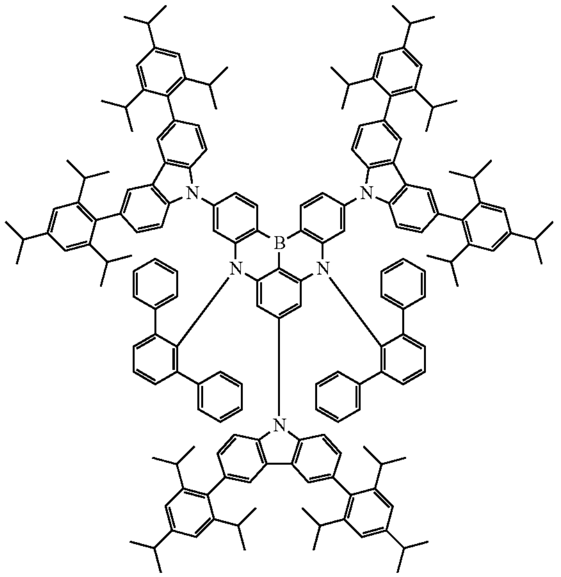
107
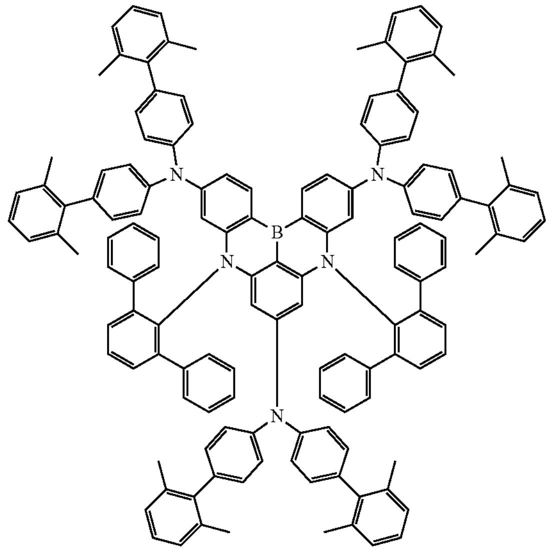
108
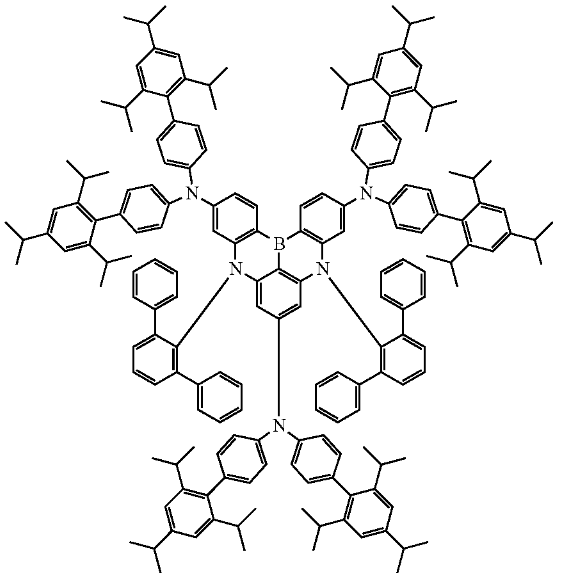

-continued
109
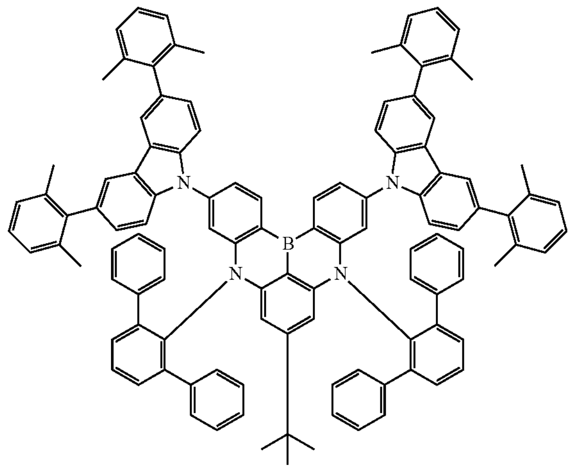
110
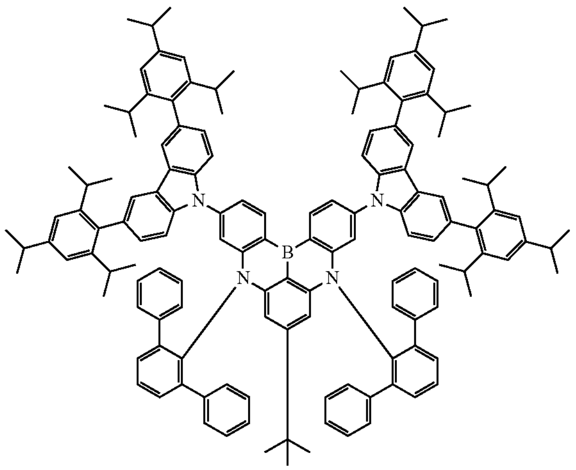
111
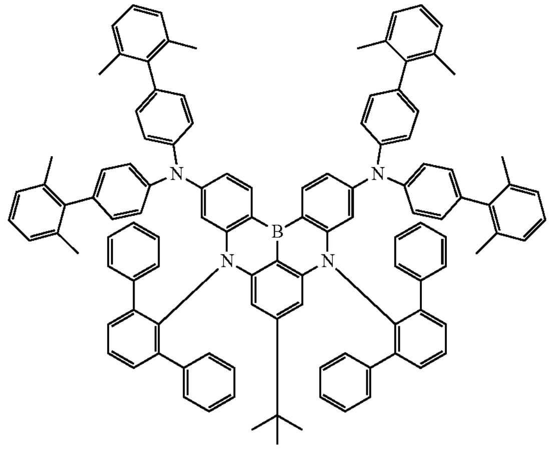
112
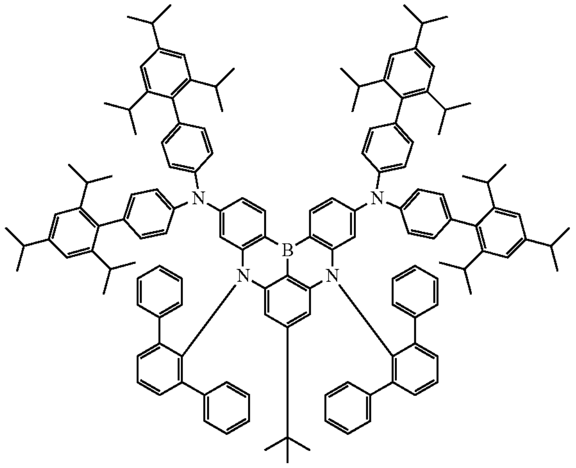
113
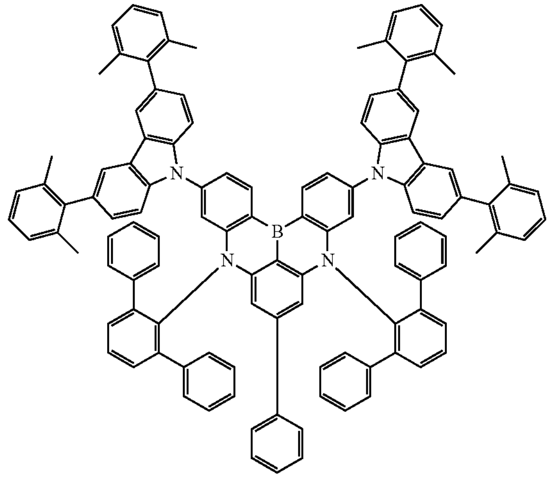
114
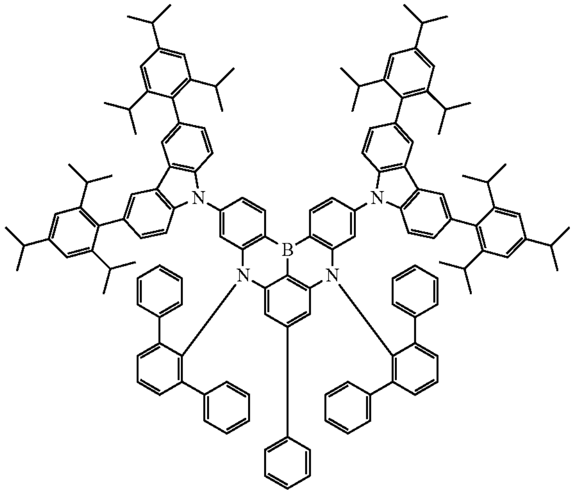

-continued
115
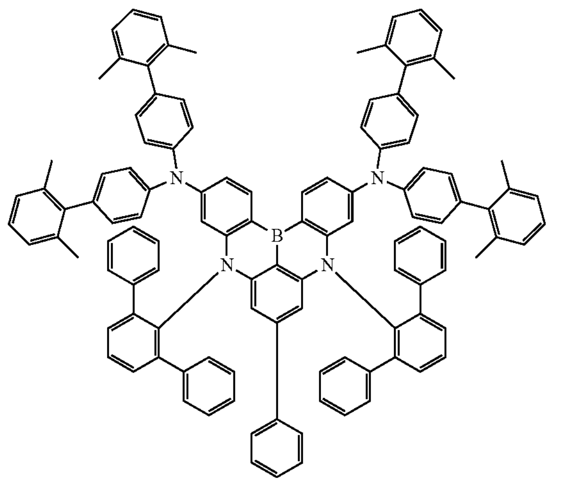
116
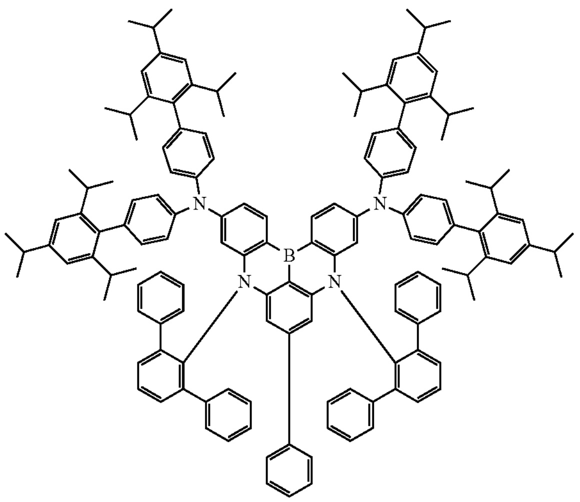
117
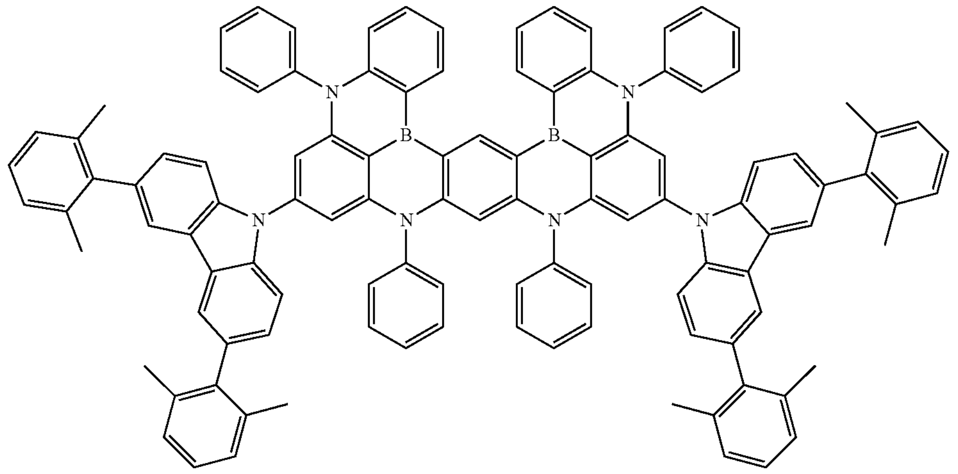
118
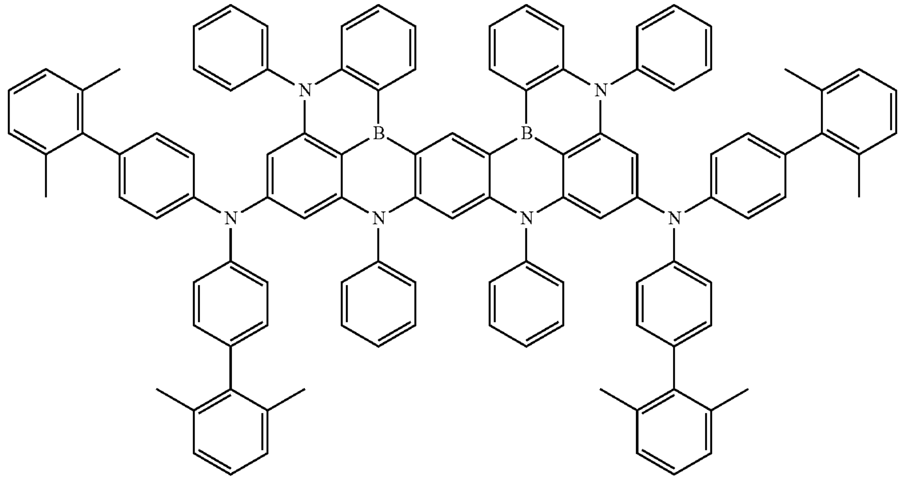

-continued
119
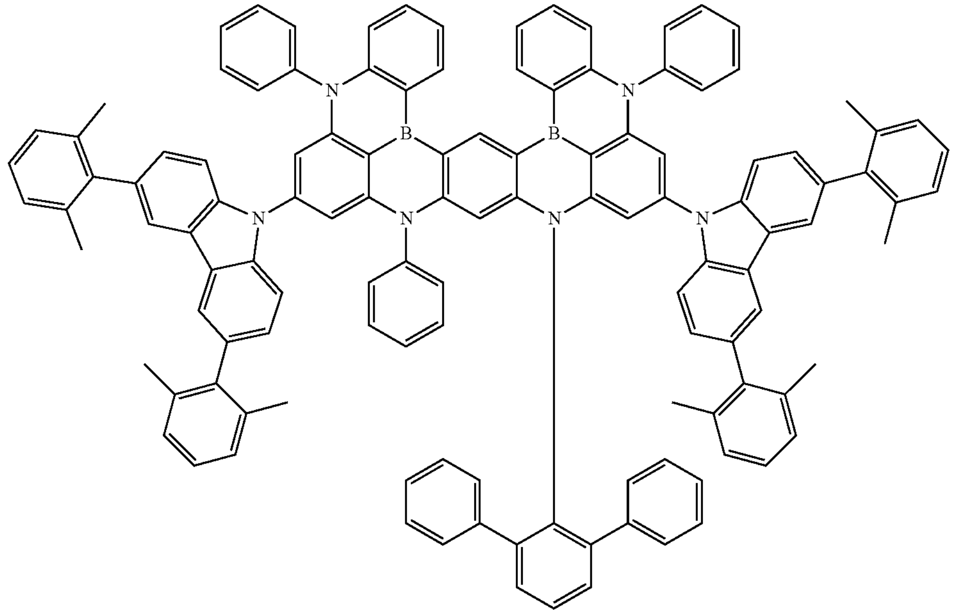
120
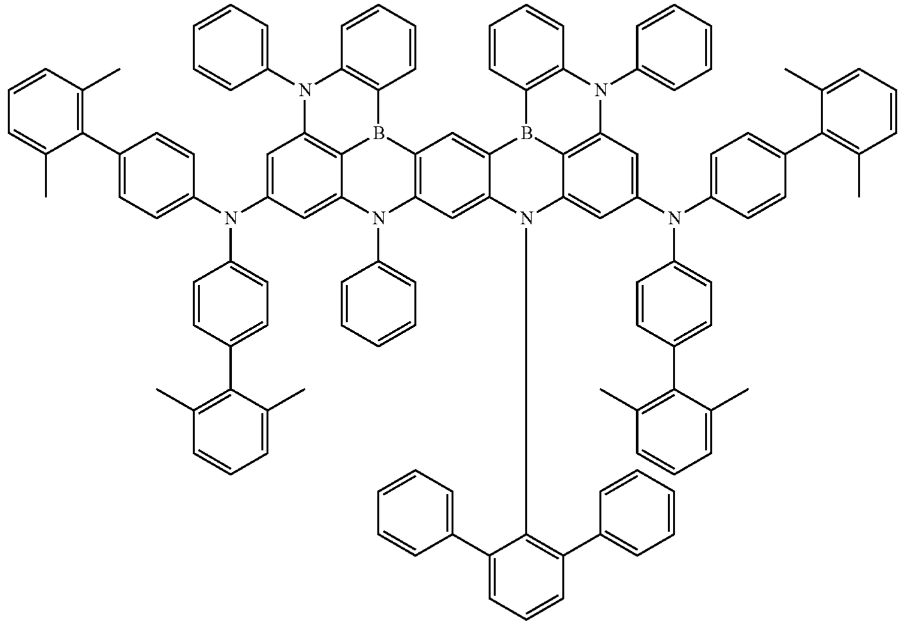

121
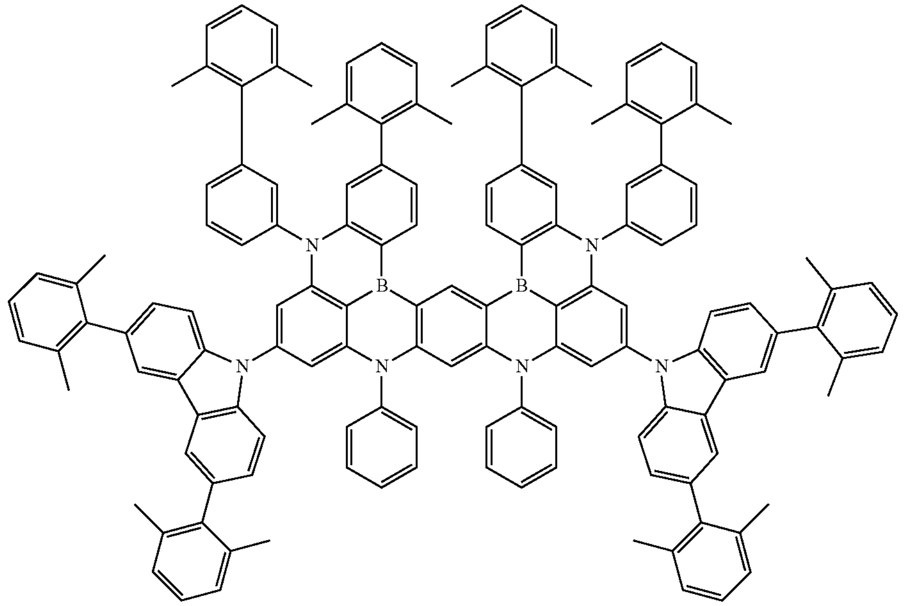
122
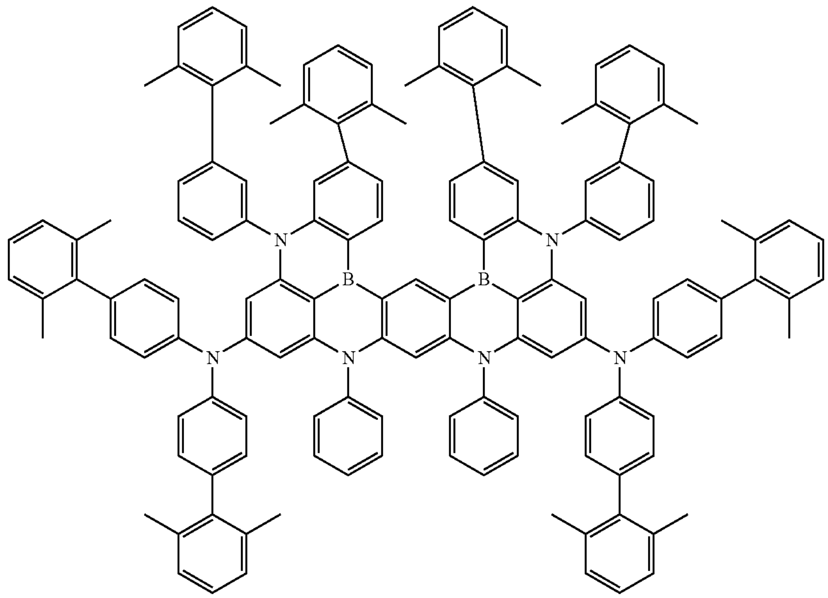

-continued
123
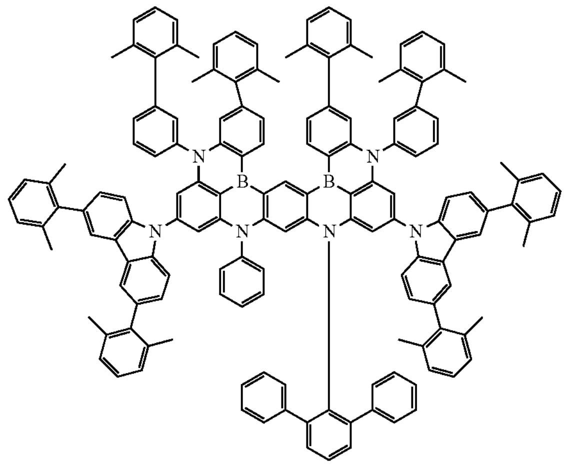
124
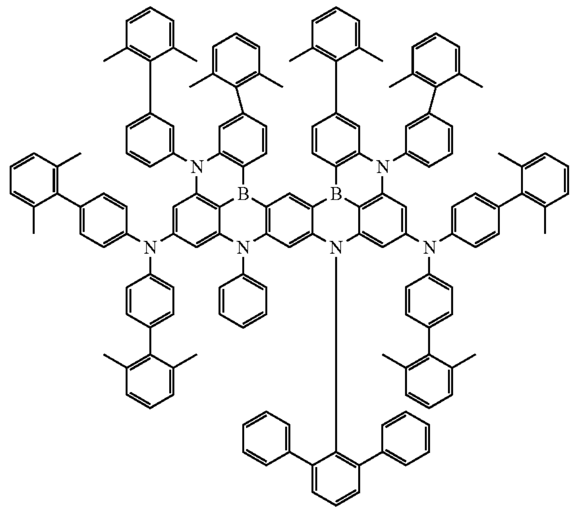
125
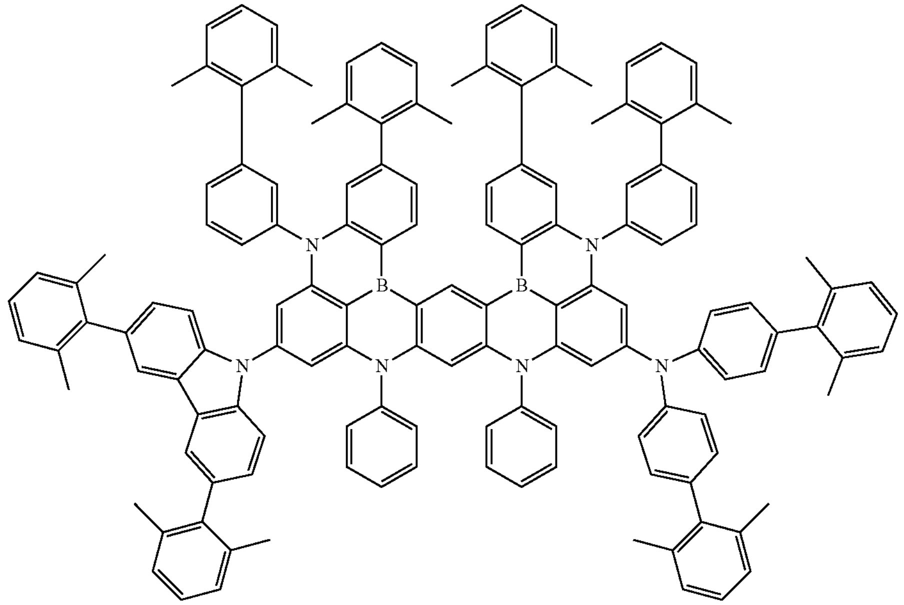

-continued
126
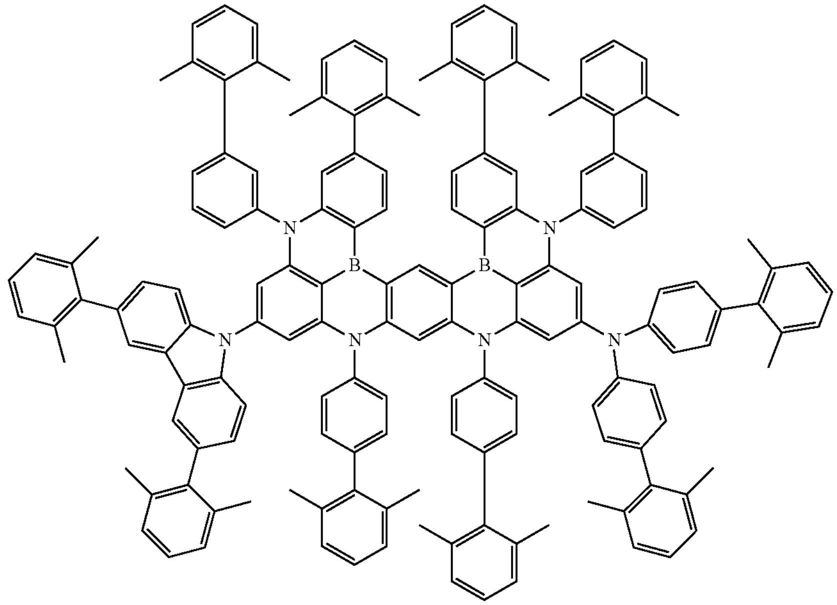
127
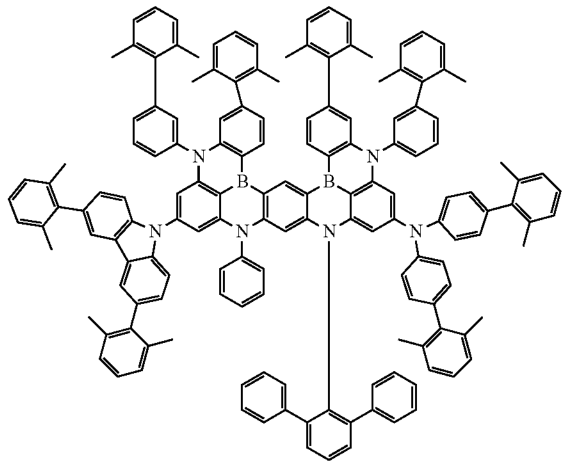
128
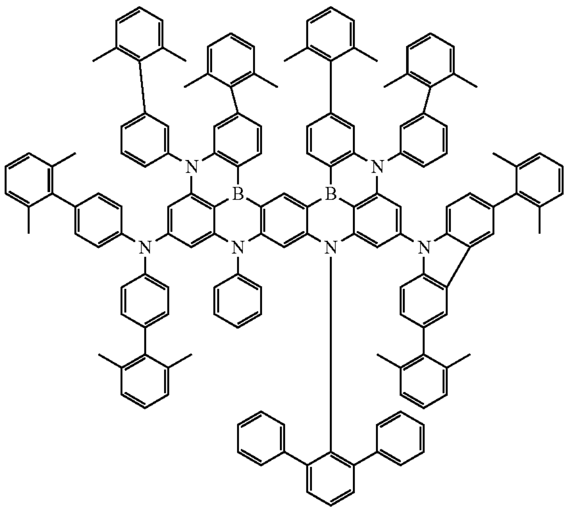

-continued
132
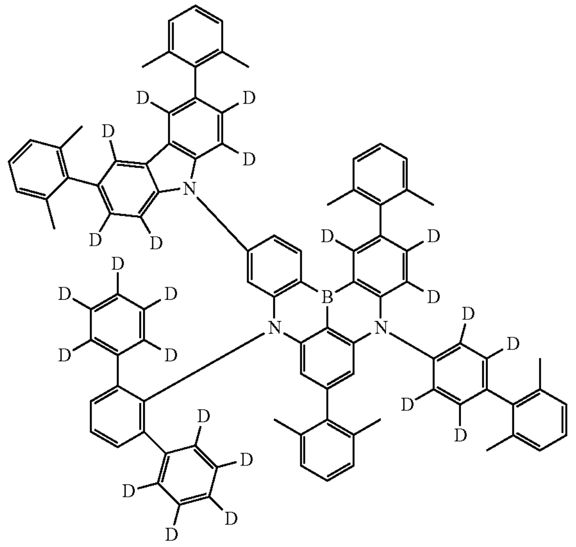
133
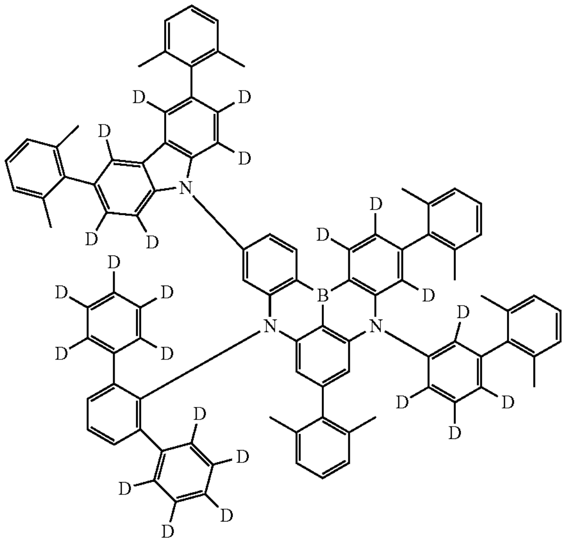
134
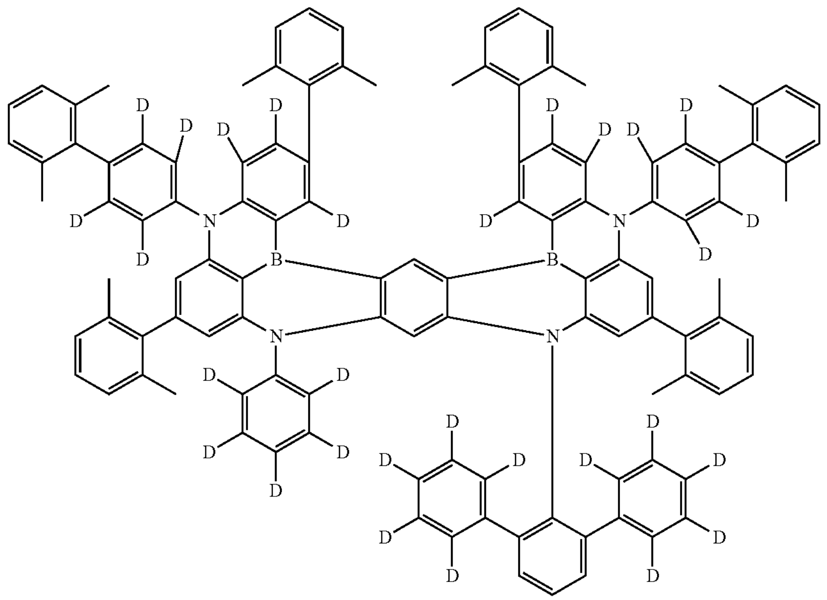

-continued
135
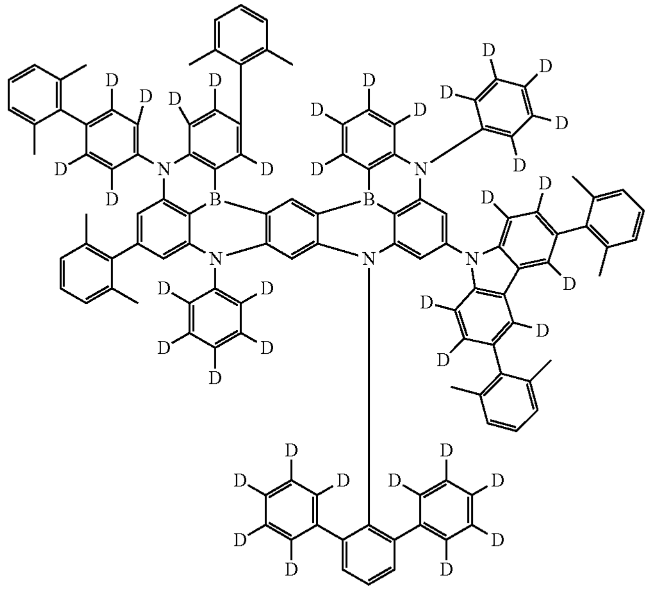
136
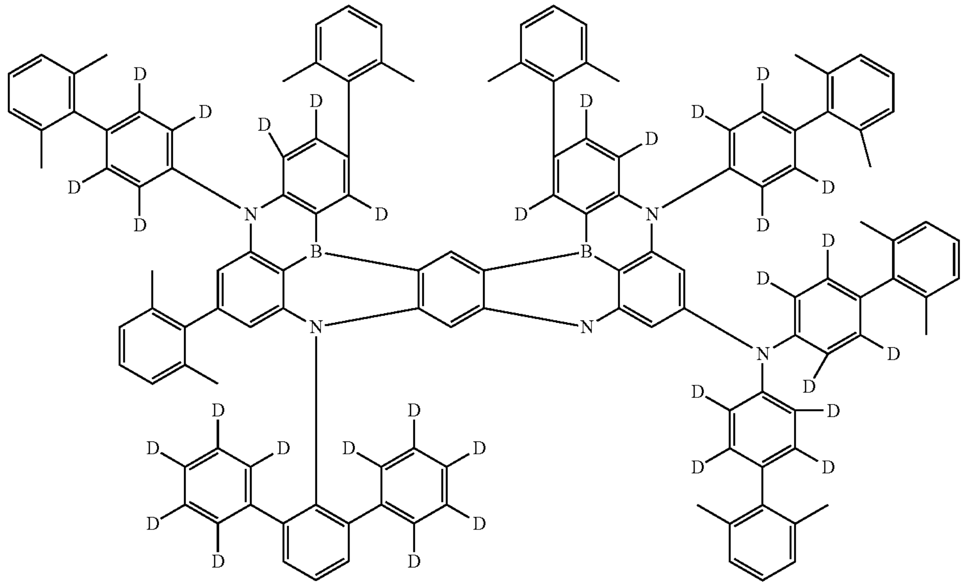

-continued
137
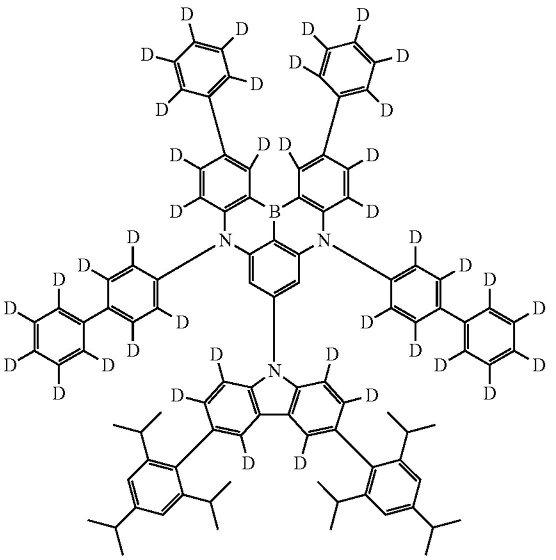
138
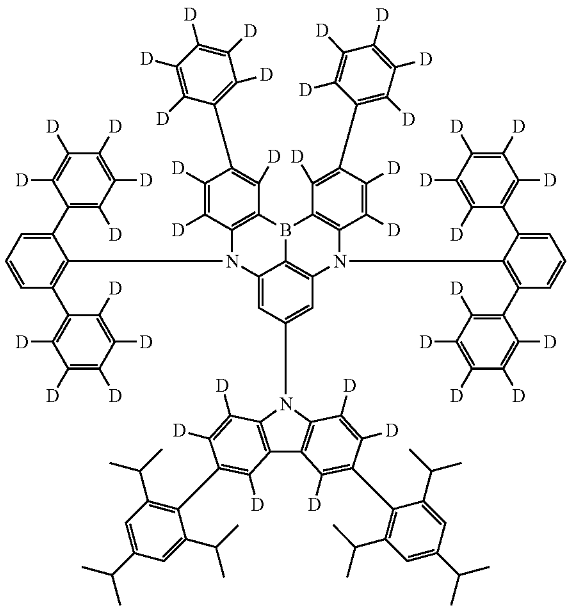
139
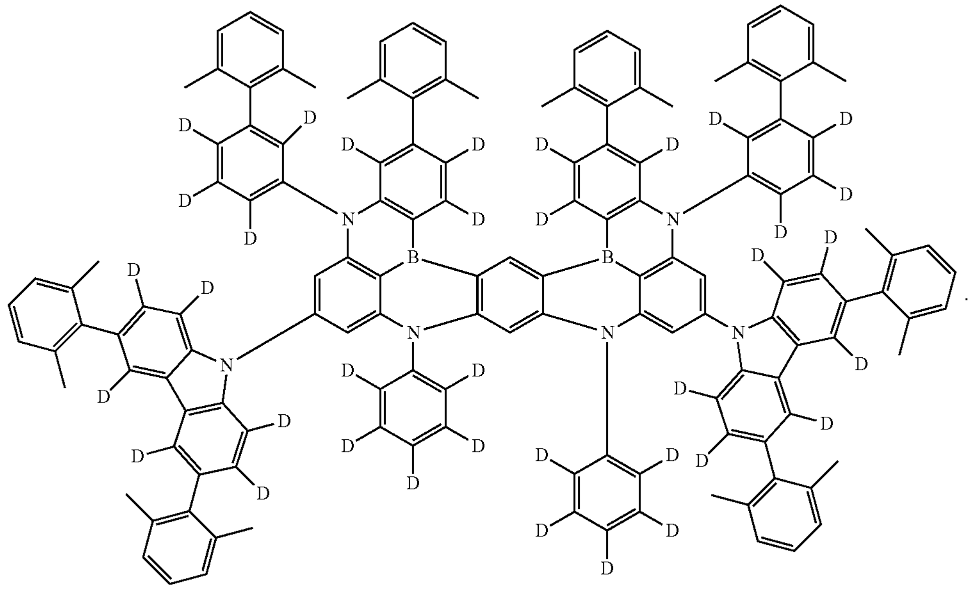
* * * * *